US010164125B2

(12) United States Patent
Yamamoto

(10) Patent No.: US 10,164,125 B2
(45) Date of Patent: Dec. 25, 2018

(54) SEMICONDUCTOR DEVICE HAVING FIRST AND SECOND ELECTRODE LAYERS ELECTRICALLY DISCONNECTED FROM EACH OTHER BY A SLIT

(71) Applicant: ROHM CO., LTD., Kyoto (JP)

(72) Inventor: Hiroki Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/689,852

(22) Filed: Aug. 29, 2017

(65) Prior Publication Data

US 2018/0006161 A1 Jan. 4, 2018

Related U.S. Application Data

(63) Continuation of application No. 15/498,454, filed on Apr. 26, 2017, now Pat. No. 9,773,925, which is a (Continued)

(30) Foreign Application Priority Data

| | | |
|---|---|---|
| Oct. 17, 2011 | (JP) | 2011-227964 |
| Dec. 9, 2011 | (JP) | 2011-270253 |
| Mar. 16, 2012 | (JP) | 2012-060557 |
| Mar. 16, 2012 | (JP) | 2012-060558 |
| Mar. 16, 2012 | (JP) | 2012-060559 |
| Apr. 5, 2012 | (JP) | 2012-086784 |
| Jul. 2, 2012 | (JP) | 2012-148862 |
| Jul. 3, 2012 | (JP) | 2012-149732 |
| Jul. 3, 2012 | (JP) | 2012-149733 |

(Continued)

(51) Int. Cl.
*H01L 31/112* (2006.01)
*H01L 29/00* (2006.01)
(Continued)

(52) U.S. Cl.
CPC ...... *H01L 29/872* (2013.01); *H01L 23/49551* (2013.01); *H01L 23/49562* (2013.01);
(Continued)

(58) Field of Classification Search
CPC . H01L 29/872; H01L 29/861; H01L 29/8611; H01L 29/808; H01L 29/66136; H01L 29/66189; H01L 2924/12032; H01L 2924/1305; H01L 27/0629; H01L 27/0722; H01L 27/0783; H01L 27/067;
(Continued)

(56) References Cited

U.S. PATENT DOCUMENTS 7,906,811 B2 3/2011 Otake
8,089,095 B2 1/2012 Salih et al.
(Continued)

FOREIGN PATENT DOCUMENTS

JP S57-63831 A 4/1982
JP S57-201071 A 12/1982
(Continued)

*Primary Examiner* — Hsien Ming Lee
(74) *Attorney, Agent, or Firm* — Rabin & Berdo, P.C.

(57) ABSTRACT

A chip part includes a substrate, an element formed on the substrate, and an electrode formed on the substrate. A recess and/or projection expressing information related to the element is formed at a peripheral edge portion of the substrate.

14 Claims, 163 Drawing Sheets

A1

A1

Related U.S. Application Data continuation of application No. 15/170,910, filed on Jun. 1, 2016, now Pat. No. 9,659,875, which is a continuation of application No. 14/703,928, filed on May 5, 2015, now Pat. No. 9,385,093, which is a continuation of application No. 14/349,901, filed as application No. PCT/JP2012/076684 on Oct. 16, 2012, now Pat. No. 9,054,072.

(30) Foreign Application Priority Data

| | | |
|---|---|---|
| Jul. 3, 2012 | (JP) | 2012-149734 |
| Sep. 28, 2012 | (JP) | 2012-217882 |

(51) Int. Cl.

| | |
|---|---|
| ***H01L 29/872*** | (2006.01) |
| ***H01L 23/495*** | (2006.01) |
| ***H01L 23/522*** | (2006.01) |
| ***H01L 29/861*** | (2006.01) |
| ***H01L 29/866*** | (2006.01) |
| ***H01L 49/02*** | (2006.01) |
| ***H01L 27/06*** | (2006.01) |
| ***H01L 23/544*** | (2006.01) |
| ***H01L 29/417*** | (2006.01) |
| ***H01L 27/102*** | (2006.01) |
| ***H01L 27/07*** | (2006.01) |
| ***H01L 29/66*** | (2006.01) |
| *H01L 29/06* | (2006.01) |
| *H01L 23/31* | (2006.01) |
| *H01L 27/02* | (2006.01) |
| *H01L 23/00* | (2006.01) |

(52) U.S. Cl.

CPC ...... *H01L 23/5223* (2013.01); *H01L 23/5228* (2013.01); *H01L 23/544* (2013.01); *H01L 23/562* (2013.01); *H01L 24/33* (2013.01); *H01L 27/067* (2013.01); *H01L 27/0629* (2013.01); *H01L 27/0722* (2013.01); *H01L 27/1021* (2013.01); *H01L 28/10* (2013.01); *H01L 28/20* (2013.01); *H01L 28/24* (2013.01); *H01L 28/40* (2013.01); *H01L 29/0692* (2013.01); *H01L 29/417* (2013.01); *H01L 29/66136* (2013.01); *H01L 29/861* (2013.01); *H01L 29/866* (2013.01); *H01L 29/8611* (2013.01); *H01L 23/3114* (2013.01); *H01L 23/3192* (2013.01); *H01L 24/05* (2013.01); *H01L 24/06* (2013.01); *H01L 24/11* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01); *H01L 24/85* (2013.01); *H01L 27/0255* (2013.01); *H01L 29/0615* (2013.01); *H01L 29/0619* (2013.01); *H01L 2223/54413* (2013.01); *H01L 2223/54433* (2013.01); *H01L 2223/54473* (2013.01); *H01L 2223/54493* (2013.01); *H01L 2224/02166* (2013.01); *H01L 2224/0401* (2013.01); *H01L 2224/04026* (2013.01); *H01L 2224/04042* (2013.01); *H01L 2224/05144* (2013.01); *H01L 2224/05553* (2013.01); *H01L 2224/05567* (2013.01); *H01L 2224/05624* (2013.01); *H01L 2224/05644* (2013.01); *H01L 2224/06181* (2013.01); *H01L 2224/11009* (2013.01); *H01L 2224/11464* (2013.01); *H01L 2224/131* (2013.01); *H01L 2224/13022* (2013.01); *H01L 2224/16225* (2013.01); *H01L 2224/16245* (2013.01); *H01L 2224/291* (2013.01); *H01L 2224/32245* (2013.01); *H01L 2224/45144* (2013.01); *H01L 2224/48091* (2013.01); *H01L 2224/48247* (2013.01); *H01L 2224/48463* (2013.01); *H01L 2224/73253* (2013.01); *H01L 2224/73265* (2013.01); *H01L 2224/85205* (2013.01); *H01L 2224/94* (2013.01); *H01L 2924/00014* (2013.01); *H01L 2924/10253* (2013.01); *H01L 2924/12032* (2013.01); *H01L 2924/12035* (2013.01); *H01L 2924/12036* (2013.01); *H01L 2924/12042* (2013.01); *H01L 2924/13091* (2013.01); *H01L 2924/14* (2013.01); *H01L 2924/15788* (2013.01); *H01L 2924/181* (2013.01); *H01L 2924/30107* (2013.01)

(58) Field of Classification Search

CPC ............. H01L 27/0711; H01L 27/0727; H01L 27/075; H01L 27/0814

USPC ........................ 257/197, 279, 274, 273, 552; 438/135–139, 514, 533, 534

See application file for complete search history.

(56) References Cited

U.S. PATENT DOCUMENTS

| | | | | |
|---|---|---|---|---|
| 8,501,580 | B2 | 8/2013 | Hu et al. | |
| 8,728,878 | B2 | 5/2014 | Chao et al. | |
| 9,141,463 | B2 * | 9/2015 | Nishiyama | G06F 11/079 |
| 9,773,925 | B2 * | 9/2017 | Yamamoto | H01L 29/872 |
| 2002/0093022 | A1 | 7/2002 | Otsuka et al. | |
| 2003/0057497 | A1 | 3/2003 | Higashida et al. | |
| 2005/0285713 | A1 | 12/2005 | Kuriyama | |
| 2007/0053167 | A1 | 3/2007 | Ueda | |
| 2009/0294865 | A1 * | 12/2009 | Tang | H01L 27/0629 257/369 |
| 2011/0212595 | A1 | 9/2011 | Hu et al. | |

FOREIGN PATENT DOCUMENTS

| | | | | | |
|---|---|---|---|---|---|
| JP | S59-51532 | A | 3/1984 | | |
| JP | S61-53756 | A | 3/1986 | | |
| JP | S61-119367 | U | 7/1986 | | |
| JP | S61-285764 | A | 12/1986 | | |
| JP | 401055873 | A | 3/1989 | | |
| JP | H04-62961 | A | 2/1992 | | |
| JP | H06-77237 | A | 3/1994 | | |
| JP | H07-505983 | A | 6/1995 | | |
| JP | H08-139318 | A | 5/1996 | | |
| JP | H08-316001 | A | 11/1996 | | |
| JP | 2001-326354 | A | 11/2001 | | |
| JP | 2002-217374 | A | 8/2002 | | |
| JP | 2002-270858 | A | 9/2002 | | |
| JP | 2005-093550 | A | 4/2005 | | |
| JP | 2005-101158 | A | 4/2005 | | |
| JP | 2005-203738 | A | 7/2005 | | |
| JP | 2010-206014 | A | 9/2010 | | |
| JP | WO2011093472 | * | 8/2011 | | H01L 21/84 |

* cited by examiner

A1

SEMICONDUCTOR DEVICE HAVING FIRST AND SECOND ELECTRODE LAYERS ELECTRICALLY DISCONNECTED FROM EACH OTHER BY A SLIT

This application is a continuation of U.S. application Ser. No. 15/498,454, filed on Apr. 26, 2017, and allowed on May 25, 2017, which was a continuation of U.S. application Ser. No. 15/170,910, filed on Jun. 1, 2016, and issued as U.S. Pat. No. 9,659,875 on May 23, 2017, which was a continuation of U.S. application Ser. No. 14/703,928, filed on May 5, 2015 and issued as U.S. Pat. No. 9,385,093 on Jul. 5, 2016, which is a continuation of U.S. application Ser. No. 14/349,901, filed on Apr. 4, 2014, and issued as U.S. Pat. No. 9,054,072 on Jun. 9, 2015, which was a National Stage application of PCT/JP2012/076684, filed on Oct. 16, 2012, and claims the benefit of the following Japanese Patent applications, the subject matters of which are incorporated herein by reference: Application No. 2011-227964 filed on Oct. 17, 2011; Application No. 2011-270253 filed on Dec. 9, 2011; Application No. 2012-060557 filed on Mar. 16, 2012; Application No. 2012-060558 filed on Mar. 16, 2012; Application No. 2012-060559 filed on Mar. 16, 2012; Application No. 2012-086784 filed on Apr. 5, 2012; Application No. 2012-148862 filed on Jul. 2, 2012; Application No. 2012-149732 filed on Jul. 3, 2012; Application No. 2012-149733 filed on Jul. 3, 2012; Application No. 2012-149734 filed on Jul. 3, 2012; and Application No. 2012-217882 filed on Sep. 28, 2012.

FIELD OF THE ART

The present invention relates to a chip diode including a diode element and to a diode package in which the chip diode is installed.

BACKGROUND ART

Patent Document 1 discloses a semiconductor device having a diode element. This semiconductor device includes an n-type semiconductor substrate, an n-type epitaxial layer formed on the semiconductor substrate, an n-type semiconductor region formed in the n-type epitaxial layer, a p-type semiconductor region formed on the n-type semiconductor region, an insulating film formed on the n-type epitaxial layer, an anode electrode penetrating through the insulating film and connected to the p-type semiconductor region, and a cathode electrode connected to a rear surface of the semiconductor substrate.

PRIOR ART DOCUMENTS

Patent Documents

Patent Document 1: Japanese Unexamined Patent Publication No. 2002-270858

Patent Document 2: Japanese Unexamined Patent Publication No. H8-316001

SUMMARY OF THE INVENTION

Problem to be Solved by the Invention

With the semiconductor device according to Patent Document 1, the anode electrode is embedded in the insulating film and an exposed upper surface of the anode electrode is used as a contact for electrical connection with an external power supply. Therefore, when mounting on a mounting substrate is performed by bonding a bonding wire to the contact by ultrasonic waves or by flip-chip bonding using a bump electrode bonded to the contact, the p-n junction directly below the contact may be destroyed due to physical stress.

An object of the present invention is thus to provide a chip diode, with which a p-n junction formed on a semiconductor layer can be prevented from being destroyed and fluctuations in characteristics can be suppressed even when a large stress is applied to a pad for electrical connection with the exterior, and a diode package that includes the chip diode.

Means for Solving the Problem

The chip diode according to the present invention for achieving the above object includes a semiconductor layer with a p-n junction, constituting a diode element, formed therein, a first electrode disposed along a top surface of the semiconductor layer, electrically connected to a first pole at one side of the p-n junction, and having a pad for electrical connection with the exterior, and a second electrode electrically connected to a second pole at the other side of the p-n junction, and the pad is provided at a position separated from a position directly above the p-n junction.

With this arrangement, the pad for electrical connection with the exterior is provided at a position separated from a position directly above the p-n junction. In other words, the pad is provided at a position shifted from the p-n junction and the p-n junction that constitutes the diode element is not disposed directly below the pad. Therefore, even if a large stress is applied to the pad when the chip diode is mounted, for example, by bonding a bonding wire to the pad by ultrasonic waves or by flip-chip bonding using a bump bonded to the pad, the physical stress transmitted to the p-n junction can be lightened and destruction of the p-n junction can thus be prevented.

With the present invention, "chip diode" means that a semiconductor element besides the diode element constituted by the p-n junction is not provided in the semiconductor layer. However, the diode element is a concept that includes a composite diode element that constitutes, for example, a circuit having a plurality of diodes (p-n junctions) connected in parallel, a circuit having cathodes of a plurality of diodes being connected mutually in series, etc. Also, the p-n junction may, for example, be of an arrangement, which is constituted of a p-type portion and an n-type portion that are mutually adjacent in a direction along the top surface of the semiconductor layer and in which the current flows in the direction along the top surface of the semiconductor layer, or may be of an arrangement, which is constituted of a p-type portion and an n-type portion that are mutually adjacent in a direction (thickness direction of the semiconductor layer) intersecting the top surface of the semiconductor layer and in which the current flows in the thickness direction of the semiconductor layer.

Specifically, it is preferable for the semiconductor layer to include a semiconductor layer of a first conductivity type having a diode impurity region of a second conductivity type formed selectively in a vicinity of the top surface, the p-n junction formed in the semiconductor layer to be arranged from a junction portion of the diode impurity region as the first pole and the remaining portion of the semiconductor layer as the second pole, and the first electrode to be connected to the diode impurity region. In this case, the second electrode may be connected to a rear surface of the semiconductor layer.

With this arrangement, a current can be made to flow in the thickness direction of the semiconductor layer between the diode impurity region of the semiconductor layer and the remaining portion that face each other in the thickness direction. Also preferably, the chip diode according to the present invention further includes an insulating film formed on the semiconductor layer and having formed therein a contact hole for connection of the first electrode and the diode impurity region, and the first electrode is led out in a lateral direction along the top surface of the insulating film from the contact hole and the pad is formed at the lead-out portion.

With this arrangement, the insulating film is interposed between the pad and the semiconductor layer and the insulating film can thus act as a cushioning material that relaxes stress applied to the pad before the stress is transmitted to the semiconductor layer. The physical stress transmitted to the p-n junction can thus be lightened further. Also with the chip diode according to the present invention, the insulating film may include a laminated film of an $SiO_2$ film, formed on the top surface of the semiconductor layer, and a PSG film, etc., formed on the $SiO_2$ film. Besides this, the insulating film may be a single layer film constituted only of an $SiO_2$ film or may be a laminated film of an $SiO_2$ film and a BPSG (boron phosphorous silicon glass) film, etc., formed on the $SiO_2$ film.

Also preferably, the chip diode according to the present invention further includes a floating region of the second conductivity type that is formed at a position in the vicinity of the top surface of the semiconductor layer and directly below the pad, and is electrically floated with respect to the diode element. With this arrangement, even if the insulating film is destroyed due to stress applied to the pad and a leak current pathway that allows electrical conduction between the pad and the semiconductor layer is formed at the destroyed portion, the flow of leak current to the current pathway can be prevented because the electrically floated region is disposed at a position directly below the pad.

Also by the above, a second capacitor $C_{pn}$, constituted by a p-n junction of the floating region (second conductivity type) and the semiconductor layer (first conductivity type), is disposed in series with respect to a first capacitor $C_1$, constituted by the insulating film, between the pad and the semiconductor layer. The effective voltage applied to the first capacitor $C_1$ can thus be decreased by voltage division by the second capacitor $C_{pn}$. Consequently, the withstand voltage can be improved by an amount corresponding to the amount of decrease.

Also, the floating region is preferably formed deeper than the diode impurity region and the impurity concentration thereof is preferably lower than the impurity concentration of the diode impurity region. Also preferably, the chip diode according to the present invention further includes a guard ring layer formed in the vicinity of the top surface of the semiconductor layer so as to surround the diode impurity region and being lower in impurity concentration than the diode impurity region. Further preferably, the guard ring layer is formed along an outer periphery of the diode impurity region so as to contact peripheral edges of the diode impurity region from the sides and from below.

By this arrangement, the chip diode can be improved in surge tolerance. Also, the chip diode according to the present invention may further include a top surface protective film formed so as to cover the first electrode and having formed therein a pad opening exposing a portion of the first electrode as the pad. In this case, the pad opening may be formed to a rectangular shape with one side being not more than 0.1 mm.

Also, the chip diode according to the present invention may be formed to a rectangular shape with one side being not more than 0.25 mm. That is, the arrangement according to the present invention can be favorably adopted in a chip diode of a small chip with one side being not more than 0.25 mm. Also, the pad and the diode impurity region may be disposed so as to be mutually adjacent along any one side of the chip diode.

Also, a diode package according to the present invention includes the chip diode according to the present invention, a resin package sealing the chip diode, a first terminal connected inside the resin package to the pad via a bonding wire, electrically connected to the first pole of the p-n junction, and having a portion exposed from the resin package, and a second terminal electrically connected inside the resin package to the second pole of the p-n junction and having a portion exposed from the resin package.

Although during manufacture of this diode package, the bonding wire is connected to the pad of the chip diode, the p-n junction is not disposed at a position directly below the pad, and therefore even if a large stress is applied during wire bonding, the physical stress transmitted to the p-n junction can be lightened. A chip diode with which the p-n junction is not destroyed can thus be installed in the package and the package can be manufactured as a device of high reliability.

Also, a diode package according to the present invention includes the chip diode according to the present invention, a resin package sealing the chip diode, a first terminal connected inside the resin package to the pad via a bump, electrically connected to the first pole of the p-n junction, and having a portion exposed from the resin package, and a second terminal electrically connected inside the resin package to the second pole of the p-n junction and having a portion exposed from the resin package.

Although during manufacture of this diode package, the bump connected to the pad of the chip diode is bonded to the first terminal, the p-n junction is not disposed at a position directly below the pad, and therefore even if a large stress is applied during bump bonding to the first terminal, the physical stress transmitted to the p-n junction can be lightened. A chip diode with which the p-n junction is not destroyed can thus be installed in the package and the package can be manufactured as a device of high reliability.

Figure 109A:
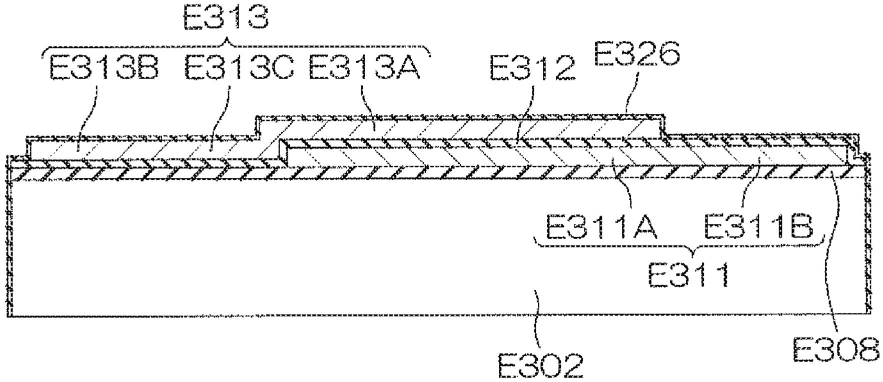
Figure 109B:
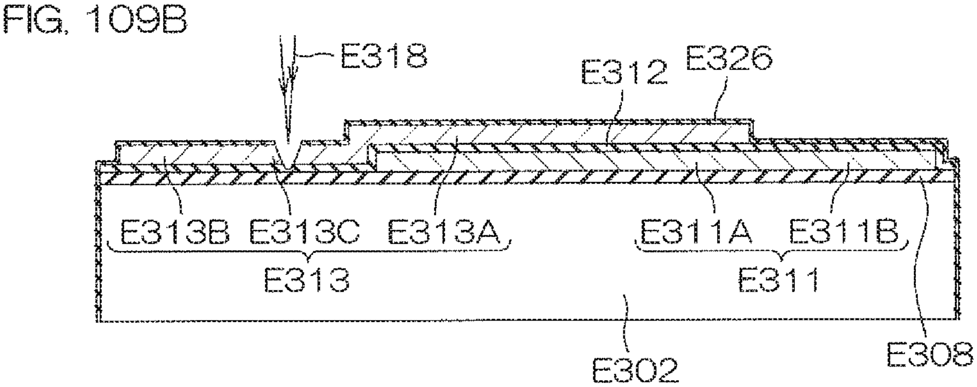
Figure 109C:
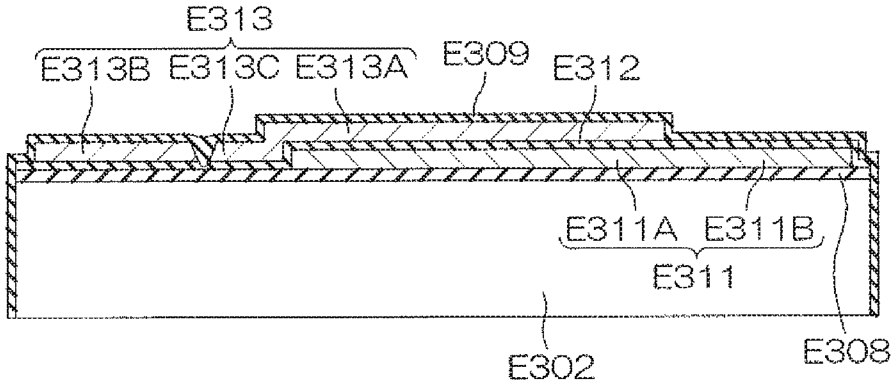

FIG. 109A, FIG. 109B, and FIG. 109C are sectional views for describing steps related to the fusing of a fuse.

Figure 110:
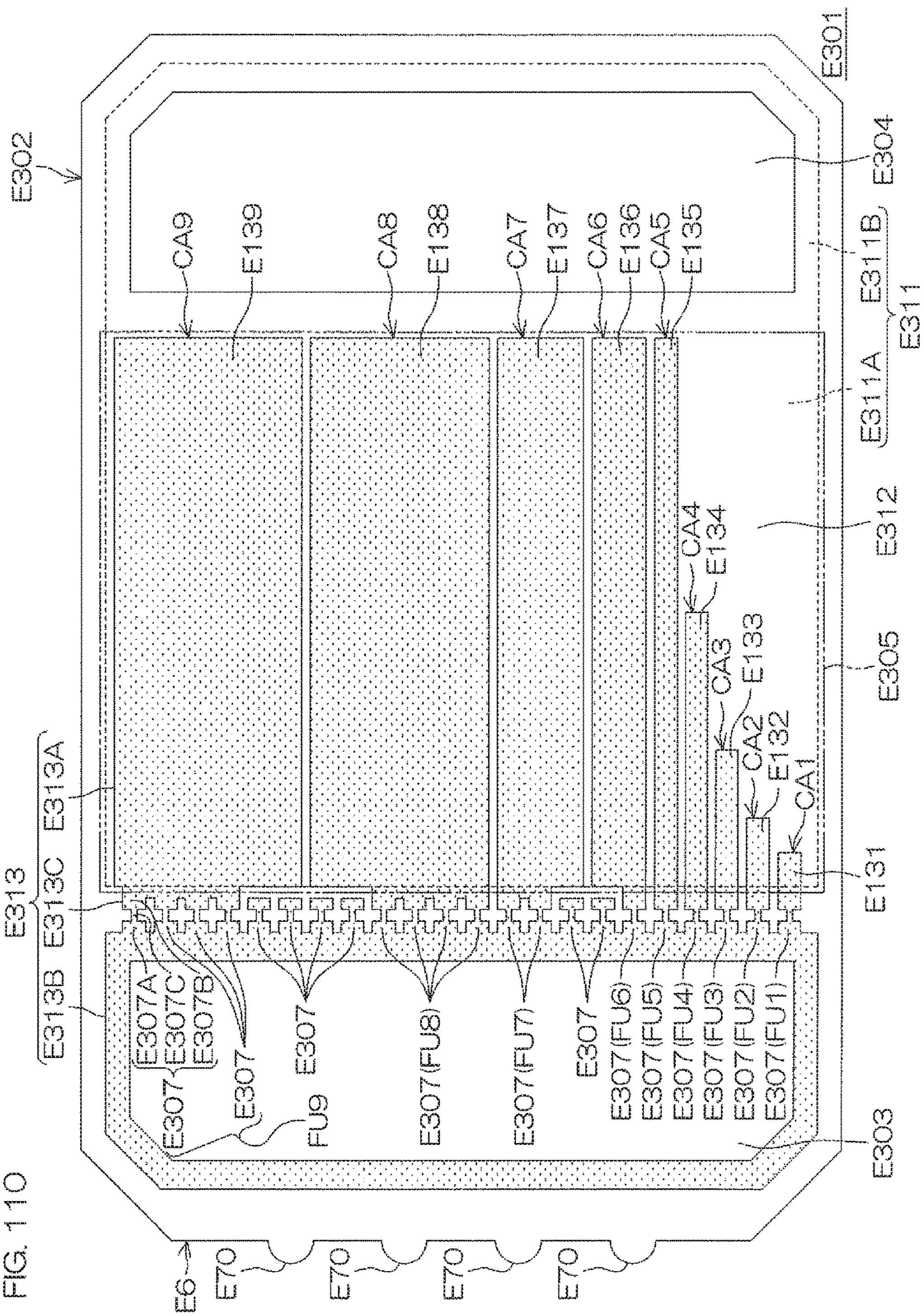

FIG. 110 is a plan view of a preferred embodiment where projecting marks are provided in place of recessed marks in the chip capacitor.

Figure 111:
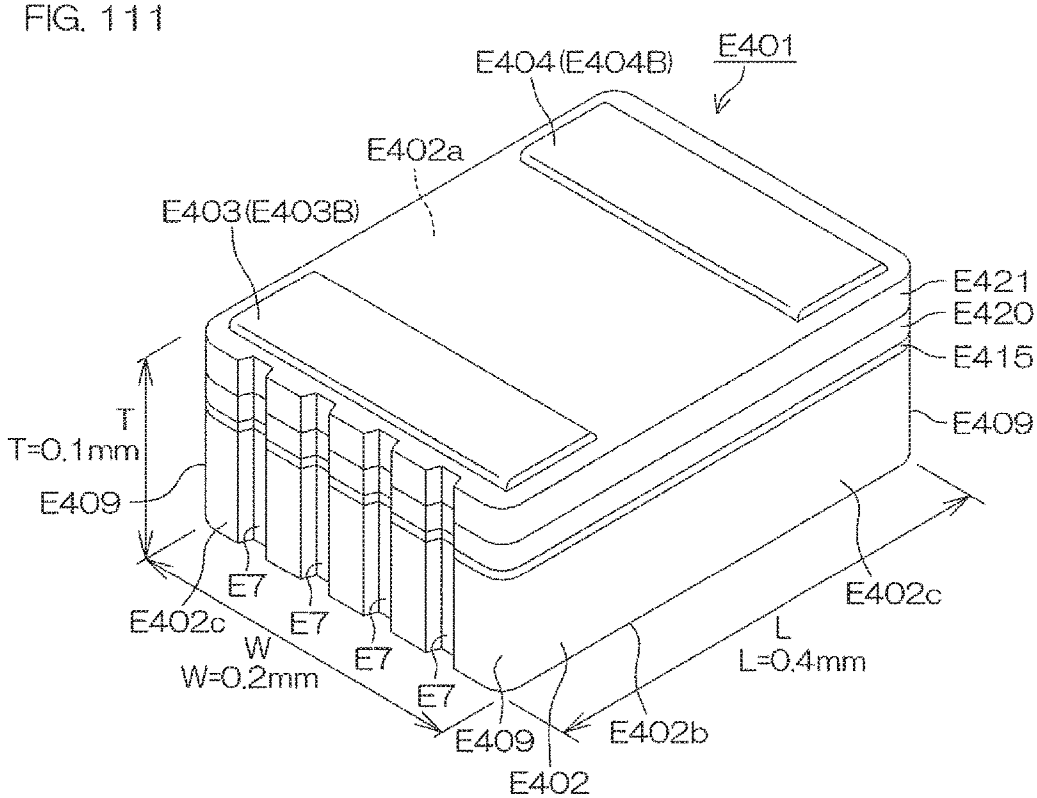

FIG. 111 is a perspective view of a chip diode according to another preferred embodiment of the sixth invention.

Figure 112:
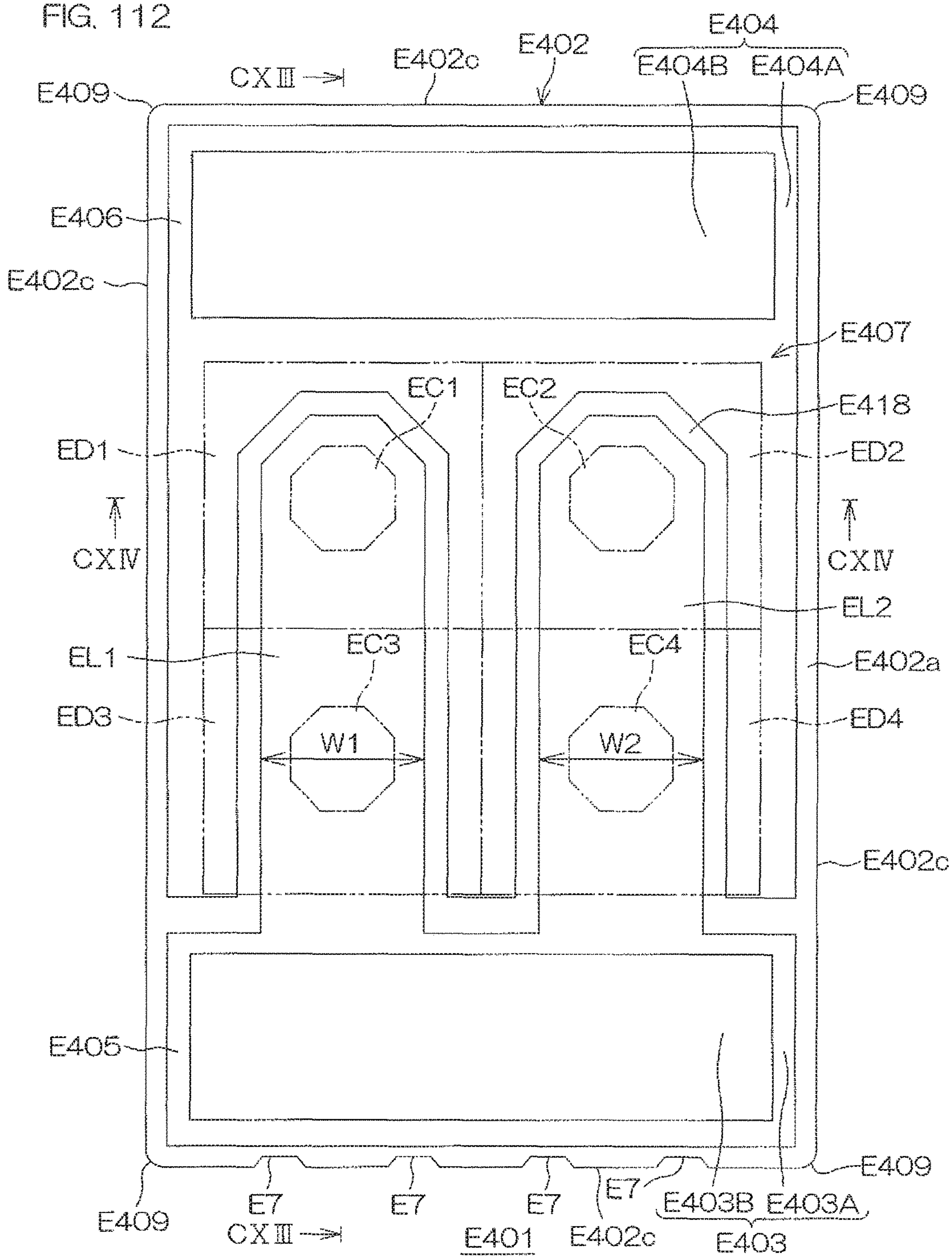

FIG. 112 is a plan view of the chip diode.

Figure 113:
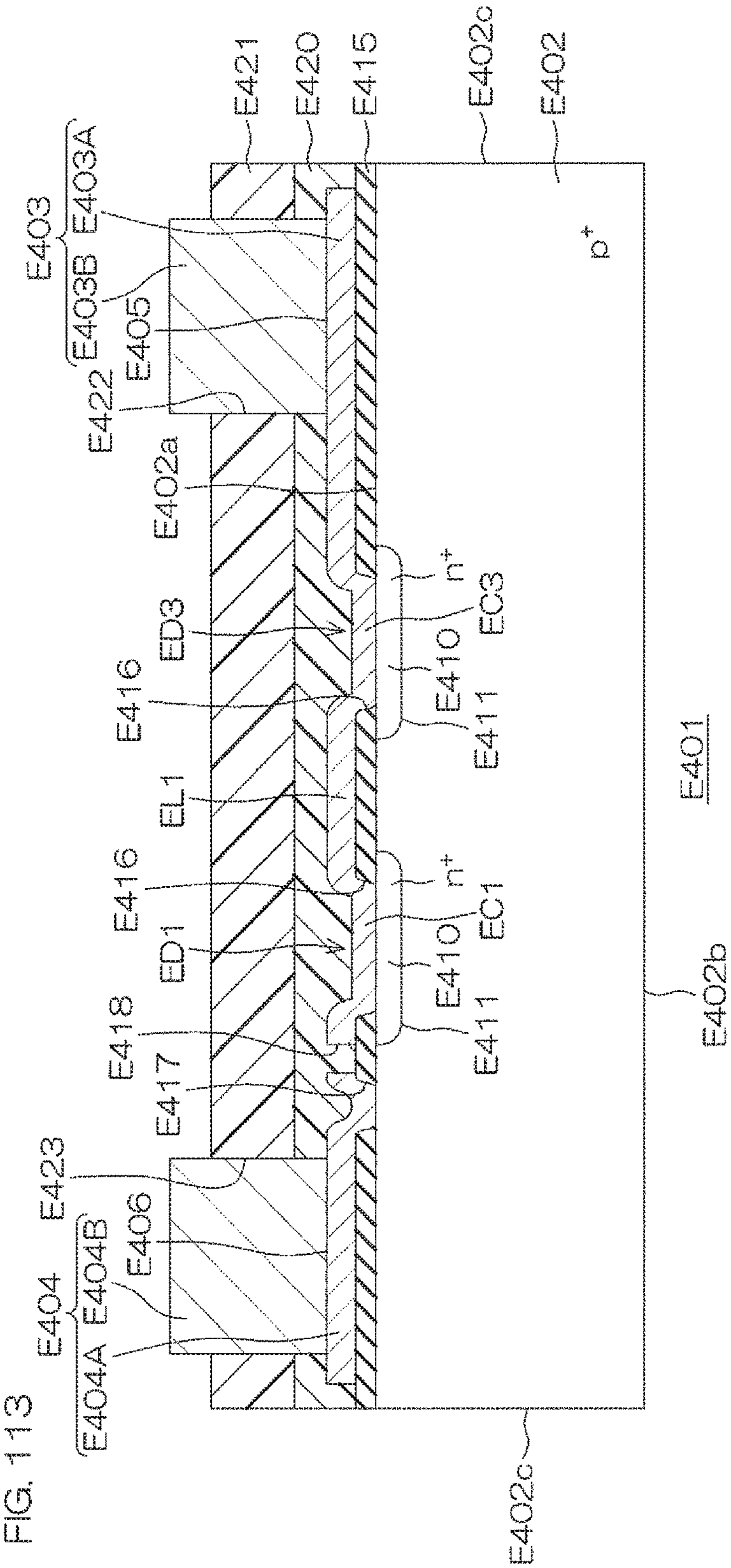

FIG. 113 is a sectional view taken along line CXIII-CXIII in FIG. 112.

Figure 114:
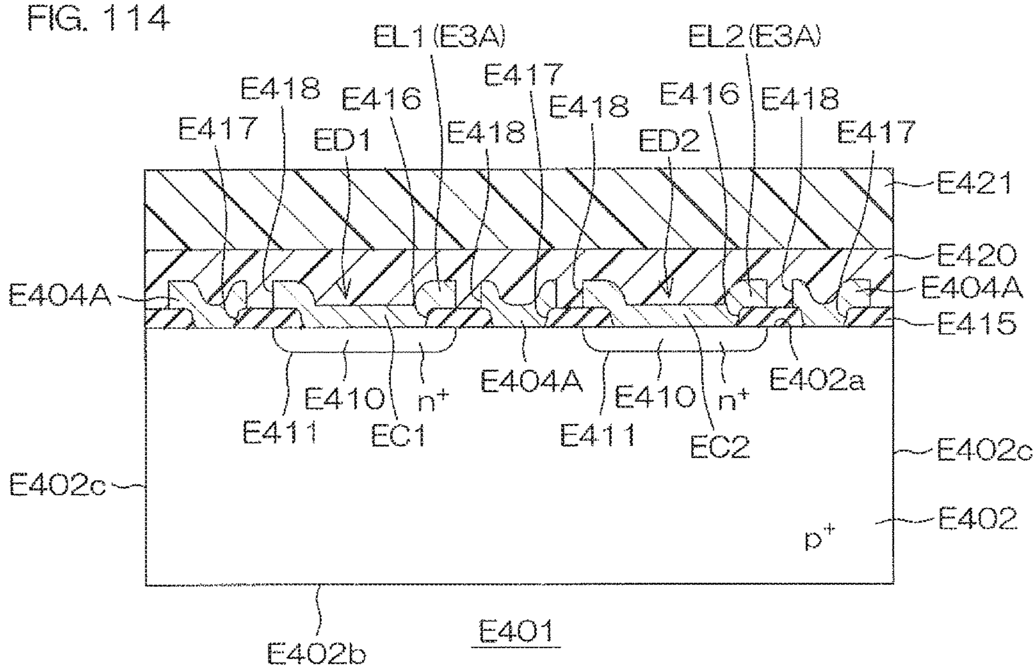

FIG. 114 is a sectional view taken along line CXIV-CXIV in FIG. 112.

Figure 115:
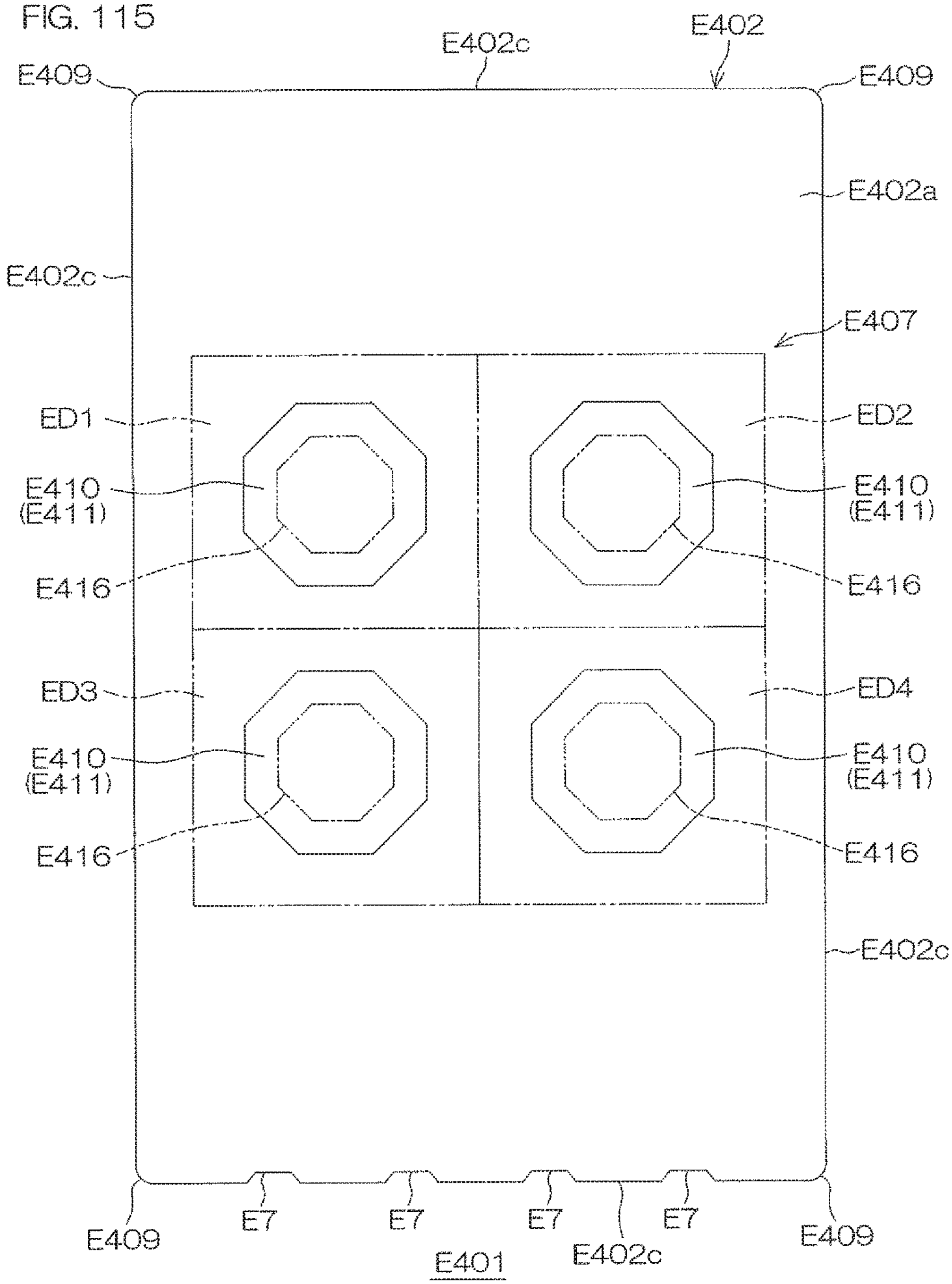

FIG. 115 is a plan view of the chip diode with a cathode electrode, an anode electrode, and the arrangement formed thereon being removed to show the structure of a top surface of a semiconductor substrate.

Figure 116:
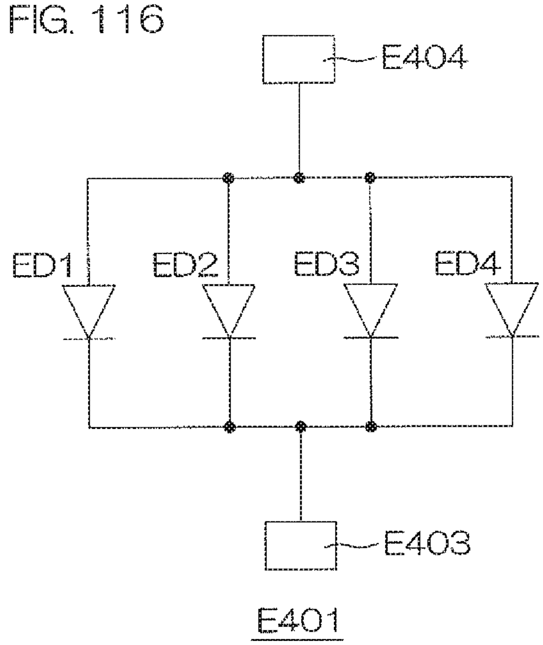

FIG. 116 is an electric circuit diagram showing the electrical structure of the interior of the chip diode.

Figure 117:
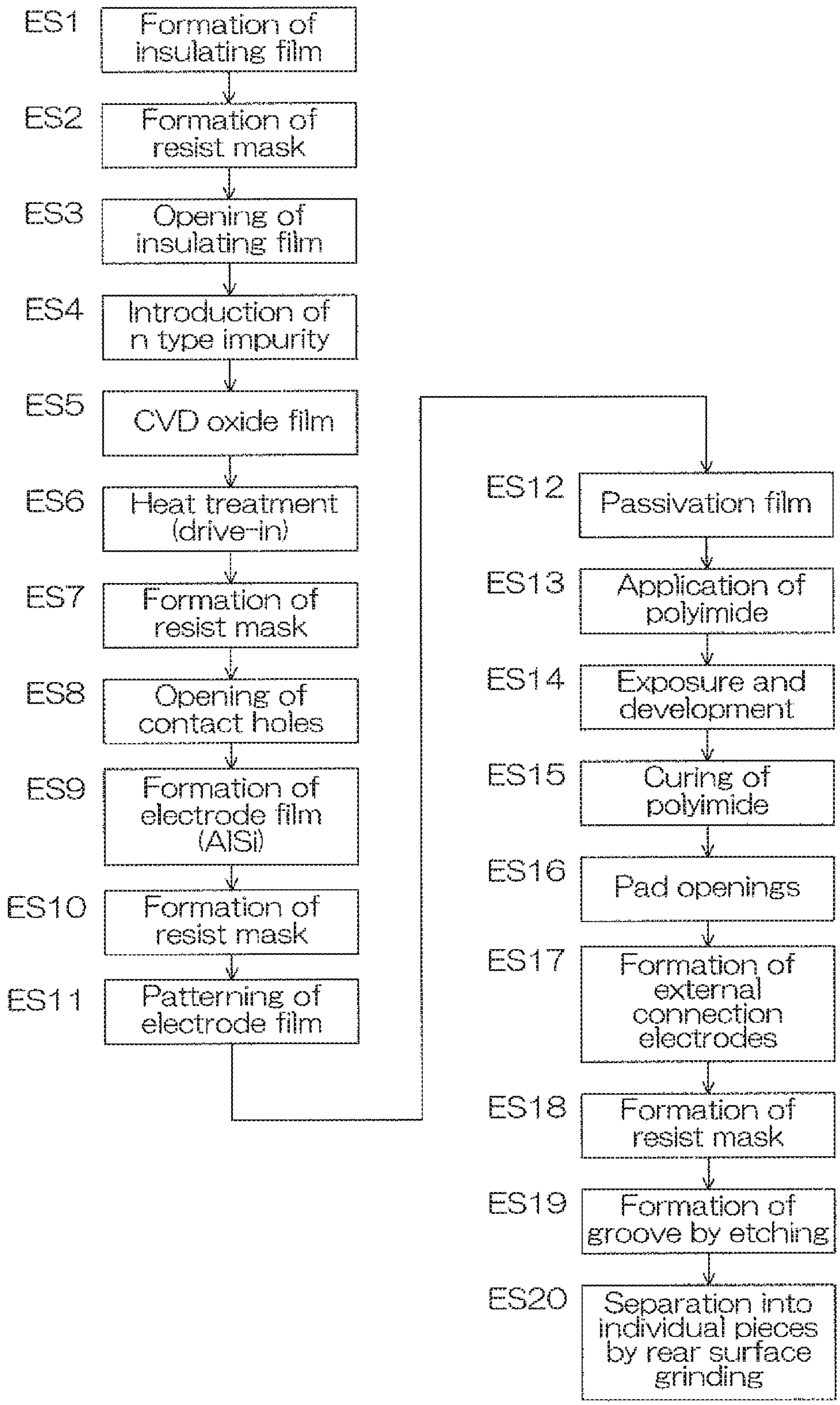

FIG. 117 is a process diagram for describing an example of a manufacturing process of the chip diode.

Figure 118A:
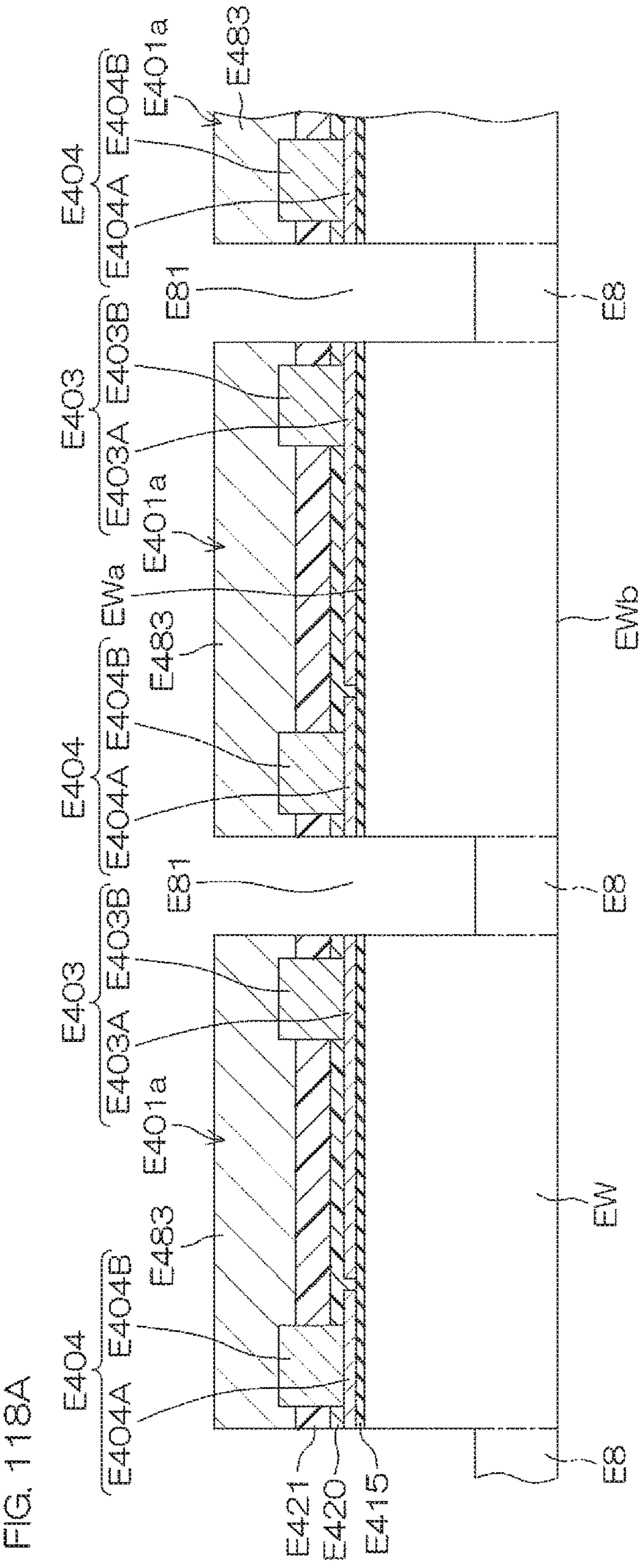

FIG. 118A is a sectional view of the arrangement of the chip diode in the middle of the manufacturing process.

Figure 118B:
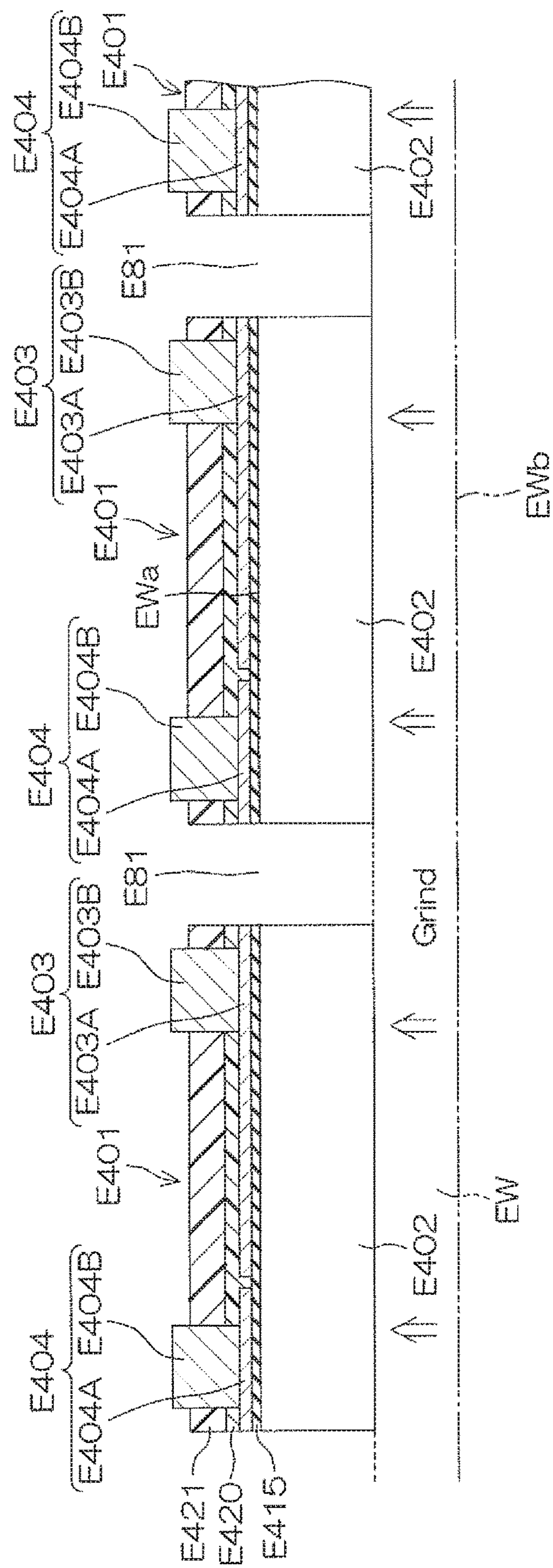

FIG. 118B is a sectional view of the arrangement in a step following that shown in FIG. 118A.

Figure 119:
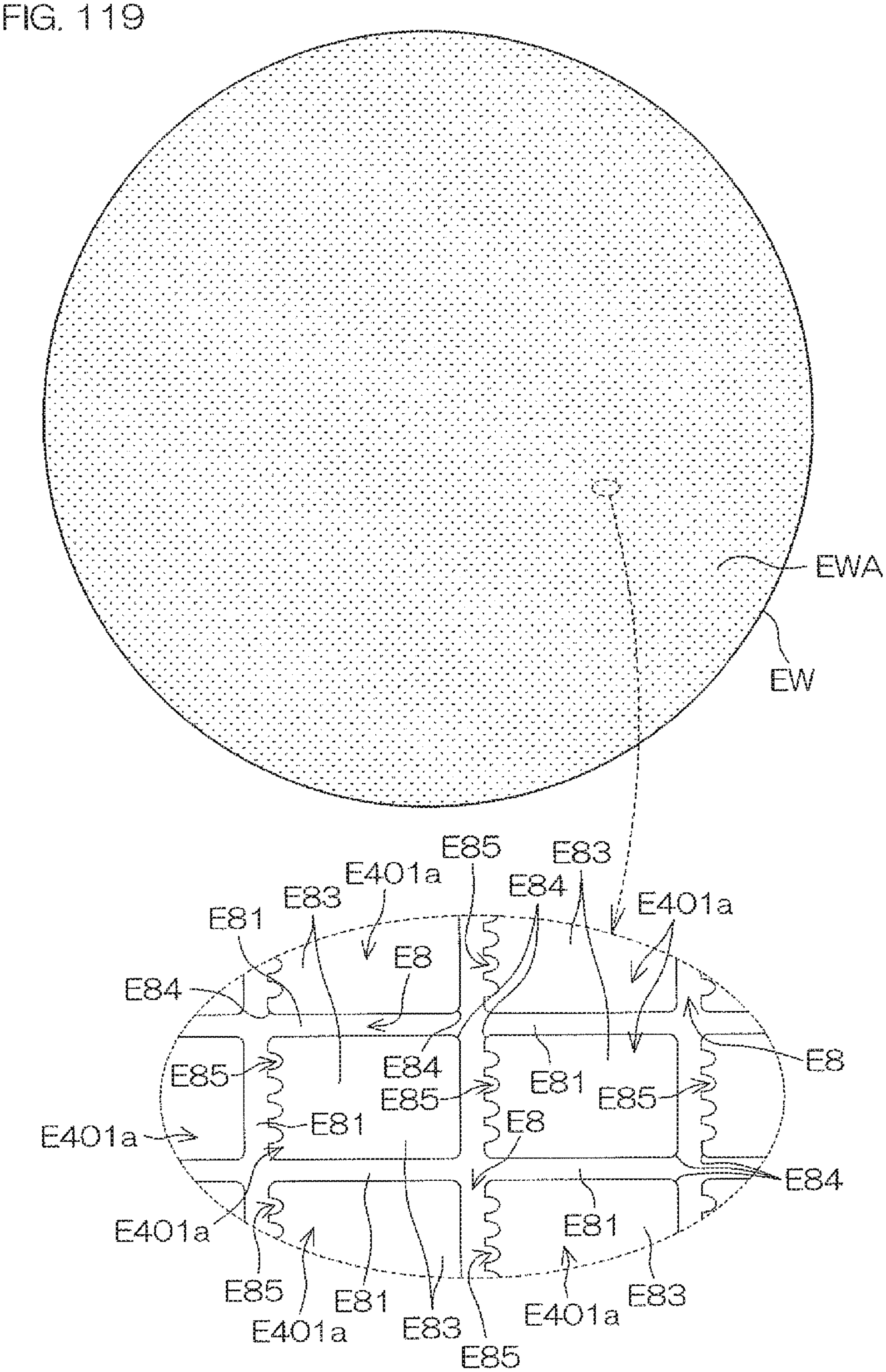

FIG. 119 is a plan view of a semiconductor wafer as a base substrate of the semiconductor substrate of the chip diode and shows a partial region in a magnified manner.

Figure 120:
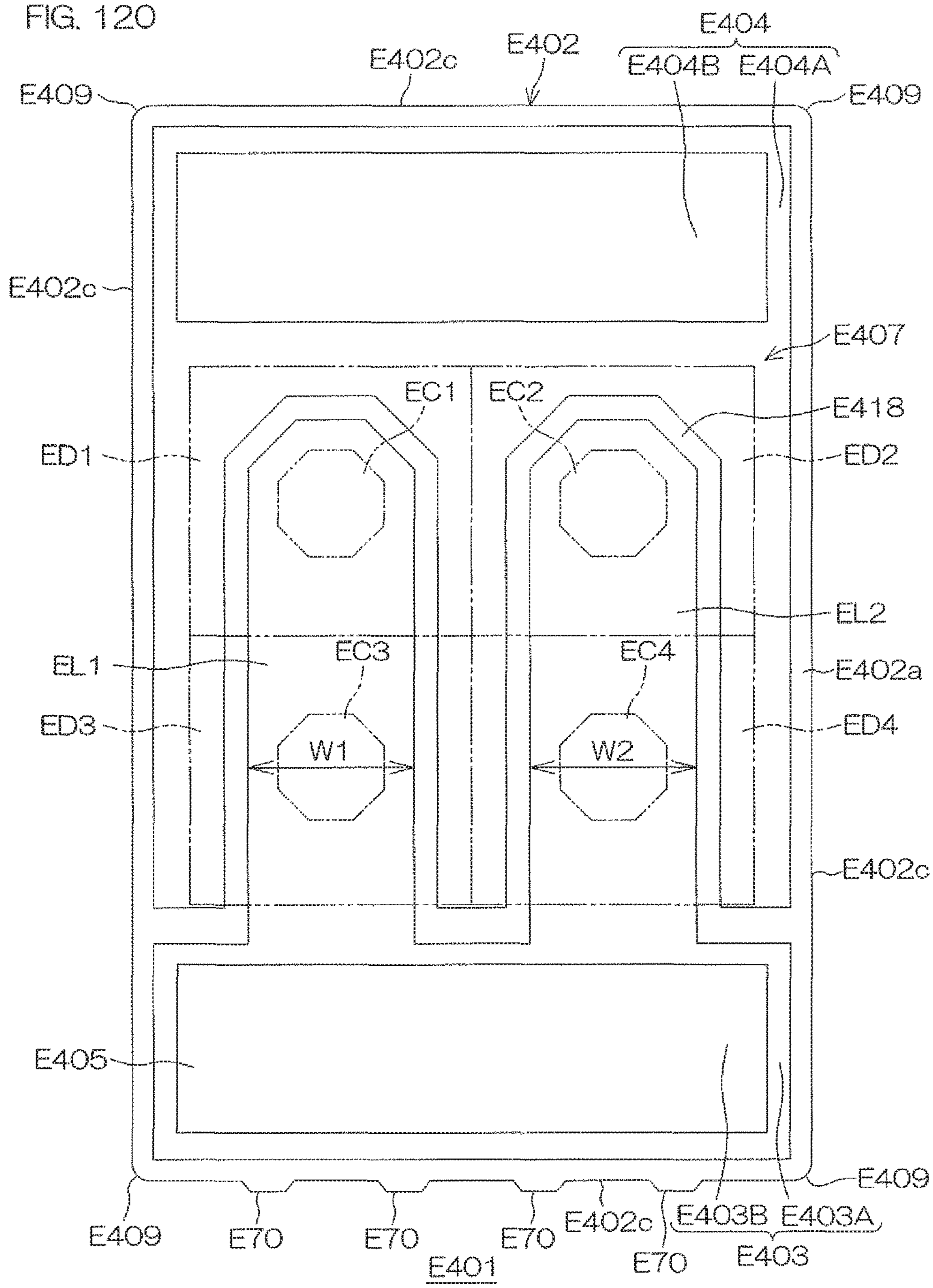

FIG. 120 is a plan view of a preferred embodiment where projecting marks are provided in place of recessed marks in the chip diode.

Figure 121:
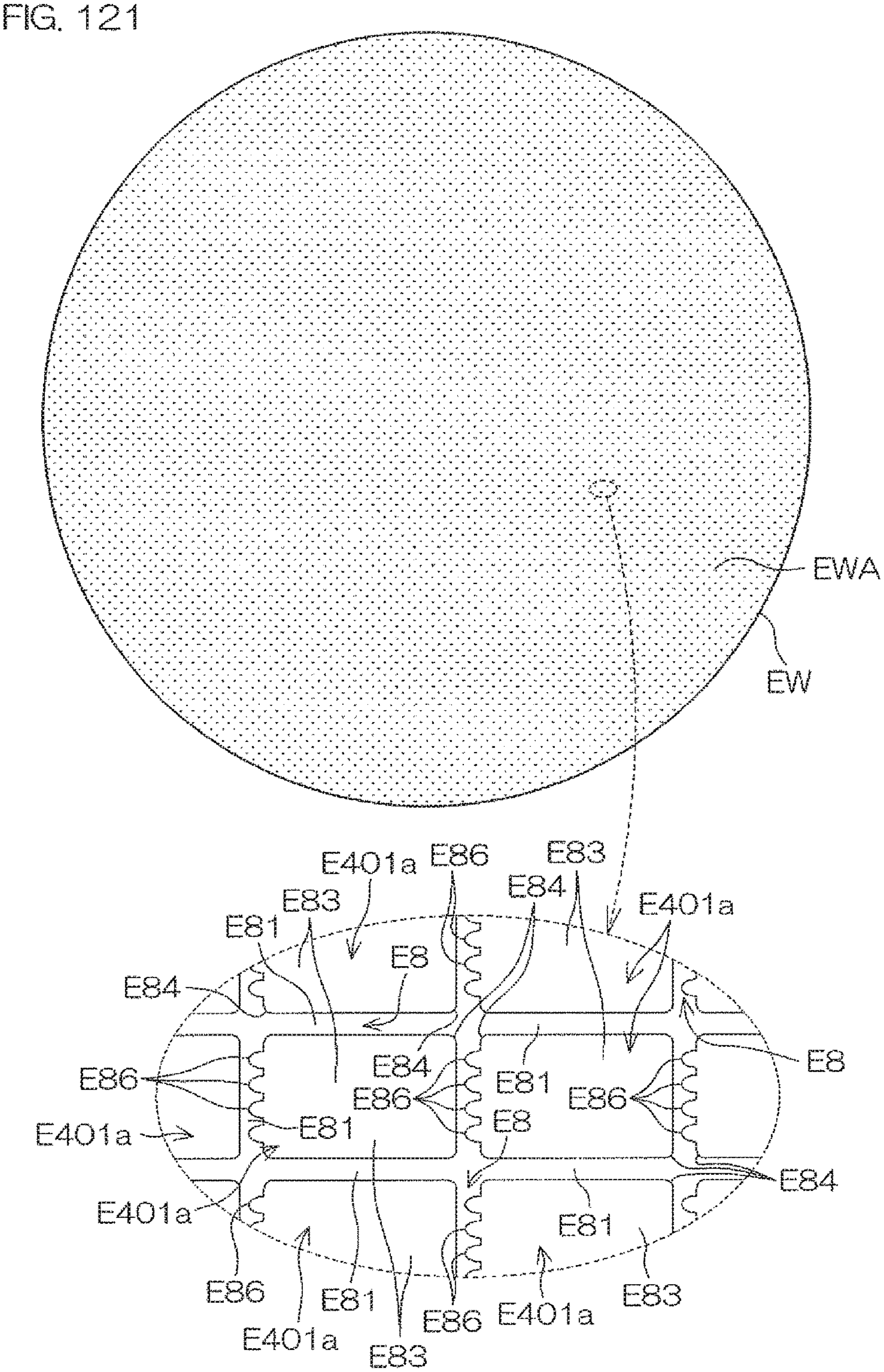

FIG. 121 is a plan view of a semiconductor wafer as a base substrate of the semiconductor substrate of the chip diode and shows a partial region in a magnified manner.

Figure 122:
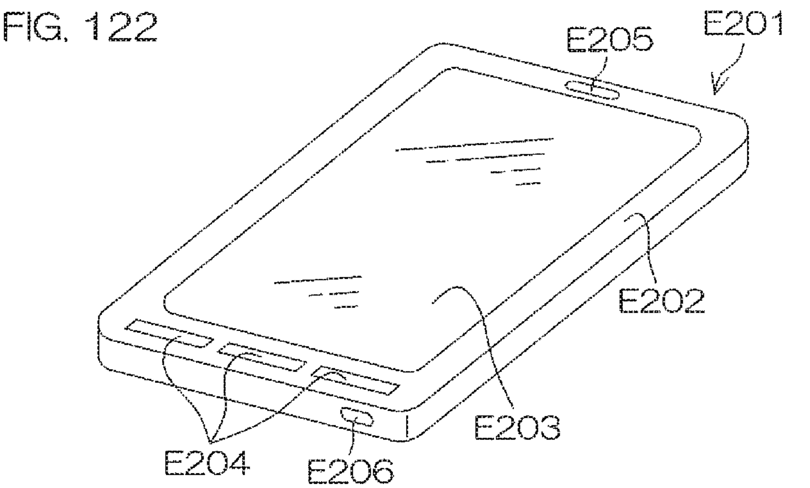

FIG. 122 is a perspective view of an outer appearance of a smartphone that is an example of an electronic equipment in which a chip part is used.

Figure 123:
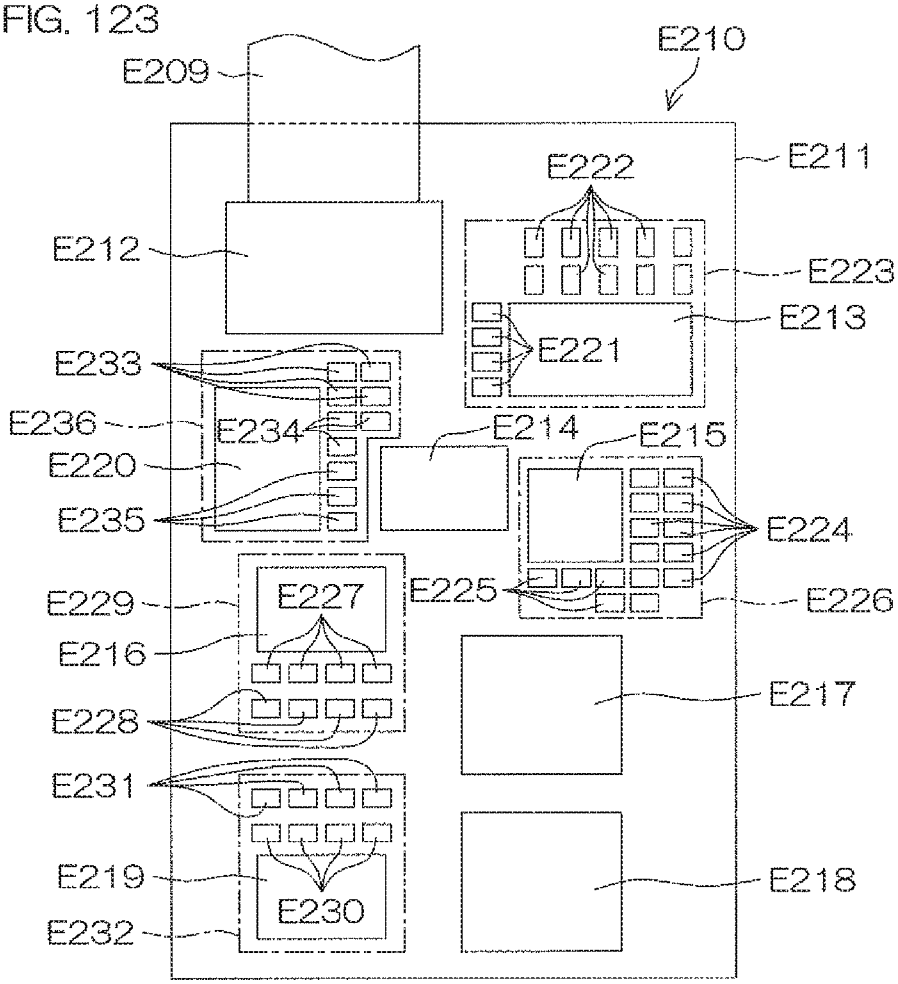

FIG. 123 is an illustrative plan view of the arrangement of an electronic circuit assembly housed in the smartphone.

Figure 124:
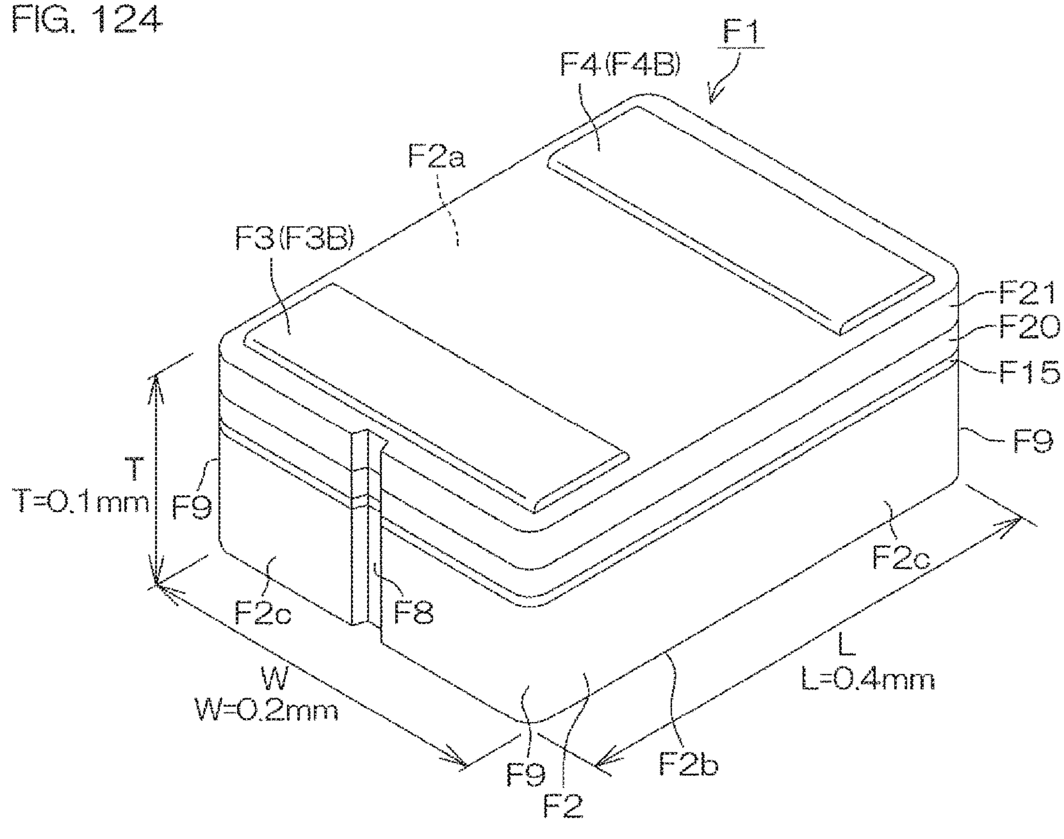

FIG. 124 is a perspective view of a chip diode according to a preferred embodiment of a seventh invention.

Figure 125:
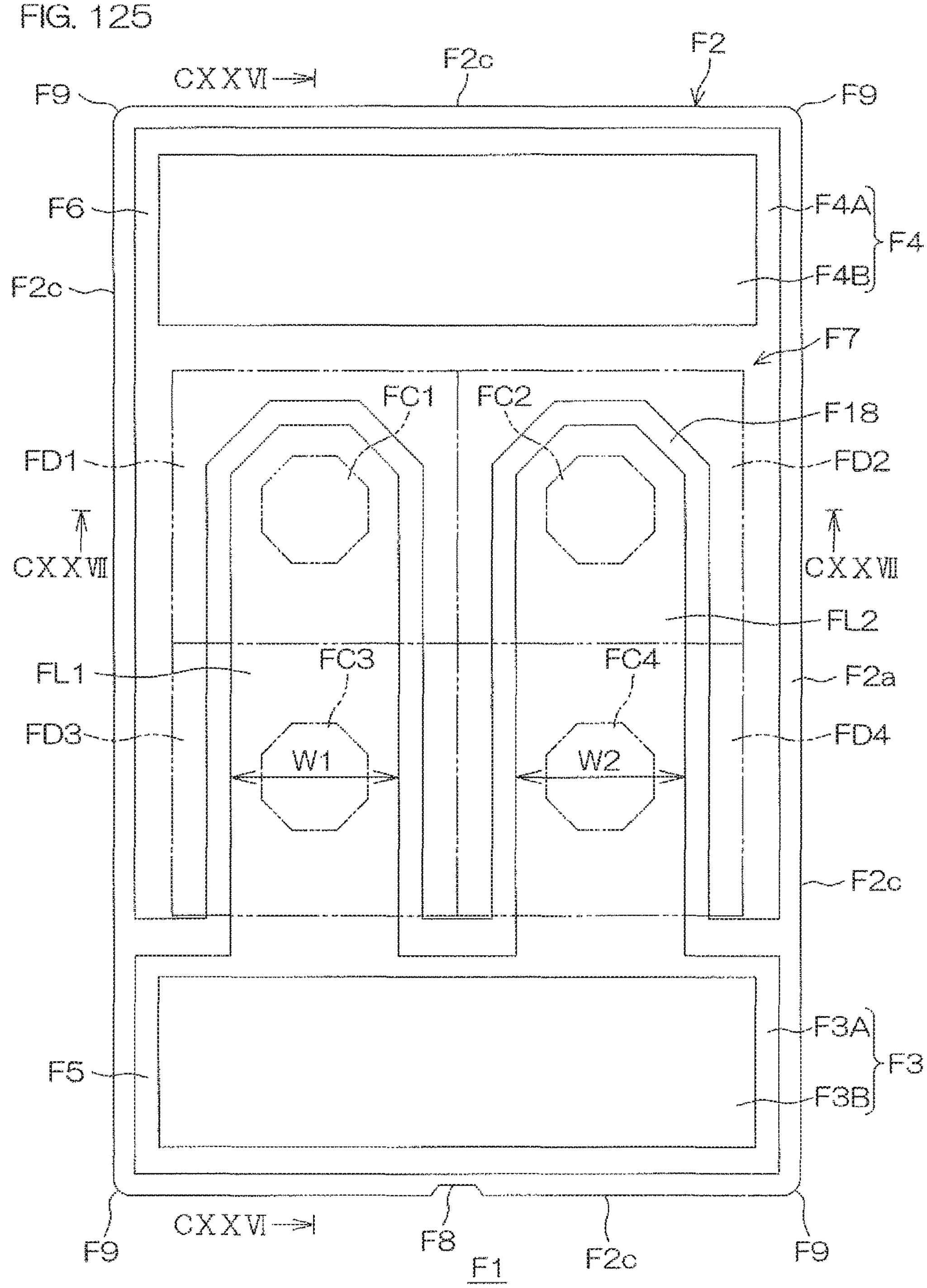

FIG. 125 is a plan view of the chip diode.

Figure 126:
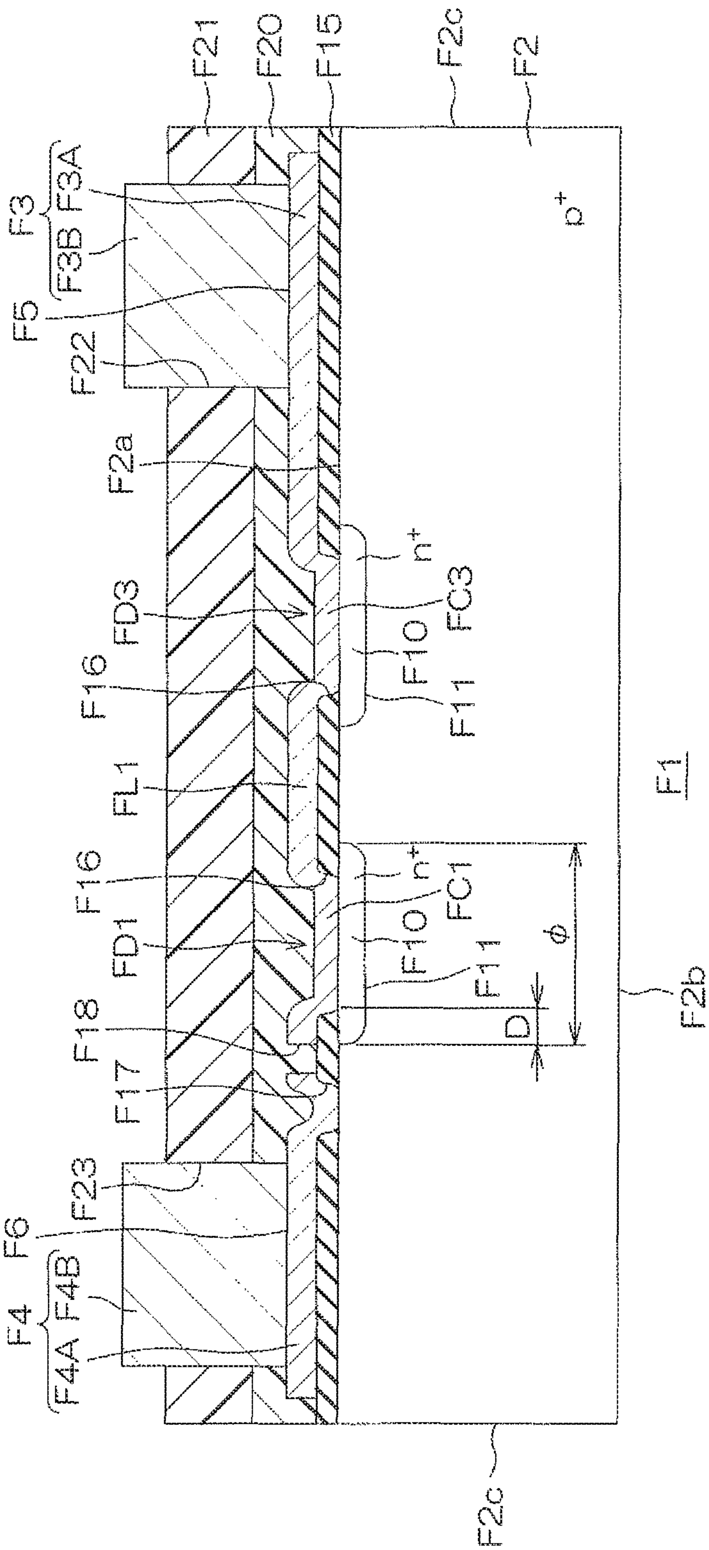

FIG. 126 is a sectional view taken along line CXXVI-CXXVI in FIG. 125.

Figure 127:
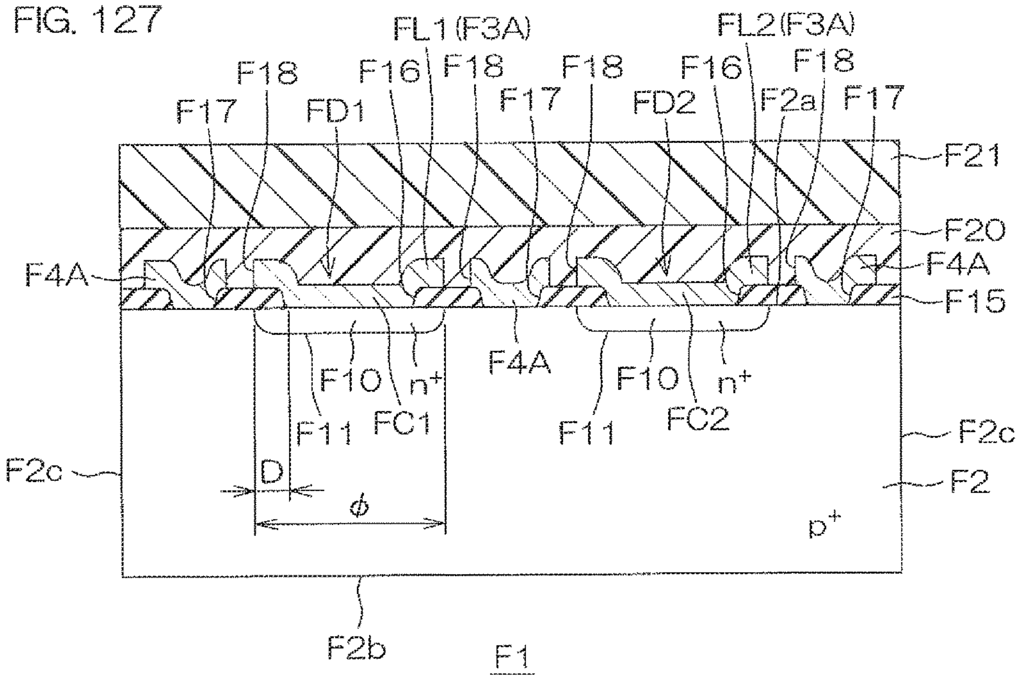

FIG. 127 is a sectional view taken along line CXXVII-CXXVII in FIG. 125.

Figure 128:
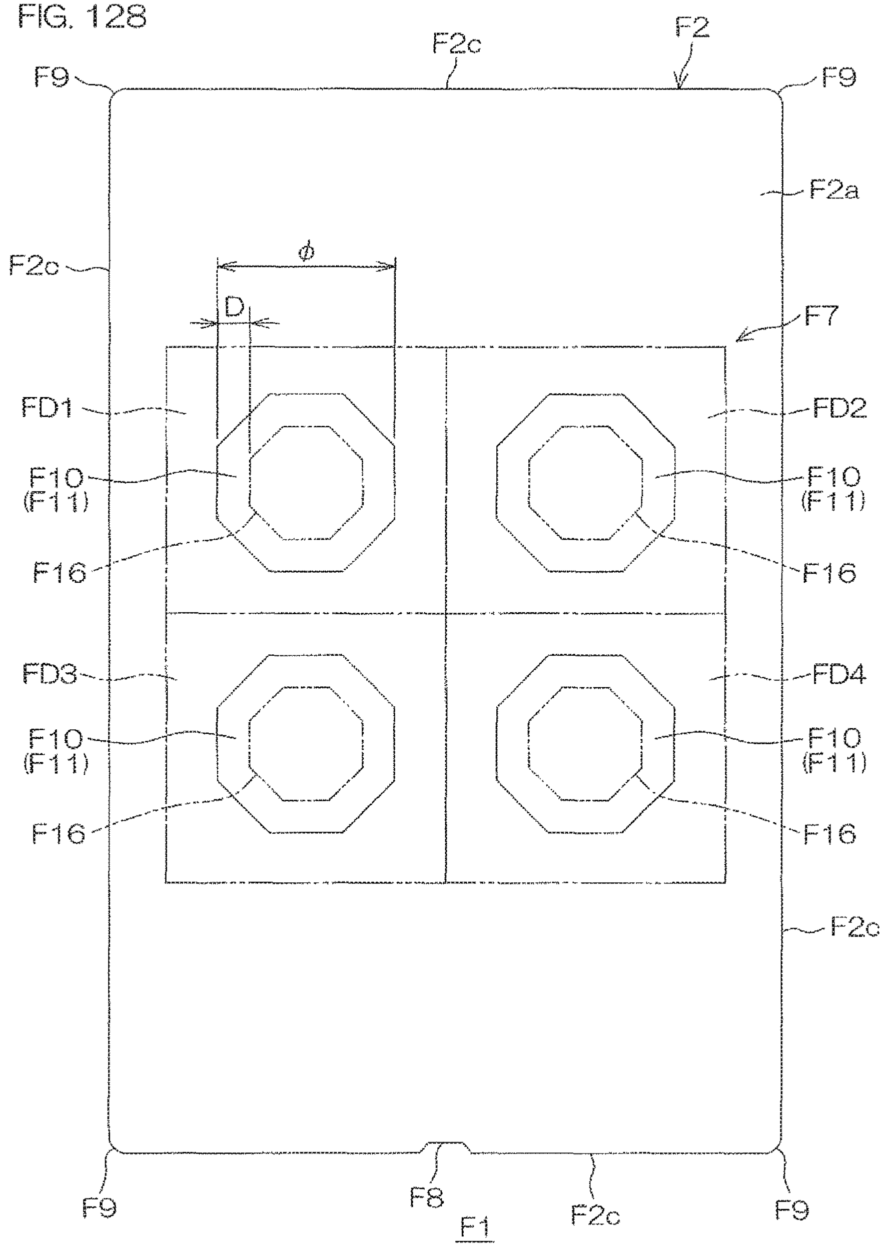

FIG. 128 is a plan view of the chip diode with a cathode electrode, an anode electrode, and the arrangement formed thereon being removed to show the structure of a top surface of a semiconductor substrate.

Figure 129:
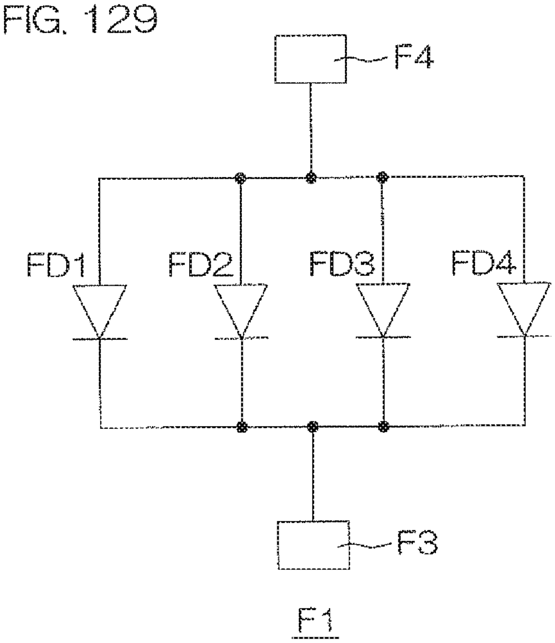

FIG. 129 is an electric circuit diagram showing the electrical structure of the interior of the chip diode.

Figure 130:
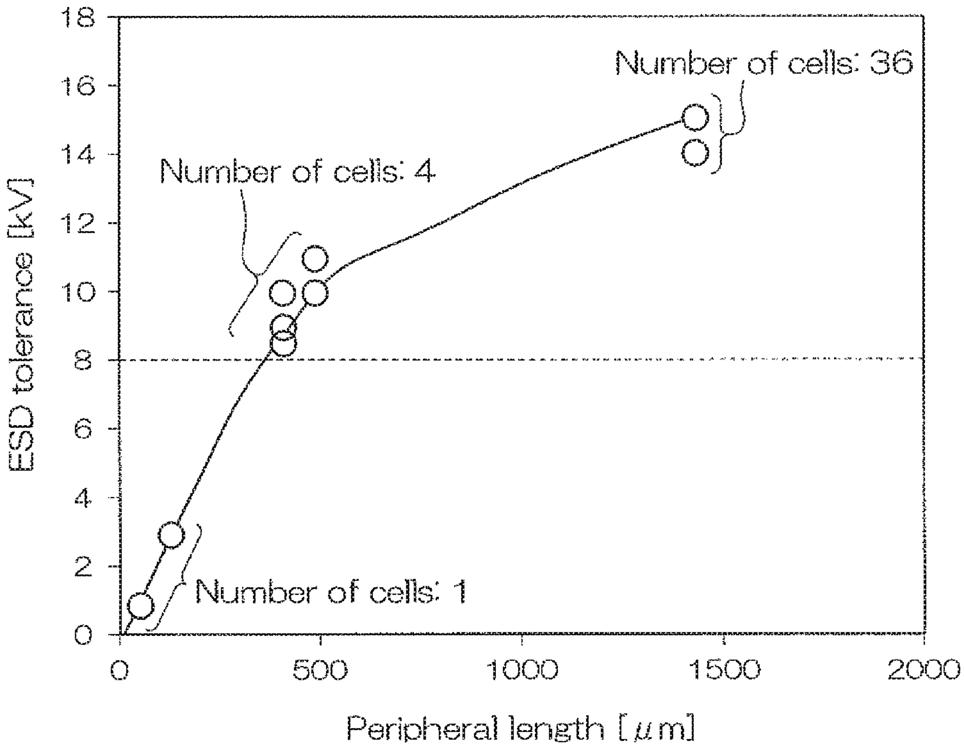

FIG. 130 shows experimental results of measuring the ESD tolerances of a plurality of samples that are differed in total peripheral length (total extension) of p-n junction regions by variously setting the sizes of diode cells and/or the number of the diode cells formed on a semiconductor substrate of the same area.

Figure 131:
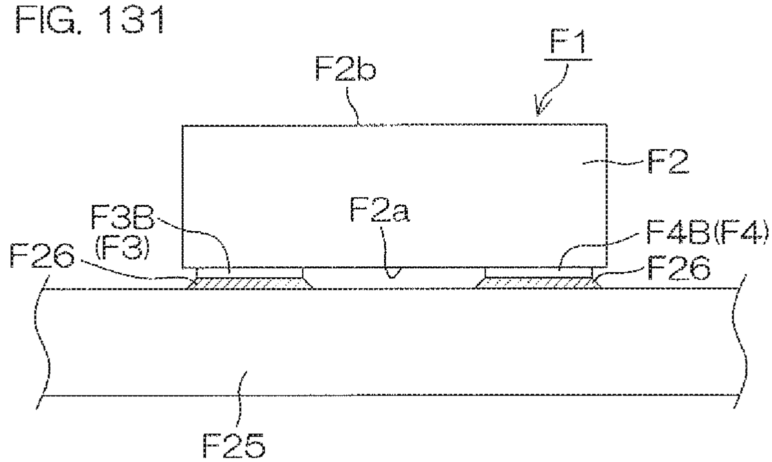

FIG. 131 is a sectional view of the arrangement of a circuit assembly with which the chip diode is flip-chip connected onto a mounting substrate.

Figure 132:
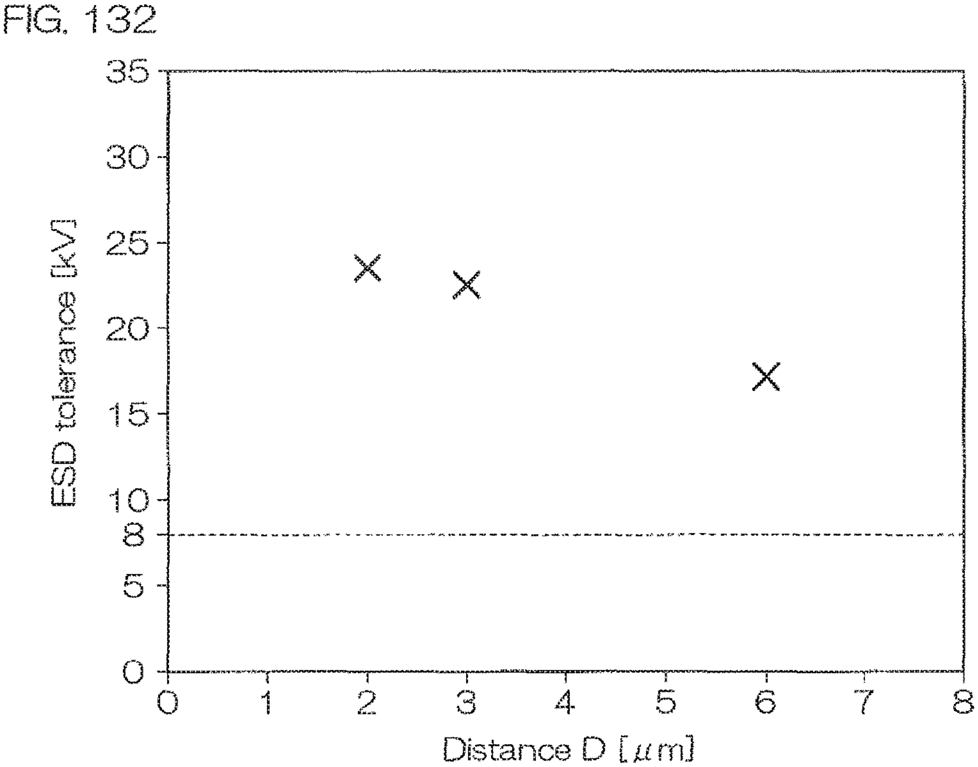

FIG. 132 shows experimental results of measuring the ESD tolerances of a plurality of samples that are differed in a distance D from a peripheral edge of a junction region of the cathode electrode and an $n^+$ type region to a peripheral edge of the $n^+$ type region by variously setting the size of a contact hole with respect to the $n^+$ type region with a diameter $\varphi$ of the same size.

Figure 133:
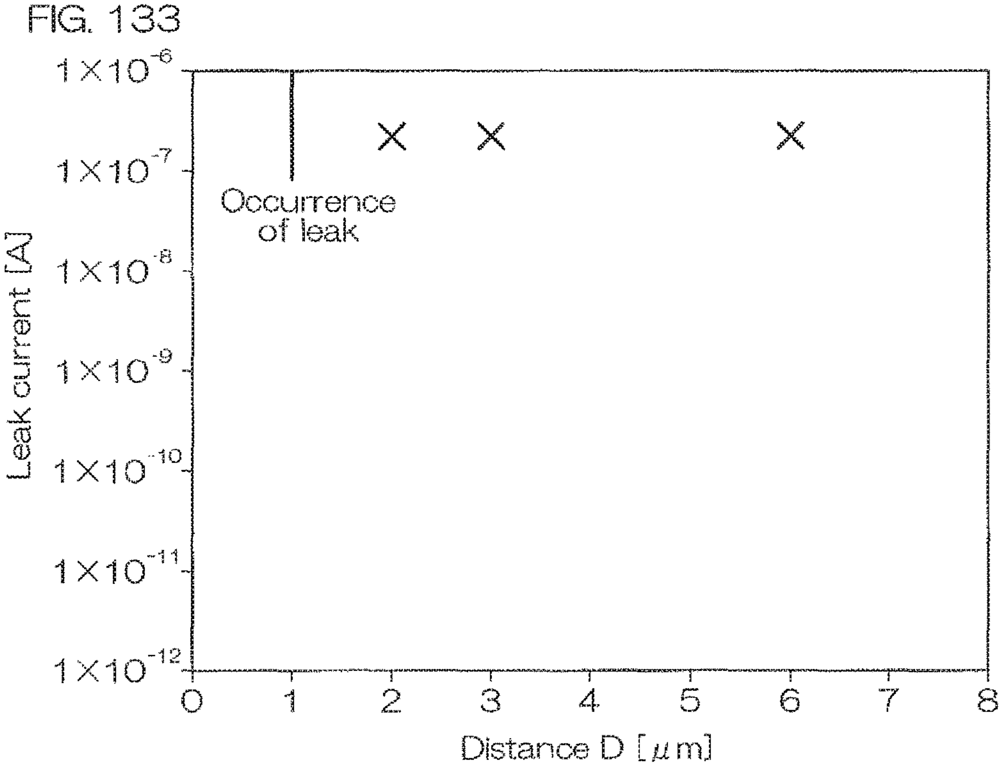

FIG. 133 shows experimental results of measuring the leak currents of the plurality of samples that are differed in the distance D by variously setting the size of the contact hole with respect to the $n^+$ type region with the diameter $\varphi$ of the same size.

Figure 134:
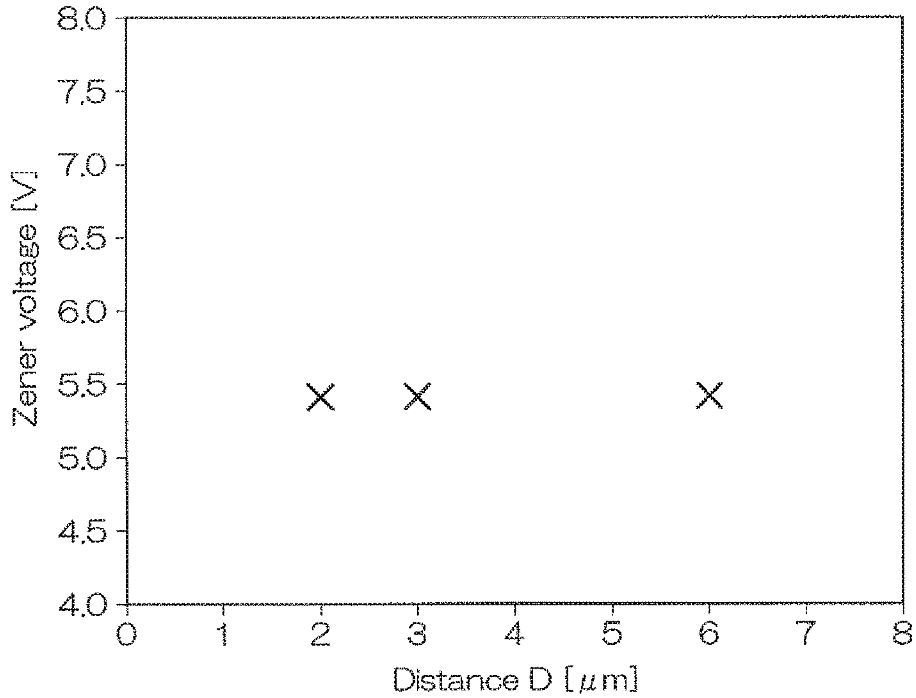

FIG. 134 shows experimental results of measuring the Zener voltage of the plurality of samples that are differed in the distance D by variously setting the size of the contact hole with respect to the $n^+$ type region with the diameter $\varphi$ of the same size.

Figure 135:
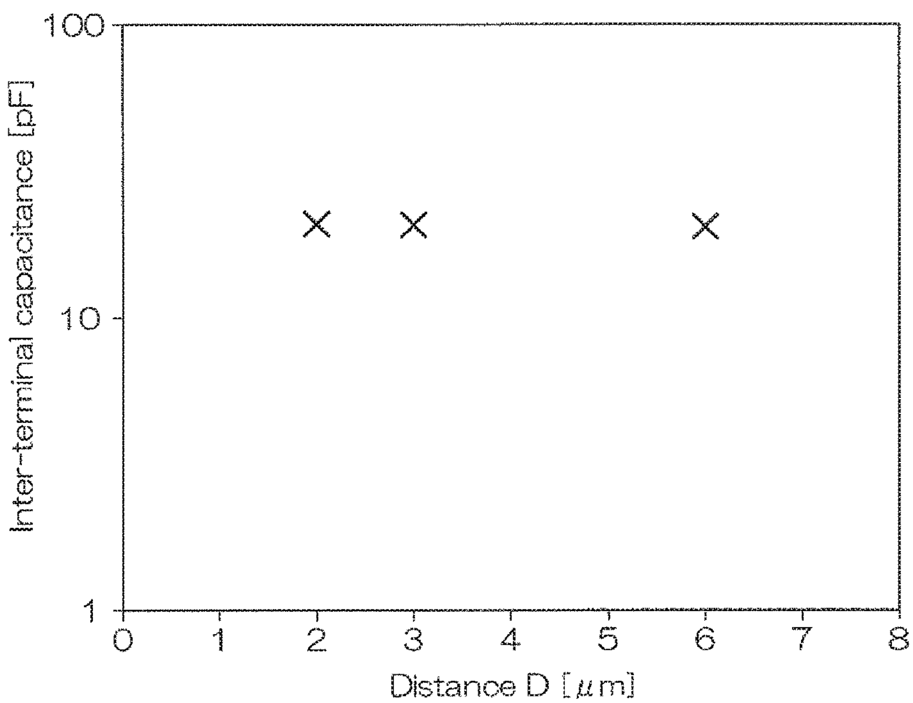

FIG. 135 shows experimental results of measuring the inter-terminal capacitances of the plurality of samples that are differed in the distance D by variously setting the size of the contact hole with respect to the $n^+$ type region with the diameter φ of the same size.

Figure 136:
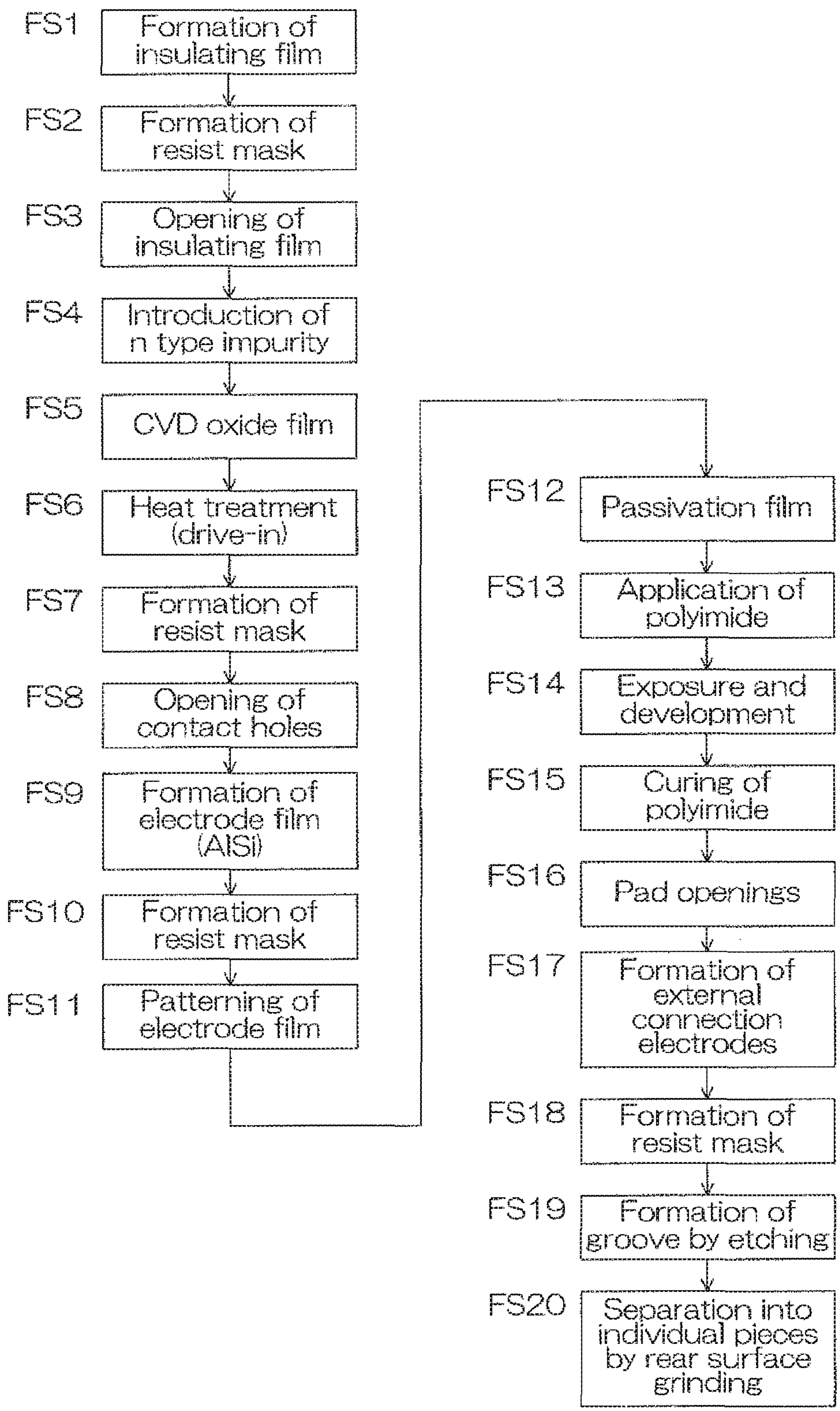

FIG. 136 is a process diagram for describing an example of a manufacturing process of the chip diode.

Figure 137A:
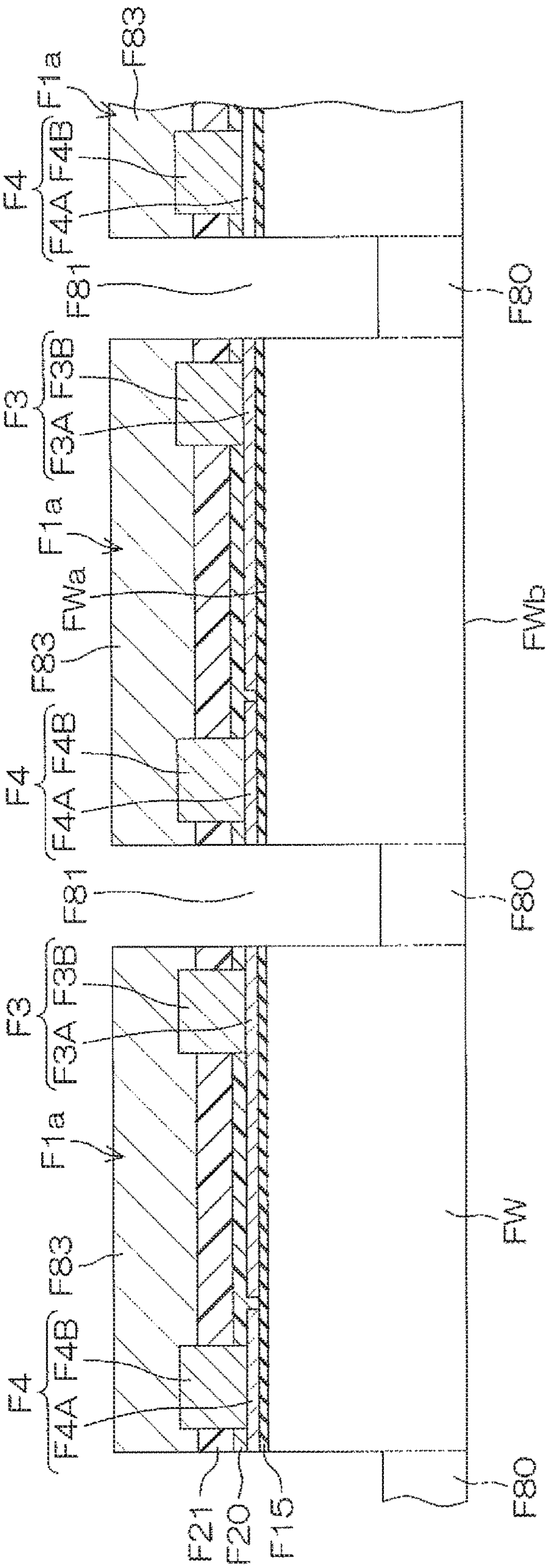

FIG. 137A is a sectional view of the arrangement of the chip diode in the middle of the manufacturing process.

Figure 137B:
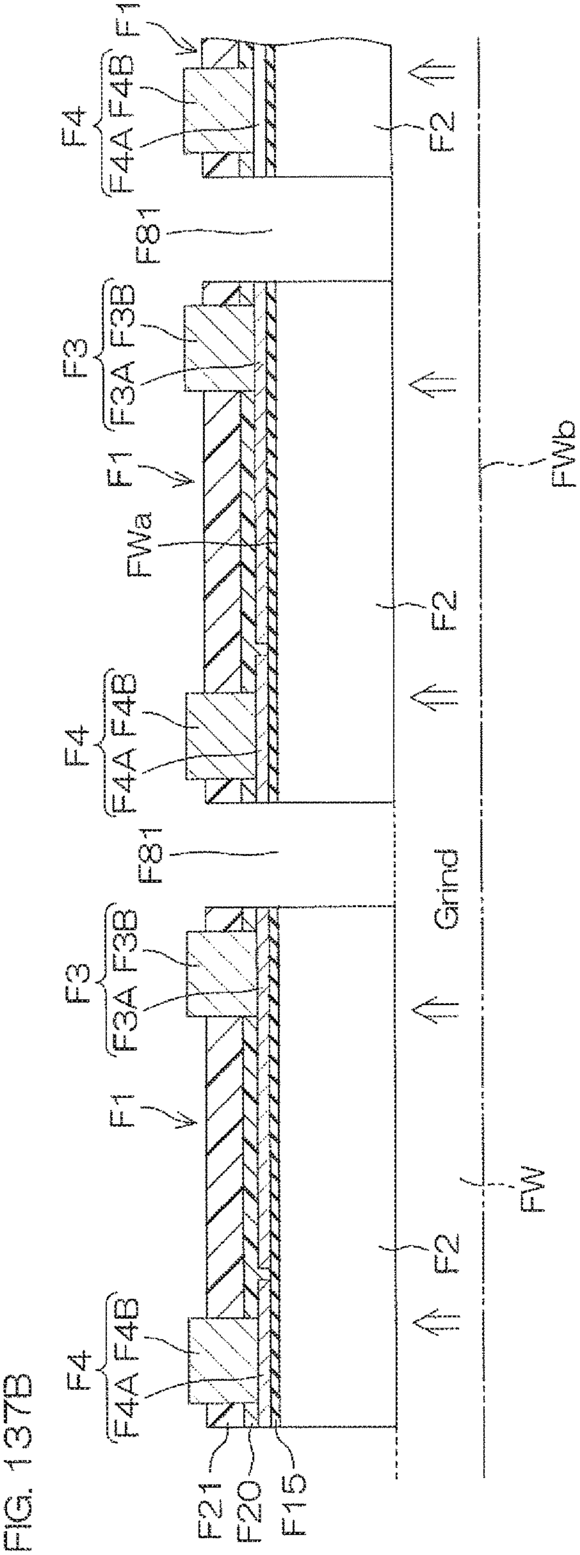

FIG. 137B is a sectional view of the arrangement in a step following that shown in FIG. 137A.

Figure 138:
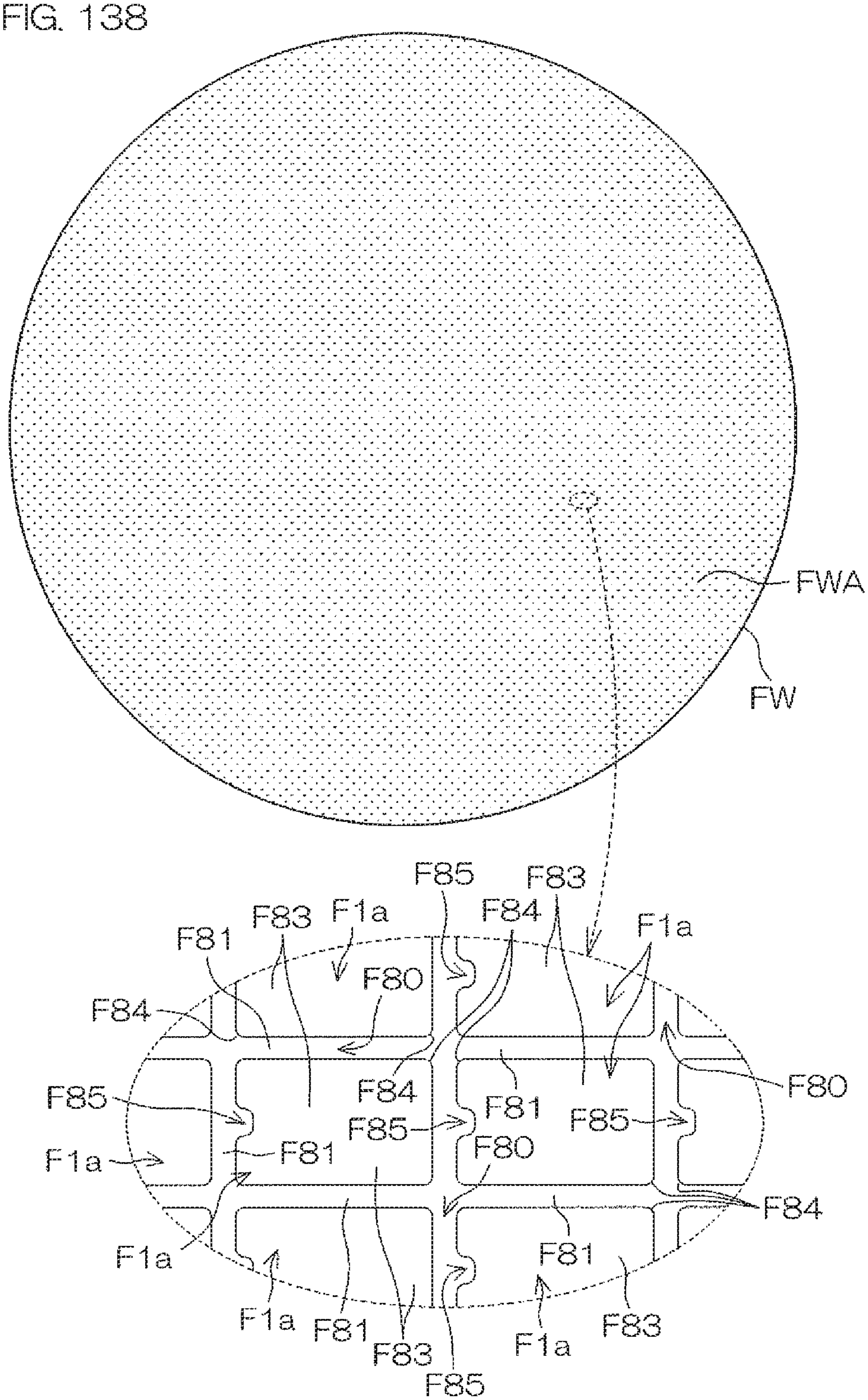

FIG. 138 is a plan view of a semiconductor wafer as a base substrate of the semiconductor substrate of the chip diode and shows a partial region in a magnified manner.

Figure 139:
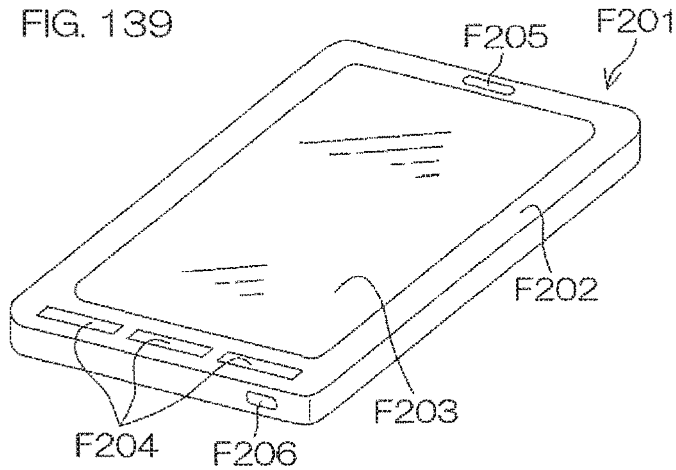

FIG. 139 is a perspective view of an outer appearance of a smartphone that is an example of an electronic equipment in which the chip diode is used.

Figure 140:
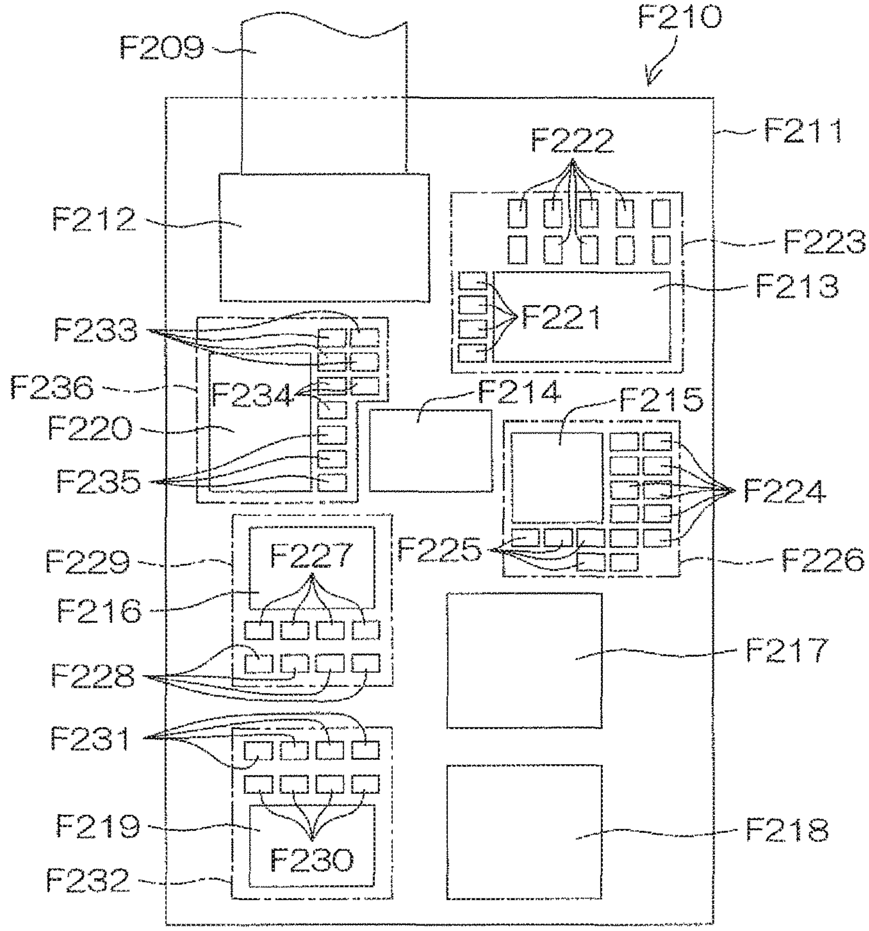

FIG. 140 is an illustrative plan view of the arrangement of an electronic circuit assembly housed in a housing of the smartphone.

Figure 141:
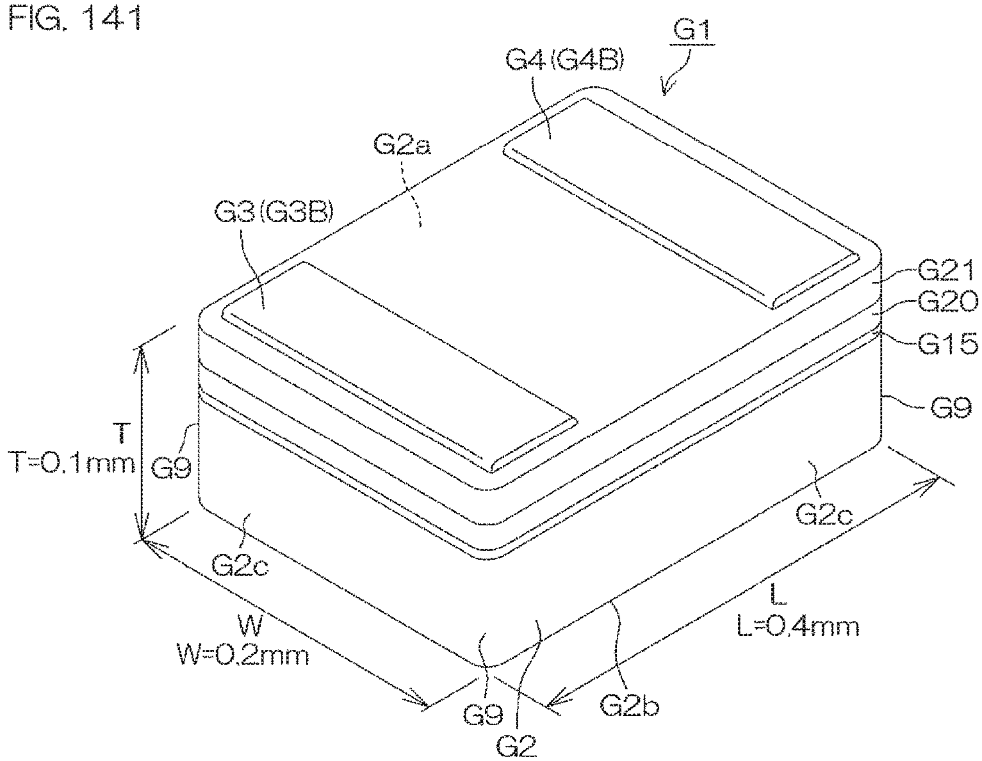

FIG. 141 is a perspective view of a bidirectional Zener diode chip according to a preferred embodiment of an eighth invention.

Figure 142:
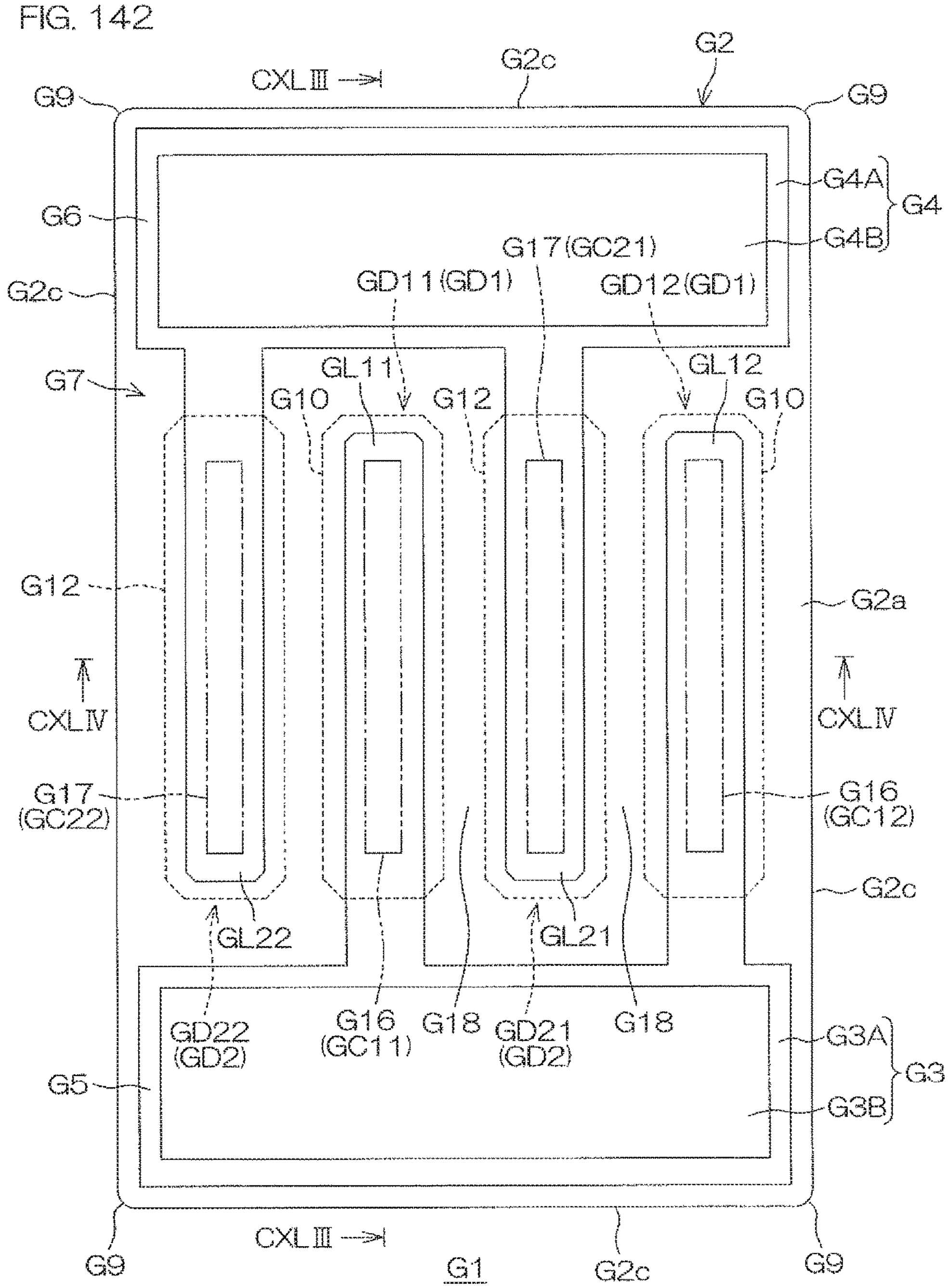

FIG. 142 is a plan view of the bidirectional Zener diode chip.

Figure 143:
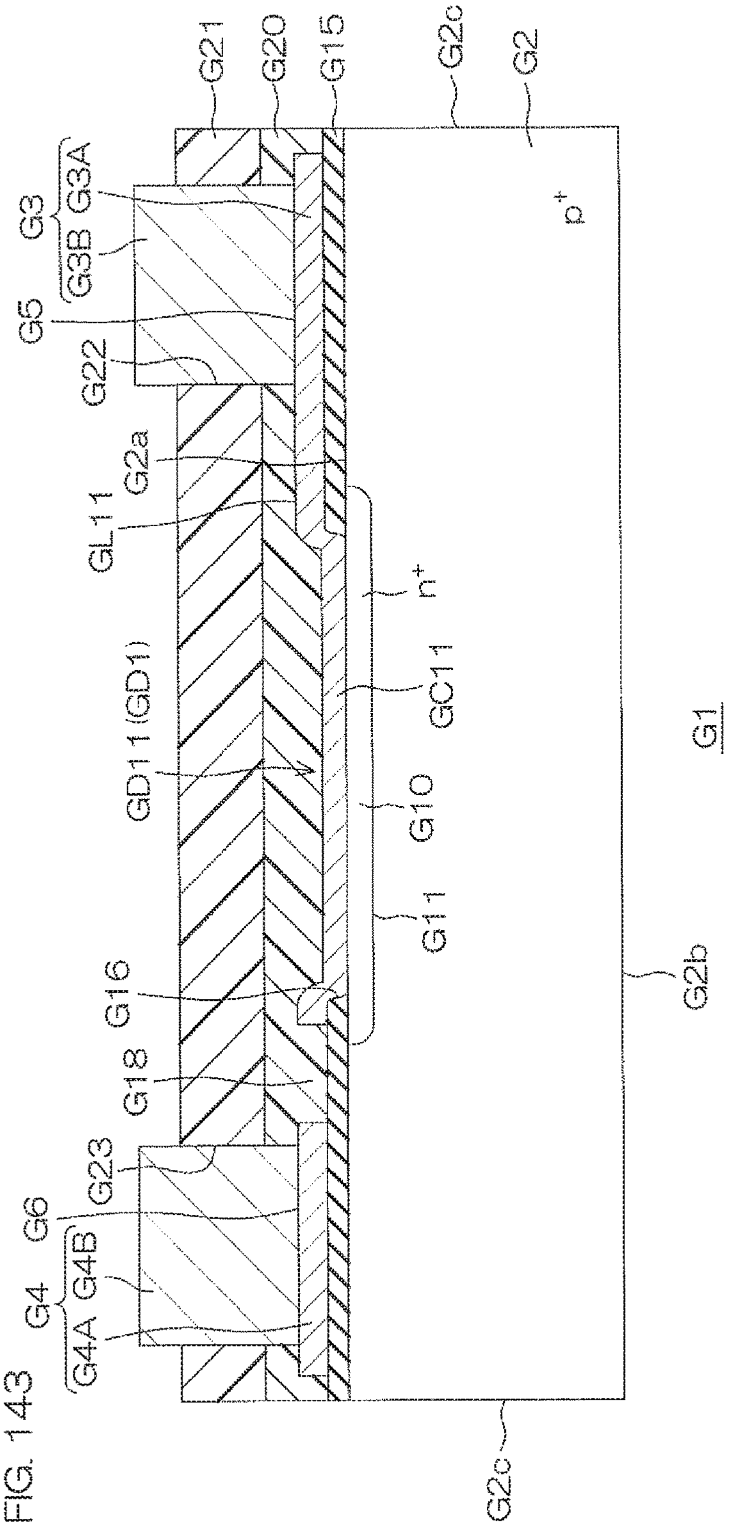

FIG. 143 is a sectional view taken along line CXLIII-CXLIII in FIG. 142.

Figure 144:
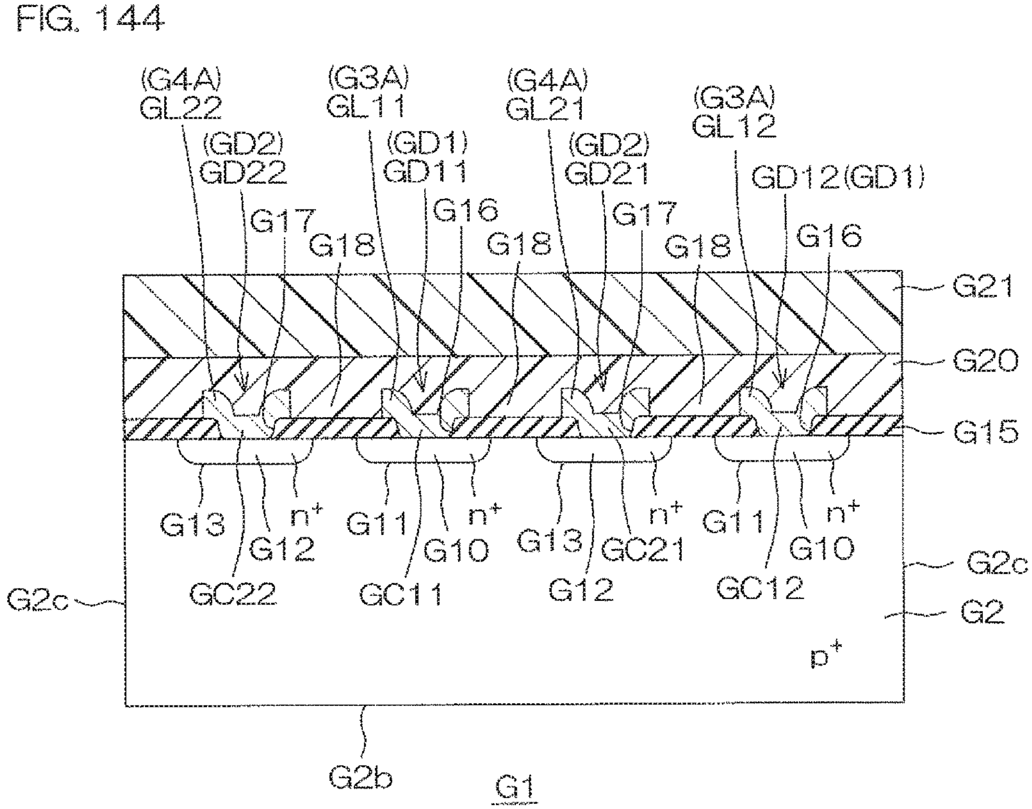

FIG. 144 is a sectional view taken along line CXLIV-CXLIV in FIG. 142.

Figure 145:
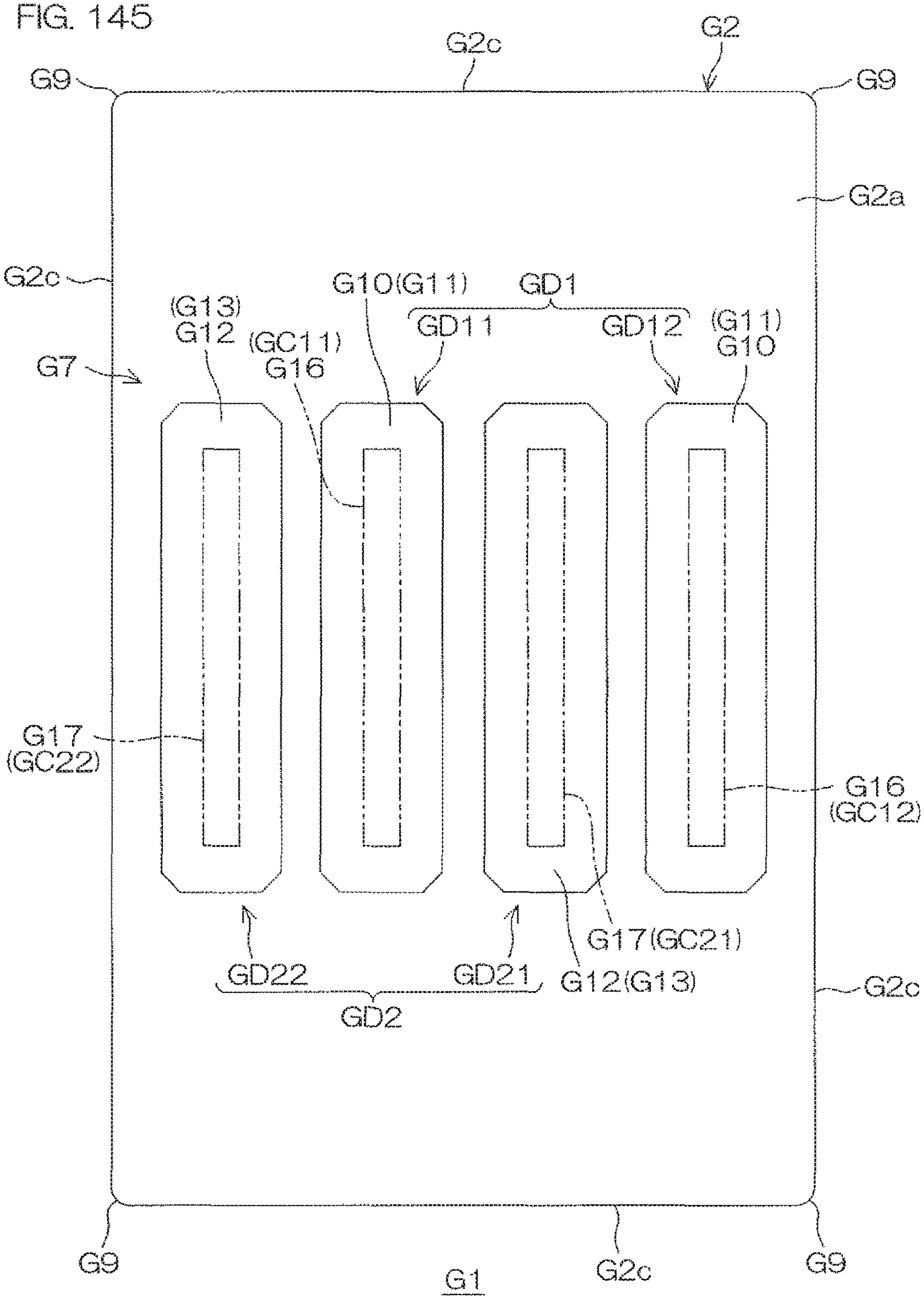

FIG. 145 is a plan view of the bidirectional Zener diode chip with a first electrode, a second electrode, and the arrangement formed thereon being removed to show the structure of a top surface of a semiconductor substrate.

Figure 146:
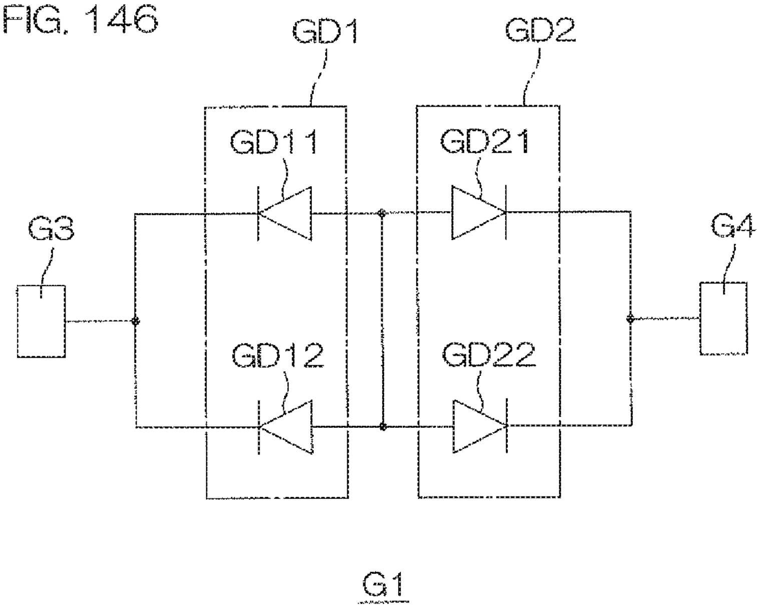

FIG. 146 is an electric circuit diagram showing the electrical structure of the interior of the bidirectional Zener diode chip.

Figure 147A:
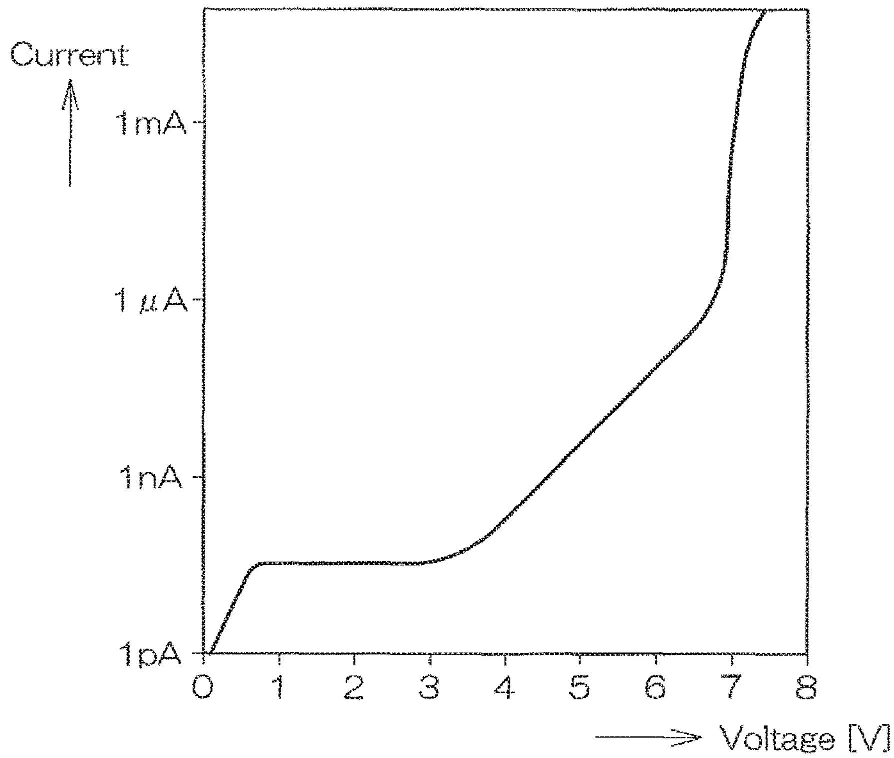

FIG. 147A is a graph of experimental results of measuring, for respective current directions, current vs. voltage characteristics of the bidirectional Zener diode chip.

Figure 147B:
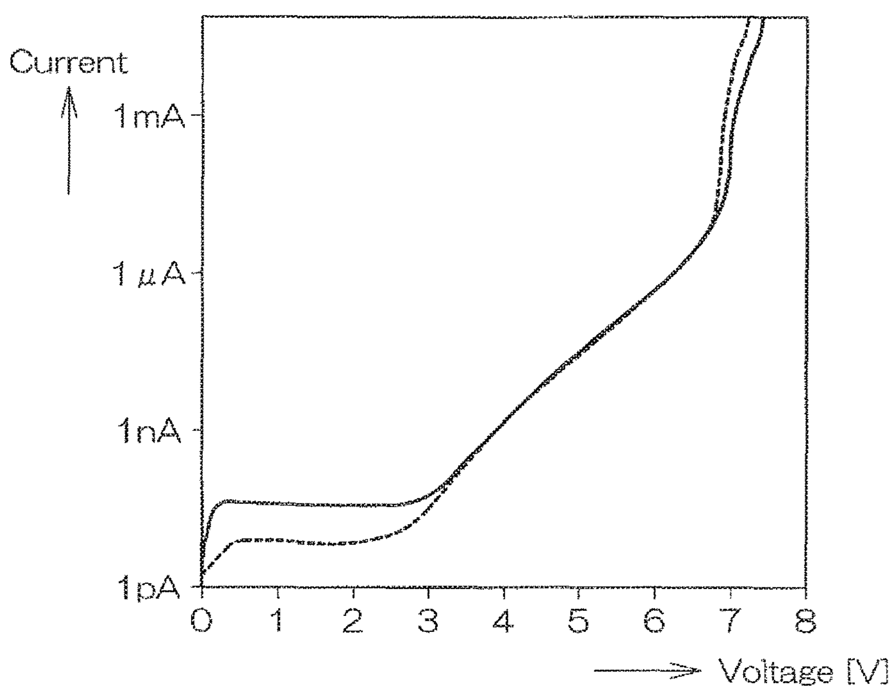

FIG. 147B is a graph of experimental results of measuring, for respective current directions, current vs. voltage characteristics of a bidirectional Zener diode chip (comparative example), with which a first electrode plus first diffusion region and a second electrode plus second diffusion region are arranged to be mutually asymmetrical.

Figure 148:
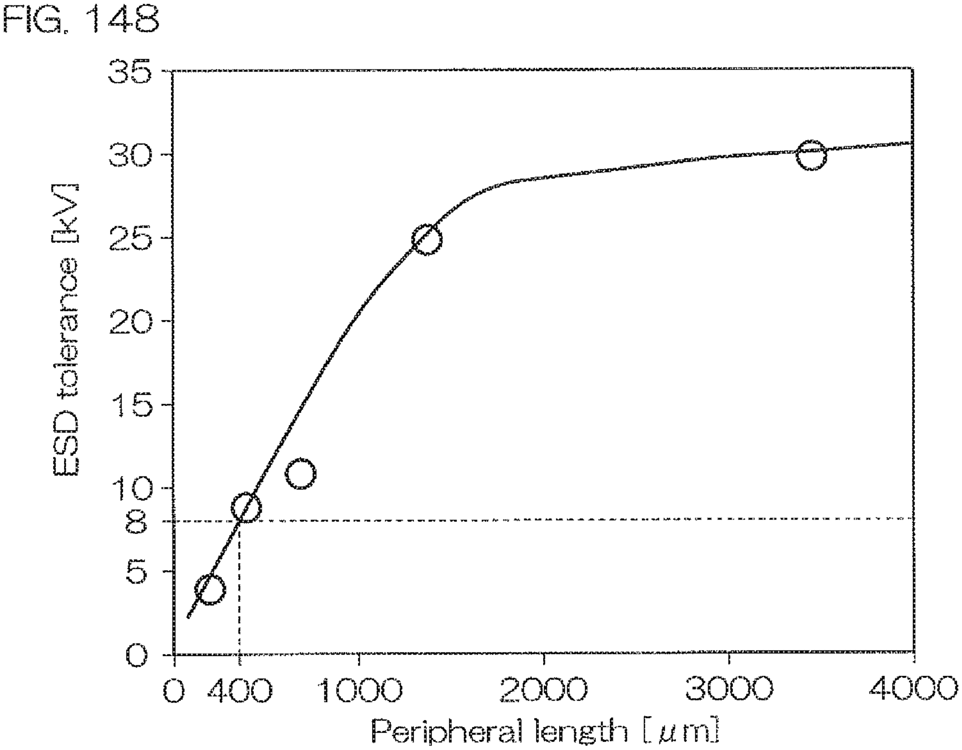

FIG. 148 is a graph of experimental results of measuring the ESD tolerances of a plurality of samples that are differed in respective peripheral lengths of p-n junction regions of a first Zener diode and p-n junction regions of a second Zener diode by variously setting the number of lead-out electrodes (diffusion regions) and/or the sizes of the diffusion regions formed on a semiconductor substrate of the same area.

Figure 149:
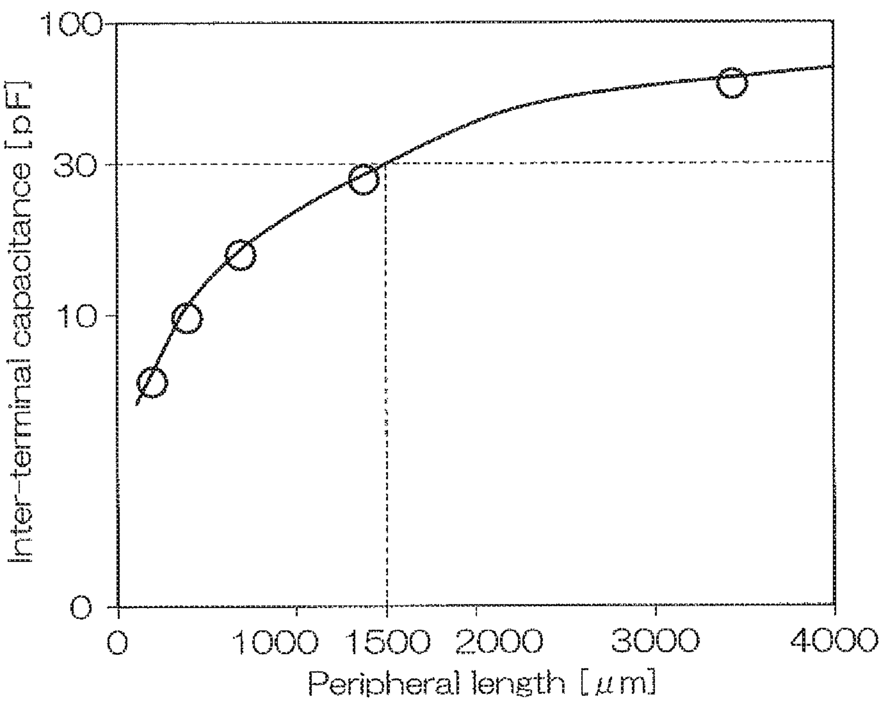

FIG. 149 is a graph of experimental results of measuring the inter-terminal capacitances of the plurality of samples that are differed in the respective peripheral lengths of the p-n junction regions of the first Zener diode and the p-n junction regions of the second Zener diode by variously setting the number of lead-out electrodes (diffusion regions) and/or the sizes of the diffusion regions formed on the semiconductor substrate of the same area.

Figure 150:
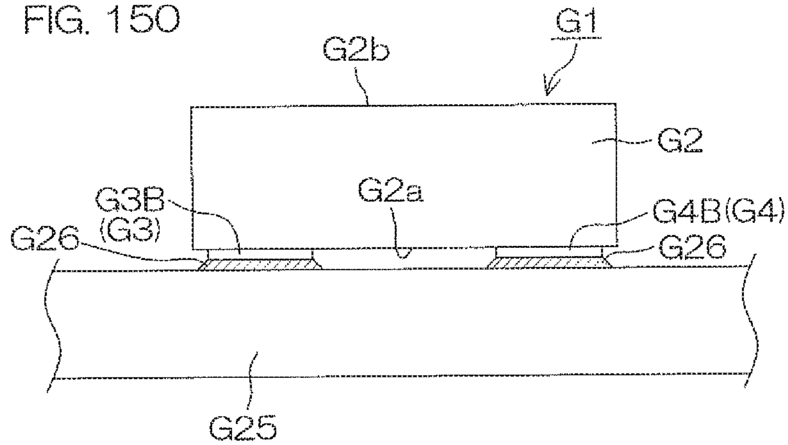

FIG. 150 is a sectional view of the arrangement of a circuit assembly with which the bidirectional Zener diode chip is flip-chip connected onto a mounting substrate.

Figure 151:
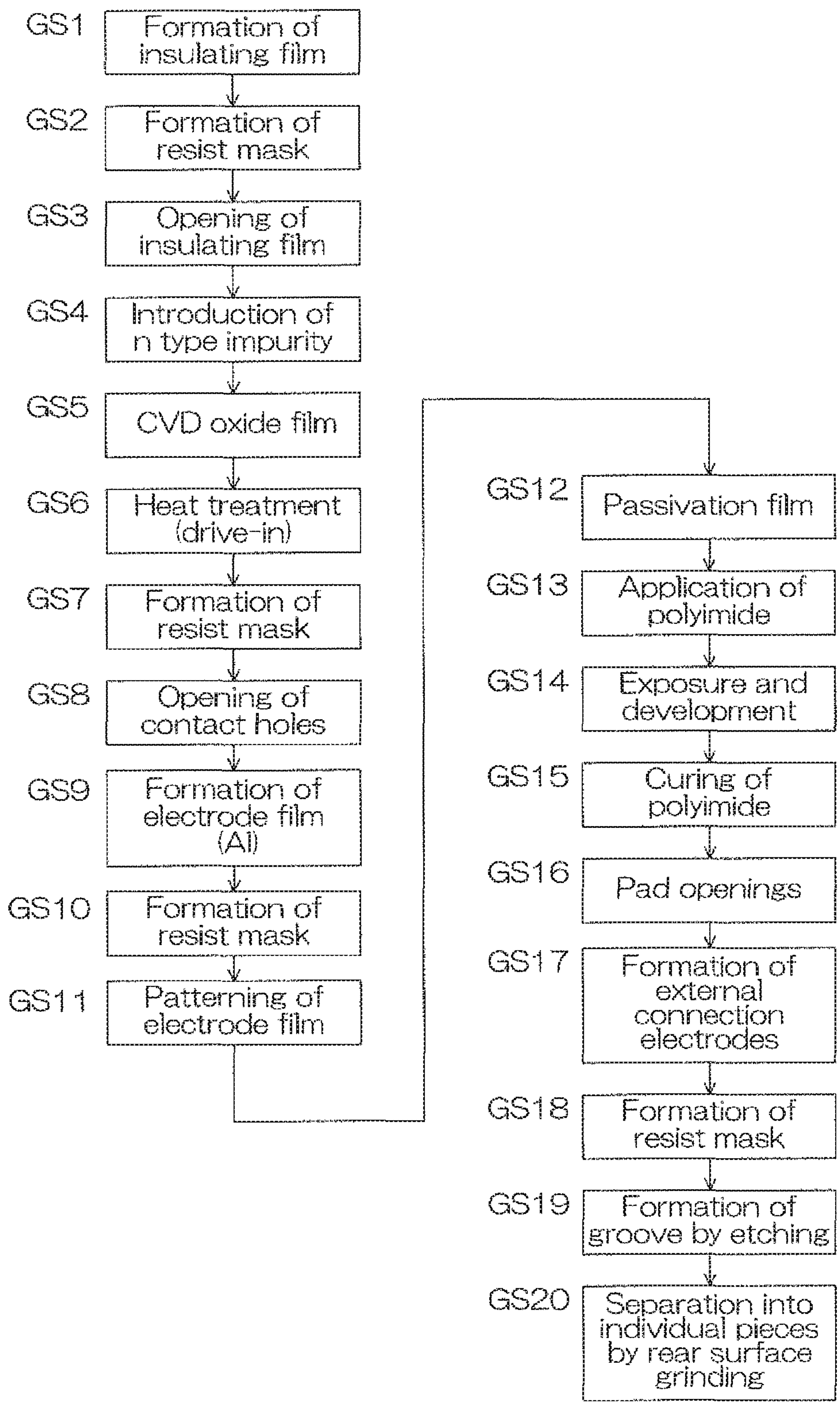

FIG. 151 is a process diagram for describing an example of a manufacturing process of the bidirectional Zener diode chip.

Figure 152A:
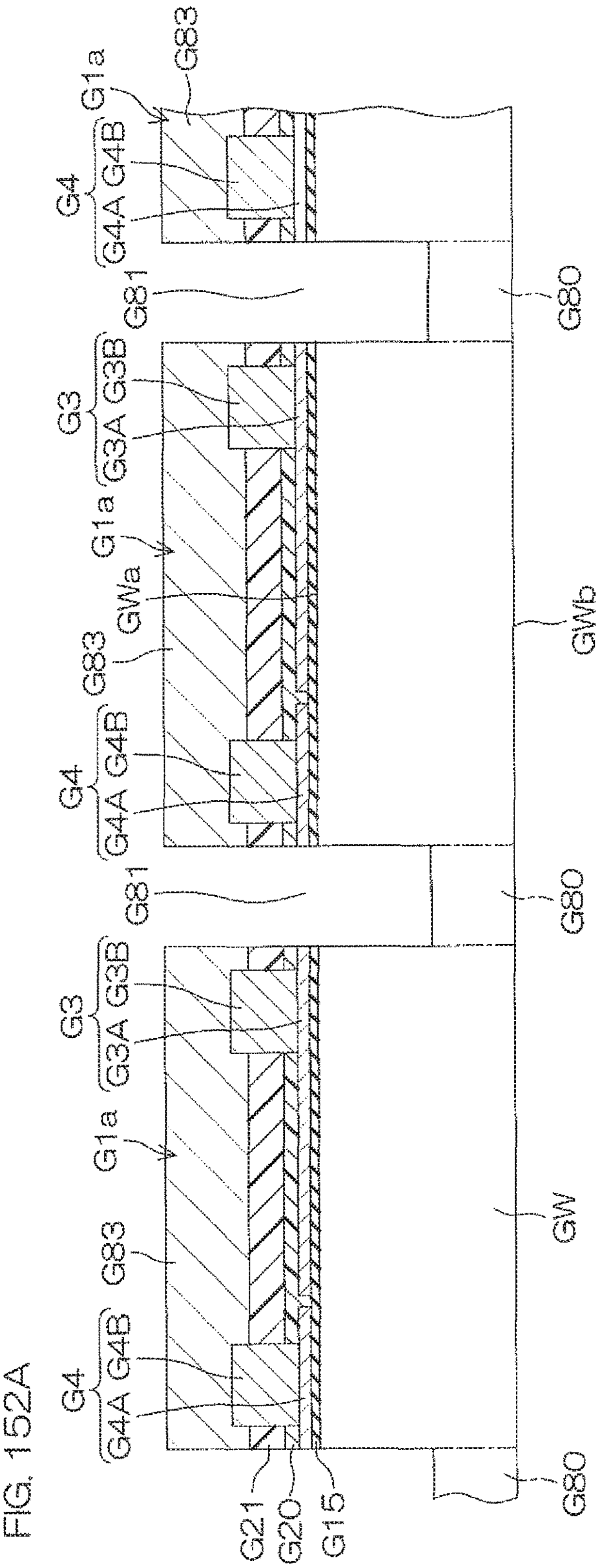

FIG. 152A is a sectional view of the arrangement of the bidirectional Zener diode chip in the middle of the manufacturing process.

Figure 152B:
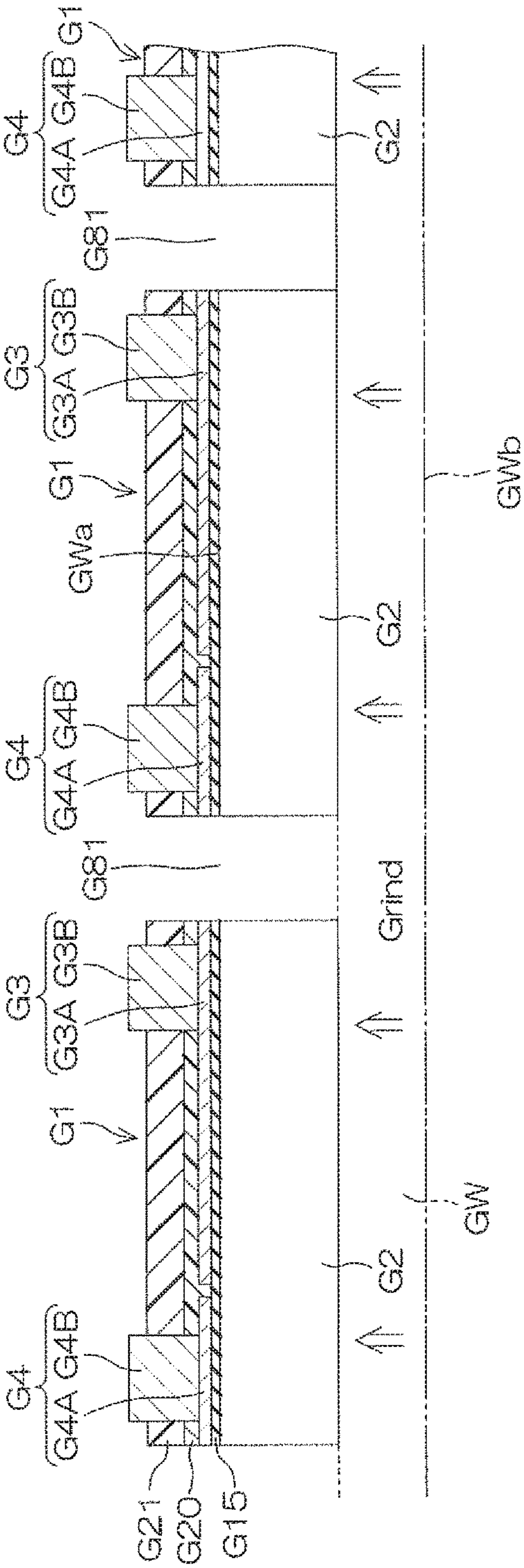

FIG. 152B is a sectional view of the arrangement in a step following that shown in FIG. 152A.

Figure 153:
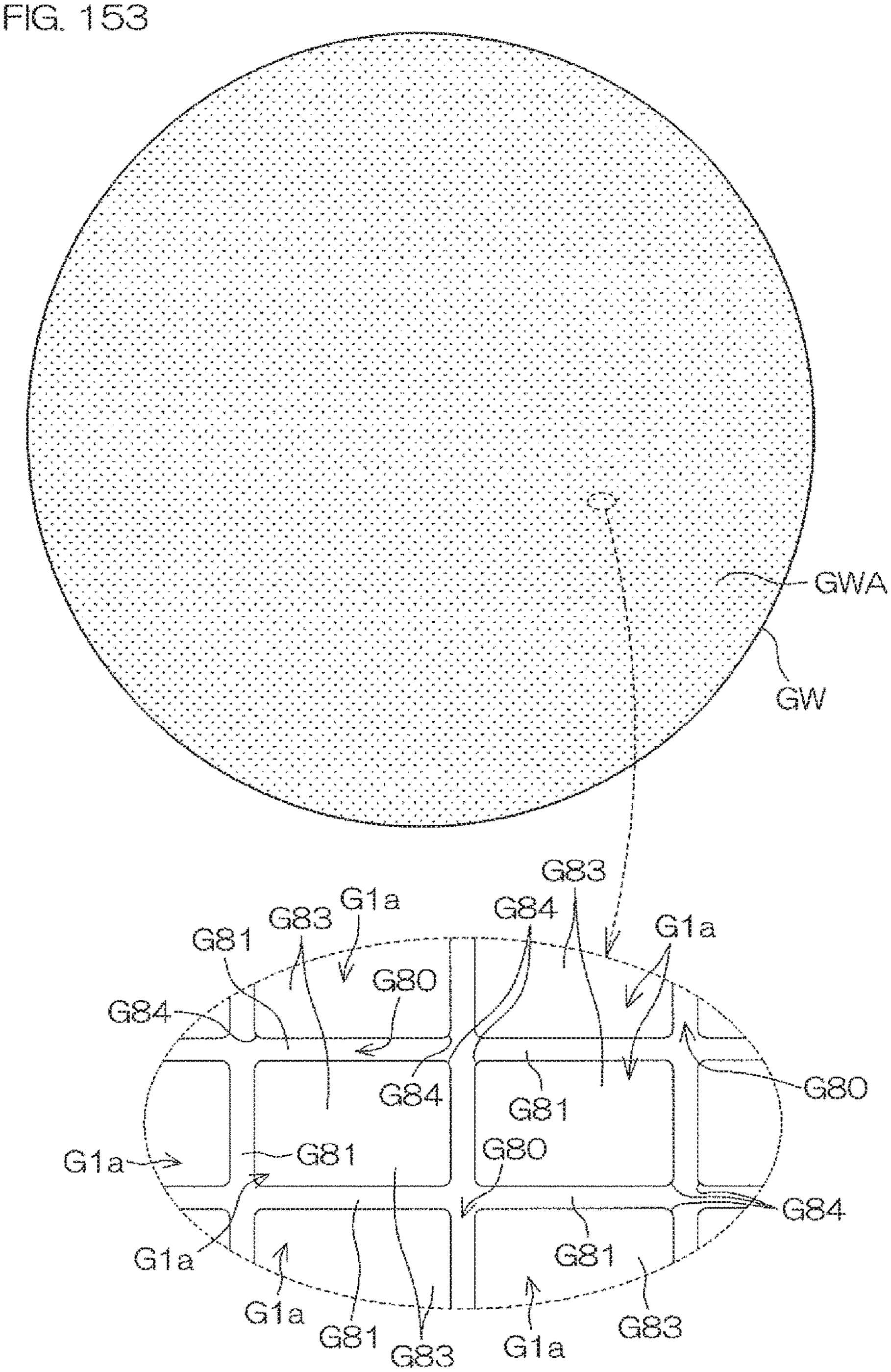

FIG. 153 is a plan view of a semiconductor wafer as a base substrate of the semiconductor substrate of the bidirectional Zener diode chip and shows a partial region in a magnified manner.

Figure 154:
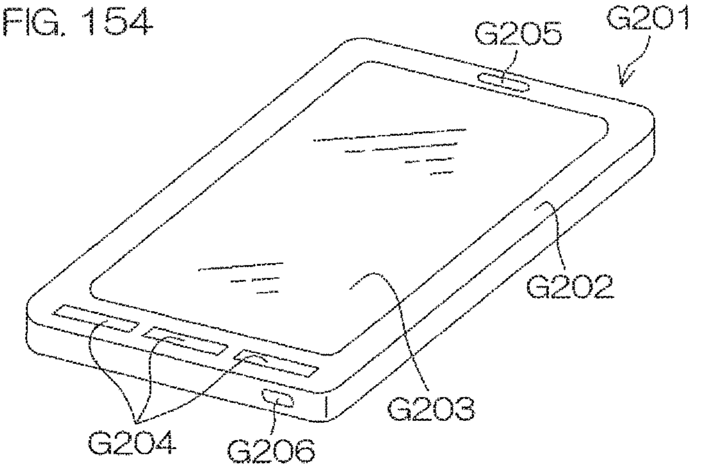

FIG. 154 is a perspective view of an outer appearance of a smartphone that is an example of an electronic equipment in which the bidirectional Zener diode chip is used.

Figure 155:
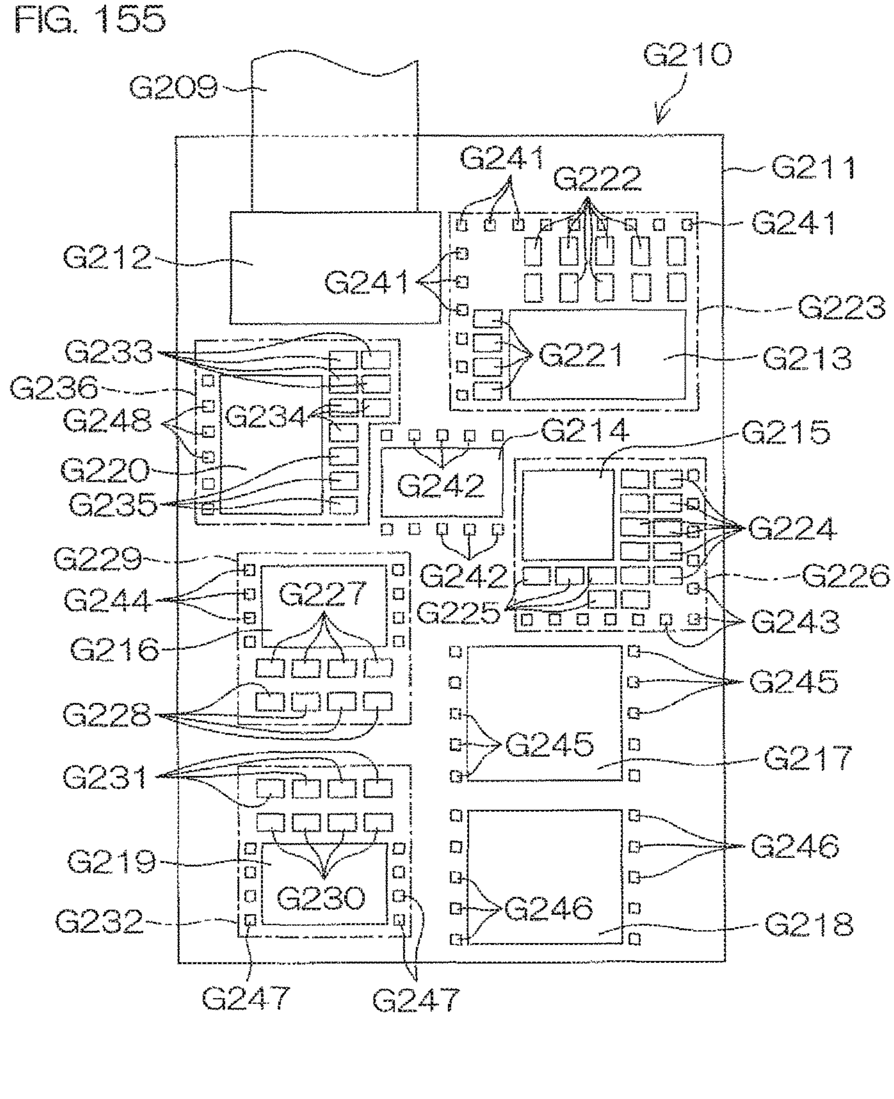

FIG. 155 is an illustrative plan view of the arrangement of an electronic circuit assembly housed in a housing of the smartphone.

Figure 156A:
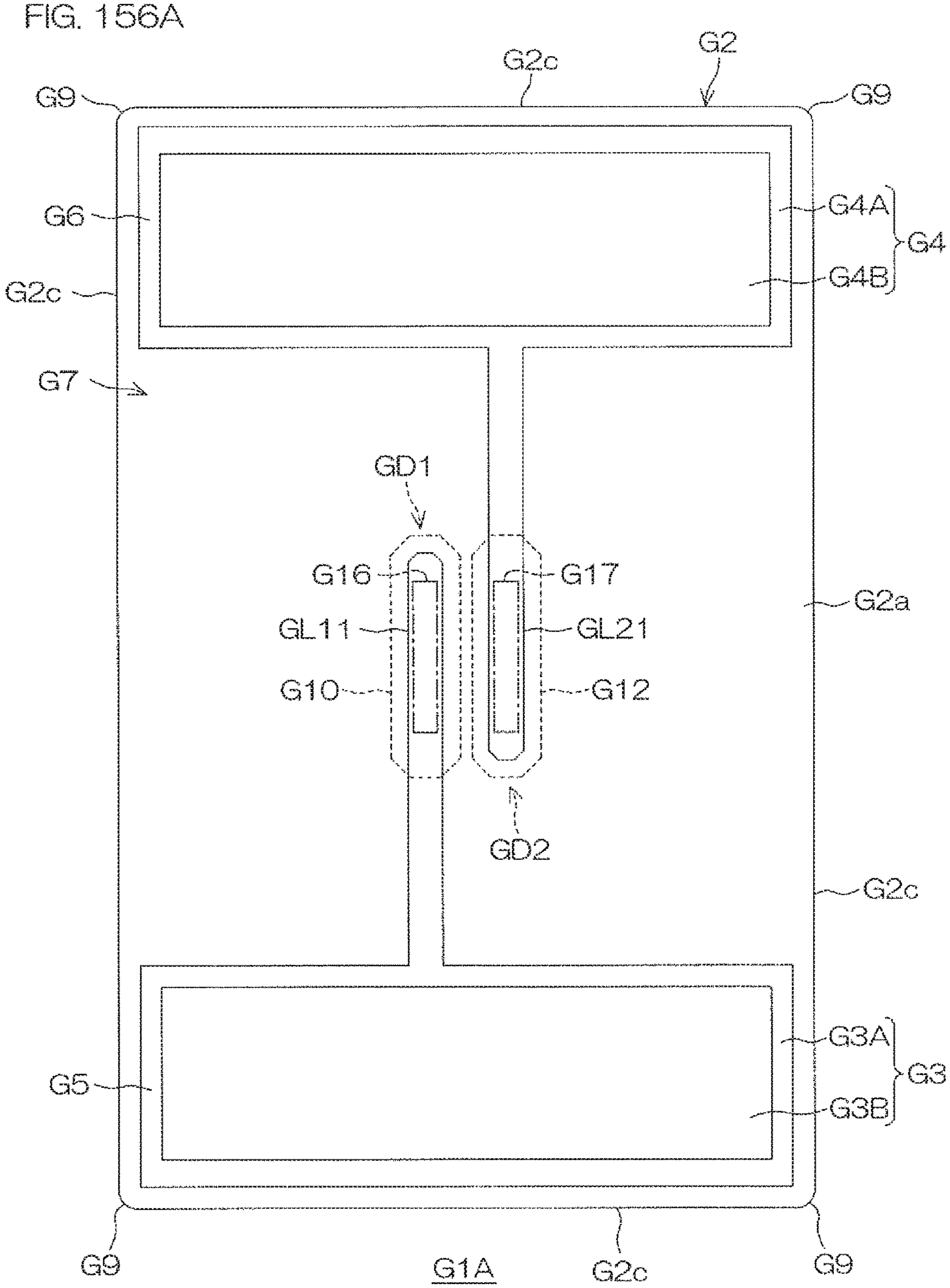

FIG. 156A is a plan view of a modification example of the bidirectional Zener diode chip.

Figure 156B:
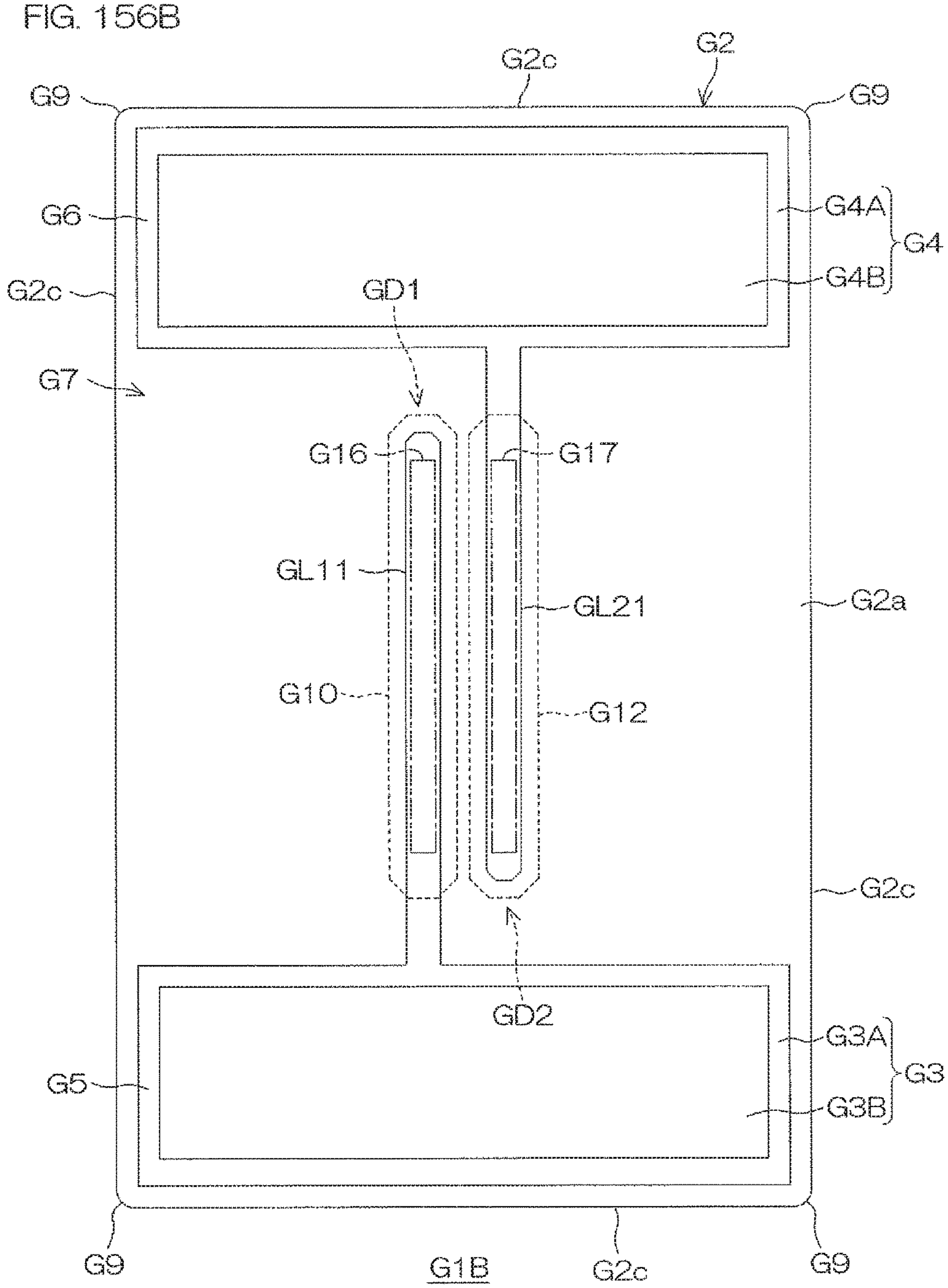

FIG. 156B is a plan view of another modification example of the bidirectional Zener diode chip.

Figure 156C:
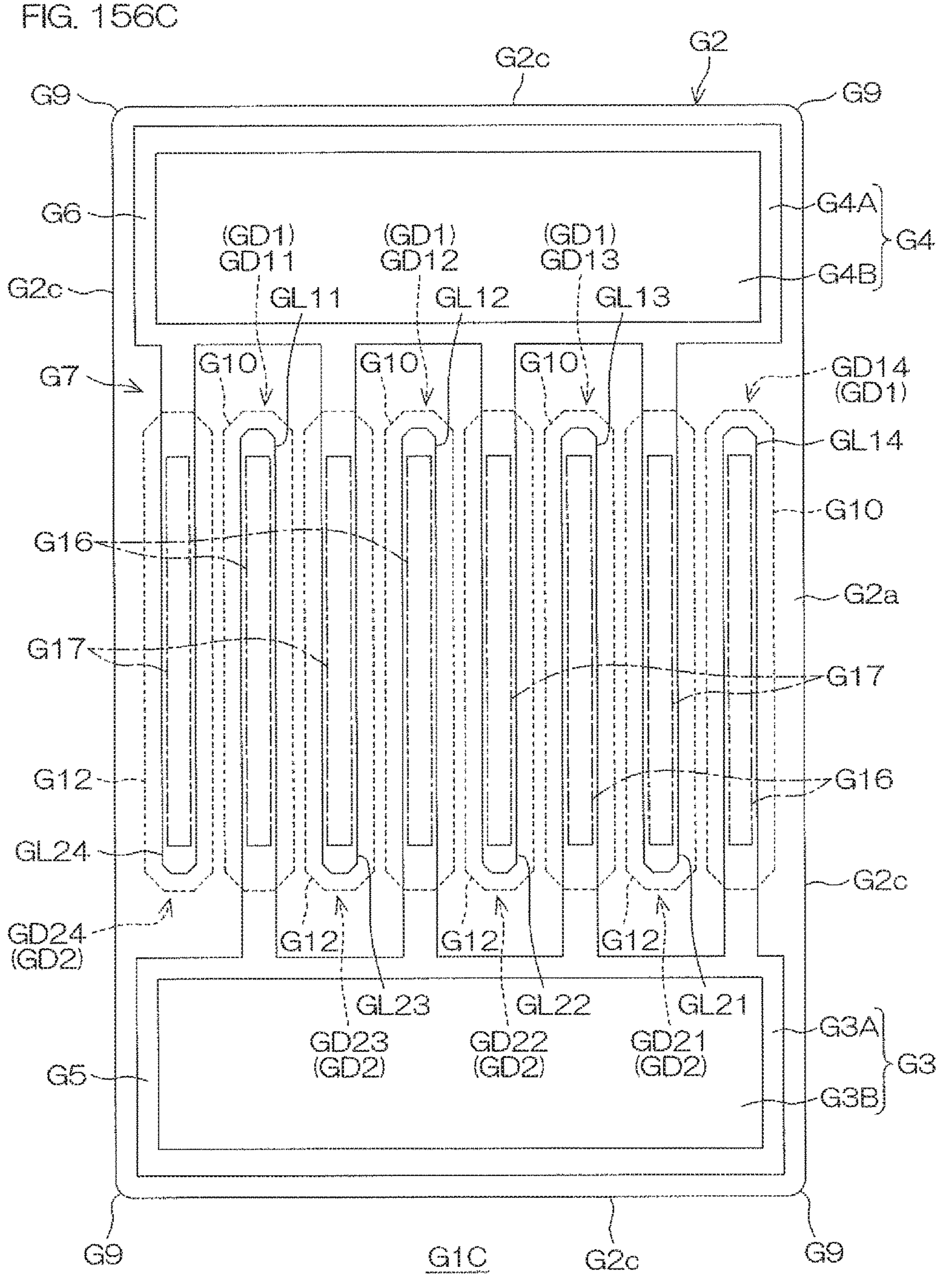

FIG. 156C is a plan view of yet another modification example of the bidirectional Zener diode chip.

Figure 156D:
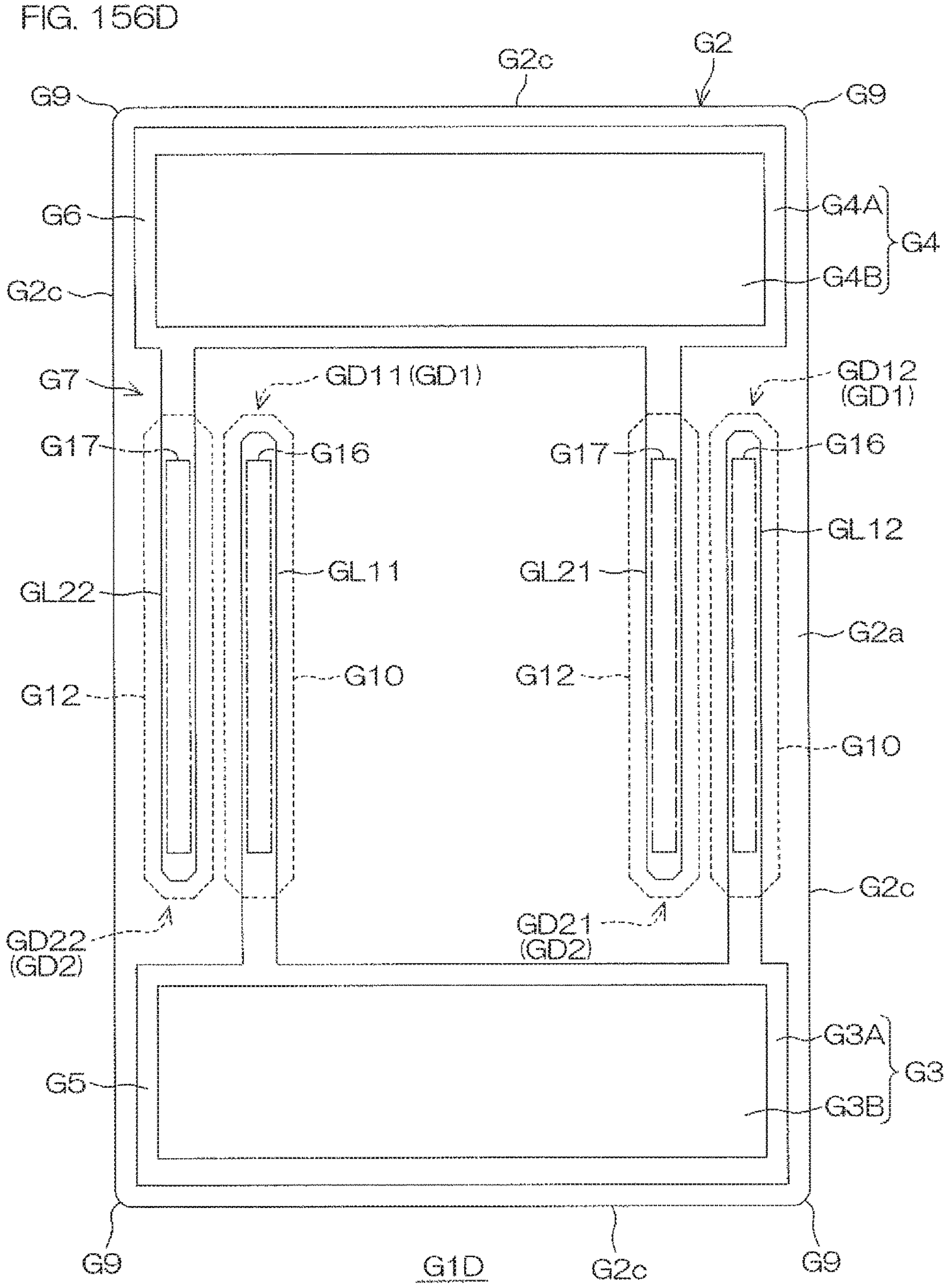

FIG. 156D is a plan view of yet another modification example of the bidirectional Zener diode chip.

Figure 156E:
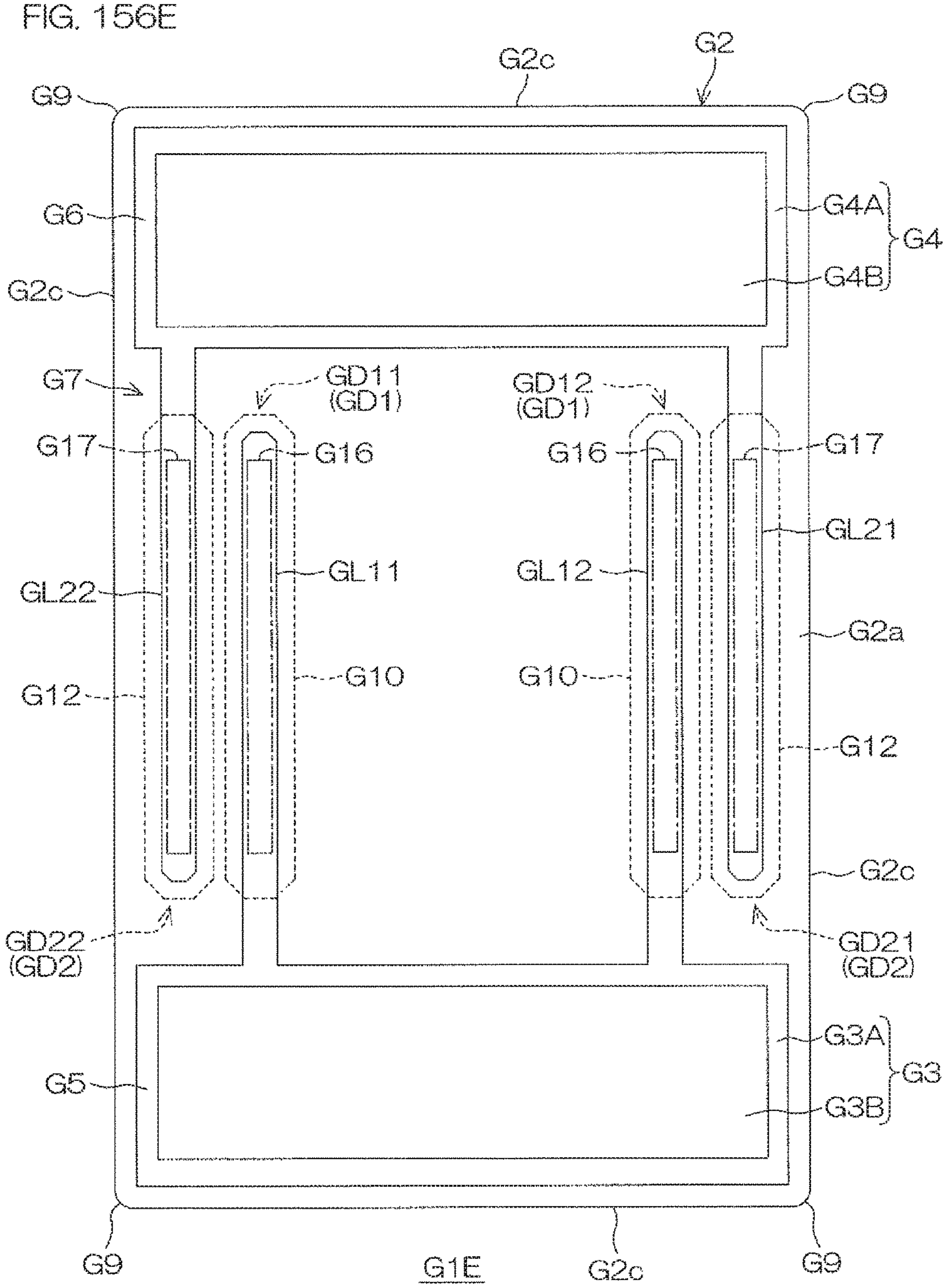

FIG. 156E is a plan view of yet another modification example of the bidirectional Zener diode chip.

Figure 157:
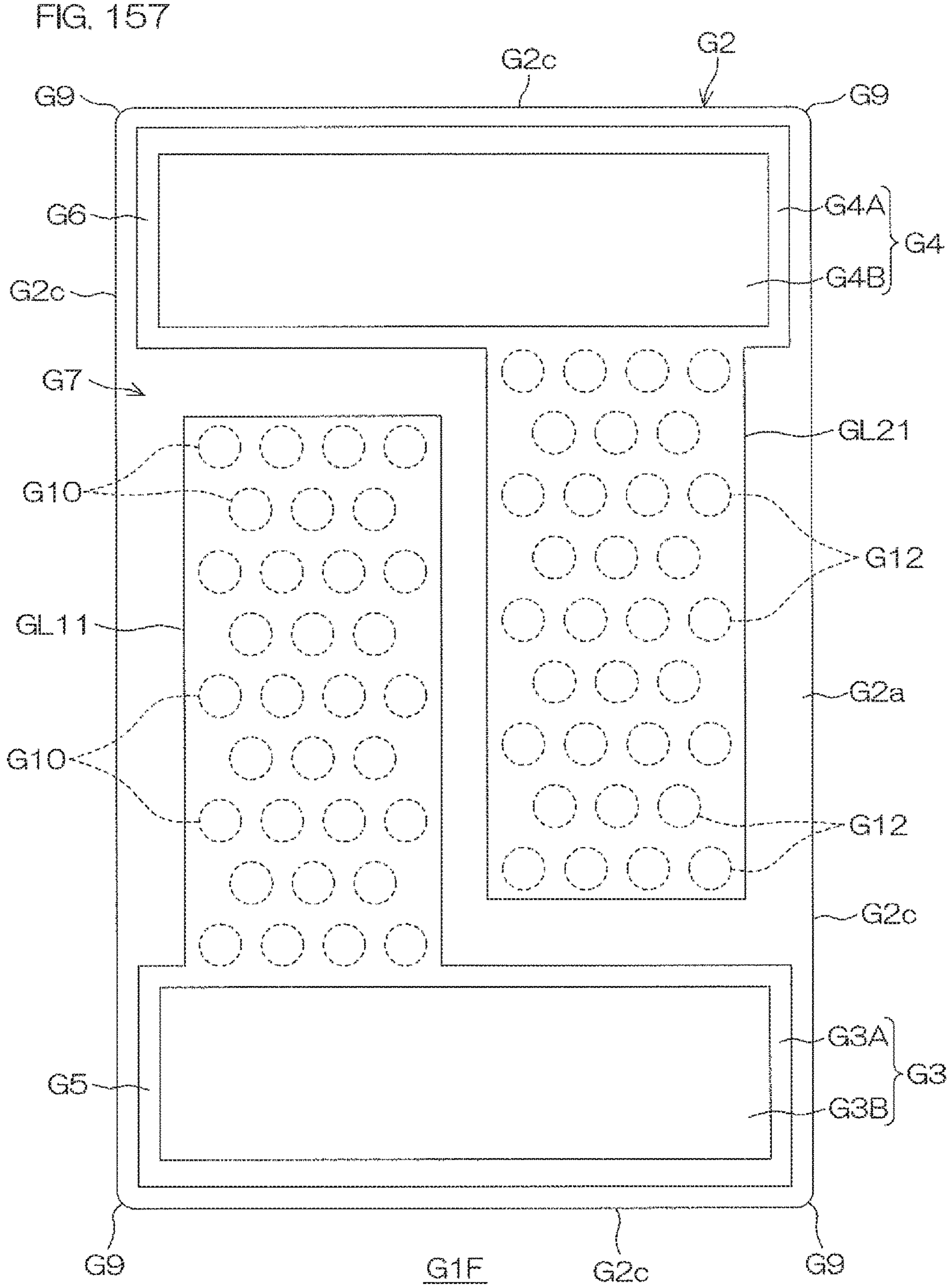

FIG. 157 is a plan view of yet another modification example of the bidirectional Zener diode chip.

Figure 158:
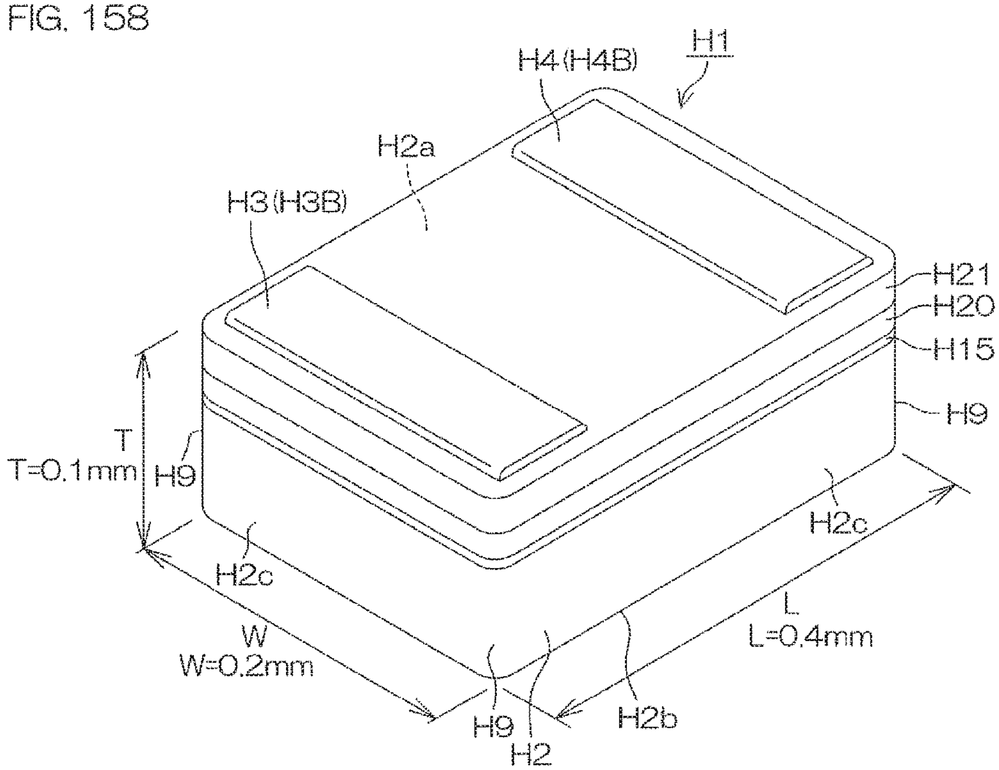

FIG. 158 is a perspective view of a bidirectional Zener diode chip according to a preferred embodiment of a ninth invention.

Figure 159:
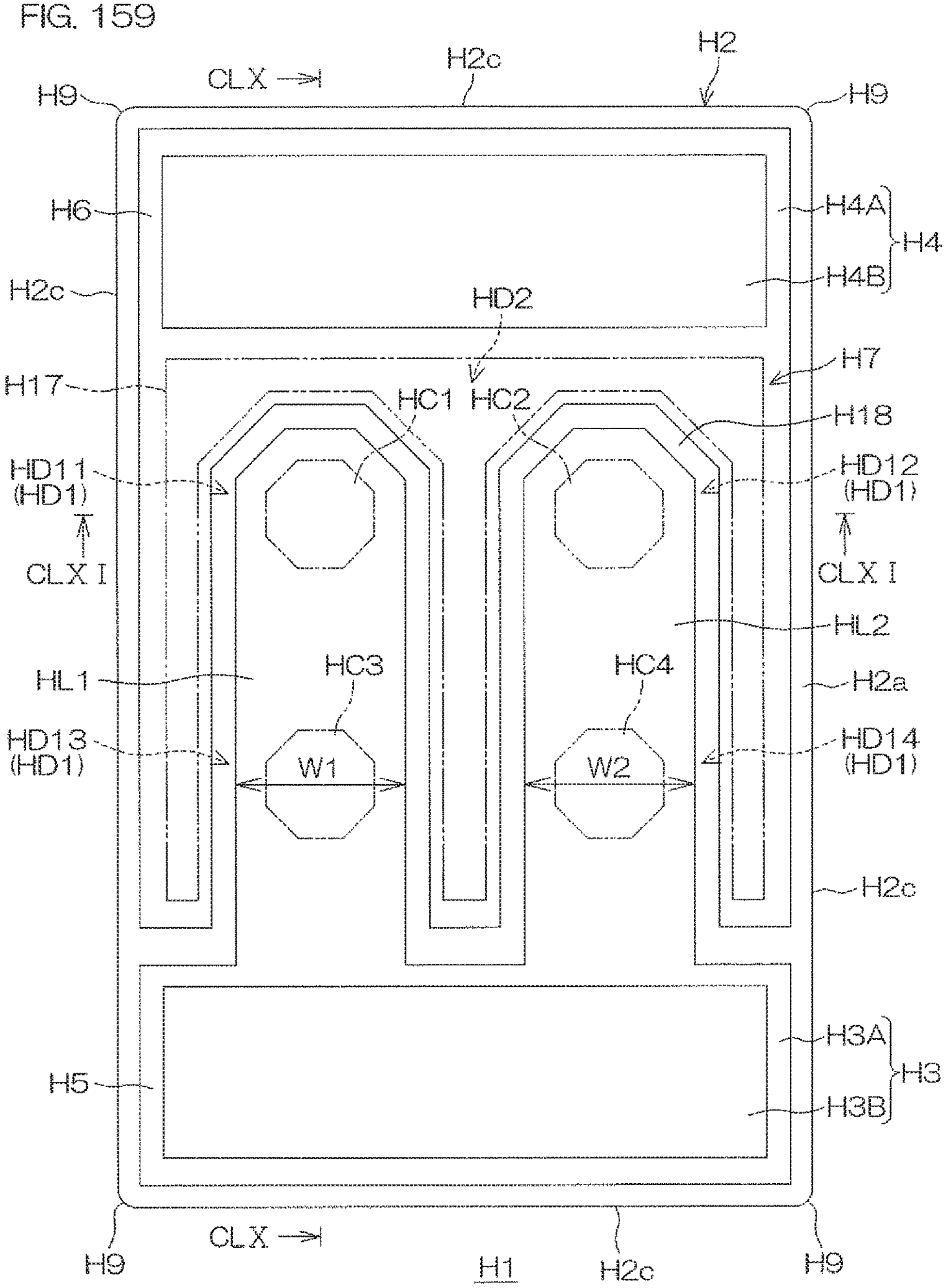

FIG. 159 is a plan view of the bidirectional Zener diode chip.

Figure 160:
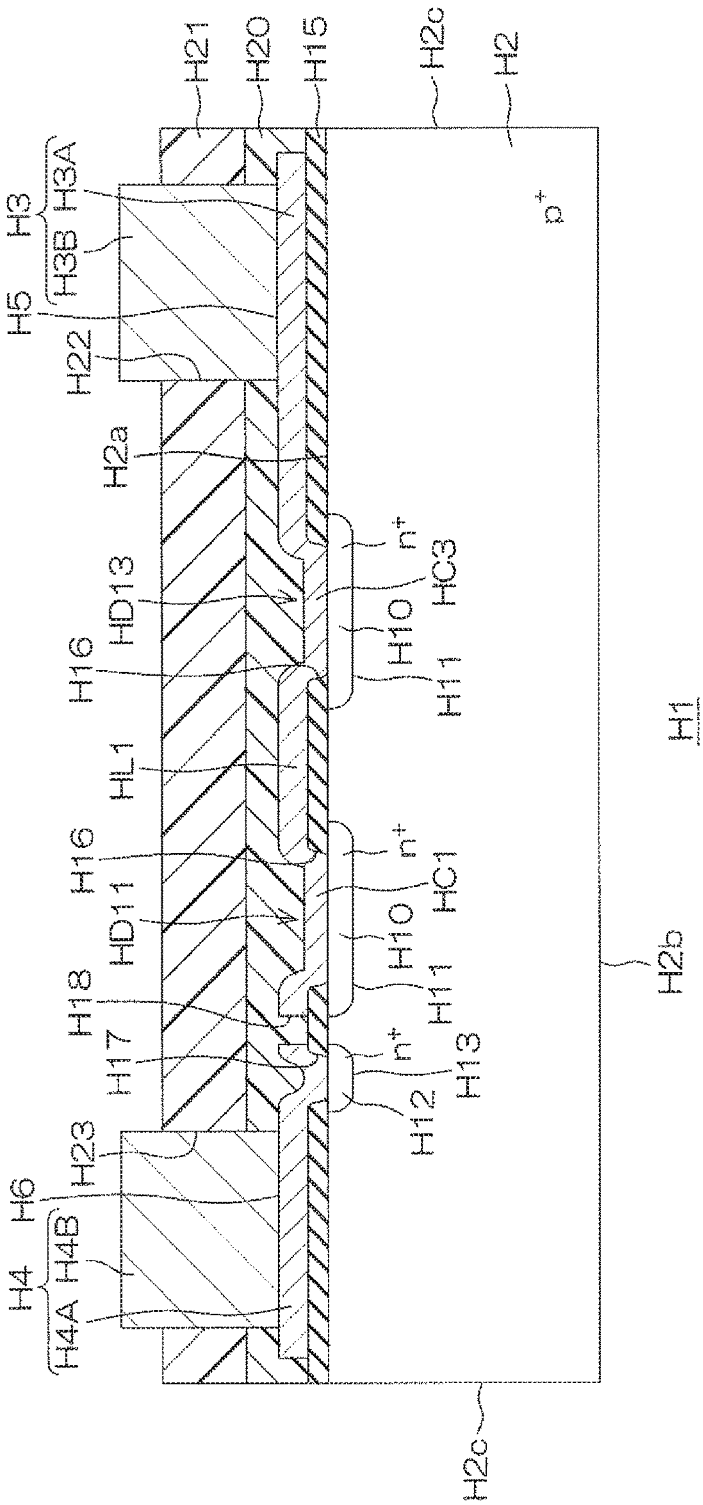

FIG. 160 is a sectional view taken along line CLX-CLX in FIG. 159.

Figure 161:
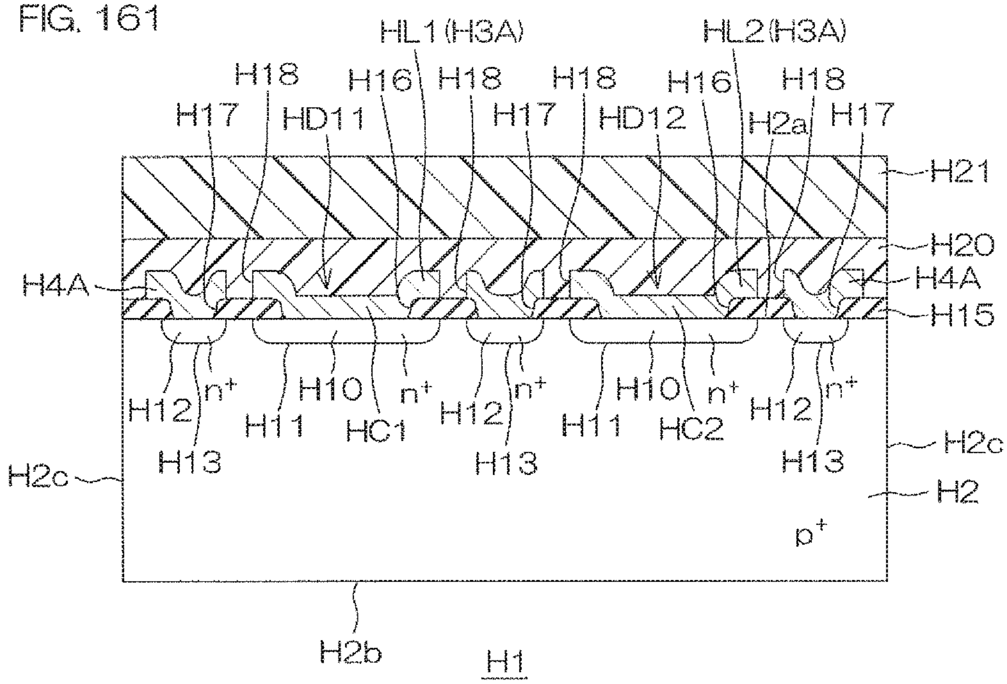

FIG. 161 is a sectional view taken along line CLXI-CLXI in FIG. 159.

Figure 162:
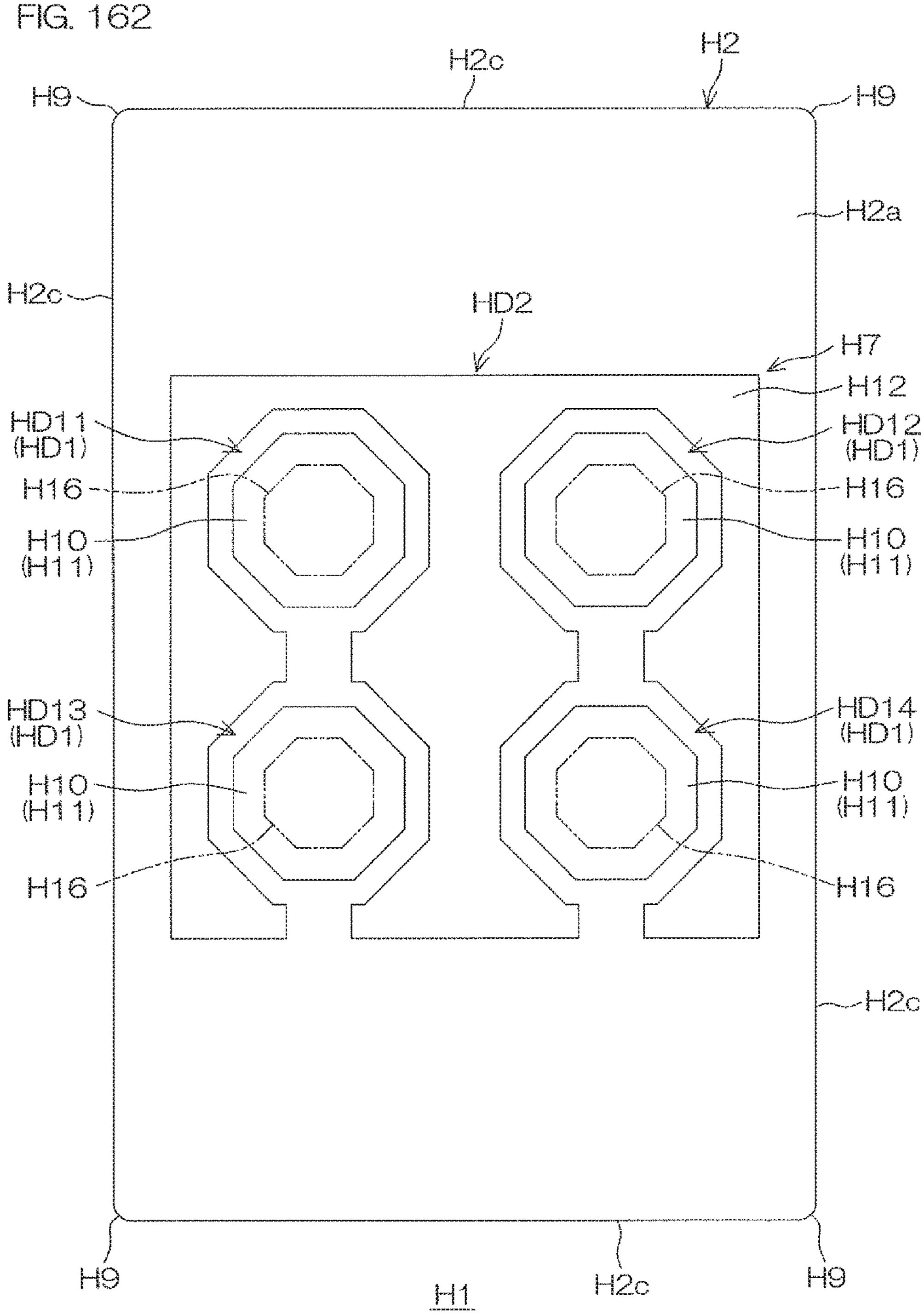

FIG. 162 is a plan view of the bidirectional Zener diode chip with a first electrode, a second electrode, and the arrangement formed thereon being removed to show the structure of a top surface of a semiconductor substrate.

Figure 163:
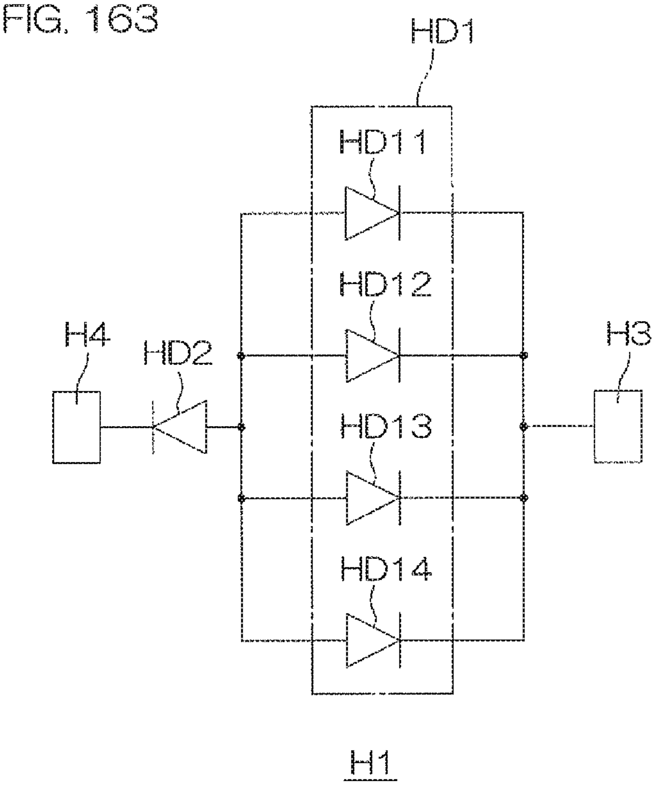

FIG. 163 is an electric circuit diagram showing the electrical structure of the interior of the bidirectional Zener diode chip.

Figure 164:
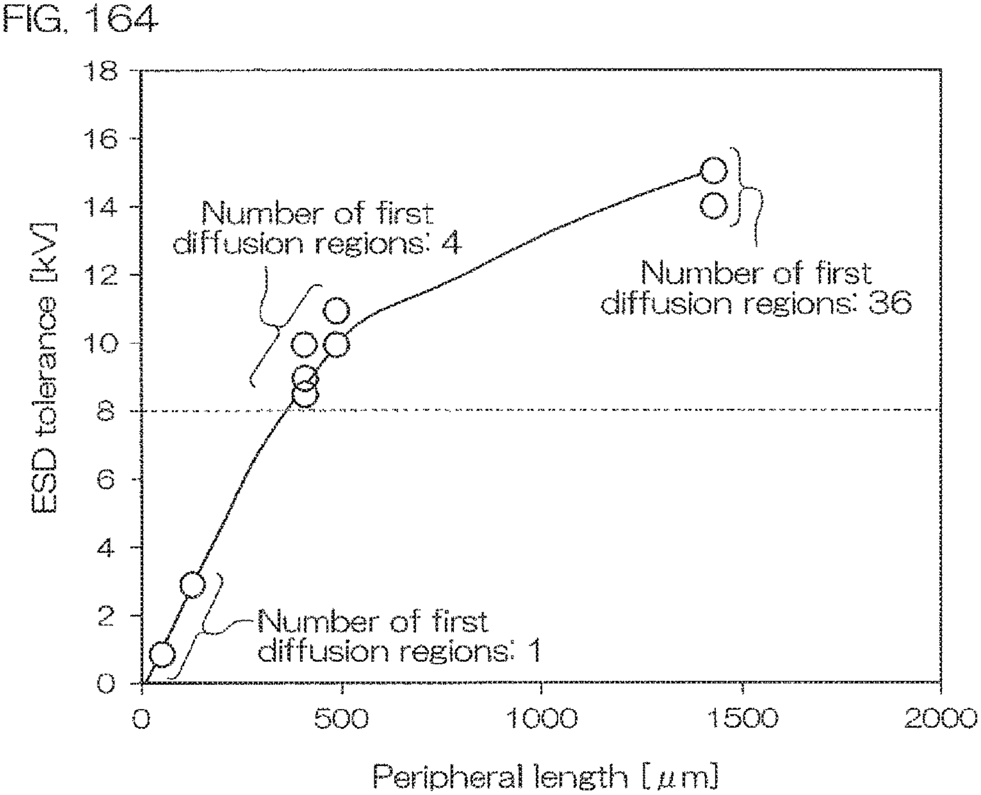

FIG. 164 shows experimental results of measuring the ESD tolerances of a plurality of samples that are differed in total peripheral length (total extension) of p-n junction regions of a first Zener diode incorporated in the bidirectional Zener diode chip by variously setting the sizes and/or the number of first diffusion regions formed on a semiconductor substrate of the same area.

Figure 165:
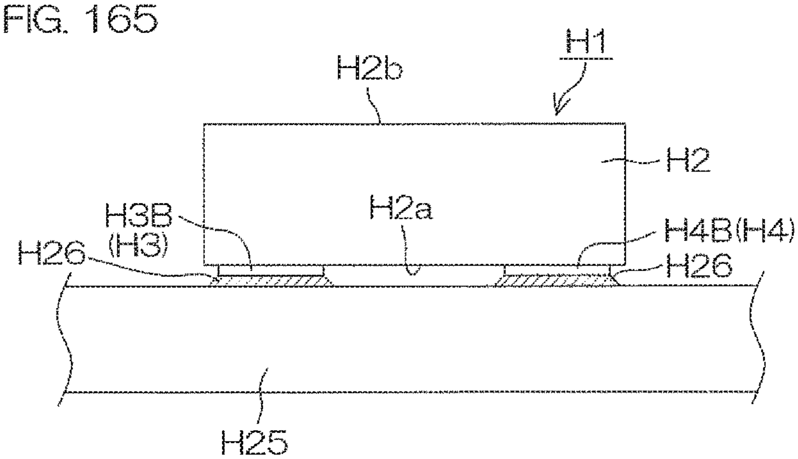

FIG. 165 is a sectional view of the arrangement of a circuit assembly with which the bidirectional Zener diode chip is flip-chip connected onto a mounting substrate.

Figure 166:
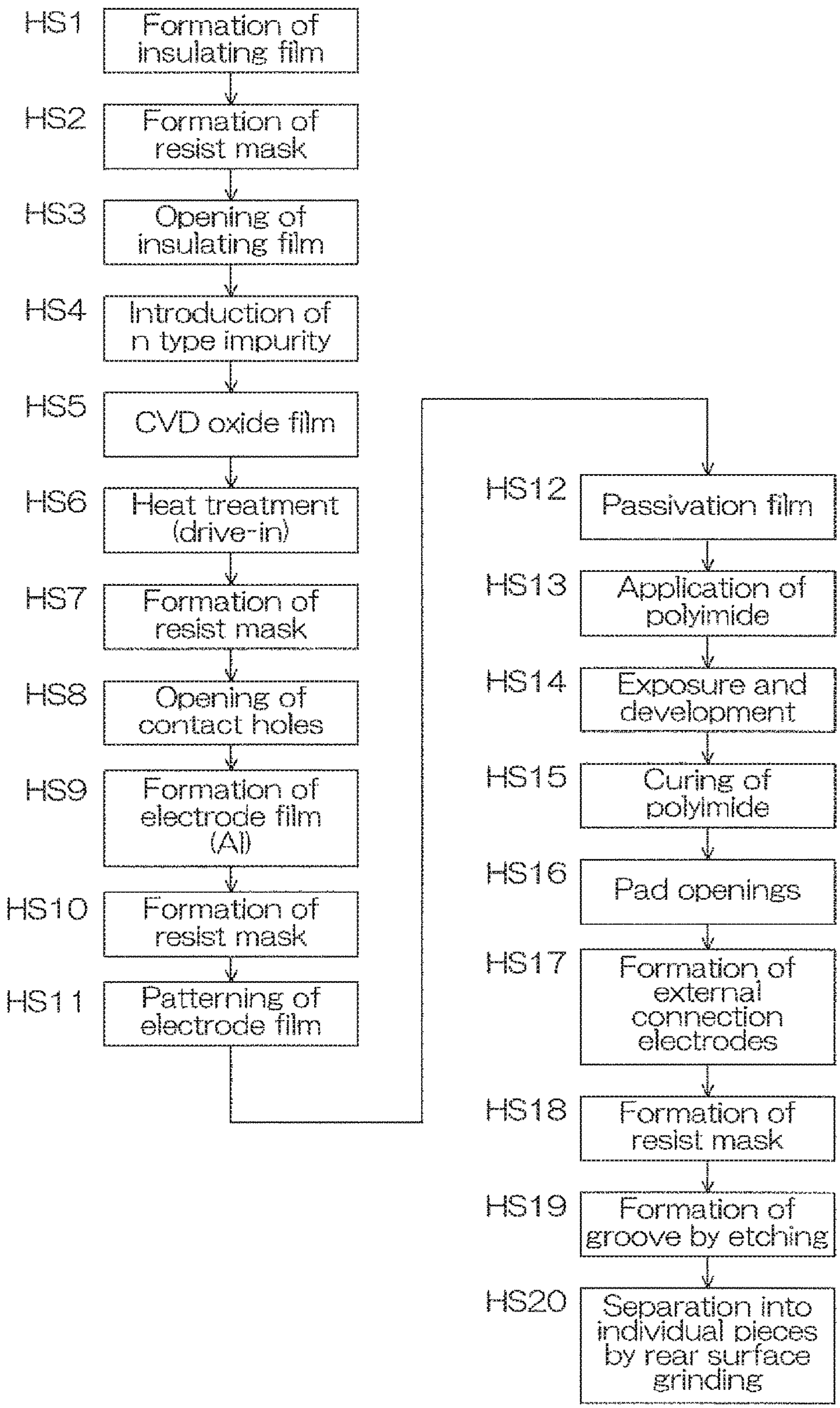

FIG. 166 is a process diagram for describing an example of a manufacturing process of the bidirectional Zener diode chip.

Figure 167A:
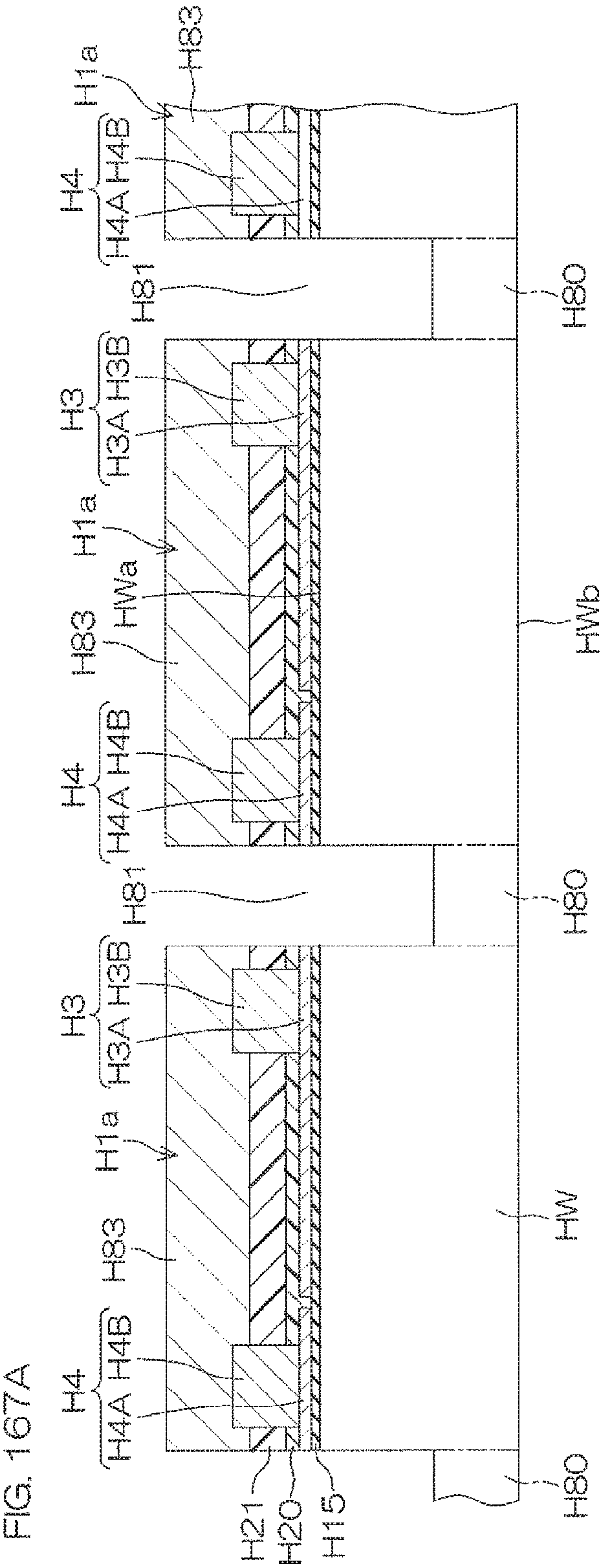

FIG. 167A is a sectional view of the arrangement of the bidirectional Zener diode chip in the middle of the manufacturing process.

Figure 167B:
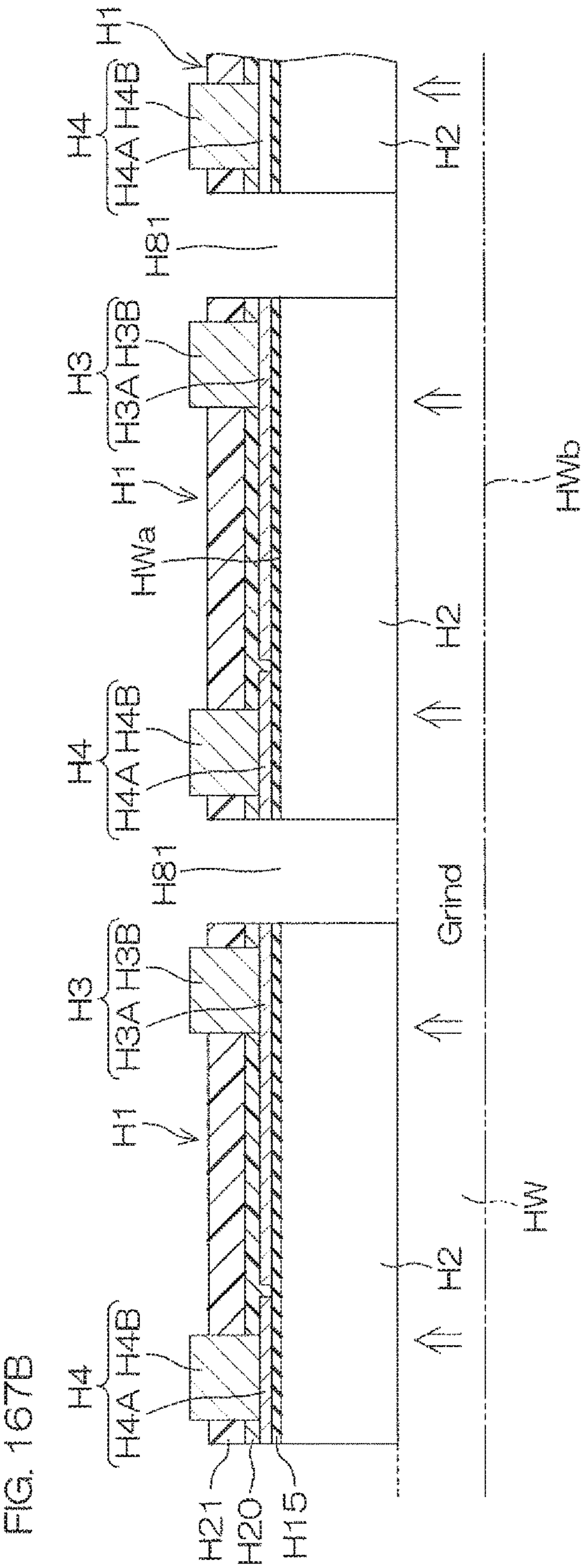

FIG. 167B is a sectional view of the arrangement in a step following that shown in FIG. 167A.

Figure 168:
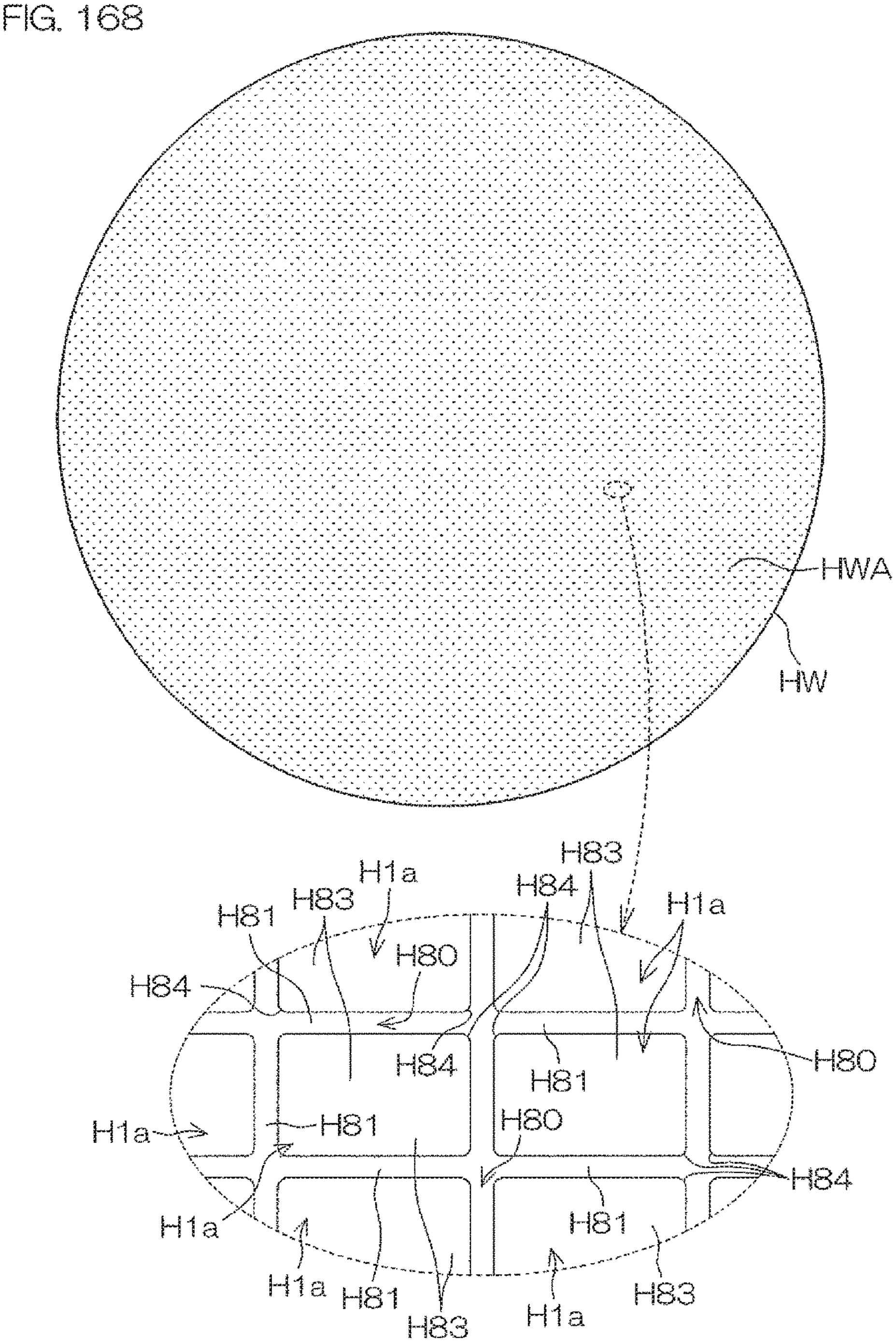

FIG. 168 is a plan view of a semiconductor wafer as a base substrate of the semiconductor substrate of the bidirectional Zener diode chip and shows a partial region in a magnified manner.

Figure 169:
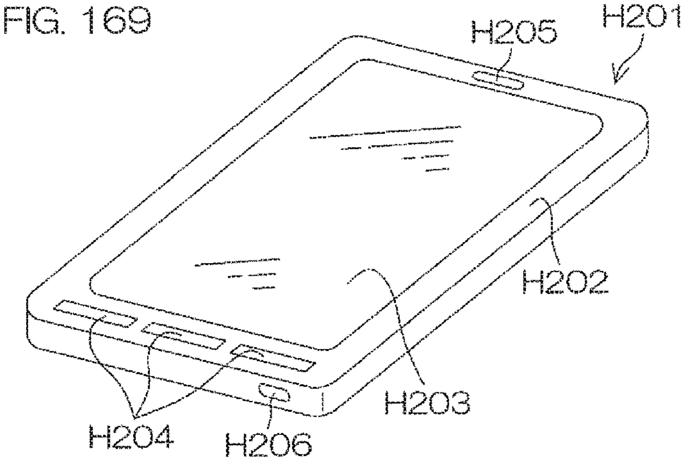

FIG. 169 is a perspective view of an outer appearance of a smartphone that is an example of an electronic equipment in which the bidirectional Zener diode chip is used.

Figure 170:
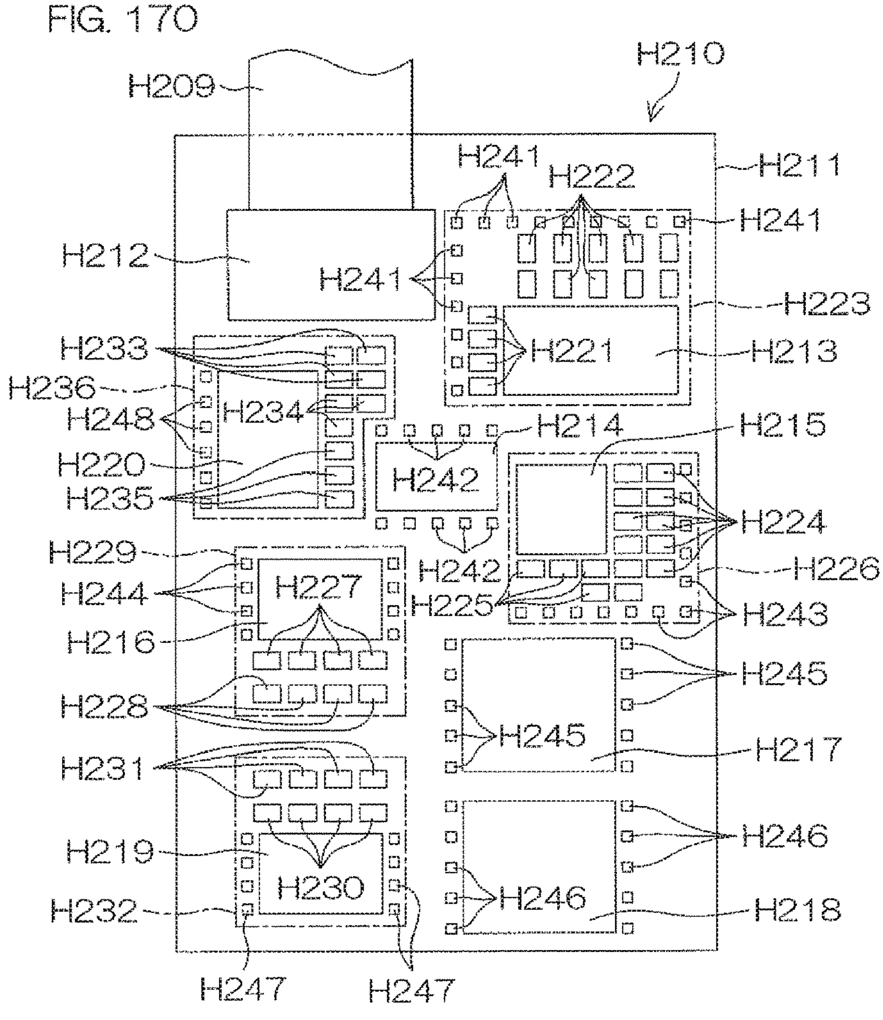

FIG. 170 is an illustrative plan view of the arrangement of an electronic circuit assembly housed in a housing of the smartphone.

MODES FOR CARRYING OUT THE INVENTION

Preferred embodiments of first to ninth inventions shall now be described in detail with reference to the attached drawings.

[1] First Invention

First Preferred Embodiment

Figure 1:
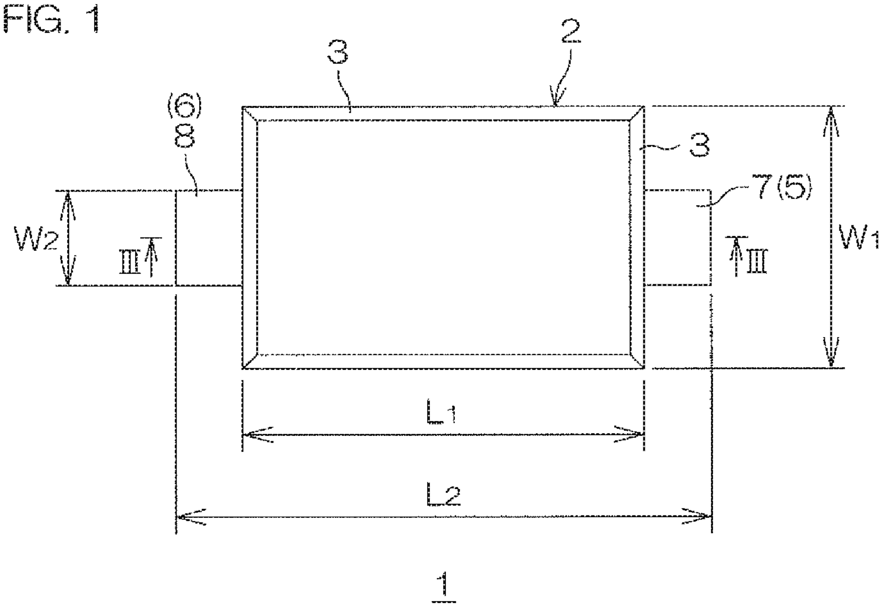
FIG. 1 is a top view of a first preferred embodiment of a diode package according to a first invention.
Figure 2:
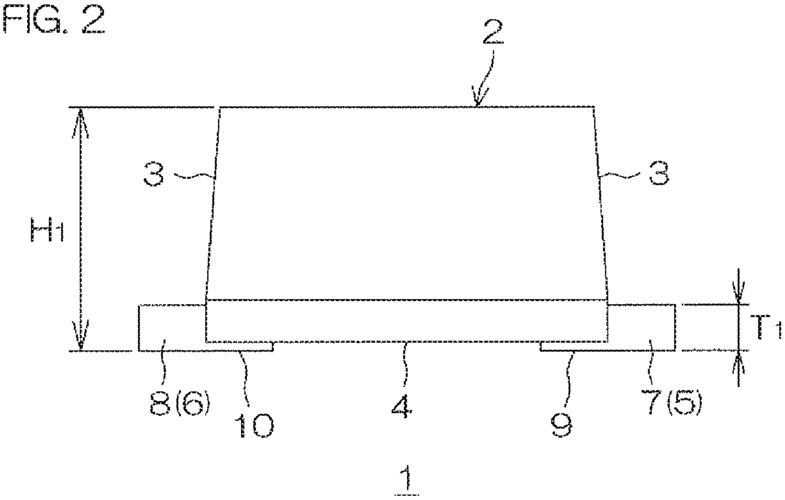
FIG. 2 is a side view of the diode package of FIG. 1.

FIG. 1 is a top view of a first preferred embodiment of a diode package 1 according to the first invention. FIG. 2 is a side view of the diode package 1 of FIG. 1.

The diode package 1 is a compact, two-terminal type voltage regulator diode package and its outer shape is defined by a resin package 2 with an oblong rectangular parallelepiped shape. Each of side surfaces 3 of the resin package 2 is a surface that is vertically upright at a lower portion and gradually inclines obliquely inward from a middle portion. At an end portion at one side in the longitudinal direction of the resin package 2 and at an end portion at the opposite side, portions of an anode terminal 5 (first terminal) and a cathode terminal 6 (second terminal), each of metal plate form, are projected and exposed respectively as an anode side outer lead 7 and a cathode side outer lead 8 along the longitudinal direction from central positions in the width direction of lower end edge portions, each formed by intersection of the lower portion of a side surface 3 and the bottom surface 4. Respective bottom surfaces 9 and 10 of the anode side outer lead 7 and the cathode side outer lead 8 are disposed across the interior and exterior of the bottom surface 4 of the resin package 2, and the exposed bottom surfaces 9 and 10 are used as contacts to a mounting substrate. Also, the anode terminal 5 and the cathode terminal 6 project with the same shape and by the same projection amount and the diode package 1 is right/left symmetrical with respect to the center in the longitudinal direction.

In regard to the outer dimensions of the diode package 1, for example, the length $L_1$ of the resin package 2 is 1.2±0.05 mm and the width $W_1$ of the resin package 2 is 0.8±0.05 mm. Also, the length $L_2$ of the diode package 1 including the projection amounts of the respective outer leads 7 and 8 is 1.6±0.1 mm and the height $H_1$ of the diode package 1 is 0.6±0.1 mm. Also, the width $W_2$ of each of the outer leads 7 and 8 is 0.3±0.05 mm, and the thickness $T_1$ of each of the terminals 5 and 6 is 0.12±0.05 mm. The dimensions indicated here as examples may be changed suitably as necessary.

Figure 3:
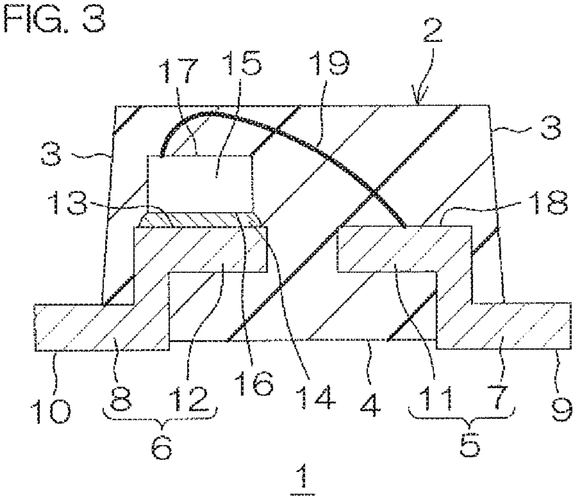
FIG. 3 is a sectional view of the diode package of FIG. 1 and shows a section taken along section line III-III in FIG. 1.

The internal structure of the diode package 1 shall now be described with reference to FIG. 3. FIG. 3 is a sectional view of the diode package 1 of FIG. 1 and shows a section taken along section line III-III in FIG. 1. The remaining portions of the anode terminal 5 and the cathode terminal 6 are disposed respectively as an anode side inner lead 11 and a cathode side inner lead 12 in the interior of the resin package 2. The anode side inner lead 11 and the cathode side inner lead 12 are formed to hook-like shapes that rise vertically from respective end portions of the outer leads 7 and 8 and are bent in a horizontal direction so as to approach each other in the longitudinal direction of the resin package 2.

A land (for example, a die pad, etc.) for supporting the chip is not provided between the anode side inner lead 11 and the cathode side inner lead 12 that oppose each other on the same plane, and one of the inner leads (the cathode side inner lead 12 in the present preferred embodiment) serves in common as a land for supporting the chip. Specifically, a rear surface 16 of a chip diode 15 is bonded via solder or other bonding material 14 to an upper surface 13 of the cathode side inner lead 12 serving in common as the land. An arcuate bonding wire 19 (made, for example, of Au (gold)), which is curved convexly upward, is installed across a top surface 17 of the chip diode 15, supported from below by the cathode terminal 6, and an upper surface 18 of the anode side inner lead 11. The cathode terminal 6 is thereby electrically connected to the rear surface 16 (lower surface) of the chip diode 15, and the anode terminal 5 is electrically connected to the top surface 17 (upper surface) of the chip diode 15.

The diode package 1 is arranged by sealing the chip diode 15, the bonding wire 19, the anode side inner lead 11, and the cathode side inner lead 12 all together in the resin package 2.

Figure 4:
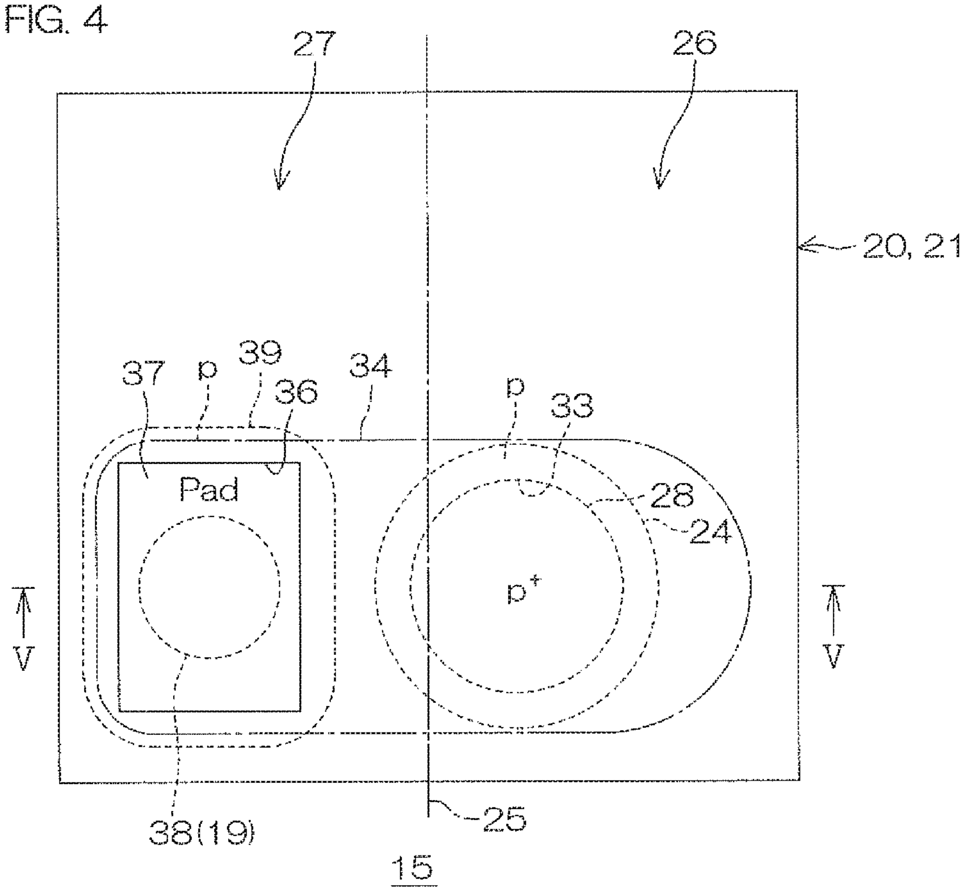
FIG. 4 is a plan view of a chip diode of FIG. 3.
Figure 5:
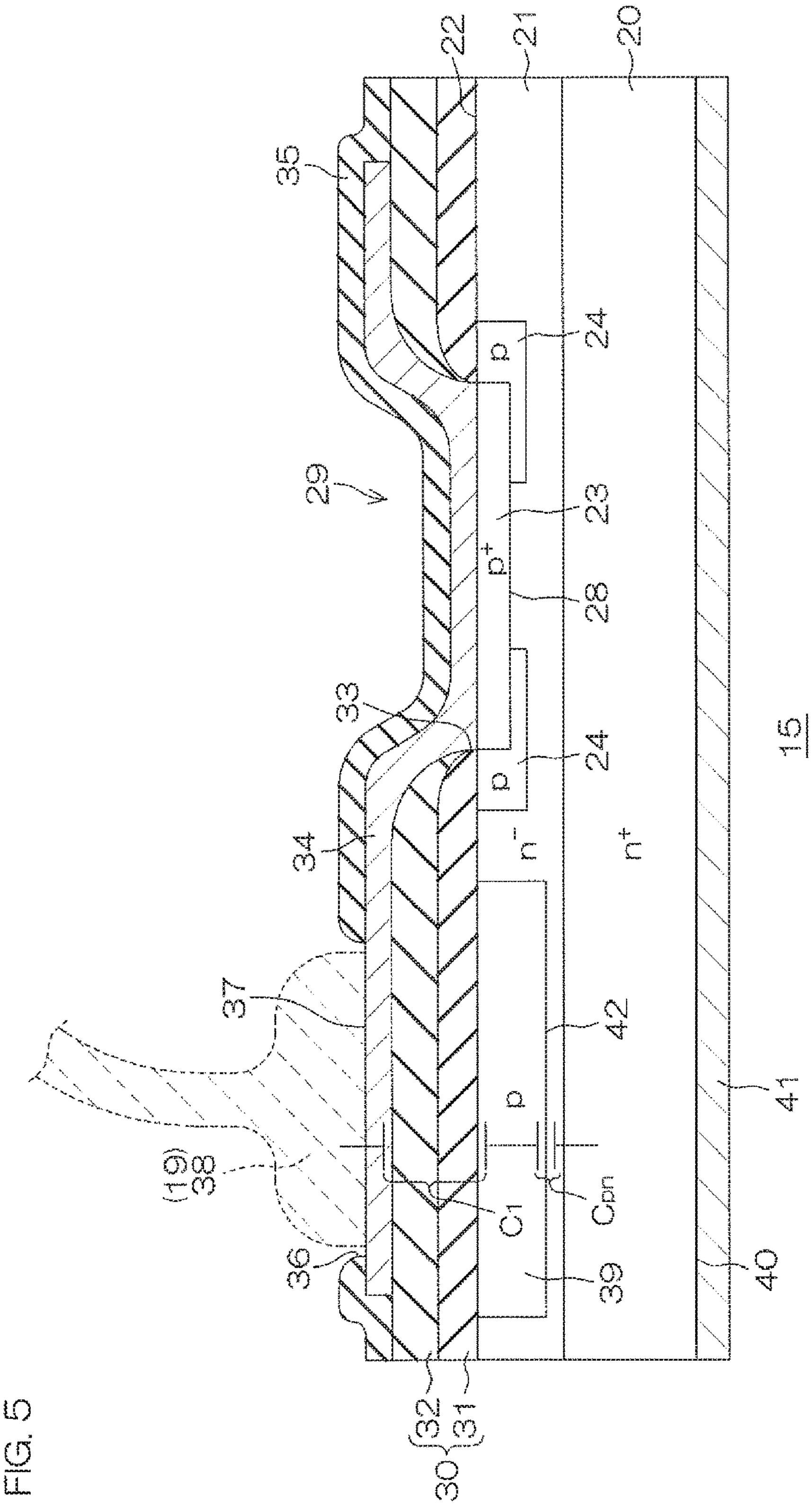
FIG. 5 is a sectional view of the chip diode of FIG. 4 and shows a section taken along section line V-V in FIG. 4.

The specific structure of the chip diode 15 shall now be described with reference to FIG. 4 and FIG. 5. FIG. 4 is a plan view of the chip diode 15 of FIG. 3. FIG. 5 is a sectional view of the chip diode 15 of FIG. 4 and shows a section taken along section line V-V in FIG. 4.

The chip diode 15 is formed to a rectangular shape with one side being approximately 0.25 mm and includes a semiconductor substrate 20 made of an $n^+$ type Si and an epitaxial layer 21 made of an $n^-$ type Si and formed on the semiconductor substrate 20. The impurity concentration of the semiconductor substrate 20 is, for example, $1\times10^{18}$ $cm^{-3}$ to $1\times10^{20}$ $cm^{-3}$, and the impurity concentration of the epitaxial layer 21 is, for example, $1\times10^{17}$ $cm^{-3}$ to $1\times10^{19}$ $cm^{-3}$.

In a vicinity of a top surface 22 of the epitaxial layer 21, a $p^+$ type diode impurity region 23 that is a first pole and a p-type guard ring layer 24 surrounding the diode impurity region 23 and having an impurity concentration lower than the diode impurity region 23 are selectively formed in a region 26, which is one of two regions 26 and 27 that are partitioned at a center line 25 of a pair of opposing sides (bisecting line of the sides) of the chip diode 15. The impurity concentration of the diode impurity region 23 is, for example, $1\times10^{19}$ $cm^{-3}$ to $1\times10^{21}$ $cm^{-3}$, and the impurity concentration of the guard ring layer 24 is, for example, $1\times10^{18}$ $cm^{-3}$ to $1\times10^{20}$ $cm^{-3}$. The surge tolerance of the chip diode 15 can be improved by the guard ring layer 24.

The diode impurity region 23 is formed to a circular well shape (with a depth, for example, of 1 μm to 10 μm). The guard ring layer 24 is formed to an annular shape along the outer periphery of the diode impurity region 23 so as to contact the peripheral edge of the diode impurity region 23 from the side and from below, and the side-contacting portion is annularly exposed at the top surface 22 of the epitaxial layer 21. In the epitaxial layer 21, the $p^+$ type diode impurity region 23 (p pole) in the vicinity of the top surface 22 and the remaining $n^-$ portion (n pole) of the epitaxial layer 21 that is a second pole are put in an adjacent state by being laminated in the thickness direction of the epitaxial layer 21. A diode element 29 constituted of a p-n junction 28 of these poles is thereby provided in the epitaxial layer 21.

An insulating film 30 is formed on the epitaxial layer 21. In the present preferred embodiment, the insulating film 30 is constituted of a laminated film of an $SiO_2$ (silicon oxide) film 31 formed on the top surface 22 of the epitaxial layer 21 and a PSG (phosphosilicate glass) film 32 formed on the $SiO_2$ film 31. The thickness of the $SiO_2$ film 31 is, for example, 5000 Å to 20000 Å and the thickness of the PSG film 32 is, for example, 5000 Å to 10000 Å.

A circular contact hole 33, penetrating through the PSG film 32 and the $SiO_2$ film 31 and coinciding with the outer periphery of the diode impurity region 23, is formed in the insulating film 30. With this arrangement, for example, by thermally oxidizing the top surface 22 of the epitaxial layer 21 to form the $SiO_2$ film 31, then forming the PSG film 32, and thereafter forming the circular contact hole 33, a p-type impurity can be ion-implanted using the insulating film 30 as a mask to form the diode impurity region 23 in a self-aligning manner with respect to the contact hole 33.

An anode electrode 34 (with a thickness of, for example, 10000 Å to 30000 Å), made of Al (aluminum), is formed as a first electrode on the insulating film 30. As the material of the anode electrode 34, any of various conductive materials besides Al may be used. The anode electrode 34 enters into the contact hole 33 and is in ohmic contact with only the diode impurity region 23 that shares the outer periphery with the contact hole 33 (that is, the electrode is not in contact with the guard ring layer 24 at the periphery of the diode impurity region 23). Also, the anode electrode 34 is led out in a lateral direction, along the side of the chip diode 15 closest to the diode impurity region 23, from the contact hole 33 to a corner portion of the chip diode 15 in the region 27 at the opposite side, with respect to the center line 25, of the region 26 in which the diode impurity region 23 is formed.

On the insulating film 30, a top surface protective film 35 (with a thickness of, for example, 10000 Å to 30000 Å), made of SiN (silicon nitride), is formed across the entire surface of the epitaxial layer 21 so as to cover the anode electrode 34. Any of various insulating materials besides SiN may be used as the material of the surface protective film 35. A rectangular pad opening 36 with one side being not more than 0.1 mm is formed in the surface protective film 35 at a position directly above a corner portion of the chip diode 15 at which a terminal portion of the anode electrode 34 is disposed. A portion of the anode electrode 34 is exposed as a pad 37 from the pad opening 36. That is, the pad 37 that is exposed from the pad opening 36 is provided at a position that is separated along the top surface 22 of the epitaxial layer 21 from a position directly above the p-n junction 28 of the diode element 29 (that is, the position of the contact hole 33). The diode impurity region 23 at one side with respect to the center line 25 and the pad 37 at the opposite side are thereby made mutually adjacent along one side of the chip diode 15. An FAB (free air ball) of the bonding wire 19 is bonded by ultrasonic waves onto the pad 37 (anode electrode 34), thereby forming a first bonding portion 38 of the bonding wire 19.

Also, at a position directly below the pad 37 in the vicinity of the top surface 22 of the epitaxial layer 21, a p-type floating region 39 that is electrically floated (insulated) with respect to the diode element 29 is formed to a rectangular well shape with an area larger than the pad opening 36 so as to surround the pad opening 36 in a plan view. Also, the floating region 39 is formed to be deeper than the diode impurity region 23 (for example, to a depth of 5 μm to 15 μm). Also, the impurity concentration of the floating region 39 is, for example, $1\times10^{18}$ $cm^{-3}$ to $1\times10^{20}$ $cm^{-3}$ and lower than the impurity concentration of the diode impurity region 23.

A cathode electrode 41 (with a thickness of, for example, 10000 Å to 30000 Å), made of Au (gold), is formed as a second electrode on a rear surface 40 of the semiconductor substrate 20. At the rear surface 40 of the semiconductor substrate 20, the cathode electrode 41 is in ohmic contact with the semiconductor substrate 20 and the epitaxial layer 21 that constitute an n-pole of the diode element 29. The cathode side inner lead 12 is bonded via the bonding material 14 to the cathode electrode 41. As the material of the cathode electrode 41, any of various conductive materials besides Au may be used.

As described above, with the chip diode 15, the pad 37 for electrical connection with the exterior is provided at a position directly above a corner portion of the chip diode 15 and is provided at a position separated from a position directly above the p-n junction 28 of the diode element 29 of the chip diode 15. In other words, the pad 37 is provided at a position shifted from the p-n junction 28 and the p-n junction 28 that constitutes the diode element 29 is not disposed directly below the pad 37.

Therefore in a manufacturing process of the diode package 1, even if a large stress is applied to the pad 37 when the first bonding portion 38 of the bonding wire 19 is formed by ultrasonic bonding on the pad 37, the physical stress transmitted to the p-n junction 28 can be lightened. The chip diode 15 with which the p-n junction 28 is not destroyed can thus be installed in the diode package 1. Consequently, the diode package 1 can be manufactured as a device of high reliability. Moreover, the insulating film 30 is interposed between the pad 37 and the epitaxial layer 21, and the insulating film 30 can thus act as a cushioning material that relaxes stress applied to the pad 37 before the stress is transmitted to the epitaxial layer 21. The physical stress transmitted to the p-n junction 28 can thus be lightened further.

On the other hand, even if the insulating film 30 is destroyed due to stress applied to the pad 37 and a leak current pathway that allows electrical conduction between the pad 37 and the epitaxial layer 21 is formed at the destroyed portion, the flow of leak current to the current pathway can be prevented because the floating region 39, which is lower in impurity concentration and deeper in depth than the diode impurity region 23, is disposed at a position directly below the pad 37.

Also by the above, a second capacitor $C_{pn}$, constituted by a p-n junction 42 of the floating region 39 (p type) and the epitaxial layer (n type), is disposed in series with respect to a first capacitor $C_1$, constituted by the insulating film 30, between the pad 37 and the epitaxial layer 21. The effective voltage applied to the first capacitor $C_1$ can thus be decreased by voltage division by the second capacitor $C_{pn}$. Consequently, the withstand voltage can be improved by an amount corresponding to the amount of decrease.

Second Preferred Embodiment

Figure 6:
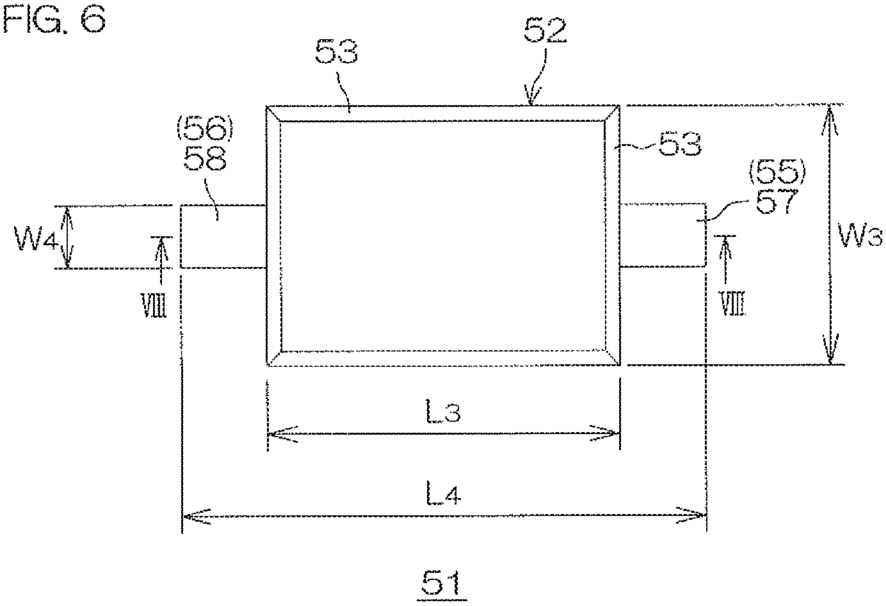
FIG. 6 is a top view of a second preferred embodiment of a diode package according to the first invention.
Figure 7:
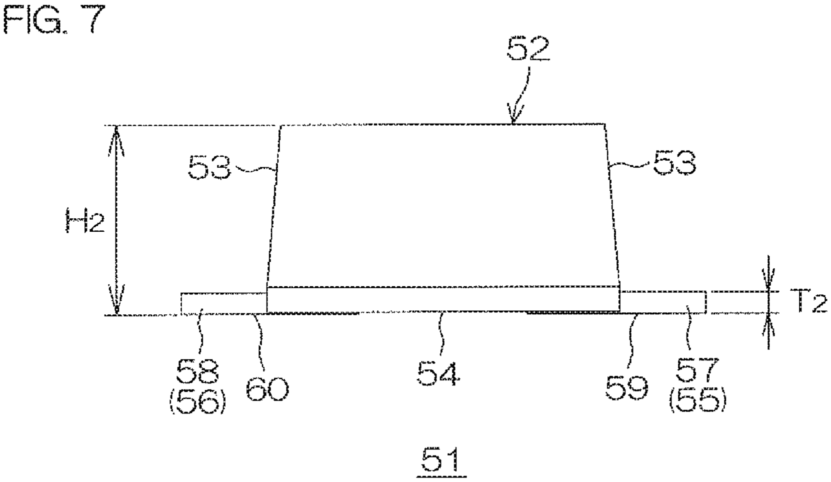
FIG. 7 is a side view of the diode package of FIG. 6.

FIG. 6 is a top view of a second preferred embodiment of a diode package 51 according to the first invention. FIG. 7 is a side view of the diode package 51 of FIG. 6.

The diode package 51 is a compact, two-terminal type switching diode package and its outer shape is defined by a resin package 52 with an oblong rectangular parallelepiped shape. Each of side surfaces 53 of the resin package 52 is a surface that is vertically upright at a lower portion and gradually inclines obliquely inward from a middle portion. At an end portion at one side in the longitudinal direction of the resin package 52 and at an end portion at the opposite side, portions of an anode terminal 55 (first terminal) and a cathode terminal 56 (second terminal), each of metal plate form, are projected and exposed respectively as an anode side outer lead 57 and a cathode side outer lead 58 along the longitudinal direction from central positions in the width direction of lower end edge portions, each formed by intersection of the lower portion of a side surface 53 and the bottom surface 54. Respective bottom surfaces 59 and 60 of the anode side outer lead 57 and the cathode side outer lead 58 are disposed across the interior and exterior of the bottom surface 54 of the resin package 52, and the exposed bottom surfaces 59 and 60 are used as contacts to a mounting substrate. Also, the anode terminal 55 and the cathode terminal 56 project with the same shape and by the same projection amount and the diode package 51 is right/left symmetrical with respect to the center in the longitudinal direction.

In regard to the outer dimensions of the diode package 51, for example, the length $L_3$ of the resin package 52 is 1.7±0.1 mm and the width $W_3$ of the resin package 52 is 1.25±0.1 mm. Also, the length $L_4$ of the diode package 51 including the projection amounts of the respective outer leads 57 and 58 is 2.5±0.2 mm and the height $H_2$ of the diode package 51 is 0.7±0.2 mm. Also, the width $W_4$ of each of the outer leads 57 and 58 is 0.3±0.05 mm, and the thickness $T_2$ of each of the terminals 55 and 56 is 0.1±0.05 mm. The dimensions indicated here as examples may be changed suitably as necessary.

Figure 8:
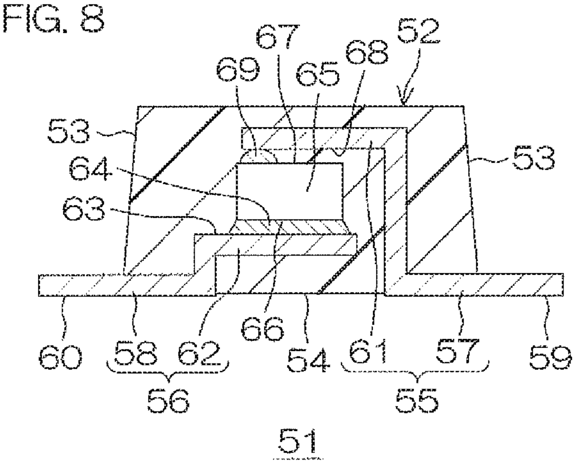
FIG. 8 is a sectional view of the diode package of FIG. 6 and shows a section taken along section line VIII-VIII in FIG. 6.

The internal structure of the diode package 51 shall now be described with reference to FIG. 8. FIG. 8 is a sectional view of the diode package 51 of FIG. 6 and shows a section taken along section line VIII-VIII in FIG. 6. The remaining portions of the anode terminal 55 and the cathode terminal 56 are disposed respectively as an anode side inner lead 61 and a cathode side inner lead 62 in the interior of the resin package 52. The anode side inner lead 61 and the cathode side inner lead 62 are formed to hook-like shapes that rise vertically from respective end portions of the outer leads 57 and 58 and are bent in a horizontal direction so as to differ mutually in level. In the present embodiment, the different level positional relationship is such that the anode side inner lead 61 is at the upper side and the cathode side inner lead 62 is at the lower side. A chip diode 65 is disposed in a form of being sandwiched between a lower surface 68 of the anode side inner lead 61 and an upper surface 63 of the cathode side inner lead 62 that face each other.

Specifically, a rear surface 66 of the chip diode 65 is bonded via solder or other bonding material 64 to the upper surface 63 of the cathode side inner lead 62 serving in common as a land for supporting the chip. Also, a top surface 67 of the chip diode 65 is bonded via a bump 69 of solder, etc., to the lower surface 68 of the anode side inner lead 61. The cathode terminal 56 is thereby electrically connected to the rear surface 66 (lower surface) of the chip diode 65, and the anode terminal 55 is electrically connected to the top surface 67 (upper surface) of the chip diode 65.

The diode package 51 is arranged by sealing the chip diode 65, a bonding wire, the anode side inner lead 61, and the cathode side inner lead 62 all together in the resin package 52. The specific structure of the chip diode 65 shall now be described with reference to FIG. 9 and FIG. 10.

Figure 9:
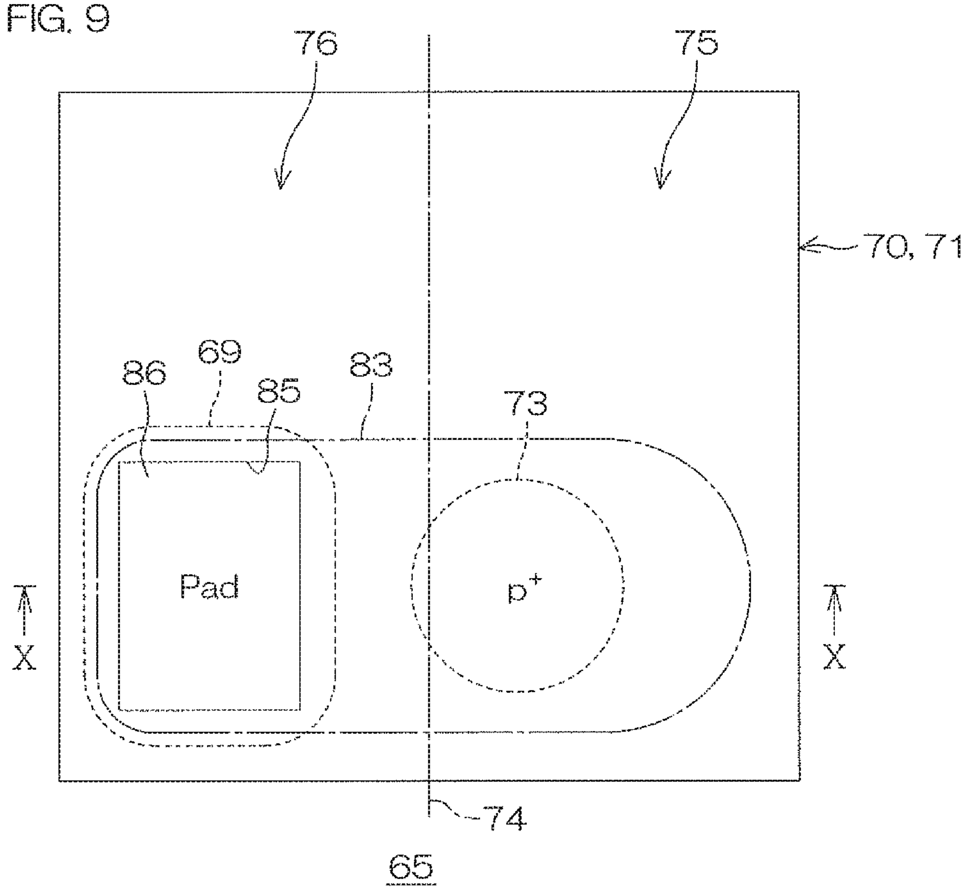
FIG. 9 is a plan view of a chip diode of FIG. 8.
Figure 10:
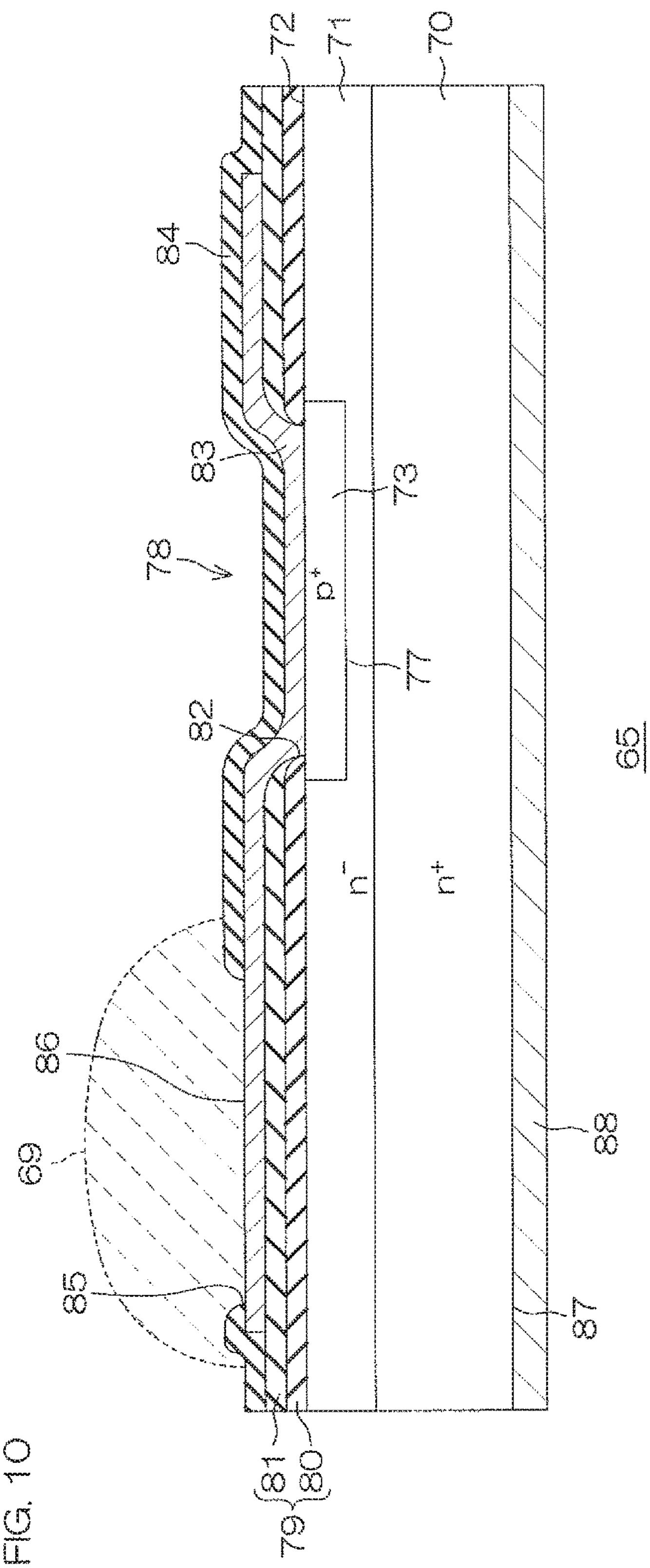
FIG. 10 is a sectional view of the chip diode of FIG. 9 and shows a section taken along section line X-X in FIG. 9.

FIG. 9 is a plan view of the chip diode 65 of FIG. 8. FIG. 10 is a sectional view of the chip diode 65 of FIG. 9 and shows a section taken along section line X-X in FIG. 9. The chip diode 65 is formed to a rectangular shape with one side being approximately 0.25 mm and includes a semiconductor substrate 70 made of an $n^+$ type Si and an epitaxial layer 71 made of an $n^-$ type Si and formed on the semiconductor substrate 70. The impurity concentration of the semiconductor substrate 70 is, for example, $1\times10^{18}$ $cm^{-3}$ to $1\times10^{20}$ $cm^{-3}$, and the impurity concentration of the epitaxial layer 71 is, for example, $1\times10^{17}$ $cm^{-3}$ to $1\times10^{19}$ $cm^{-3}$.

In a vicinity of a top surface 72 of the epitaxial layer 71, a $p^+$ type diode impurity region 73, which is a first pole, is selectively formed in a region 75, which is one of two regions 75 and 76 that are partitioned at a center line 74 of a pair of opposing sides (bisecting line of the sides) of the chip diode 65. The impurity concentration of the diode impurity region 73 is, for example, $1\times10^{19}$ $cm^{-3}$ to $1\times10^{21}$ $cm^{-3}$.

The diode impurity region 73 is formed to a circular well shape (with a depth, for example, of 1 μm to 10 μm). In the epitaxial layer 71, the $p^+$ type diode impurity region 73 (p pole) in the vicinity of the top surface 72 and the remaining $n^-$ portion (n pole) of the epitaxial layer 71 that is a second pole are put in an adjacent state by being laminated in the thickness direction of the epitaxial layer 71. A diode element 78 constituted of a p-n junction 77 of these poles is thereby provided in the epitaxial layer 71.

An insulating film 79 is formed on the epitaxial layer 71. In the present preferred embodiment, the insulating film 79 is constituted of a laminated film of an $SiO_2$ (silicon oxide) film 80 formed on the top surface 72 of the epitaxial layer 71 and a PSG (phosphosilicate glass) film 81 formed on the $SiO_2$ film 80. The thickness of the $SiO_2$ film 80 is, for example, 5000 Å to 20000 Å and the thickness of the PSG film 81 is, for example, 5000 Å to 10000 Å.

A circular contact hole 82, penetrating through the PSG film 81 and the $SiO_2$ film 80 and being smaller in diameter than the outer periphery of the diode impurity region 73, is formed in the insulating film 79. An anode electrode 83 (with a thickness of, for example, 10000 Å to 30000 Å), made of Al (aluminum), is formed as a first electrode on the insulating film 79. As the material of the anode electrode 83, any of various conductive materials besides Al may be used.

The anode electrode 83 enters into the contact hole 82 and is in ohmic contact with the diode impurity region 73. Also, the anode electrode 83 is led out in a lateral direction, along the side of the chip diode 65 closest to the diode impurity region 73, from the contact hole 82 to a corner portion of the chip diode 65 in the region 76 at the opposite side, with respect to the center line 74, of the region 75 in which the diode impurity region 73 is formed.

On the insulating film 79, a top surface protective film 84 (with a thickness of, for example, 10000 Å to 30000 Å), made of SiN (silicon nitride), is formed across the entire surface of the epitaxial layer 71 so as to cover the anode electrode 83. Any of various insulating materials besides SiN may be used as the material of the surface protective film 84. A rectangular pad opening 85 with a long side being approximately 0.1 mm is formed in the surface protective film 84 at a position directly above a corner portion of the chip diode 65 at which a terminal portion of the anode electrode 83 is disposed. A portion of the anode electrode 83 is exposed as a pad 86 from the pad opening 85. That is, the pad 86 that is exposed from the pad opening 85 is provided at a position that is separated along the top surface 72 of the epitaxial layer 71 from a position directly above the p-n junction 77 of the diode element 78 (that is, the position of the contact hole 82). The diode impurity region 73 at one side with respect to the center line 74 and the pad 86 at the opposite side are thereby made mutually adjacent along one side of the chip diode 65. The bump 69 is formed on the pad 86 (anode electrode 83).

A cathode electrode 88 (with a thickness of, for example, 10000 Å to 30000 Å), made of Au (gold), is formed as a second electrode on a rear surface 87 of the semiconductor substrate 70. At the rear surface 87 of the semiconductor substrate 70, the cathode electrode 88 is in ohmic contact with the semiconductor substrate 70 and the epitaxial layer 71 that constitute an n-pole of the diode element 78. The cathode side inner lead 62 is bonded via the bonding material 64 to the cathode electrode 88. As the material of the cathode electrode 88, any of various conductive materials besides Au may be used.

As described above, with the chip diode 65, the pad 86 for electrical connection with the exterior is provided at a position directly above a corner portion of the chip diode 65 and is provided at a position separated from a position directly above the p-n junction 77 of the diode element 78 of the chip diode 65. In other words, the pad 86 is provided at a position shifted from the p-n junction 77 and the p-n junction 77 that constitutes the diode element 78 is not disposed directly below the pad 86.

Therefore in a manufacturing process of the diode package 51, even if a large stress is applied to the pad 86 when the anode terminal 55 is press-bonded onto the bump 69 formed on the pad 86, the physical stress transmitted to the p-n junction 77 can be lightened. The chip diode 65 with which the p-n junction 77 is not destroyed can thus be installed in the diode package 51. Consequently, the diode package 51 can be manufactured as a device of high reliability. Moreover, the insulating film 79 is interposed between the pad 86 and the epitaxial layer 71, and the insulating film 79 can thus act as a cushioning material that relaxes stress applied to the pad 86 before the stress is transmitted to the epitaxial layer 71. The physical stress transmitted to the p-n junction 77 can thus be lightened further.

Although preferred embodiments of the first invention have been described above, the first invention may be implemented in yet other modes as well. For example, with each of the chip diodes 15 and 65, an arrangement in which the conductivity types of the respective semiconductor portions are inverted may be adopted. For example, the p-type portion may be changed to the n-type and the n-type portion may be changed to the p-type. Also, the material constituting the respective semiconductor portions does not have to be silicon.

Also, the p-n junction 28 or 77 constituting the diode element 29 or 78 may, for example, be constituted of a p-type portion and an n-type portion that are mutually adjacent in the direction along the top surface 22 or 72 of the epitaxial layer 21 or 71 and thereby arranged so that the current flows in the direction along the top surface 22 or 72 of the epitaxial layer 21 or 71. Also in regard to the size of the chip diode, although the chip diodes 15 and 65, each having a size with one side being not more than 0.1 mm, were taken up as examples with the respective preferred embodiments described above, the size may be changed as suitable in accordance with the size of the package. For example, in a case of housing in a package with a comparatively large size, the chip size may be enlarged within a range enabling housing within the package.

Also, in regard to the size of the pad opening, although the case where one side is approximately 0.1 mm was taken up in both of the preferred embodiments for chip diodes 15 and 65 of approximately 0.25 mm size, the size may be changed as suitable in accordance with the chip size and the type of terminal to be bonded to the pad exposed from the pad opening. For example, in a case where the bump 69 is to be formed on the pad 86 as in the chip diode 65, the size of the pad opening may be 0.19 mm×0.07 mm.

Also, the chip diode 65 may include, in place of the cathode electrode 88, a cathode electrode that is formed on the top surface of the insulating film 79 across an interval from the anode electrode 83. In this case, by forming, in the surface protective film 84, a pad opening that exposes a portion of the cathode electrode as a pad, a bump can be formed on the pad (cathode pad). The chip diode 65 can thereby be flip-chip bonded via the bump and the bump 69 on the anode electrode 83, for example, to islands or leads inside the diode package 51. Also, even in the case of using the bump, the same effects as those in the case of FIG. 1 can be obtained by providing a floating region below the pad in the same manner.

The first invention may be used as a chip part for usages in electrical and electronic equipment in general. For example, the first invention may be used favorably in a refrigerator, vacuum cleaner, laptop computer, cellphone, etc.

[2] Second Invention

In portable electronic equipment as represented by cellphones, the downsizing of the circuit parts constituting the internal circuits is being demanded. Downsizing is thus being demanded for chip diodes as well and accordingly, it is becoming difficult to secure current capability and also secure ESD (electrostatic discharge) tolerance.

An object of the second invention is to provide a chip diode that is improved in ESD tolerance. A more specific object of the second invention is to provide a chip diode with which both downsizing and securing of ESD tolerance can be achieved at the same time. The second invention has the following features.

A1. A chip diode including a plurality of diode cells formed on a semiconductor substrate and parallel connection portions provided on the semiconductor substrate and connecting the plurality of diode cells in parallel. With this arrangement, the plurality of diode cells are formed on the semiconductor substrate and the plurality of diode cells are connected in parallel by the parallel connection portion. The ESD tolerance can thereby be improved, and in particular, both reduction of the chip size and securing of ESD tolerance can be achieved at the same time.

A2. The chip diode according to “A1.,” where each of the plurality of diode cells has an individual diode junction region. With this arrangement, diode junction regions that are separated according to each diode cell are formed and these regions are connected in parallel by the parallel connection portions. By a diode junction region being formed in each of the plurality of diode cells, a peripheral length of the diode junction regions on the semiconductor substrate can be made long. Concentration of electric field is thereby relaxed and the ESD tolerance can be improved. That is, a sufficient ESD tolerance can be secured even if the chip size is reduced. The peripheral length of the diode junction regions is the total of the lengths of the peripheries of the diode junction regions at the top surface of the semiconductor substrate.

A3. The chip diode according to “A2.,” where each of the diode junction regions is a p-n junction region. With this arrangement, p-n junction regions that are separated according to each diode cell are formed and these regions are connected in parallel by the parallel connection portions. A p-n junction type chip diode, with which the plurality of diode cells are connected in parallel, can thus be provided. By a p-n junction region being formed in each of the plurality of diode cells, a peripheral length of the p-n junction regions on the semiconductor substrate can be made long. Concentration of electric field is thereby relaxed and the ESD tolerance can be improved. That is, a sufficient ESD tolerance can be secured even if the chip size is reduced. The peripheral length of the p-n junction regions is the total extension of the boundary lines between p-type regions and n-type regions at the top surface of the semiconductor substrate.

A4. The chip diode according to “A3.,” where the semiconductor substrate is constituted of a semiconductor of a first conductivity type and each diode cell has a region of a second conductivity type formed on the semiconductor substrate. With this arrangement, the plurality of diode cells, each having the p-n junction region, can be formed on the semiconductor substrate by forming the regions of the second conductivity type that are separated according to each diode cell on the first conductivity type semiconductor substrate.

A5. The chip diode according to “A4.,” where the parallel connection portions include a first electrode that is in common contact with the regions of the second conductivity type provided respectively in the plurality of diode cells and further include a second electrode electrically connected to the semiconductor substrate. With this arrangement, the plurality of diode cells are connected in parallel by the second conductivity type regions of the respective diode cells being connected in common to the first electrode and the second electrode being electrically connected to the first conductivity type region shared by the plurality of diode cells.

A6. The chip diode according to “A4.,” further including a first conductivity type region formed on the semiconductor substrate and having a higher impurity concentration than the semiconductor substrate and where the second electrode is bonded to the first conductivity type region. With this arrangement, the first conductivity type region of high impurity concentration is formed on the semiconductor substrate, the second electrode is bonded to the first conductivity type region, and an ohmic junction can thus be formed between the two.

A7. The chip diode according to “A2.,” where each of the diode junction regions is a Schottky junction region. With this arrangement, a plurality of mutually separated Schottky junction regions are formed on the semiconductor substrate and these constitute the plurality of diode cells (Schottky barrier diode cells). A Schottky barrier diode type chip diode in which the plurality of Schottky barrier diode cells are connected in parallel can thus be provided.

By a Schottky junction region being formed in each of the plurality of diode cells, a peripheral length of the Schottky junction regions on the semiconductor substrate can be made long. Concentration of electric field is thereby relaxed and the ESD tolerance can be improved. That is, a sufficient ESD tolerance can be secured even if the chip size is reduced. The peripheral length of the Schottky junction regions is the total extension of the peripheries of the regions of contact (Schottky junction regions) of a Schottky metal and the semiconductor substrate top surface.

A8. The chip diode according to “A7.,” where the parallel connection portions include a first electrode having a Schottky metal in contact with the Schottky junction regions of the plurality of diode cells and in Schottky junction with the respective Schottky junction regions, and a second electrode electrically connected to the semiconductor substrate. With this arrangement, Schottky junctions are formed according to each individual diode cell by the Schottky metal being joined to the respective Schottky junction regions of the plurality of diode cells. The plurality of Schottky barrier diode cells that are thus formed are connected in common to the first electrode. The semiconductor substrate is made a region in common to the plurality of Schottky barrier diode cells and is connected to the second electrode. The plurality of Schottky barrier diode cells are thus connected in parallel between the first and second electrodes.

A9. The chip diode according to “A5.,” “A6.,” or “A7.,” where the first electrode and the second electrode are formed on one of the surfaces of the semiconductor substrate. With this arrangement, both the first electrode and the second electrode are formed on one of the surfaces of the semiconductor substrate, and the chip diode can thus be surface-mounted on a mounting substrate. That is, a flip-chip connection type chip diode can be provided.

A10. The chip diode according to any one of “A2.” to “A9.,” where the diode junction regions of the plurality of diode cells are formed to be equal in size. With this arrangement, the plurality of diode cells has substantially equal characteristics and the chip diode thus has satisfactory characteristics as a whole and can be made to have a sufficient ESD tolerance even when downsized.

A11. The chip diode according to any one of “A2.” to “A10.” where each diode junction region is a polygonal region. With this arrangement, each diode cell has a diode junction region of long peripheral length, the peripheral length of the entirety can thus be made long, and the ESD tolerance can thus be improved.

A12. The chip diode according to any one of aspects “A2.” to “A11.,” where the plurality of diode cells are formed to be equal in size (more specifically, the p-n junction regions or the Schottky junction regions of the plurality of diode cells are formed to be equal in size). With this arrangement, the plurality of diode cells have substantially equal characteristics and the chip diode thus has satisfactory characteristics as a whole and can be made to have a sufficient ESD tolerance even when downsized.

A13. The chip diode according to any one of “A2.” to “A12.,” where the plurality of diode cells are arrayed two-dimensionally at equal intervals. With this arrangement, the ESD tolerance can be improved further by the plurality of diode cells being arrayed two-dimensionally at equal intervals.

A14. The chip diode according to any one of “A2.” to “A13.,” where not less than four of the diode cells are provided. With this arrangement, by not less than four of the diode cells being provided, the peripheral length of the diode junction regions can be made long and the ESD tolerance can be improved efficiently.

Figure 11:
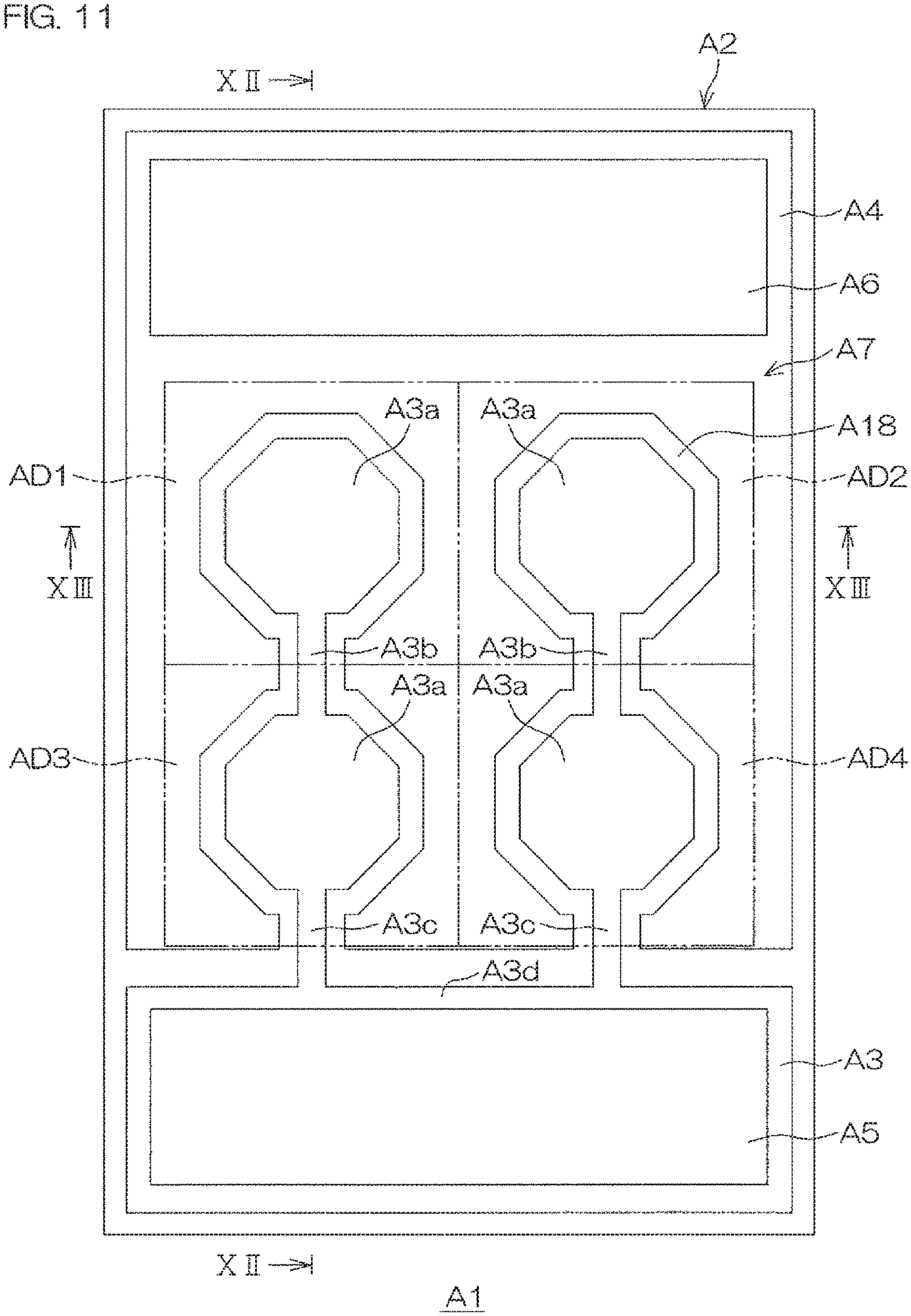
FIG. 11 is a plan view of a chip diode according to a first preferred embodiment of a second invention.
Figure 12:
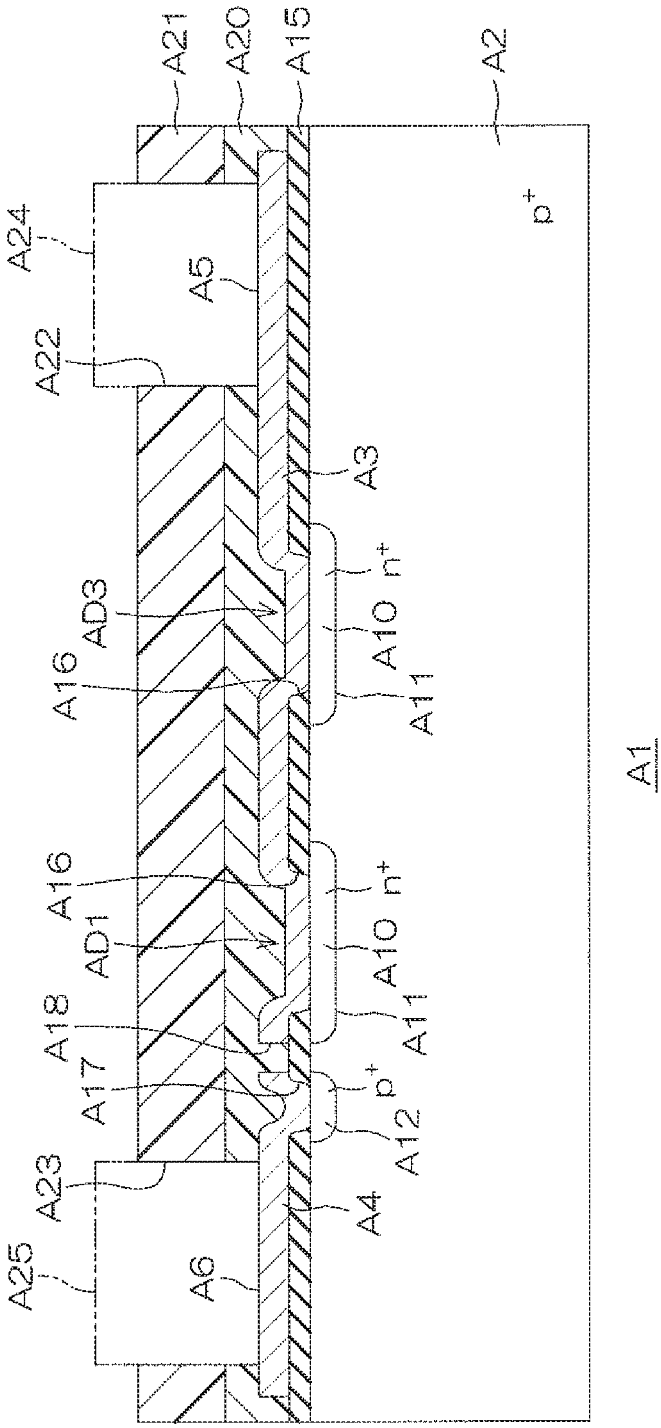
FIG. 12 is a sectional view taken along line XII-XII in FIG. 11.
Figure 13:
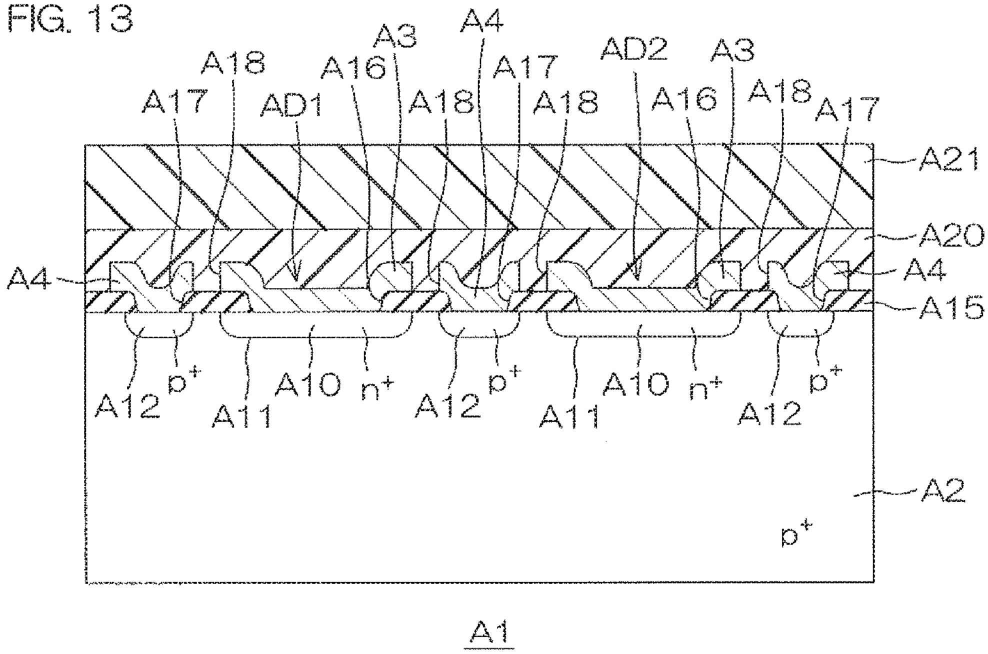
FIG. 13 is a sectional view taken along line XIII-XIII in FIG. 11.

Preferred embodiments of the second invention shall now be described in detail with reference to the attached drawings. FIG. 11 is a plan view of a chip diode according to a first preferred embodiment of the second invention and FIG. 12 is a sectional view taken along line XII-XII in FIG. 11. Further, FIG. 13 is a sectional view taken along line XIII-XIII in FIG. 11. The chip diode A1 includes a $p^+$ type semiconductor substrate A2 (for example, a silicon substrate), a plurality of diode cells AD1 to AD4 formed on the semiconductor substrate A2, and a cathode electrode A3 and an anode electrode A4 connecting the plurality of diode cells AD1 to AD4 in parallel. The semiconductor substrate A2 is formed to a rectangular shape in a plan view and, for example, the length in the long direction may be approximately 0.5 mm and the length in the short direction may be approximately 0.25 mm. A cathode pad A5 for connection with the cathode electrode A3 and an anode pad A6 for connection with the anode electrode A4 are disposed at respective end portions of the semiconductor substrate A2. A diode cell region A7 is provided between the pads A5 and A6.

In the present preferred embodiment, the diode cell region A7 is formed to a rectangular shape. The plurality of diode cells AD1 to AD4 are disposed inside the diode cell region A7. In regard to the plurality of diode cells AD1 to AD4, four are provided in the present preferred embodiment and these are arrayed two-dimensionally at equal intervals in a matrix along the long direction and short direction of the semiconductor substrate A2.

Figure 14:
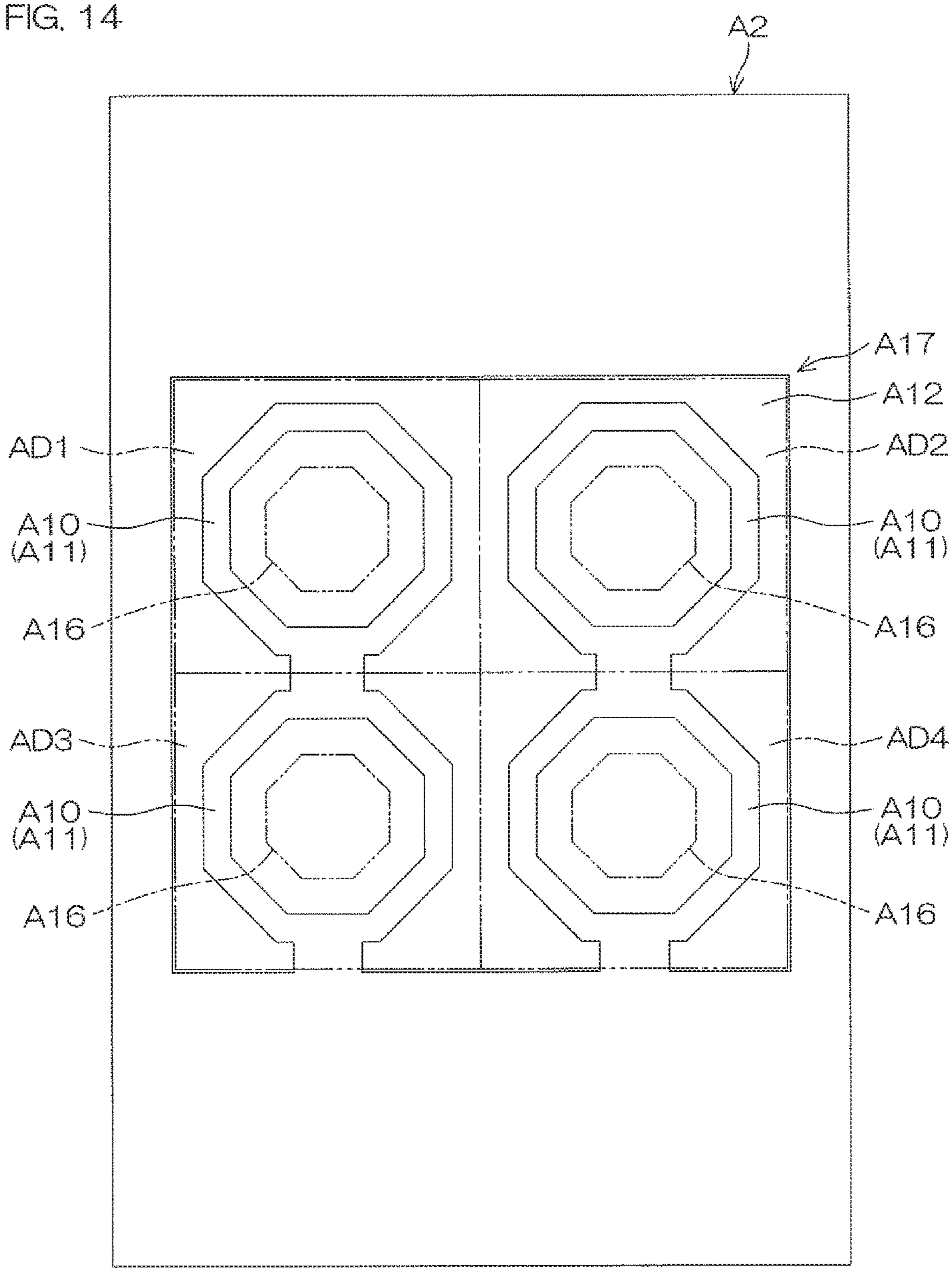
FIG. 14 is a plan view of the chip diode according to the first preferred embodiment with a cathode electrode, an anode electrode, and the arrangement formed thereon being removed to show the structure of a top surface of a semiconductor substrate.

FIG. 14 is a plan view showing the structure of a top surface of the semiconductor substrate A2 with the cathode electrode A3, the anode electrode A4, and the arrangement formed thereon being removed. In each of the regions of the diode cells AD1 to AD4, an $n^+$ type region A10 is formed in a top layer region of the $p^+$ type semiconductor substrate A2. The $n^+$ type regions A10 are separated according to each individual diode cell. The diode cells AD1 to AD4 are thereby made to respectively have p-n junction regions A11 that are separated according to each individual diode cell.

In the present preferred embodiment, the plurality of diode cells AD1 to AD4 are formed to be equal in size and equal in shape and are specifically formed to rectangular shapes, and the $n^-$ type region A10 with a polygonal shape is formed in the rectangular region of each diode cell. In the present preferred embodiment, each $n^+$ type region A10 is formed to a regular octagon having four sides extending along the four sides forming the rectangular region of the corresponding diode cell among the diode cells AD1 to AD4 and another four sides respectively facing the four corner portions of the rectangular region of the corresponding diode cell among the diode cells AD1 to AD4. Further in the top layer region of the semiconductor substrate A2, a $p^+$ type region A12 is formed in a state of being separated from the $n^+$ type regions A10 across a predetermined interval. In the diode cell region A7, the $p^+$ type region A12 is formed to a pattern that avoids the region in which the cathode electrode A3 is disposed.

As shown in FIG. 12 and FIG. 13, an insulating film A15 (omitted from illustration in FIG. 11), constituted of an oxide film, etc., is formed on the top surface of the semiconductor substrate A2. Contact holes A16 exposing top surfaces of the respective $n^+$ type regions A10 of the diode cells AD1 to AD4 and contact holes A17 exposing the $p^+$ type region A12 are formed in the insulating film A15. The cathode electrode A3 and the anode electrode A4 are formed on the top surface of the insulating film A15. The cathode electrode A3 enters into the contact holes A16 from the top surface of the insulating film A15 and is in ohmic contact with the respective $n^+$ type regions A10 of the diode cells AD1 to AD4 inside the contact holes A16. The anode electrode A4 extends to inner sides of the contact holes A17 from the top surface of the insulating film A15 and is in ohmic contact with the $p^+$ type region A12 inside the contact holes A17. In the present preferred embodiment, the cathode electrode A3 and the anode electrode A4 are constituted of electrode films made of the same material.

As each electrode film, a Ti/Al laminated film having a Ti film as a lower layer and an Al film as an upper layer or an AlCu film may be applied. Besides these, an AlSi film may also be used as the electrode film. When an AlSi film is used, the anode electrode A4 can be put in ohmic contact with the semiconductor substrate A2 without having to provide the $p^+$ type region A12 on the top surface of the semiconductor substrate A2. A process for forming the $p^+$ type region A12 can thus be omitted.

The cathode electrode A3 and the anode electrode A4 are separated by a slit A18. In the present preferred embodiment, the slit A18 is formed to a frame shape (that is, a regular octagonal frame shape) matching the planar shapes of the $n^-$ type regions A10 of the diode cells AD1 to AD4 so as to border the $n^+$ type regions A10. Accordingly, the cathode electrode A3 has, in the regions of the respective diode cells AD1 to AD4, cell junction portions A3*a* with planar shapes matching the shapes of the $n^+$ type regions A10 (that is, regular octagonal shapes), the cell junction portions A3*a* are put in communication with each other by rectilinear bridging portions A3*b* and are connected by other rectilinear bridging portions A3*c* to a large external connection portion A3*d* of rectangular shape that is formed directly below the cathode pad A5. On the other hand, the anode electrode A4 is formed on the top surface of the insulating film A15 so as to surround the cathode electrode A3 across an interval corresponding to the slit A18 of substantially fixed width and is formed integrally to extend to a rectangular region directly below the anode pad A6.

The cathode electrode A3 and the anode electrode A4 are covered by a passivation film A20 (omitted from illustration in FIG. 11), constituted, for example, of a nitride film, and a resin film A21, made of polyimide, etc., is further formed on the passivation film A20. A pad opening A22 exposing the cathode pad A5 and a pad opening A23 exposing the anode pad A6 are formed so as to penetrate through the passivation film A20 and the resin film A21. Further, external connection electrodes A24 and A25 may be embedded in the pad openings A22 and A23 as indicated by alternate long and two short dashes line in FIG. 12. The external connection electrodes A24 and A25 may have top surfaces at positions lower than the top surface of the resin film A21 (positions close to the semiconductor substrate A2) or may project from the top surface of the resin film A21 and have top surfaces at positions higher than the resin film A21 (positions far from the semiconductor substrate A2). An example where the external connection electrodes A24 and A25 project from the top surface of the resin film A21 is shown in FIG. 12. Each of the external connection electrodes A24 and A25 may be constituted, for example, of an Ni/Pd/Au laminated film having an Ni film in contact with the electrode A3 or A4, a Pd film formed on the Ni film, and an Au film formed on the Pd film. Such a laminated film may be formed by a plating method.

In each of the diode cells AD1 to AD4, a p-n junction region A11 is formed between the p-type semiconductor substrate A2 and the $n^+$ type region A10, and a p-n junction diode is thus formed respectively. The $n^+$ type regions A10 of the plurality of diode cells AD1 to AD4 are connected in common to the cathode electrode A3, and the $p^+$ type semiconductor substrate A2, which is the p-type region in common to the diode cells AD1 to AD4, is connected in common via the $p^+$ type region A12 to the anode electrode A4. The plurality of diode cells AD1 to AD4, formed on the semiconductor substrate A2 are thereby connected in parallel all together.

Figure 15:
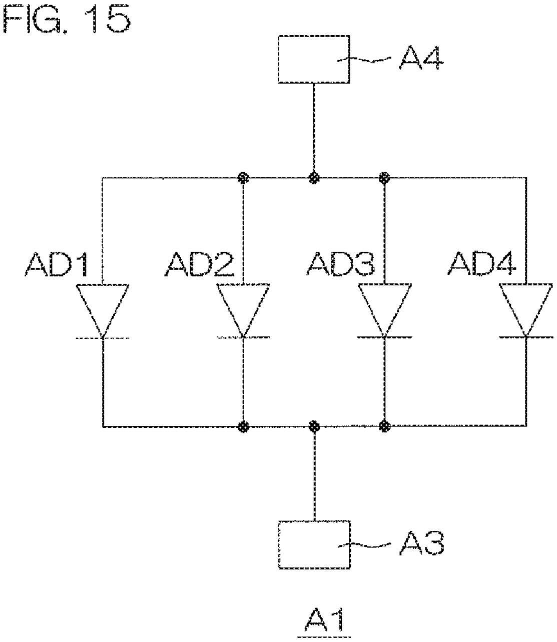
FIG. 15 is an electric circuit diagram showing the electrical structure of the interior of the chip diode according to the first preferred embodiment of the second invention.

FIG. 15 is an electric circuit diagram showing the electrical structure of the interior of the chip diode A1. By the cathode sides of the p-n junction diodes respectively constituted by the diode cells AD1 to AD4 being connected in common by the cathode electrode A3 and the anode sides being connected in common by the anode electrode A4, all of the diodes are connected in parallel and are thereby made to function as a single diode as a whole.

With the arrangement of the present preferred embodiment, the chip diode A1 has the plurality of diode cells AD1 to AD4 and each of the diode cells AD1 to AD4 has the p-n junction region A11. The p-n junction regions A11 are separated according to each of the diode cells AD1 to AD4. The chip diode A1 is thus made long in the peripheral length of the p-n junction regions A11, that is, the total peripheral length (total extension) of the $n^+$ type regions A10 in the semiconductor substrate A2. The electric field can thereby be dispersed and prevented from concentrating at vicinities of the p-n junction regions A11, and the ESD tolerance can thus be improved. That is, even when the chip diode A1 is to be formed compactly, the total peripheral length of the p-n junction regions A11 can be made large, thereby enabling both downsizing of the chip diode A1 and securing of the ESD tolerance to be achieved at the same time.

Figure 16:
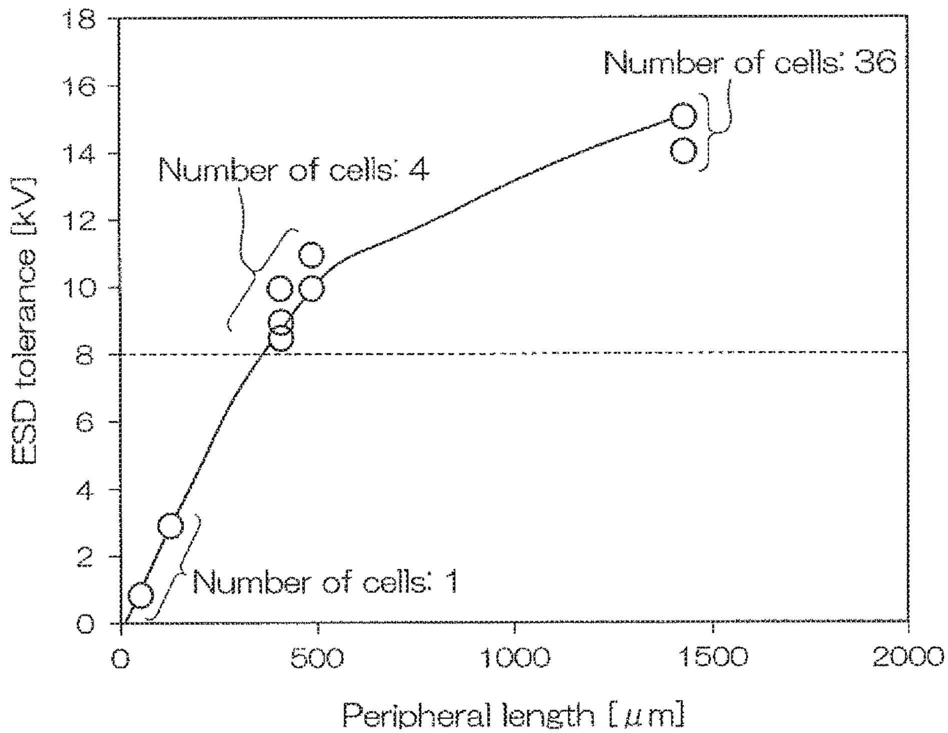
FIG. 16 shows experimental results of measuring the ESD tolerances of a plurality of samples that are differed in total peripheral length (total extension) of p-n junction regions by variously setting the sizes of diode cells and/or the number of the diode cells formed on a semiconductor substrate of the same area.

FIG. 16 shows experimental results of measuring the ESD tolerances of a plurality of samples that are differed in the total peripheral length (total extension) of the p-n junction regions by variously setting the sizes of diode cells and/or the number of the diode cells formed on a semiconductor substrate of the same area. From these experimental results, it can be understood that the longer the peripheral length of the p-n junction regions, the greater the ESD tolerance. In cases where not less than four diode cells are formed on the semiconductor substrate, ESD tolerances in the excess of 8 kilovolts could be realized.

A manufacturing process of the chip diode A1 shall now be described briefly. First, the insulating film A15, which is a thermal oxide film, etc., is formed on the top surface of the $p^+$ type semiconductor substrate A2 and a resist mask is formed on the insulating film A15. By ion implantation or diffusion of an n-type impurity (for example, phosphorus) via the resist mask, the $n^+$ type regions A10 are formed. Further, another resist mask, having an opening matching the $p^+$ type region A12, is formed and by ion implantation or diffusion of a p-type impurity (for example, arsenic) via the resist mask, the $p^+$ type region A12 is formed. After then peeling off the resist mask and thickening the insulating film A15 (thickening, for example, by CVD) as necessary, yet another resist mask, having opening matching the contact holes A16 and A17, is formed on the insulating film A15. The contact holes A16 and A17 are formed in the insulating film A15 by etching via the resist mask.

Thereafter, an electrode film that constitutes the cathode electrode A3 and the anode electrode A4 is formed on the insulating film A15, for example, by sputtering. A resist film having an opening pattern corresponding to the slit A18 is then formed on the electrode film and the slit A18 is formed in the electrode film by etching via the resist film. The electrode film is thereby separated into the cathode electrode A3 and the anode electrode A4.

Then after peeling off the resist film, the passivation film A20, which is a nitride film, etc., is formed, for example, by the CVD method, and further, polyimide, etc., is applied to form the resin film A21. By then applying etching using photolithography to the passivation film A20 and the resin film A21, the pad openings A22 and A23 are formed. Thereafter, the external connection electrodes A24 and A25 are formed as necessary inside the pad openings A22 and A23. The external connection electrodes A24 and A25 may be formed by plating. The chip diode A1 with the structure described above can thereby be obtained.

Figure 17:
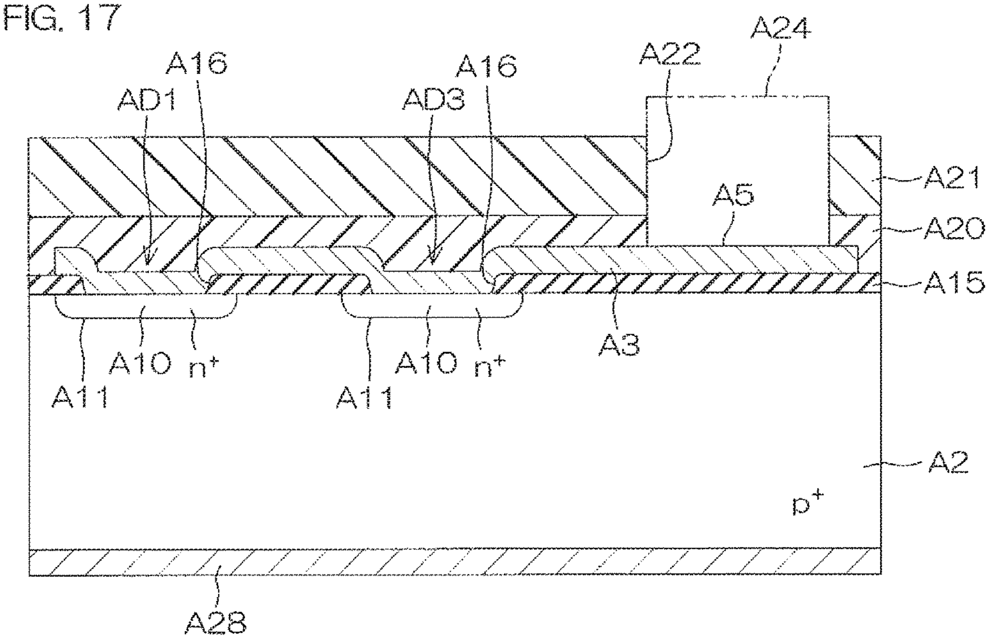
FIG. 17 is a sectional view for describing the arrangement of a chip diode according to a second preferred embodiment of the second invention.

FIG. 17 is a sectional view for describing the arrangement of a chip diode according to a second preferred embodiment of the second invention. In FIG. 17, portions corresponding to the respective portions shown in FIG. 11 to FIG. 14 of the above description are provided with the same reference symbols. In the present preferred embodiment, the cathode electrode A3 is disposed on the top surface of the semiconductor substrate A2 and an anode electrode A28 is disposed on the rear surface of the semiconductor substrate A2. Therefore with the present preferred embodiment, there is no need to provide the anode pad A6 at the top surface side (cathode electrode A3 side) of the semiconductor substrate A2 and the size of the semiconductor substrate A2 can be reduced or the number of diode cells AD1 to AD4 can be increased accordingly. The cathode electrode A3 is formed to cover substantially the entirety of the top surface of the semiconductor substrate A2 and is in ohmic contact with the respective $n^+$ type regions A10 of the diode cells AD1 to AD4. The anode electrode A28 is in ohmic contact with the rear surface of the semiconductor substrate A2. The anode electrode A28 may, for example, be made of gold.

Figure 18:
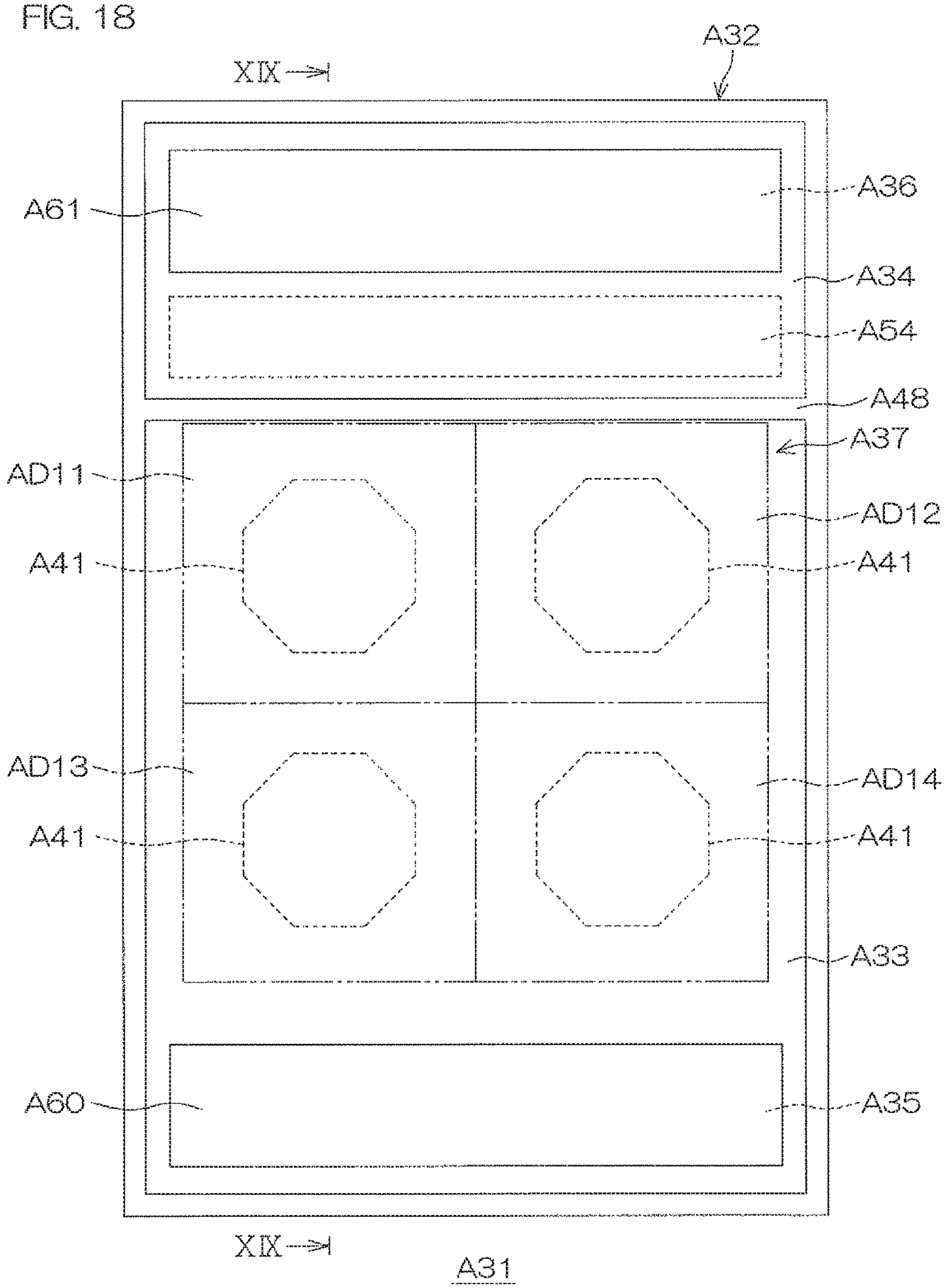
FIG. 18 is a plan view for describing the arrangement of a chip diode according to a third preferred embodiment of the second invention.
Figure 19:
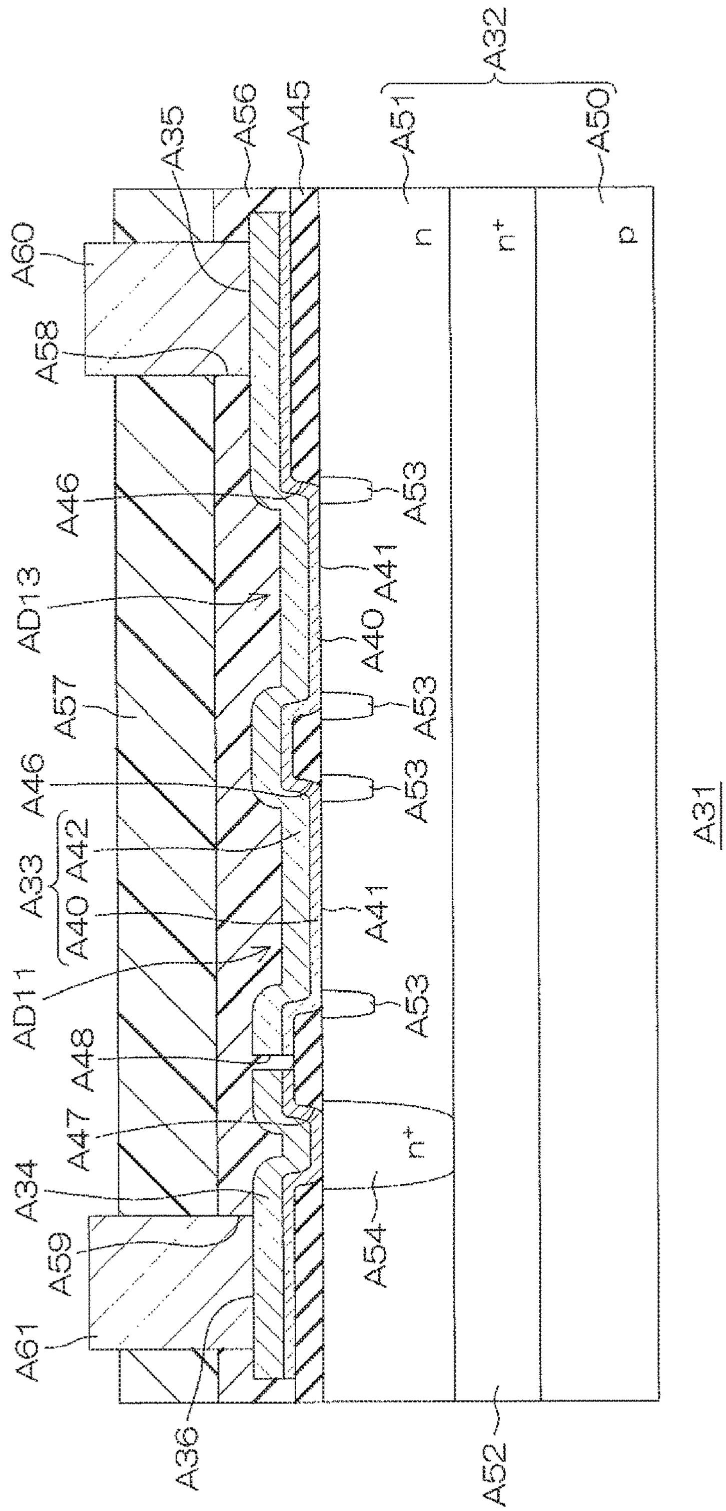
FIG. 19 is a sectional view taken along line XIX-XIX in FIG. 18.

FIG. 18 is a plan view for describing the arrangement of a chip diode A31 according to a third preferred embodiment of the second invention. FIG. 19 is a sectional view taken along line XIX-XIX in FIG. 18. The chip diode A31 includes a semiconductor substrate A32, a cathode electrode A33 and an anode electrode A34 formed on the semiconductor substrate A32, and a plurality of diode cells AD11 to AD14 connected in parallel between the cathode electrode A33 and the anode electrode A34. The semiconductor substrate A32 is formed to a substantially rectangular shape in a plan view and has a cathode pad A35 and an anode pad A36 respectively disposed at respective end portions in the long direction thereof. A diode cell region A37 of rectangular shape is set between the cathode pad A35 and the anode pad A36. The plurality of diode cells AD11 to AD14 are arrayed two-dimensionally inside the diode cell region A37. In the present preferred embodiment, the plurality of diode cells AD11 to AD14 are arrayed at equal intervals in a matrix along the long direction and the short direction of the semiconductor substrate A32. The size of the semiconductor substrate A32 may be approximately the same as that of the semiconductor substrate A2 of the first preferred embodiment.

Each of the diode cells AD11 to AD14 is constituted of a rectangular region and has a Schottky junction region A41 of polygonal shape (a regular octagonal shape in the present preferred embodiment) in a plan view in the interior of the rectangular region. A Schottky metal A40 is disposed so as to contact the respective Schottky junction regions A41. That is, the Schottky metal A40 is in a Schottky junction with the semiconductor substrate A32 in the Schottky junction regions A41.

In the present preferred embodiment, the semiconductor substrate A32 has a p-type silicon substrate A50 and an n-type epitaxial layer A51 grown epitaxially thereon. An $n^+$ type embedded layer A52, formed by introducing an n-type impurity (for example, arsenic), is formed on the top surface of the p-type silicon substrate A50. The Schottky junction region A41 is set at the top surface of the n-type epitaxial layer A51 and the Schottky junction is formed by the Schottky metal A40 being joined to the top surface of the n-type epitaxial layer A51. A guard ring A53 is formed at a periphery of the Schottky junction region A41 to suppress leakage at the contact edge.

The Schottky metal A40 may be made, for example, of Ti or TiN, and the cathode electrode A33 is arranged by laminating a metal film A42 of AlSi alloy, etc., on the Schottky metal A40. Although the Schottky metal A40 may be separated according to each of the diode cells AD11 to AD14, in the present preferred embodiment, the Schottky metal A40 is formed so as to be in contact in common with the respective Schottky junction regions A41 of the plurality of diode cells AD11 to AD14.

An $n^+$ type well A54, reaching from the top surface of the epitaxial layer A51 to the $n^+$ type embedded layer A52, is formed in a region of the n-type epitaxial layer A51 that avoids the Schottky junction region A41. The anode electrode A34 is formed so as to be in ohmic contact with the top surface of the $n^+$ type well A54. The anode electrode A34 may be constituted of an electrode film of the same arrangement as the cathode electrode A33.

An insulating film A45, constituted, for example, of an oxide film, is formed on the top surface of the n-type epitaxial layer A51. Contact holes A46, corresponding to the Schottky junction regions A41, and a contact hole A47, exposing the $n^+$ type well A54, are formed in the insulating film A45. The cathode electrode A33 is formed so as to cover the insulating film A45, reaches the interiors of the contact holes A46, and is in Schottky junction with the n-type epitaxial layer A51 in the contact holes A46. On the other hand, the anode electrode A34 is formed on the insulating film A45, extends into the contact hole A47, and is in ohmic contact with the $n^+$ type well A54 inside the contact hole A47. The cathode electrode A33 and the anode electrode A34 are separated by a slit A48.

A passivation film A56, constituted, for example, of a nitride film, is formed so as to cover the cathode electrode A33 and the anode electrode A34. Further, a resin film A57, made of polyimide, etc., is formed so as to cover the passivation film A56. A pad opening A58, which exposes a partial region of the top surface of the cathode electrode A33 that is to be a cathode pad A35, is formed to penetrate through the passivation film A56 and the resin film A57. Further, a pad opening A59 is formed to penetrate through the passivation film A56 and the resin film A57 so as to exposes a partial region of the top surface of the anode electrode A34 that is to be an anode pad A36. External connection electrodes A60 and A61 are respectively embedded in the pad openings A58 and A59. These project upward from the top surface of the resin film A57. Each of the external connection electrodes A60 and A61 may be constituted of a Ni/Pd/Au laminated film having an Ni film in contact with the electrode A33 or A34, a Pd film formed on the Ni film, and an Au film formed on the Pd film. Such a laminated film may be formed by a plating method.

With this arrangement, the cathode electrode A33 is connected in common to the respective Schottky junction regions A41 of the diode cells AD11 to AD14. Also, the anode electrode A34 is connected to the n-type epitaxial layer A51 via the $n^+$ type well A54 and the $n^+$ type embedded layer A52 and is thus connected in common and parallel to the Schottky junction regions A41 formed in the plurality of diode cells AD11 to AD14. A plurality of Schottky barrier diodes, having the Schottky junction regions A41 of the plurality of diode cells AD11 to AD14, are thus connected in parallel between the cathode electrode A33 and the anode electrode A34.

The plurality of diode cells AD11 to AD14 respectively have the mutually separated Schottky junction regions A41 in the present preferred embodiment as well, and therefore the total extension of the peripheral length of the Schottky junction regions (peripheral length of the Schottky junction regions A41 at the top surface of the n-type epitaxial layer A51) is made large. Concentration of electric field can thereby be suppressed and the ESD tolerance can thus be improved. That is, even when the chip diode A31 is to be formed compactly, the total peripheral length of the Schottky junction regions A41 can be made large, thereby enabling both downsizing of the chip diode A31 and securing of the ESD tolerance to be achieved at the same time.

Figure 20:
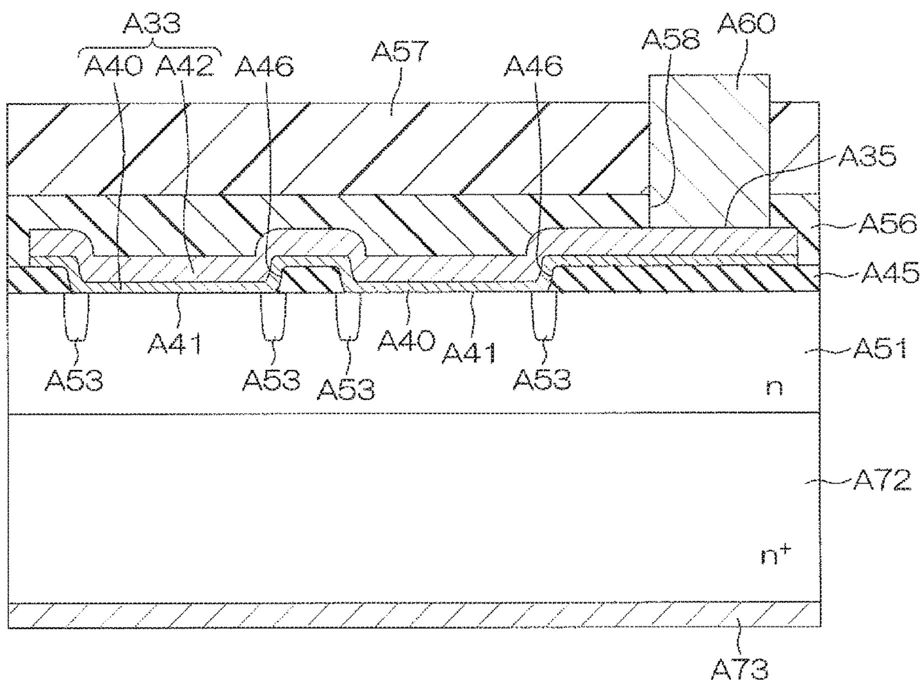
FIG. 20 is an illustrative sectional view for describing the arrangement of a chip diode according to a fourth preferred embodiment of the second invention.

FIG. 20 is an illustrative sectional view for describing the arrangement of a chip diode according to a fourth preferred embodiment of the second invention. In FIG. 20, portions corresponding to the respective portions shown in FIG. 18 and FIG. 19 of the above description are provided with the same reference symbols. In the present preferred embodiment, the n-type epitaxial layer A51 is formed on a top surface of an $n^+$ type silicon substrate A72. An anode electrode A73 is formed so as to be in ohmic contact with a rear surface (surface at the opposite side with respect to the n-type epitaxial layer A51) of the $n^+$ type semiconductor substrate A72. On the top surface of the n-type epitaxial layer A51, an anode electrode is not formed and only the cathode electrode A33 that is connected in parallel to the Schottky junction regions A41 formed on the n-type epitaxial layer A51 is formed. Even with such an arrangement, the same actions and effects as those of the third preferred embodiment can be exhibited. In addition, there is no need to provide the anode electrode at the top surface of the n-type epitaxial layer A51 so that a larger number of diode cells can be disposed on the top surface of the n-type epitaxial layer A51 to further increase the total extension of the peripheral length of the Schottky junction regions A41 and improve the ESD tolerance. Or, the size of the $n^+$ type semiconductor substrate A72 can be reduced to provide a more compact chip diode with which the ESD tolerance is secured.

Although preferred embodiments of the second invention have been described above, the second invention may be implemented in yet other modes as well. For example, although with the first to fourth preferred embodiments described above, examples where four diode cells are formed on the semiconductor substrate were described, two or three diode cells may be formed or not less than four diode cells may be formed on the semiconductor substrate. Also, although with the preferred embodiments, examples where the p-n junction regions or the Schottky junction regions are respectively formed to a regular octagon in a plan view were described, the p-n junction regions or the Schottky junction regions may be formed to any polygonal shape with the number of sides being not less than three, and the planar shape of the regions may be circular or elliptical. If the shape of the p-n junction regions or the Schottky junction regions is to be made a polygonal shape, the shape does not have to be a regular polygonal shape and the regions may be formed to a polygon with two or more types of side length. Yet further, there is no need to form the p-n junction regions or the Schottky junction regions to the same size and a plurality of diode cells respectively having junction regions of different sizes may be mixed on the semiconductor substrate. Yet further, the shape of the p-n junction regions or the Schottky junction regions formed on the semiconductor substrate does not have to be of one type, and p-n junction regions or Schottky junction regions with two or more types of shape may be mixed on the semiconductor substrate.

[3] Third Invention

In portable electronic equipment as represented by cellphones, the downsizing of the circuit parts constituting the internal circuits is being demanded. Downsizing is thus being demanded for chip diodes as well and accordingly, it is becoming difficult to secure current capability and also secure ESD (electrostatic discharge) tolerance. That is, it is becoming difficult to realize a compact chip diode of high reliability.

An object of the third invention is to provide a chip diode with which both downsizing and securing of reliability can be achieved at the same time. The third invention further provides a circuit assembly including the chip diode and an electronic equipment including such as circuit assembly. The third invention has the following features.

B1. A chip diode including a plurality of diode cells formed on a semiconductor substrate and each having an individual diode junction region, a plurality of lead-out electrodes each connected to poles at one side of the plurality of diode cells, a first electrode having an external connection portion connected to the plurality of lead-out electrodes, and a second electrode connected to the poles at the other side of the plurality of diode cells, and where the lead-out electrodes have cell connection portions connected to the poles at one side of the diode cells and have widths wider than the cell connection portions at all locations between the cell connection portion and the external connection portion.

With this arrangement, the plurality of diode cells are formed on the semiconductor substrate, the poles at one side of the plurality of diode cells are connected in common to the external connection portion of the first electrode by the plurality of lead-out electrodes, and the poles at the other side are connected to the second electrode. The plurality of diode cells are thereby connected in parallel between the first electrode and the second electrode. The ESD tolerance can thereby be improved, and in particular, both reduction of the chip size and securing of the ESD tolerance can be achieved at the same time. More specifically, the diode junction regions that are separated according to each diode cell are formed and these are connected in parallel. By an individual diode junction region being formed in each of the plurality of diode cells, a peripheral length of the diode junction regions on the semiconductor substrate can be made long. Concentration of electric field is thereby relaxed and the ESD tolerance can be improved. That is, a sufficient ESD tolerance can be secured even if the chip size is reduced. The peripheral length of the diode junction regions is the total of the lengths of the peripheries of the diode junction regions at the top surface of the semiconductor substrate.

Further with the present invention, the width of each lead-out electrode is wider than the width of the cell connection portion at all locations between the cell connection portion, connected to the pole at one side of a diode cell, and the external connection portion. A large allowable current amount can thus be set and electromigration can be reduced to improve reliability with respect to a large current. That is, a chip diode that is compact, high in ESD tolerance, and secured in reliability with respect to large currents can be provided.

The width of the lead-out electrode is the length in a direction orthogonal to an extension direction of the lead-out electrode in a plan view as viewed in the direction of a normal to a principal surface (element forming surface) of the semiconductor substrate. The extension direction is a direction along the principal surface of the substrate and is the direction in which the lead-out electrode extends. The lead-out electrode does not have to be formed rectilinearly, and in a case where the lead-out electrode is curved or bent, the length in the direction orthogonal to the extension direction of the lead-out electrode at each position is the width of the lead-out electrode. The width of the cell connection portion is the length along a direction orthogonal to a lead-out direction of the lead-out electrode in a plan view as viewed in the direction of the normal to the semiconductor substrate. The lead-out direction is a direction in which the lead-out electrode extends across an edge of the diode junction region in a plan view.

B2. The chip diode according to "B1.," where each of the diode junction regions is a p-n junction region. With this arrangement, p-n junction regions that are separated according to each diode cell are formed and these regions are connected in parallel. A p-n junction type chip diode, with which the plurality of diode cells are connected in parallel, can thus be provided. By a p-n junction region being formed in each of the plurality of diode cells, a peripheral length of the p-n junction regions on the semiconductor substrate can be made long. Concentration of electric field is thereby relaxed and the ESD tolerance can be improved. That is, a sufficient ESD tolerance can be secured even if the chip size is reduced. The peripheral length of the p-n junction regions is the total extension of the boundary lines between p-type regions and n-type regions at the top surface of the semiconductor substrate.

B3. The chip diode according to "B2.," where the semiconductor substrate is constituted of a p-type semiconductor substrate and n-type diffusion layers, forming the p-n junction regions with the p-type semiconductor substrate, are formed on the p-type semiconductor substrate while being separated according to each diode cell, the second electrode is electrically connected to the semiconductor substrate, and the cell connection portions of the lead-out electrodes are in contact with the n-type diffusion layers.

With this arrangement, the n-type diffusion layers corresponding to the poles at one side of the respective diode cells are connected via the lead-out electrodes to the external connection portion of the first electrode, and the p-type semiconductor substrate corresponding to the poles at the other side of the respective diode cells is electrically connected to the second electrode. The plurality of diode cells are thereby connected in parallel. Also, the n-type diffusion layers that are separated according to each diode cell are formed on the p-type semiconductor substrate and the plurality of diode cells, each having the p-n junction region, are thereby formed on the p-type semiconductor substrate. The cell connection portions of the lead-out electrodes contact the n-type diffusion layers and the lead-out electrodes have wider widths than the cell connection portions at all locations. Electromigration can thereby be reduced to improve reliability with respect to a large current.

Further, the semiconductor substrate is constituted of the p-type semiconductor substrate and therefore stable characteristics can be realized even if an epitaxial layer is not formed on the semiconductor substrate. That is, an n-type semiconductor wafer is large in in-plane variation of resistivity, and therefore an epitaxial layer with low in-plane variation of resistivity must be formed on the top surface and an impurity diffusion layer must be formed on the epitaxial layer to form the p-n junction. On the other hand, a p-type semiconductor wafer is low in in-plane variation and a diode with stable characteristics can be cut out from any location of the wafer without having to form an epitaxial layer. Therefore by using the p-type semiconductor substrate, the manufacturing process can be simplified and the manufacturing cost can be reduced.

B4. The chip diode according to "B2." or "B3.," where the second electrode includes an electrode film contacting the p-type semiconductor substrate and made of AlSi. AlSi is close in work function to a p-type semiconductor (especially a p-type silicon semiconductor). An AlSi electrode film can thus form a satisfactory ohmic junction with the p-type semiconductor. There is thus no need to form a high impurity concentration diffusion layer for ohmic junction on the p-type semiconductor substrate. The manufacturing process can thereby be simplified further and the productivity and the production cost can be reduced accordingly.

Besides the above, a Ti/Al laminated film, a Ti/TiN/AiCu laminated film, or other electrode film material may be applied as the electrode film that contacts the p-type semiconductor substrate. In this case, it is preferable to form a $p^+$ type diffusion layer, with a higher impurity concentration than the p-type semiconductor substrate, on the p-type semiconductor substrate and to form an ohmic contact by bonding the electrode film to the $p^+$ type diffusion layer.

B5. The chip diode according to any one of "B1." to "B4.," where the plurality of diode cells include a plurality of diode cells that are aligned on a straight line toward the external connection portion and the plurality of diode cells that are aligned on the straight line are connected to the external connection portion by the lead-out electrode in common that is formed rectilinearly along the straight line. With this arrangement, the plurality of diode cells that are aligned on the straight line toward the external connection portion of the first electrode are connected to the external connection portion by the rectilinear lead-out electrode in common. The length of the lead-out electrode from the diode cell to the external connection portion of the first electrode can thereby be minimized and electromigration can thus be reduced more effectively. Also, a single lead-out electrode can be shared by the plurality of diode cells to enable a lead-out electrode of wide line width to be laid out on the semiconductor substrate while forming a large number of diode cells to increase the peripheral length of the diode junction regions (p-n junction regions). Both further improvement of ESD tolerance and reduction of electromigration can thereby be achieved at the same time to provide a chip diode of even higher reliability.

B6. The chip diode according to "B5.," where an end portion of the rectilinear lead-out electrode at the side opposite to the external connection portion side is shaped to match the shapes of the diode junction regions. With this arrangement, the end portion of the lead-out electrode is matched to the shapes of the diode junction regions to enable connection with the diode junction regions to be realized while lessening the area occupied by the lead-out electrode.

B7. The chip diode according to any one of "B1." to "B6.," where the plurality of diode cells are arrayed two-dimensionally on the semiconductor substrate. With this arrangement, the ESD tolerance can be improved further by the plurality of diode cells being arrayed two-dimensionally (preferably arrayed two-dimensionally at equal intervals).

B8. The chip diode according to any one of "B1." to "B7.," where the first electrode and the second electrode are disposed at one of the principal surface sides of the semiconductor substrate. With this arrangement, both the first electrode and the second electrode are formed on one of the surfaces of the semiconductor substrate, and the chip diode can thus be surface-mounted on a mounting substrate. That is, a flip-chip connection type chip diode can be provided. The space occupied by the chip diode can thereby be made small. In particular, reduction of height of the chip diode on the mounting substrate can be realized. Effective use can thereby be made of the space inside a casing of a compact electronic equipment, etc., to contribute to high-density packaging and downsizing.

B9. The chip diode according to any one of "B1." to "B8.," further including an insulating film covering the principal surface of the semiconductor substrate and where the cell connection portions of the lead-out electrodes are connected to the poles at one side of the diode cells via contact holes formed in the insulating film and the external connection portion is disposed on the insulating film in a region outside the contact holes. With this arrangement, the insulating film is formed on the semiconductor substrate and the cell connection portions of the lead-out electrodes are connected to the diode cells via the contact holes formed in the insulating film. The external connection portion of the first electrode is disposed on the insulating film in the region outside the contact holes. Application of a large impact to the diode junction regions can thus be avoided during mounting of the chip diode on the mounting substrate or during connection of a bonding wire to the external connection portion. Destruction of the diode junction regions can thereby be avoided, and a chip diode that is excellent in durability against external forces can be realized.

B10. The chip diode according to any one of "B1." to "B9.," further including a protective film formed on the principal surface of the semiconductor substrate so as to cover the lead-out electrodes while exposing the first electrode and the second electrode. With this arrangement, the protective film that covers the lead-out electrodes while exposing the first electrode and the second electrode is formed so that entry of moisture to the lead-out electrodes and the diode junction regions can be suppressed or prevented. In addition, the durability against external forces can be improved by the protective film.

B11. The chip diode according to any one of "B1." to "B10.," where the lead-out electrodes are formed on one of the principal surfaces of the semiconductor substrate, and the one principal surface of the semiconductor substrate has a rectangular shape with rounded corner portions. With this arrangement, the surface of the semiconductor substrate at the side on which the lead-out electrodes are formed has the rectangular shape with rounded corner portions. Fragmenting (chipping) of the corner portions of the chip diode can thereby be suppressed or prevented and a chip diode with few appearance defects can be provided.

B12. The chip diode according to "B11.," where a recess expressing a cathode direction is formed in a middle portion of one side of the rectangular shape. With this arrangement, the recess expressing the cathode direction is formed on one side of the semiconductor substrate of rectangular shape and there is thus no need to form a mark (cathode mark) that expresses the cathode direction by marking, etc., on a surface of the semiconductor substrate (for example, on the top surface of the protective film). A recess such as the above may be formed at the same time as performing the processing for cutting out the chip diode from a wafer (base substrate). Also, the recess can be formed even when the size of the chip diode is minute and marking is difficult. A step for marking can thus be omitted and a sign expressing the cathode direction can be provided even in a chip diode of minute size.

B13. A circuit assembly including a mounting substrate and the chip diode according to any one of "B1." to "B12." that is mounted on the mounting substrate. With this arrangement, a circuit assembly can be provided that uses the chip diode that is compact, high in ESD tolerance, and secured in reliability with respect to large currents.

B14. The circuit assembly according to "B13.," where the chip diode is connected to the mounting substrate by wireless bonding (face-down bonding or flip-chip bonding).

With this arrangement, the space occupied by the chip diode on the mounting substrate can be made small to enable a contribution to be made to high-density packaging of electronic parts.

B15. An electronic equipment including the circuit assembly according to "B13." or "B14." and a casing housing the circuit assembly. With this arrangement, an electronic equipment can be provided with which the circuit assembly that uses the chip diode that is compact, high in ESD tolerance, and secured in reliability with respect to large currents is housed in the casing. An electronic equipment of high reliability can thus be provided.

The diode junction regions of the plurality of diode cells may be formed to be equal in size. With this arrangement, the plurality of diode cells have substantially equal characteristics and the chip diode thus has satisfactory characteristics as a whole and can be made to have a sufficient ESD tolerance even when downsized. Each diode junction region may be a polygonal region. With this arrangement, each diode cell has a diode junction region of long peripheral length, the peripheral length of the entirety can thus be made long, and the ESD tolerance can thus be improved.

The plurality of diode cells may be formed to be equal in size (more specifically, the p-n junction regions of the plurality of diode cells may be formed to be equal in size). With this arrangement, the plurality of diode cells have substantially equal characteristics and the chip diode thus has satisfactory characteristics as a whole and can be made to have a sufficient ESD tolerance even when downsized. Preferably, not less than four of the diode cells are provided. With this arrangement, by not less than four of the diode cells being provided, the peripheral length of the diode junction regions can be made long and the ESD tolerance can be improved efficiently.

Preferred embodiments of the third invention shall now be described in detail with reference to the attached drawings.

Figure 21:
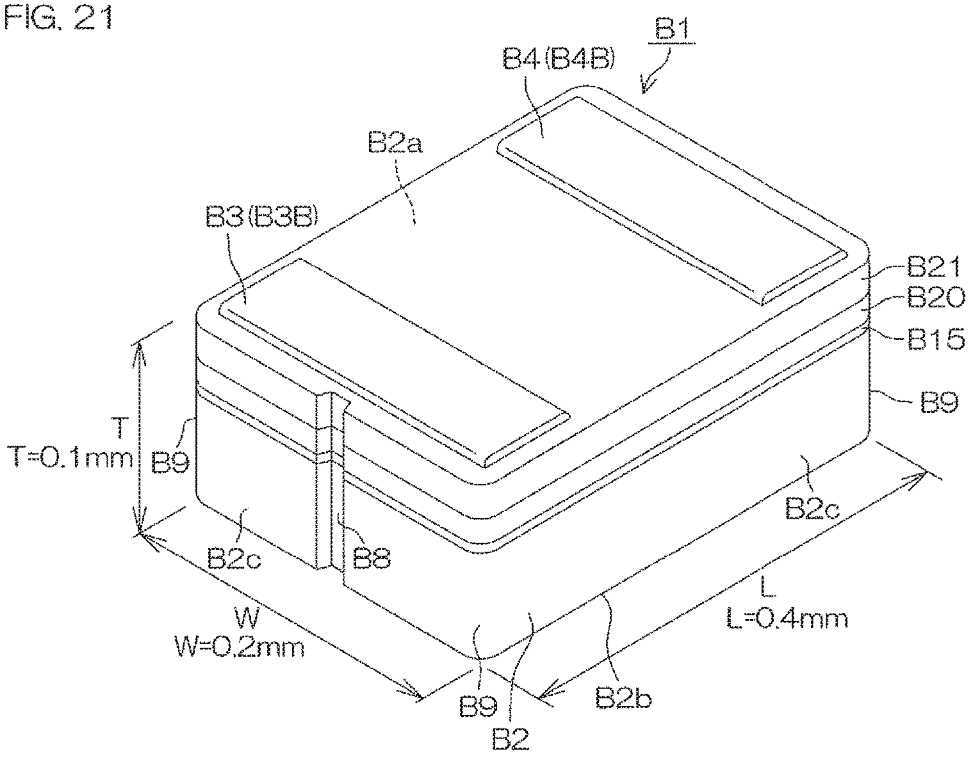
FIG. 21 is a perspective view of a chip diode according to a preferred embodiment of a third invention.
Figure 22:
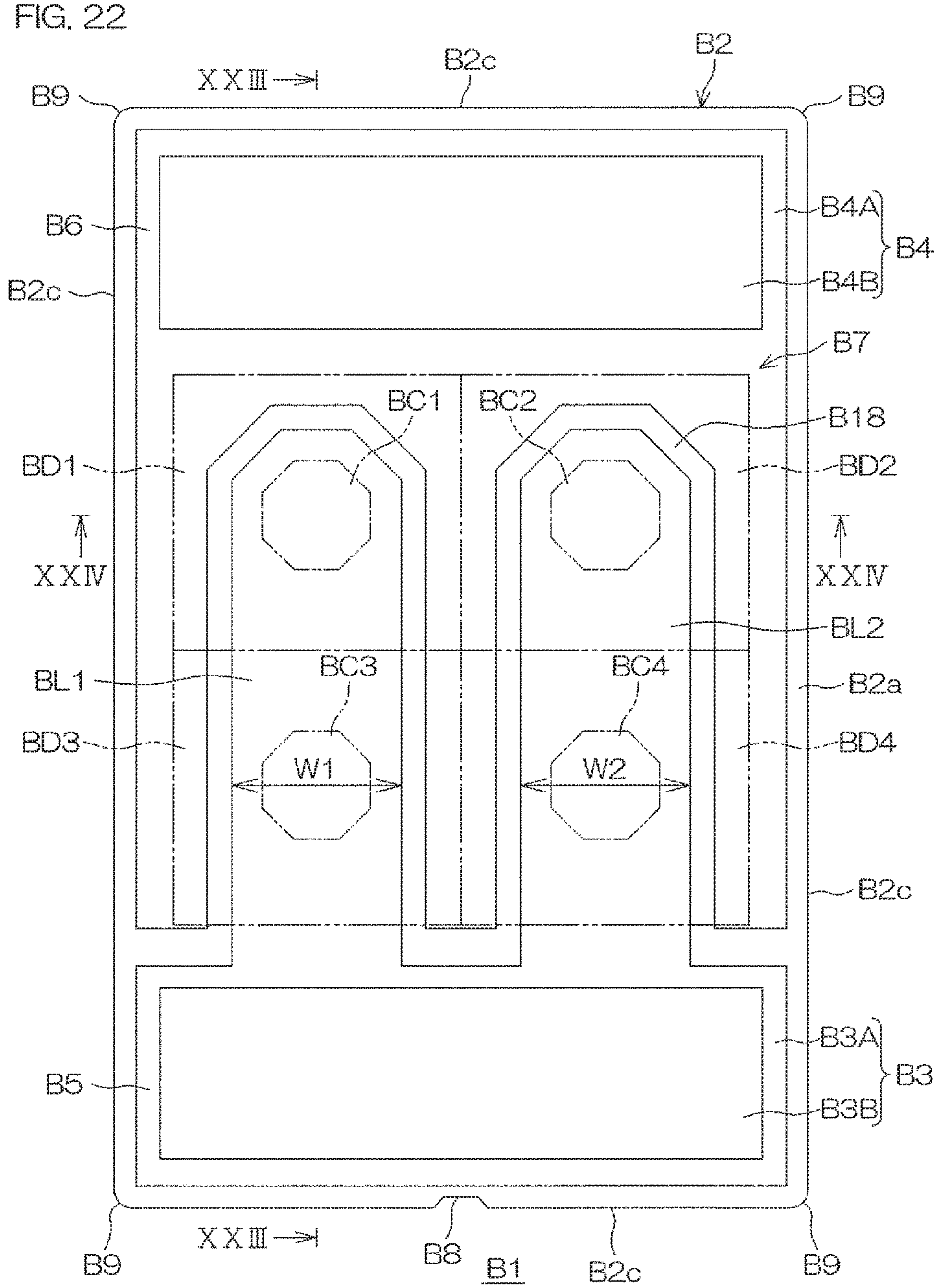
FIG. 22 is a plan view of the chip diode according to the first preferred embodiment of the third invention.
Figure 23:
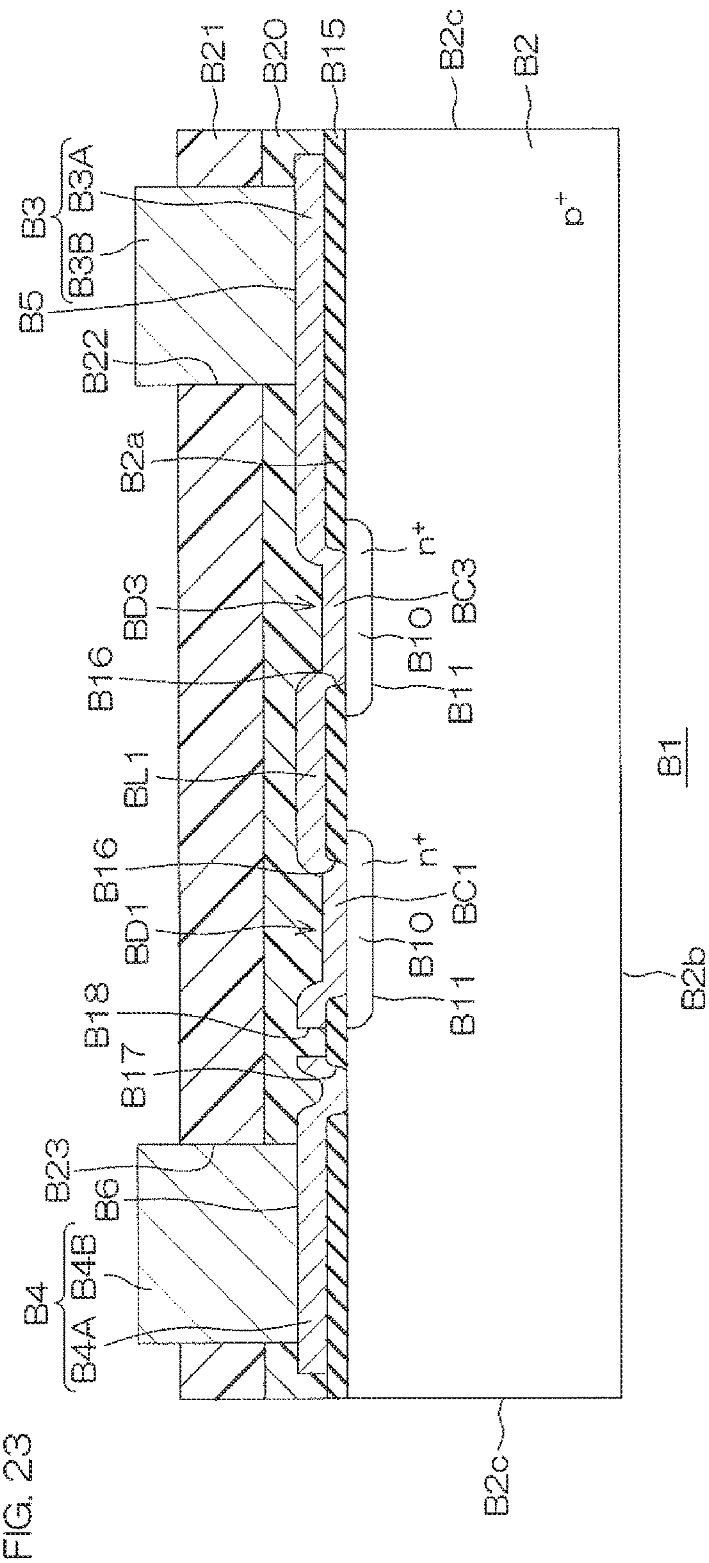
FIG. 23 is a sectional view taken along line XXIII-XXIII in FIG. 22.
Figure 24:
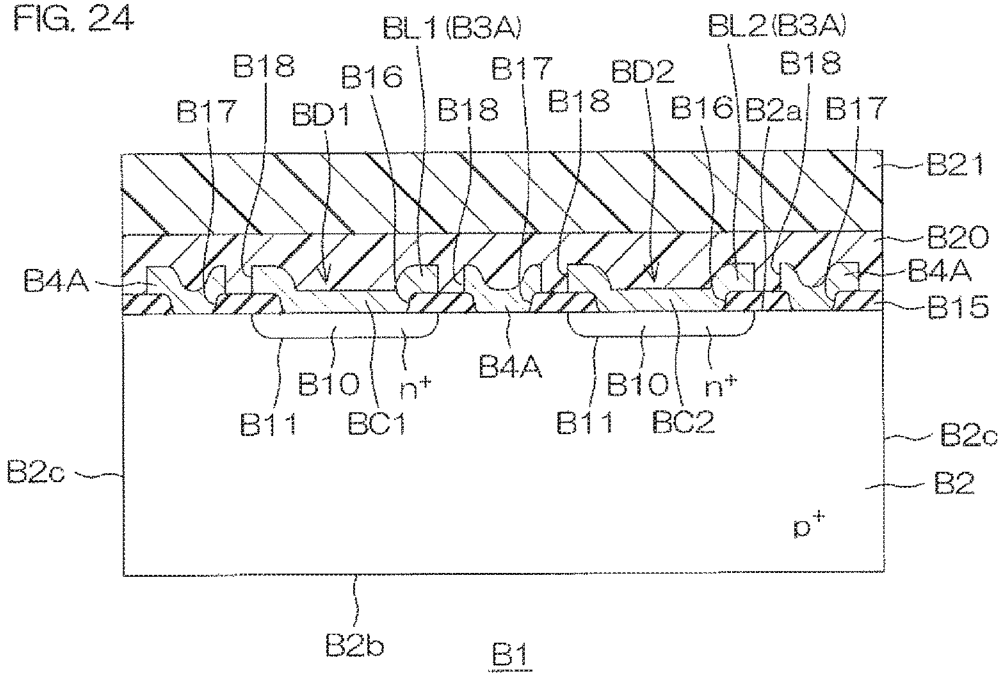
FIG. 24 is a sectional view taken along line XXIV-XXIV in FIG. 22.

FIG. 21 is a perspective view of a chip diode according to a first preferred embodiment of the third invention, FIG. 22 is a plan view thereof, and FIG. 23 is a sectional view taken along line XXIII-XXIII in FIG. 22. Further, FIG. 24 is a sectional view taken along line XXIV-XXIV in FIG. 22. The chip diode B1 includes a $p^+$ type semiconductor substrate B2 (for example, a silicon substrate), a plurality of diode cells BD1 to BD4 formed on the semiconductor substrate B2, and a cathode electrode B3 and an anode electrode B4 connecting the plurality of diode cells BD1 to BD4 in parallel. The semiconductor substrate B2 includes a pair of principal surfaces B2*a* and B2*b* and a plurality of side surfaces B2*c* orthogonal to the pair of principal surfaces B2*a* and B2*b*, and one (principal surface B2*a*) of the pair of principal surfaces B2*a* and B2*b* is arranged as an element forming surface. Hereinafter, the principal surface B2*a* shall be referred to as the "element forming surface B2*a*." The element forming surface B2*a* is formed to a rectangular shape in a plan view and, for example, the length L in the long direction may be approximately 0.4 mm and the length W in the short direction may be approximately 0.2 mm. Also, the thickness T of the chip diode B1 as a whole may be approximately 0.1 mm. An external connection electrode B3B of the cathode electrode B3 and an external connection electrode B4B of the anode electrode B4 are disposed at respective end portions of the element forming surface B2*a*. A diode cell region B7 is provided on the element forming surface B2*a* between the external connection electrodes B3B and B4B.

A recess B8 that is cut out so as to extend in the thickness direction of the semiconductor substrate B2 is formed on one side surface B2*c* that is continuous with one short side (in the present preferred embodiment, the short side close to the cathode side external connection electrode B3B) of the element forming surface B2*a*. In the present preferred embodiment, the recess B8 extends across the entirety in the thickness direction of the semiconductor substrate B2. In a plan view, the recess B8 is recessed inward from the one short side of the element forming surface B2*a* and, in the present preferred embodiment, has a trapezoidal shape that becomes narrow toward the inner side of the element forming surface B2*a*. Obviously, this planar shape is an example and the planar shape may instead be a rectangular shape, a triangular shape, or a recessingly curved shape, such as a partially circular shape (for example, an arcuate shape), etc. The recess B8 indicates the orientation (chip direction) of the chip diode B1. More specifically, the recess B8 provides a cathode mark that indicates the position of the cathode side external connection electrode B3B. A structure is thereby provided with which the polarity of the chip diode B1 can be ascertained from its outer appearance during mounting.

The semiconductor substrate B2 has four corner portions B9 at four corners, each corresponding to an intersection portion of a pair of mutually adjacent side surfaces among the four side surfaces B2*c*. In the present preferred embodiment, the four corner portions B9 are shaped to round shapes. Each corner portion B9 has a smooth curved surface that is outwardly convex in a plan view as viewed in a direction of a normal to the element forming surface B2*a*. A structure capable of suppressing chipping during the manufacturing process or mounting of the chip diode B1 is thereby arranged.

Figure 25:
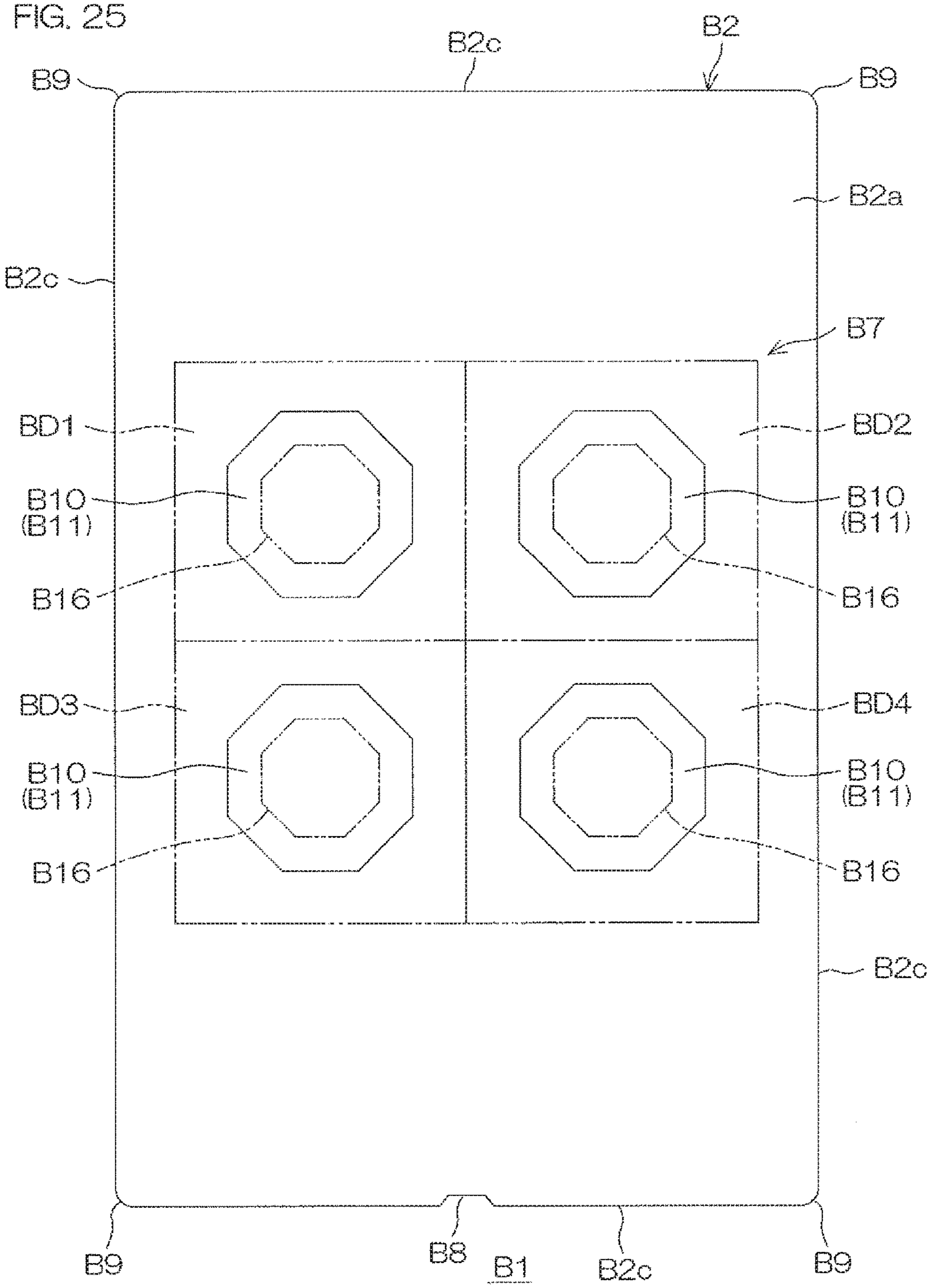
FIG. 25 is a plan view of the chip diode according to the first preferred embodiment of the third invention with a cathode electrode, an anode electrode, and the arrangement formed thereon being removed to show the structure of a top surface of a semiconductor substrate.

In the present preferred embodiment, the diode cell region B7 is formed to a rectangular shape. The plurality of diode cells BD1 to BD4 are disposed inside the diode cell region B7. In regard to the plurality of diode cells BD1 to BD4, four are provided in the present preferred embodiment and these are arrayed two-dimensionally at equal intervals in a matrix along the long direction and short direction of the semiconductor substrate B2. FIG. 25 is a plan view showing the structure of the top surface (element forming surface B2*a*) of the semiconductor substrate B2 with the cathode electrode B3, the anode electrode B4, and the arrangement formed thereon being removed. In each of the regions of the diode cells BD1 to BD4, an $n^-$ type region B10 is formed in a top layer region of the $p^+$ type semiconductor substrate B2. The $n^+$ type regions B10 are separated according to each individual diode cell. The diode cells BD1 to BD4 are thereby made to respectively have p-n junction regions B11 that are separated according to each individual diode cell.

In the present preferred embodiment, the plurality of diode cells BD1 to BD4 are formed to be equal in size and equal in shape and are specifically formed to rectangular shapes, and the $n^+$ type region B10 with a polygonal shape is formed in the rectangular region of each diode cell. In the present preferred embodiment, each $n^+$ type region B10 is formed to a regular octagon having four sides extending along the four sides forming the rectangular region of the corresponding diode cell among the diode cells BD1 to BD4 and another four sides respectively facing the four corner portions of the rectangular region of the corresponding diode cell among the diode cells BD1 to BD4.

As shown in FIG. 23 and FIG. 24, an insulating film B15 (omitted from illustration in FIG. 22), constituted of an oxide film, etc., is formed on the element forming surface B2*a* of the semiconductor substrate B2. Contact holes B16 (cathode contact holes) exposing top surfaces of the respective $n^+$ type regions B10 of the diode cells BD1 to BD4 and contact holes B17 (anode contact holes) exposing the element forming surface B2*a* are formed in the insulating film B15. The cathode electrode B3 and the anode electrode B4 are formed on the top surface of the insulating film B15. The cathode electrode B3 includes a cathode electrode film B3A formed on the top surface of the insulating film B15 and the external connection electrode B3B bonded to the cathode electrode film B3A. The cathode electrode film B3A includes a lead-out electrode BL1 connected to the plurality of diode cells BD1 and BD3, a lead-out electrode BL2 connected to the plurality of diodes BD2 and BD4, and a cathode pad B5 formed integral to the lead-out electrodes BL1 and BL2 (cathode lead-out electrodes). The cathode pad B5 is formed to a rectangle at one end portion of the element forming surface B2*a*. The external connection electrode B3B is connected to the cathode pad B5. The external connection electrode B3B is thereby connected in common to the lead-out electrodes BL1 and BL2. The cathode pad B5 and the external connection electrode B3B constitute an external connection portion (cathode external connection portion) of the cathode electrode B3.

The anode electrode B4 includes an anode electrode film B4A formed on the top surface of the insulating film B15 and the external connection electrode B4B bonded to the anode electrode film B4A. The anode electrode film B4A is connected to the $p^+$ type semiconductor substrate B2 and has an anode pad B6 near one end portion of the element forming surface B2*a*. The anode pad B6 is constituted of a region of the anode electrode film B4A that is disposed at the one end portion of the element forming surface B2*a*. The external connection electrode B4B is connected to the anode pad B6. The anode pad B6 and the external connection electrode B4B constitute an external connection portion (anode external connection portion) of the anode electrode B4. The region of the anode electrode film B4A besides the anode pad B6 is an anode lead-out electrode that is led out from the anode contact holes B17.

The lead-out electrode BL1 enters into the contact holes B16 of the diode cells BD1 and BD3 from the top surface of the insulating film B15 and is in ohmic contact with the respective $n^+$ type regions B10 of the diode cells BD1 and BD3 inside the respective contact holes B16. In the lead-out electrode BL1, the portions connected to the diode cells BD1 and BD3 inside the contact holes B16 constitute cell connection portions BC1 and BC3. Similarly, the lead-out electrode BL2 enters into the contact holes B16 of the diode cells BD2 and BD4 from the top surface of the insulating film B15 and is in ohmic contact with the respective $n^+$ type regions B10 of the diode cells BD2 and BD4 inside the respective contact holes B16. In the lead-out electrode BL2, the portions connected to the diode cells BD2 and BD4 inside the contact holes B16 constitute cell connection portions BC2 and BC4. The anode electrode film B4A extends to inner sides of the contact holes B17 from the top surface of the insulating film B15 and is in ohmic contact with the $p^+$ type semiconductor substrate B2 inside the contact holes B17. In the present preferred embodiment, the cathode electrode film B3A and the anode electrode film B4A are made of the same material.

In the present preferred embodiment, AlSi films are used as the electrode films. When an AlSi film is used, the anode electrode film B4A can be put in ohmic contact with the $p^+$ type semiconductor substrate B2 without having to provide a $p^+$ type region on the top surface of the semiconductor substrate B2. That is, an ohmic junction can be formed by putting the anode electrode film B4A in direct contact with the $p^+$ type semiconductor substrate B2. A process for forming the $p^+$ type region can thus be omitted.

The cathode electrode film B3A and the anode electrode film B4A are separated by a slit B18. The lead-out electrode BL1 is formed rectilinearly along a straight line passing from the diode cell BD1 to the cathode pad B5 through the diode cell BD3. Similarly, the lead-out electrode BL2 is formed rectilinearly along a straight line passing from the diode cell BD2 to the cathode pad B5 through the diode cell BD4. The lead-out electrodes BL1 and BL2 respectively have uniform widths W1 and W2 at all locations between the $n^+$ type regions B10 and the cathode pad B5, and the widths W1 and W2 are wider than the widths of the cell connection portions BC1, BC2, BC3, and BC4. The widths of the cell connection portions BC1 to BC4 are defined by the lengths in the direction orthogonal to the lead-out directions of the lead-out electrodes BL1 and BL2. Tip end portions of the lead-out electrodes BL1 and BL2 are shaped to match the planar shapes of the $n^+$ type regions B10. Base end portions of the lead-out electrodes BL1 and BL2 are connected to the cathode pad B5. The slit B18 is formed so as to border the lead-out electrodes BL1 and BL2. On the other hand, the anode electrode film B4A is formed on the top surface of the insulating film B15 so as to surround the cathode electrode film B3A across an interval corresponding to the slit B18 of substantially fixed width. The anode electrode film B4A integrally includes a comb-teeth-like portion extending in the longitudinal direction of the element forming surface B2*a* and the anode pad B6 that is constituted of a rectangular region.

The cathode electrode film B3A and the anode electrode film B4A are covered by a passivation film B20 (omitted from illustration in FIG. 22), constituted, for example, of a nitride film, and a resin film B21, made of polyimide, etc., is further formed on the passivation film B20. A pad opening B22 exposing the cathode pad B5 and a pad opening B23 exposing the anode pad B6 are formed so as to penetrate through the passivation film B20 and the resin film B21. The external connection electrodes B3B and B4B are respectively embedded in the pad openings B22 and B23. The passivation film B20 and the resin film B21 constitute a protective film to suppress or prevent the entry of moisture to the lead-out electrodes BL1 and BL2 and the p-n junction regions B11 and also absorb impacts, etc., from the exterior, thereby contributing to improvement of the durability of the chip diode B1.

The external connection electrodes B3B and B4B may have top surfaces at positions lower than the top surface of the resin film B21 (positions close to the semiconductor substrate B2) or may project from the top surface of the resin film B21 and have top surfaces at positions higher than the resin film B21 (positions far from the semiconductor substrate B2). An example where the external connection electrodes B3B and B4B project from the top surface of the resin film B21 is shown in FIG. 23. Each of the external connection electrodes B3B and B4B may be constituted, for example, of an Ni/Pd/Au laminated film having an Ni film in contact with the electrode film B3A or B4A, a Pd film formed on the Ni film, and an Au film formed on the Pd film. Such a laminated film may be formed by a plating method.

In each of the diode cells BD1 to BD4, the p-n junction region B11 is formed between the p-type semiconductor substrate B2 and the $n^+$ type region B10, and a p-n junction diode is thus formed respectively. The $n^+$ type regions B10 of the plurality of diode cells BD1 to BD4 are connected in common to the cathode electrode B3, and the $p^+$ type semiconductor substrate B2, which is the p-type region in common to the diode cells BD1 to BD4, is connected in common to the anode electrode B4. The plurality of diode cells BD1 to BD4, formed on the semiconductor substrate B2, are thereby connected in parallel all together.

Figure 26:
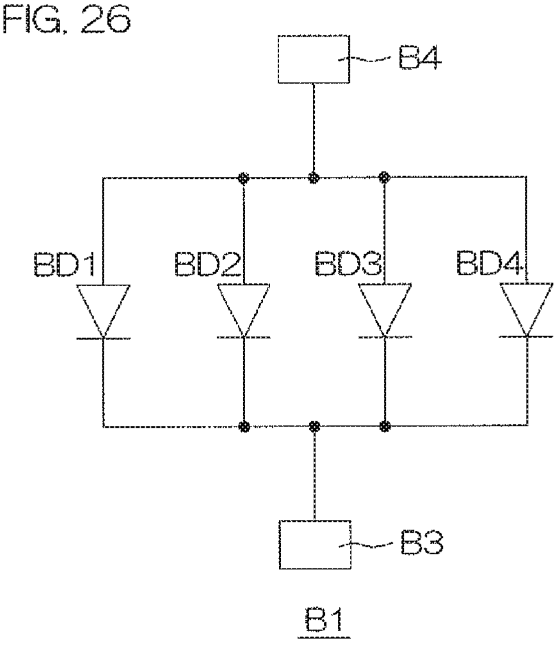
FIG. 26 is an electric circuit diagram showing the electrical structure of the interior of the chip diode according to the first preferred embodiment of the third invention.

FIG. 26 is an electric circuit diagram showing the electrical structure of the interior of the chip diode B1. With the p-n junction diodes respectively constituted by the diode cells BD1 to BD4, the cathode sides are connected in common by the cathode electrode B3, the anode sides are connected in common by the anode electrode B4, and all of the diodes are thereby connected in parallel and made to function as a single diode as a whole.

With the arrangement of the present preferred embodiment, the chip diode B1 has the plurality of diode cells BD1 to BD4 and each of the diode cells BD1 to BD4 has the p-n junction region B11. The p-n junction regions B11 are separated according to each of the diode cells BD1 to BD4. The chip diode B1 is thus made long in the peripheral length of the p-n junction regions B11, that is, the total peripheral length (total extension) of the $n^+$ type regions B10 in the semiconductor substrate B2. The electric field can thereby be dispersed and prevented from concentrating at vicinities of the p-n junction regions B11, and the ESD tolerance can thus be improved. That is, even when the chip diode B1 is to be formed compactly, the total peripheral length of the p-n junction regions B11 can be made large, thereby enabling both downsizing of the chip diode B1 and securing of the ESD tolerance to be achieved at the same time.

Figure 27:
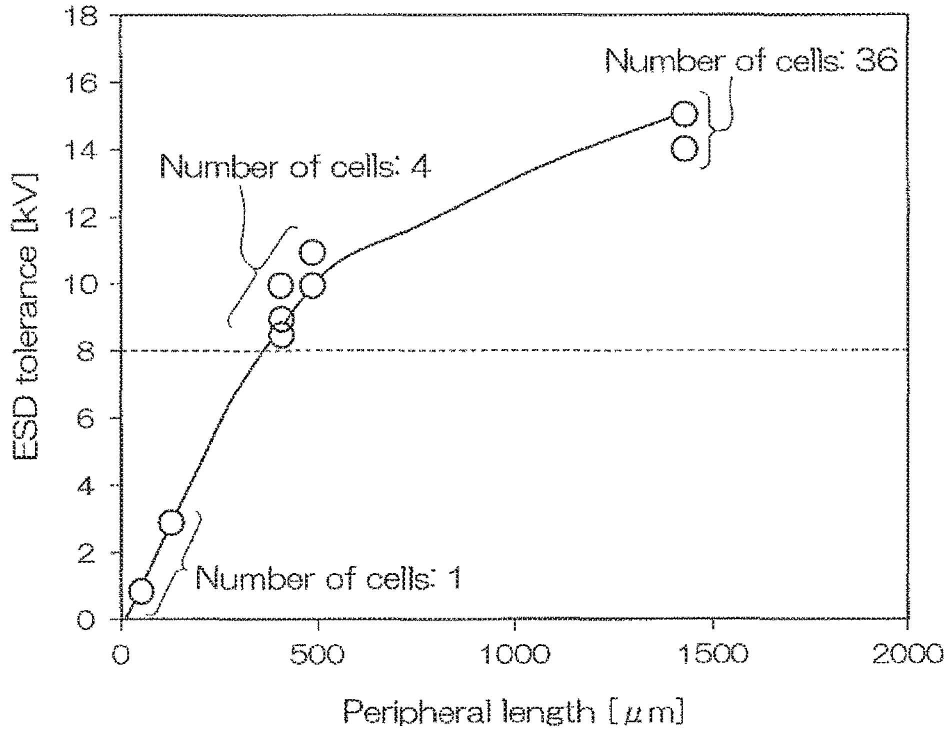
FIG. 27 shows experimental results of measuring the ESD tolerances of a plurality of samples that are differed in total peripheral length (total extension) of p-n junction regions by variously setting the sizes of diode cells and/or the number of the diode cells formed on a semiconductor substrate of the same area.

FIG. 27 shows experimental results of measuring the ESD tolerances of a plurality of samples that are differed in the total peripheral length (total extension) of the p-n junction regions by variously setting the sizes of diode cells and/or the number of the diode cells formed on a semiconductor substrate of the same area. From these experimental results, it can be understood that the longer the peripheral length of the p-n junction regions, the greater the ESD tolerance. In cases where not less than four diode cells are formed on the semiconductor substrate, ESD tolerances in the excess of 8 kilovolts could be realized.

Further with the present preferred embodiment, the widths W1 and W2 of the lead-out electrodes BL1 and BL2 are wider than the widths of the cell connection portions BC1 to BC4 at all locations between the cell connection portions BC1 to BC4 and the cathode pad B5. A large allowable current amount can thus be set and electromigration can be reduced to improve reliability with respect to a large current. That is, a chip diode that is compact, high in ESD tolerance, and secured in reliability with respect to large currents can be provided.

Also with the present preferred embodiment, the plurality of diode cells BD1 and BD3 and the plurality of diode cells BD2 and BD4, which are respectively aligned along straight lines directed toward the cathode pad B5, are connected to the cathode pad B5 by the rectilinear lead-out electrodes BL1 and BL2 in common. The lengths of the lead-out electrodes from the diode cells BD1 to BD4 to the cathode pad B5 can thereby be minimized and electromigration can thus be reduced more effectively. Also, a single lead-out electrode BL1 or BL2 can be shared by the plurality of diode cells BD1 and BD3 or the plurality of diode cells BD2 and BD4, and therefore lead-out electrodes of wide line widths can be laid out on the semiconductor substrate B2 while forming a large number of diode cells BD1 to BD4 to increase the peripheral length of the diode junction regions (p-n junction regions B11). Both further improvement of ESD tolerance and reduction of electromigration can thereby be achieved at the same time to further improve the reliability.

Figure 28:
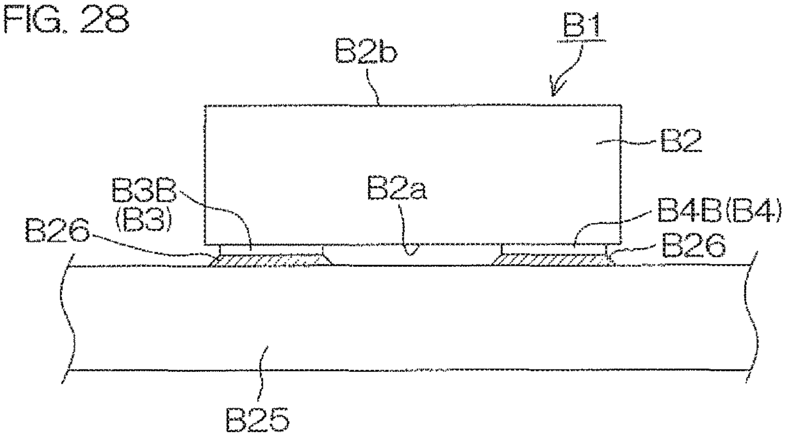
FIG. 28 is a sectional view of the arrangement of a circuit assembly with which the chip diode according to the first preferred embodiment of the third invention is flip-chip connected onto a mounting substrate.

Also, the end portions of the lead-out electrodes BL1 and BL2 have partially polygonal shapes matching the shapes (polygons) of the $n^+$ type regions B10 and can thus be connected to the $n^+$ type regions B10 while making small the areas occupied by the lead-out electrodes BL1 and BL2. Further, both the cathode side and anode side external connection electrodes B3B and B4B are formed on the element forming surface B2*a*, which is one of the surfaces of the semiconductor substrate B2. Therefore as shown in FIG. 28, a circuit assembly having the chip diode B1 surface-mounted on a mounting substrate B25 can be arranged by making the element forming surface B2*a* face the mounting substrate B25 and bonding the external connection electrodes B3B and B4B onto the mounting substrate B25 by solders B26. That is, the chip diode B1 of the flip-chip connection type can be provided, and by performing face-down bonding with the element forming surface B2*a* being made to face the mounting surface of the mounting substrate B25, the chip diode B1 can be connected to the mounting substrate B25 by wireless bonding. The area occupied by the chip diode B1 on the mounting substrate B25 can thereby be made small. In particular, reduction of height of the chip diode B1 on the mounting substrate B25 can be realized. Effective use can thereby be made of the space inside a casing of a compact electronic equipment, etc., to contribute to high-density packaging and downsizing.

Also with the present preferred embodiment, the insulating film B15 is formed on the semiconductor substrate B2 and the cell connection portions BC1 to BC4 of the lead-out electrodes BL1 and BL2 are connected to the diode cells BD1 to BD4 via the contact holes B16 formed in the insulating film B15. The cathode pad B5 is disposed on the insulating film B15 in the region outside the contact holes B16. That is, the cathode pad B5 is provided at a position separated from positions directly above the p-n junction regions B11. Also, the anode electrode film B4A is connected to the semiconductor substrate B2 via the contact holes B17 formed in the insulating film B15, and the anode pad B6 is disposed on the insulating film B15 in the region outside the contact holes B17. The anode pad B6 is also disposed at a position separated from positions directly above the p-n junction regions B11. Application of a large impact to the p-n junction regions B11 can thus be avoided during mounting of the chip diode B1 on the mounting substrate B25. Destruction of the p-n junction regions B11 can thereby be avoided and a chip diode that is excellent in durability against external forces can thereby be provided. An arrangement is also possible where the external connection electrodes B3B and B4B are not provided, the cathode pad B5 and the anode pad B6 are respectively used as the cathode external connection portion and the anode connection portion, and bonding wires are connected to the cathode pad B5 and the anode pad B6. Destruction of the p-n junction regions B11 due to impacts during wire bonding can be avoided in this case as well.

Also with the present preferred embodiment, the anode electrode film B4A is constituted of an AlSi film. An AlSi film is close in work function to a p-type semiconductor (especially a p-type silicon semiconductor) and can thus form a satisfactory ohmic junction with the $p^+$ type semiconductor substrate B2. There is thus no need to form a high impurity concentration diffusion layer for ohmic junction on the p-type$^+$ semiconductor substrate B2. The manufacturing process can thereby be simplified further and the productivity and the production cost can be reduced accordingly.

Further with the present preferred embodiment, the semiconductor substrate B2 has the rectangular shape with the corner portions B9 being rounded. Fragmenting (chipping) of the corner portions of the chip diode B1 can thereby be suppressed or prevented and the chip diode B1 with few appearance defects can be provided. Further with the present preferred embodiment, the recess B8 expressing the cathode direction is formed on the short side of the semiconductor substrate B2 close to the cathode side external connection electrode B3B and there is thus no need to mark a cathode mark on a rear surface (the principal surface at the side opposite to the element forming surface B2*a*) of the semiconductor substrate B2. The recess B8 may be formed at the same time as performing the processing for cutting out the chip diode B1 from a wafer (base substrate). Also, the recess B8 can be formed to indicate the direction of the cathode even when the size of the chip diode B1 is minute and marking is difficult. A step for marking can thus be omitted and a sign expressing the cathode direction can be provided even in the chip diode B1 of minute size.

Figure 29:
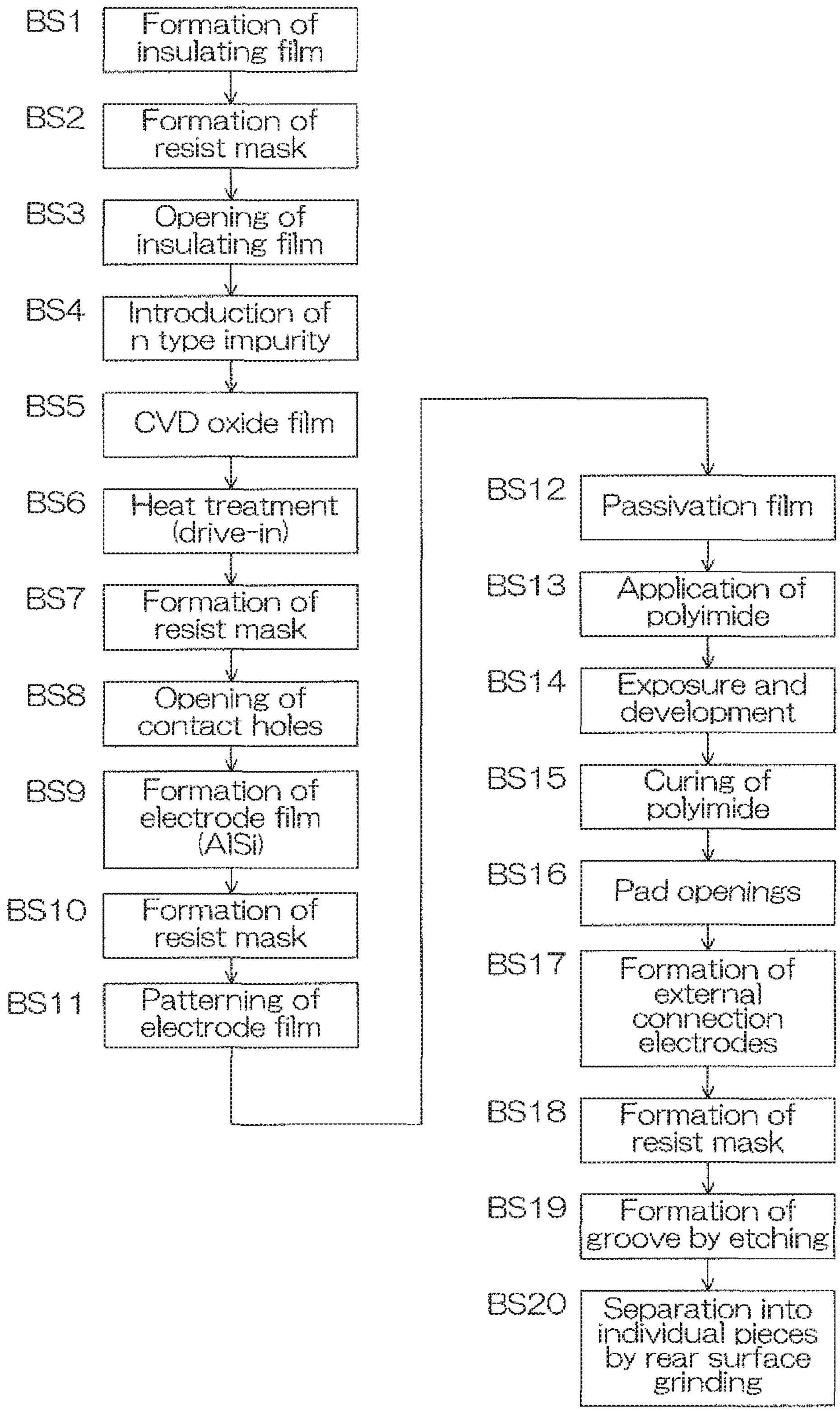
FIG. 29 is a process diagram for describing an example of a manufacturing process of the chip diode according to the first preferred embodiment of the third invention.
Figure 30A:
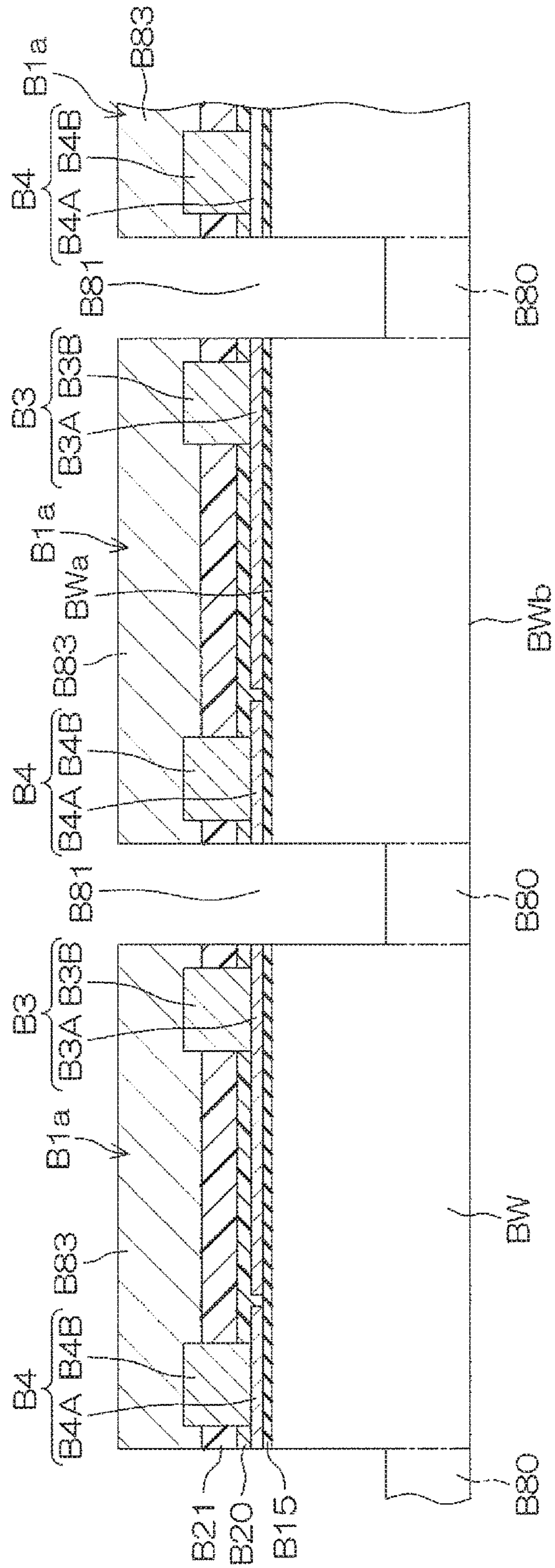
FIG. 30A is a sectional view of the arrangement of the chip diode according to the first preferred embodiment of the third invention in the middle of the manufacturing process.
Figure 30B:
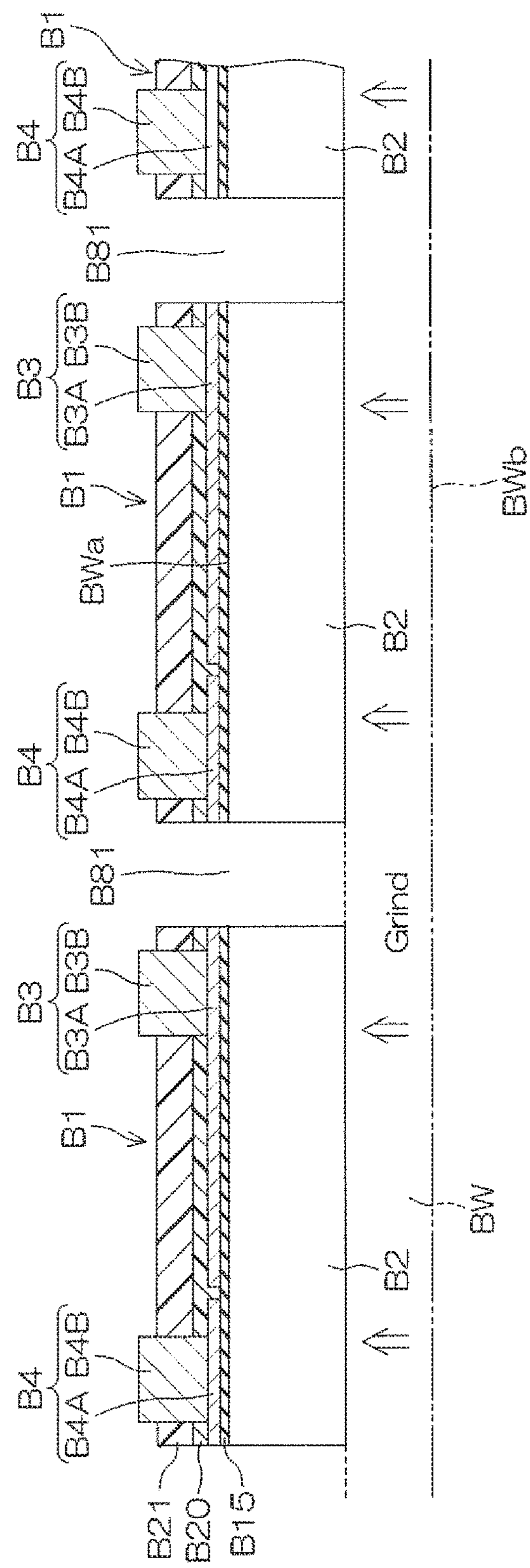
FIG. 30B is a sectional view of the arrangement in a step following that shown in FIG. 30A.
Figure 31:
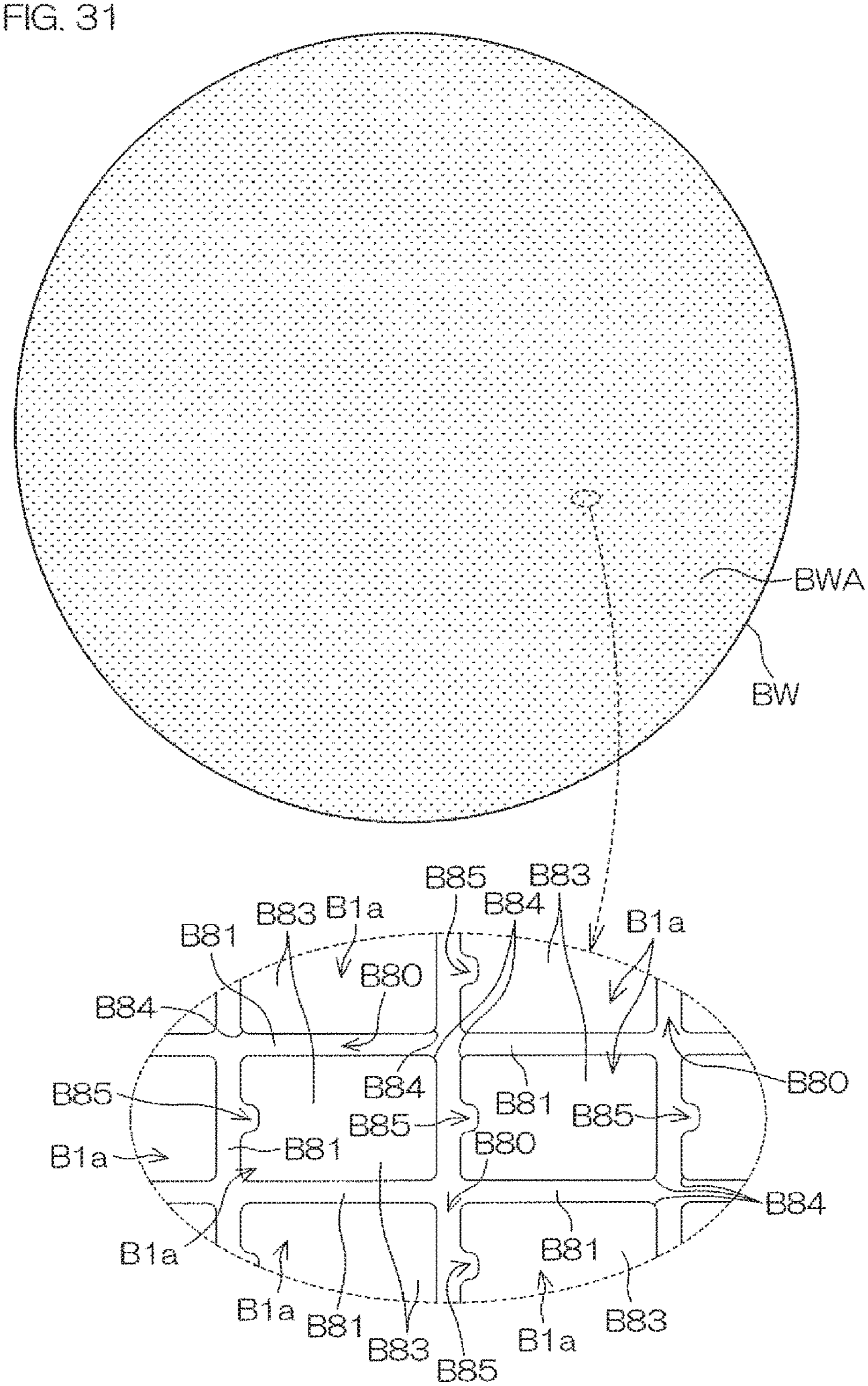
FIG. 31 is a plan view of a semiconductor wafer as a base substrate of the semiconductor substrate of the chip diode and shows a partial region in a magnified manner.

FIG. 29 is a process diagram for describing an example of a manufacturing process of the chip diode B1. Also, FIG. 30A and FIG. 30B are sectional views of the arrangement in the middle of the manufacturing process of FIG. 29 and show a section corresponding to FIG. 23. FIG. 31 is a plan view of a $p^+$ type semiconductor wafer BW as a base substrate of the semiconductor substrate B2 and shows a partial region in a magnified manner.

First, the $p^+$ type semiconductor wafer BW is prepared as the base substrate of the semiconductor substrate B2. A top surface of the semiconductor wafer BW is an element forming surface BWa and corresponds to the element forming surface B2*a* of the semiconductor substrate B2. A plurality of chip diode regions B1*a*, corresponding to a plurality of the chip diodes B1, are arrayed and set in a matrix on the element forming surface BWa. A boundary region B80 is provided between adjacent chip diode regions B1*a*. The boundary region B80 is a band-like region having a substantially fixed width and extends in two orthogonal directions to form a lattice. After performing necessary steps on the semiconductor wafer BW, the semiconductor wafer BW is cut apart along the boundary region B80 to obtain the plurality of chip diodes B1.

The steps executed on the semiconductor wafer BW are, for example, as follows. First, the insulating film B15 (with a thickness, for example, of 8000 Å to 8600 Å), which is a thermal oxide film or CVD oxide film, etc., is formed on the element forming surface BWa of the $p^+$ type semiconductor wafer BW (BS1) and a resist mask is formed on the insulating film B15 (BS2). Openings corresponding to the $n^+$ type regions B10 are then formed in the insulating film B15 by etching using the resist mask (BS3). Further, after peeling off the resist mask, an n-type impurity is introduced to top layer portions of the semiconductor wafer BW that are exposed from the openings formed in the insulating film B15 (BS4). The introduction of the n-type impurity may be performed by a step of depositing phosphorus as the n-type impurity on the top surface (so-called phosphorus deposition) or by implantation of n-type impurity ions (for example, phosphorus ions). Phosphorus deposition is a process of depositing phosphorus on the top surface of the semiconductor wafer BW exposed inside the openings in the insulating film B15 by conveying the semiconductor wafer BW into a diffusion furnace and performing heat treatment while making $POCl_3$ gas flow inside a diffusion passage. After thickening the insulating film B15 (thickening, for example, by approximately 1200 Å by CVD oxide film formation) as necessary (BS5), heat treatment (drive-in) for activation of the impurity ions introduced into the semiconductor wafer BW is performed (BS6). The $n^+$ type regions B10 are thereby formed on the top layer portion of the semiconductor wafer BW.

Thereafter, another resist mask having openings matching the contact holes B16 and B17 is formed on the insulating film B15 (BS7). The contact holes B16 and B17 are formed in the insulating film B15 by etching via the resist mask (BS8), and the resist mask is peeled off thereafter. An electrode film that constitutes the cathode electrode B3 and the anode electrode B4 is then formed on the insulating film B15, for example, by sputtering (BS9). In the present preferred embodiment, an electrode film (for example, of 10000 Å thickness), made of AlSi, is formed. Another resist mask having an opening pattern corresponding to the slit B18 is then formed on the electrode film (BS10) and the slit B18 is formed in the electrode film by etching (for example, reactive ion etching) via the resist mask (BS11). The width of the slit B18 may be approximately 3 μm. The electrode film is thereby separated into the cathode electrode film B3A and the anode electrode film B4A.

Then after peeling off the resist film, the passivation film B20, which is a nitride film, etc., is formed, for example, by the CVD method (BS12), and further, polyimide, etc., is applied to form the resin film B21 (BS13). For example, a polyimide imparted with photosensitivity is applied, and after exposing in a pattern corresponding to the pad openings B22 and B23, the polyimide film is developed (step BS14). The resin film B21 having openings corresponding to the pad openings B22 and B23 is thereby formed. Thereafter, heat treatment for curing the resin film is performed as necessary (BS15). The pad openings B22 and B23 are then formed in the passivation film B20 by performing dry etching (for example, reactive ion etching) using the resin film B21 as a mask (BS16). Thereafter, the external connection electrodes B3B and B4B are formed inside the pad openings B22 and B23 (BS17). The external connection electrodes B3B and B4B may be formed by plating (preferably, electroless plating).

Thereafter, a resist mask B83 (see FIG. 30A), having a lattice-shaped opening matching the boundary region B80 (see FIG. 31) is formed (BS18). Plasma etching is performed via the resist mask B83 and the semiconductor wafer BW is thereby etched to a predetermined depth from the element forming surface BWa as shown in FIG. 30A. A groove B81 for cutting is thereby formed along the boundary region B80 (BS19). After peeling off the resist mask B83, the semiconductor wafer BW is ground from the rear surface BWb until a bottom portion of the groove B81 is reached as shown in FIG. 30B (BS20). The plurality of chip diode regions B1*a* are thereby separated into individual pieces and the chip diodes B1 with the structure described above can thereby be obtained.

As shown in FIG. 31, the resist mask B83 arranged to form the groove B81 at the boundary region B80 has, at positions adjacent to the four corners of each chip diode regions B1*a*, round shaped portions B84 of curved shapes that are convex toward outer sides of the chip diode regions B1*a*. Each round shaped portion B84 is formed to connect two adjacent sides of a chip diode region B1*a* by a smooth curve. Further, the resist mask B83 arranged to form the groove B81 in the boundary region B80 has, at a position adjacent to one short side of each chip diode regions B1*a*, a recess B85 that is recessed toward an inner side of the chip diode regions B1*a*. Therefore, when the groove B81 is formed by plasma etching using the resist mask B83 as a mask, the groove B81 is to made to have, at positions adjacent to the four corners of each chip diode regions B1*a*, round shaped portions of curved shapes that are convex toward the outer sides of the chip diode regions B1*a* and to have, at a position adjacent to one side of the each chip diode regions B1*a*, a recess that is recessed toward the inner side of the chip diode regions B1*a*. Therefore in the step of forming the groove B81 for cutting out the chip diode regions B1*a* from the semiconductor wafer BW, the corner portions B9 of the four corners can be shaped to round shapes and the recess B8 can be formed as the cathode mark in one short side (the short side at the cathode side) in each chip diode B1 at the same time. That is, the corner portions B9 can be processed to round shapes and the recess B8 can be formed as the cathode mark without adding a dedicated step.

With the present preferred embodiment, the semiconductor substrate B2 is constituted of the p-type semiconductor and therefore stable characteristics can be realized even if an epitaxial layer is not formed on the semiconductor substrate B2. That is, an n-type semiconductor wafer is large in in-plane variation of resistivity, and therefore when an n-type semiconductor wafer is used, an epitaxial layer with low in-plane variation of resistivity must be formed on the top surface and an impurity diffusion layer must be formed on the epitaxial layer to form the p-n junction. This is because an n-type impurity is low in segregation coefficient and therefore when an ingot (for example, a silicon ingot) that is to be the source of a semiconductor wafer is formed, a large difference in resistivity arises between a central portion and a peripheral edge portion of the wafer. On the other hand, a p-type impurity is comparatively high in segregation coefficient and therefore a p-type semiconductor wafer is low in in-plane variation of resistivity. Therefore by using a p-type semiconductor wafer, a diode with stable characteristics can be cut out from any location of the wafer without having to form an epitaxial layer. Therefore by using the $p^+$ type semiconductor substrate 2, the manufacturing process can be simplified and the manufacturing cost can be reduced.

Figure 32A:
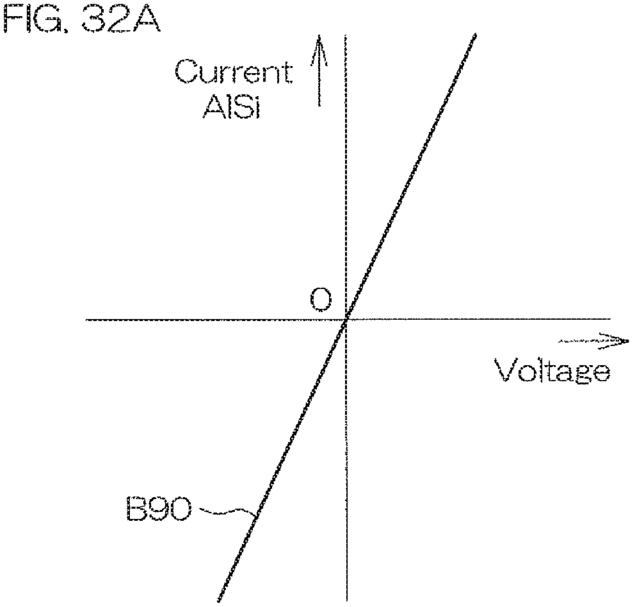
FIG. 32A and FIG. 32B are diagrams for describing the ohmic contact of an AlSi electrode film and a $p^+$ type semiconductor substrate.
Figure 32B:
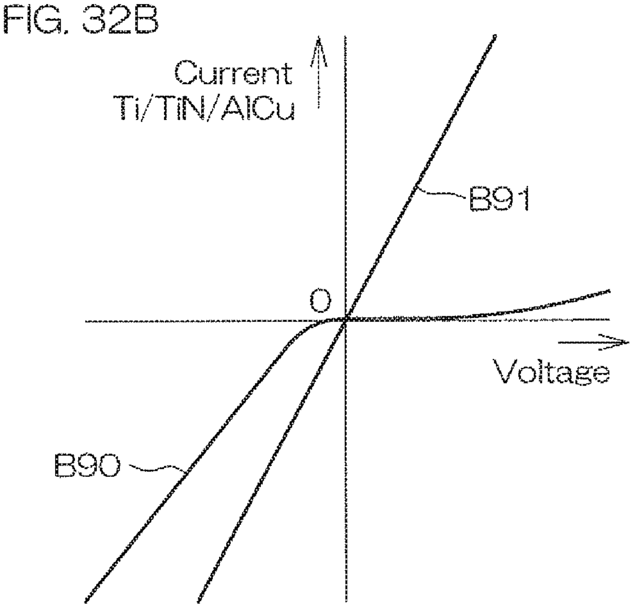

FIG. 32A and FIG. 32B are diagrams for describing the ohmic contact of an AlSi electrode film and a $p^+$ type semiconductor substrate. FIG. 32A shows current vs. voltage characteristics between a $p^+$ type silicon substrate and an AlSi film when the AlSi film is formed on the $p^+$ type silicon substrate. The current is proportional to the applied voltage and it can thus be understood that a satisfactory ohmic contact is formed. For comparison, a curve B90 in FIG. 32B shows the same characteristics in a case where the electrode film formed on the $p^+$ type silicon substrate is arranged as a laminated film in which a Ti film, a TiN film, and an AlCu film are laminated successively from the substrate top surface. The current vs. voltage characteristics are not linear characteristics and it can thus be understood that an ohmic contact is not obtained. On the other hand, a curve B91 shows the current vs. voltage characteristics in a case where a high concentration region is formed by introducing a p-type impurity to a higher concentration in the top surface of a $p^+$ type silicon substrate and an electrode film, constituted of a laminated film formed by laminating a Ti film, a TiN film, and an AlCu film successively on the substrate top surface, is put in contact with the high concentration region. In this case, the current vs. voltage characteristics are linear characteristics and it can thus be understood that a satisfactory ohmic contact is obtained. From the above, it can be understood that by using an AlSi film as the electrode film, a cathode electrode film and an anode electrode film that are in ohmic contact with the $p^+$ type semiconductor substrate can be formed without having to form a high concentration region in the $p^+$ type semiconductor substrate and the manufacturing process can thereby be simplified.

Figure 33:
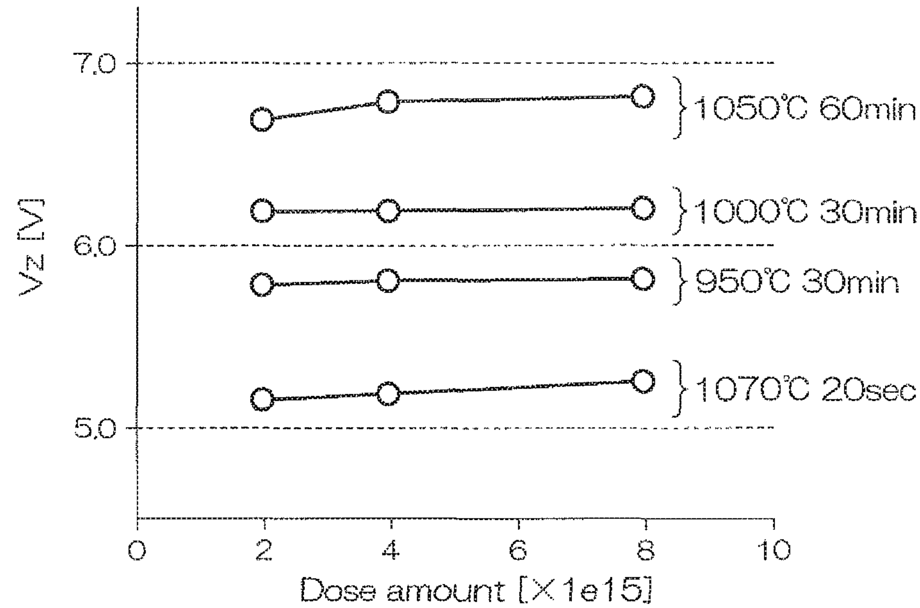
FIG. 33 is a diagram for describing a feature related to adjustment of a Zener voltage (Vz) of the chip diode.

FIG. 33 is a diagram for describing a feature related to adjustment of a Zener voltage (Vz) of the chip diode B1. That is, the features concerning Zener voltage adjustment in a case where the chip diode B1 is arranged as a Zener diode are shown. To describe more specifically, after introducing an n-type impurity (for example, phosphorus) in the top layer portion of the semiconductor substrate B2 to form the $n^+$ type regions B10, the heat treatment (drive-in) for activating the introduced impurity is performed. The Zener voltage changes in accordance with the temperature and duration of the heat treatment. Specifically, the Zener voltage tends to increase with increase in the amount of heat applied to the semiconductor substrate B2 during the heat treatment. The Zener voltage can be adjusted using this tendency. As can be understood from FIG. 33, the Zener voltage is more strongly dependent on the heat amount during the heat treatment than the impurity dose amount.

Figure 34:
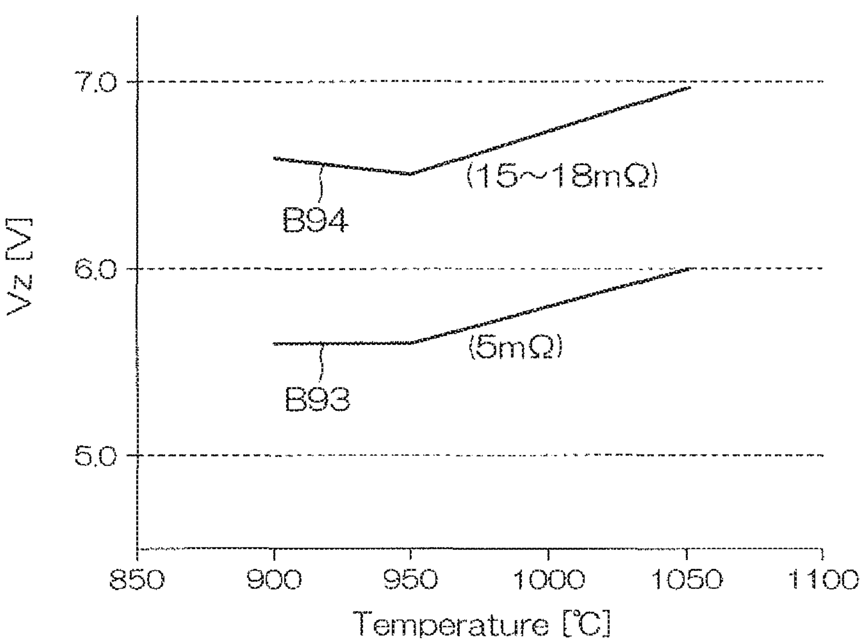
FIG. 34 is a diagram for describing another feature related to the adjustment of the Zener voltage (Vz).

FIG. 34 is a diagram for describing another feature related to the adjustment of the Zener voltage (Vz). Specifically, changes of the Zener diode with respect to the temperature during the heat treatment for activating the n-type impurity introduced into the semiconductor substrate B2 are shown, with a curve B93 indicating the Zener voltage in a case of using a semiconductor substrate with a comparatively low resistivity (for example, 5 mΩ) and a curve B94 indicating the Zener voltage in a case of using a semiconductor substrate with a comparatively high resistivity (for example, 15 to 18 mΩ). From a comparison of the curves B93 and B94, it can be understood that the Zener voltage is dependent on the resistivity of the semiconductor substrate. The Zener voltage can thus be adjusted to a design value by applying a semiconductor substrate with a resistivity that is appropriate in accordance with the targeted Zener voltage.

Figure 35:
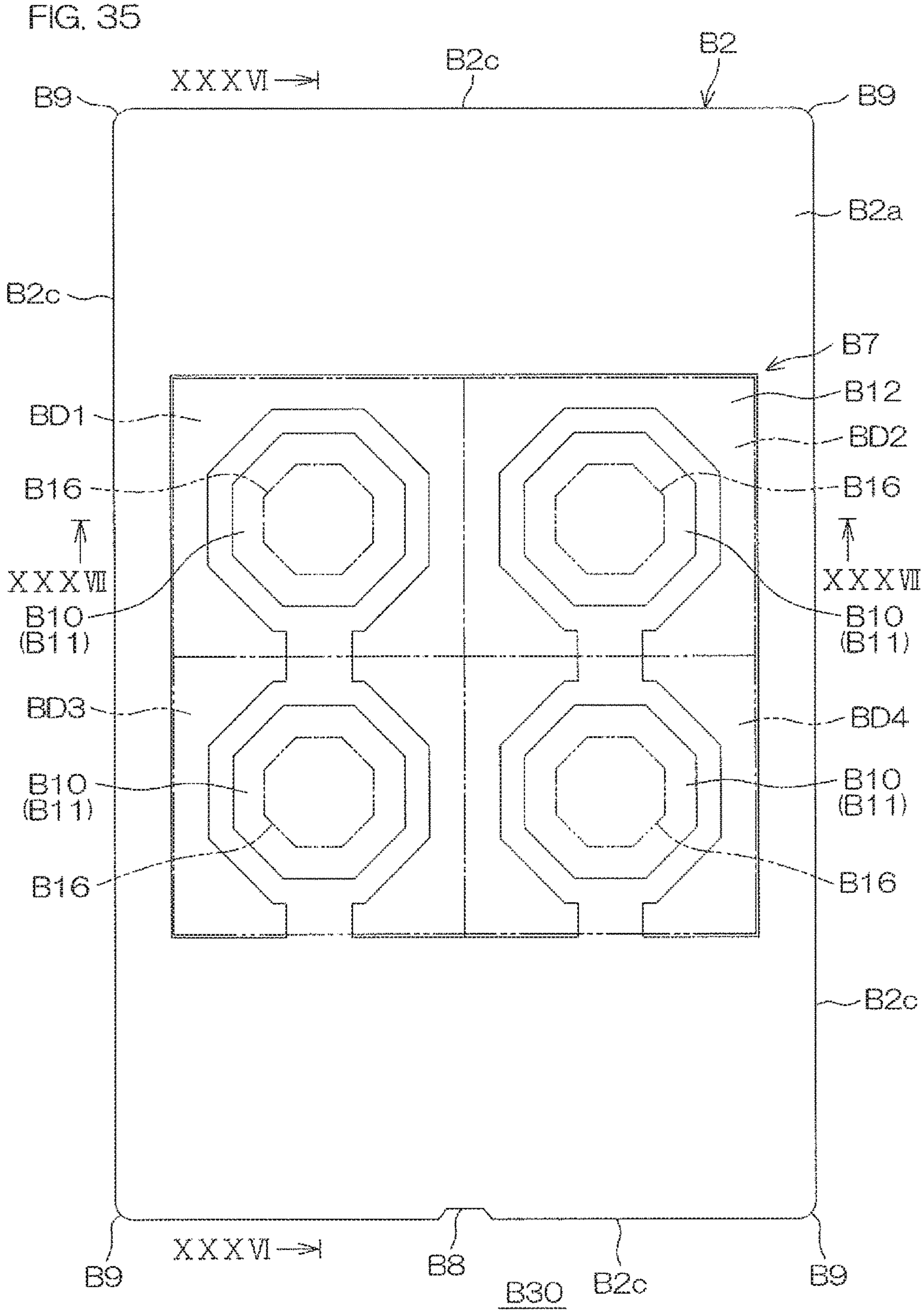
FIG. 35 is an illustrative plan view of a chip diode according to a second preferred embodiment of the third invention.
Figure 36:
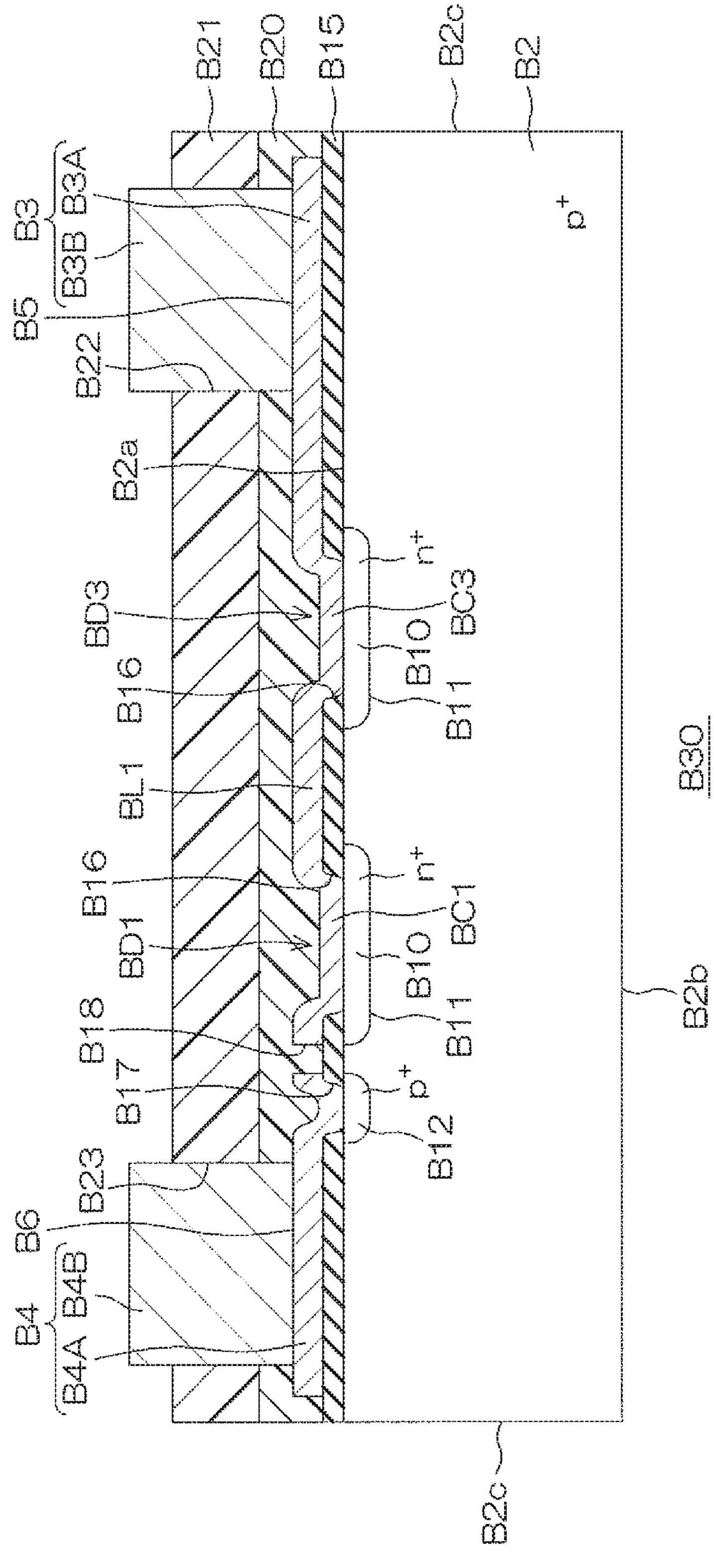
FIG. 36 is a sectional view taken along line XXXVI-XXXVI in FIG. 35.
Figure 37:
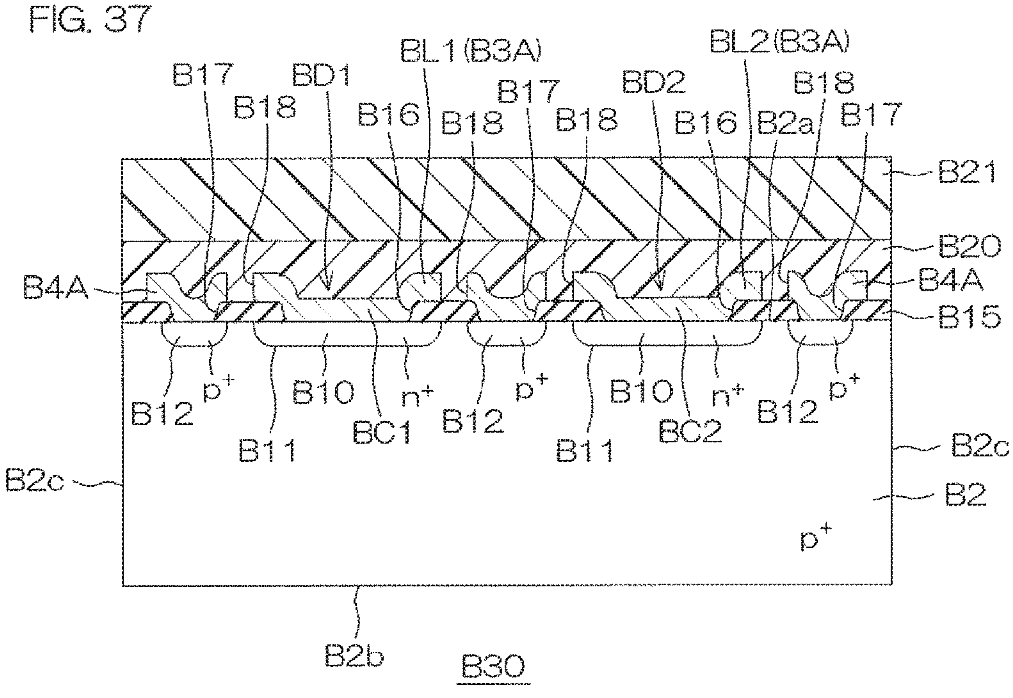
FIG. 37 is a sectional view taken along line XXXVII-XXXVII in FIG. 35.

FIG. 35 is an illustrative plan view of a chip diode B30 according to a second preferred embodiment of the third invention. The outer appearance and electrode configuration of the chip diode B30 are substantially the same as those of the first preferred embodiment described above and are as shown in FIG. 21 and FIG. 22. As in FIG. 25 described above, the arrangement appearing on the element forming surface B2*a* of the semiconductor substrate B2 is shown in FIG. 35. FIG. 36 is a sectional view taken along line XXXVI-XXXVI in FIG. 35, and FIG. 37 is a sectional view taken along line XXXVII-XXXVII in FIG. 35. In FIG. 35 to FIG. 37, portions corresponding to the respective portions of the first preferred embodiment shown in FIG. 21 and FIG. 22 of the above description are provided with the same reference symbols. FIG. 21 and FIG. 22 shall also be referenced.

In the present preferred embodiment, in a top layer region of the semiconductor substrate B2, a $p^+$ type region B12 is formed in a state of being separated from the $n^+$ type regions B10 across a predetermined interval. In the diode cell region B7, the $p^+$ type region B12 is formed to a pattern that avoids the $n^+$ type regions B10. In the present preferred embodiment an electrode film other than an AlSi film, for example, a Ti/Al laminated film having a Ti film as a lower layer and an Al film as an upper layer or a Ti/TiN/Al laminated film having a Ti film (with a thickness, for example, of 300 to 400 Å), a TiN film (with a thickness, for example, of approximately 1000 Å), and an AlCu film (with a thickness, for example, of approximately 30000 Å) laminated successively from the substrate B2 side, etc., is applied as each of the cathode electrode film B3A and the anode electrode film B4A. The anode electrode film B4A extends to inner sides of the contact holes B17 from the top surface of the insulating film B15 and is in ohmic contact with the $p^+$ type region B12 inside the contact holes B17. As can be understood from FIG. 32B (curve B91) that was referenced for the first preferred embodiment, an ohmic contact between the anode electrode film B4A and the $p^+$ type region B12 can be formed to electrically connect the anode electrode film B4A and the semiconductor substrate B2 with such an arrangement as well.

Figure 38:
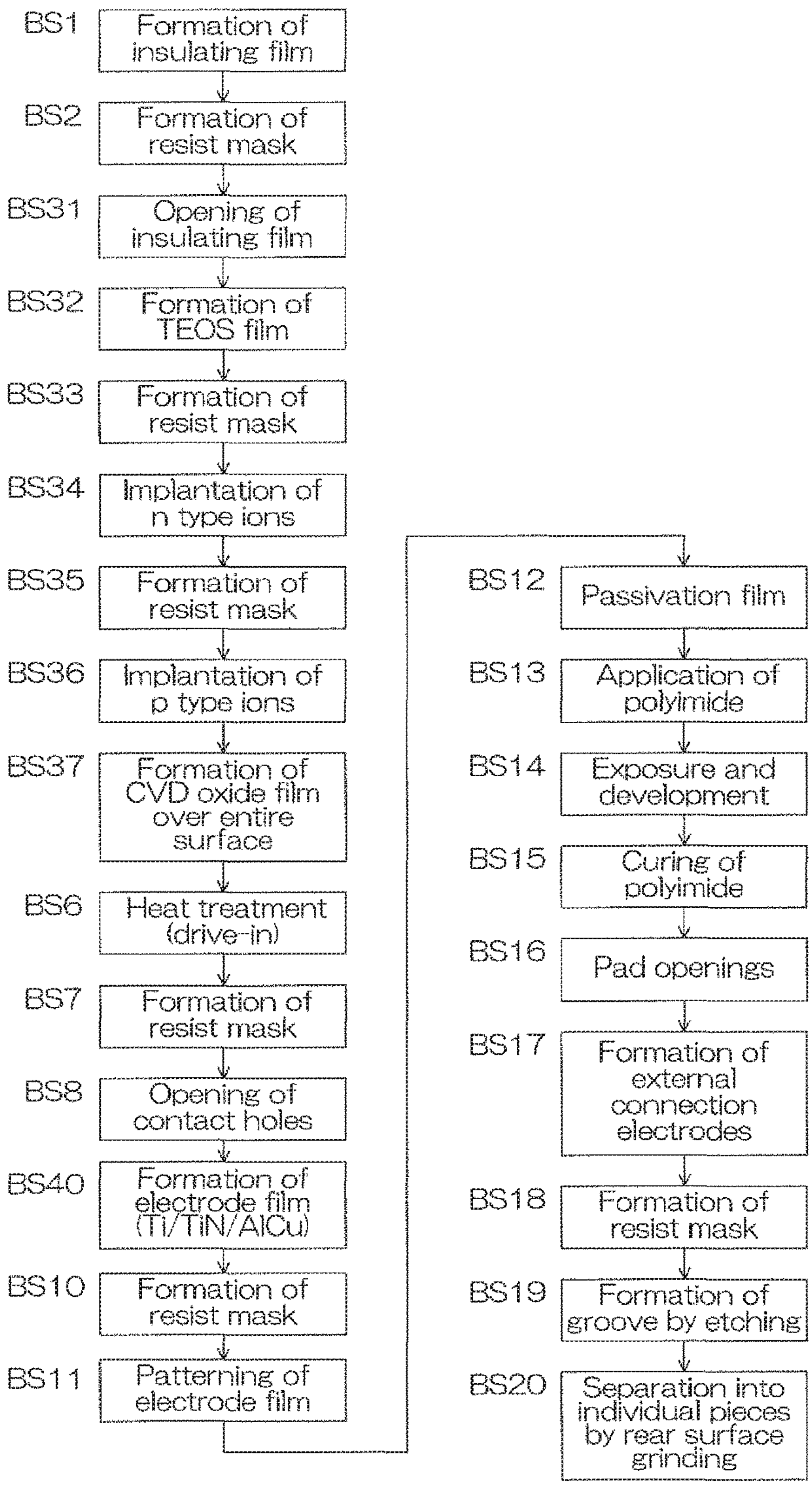
FIG. 38 is a process diagram for describing an example of a manufacturing process of the chip diode according to the second preferred embodiment of the third invention.

FIG. 38 is a process diagram for describing an example of a manufacturing process of the chip diode B30. Also, FIG. 39A to FIG. 39D are sectional views of the arrangements in the middle of the manufacturing process of FIG. 38. In FIG. 38, steps that are the same as the respective steps shown in FIG. 29 in the above description are provided with the same reference symbols and redundant description shall be omitted.

Figure 39A:
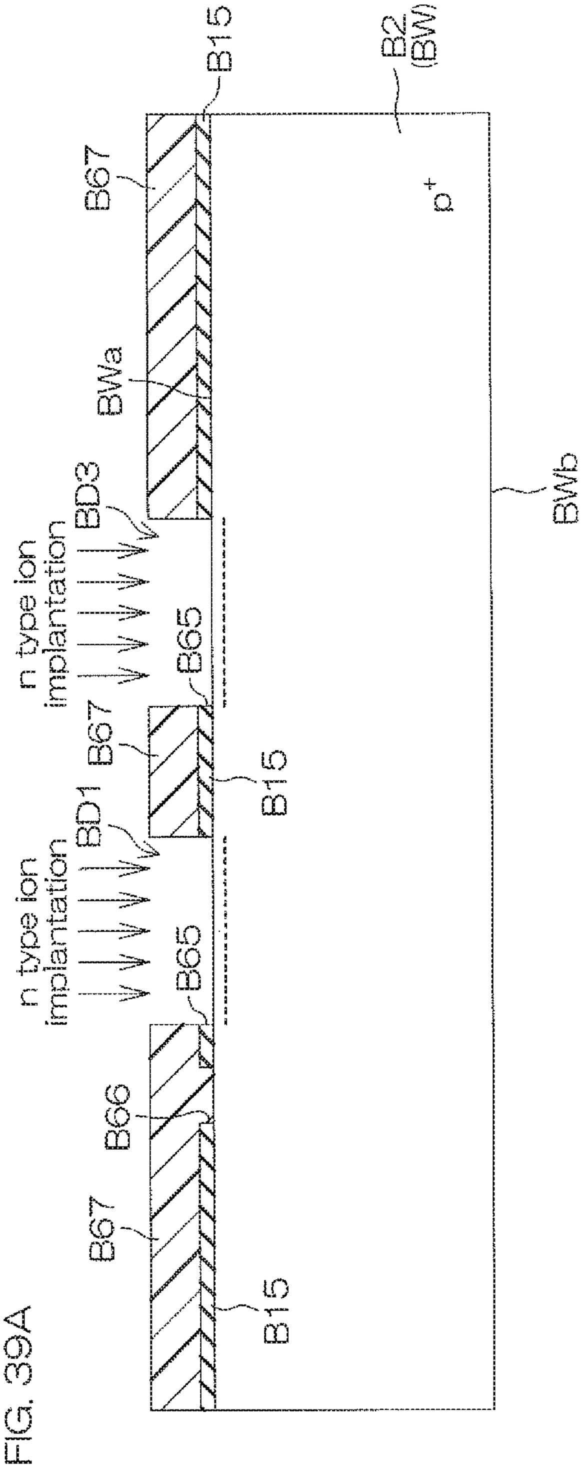
FIG. 39A is a sectional view of the arrangement in the middle of the manufacturing process of FIG. 38.
Figure 39B:
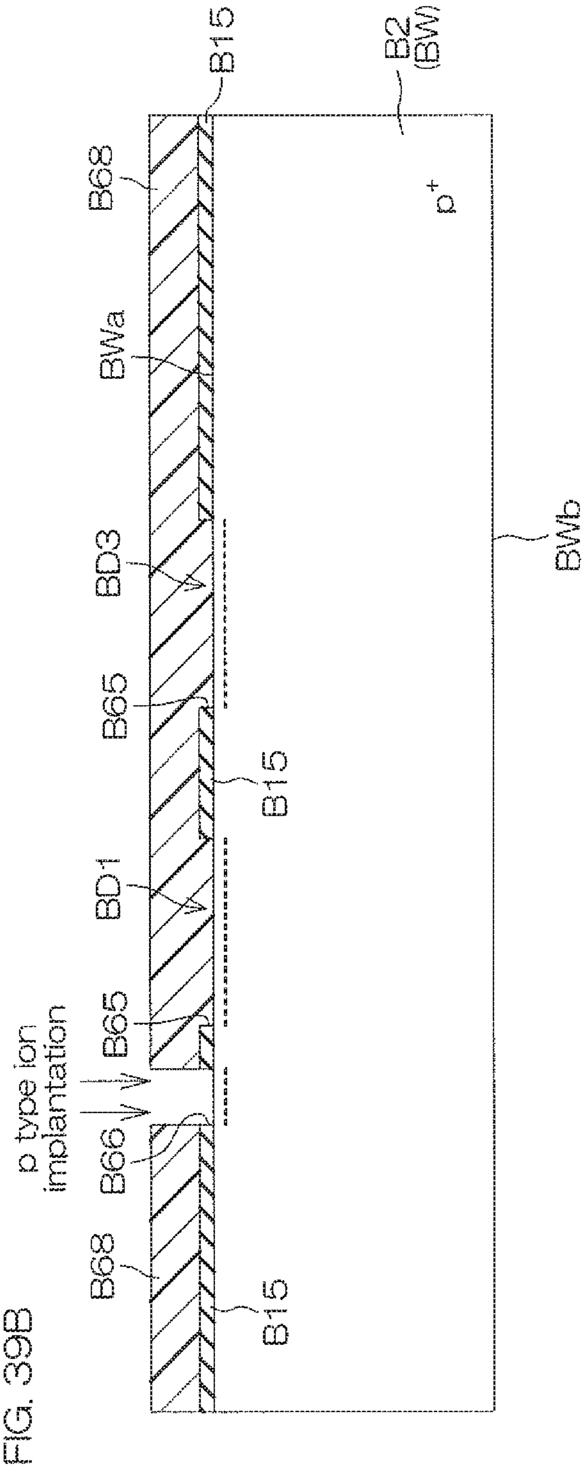
FIG. 39B is a sectional view of the arrangement in the middle of the manufacturing process of FIG. 38 and shows the arrangement in a step following that shown in FIG. 39A.
Figure 39C:
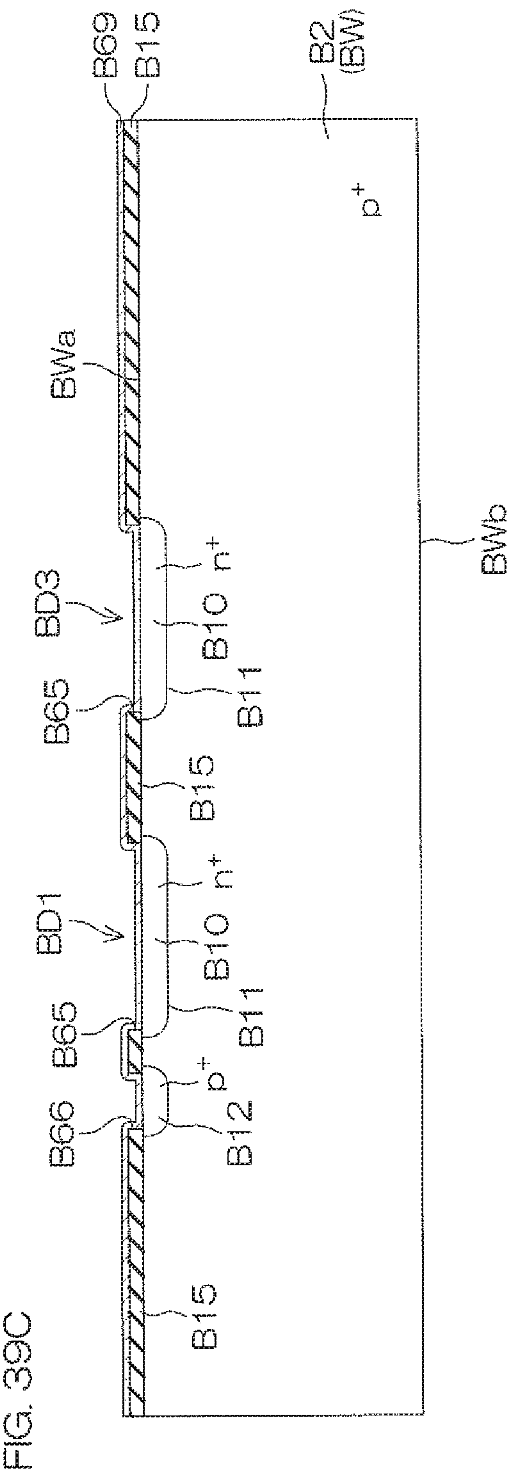
FIG. 39C is a sectional view of the arrangement in the middle of the manufacturing process of FIG. 38 and shows the arrangement in a step following that shown in FIG. 39B.
Figure 39D:
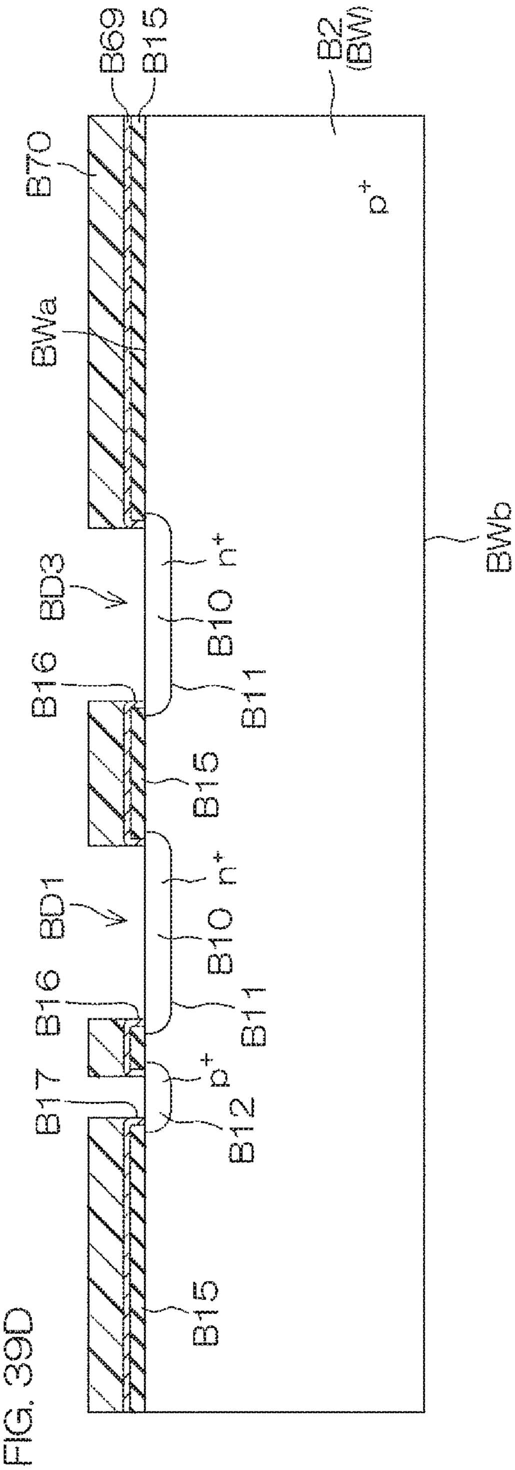
FIG. 39D is a sectional view of the arrangement in the middle of the manufacturing process of FIG. 38 and shows the arrangement in a step following that shown in FIG. 39C.

First, the insulating film B15 (with a thickness, for example, of 8000 Å), which is a thermal oxide film or CVD oxide film, etc., is formed on the element forming surface BWa of the $p^+$ type semiconductor wafer BW (BS1) and a resist mask is formed on the insulating film B15 (BS2). Openings B65 and B66 corresponding to the $n^+$ type regions B10 and the $p^+$ type region B12 are then formed in the insulating film B15 by etching using the resist mask as shown in FIG. 39A (BS31). Further, after peeling off the resist mask, an oxide film (for example, a TEOS film (a silicon oxide film formed by a reaction of tetraethoxysilane and oxygen)), arranged to suppress damage due to ion implantation, is formed as necessary on the entire surface (BS32). Another resist mask B67 is then formed (BS33). The resist mask B67 has openings corresponding to the $n^+$ type regions B10 and covers the region in which the $p^+$ type region B12 is to be formed. n-type impurity ions (for example, phosphorus ions) are implanted into the semiconductor wafer BW via the resist mask B67 (BS34). The resist mask B67 is then peeled off, and another resist mask B68 is formed as shown in FIG. 39B (BS35). The resist mask B68 has an opening corresponding to the $p^+$ type region B12 and covers the regions in which the $n^+$ type regions B10 are to be formed. p-type impurity ions (for example, boron ions) are implanted into the semiconductor wafer BW via the resist mask B68 (BS36). The resist mask B68 is then peeled off, and a CVD oxide film B69 that covers the entire surface of the semiconductor wafer BW is formed as shown in FIG. 39C (BS37). The thickness of the CVD oxide film B69 is preferably not less than 600 Å and more preferably not less than 1200 Å. The CVD oxide film B69 thickens the insulating film B15 and becomes a portion of the insulating film B15 and further covers the element forming surface BWa of the semiconductor wafer BW at the openings B65 and B66 in the insulating film B15. In this state, the heat treatment (drive-in) for activation of the impurity ions introduced into the semiconductor wafer BW is performed (BS6). The n-type impurity ions and the p-type impurity ions implanted into the semiconductor wafer BW are thereby activated respectively to form the $n^+$ type regions B10 and the $p^+$ type region B12. Then as shown in FIG. 39D, yet another resist mask B70 having openings matching the contact holes B16 and B17 is formed on the insulating film B15 (BS7). The contact holes B16 and B17 are formed in the insulating film B15 by etching via the resist mask B70 (BS8), and the resist mask B70 is peeled off thereafter (BS9).

An electrode film that constitutes the cathode electrode B3 and the anode electrode B4 is then formed on the insulating film B15, for example, by sputtering (BS40). In the present preferred embodiment, a Ti film, a TiN film, and an AlCu film are sputtered successively to form an electrode film constituted of the resulting laminated film. Another resist mask having an opening pattern corresponding to the slit B18 is then formed on the electrode film (BS10) and the slit B18 is formed in the electrode film by etching (for example, reactive ion etching) via the resist mask (BS11). The electrode film is thereby separated into the cathode electrode film B3A and the anode electrode film B4A.

The steps subsequent to the above are the same as those of the first preferred embodiment.

In the present manufacturing process, the entire wafer surface is covered by the CVD oxide film B69 before the heat treatment (drive-in) for activating the impurity introduced into the semiconductor wafer BW. Phosphorus, which is the $n^+$ type impurity, is thereby prevented from diffusing into the atmosphere and entering into the $p^+$ type region B12. Obstruction of the ohmic contact between the $p^+$ type region B12 and the anode electrode film B4A due to the n-type impurity can thereby be avoided to enable a satisfactory ohmic contact to be obtained between the $p^+$ type region B12 and the anode electrode film B4A. The chip diode B30 with excellent characteristics can thereby be provided.

Figure 40:
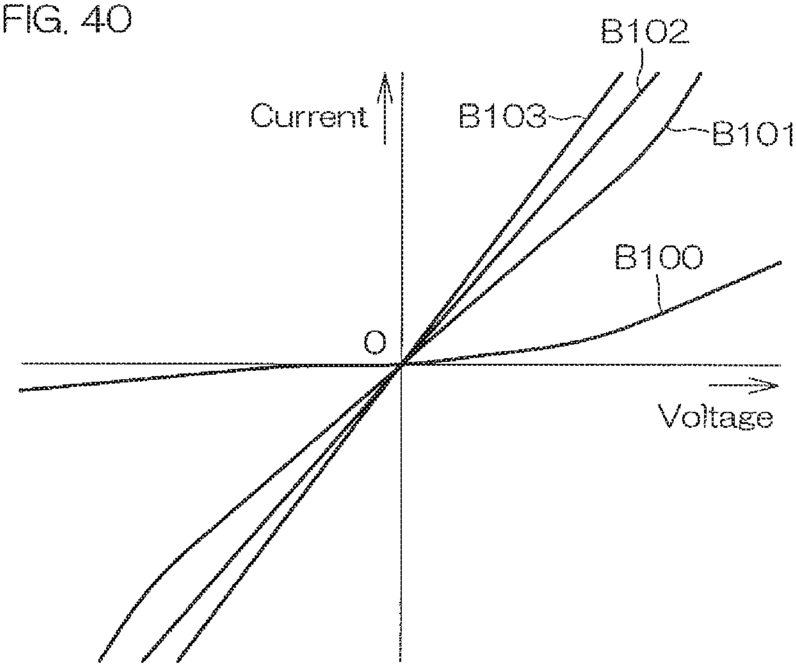
FIG. 40 is a diagram for describing the effect of forming a CVD oxide film before heat treatment for activation of an impurity and shows the current vs. voltage characteristics between the semiconductor substrate and an anode electrode film.

FIG. 40 is a diagram for describing the effect of forming the CVD oxide film B69 and shows the current vs. voltage characteristics between the $p^-$ type semiconductor substrate B2 and the anode electrode film B4A. A curve B100 shows the characteristics in a case where the CVD oxide film B69 is not formed and it can be understood that the change of current with respect to the change of voltage is dull and a satisfactory ohmic contact is not obtained. This is considered to have been caused by phosphorus, which is the $n^+$ type impurity, diffusing into the atmosphere and entering the $p^+$ type region B12 during the heat treatment for activating the impurity and the ohmic contact between the $p^+$ type region B12 and the anode electrode film B4A being obstructed by the n-type impurity. Curves B101, B102, and B103 respectively show characteristics in cases where the film thickness of the CVD oxide film B69 is set to 600 Å, 1200 Å, and 4800 Å. From a comparison of the curve B100 and the curves B101, B102, and B103, it can be understood that the current vs. voltage characteristics can be improved significantly by providing the CVD oxide film B69 before the heat treatment for activating the impurity. It can be understood that a current variation of high linearity with respect to the change of voltage is obtained and a satisfactory ohmic contact can be realized especially when the film thickness of the CVD oxide film B69 is made not less than 1200 Å.

Figure 41:
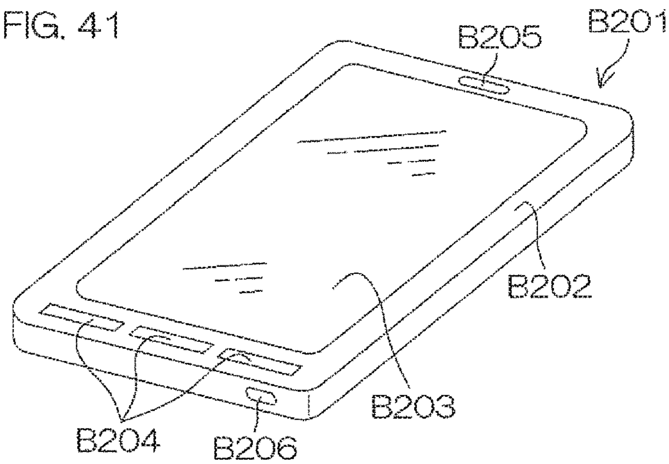
FIG. 41 is a perspective view of an outer appearance of a smartphone that is an example of an electronic equipment in which the chip diode is used.

FIG. 41 is a perspective view of an outer appearance of a smartphone that is an example of an electronic equipment in which the chip diode is used. The smartphone B201 is arranged by housing electronic parts in the interior of a casing B202 with a flat rectangular parallelepiped shape. The casing B202 has a pair of principal surfaces with an oblong shape at its front side and rear side, and the pair of principal surfaces are joined by four side surfaces. A display surface of a display panel B203, constituted of a liquid crystal panel or an organic EL panel, etc., is exposed at one of the principal surfaces of the casing B202. The display surface of the display panel B203 constitutes a touch panel and provides an input interface for a user.

The display panel B203 is formed to an oblong shape that occupies most of one of the principal surfaces of the casing B202. Operation buttons B204 are disposed along one short side of the display panel B203. In the present preferred embodiment, a plurality (three) of the operation buttons B204 are aligned along the short side of the display panel B203. The user can call and execute necessary functions by performing operations of the smartphone B210 by operating the operation buttons B204 and the touch panel.

A speaker B205 is disposed in a vicinity of the other short side of the display panel B203. The speaker B205 provides an earpiece for a telephone function and is also used as an acoustic conversion unit for reproducing music data, etc. On the other hand, close to the operation buttons B204, a microphone B206 is disposed at one of the side surfaces of the casing B202. The microphone 206 provides a mouthpiece for the telephone function and may also be used as a microphone for sound recording.

Figure 42:
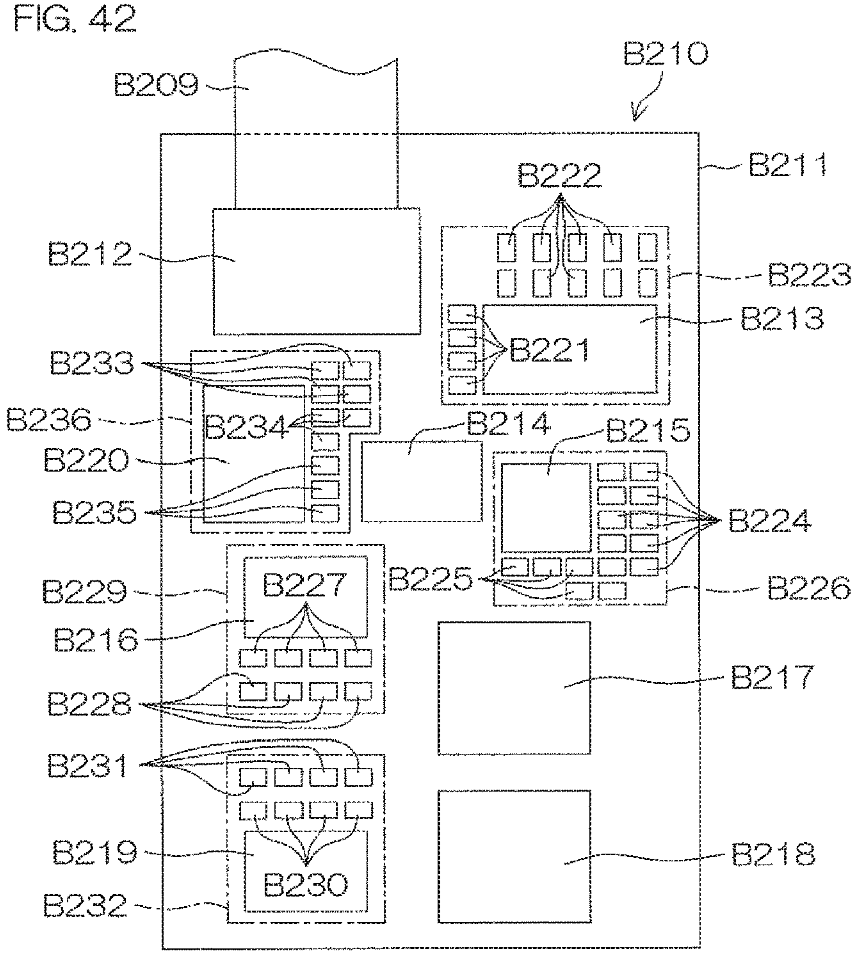
FIG. 42 is an illustrative plan view of the arrangement of an electronic circuit assembly housed in a housing of the smartphone.

FIG. 42 is an illustrative plan view of the arrangement of an electronic circuit assembly B210 housed in the interior of the housing B202. The electronic circuit assembly B210 includes a wiring substrate B211 and circuit parts mounted on a mounting surface of the wiring substrate B211. The plurality of circuit parts include a plurality of integrated circuit elements (ICs) B212 to B220 and a plurality of chip parts. The plurality of ICs include a transmission processing IC B212, a one-segment TV receiving IC B213, a GPS receiving IC B214, an FM tuner IC B215, a power supply IC B216, a flash memory B217, a microcomputer B218, a power supply IC B219, and a baseband IC B220. The plurality of chip parts include chip inductors B221, B225, and B235, chip resistors B222, B224, and B233, chip capacitors B227, B230, and B234, and chip diodes B228 and B231. The chip parts are mounted on the mounting surface of the wiring substrate B211, for example, by flip-chip bonding. The chip diodes according to any of the preferred embodiments described above may be applied as the chip diodes B228 and B231.

The transmission processing IC B212 has incorporated therein an electronic circuit arranged to generate display control signals for the display panel B203 and receive input signals from the touch panel on the top surface of the display panel B203. For connection with the display panel B203, the transmission processing IC B212 is connected to a flexible wiring B209. The one-segment TV receiving IC B213 incorporates an electronic circuit that constitutes a receiver for receiving one-segment broadcast (terrestrial digital television broadcast targeted for reception by portable equipment) radio waves. A plurality of the chip inductors B221 and a plurality of the chip resistors B222 are disposed in a vicinity of the one-segment TV receiving IC B213. The one-segment TV receiving IC B213, the chip inductors B221, and the chip resistors B222 constitute a one-segment broadcast receiving circuit B223. The chip inductors B221 and the chip resistors B222 respectively have accurately adjusted inductances and resistances and provide circuit constants of high precision to the one-segment broadcast receiving circuit B223.

The GPS receiving IC B214 incorporates an electronic circuit that receives radio waves from GPS satellites and outputs positional information of the smartphone B201. The FM tuner IC B215 constitutes, together with a plurality of the chip resistors B224 and a plurality of the chip inductors B225 mounted on the wiring substrate B211 in a vicinity thereof, an FM broadcast receiving circuit B226. The chip resistors B224 and the chip inductors B225 respectively have accurately adjusted resistances and inductances and provide circuit constants of high precision to the FM broadcast receiving circuit B226.

A plurality of the chip capacitors B227 and a plurality of the chip diodes B228 are mounted on the mounting surface of the wiring substrate B211 in a vicinity of the power supply IC B216. Together with the chip capacitors B227 and the chip diodes B228, the power supply IC B216 constitutes a power supply circuit B229. The flash memory B217 is a storage device for recording operating system programs, data generated in the interior of the smartphone B201, and data and programs acquired from the exterior by communication functions, etc.

The microcomputer B218 is a computing processing circuit that incorporates a CPU, a ROM, and a RAM and realizes a plurality of functions of the smartphone B201 by executing various computational processes. More specifically, computational processes for image processing and various application programs are realized by actions of the microcomputer B218. A plurality of the chip capacitors B230 and a plurality of the chip diodes B231 are mounted on the mounting surface of the wiring substrate B211 in a vicinity of the power supply IC B219. Together with the chip capacitors B230 and the chip diodes B231, the power supply IC B219 constitutes a power supply circuit B232.

A plurality of the chip resistors B233, a plurality of the chip capacitors B234, and a plurality of the chip inductors B235 are mounted on the mounting surface of the wiring substrate B211 in a vicinity of the baseband IC B220. Together with the chip resistors B233, the chip capacitors B234, and the chip inductors B235, the baseband IC B220 constitutes a baseband communication circuit B236. The baseband communication circuit B236 provides communication functions for telephone communication and data communication.

With the above arrangement, electric power that is appropriately adjusted by the power supply circuits B229 and B232 is supplied to the transmission processing IC B212, the GPS receiving IC B214, the one-segment broadcast receiving circuit B223, the FM broadcast receiving circuit B226, the baseband communication circuit B236, the flash memory B217, and the microcomputer B218. The microcomputer B218 performs computational processes in response to input signals input via the transmission processing IC B212 and makes the display control signals be output from the transmission processing IC B212 to the display panel B203 to make the display panel B203 perform various displays.

When receiving of a one-segment broadcast is commanded by operation of the touch panel or the operation buttons B204, the one-segment broadcast is received by actions of the one-segment broadcast receiving circuit B223. Computational processes for outputting received images to the display panel B203 and making received audio signals be acoustically converted by the speaker B205 are executed by the microcomputer B218. Also, when positional information of the smartphone B201 is required, the microcomputer B218 acquires the positional information output by the GPS receiving IC B214 and executes computational processes using the positional information.

Further, when an FM broadcast receiving command is input by operation of the touch panel or the operation buttons B204, the microcomputer B218 starts up the FM broadcast receiving circuit B226 and executes computational processes for outputting the received audio signals from the speaker B205. The flash memory B217 is used for storing data acquired by communication and storing data prepared by computations by the microcomputer B218 and inputs from the touch panel. The microcomputer B218 writes data into the flash memory B217 or reads data from the flash memory B217 as necessary.

The telephone communication or data communication functions are realized by the baseband communication circuit B236. The microcomputer B218 controls the baseband communication circuit B236 to perform processes for sending and receiving audio or data.

Although preferred embodiments of the third invention have been described above, the third invention may be implemented in yet other modes as well. For example, although with the first and second preferred embodiments described above, examples where four diode cells are formed on the semiconductor substrate were described, two or three diode cells may be formed or not less than four diode cells may be formed on the semiconductor substrate.

Also, although with the preferred embodiments, examples where the p-n junction regions are respectively formed to a regular octagon in a plan view were described, the p-n junction regions may be formed to any polygonal shape with the number of sides being not less than three, and the planar shapes of the regions may be circular or elliptical. If the shape of the p-n junction regions is to be made a polygonal shape, the shape does not have to be a regular polygonal shape and the respective regions may be formed to a polygon with two or more types of side length. Yet further, there is no need to form the p-n junction regions to the same size and a plurality of diode cells respectively having junction regions of different sizes may be mixed on the semiconductor substrate. Yet further, the shape of the p-n junction regions formed on the semiconductor substrate does not have to be of one type, and p-n junction regions with two or more types of shape may be mixed on the semiconductor substrate.

[4] Fourth Invention

With the arrangement of Patent Document 1 (Japanese Unexamined Patent Publication No. 2002-270858), the anode electrode is embedded in the insulating film and the exposed upper surface of the anode electrode is used for external connection. Specifically, a bonding wire is bonded to the upper surface of the anode electrode to achieve external connection of the diode element. However, the anode electrode is embedded in the insulating film and the p-n junction is positioned directly below it. The physical stress applied to the anode electrode in the process of external connection is thus transmitted to the p-n junction and the p-n junction may become destroyed or the element characteristics may vary. Therefore the reliability of the diode element after mounting is not necessarily satisfactory.

An object of the fourth invention is to provide a chip diode that is improved in reliability. The fourth invention further provides a circuit assembly including the chip diode and an electronic equipment including such a circuit assembly. The fourth invention has the following features.

C1. A chip diode including a p-type semiconductor substrate, an n-type diffusion layer formed on the p-type semiconductor substrate and forming a p-n junction region with the p-type semiconductor substrate, an insulating film covering a principal surface of the p-type semiconductor substrate and having a cathode contact hole exposing the n-type diffusion layer, a cathode electrode having a cathode lead-out electrode contacting the n-type diffusion layer via the cathode contact hole and led out onto the insulating film in a region outside the cathode contact hole and a cathode external connection portion connected to the cathode lead-out electrode and disposed on the insulating film in the region outside the cathode contact hole, and an anode electrode connected to the p-type semiconductor substrate.

With this arrangement, the insulating film is formed on the p-type semiconductor substrate and the cathode lead-out electrode is connected to the n-type diffusion layer via the cathode contact hole formed in the insulating film. The cathode external connection portion is disposed on the insulating film in the region outside the cathode contact hole. The cathode external connection portion can thereby be disposed so as to avoid a position directly above the p-n junction region, and application of a large impact to the p-n junction region can thus be avoided during mounting of the chip diode on a mounting substrate or during connection of a bonding wire to the cathode external connection portion. Destruction of the p-n junction region can thereby be avoided, and a chip diode that is excellent in durability against external forces and therefore improved in reliability can be realized.

Further with the present invention, the semiconductor substrate is constituted of the p-type semiconductor substrate and therefore stable characteristics can be realized even if an epitaxial layer is not formed on the semiconductor substrate. That is, an n-type semiconductor wafer is large in in-plane variation of resistivity, and therefore an epitaxial layer with low in-plane variation of resistivity must be formed on the top surface and an impurity diffusion layer must be formed on the epitaxial layer to form the p-n junction. On the other hand, a p-type semiconductor wafer is low in in-plane variation and a diode with stable characteristics can be cut out from any location of the wafer without having to form an epitaxial layer. Therefore by using the p-type semiconductor substrate, the manufacturing process can be simplified and the manufacturing cost can be reduced.

C2. The chip diode according to "C1.," where the cathode external connection portion is provided at a position separated from a position directly above the p-n junction region. With this arrangement, physical stress on the p-n junction region can be reduced reliably to enable improvement of the reliability of the chip diode.

C3. The chip diode according to "C1." or "C2.," where the insulating film further has an anode contact hole exposing the p-type semiconductor substrate and the anode electrode has an anode lead-out electrode contacting the p-type semiconductor substrate via the anode contact hole and led out onto the insulating film in a region outside the anode contact hole and an anode external connection portion connected to the anode lead-out electrode and disposed on the insulating film in the region outside the anode contact hole.

With this arrangement, the anode external connection portion can also be disposed so as to avoid a position directly above the p-n junction region, and application of a large impact to the p-n junction region can thus be avoided during mounting of the chip diode on a mounting substrate or during connection of a bonding wire to the anode external connection portion. A chip diode that is further improved in reliability can thereby be realized.

C4. The chip diode according to "C3.," where the anode lead-out electrode is constituted of an AlSi electrode film and the AlSi electrode film contacts the p-type semiconductor substrate. With this arrangement, the anode electrode has the AlSi electrode film that contacts the p-type semiconductor substrate. AlSi is close in work function to a p-type semiconductor (especially a p-type silicon semiconductor). An AlSi electrode film can thus form a satisfactory ohmic junction with the p-type semiconductor substrate. There is thus no need to form a high impurity concentration diffusion layer for ohmic junction on the p-type semiconductor substrate. The manufacturing process can thereby be simplified further and the productivity and the production cost can be reduced accordingly.

C5. The chip diode according to "C3.," further including a $p^+$ type diffusion layer, formed on the p-type semiconductor substrate, containing a p-type impurity at a higher concentration than the p-type semiconductor substrate, and exposed in the anode contact hole, and where the anode lead-out electrode contacts the p-type diffusion layer. Besides an AlSi film, a Ti/Al laminated film, a Ti/TiN/AlCu laminated film, or other electrode film material may be applied as the electrode film that contacts the p-type semiconductor substrate. In this case, it is preferable to form the $p^+$ type diffusion layer, with the higher impurity concentration than the p-type semiconductor substrate, on the p-type semiconductor substrate and to form an ohmic contact by bonding the anode lead-out electrode to the $p^+$ type diffusion layer.

C6. The chip diode according to any one of "C1." to "C5.," where a plurality of the n-type diffusion layers are formed on the p-type semiconductor substrate in individually separated states to constitute a plurality of diode cells that respectively form the p-n junction region individually, and the cathode lead-out electrode includes a plurality of cell connection portions respectively connected to the n-type diffusion layers of the plurality of diode cells.

With this arrangement, the plurality of diode cells are formed on the p-type semiconductor substrate. The cathode lead-out electrode has the plurality of cell connection portions respectively connected to the n-type diffusion layers of the plurality of diode cells. The plurality of diode cells are thereby connected in parallel between the cathode electrode and the anode electrode. The ESD tolerance can thereby be improved, and in particular, both reduction of the chip size and securing of the ESD tolerance can be achieved at the same time. More specifically, the p-n junction regions that are separated according to each diode cell are formed and these are connected in parallel. By an individual p-n junction region being formed in each of the plurality of diode cells, a peripheral length of the p-n junction regions on the semiconductor substrate can be made long. Concentration of electric field is thereby relaxed and the ESD tolerance can be improved. That is, a sufficient ESD tolerance can be secured even if the chip size is reduced. The peripheral length of the p-n junction regions is the total of the lengths of the peripheries of the p-n junction regions at the top surface of the semiconductor substrate. More specifically, the peripheral length of the p-n junction regions is the total extension of the boundary lines between p-type regions and n-type regions at the top surface of the semiconductor substrate.

C7. The chip diode according to "C6.," where the plurality of diode cells are arrayed two-dimensionally on the p-type semiconductor substrate. With this arrangement, the ESD tolerance can be improved further by the plurality of diode cells being arrayed two-dimensionally (preferably arrayed two-dimensionally at equal intervals). The p-n junction regions of the plurality of diode cells may be formed to be equal in size. With this arrangement, the plurality of diode cells have substantially equal characteristics and the chip diode thus has satisfactory characteristics as a whole and can be made to have a sufficient ESD tolerance even when downsized. Each p-n junction region may be a polygonal region. With this arrangement, each diode cell has a p-n junction region of long peripheral length, the peripheral length of the entirety can thus be made long, and the ESD tolerance can thus be improved.

The plurality of diode cells may be formed to be equal in size (more specifically, the p-n junction regions of the plurality of diode cells may be formed to be equal in size). With this arrangement, the plurality of diode cells have substantially equal characteristics and the chip diode thus has satisfactory characteristics as a whole and can be made to have a sufficient ESD tolerance even when downsized. Preferably, not less than four of the diode cells are provided. With this arrangement, by not less than four of the diode cells being provided, the peripheral length of the diode junction regions can be made long and the ESD tolerance can be improved efficiently.

C8. The chip diode according to any one of "C1." to "C7.," where the p-type semiconductor substrate does not have an epitaxial layer. As mentioned above, the semiconductor substrate is constituted of the p-type semiconductor substrate and therefore stable characteristics can be realized even if an epitaxial layer is not formed on the semiconductor substrate. Therefore by omitting the epitaxial layer, the manufacturing process can be simplified and the manufacturing cost can be reduced.

C9. The chip diode according to any one of "C1." to "C8.," where the cathode electrode and the anode electrode are disposed at one of the principal surface sides of the p-type semiconductor substrate. With this arrangement, both the cathode electrode and the anode electrode are formed on one of the surfaces of the p-type semiconductor substrate, and the chip diode can thus be surface-mounted on a mounting substrate. That is, a flip-chip connection type chip diode can be provided. The space occupied by the chip diode can thereby be made small. In particular, reduction of height of the chip diode on the mounting substrate can be realized. Effective use can thereby be made of the space inside a casing of a compact electronic equipment, etc., to contribute to high-density packaging and downsizing.

C10. The chip diode according to any one of "C1." to "C9.," further including a protective film formed on the principal surface of the p-type semiconductor substrate so as to cover the cathode lead-out electrode while exposing the cathode electrode and the anode electrode. With this arrangement, the protective film that covers the cathode lead-out electrode while exposing the cathode electrode and the anode electrode is formed so that entry of moisture to the cathode lead-out electrode and the p-n junction regions can be suppressed or prevented. In addition, the durability against external forces can be improved by the protective film and the reliability can be improved further.

C11. The chip diode according to any one of "C1." to "C10.," where the cathode lead-out electrode is formed on one of the principal surfaces of the p-type semiconductor substrate, and the one principal surface of the p-type semiconductor substrate has a rectangular shape with rounded corner portions. With this arrangement, the surface of the semiconductor substrate at the side on which the cathode lead-out electrode is formed has the rectangular shape with rounded corner portions. Fragmenting (chipping) of the corner portions of the chip diode can thereby be suppressed or prevented and a chip diode with few appearance defects can be provided.

C12. The chip diode according to "C11.", where a recess expressing a cathode direction is formed in a middle portion of one side of the rectangular shape. With this arrangement, the recess expressing the cathode direction is formed on one side of the semiconductor substrate of rectangular shape and there is thus no need to form a mark (cathode mark) that expresses the cathode direction by marking, etc., on a surface of the semiconductor substrate (for example, on the top surface of the protective film). A recess such as the above may be formed at the same time as performing the processing for cutting out the chip diode from a wafer (base substrate). Also, the recess can be formed even when the size of the chip diode is minute and marking is difficult. A step for marking can thus be omitted and a sign expressing the cathode direction can be provided even in a chip diode of minute size.

C13. A circuit assembly including a mounting substrate and the chip diode according to any one of "C1." to "C12." that is mounted on the mounting substrate. With this arrangement, a circuit assembly can be provided that uses the chip diode, with which destruction and variation of characteristics during mounting can be suppressed and which is thus improved in reliability. A circuit assembly of high reliability can thus be provided.

C14. The circuit assembly according to "C13.," where the chip diode is connected to the mounting substrate by wireless bonding (face-down bonding or flip-chip bonding). With this arrangement, the space occupied by the chip diode on the mounting substrate can be made small to enable a contribution to be made to high-density packaging of electronic parts.

C15. An electronic equipment including the circuit assembly according to "C13." or "C14." and a casing housing the circuit assembly. With this arrangement, an electronic equipment can be provided with which the circuit assembly, using the chip diode that can be suppressed in destruction and variation of characteristics during mounting and is thus improved in reliability, is housed in the casing. An electronic equipment of high reliability can thus be provided.

Preferred embodiments of the fourth invention shall now be described in detail with reference to the attached drawings.

Figure 43:
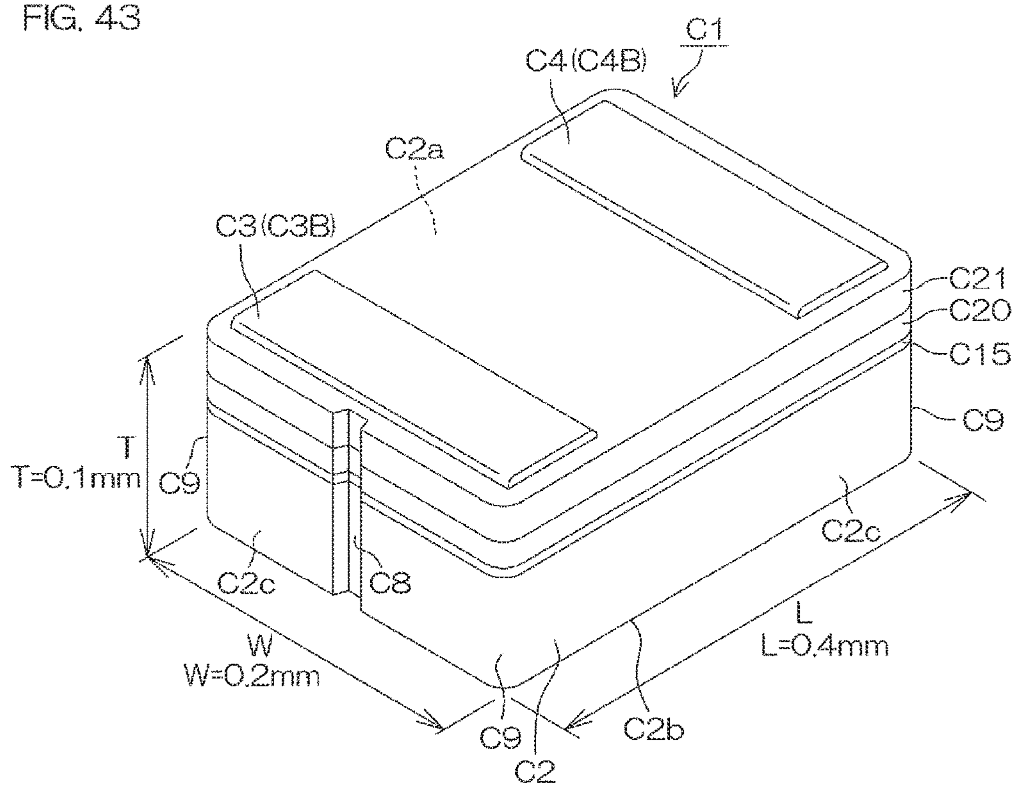
FIG. 43 is a perspective view of a chip diode according to a first preferred embodiment of a fourth invention.
Figure 44:
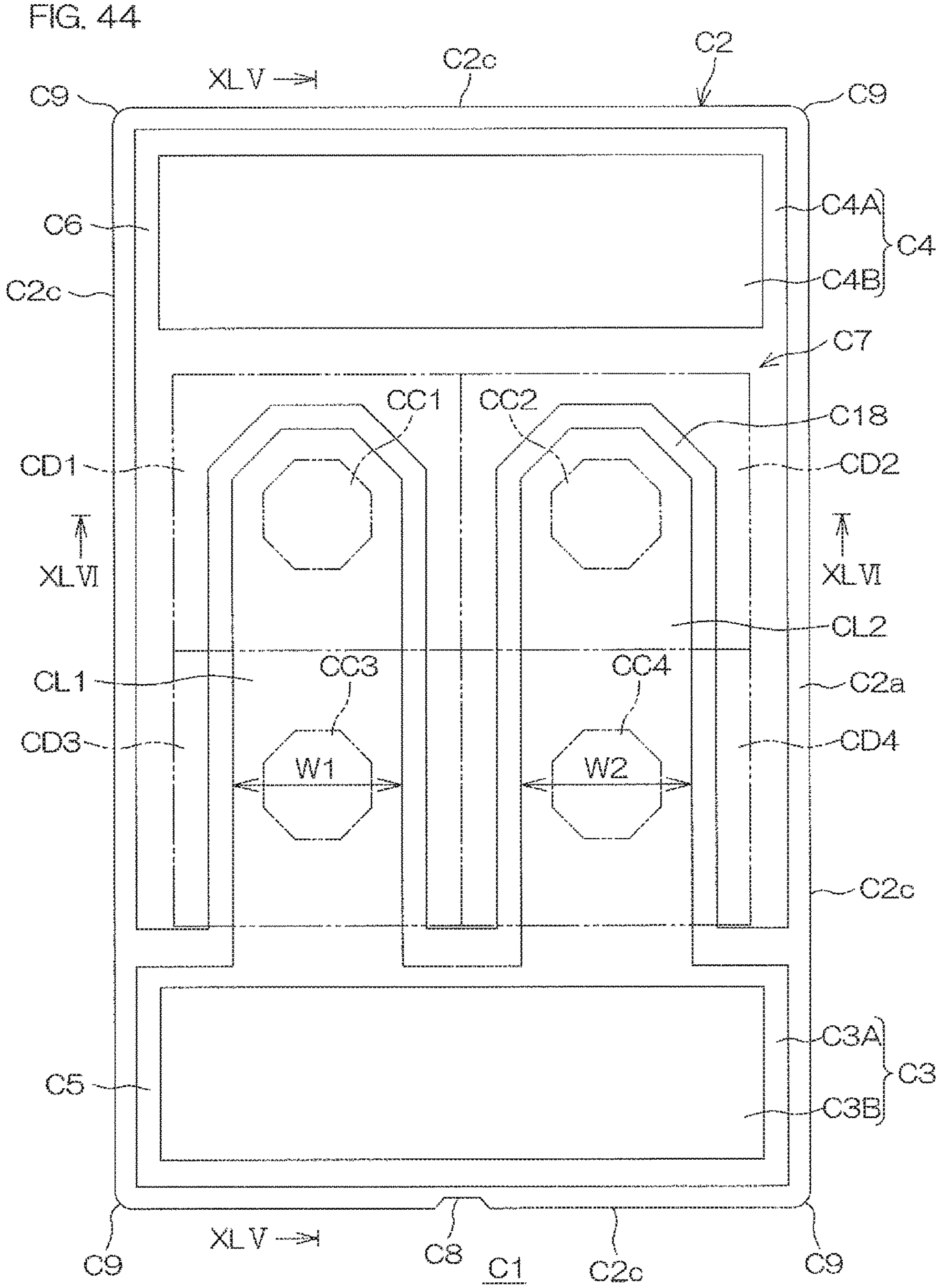
FIG. 44 is a plan view of the chip diode according to the first preferred embodiment of the fourth invention.
Figure 45:
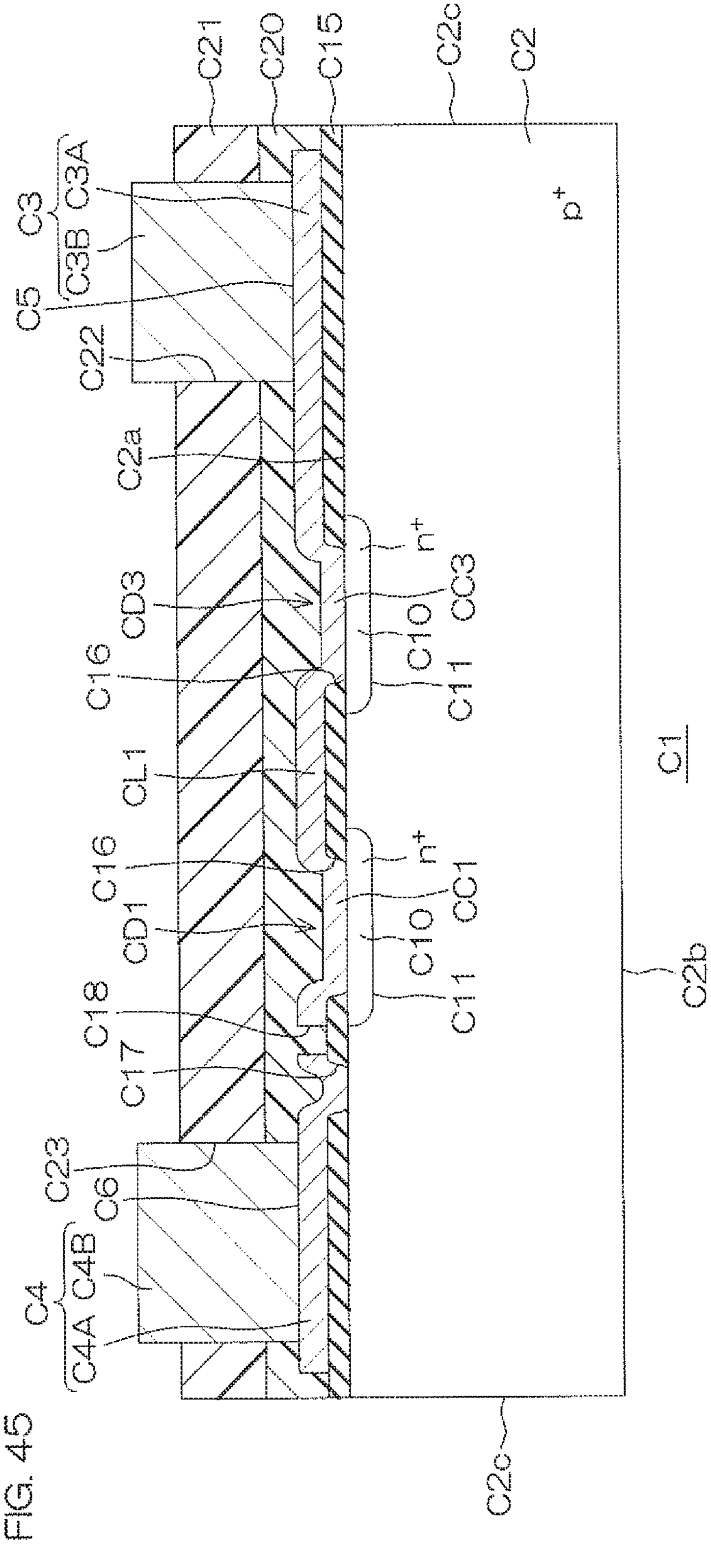
FIG. 45 is a sectional view taken along line XLV-XLV in FIG. 44.
Figure 46:
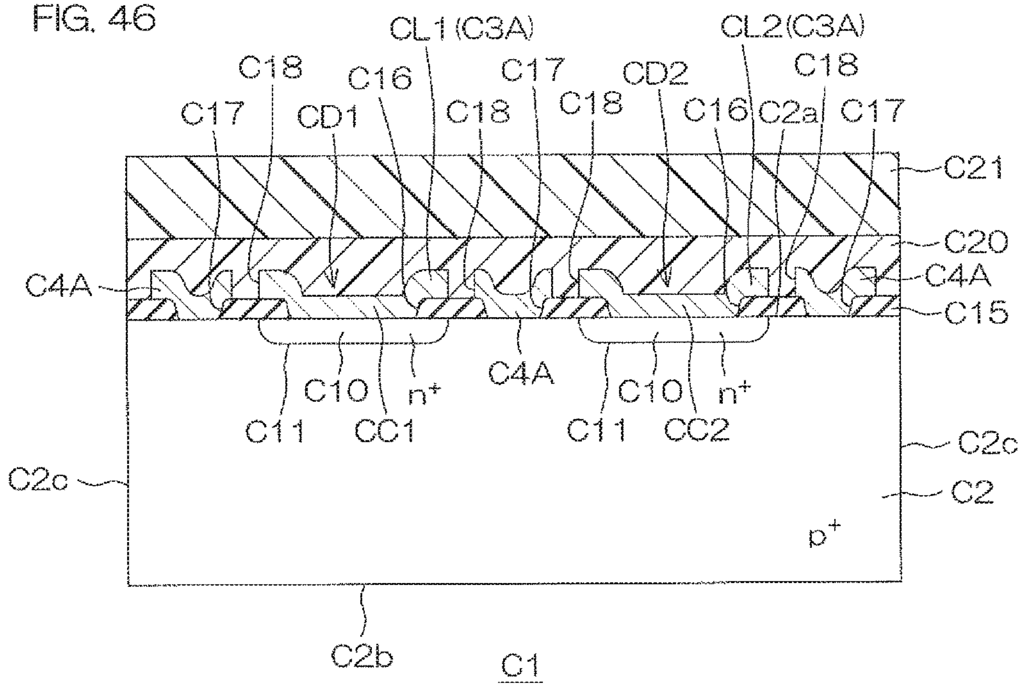
FIG. 46 is a sectional view taken along line XLVI-XLVI in FIG. 44.

FIG. 43 is a perspective view of a chip diode according to a first preferred embodiment of the fourth invention, FIG. 44 is a plan view thereof, and FIG. 45 is a sectional view taken along line XLV-XLV in FIG. 44. Further, FIG. 46 is a sectional view taken along line XLVI-XLVI in FIG. 44.

The chip diode C1 includes a $p^+$ type semiconductor substrate C2 (for example, a silicon substrate), a plurality of diode cells CD1 to CD4 formed on the semiconductor substrate C2, and a cathode electrode C3 and an anode electrode C4 connecting the plurality of diode cells CD1 to CD4 in parallel. The semiconductor substrate C2 includes a pair of principal surfaces C2*a* and C2*b* and a plurality of side surfaces C2*c* orthogonal to the pair of principal surfaces C2*a* and C2*b*, and one (principal surface C2*a*) of the pair of principal surfaces C2*a* and C2*b* is arranged as an element forming surface. Hereinafter, the principal surface C2*a* shall be referred to as the "element forming surface C2*a*." The element forming surface C2*a* is formed to a rectangular shape in a plan view and, for example, the length L in the long direction may be approximately 0.4 mm and the length W in the short direction may be approximately 0.2 mm. Also, the thickness T of the chip diode C1 as a whole may be approximately 0.1 mm. An external connection electrode C3B of the cathode electrode C3 and an external connection electrode C4B of the anode electrode C4 are disposed at respective end portions of the element forming surface C2*a*. A diode cell region C7 is provided between the external connection electrodes C3B and C4B.

A recess C8 that is cut out so as to extend in the thickness direction of the semiconductor substrate C2 is formed on one side surface C2*c* that is continuous with one short side (in the present preferred embodiment, the short side close to the cathode side external connection electrode C3B) of the element forming surface C2*a*. In the present preferred embodiment, the recess C8 extends across the entirety in the thickness direction of the semiconductor substrate C2. In a plan view, the recess C8 is recessed inward from the one short side of the element forming surface C2*a* and, in the present preferred embodiment, has a trapezoidal shape that becomes narrow toward the inner side of the element forming surface C2*a*. Obviously, this planar shape is an example and the planar shape may instead be a rectangular shape, a triangular shape, or a recessingly curved shape, such as a partially circular shape (for example, an arcuate shape), etc. The recess C8 indicates the orientation (chip direction) of the chip diode C1. More specifically, the recess C8 provides a cathode mark that indicates the position of the cathode side external connection electrode C3B. A structure is thereby provided with which the polarity of the chip diode C1 can be ascertained from its outer appearance during mounting.

The semiconductor substrate C2 has four corner portions C9 at four corners, each corresponding to an intersection portion of a pair of mutually adjacent side surfaces among the four side surfaces C2*c*. In the present preferred embodiment, the four corner portions C9 are shaped to round shapes. Each corner portion C9 has a smooth curved surface that is outwardly convex in a plan view as viewed in a direction of a normal to the element forming surface C2*a*. A structure capable of suppressing chipping during the manufacturing process or mounting of the chip diode C1 is thereby arranged.

Figure 47:
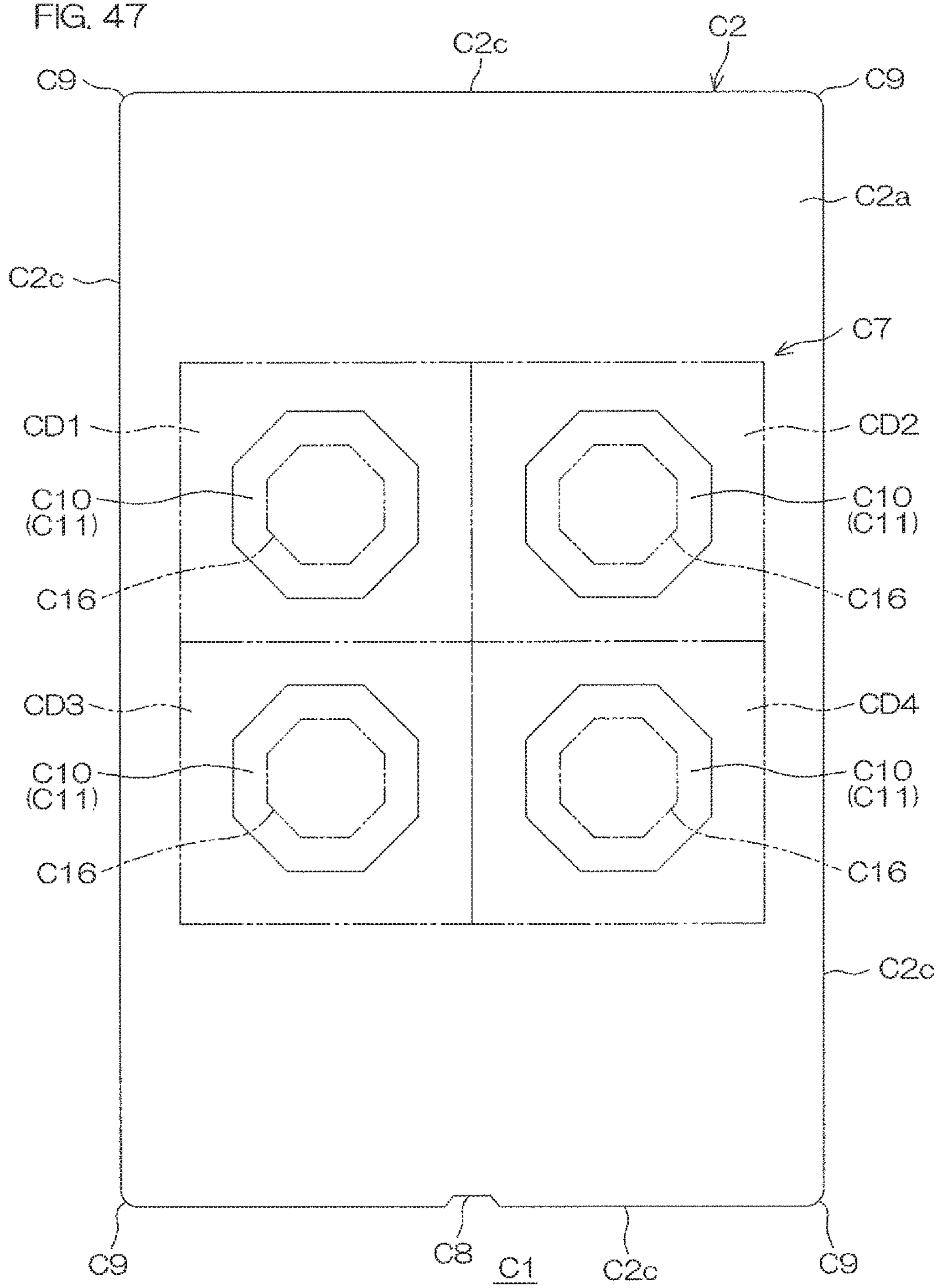
FIG. 47 is a plan view of the chip diode according to the first preferred embodiment of the fourth invention with a cathode electrode, an anode electrode, and the arrangement formed thereon being removed to show the structure of a top surface of a semiconductor substrate.

In the present preferred embodiment, the diode cell region C7 is formed to a rectangular shape. The plurality of diode cells CD1 to CD4 are disposed inside the diode cell region C7. In regard to the plurality of diode cells CD1 to CD4, four are provided in the present preferred embodiment and these are arrayed two-dimensionally at equal intervals in a matrix along the long direction and short direction of the semiconductor substrate C2. FIG. 47 is a plan view showing the structure of the top surface (element forming surface C2*a*) of the semiconductor substrate C2 with the cathode electrode C3, the anode electrode C4, and the arrangement formed thereon being removed. In each of the regions of the diode cells CD1 to CD4, an $n^-$ type region C10 is formed in a top layer region of the $p^+$ type semiconductor substrate C2. The $n^+$ type regions C10 are separated according to each individual diode cell. The diode cells CD1 to CD4 are thereby made to respectively have p-n junction regions C11 that are separated according to each individual diode cell.

In the present preferred embodiment, the plurality of diode cells CD1 to CD4 are formed to be equal in size and equal in shape and are specifically formed to rectangular shapes, and the $n^+$ type region C10 with a polygonal shape is formed in the rectangular region of each diode cell. In the present preferred embodiment, each $n^+$ type region C10 is formed to a regular octagon having four sides extending along the four sides forming the rectangular region of the corresponding diode cell among the diode cells CD1 to CD4 and another four sides respectively facing the four corner portions of the rectangular region of the corresponding diode cell among the diode cells CD1 to CD4.

As shown in FIG. 45 and FIG. 46, an insulating film C15 (omitted from illustration in FIG. 44), constituted of an oxide film, etc., is formed on the element forming surface C2*a* of the semiconductor substrate C2. Contact holes C16 (cathode contact holes) exposing top surfaces of the respective $n^+$ type regions C10 of the diode cells CD1 to CD4 and contact holes C17 (anode contact holes) exposing the element forming surface C2*a* are formed in the insulating film C15. The cathode electrode C3 and the anode electrode C4 are formed on the top surface of the insulating film C15. The cathode electrode C3 includes a cathode electrode film C3A formed on the top surface of the insulating film C15 and the external connection electrode C3B bonded to the cathode electrode film C3A. The cathode electrode film C3A includes a lead-out electrode CL1 connected to the plurality of diode cells CD1 and CD3, a lead-out electrode CL2 connected to the plurality of diodes CD2 and CD4, and a cathode pad C5 formed integral to the lead-out electrodes CL1 and CL2 (cathode lead-out electrodes). The cathode pad C5 is formed to a rectangle at one end portion of the element forming surface C2*a*. The external connection electrode C3B is connected to the cathode pad C5. The external connection electrode C3B is thereby connected in common to the lead-out electrodes CL1 and CL2. The cathode pad C5 and the external connection electrode C3B constitute an external connection portion (cathode external connection portion) of the cathode electrode C3.

The anode electrode C4 includes an anode electrode film C4A formed on the top surface of the insulating film C15 and the external connection electrode C4B bonded to the anode electrode film C4A. The anode electrode film C4A is connected to the $p^+$ type semiconductor substrate C2 and has an anode pad C6 near one end portion of the element forming surface C2*a*. The anode pad C6 is constituted of a region of the anode electrode film C4A that is disposed at the one end portion of the element forming surface C2*a*. The external connection electrode C4B is connected to the anode pad C6. The anode pad C6 and the external connection electrode C4B constitute an external connection portion (anode external connection portion) of the anode electrode C4. The region of the anode electrode film C4A besides the anode pad C6 is an anode lead-out electrode that is led out from the anode contact holes C17.

The lead-out electrode CL1 enters into the contact holes C16 of the diode cells CD1 and CD3 from the top surface of the insulating film C15 and is in ohmic contact with the respective $n^+$ type regions C10 of the diode cells CD1 and CD3 inside the respective contact holes C16. In the lead-out electrode CL1, the portions connected to the diode cells CD1 and CD3 inside the contact holes C16 constitute cell connection portions CC1 and CC3. Similarly, the lead-out electrode CL2 enters into the contact holes C16 of the diode cells CD2 and CD4 from the top surface of the insulating film C15 and is in ohmic contact with the respective $n^+$ type regions C10 of the diode cells CD2 and CD4 inside the respective contact holes C16. In the lead-out electrode CL2, the portions connected to the diode cells CD2 and CD4 inside the contact holes C16 constitute cell connection portions CC2 and CC4. The anode electrode film C4A extends to inner sides of the contact holes C17 from the top surface of the insulating film C15 and is in ohmic contact with the $p^+$ type semiconductor substrate C2 inside the contact holes C17. In the present preferred embodiment, the cathode electrode film C3A and the anode electrode film C4A are made of the same material.

In the present preferred embodiment, AlSi films are used as the electrode films. When an AlSi film is used, the anode electrode film C4A can be put in ohmic contact with the $p^+$ type semiconductor substrate C2 without having to provide a $p^+$ type region on the top surface of the semiconductor substrate C2. That is, an ohmic junction can be formed by putting the anode electrode film C4A in direct contact with the $p^+$ type semiconductor substrate C2. A process for forming the $p^+$ type region can thus be omitted.

The cathode electrode film C3A and the anode electrode film C4A are separated by a slit C18. The lead-out electrode CL1 is formed rectilinearly along a straight line passing from the diode cell CD1 to the cathode pad C5 through the diode cell CD3. Similarly, the lead-out electrode CL2 is formed rectilinearly along a straight line passing from the diode cell CD2 to the cathode pad C5 through the diode cell CD4. The lead-out electrodes CL1 and CL2 respectively have uniform widths W1 and W2 at all locations between the $n^+$ type regions C10 and the cathode pad C5, and the widths W1 and W2 are wider than the widths of the cell connection portions CC1, CC2, CC3, and CC4. The widths of the cell connection portions CC1 to CC4 are defined by the lengths in the direction orthogonal to the lead-out directions of the lead-out electrodes CL1 and CL2. Tip end portions of the lead-out electrodes CL1 and CL2 are shaped to match the planar shapes of the $n^+$ type regions C10. Base end portions of the lead-out electrodes CL1 and CL2 are connected to the cathode pad C5. The slit C18 is formed so as to border the lead-out electrodes CL1 and CL2. On the other hand, the anode electrode film C4A is formed on the top surface of the insulating film C15 so as to surround the cathode electrode film C3A across an interval corresponding to the slit C18 of substantially fixed width. The anode electrode film C4A integrally includes a comb-teeth-like portion extending in the longitudinal direction of the element forming surface C2*a* and the anode pad C6 that is constituted of a rectangular region.

The cathode electrode film C3A and the anode electrode film C4A are covered by a passivation film C20 (omitted from illustration in FIG. 44), constituted, for example, of a nitride film, and a resin film C21, made of polyimide, etc., is further formed on the passivation film C20. A pad opening C22 exposing the cathode pad C5 and a pad opening C23 exposing the anode pad C6 are formed so as to penetrate through the passivation film C20 and the resin film C21. The external connection electrodes C3B and C4B are respectively embedded in the pad openings C22 and C23. The passivation film C20 and the resin film C21 constitute a protective film to suppress or prevent the entry of moisture to the lead-out electrodes CL1 and CL2 and the p-n junction regions C11 and also absorb impacts, etc., from the exterior, thereby contributing to improvement of the durability of the chip diode C1.

The external connection electrodes C3B and C4B may have top surfaces at positions lower than the top surface of the resin film C21 (positions close to the semiconductor substrate C2) or may project from the top surface of the resin film C21 and have top surfaces at positions higher than the resin film C21 (positions far from the semiconductor substrate C2). An example where the external connection electrodes C3B and C4B project from the top surface of the resin film C21 is shown in FIG. 45. Each of the external connection electrodes C3B and C4B may be constituted, for example, of an Ni/Pd/Au laminated film having an Ni film in contact with the electrode film C3A or C4A, a Pd film formed on the Ni film, and an Au film formed on the Pd film. Such a laminated film may be formed by a plating method.

In each of the diode cells CD1 to CD4, the p-n junction region C11 is formed between the p-type semiconductor substrate C2 and the $n^+$ type region C10, and a p-n junction diode is thus formed respectively. The $n^+$ type regions C10 of the plurality of diode cells CD1 to CD4 are connected in common to the cathode electrode C3, and the $p^+$ type semiconductor substrate C2, which is the p-type region in common of the diode cells CD1 to CD4, is connected in common to the anode electrode C4. The plurality of diode cells CD1 to CD4, formed on the semiconductor substrate C2, are thereby connected in parallel all together.

Figure 48:
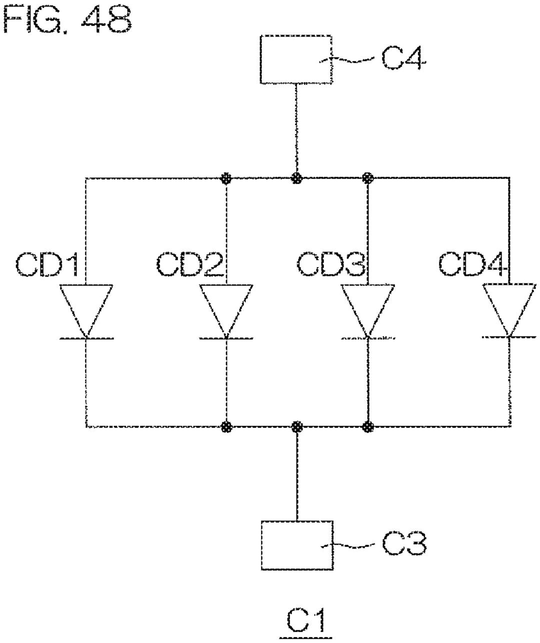
FIG. 48 is an electric circuit diagram showing the electrical structure of the interior of the chip diode according to the first preferred embodiment of the fourth invention.

FIG. 48 is an electric circuit diagram showing the electrical structure of the interior of the chip diode C1. With the p-n junction diodes respectively constituted by the diode cells CD1 to CD4, the cathode sides are connected in common by the cathode electrode C3, the anode sides are connected in common by the anode electrode C4, and all of the diodes are thereby connected in parallel and made to function as a single diode as a whole.

With the arrangement of the present preferred embodiment, the chip diode C1 has the plurality of diode cells CD1 to CD4 and each of the diode cells CD1 to CD4 has the p-n junction region C11. The p-n junction regions C11 are separated according to each of the diode cells CD1 to CD4. The chip diode C1 is thus made long in the peripheral length of the p-n junction regions C11, that is, the total peripheral length (total extension) of the $n^+$ type regions C10 in the semiconductor substrate C2. The electric field can thereby be dispersed and prevented from concentrating at vicinities of the p-n junction regions C11, and the ESD tolerance can thus be improved. That is, even when the chip diode C1 is to be formed compactly, the total peripheral length of the p-n junction regions C11 can be made large, thereby enabling both downsizing of the chip diode C1 and securing of the ESD tolerance to be achieved at the same time.

Figure 49:
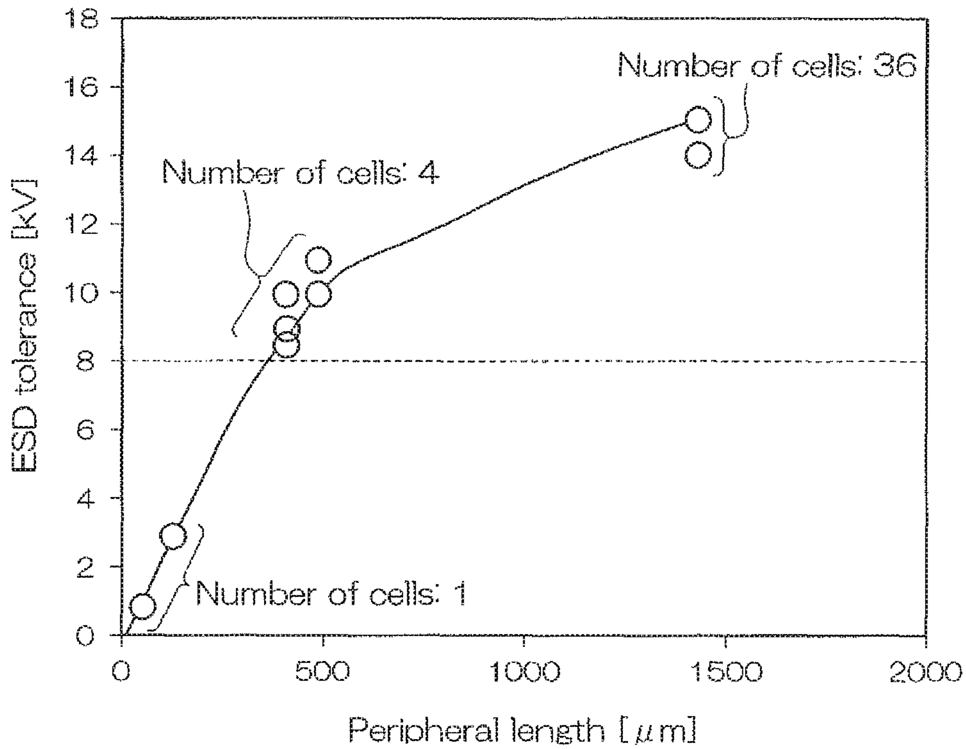
FIG. 49 shows experimental results of measuring the ESD tolerances of a plurality of samples that are differed in total peripheral length (total extension) of p-n junction regions by variously setting the sizes of diode cells and/or the number of the diode cells formed on a semiconductor substrate of the same area.

FIG. 49 shows experimental results of measuring the ESD tolerances of a plurality of samples that are differed in the total peripheral length (total extension) of the p-n junction regions by variously setting the sizes of diode cells and/or the number of the diode cells formed on a semiconductor substrate of the same area. From these experimental results, it can be understood that the longer the peripheral length of the p-n junction regions, the greater the ESD tolerance. In cases where not less than four diode cells are formed on the semiconductor substrate, ESD tolerances in the excess of 8 kilovolts could be realized.

Further with the present preferred embodiment, the widths W1 and W2 of the lead-out electrodes CL1 and CL2 are wider than the widths of the cell connection portions CC1 to CC4 at all locations between the cell connection portions CC1 to CC4 and the cathode pad C5. A large allowable current amount can thus be set and electromigration can be reduced to improve reliability with respect to a large current. That is, a chip diode that is compact, high in ESD tolerance, and secured in reliability with respect to large currents can be provided.

Also with the present preferred embodiment, the plurality of diode cells CD1 and CD3 and the plurality of diode cells CD2 and CD4, which are respectively aligned along straight lines directed toward the cathode pad C5, are connected to the cathode pad C5 by the rectilinear lead-out electrodes CL1 and CL2 in common. The lengths of the lead-out electrodes from the diode cells CD1 to CD4 to the cathode pad C5 can thereby be minimized and electromigration can thus be reduced more effectively. Also, a single lead-out electrode CL1 or CL2 can be shared by the plurality of diode cells CD1 and CD3 or the plurality of diode cells CD2 and CD4, and therefore lead-out electrodes of wide line widths can be laid out on the semiconductor substrate C2 while forming a large number of diode cells CD1 to CD4 to increase the peripheral length of the diode junction regions (p-n junction regions C11). Both further improvement of ESD tolerance and reduction of electromigration can thereby be achieved at the same time to further improve the reliability.

Figure 50:
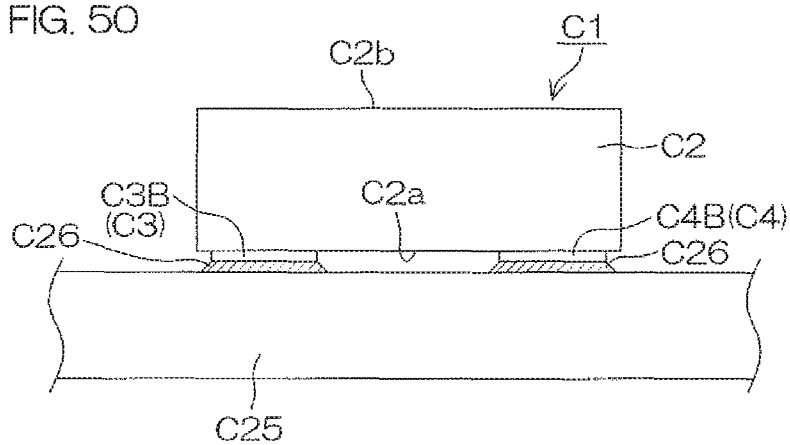
FIG. 50 is a sectional view of the arrangement of a circuit assembly with which the chip diode according to the first preferred embodiment of the fourth invention is flip-chip connected onto a mounting substrate.

Also, the end portions of the lead-out electrodes CL1 and CL2 have partially polygonal shapes matching the shapes (polygons) of the $n^+$ type regions C10 and can thus be connected to the $n^+$ type regions C10 while making small the areas occupied by the lead-out electrodes CL1 and CL2. Further, both the cathode side and anode side external connection electrodes C3B and C4B are formed on the element forming surface C2*a*, which is one of the surfaces of the semiconductor substrate C2. Therefore as shown in FIG. 50, a circuit assembly having the chip diode C1 surface-mounted on a mounting substrate C25 can be arranged by making the element forming surface C2*a* face the mounting substrate C25 and bonding the external connection electrodes C3B and C4B onto the mounting substrate C25 by solders C26. That is, the chip diode C1 of the flip-chip connection type can be provided, and by performing face-down bonding with the element forming surface C2*a* being made to face the mounting surface of the mounting substrate C25, the chip diode C1 can be connected to the mounting substrate C25 by wireless bonding. The area occupied by the chip diode C1 on the mounting substrate C25 can thereby be made small. In particular, reduction of height of the chip diode C1 on the mounting substrate C25 can be realized. Effective use can thereby be made of the space inside a casing of a compact electronic equipment, etc., to contribute to high-density packaging and downsizing.

Also with the present preferred embodiment, the insulating film C15 is formed on the semiconductor substrate C2 and the cell connection portions CC1 to CC4 of the lead-out electrodes CL1 and CL2 are connected to the diode cells CD1 to CD4 via the contact holes C16 formed in the insulating film C15. The cathode pad C5 is disposed on the insulating film C15 in the region outside the contact holes C16. That is, the cathode pad C5 is provided at a position separated from positions directly above the p-n junction regions C11. Also, the anode electrode film C4A is connected to the semiconductor substrate C2 via the contact holes C17 formed in the insulating film C15, and the anode pad C6 is disposed on the insulating film C15 in the region outside the contact holes C17. The anode pad C6 is also disposed at a position separated from positions directly above the p-n junction regions C11. Application of a large impact to the p-n junction regions C11 can thus be avoided during mounting of the chip diode C1 on the mounting substrate C25. Destruction of the p-n junction regions C11 can thereby be avoided and a chip diode that is excellent in durability against external forces can thereby be realized. An arrangement is also possible where the external connection electrodes C3B and C4B are not provided, the cathode pad C5 and the anode pad C6 are respectively used as the cathode external connection portion and the anode connection portion, and bonding wires are connected to the cathode pad C5 and the anode pad C6. Destruction of the p-n junction regions C11 due to impacts during wire bonding can be avoided in this case as well.

Also with the present preferred embodiment, the anode electrode film C4A is constituted of an AlSi film. An AlSi film is close in work function to a p-type semiconductor (especially a p-type silicon semiconductor) and can thus form a satisfactory ohmic junction with the $p^+$ type semiconductor substrate C2. There is thus no need to form a high impurity concentration diffusion layer for ohmic junction on the $p^+$ type semiconductor substrate C2. The manufacturing process can thereby be simplified further and the productivity and the production cost can be reduced accordingly.

Further with the present preferred embodiment, the semiconductor substrate C2 has the rectangular shape with the corner portions C9 being rounded. Fragmenting (chipping) of the corner portions of the chip diode C1 can thereby be suppressed or prevented and the chip diode C1 with few appearance defects can be provided. Further with the present preferred embodiment, the recess C8 expressing the cathode direction is formed on the short side of the semiconductor substrate C2 close to the cathode side external connection electrode C3B and there is thus no need to mark a cathode mark on a rear surface (the principal surface at the side opposite to the element forming surface C2*a*) of the semiconductor substrate C2. The recess C8 may be formed at the same time as performing the processing for cutting out the chip diode C1 from a wafer (base substrate). Also, the recess C8 can be formed to indicate the direction of the cathode even when the size of the chip diode C1 is minute and marking is difficult. A step for marking can thus be omitted and a sign expressing the cathode direction can be provided even in the chip diode C1 of minute size.

Figure 51:
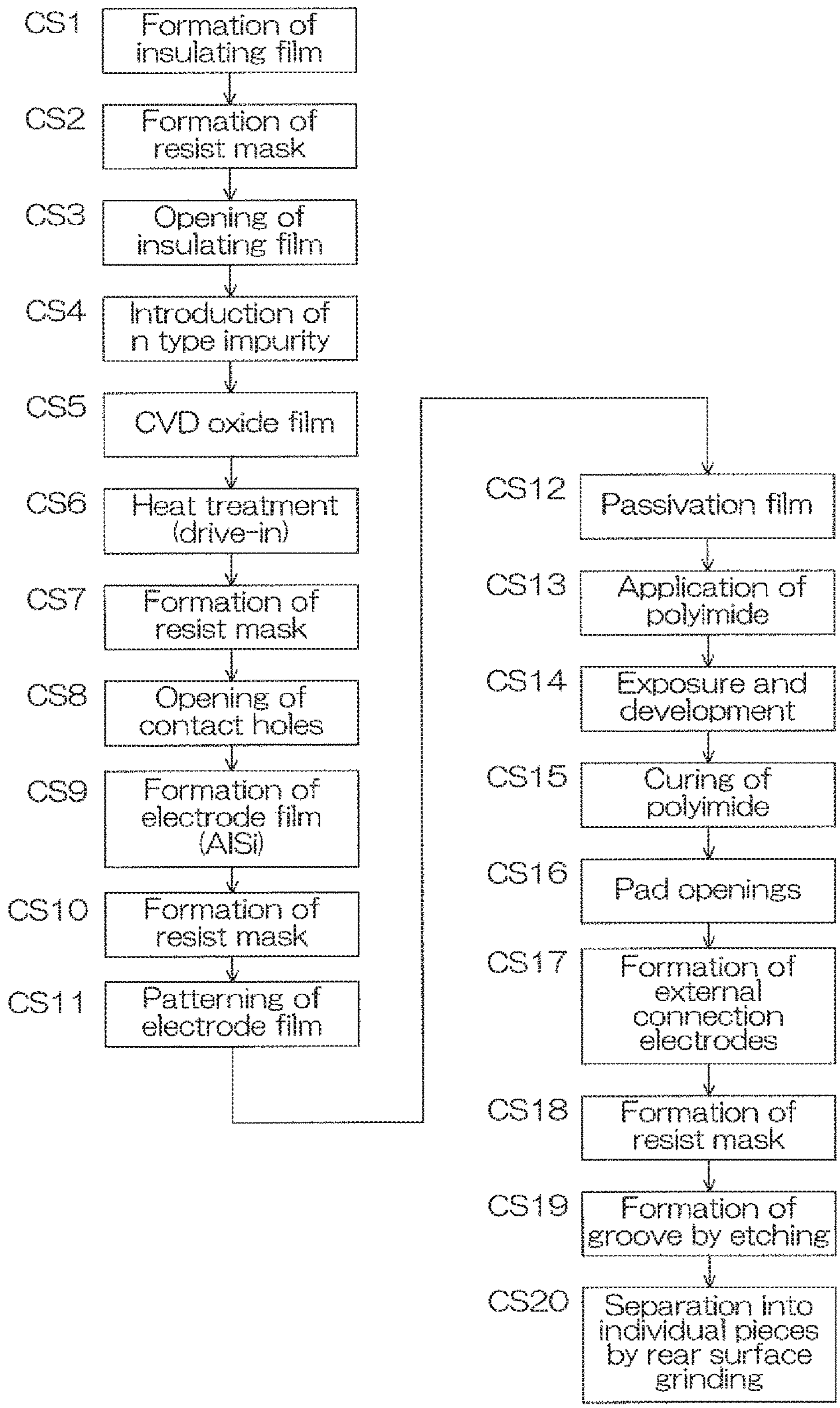
FIG. 51 is a process diagram for describing an example of a manufacturing process of the chip diode according to the first preferred embodiment of the fourth invention.
Figure 52A:
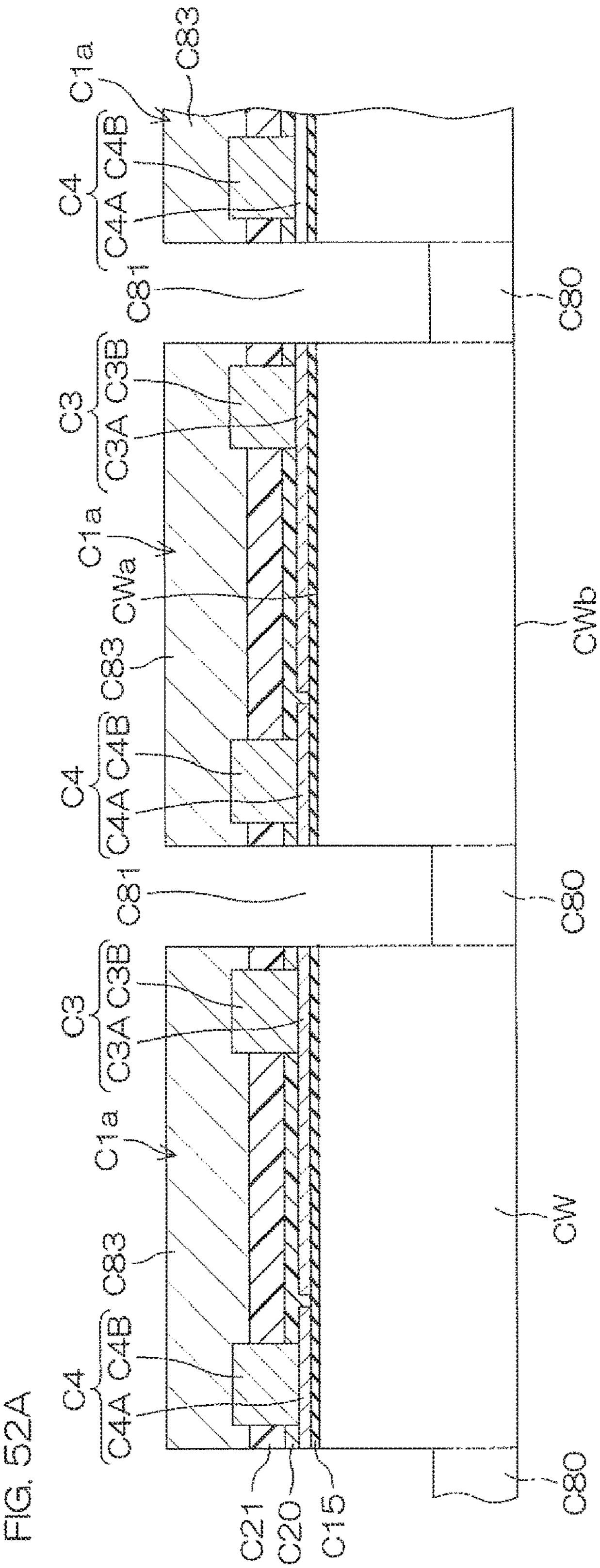
FIG. 52A is a sectional view of the arrangement of the chip diode according to the first preferred embodiment of the fourth invention in the middle of the manufacturing process.
Figure 52B:
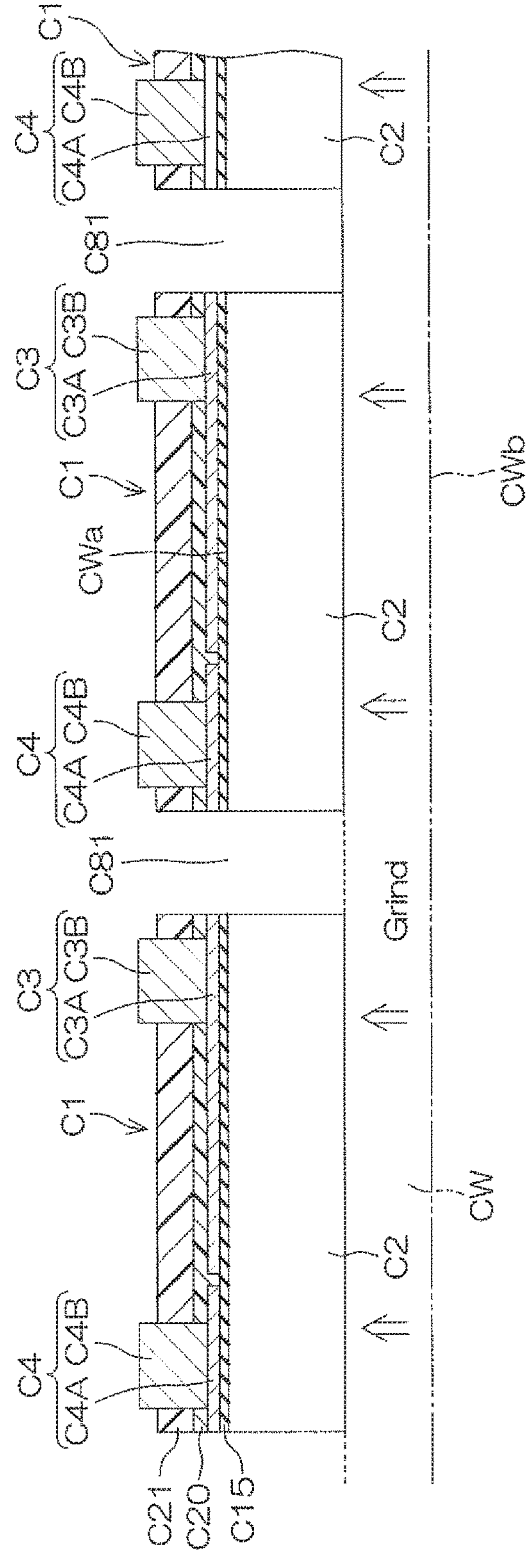
FIG. 52B is a sectional view of the arrangement in a step following that shown in FIG. 52A.
Figure 53:
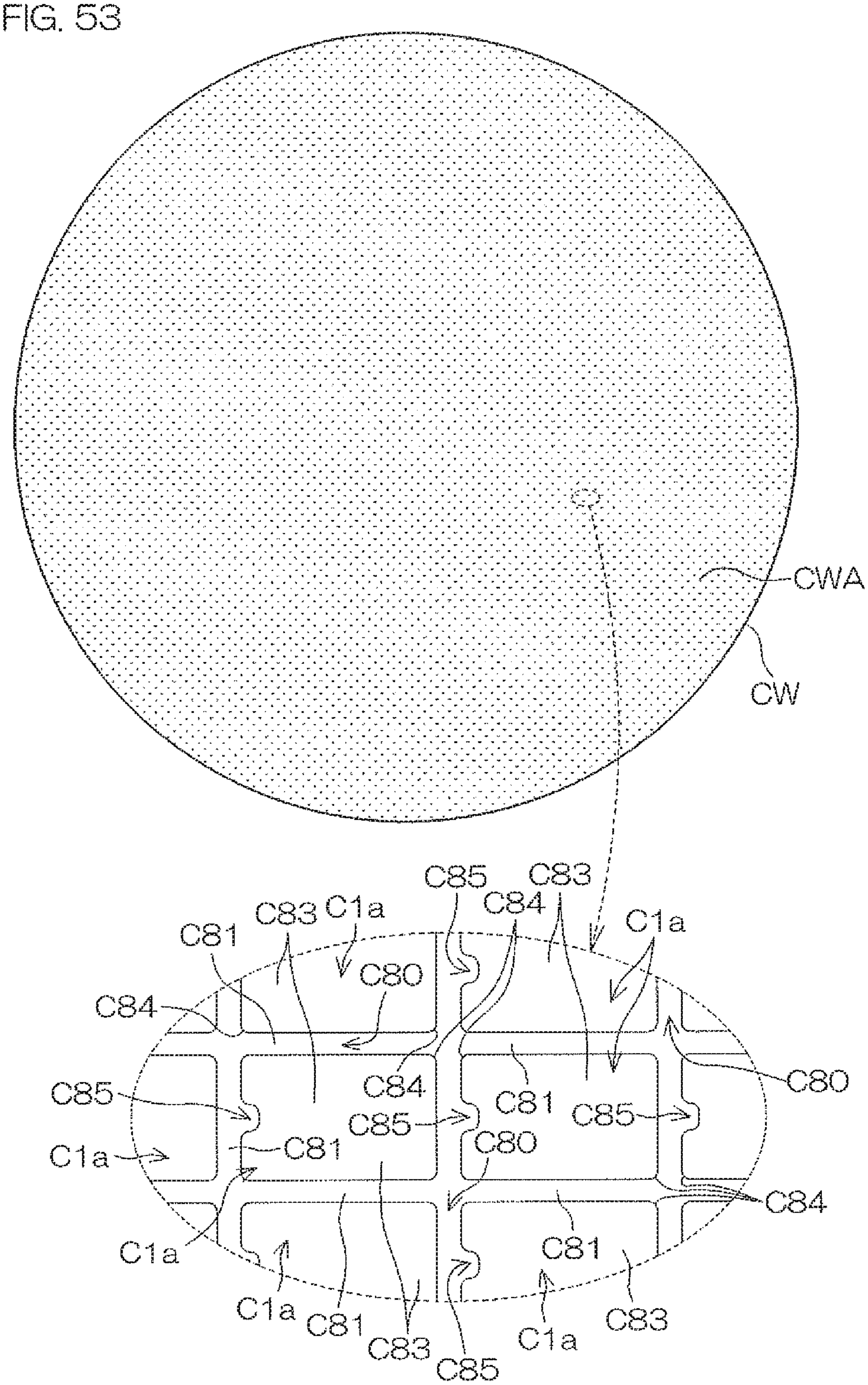
FIG. 53 is a plan view of a semiconductor wafer as a base substrate of the semiconductor substrate of the chip diode and shows a partial region in a magnified manner.

FIG. 51 is a process diagram for describing an example of a manufacturing process of the chip diode C1. Also, FIG. 52A and FIG. 52B are sectional views of the arrangement in the middle of the manufacturing process of FIG. 51 and show a section corresponding to FIG. 45. FIG. 53 is a plan view of a $p^+$ type semiconductor wafer CW as a base substrate of the semiconductor substrate C2 and shows a partial region in a magnified manner.

First, the $p^+$ type semiconductor wafer CW is prepared as the base substrate of the semiconductor substrate C2. A top surface of the semiconductor wafer CW is an element forming surface CWa and corresponds to the element forming surface C2*a* of the semiconductor substrate C2. A plurality of chip diode regions C1*a*, corresponding to a plurality of the chip diodes C1, are arrayed and set in a matrix on the element forming surface CWa. A boundary region C80 is provided between adjacent chip diode regions C1*a*. The boundary region C80 is a band-like region having a substantially fixed width and extends in two orthogonal directions to form a lattice. After performing necessary steps on the semiconductor wafer CW, the semiconductor wafer CW is cut apart along the boundary region C80 to obtain the plurality of chip diodes C1.

The steps executed on the semiconductor wafer CW are, for example, as follows. First, the insulating film C15 (with a thickness, for example, of 8000 Å to 8600 Å), which is a thermal oxide film or CVD oxide film, etc., is formed on the element forming surface CWa of the $p^+$ type semiconductor wafer CW (CS1) and a resist mask is formed on the insulating film C15 (CS2). Openings corresponding to the $n^+$ type regions C10 are then formed in the insulating film C15 by etching using the resist mask (CS3). Further, after peeling off the resist mask, an n-type impurity is introduced to top layer portions of the semiconductor wafer CW that are exposed from the openings formed in the insulating film C15 (CS4). The introduction of the n-type impurity may be performed by a step of depositing phosphorus as the n-type impurity on the top surface (so-called phosphorus deposition) or by implantation of n-type impurity ions (for example, phosphorus ions). Phosphorus deposition is a process of depositing phosphorus on the top surface of the semiconductor wafer CW exposed inside the openings in the insulating film C15 by conveying the semiconductor wafer CW into a diffusion furnace and performing heat treatment while making $POCl_3$ gas flow inside a diffusion passage. After thickening the insulating film C15 (thickening, for example, by approximately 1200 Å by CVD oxide film formation) as necessary (CS5), heat treatment (drive-in) for activation of the impurity ions introduced into the semiconductor wafer CW is performed (CS6). The $n^+$ type regions C10 are thereby formed on the top layer portion of the semiconductor wafer CW.

Thereafter, another resist mask having openings matching the contact holes C16 and C17 is formed on the insulating film C15 (CS7). The contact holes C16 and C17 are formed in the insulating film C15 by etching via the resist mask (CS8), and the resist mask is peeled off thereafter. An electrode film that constitutes the cathode electrode C3 and the anode electrode C4 is then formed on the insulating film C15, for example, by sputtering (CS9). In the present preferred embodiment, an electrode film (for example, of 10000 Å thickness), made of AlSi, is formed. Another resist mask having an opening pattern corresponding to the slit C18 is then formed on the electrode film (CS10) and the slit C18 is formed in the electrode film by etching (for example, reactive ion etching) via the resist mask (CS11). The width of the slit C18 may be approximately 3 μm. The electrode film is thereby separated into the cathode electrode film C3A and the anode electrode film C4A.

Then after peeling off the resist film, the passivation film C20, which is a nitride film, etc., is formed, for example, by the CVD method (CS12), and further, polyimide, etc., is applied to form the resin film C21 (CS13). For example, a polyimide imparted with photosensitivity is applied, and after exposing in a pattern corresponding to the pad openings C22 and C23, the polyimide film is developed (step CS14). The resin film C21 having openings corresponding to the pad openings C22 and C23 is thereby formed. Thereafter, heat treatment for curing the resin film is performed as necessary (CS15). The pad openings C22 and C23 are then formed in the passivation film C20 by performing dry etching (for example, reactive ion etching) using the resin film C21 as a mask (CS16). Thereafter, the external connection electrodes C3B and C4B are formed inside the pad openings C22 and C23 (CS17). The external connection electrodes C3B and C4B may be formed by plating (preferably, electroless plating).

Thereafter, a resist mask C83 (see FIG. 52A), having a lattice-shaped opening matching the boundary region C80 (see FIG. 53), is formed (CS18). Plasma etching is performed via the resist mask C83 and the semiconductor wafer CW is thereby etched to a predetermined depth from the element forming surface CWa as shown in FIG. 52A. A groove C81 for cutting is thereby formed along the boundary region C80 (CS19). After peeling off the resist mask C83, the semiconductor wafer CW is ground from the rear surface CWb until a bottom portion of the groove C81 is reached as shown in FIG. 52B (CS20). The plurality of chip diode regions C1*a* are thereby separated into individual pieces and the chip diodes C1 with the structure described above can thereby be obtained.

As shown in FIG. 53, the resist mask C83 arranged to form the groove C81 at the boundary region C80 has, at positions adjacent to the four corners of each chip diode regions C1*a*, round shaped portions C84 of curved shapes that are convex toward outer sides of the respective chip diode regions C1*a*. Each round shaped portion C84 is formed to connect two adjacent sides of the chip diode region C1*a* by a smooth curve. Further, the resist mask C83 arranged to form the groove C81 in the boundary region C80 has, at a position adjacent to one short side of each chip diode regions C1*a*, a recess C85 that is recessed toward an inner side of the chip diode regions C1*a*. Therefore, when the groove C81 is formed by plasma etching using the resist mask C83 as a mask, the groove C81 is to made to have, at positions adjacent to the four corners of each chip diode regions C1*a*, round shaped portions of curved shapes that are convex toward the outer sides of the chip diode region C1*a* and to have, at a position adjacent to one short side of each chip diode regions C1*a*, a recess that is recessed toward the inner side of the chip diode regions C1*a*. Therefore in the step of forming the groove C81 for cutting out the chip diode regions C1*a* from the semiconductor wafer CW, the corner portions C9 of the four corners can be shaped to round shapes and the recess C8 can be formed as the cathode mark in one short side (the short side at the cathode side) in each chip diode C1 at the same time. That is, the corner portions C9 can be processed to round shapes and the recess C8 can be formed as the cathode mark without adding a dedicated step.

With the present preferred embodiment, the semiconductor substrate C2 is constituted of the p-type semiconductor and therefore stable characteristics can be realized even if an epitaxial layer is not formed on the semiconductor substrate C2. That is, an n-type semiconductor wafer is large in in-plane variation of resistivity, and therefore when an n-type semiconductor wafer is used, an epitaxial layer with low in-plane variation of resistivity must be formed on the top surface and an impurity diffusion layer must be formed on the epitaxial layer to form the p-n junction. This is because an n-type impurity is low in segregation coefficient and therefore when an ingot (for example, a silicon ingot) that is to be the source of a semiconductor wafer is formed, a large difference in resistivity arises between a central portion and a peripheral edge portion of the wafer. On the other hand, a p-type impurity is comparatively high in segregation coefficient and therefore a p-type semiconductor wafer is low in in-plane variation of resistivity. Therefore by using a p-type semiconductor wafer, a diode with stable characteristics can be cut out from any location of the wafer without having to form an epitaxial layer. Therefore by using the $p^+$ type semiconductor substrate C2, the manufacturing process can be simplified and the manufacturing cost can be reduced.

Figure 54A:
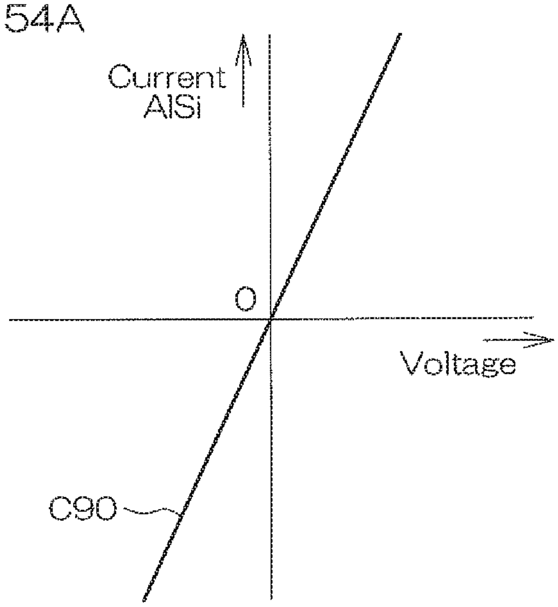
FIG. 54A and FIG. 54B are diagrams for describing the ohmic contact of an AlSi electrode film and a $p^+$ type semiconductor substrate.
Figure 54B:
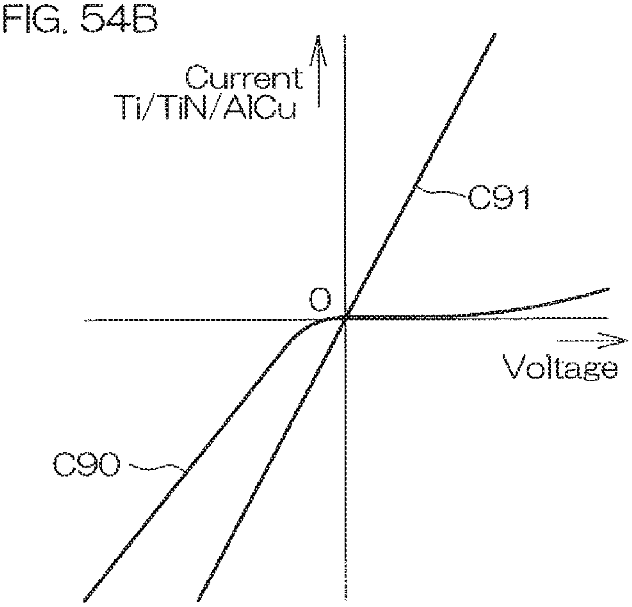

FIG. 54A and FIG. 54B are diagrams for describing the ohmic contact of an AlSi electrode film and a $p^+$ type semiconductor substrate. FIG. 54A shows current vs. voltage characteristics between a $p^+$ type silicon substrate and an AlSi film when the AlSi film is formed on the $p^+$ type silicon substrate. The current is proportional to the applied voltage and it can thus be understood that a satisfactory ohmic contact is formed. For comparison, a curve C90 in FIG. 54B shows the same characteristics in a case where the electrode film formed on the $p^+$ type silicon substrate is arranged as a laminated film in which a Ti film, a TiN film, and an AlCu film are laminated successively from the substrate top surface. The current vs. voltage characteristics are not linear characteristics and it can thus be understood that an ohmic contact is not obtained. On the other hand, a curve C91 shows the current vs. voltage characteristics in a case where a high concentration region is formed by introducing a p-type impurity to a higher concentration in the top surface of a $p^+$ type silicon substrate and an electrode film, constituted of a laminated film formed by laminating a Ti film, a TiN film, and an AlCu film successively on the substrate top surface, is put in contact with the high concentration region. In this case, the current vs. voltage characteristics are linear characteristics and it can thus be understood that a satisfactory ohmic contact is obtained. From the above, it can be understood that by using an AlSi film as the electrode film, a cathode electrode film and an anode electrode film that are in ohmic contact with the $p^+$ type silicon substrate can be formed without having to form a high concentration region in the $p^+$ type semiconductor substrate and the manufacturing process can thereby be simplified.

Figure 55:
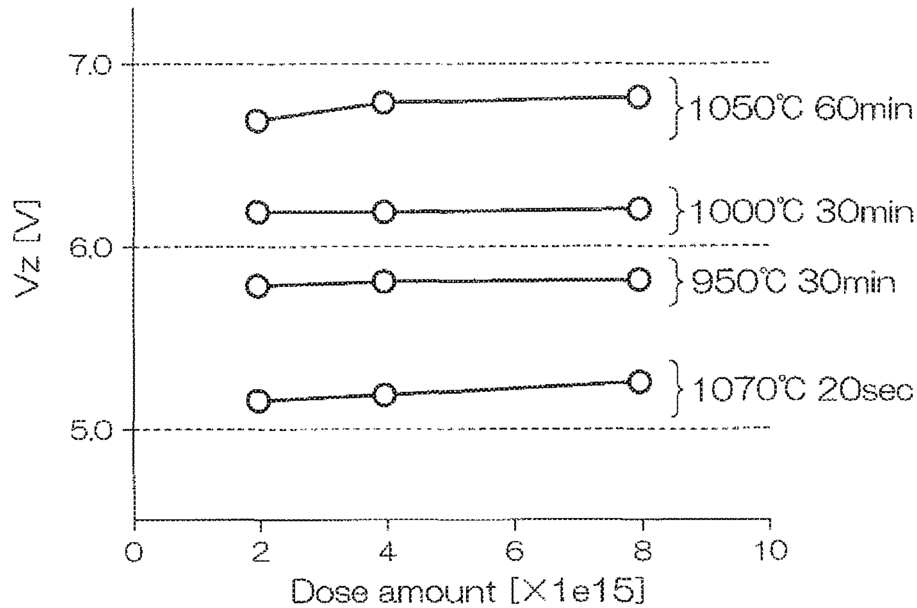
FIG. 55 is a diagram for describing a feature related to adjustment of a Zener voltage (Vz) of the chip diode.

FIG. 55 is a diagram for describing a feature related to adjustment of a Zener voltage (Vz) of the chip diode C1. That is, the features concerning Zener voltage adjustment in a case where the chip diode C1 is arranged as a Zener diode are shown. To describe more specifically, after introducing an n-type impurity (for example, phosphorus) in the top layer portion of the semiconductor substrate C2 to form the $n^+$ type regions C10, the heat treatment (drive-in) for activating the introduced impurity is performed. The Zener voltage changes in accordance with the temperature and duration of the heat treatment. Specifically, the Zener voltage tends to increase with increase in the amount of heat applied to the semiconductor substrate C2 during the heat treatment. The Zener voltage can be adjusted using this tendency. As can be understood from FIG. 55, the Zener voltage is more strongly dependent on the heat amount during the heat treatment than the impurity dose amount.

Figure 56:
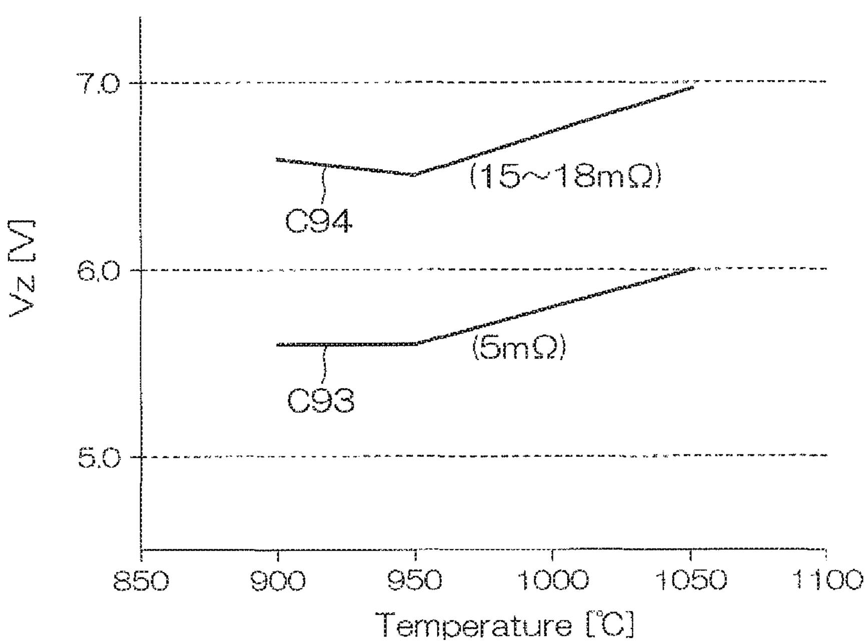
FIG. 56 is a diagram for describing another feature related to the adjustment of the Zener voltage (Vz).

FIG. 56 is a diagram for describing another feature related to the adjustment of the Zener voltage (Vz). Specifically, changes of the Zener voltage with respect to the temperature during the heat treatment for activating the n-type impurity introduced into the semiconductor substrate C2 are shown, with a curve C93 showing the Zener voltage in a case of using a semiconductor substrate with a comparatively low resistivity (for example, 5 mΩ) and a curve C94 showing the Zener voltage in a case of using a semiconductor substrate with a comparatively high resistivity (for example, 15 to 18 mΩ). From a comparison of the curves C93 and C94, it can be understood that the Zener voltage is dependent on the resistivity of the semiconductor substrate. The Zener voltage can thus be adjusted to a design value by applying a semiconductor substrate with a resistivity that is appropriate in accordance with the targeted Zener voltage.

Figure 57:
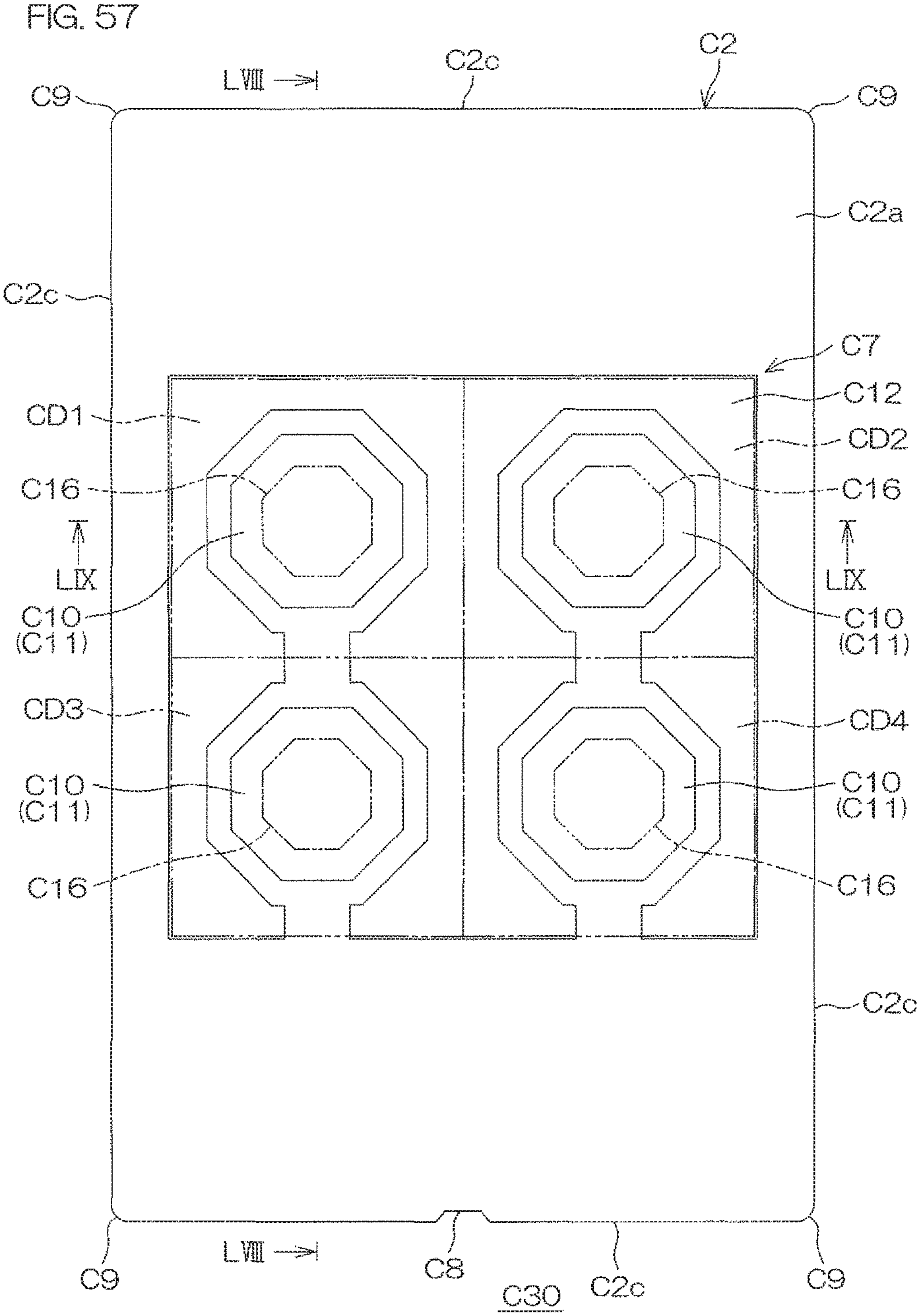
FIG. 57 is an illustrative plan view of a chip diode according to a second preferred embodiment of the fourth invention.
Figure 58:
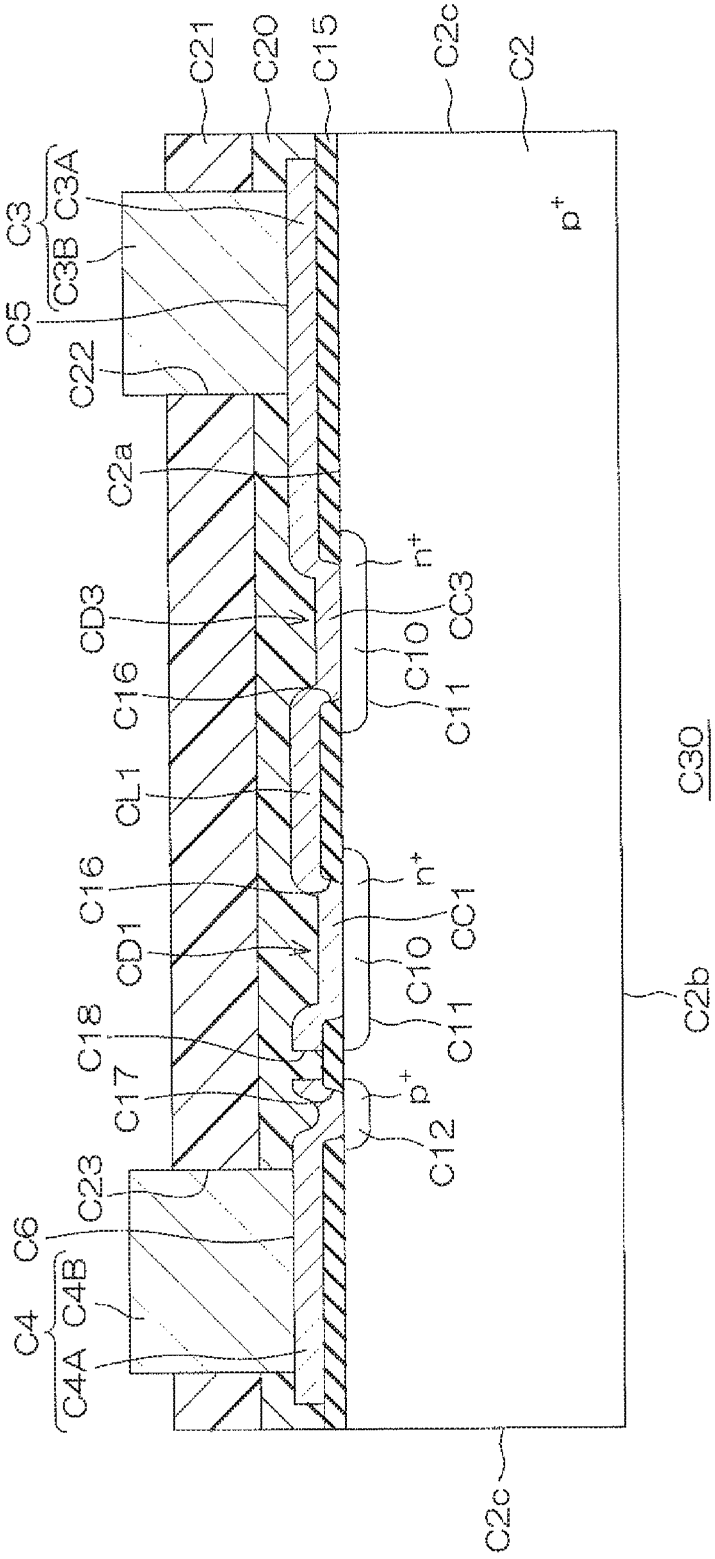
FIG. 58 is a sectional view taken along line LVIII-LVIII in FIG. 57.
Figure 59:
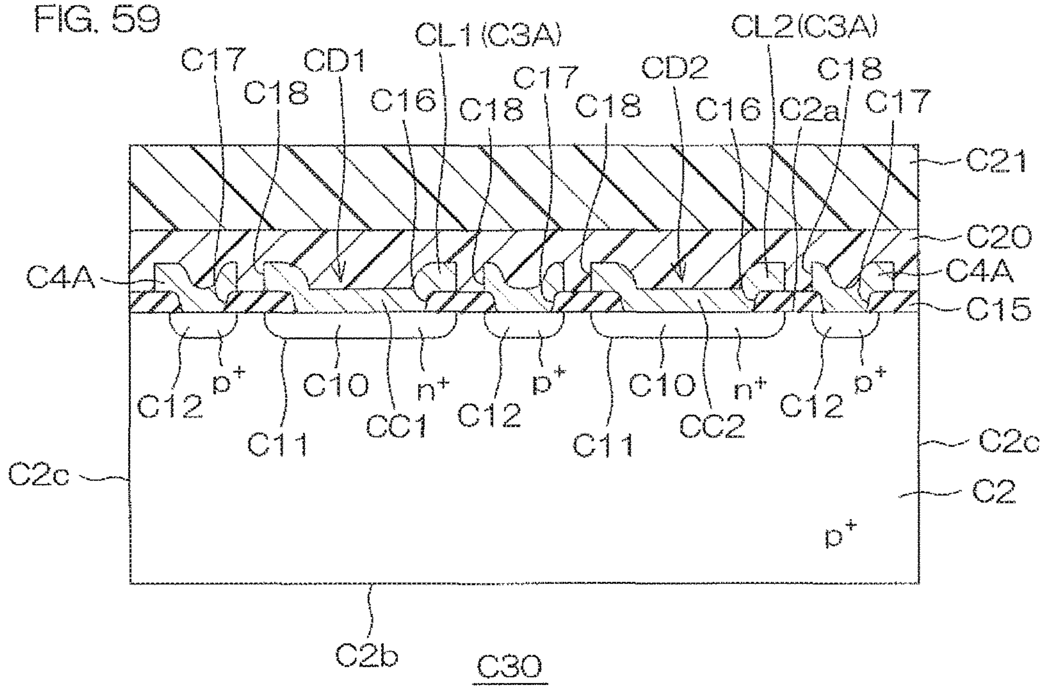
FIG. 59 is a sectional view taken along line LIX-LIX in FIG. 57.

FIG. 57 is an illustrative plan view of a chip diode C30 according to a second preferred embodiment of the fourth invention. The outer appearance and electrode configuration of the chip diode C30 are substantially the same as those of the first preferred embodiment described above and are as shown in FIG. 43 and FIG. 44. As in FIG. 47 described above, the arrangement appearing on the element forming surface C2*a* of the semiconductor substrate C2 is shown in FIG. 57. FIG. 58 is a sectional view taken along line LVIII-LVIII in FIG. 57, and FIG. 59 is a sectional view taken along line LIX-LIX in FIG. 57. In FIG. 57 to FIG. 59, portions corresponding to the respective portions of the first preferred embodiment shown in FIG. 43 and FIG. 44 of the above description are provided with the same reference symbols. FIG. 43 and FIG. 44 shall also be referenced.

In the present preferred embodiment, in a top layer region of the semiconductor substrate C2, a $p^+$ type region C12 is formed in a state of being separated from the $n^+$ type regions C10 across a predetermined interval. In the diode cell region C7, the $p^+$ type region C12 is formed to a pattern that avoids the $n^+$ type regions C10. In the present preferred embodiment, an electrode film other than an AlSi film, for example, a Ti/Al laminated film having a Ti film as a lower layer and an Al film as an upper layer or a Ti/TiN/Al laminated film having a Ti film (with a thickness, for example, of 300 to 400 Å), a TiN film (with a thickness, for example, of approximately 1000 Å), and an AlCu film (with a thickness, for example, of approximately 30000 Å) laminated successively from the substrate C2 side, etc., is applied as each of the cathode electrode film C3A and the anode electrode film C4A. The anode electrode film C4A extends to inner sides of the contact holes C17 from the top surface of the insulating film C15 and is in ohmic contact with the $p^+$ type region C12 inside the contact holes C17. As can be understood from FIG. 54B (curve C91) that was referenced for the first preferred embodiment, an ohmic contact between the anode electrode film C4A and the $p^+$ type region C12 can be formed to electrically connect the anode electrode film C4A and the semiconductor substrate C2 with such an arrangement as well.

Figure 60:
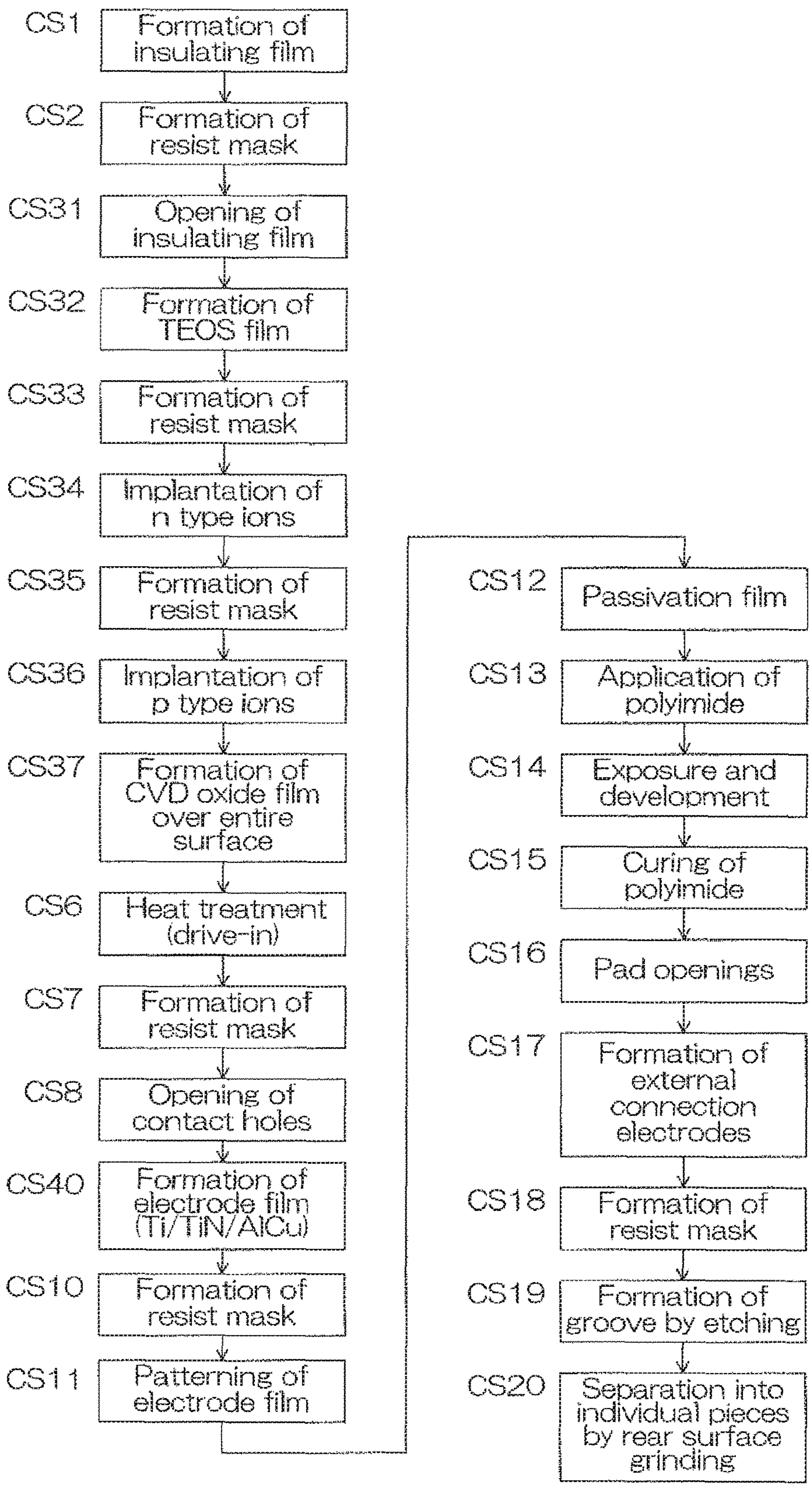
FIG. 60 is a process diagram for describing an example of a manufacturing process of the chip diode according to the second preferred embodiment of the fourth invention.

FIG. 60 is a process diagram for describing an example of a manufacturing process of the chip diode C30. Also, FIG. 61A to FIG. 61D are sectional views of the arrangements in the middle of the manufacturing process of FIG. 60. In FIG. 60, steps that are the same as the respective steps shown in FIG. 51 in the above description are provided with the same reference symbols and redundant description shall be omitted.

Figure 61A:
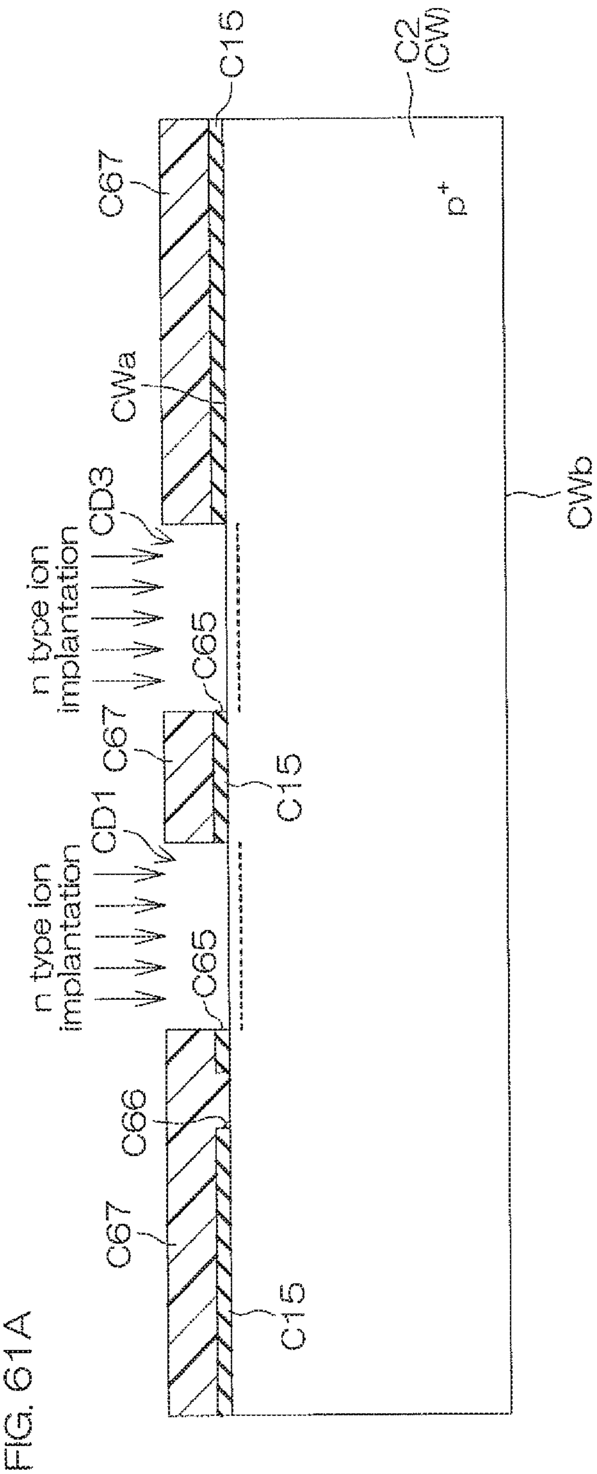
FIG. 61A is a sectional view of the arrangement in the middle of the manufacturing process of FIG. 60.
Figure 61B:
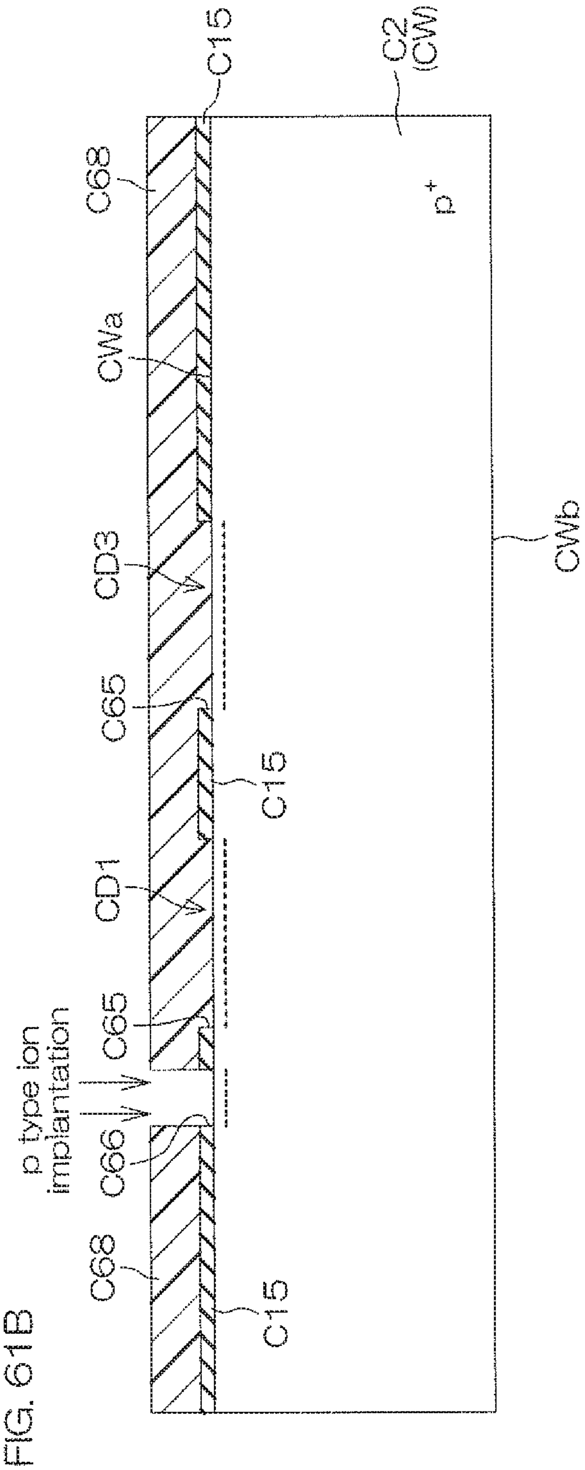
FIG. 61B is a sectional view of the arrangement in the middle of the manufacturing process of FIG. 60 and shows the arrangement in a step following that shown in FIG. 61A.
Figure 61C:
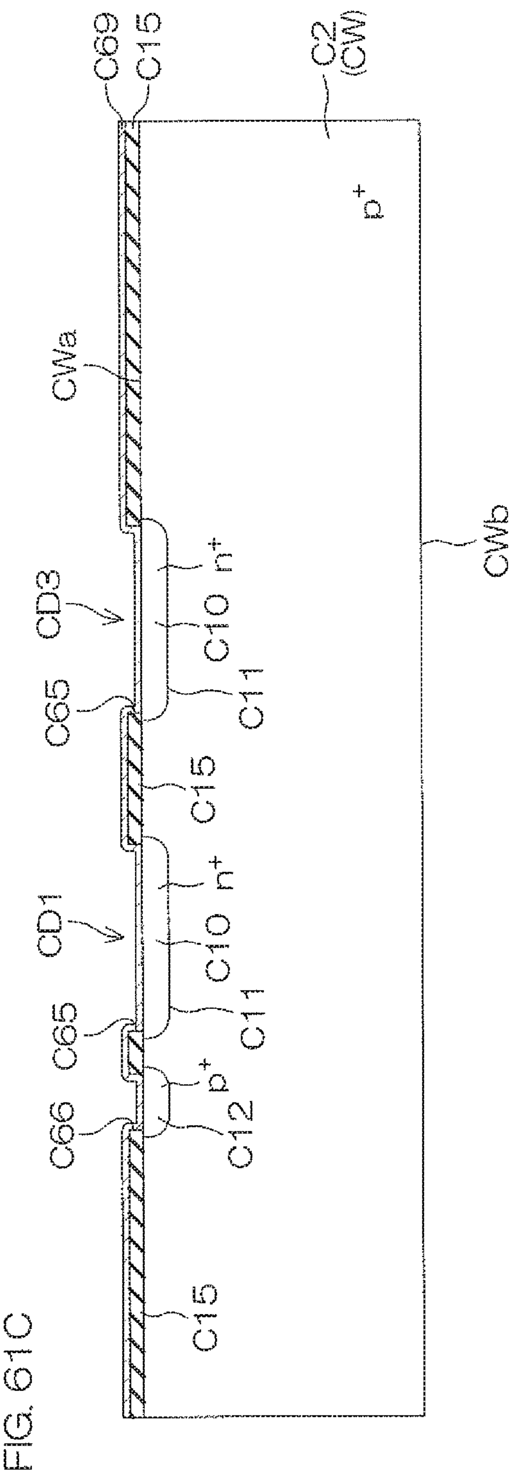
FIG. 61C is a sectional view of the arrangement in the middle of the manufacturing process of FIG. 60 and shows the arrangement in a step following that shown in FIG. 61B.
Figure 61D:
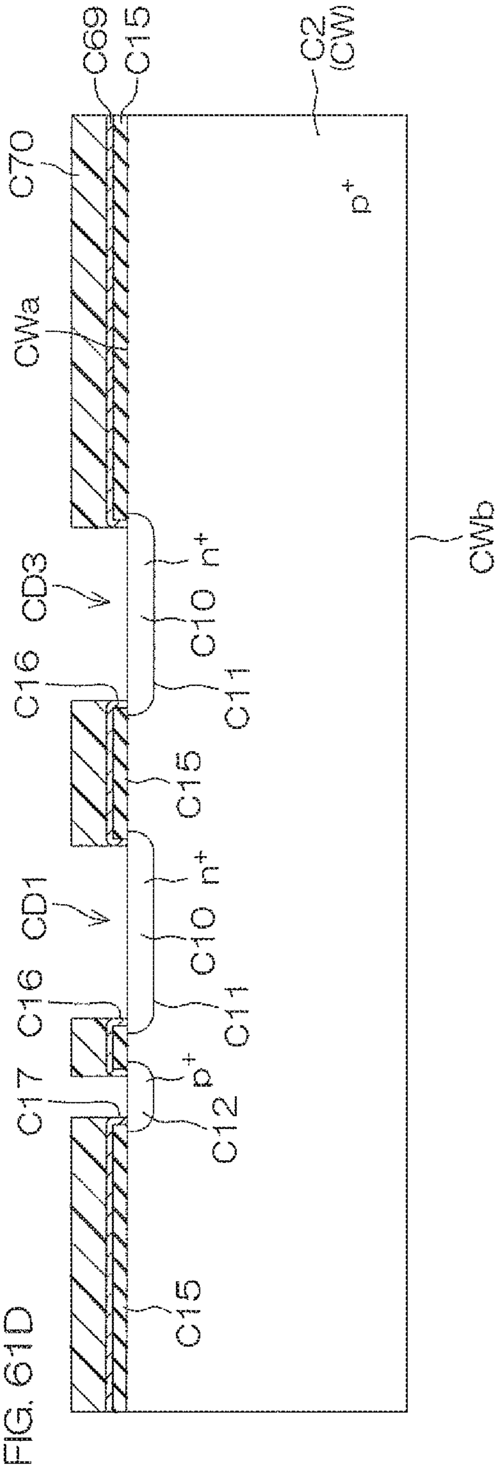
FIG. 61D is a sectional view of the arrangement in the middle of the manufacturing process of FIG. 60 and shows the arrangement in a step following that shown in FIG. 61C.

First, the insulating film C15 (with a thickness, for example, of 8000 Å), which is a thermal oxide film or CVD oxide film, etc., is formed on the element forming surface CWa of the $p^+$ type semiconductor wafer CW (CS1) and a resist mask is formed on the insulating film C15 (CS2). Openings C65 and C66 corresponding to the $n^+$ type regions C10 and the $p^+$ type region C12 are then formed in the insulating film C15 by etching using the resist mask as shown in FIG. 61A (CS31). Further, after peeling off the resist mask, an oxide film (for example, a TEOS film (a silicon oxide film formed by a reaction of tetraethoxysilane and oxygen)), arranged to suppress damage due to ion implantation, is formed as necessary on the entire surface (CS32). Another resist mask C67 is then formed (CS33). The resist mask C67 has openings corresponding to the $n^+$ type regions C10 and covers the region in which the $p^+$ type region C12 is to be formed. n-type impurity ions (for example, phosphorus ions) are implanted into the semiconductor wafer CW via the resist mask C67 (CS34). The resist mask C67 is then peeled off, and another resist mask C68 is formed as shown in FIG. 61B (CS35). The resist mask C68 has an opening corresponding to the $p^+$ type region C12 and covers the regions in which the $n^+$ type regions C10 are to be formed. p-type impurity ions (for example, boron ions) are implanted into the semiconductor wafer CW via the resist mask C68 (CS36). The resist mask C68 is then peeled off, and a CVD oxide film C69 that covers the entire surface of the semiconductor wafer CW is formed as shown in FIG. 61C (CS37). The thickness of the CVD oxide film C69 is preferably not less than 600 Å and more preferably not less than 1200 Å. The CVD oxide film C69 thickens the insulating film C15 and becomes a portion of the insulating film C15 and further covers the element forming surface CWa of the semiconductor wafer CW at the openings C65 and C66 in the insulating film C15. In this state, the heat treatment (drive-in) for activation of the impurity ions introduced into the semiconductor wafer CW is performed (CS6). The n-type impurity ions and the p-type impurity ions implanted into the semiconductor wafer CW are thereby activated respectively to form the $n^+$ type regions C10 and the $p^+$ type region C12. Then as shown in FIG. 61D, yet another resist mask C70 having openings matching the contact holes C16 and C17 is formed on the insulating film C15 (CS7). The contact holes C16 and C17 are formed in the insulating film C15 by etching via the resist mask C70 (CS8), and the resist mask C70 is peeled off thereafter (CS9).

An electrode film that constitutes the cathode electrode C3 and the anode electrode C4 is then formed on the insulating film C15, for example, by sputtering (CS40). In the present preferred embodiment, a Ti film, a TiN film, and an AlCu film are sputtered successively to form an electrode film constituted of the resulting laminated film. Another resist mask having an opening pattern corresponding to the slit C18 is then formed on the electrode film (CS10) and the slit C18 is formed in the electrode film by etching (for example, reactive ion etching) via the resist mask (CS11). The electrode film is thereby separated into the cathode electrode film C3A and the anode electrode film C4A.

The steps subsequent to the above are the same as those of the first preferred embodiment. In the present manufacturing process, the entire wafer surface is covered by the CVD oxide film C69 before the heat treatment (drive-in) for activating the impurity introduced into the semiconductor wafer CW. Phosphorus, which is the $n^+$ type impurity, is thereby prevented from diffusing into the atmosphere and entering into the $p^+$ type region C12. Obstruction of the ohmic contact between the $p^+$ type region C12 and the anode electrode film C4A due to the n-type impurity can thereby be avoided to enable a satisfactory ohmic contact to be obtained between the $p^+$ type region C12 and the anode electrode film C4A. The chip diode C30 with excellent characteristics can thereby be provided.

Figure 62:
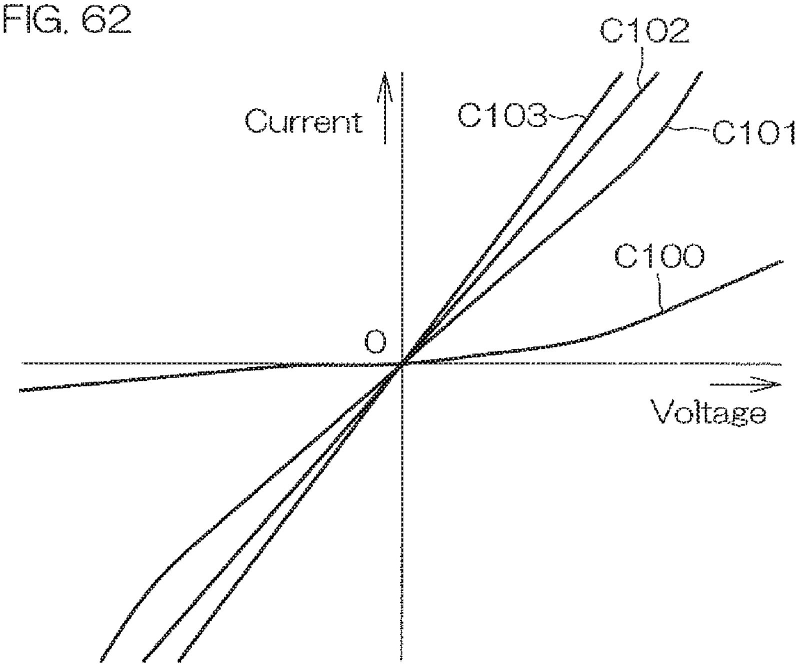
FIG. 62 is a diagram for describing the effect of forming a CVD oxide film before heat treatment for activation of an impurity and shows the current vs. voltage characteristics between the semiconductor substrate and an anode electrode film.

FIG. 62 is a diagram for describing the effect of forming the CVD oxide film C69 and shows the current vs. voltage characteristics between the $p^+$ type semiconductor substrate C2 and the anode electrode film C4A. A curve C100 shows the characteristics in a case where the CVD oxide film C69 is not formed and it can be understood that the change of current with respect to the change of voltage is dull and a satisfactory ohmic contact is not obtained. This is considered to have been caused by phosphorus, which is the n-type impurity, diffusing into the atmosphere and entering the $p^+$ type region C12 during the heat treatment for activating the impurity and the ohmic contact between the $p^+$ type region C12 and the anode electrode film C4A being obstructed by the n-type impurity. Curves C101, C102, and C103 respectively show characteristics in cases where the film thickness of the CVD oxide film C69 is set to 600 Å, 1200 Å, and 4800 Å. From a comparison of the curve C100 and the curves C101, C102, and C103, it can be understood that the current vs. voltage characteristics can be improved significantly by providing the CVD oxide film C69 before the heat treatment for activating the impurity. It can be understood that a current variation of high linearity with respect to the change of voltage is obtained and a satisfactory ohmic contact can be realized especially when the film thickness of the CVD oxide film C69 is made not less than 1200 Å.

Figure 63:
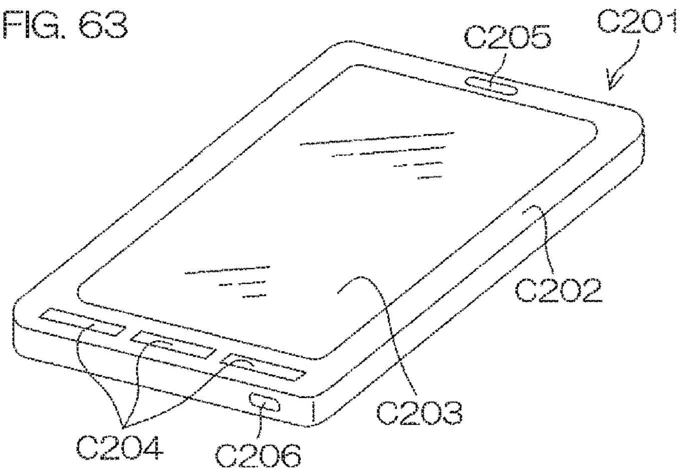
FIG. 63 is a perspective view of an outer appearance of a smartphone that is an example of an electronic equipment in which the chip diode is used.

FIG. 63 is a perspective view of an outer appearance of a smartphone that is an example of an electronic equipment in which the chip diode is used. The smartphone C201 is arranged by housing electronic parts in the interior of a casing C202 with a flat rectangular parallelepiped shape. The casing C202 has a pair of principal surfaces at its front side and rear side, and the pair of principal surfaces are joined by four side surfaces. A display surface of a display panel C203, constituted of a liquid crystal panel or an organic EL panel, etc., is exposed at one of the principal surfaces of the casing C202. The display surface of the display panel C203 constitutes a touch panel and provides an input interface for a user.

The display panel C203 is formed to an oblong shape that occupies most of one of the principal surfaces of the casing C202. Operation buttons C204 are disposed along one short side of the display panel C203. In the present preferred embodiment, a plurality (three) of the operation buttons C204 are aligned along the short side of the display panel C203. The user can call and execute necessary functions by performing operations of the smartphone C210 by operating the operation buttons C204 and the touch panel.

A speaker C205 is disposed in a vicinity of the other short side of the display panel C203. The speaker C205 provides an earpiece for a telephone function and is also used as an acoustic conversion unit for reproducing music data, etc. On the other hand, close to the operation buttons C204, a microphone C206 is disposed at one of the side surfaces of the casing C202. The microphone 206 provides a mouthpiece for the telephone function and may also be used as a microphone for sound recording.

Figure 64:
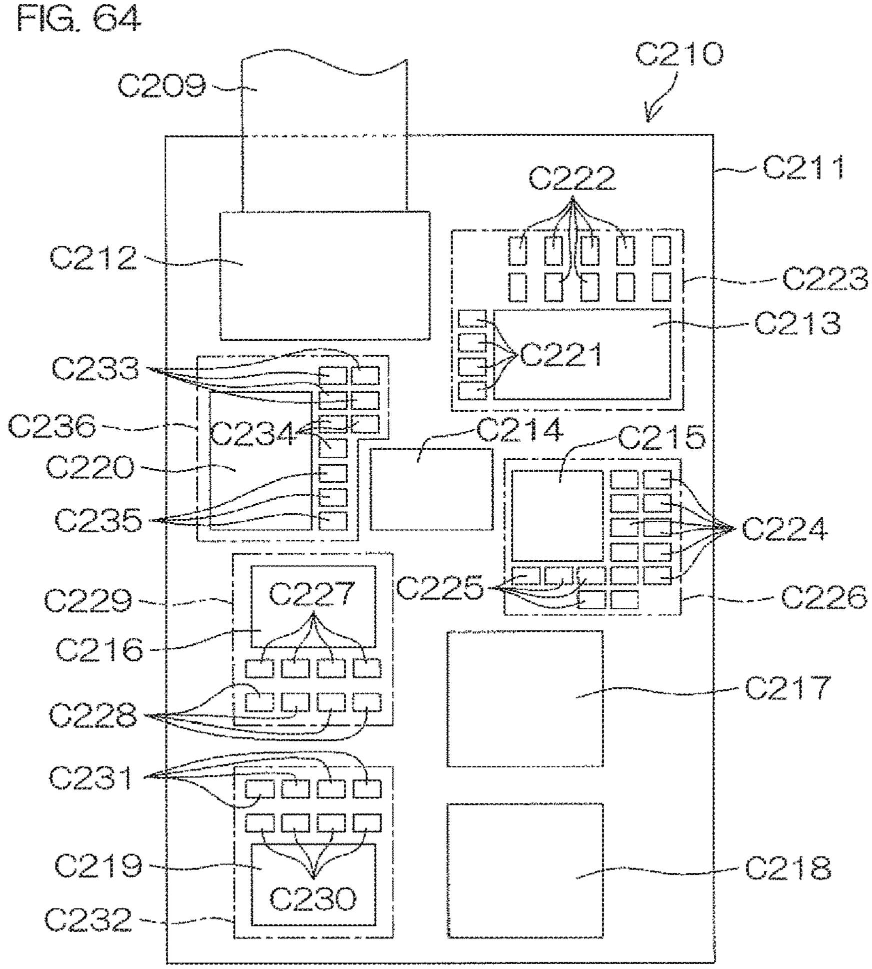
FIG. 64 is an illustrative plan view of the arrangement of an electronic circuit assembly housed in a housing of the smartphone.

FIG. 64 is an illustrative plan view of the arrangement of an electronic circuit assembly C210 housed in the interior of the housing C202. The electronic circuit assembly C210 includes a wiring substrate C211 and circuit parts mounted on a mounting surface of the wiring substrate C211. The plurality of circuit parts include a plurality of integrated circuit elements (ICs) C212 to C220 and a plurality of chip parts. The plurality of ICs include a transmission processing IC C212, a one-segment TV receiving IC C213, a GPS receiving IC C214, an FM tuner IC C215, a power supply IC C216, a flash memory C217, a microcomputer C218, a power supply IC C219, and a baseband IC C220. The plurality of chip parts include chip inductors C221, C225, and C235, chip resistors C222, C224, and C233, chip capacitors C227, C230, and C234, and chip diodes C228 and C231. The chip parts are mounted on the mounting surface of the wiring substrate C211, for example, by flip-chip bonding. The chip diodes according to any of the preferred embodiments described above may be applied as the chip diodes C228 and C231.

The transmission processing IC C212 has incorporated therein an electronic circuit arranged to generate display control signals for the display panel C203 and receive input signals from the touch panel on the top surface of the display panel C203. For connection with the display panel C203, the transmission processing IC C212 is connected to a flexible wiring C209. The one-segment TV receiving IC C213 incorporates an electronic circuit that constitutes a receiver for receiving one-segment broadcast (terrestrial digital television broadcast targeted for reception by portable equipment) radio waves. A plurality of the chip inductors C221 and a plurality of the chip resistors C222 are disposed in a vicinity of the one-segment TV receiving IC C213. The one-segment TV receiving IC C213, the chip inductors C221, and the chip resistors C222 constitute a one-segment broadcast receiving circuit C223. The chip inductors C221 and the chip resistors C222 respectively have accurately adjusted inductances and resistances and provide circuit constants of high precision to the one-segment broadcast receiving circuit C223.

The GPS receiving IC C214 incorporates an electronic circuit that receives radio waves from GPS satellites and outputs positional information of the smartphone C201. The FM tuner IC C215 constitutes, together with a plurality of the chip resistors C224 and a plurality of the chip inductors C225 mounted on the wiring substrate C211 in a vicinity thereof, an FM broadcast receiving circuit C226. The chip resistors C224 and the chip inductors C225 respectively have accurately adjusted resistances and inductances and provide circuit constants of high precision to the FM broadcast receiving circuit C226.

A plurality of the chip capacitors C227 and a plurality of the chip diodes C228 are mounted on the mounting surface of the wiring substrate C211 in a vicinity of the power supply IC C216. Together with the chip capacitors C227 and the chip diodes C228, the power supply IC C216 constitutes a power supply circuit C229. The flash memory C217 is a storage device for recording operating system programs, data generated in the interior of the smartphone C201, and data and programs acquired from the exterior by communication functions, etc.

The microcomputer C218 is a computing processing circuit that incorporates a CPU, a ROM, and a RAM and realizes a plurality of functions of the smartphone C201 by executing various computational processes. More specifically, computational processes for image processing and various application programs are realized by actions of the microcomputer C218. A plurality of the chip capacitors C230 and a plurality of the chip diodes C231 are mounted on the mounting surface of the wiring substrate C211 in a vicinity of the power supply IC C219. Together with the chip capacitors C230 and the chip diodes C231, the power supply IC C219 constitutes a power supply circuit C232.

A plurality of the chip resistors C233, a plurality of the chip capacitors C234, and a plurality of the chip inductors C235 are mounted on the mounting surface of the wiring substrate C211 in a vicinity of the baseband IC C220. Together with the chip resistors C233, the chip capacitors C234, and the chip inductors C235, the baseband IC C220 constitutes a baseband communication circuit C236. The baseband communication circuit C236 provides communication functions for telephone communication and data communication.

With the above arrangement, electric power that is appropriately adjusted by the power supply circuits C229 and C232 is supplied to the transmission processing IC C212, the GPS receiving IC C214, the one-segment broadcast receiving circuit C223, the FM broadcast receiving circuit C226, the baseband communication circuit C236, the flash memory C217, and the microcomputer C218. The microcomputer C218 performs computational processes in response to input signals input via the transmission processing IC C212 and makes the display control signals be output from the transmission processing IC C212 to the display panel C203 to make the display panel C203 perform various displays.

When receiving of a one-segment broadcast is commanded by operation of the touch panel or the operation buttons C204, the one-segment broadcast is received by actions of the one-segment broadcast receiving circuit C223. Computational processes for outputting the received images to the display panel C203 and making the received audio signals be acoustically converted by the speaker C205 are executed by the microcomputer C218. Also, when positional information of the smartphone C201 is required, the microcomputer C218 acquires the positional information output by the GPS receiving IC C214 and executes computational processes using the positional information.

Further, when an FM broadcast receiving command is input by operation of the touch panel or the operation buttons C204, the microcomputer C218 starts up the FM broadcast receiving circuit C226 and executes computational processes for outputting the received audio signals from the speaker C205. The flash memory C217 is used for storing data acquired by communication and storing data prepared by computations by the microcomputer C218 and inputs from the touch panel. The microcomputer C218 writes data into the flash memory C217 or reads data from the flash memory C217 as necessary.

The telephone communication or data communication functions are realized by the baseband communication circuit C236. The microcomputer C218 controls the baseband communication circuit C236 to perform processes for sending and receiving audio signals or data.

Although preferred embodiments of the fourth invention have been described above, the fourth invention may be implemented in yet other modes as well. For example, although with the first and second preferred embodiments described above, examples where four diode cells are formed on the semiconductor substrate were described, two or three diode cells may be formed or not less than four diode cells may be formed on the semiconductor substrate.

Also, although with the preferred embodiments, examples where the p-n junction regions are respectively formed to a regular octagon in a plan view were described, the p-n junction regions may be formed to any polygonal shape with the number of sides being not less than three, and the planar shapes of the regions may be circular or elliptical. If the shape of the p-n junction regions is to be made a polygonal shape, the shape does not have to be a regular polygonal shape and the respective regions may be formed to a polygon with two or more types of side length. Yet further, there is no need to form the p-n junction regions to the same size and a plurality of diode cells respectively having junction regions of different sizes may be mixed on the semiconductor substrate. Yet further, the shape of the p-n junction regions formed on the semiconductor substrate does not have to be of one type, and p-n junction regions with two or more types of shape may be mixed on the semiconductor substrate.

[5] Fifth Invention

With the arrangement of Patent Document 1 (Japanese Unexamined Patent Publication No. 2002-270858), the anode electrode is embedded in the insulating film and the exposed upper surface of the anode electrode is used for external connection. Specifically, a bonding wire is bonded to the upper surface of the anode electrode to achieve external connection of the diode element.

However, the anode electrode is embedded in the insulating film and the p-n junction is positioned directly below it. The physical stress applied to the anode electrode in the process of external connection is thus transmitted to the p-n junction and the p-n junction may become destroyed or the element characteristics may vary. Therefore the reliability of the diode element after mounting is not necessarily satisfactory.

An object of the fifth invention is to provide a chip diode that is improved in reliability.

The fifth invention further provides a circuit assembly including the chip diode and an electronic equipment including such a circuit assembly. The fifth invention has the following features.

D1. A chip diode including a p-type semiconductor substrate, an n-type diffusion layer formed on the p-type semiconductor substrate and forming a p-n junction region with the p-type semiconductor substrate, an insulating film covering a principal surface of the p-type semiconductor substrate and having a cathode contact hole exposing the n-type diffusion layer, a cathode electrode having a cathode lead-out electrode contacting the n-type diffusion layer via the cathode contact hole and led out onto the insulating film in a region outside the cathode contact hole and a cathode external connection portion connected to the cathode lead-out electrode and disposed on the insulating film in the region outside the cathode contact hole, and an anode electrode having an AlSi electrode film contacting the p-type semiconductor substrate.

With the present arrangement, the insulating film is formed on the p-type semiconductor substrate and the cathode lead-out electrode is connected to the n-type diffusion layer via the cathode contact hole formed in the insulating film. The cathode external connection portion is disposed on the insulating film in the region outside the cathode contact hole. The cathode external connection portion can thereby be disposed so as to avoid a position directly above the p-n junction region, and application of a large impact to the p-n junction region can thus be avoided during mounting of the chip diode on a mounting substrate or during connection of a bonding wire to the cathode external connection portion. Destruction of the p-n junction region can thereby be avoided, and a chip diode that is excellent in durability against external forces and therefore improved in reliability can be realized.

Further with the present invention, the anode electrode has the AlSi electrode film that contacts the p-type semiconductor substrate. AlSi is close in work function to a p-type semiconductor (especially a p-type silicon semiconductor). An AlSi electrode film can thus form a satisfactory ohmic junction with the p-type semiconductor substrate. There is thus no need to form a high impurity concentration diffusion layer for ohmic junction on the p-type semiconductor substrate. The manufacturing process can thereby be simplified and the productivity and the production cost can be reduced accordingly.

Further with the present invention, the semiconductor substrate is constituted of the p-type semiconductor substrate and therefore stable characteristics can be realized even if an epitaxial layer is not formed on the semiconductor substrate. That is, an n-type semiconductor wafer is large in in-plane variation of resistivity, and therefore an epitaxial layer with low in-plane variation of resistivity must be formed on the top surface and an impurity diffusion layer must be formed on the epitaxial layer to form the p-n junction. On the other hand, a p-type semiconductor wafer is low in in-plane variation and a diode with stable characteristics can be cut out from any location of the wafer without having to form an epitaxial layer. Therefore by using the p-type semiconductor substrate, the manufacturing process can be simplified and the manufacturing cost can be reduced.

D2. The chip diode according to "D1.," where the AlSi electrode film directly contacts the p-type semiconductor substrate to form an ohmic junction without intervention of a $p^+$ type region (a region containing a p-type impurity at a higher concentration than the p-type semiconductor substrate).

D3. The chip diode according to "D1" or "D2.," where the p-type semiconductor substrate is a p-type silicon semiconductor substrate. The reason why such an arrangement is favorable is that the work functions of AlSi and the p-type silicon semiconductor are close to each other as mentioned above.

D4. The chip diode according to any one of "D1." to "D3.," where the insulating film further has an anode contact hole exposing the p-type semiconductor substrate and the AlSi electrode film contacts the p-type semiconductor substrate via the anode contact hole. In this case, the AlSi electrode film may constitute an anode lead-out electrode that is led out onto the insulating film in a region outside the anode contact hole. Also, the anode electrode preferably has an anode external connection portion connected to the anode lead-out electrode and disposed on the insulating film in the region outside the anode contact hole. The anode external connection portion can thereby also be disposed so as to avoid a position directly above the p-n junction region, and application of a large impact to the p-n junction region can thus be avoided during mounting of the chip diode on a mounting substrate or during connection of a bonding wire to the anode external connection portion. A chip diode that is further improved in reliability can thereby be realized.

D5. The chip diode according to any one of “D1.” to “D4.,” where a plurality of the n-type diffusion layers are formed on the p-type semiconductor substrate in individually separated states to constitute a plurality of diode cells that respectively form the p-n junction region individually, and the cathode lead-out electrode includes a plurality of cell connection portions respectively connected to the n-type diffusion layers of the plurality of diode cells.

With this arrangement, the plurality of diode cells are formed on the p-type semiconductor substrate. The cathode lead-out electrode has the plurality of cell connection portions respectively connected to the n-type diffusion layers of the plurality of diode cells. The plurality of diode cells are thereby connected in parallel between the cathode electrode and the anode electrode. The ESD tolerance can thereby be improved, and in particular, both reduction of the chip size and securing of the ESD tolerance can be achieved at the same time. More specifically, the p-n junction regions that are separated according to each diode cell are formed and these are connected in parallel. By an individual p-n junction region being formed in each of the plurality of diode cells, a peripheral length of the p-n junction regions on the semiconductor substrate can be made long. Concentration of electric field is thereby relaxed and the ESD tolerance can be improved. That is, a sufficient ESD tolerance can be secured even if the chip size is reduced. The peripheral length of the p-n junction regions is the total of the lengths of the peripheries of the p-n junction regions at the top surface of the semiconductor substrate. More specifically, the peripheral length of the p-n junction regions is the total extension of the boundary lines between p-type regions and n-type regions at the top surface of the semiconductor substrate.

D6. The chip diode according to “D5.,” where the plurality of diode cells are arrayed two-dimensionally on the p-type semiconductor substrate. With this arrangement, the ESD tolerance can be improved further by the plurality of diode cells being arrayed two-dimensionally (preferably arrayed two-dimensionally at equal intervals). The p-n junction regions of the plurality of diode cells may be formed to be equal in size. With this arrangement, the plurality of diode cells have substantially equal characteristics and the chip diode thus has satisfactory characteristics as a whole and can be made to have a sufficient ESD tolerance even when downsized.

Each p-n junction region may be a polygonal region. With this arrangement, each diode cell has a p-n junction region of long peripheral length, the peripheral length of the entirety can thus be made long, and the ESD tolerance can thus be improved. The plurality of diode cells may be formed to be equal in size (more specifically, the p-n junction regions of the plurality of diode cells may be formed to be equal in size). With this arrangement, the plurality of diode cells have substantially equal characteristics and the chip diode thus has satisfactory characteristics as a whole and can be made to have a sufficient ESD tolerance even when downsized.

Preferably, not less than four of the diode cells are provided. With this arrangement, by not less than four of the diode cells being provided, the peripheral length of the diode junction regions can be made long and the ESD tolerance can be improved efficiently.

D7. The chip diode according to any one of “D1.” to “D6.,” where the p-type semiconductor substrate does not have an epitaxial layer. As mentioned above, the semiconductor substrate is constituted of the p-type semiconductor substrate and therefore stable characteristics can be realized even if an epitaxial layer is not formed on the semiconductor substrate. Therefore by omitting the epitaxial layer, the manufacturing process can be simplified and the manufacturing cost can be reduced.

D8. The chip diode according to any one of “D1.” to “D7.,” where the cathode electrode and the anode electrode are disposed at one of the principal surface sides of the p-type semiconductor substrate. With this arrangement, both the cathode electrode and the anode electrode are formed on one of the surfaces of the p-type semiconductor substrate, and the chip diode can thus be surface-mounted on a mounting substrate. That is, a flip-chip connection type chip diode can be provided. The space occupied by the chip diode can thereby be made small. In particular, reduction of height of the chip diode on the mounting substrate can be realized. Effective use can thereby be made of the space inside a casing of a compact electronic equipment, etc., to contribute to high-density packaging and downsizing.

D9. The chip diode according to any one of “D1.” to “D8.,” further including a protective film formed on the principal surface of the p-type semiconductor substrate so as to cover the cathode lead-out electrode while exposing the cathode electrode and the anode electrode. With this arrangement, the protective film that covers the cathode lead-out electrode while exposing the cathode electrode and the anode electrode is formed so that entry of moisture to the cathode lead-out electrode and the p-n junction regions can be suppressed or prevented. In addition, the durability against external forces can be improved by the protective film and the reliability can be improved further.

D10. The chip diode according to any one of “D1.” to “D9.,” where the cathode lead-out electrode is formed on one of the principal surfaces of the p-type semiconductor substrate, and the one principal surface of the p-type semiconductor substrate has a rectangular shape with rounded corner portions. With this arrangement, the surface of the semiconductor substrate at the side on which the cathode lead-out electrode is formed has the rectangular shape with rounded corner portions. Fragmenting (chipping) of the corner portions of the chip diode can thereby be suppressed or prevented and a chip diode with few appearance defects can be provided.

D11. The chip diode according to “D10.,” where a recess expressing a cathode direction is formed in a middle portion of one side of the rectangular shape. With this arrangement, the recess expressing the cathode direction is formed on one side of the semiconductor substrate of rectangular shape and there is thus no need to form a mark (cathode mark) that expresses the cathode direction by marking, etc., on a surface of the semiconductor substrate (for example, on the top surface of the protective film). A recess such as the above may be formed at the same time as performing the processing for cutting out the chip diode from a wafer (base substrate). Also, the recess can be formed even when the size of the chip diode is minute and marking is difficult. A step for marking can thus be omitted and a sign expressing the cathode direction can be provided even in a chip diode of minute size.

D12. A circuit assembly including a mounting substrate and the chip diode according to any one of “D1.” to “D11.” that is mounted on the mounting substrate. With this arrangement, a circuit assembly can be provided that uses the chip diode, with which destruction and variation of characteristics during mounting can be suppressed and which is thus improved in reliability. A circuit assembly of high reliability can thus be provided.

D13. The circuit assembly according to "D12.," where the chip diode is connected to the mounting substrate by wireless bonding (face-down bonding or flip-chip bonding). With this arrangement, the space occupied by the chip diode on the mounting substrate can be made small to enable a contribution to be made to high-density packaging of electronic parts.

D14. An electronic equipment including the circuit assembly according to "D12." or "D13." and a casing housing the circuit assembly. With this arrangement, an electronic equipment can be provided with which the circuit assembly, using the chip diode that can be suppressed in destruction and variation of characteristics during mounting and is thus improved in reliability, is housed in the casing. An electronic equipment of high reliability can thus be provided.

Preferred embodiments of the fifth invention shall now be described in detail with reference to the attached drawings.

Figure 65:
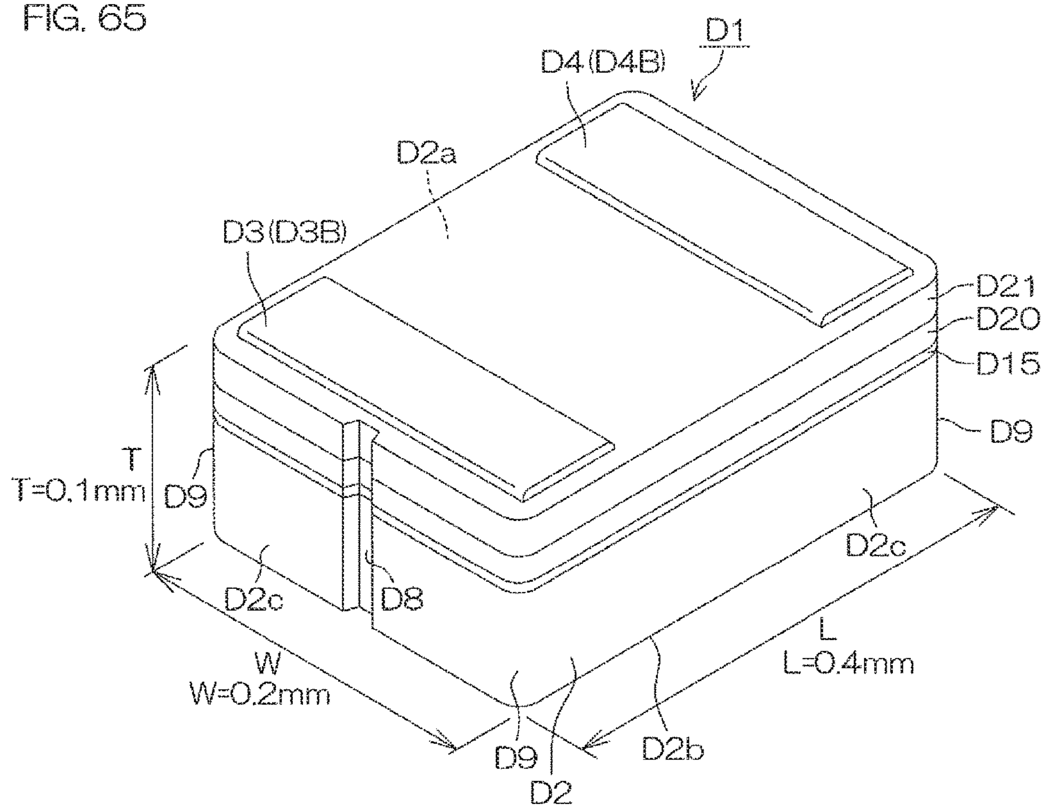
FIG. 65 is a perspective view of a chip diode according to a preferred embodiment of a fifth invention.
Figure 66:
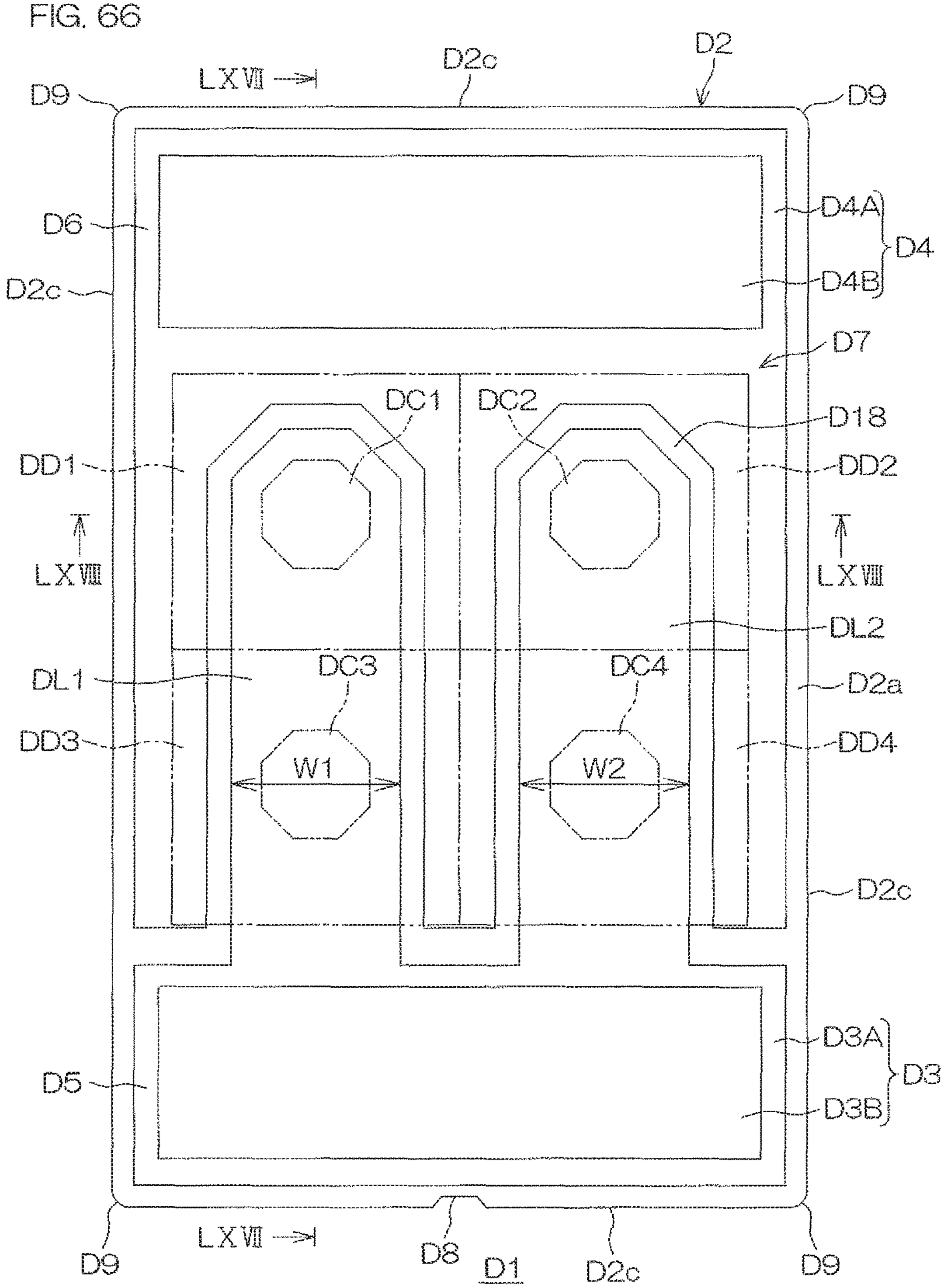
FIG. 66 is a plan view of the chip diode.
Figure 67:
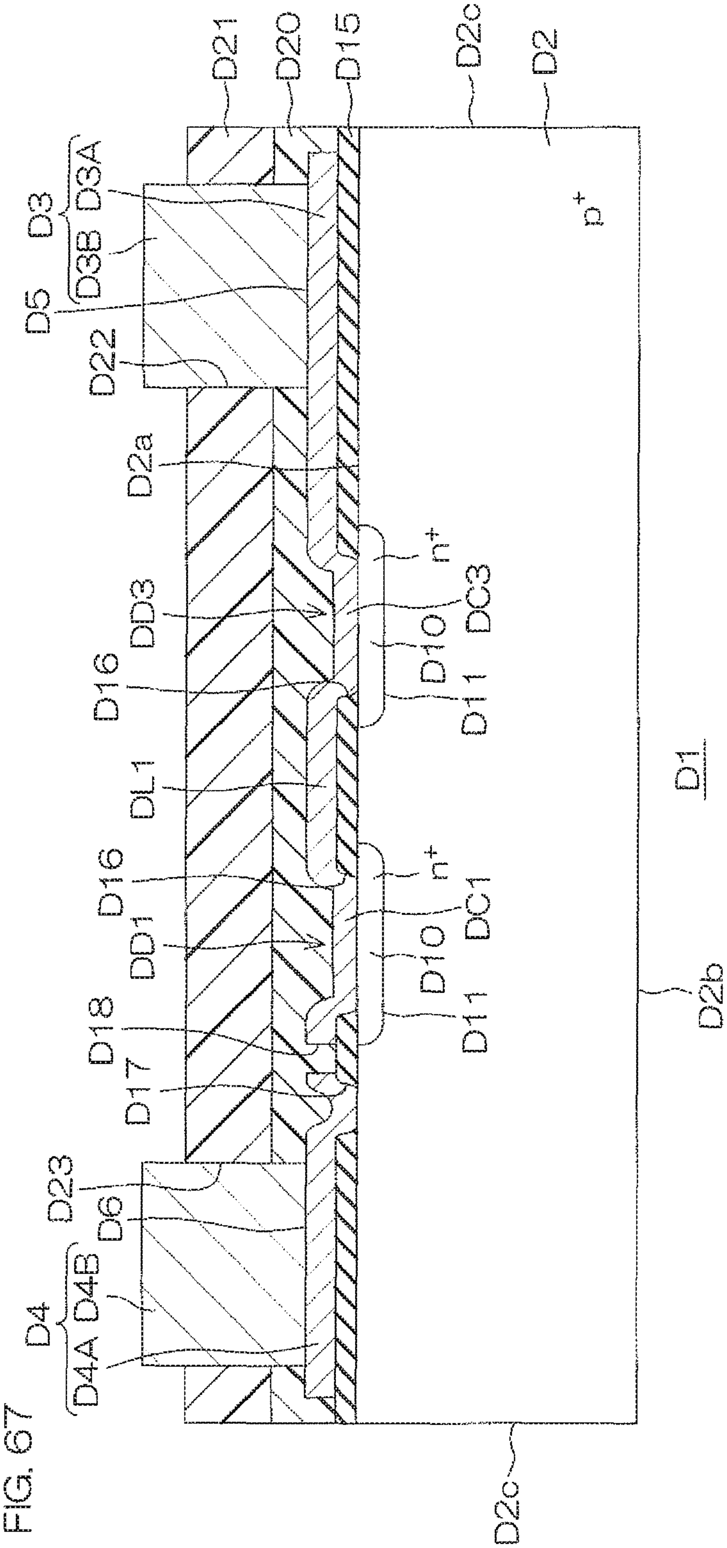
FIG. 67 is a sectional view taken along line LXVII-LXVII in FIG. 66.
Figure 68:
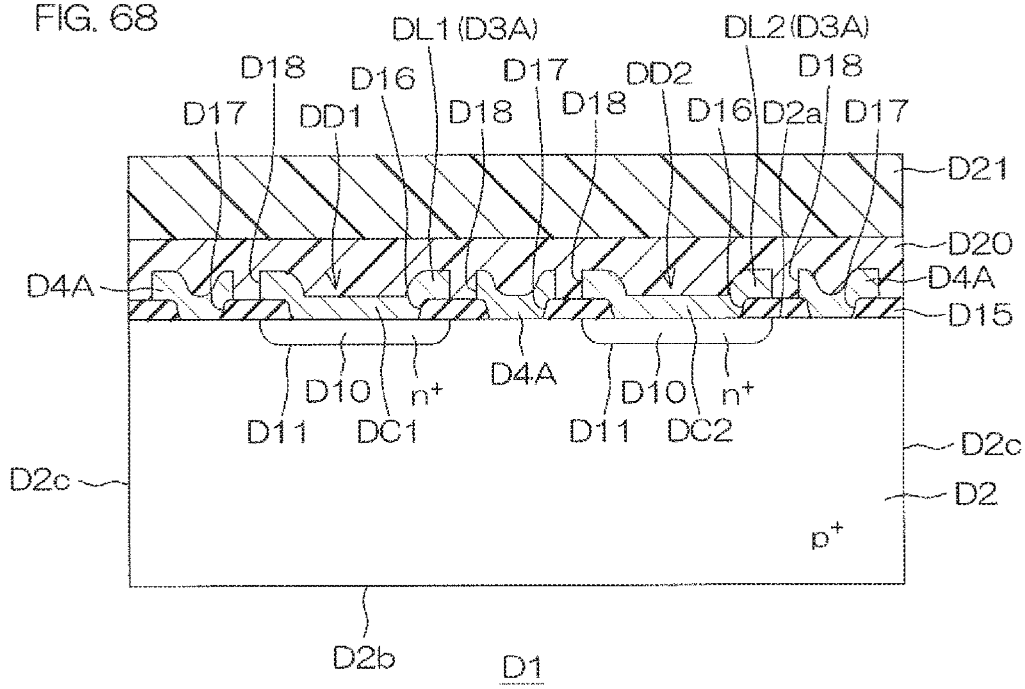
FIG. 68 is a sectional view taken along line LXVIII-LXVIII in FIG. 66.

FIG. 65 is a perspective view of a chip diode according to a preferred embodiment of the fifth invention, FIG. 66 is a plan view thereof, and FIG. 67 is a sectional view taken along line LXVII-LXVII in FIG. 66. Further, FIG. 68 is a sectional view taken along line LXVIII-LXVIII in FIG. 66. The chip diode D1 includes a $p^+$ type semiconductor substrate D2 (for example, a silicon substrate), a plurality of diode cells DD1 to DD4 formed on the semiconductor substrate D2, and a cathode electrode D3 and an anode electrode D4 connecting the plurality of diode cells DD1 to DD4 in parallel. The semiconductor substrate D2 includes a pair of principal surfaces D2*a* and D2*b* and a plurality of side surfaces D2*c* orthogonal to the pair of principal surfaces D2*a* and D2*b*, and one (principal surface D2*a*) of the pair of principal surfaces D2*a* and D2*b* is arranged as an element forming surface. Hereinafter, the principal surface D2*a* shall be referred to as the "element forming surface D2*a*." The element forming surface D2*a* is formed to a rectangular shape in a plan view and, for example, the length L in the long direction may be approximately 0.4 mm and the length W in the short direction may be approximately 0.2 mm. Also, the thickness T of the chip diode D1 as a whole may be approximately 0.1 mm. An external connection electrode D3B of the cathode electrode D3 and an external connection electrode D4B of the anode electrode D4 are disposed at respective end portions of the element forming surface D2*a*. A diode cell region D7 is provided between the external connection electrodes D3B and D4B.

A recess D8 that is cut out so as to extend in the thickness direction of the semiconductor substrate D2 is formed on one side surface D2*c* that is continuous with one short side (in the present preferred embodiment, the short side close to the cathode side external connection electrode D3B) of the element forming surface D2*a*. In the present preferred embodiment, the recess D8 extends across the entirety in the thickness direction of the semiconductor substrate D2. In a plan view, the recess D8 is recessed inward from the one short side of the element forming surface D2*a* and, in the present preferred embodiment, has a trapezoidal shape that becomes narrow toward the inner side of the element forming surface D2*a*. Obviously, this planar shape is an example and the planar shape may instead be a rectangular shape, a triangular shape, or a recessingly curved shape, such as a partially circular shape (for example, an arcuate shape), etc. The recess D8 indicates the orientation (chip direction) of the chip diode D1. More specifically, the recess D8 provides a cathode mark that indicates the position of the cathode side external connection electrode D3B. A structure is thereby provided with which the polarity of the chip diode D1 can be ascertained from its outer appearance during mounting.

The semiconductor substrate D2 has four corner portions D9 at four corners, each corresponding to an intersection portion of a pair of mutually adjacent side surfaces among the four side surfaces D2*c*. In the present preferred embodiment, the four corner portions D9 are shaped to round shapes. Each corner portion D9 has a smooth curved surface that is outwardly convex in a plan view as viewed in a direction of a normal to the element forming surface D2*a*. A structure capable of suppressing chipping during the manufacturing process or mounting of the chip diode D1 is thereby arranged.

Figure 69:
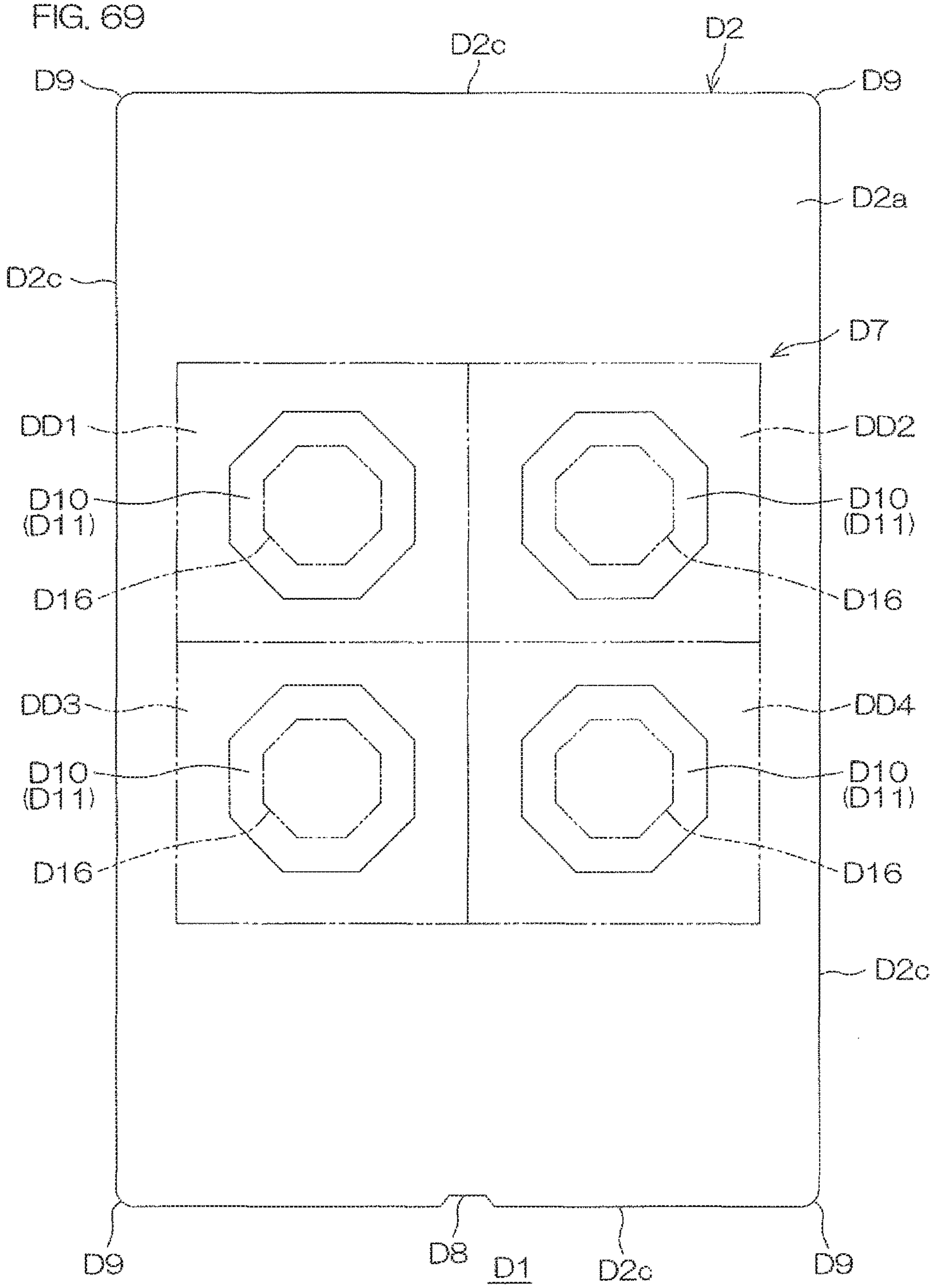
FIG. 69 is a plan view of the chip diode with a cathode electrode, an anode electrode, and the arrangement formed thereon being removed to show the structure of a top surface of a semiconductor substrate.

In the present preferred embodiment, the diode cell region D7 is formed to a rectangular shape. The plurality of diode cells DD1 to DD4 are disposed inside the diode cell region D7. In regard to the plurality of diode cells DD1 to DD4, four are provided in the present preferred embodiment and these are arrayed two-dimensionally at equal intervals in a matrix along the long direction and short direction of the semiconductor substrate D2. FIG. 69 is a plan view showing the structure of the top surface (element forming surface D2*a*) of the semiconductor substrate D2 with the cathode electrode D3, the anode electrode D4, and the arrangement formed thereon being removed. In each of the regions of the diode cells DD1 to DD4, an $n^+$ type region D10 is formed in a top layer region of the $p^+$ type semiconductor substrate D2. The $n^+$ type regions D10 are separated according to each individual diode cell. The diode cells DD1 to DD4 are thereby made to respectively have p-n junction regions D11 that are separated according to each individual diode cell.

In the present preferred embodiment, the plurality of diode cells DD1 to DD4 are formed to be equal in size and equal in shape and are specifically formed to rectangular shapes, and the $n^+$ type region D10 with a polygonal shape is formed in the rectangular region of each diode cell. In the present preferred embodiment, each $n^+$ type region D10 is formed to a regular octagon having four sides extending along the four sides forming the rectangular region of the corresponding diode cell among the diode cells DD1 to DD4 and another four sides respectively facing the four corner portions of the rectangular region of the corresponding diode cell among the diode cells DD1 to DD4.

As shown in FIG. 67 and FIG. 68, an insulating film D15 (omitted from illustration in FIG. 66), constituted of an oxide film, etc., is formed on the element forming surface D2*a* of the semiconductor substrate D2. Contact holes D16 (cathode contact holes) exposing top surfaces of the respective $n^+$ type regions D10 of the diode cells DD1 to DD4 and contact holes D17 (anode contact holes) exposing the element forming surface D2*a* are formed in the insulating film D15. The cathode electrode D3 and the anode electrode D4 are formed on the top surface of the insulating film D15. The cathode electrode D3 includes a cathode electrode film D3A formed on the top surface of the insulating film D15 and the external connection electrode D3B bonded to the cathode electrode film D3A. The cathode electrode film D3A includes a lead-out electrode DL1 connected to the plurality of diode cells DD1 and DD3, a lead-out electrode DL2 connected to the plurality of diodes DD2 and DD4, and a cathode pad D5 formed integral to the lead-out electrodes DL1 and DL2 (cathode lead-out electrodes). The cathode pad D5 is formed to a rectangle at one end portion of the element forming surface D2*a*. The external connection electrode D3B is connected to the cathode pad D5. The external connection electrode D3B is thereby connected in common to the lead-out electrodes DL1 and DL2. The cathode pad D5 and the external connection electrode D3B constitute an external connection portion (cathode external connection portion) of the cathode electrode D3.

The anode electrode D4 includes an anode electrode film D4A formed on the top surface of the insulating film D15 and the external connection electrode D4B bonded to the anode electrode film D4A. The anode electrode film D4A is connected to the $p^+$ type semiconductor substrate D2 and has an anode pad D6 near one end portion of the element forming surface D2*a*. The anode pad D6 is constituted of a region of the anode electrode film D4A that is disposed at the one end portion of the element forming surface D2*a*. The external connection electrode D4B is connected to the anode pad D6. The anode pad D6 and the external connection electrode D4B constitute an external connection portion (anode external connection portion) of the anode electrode D4. The region of the anode electrode film D4A besides the anode pad D6 is an anode lead-out electrode that is led out from the anode contact holes D17.

The lead-out electrode DL1 enters into the contact holes D16 of the diode cells DD1 and DD3 from the top surface of the insulating film D15 and is in ohmic contact with the respective $n^+$ type regions D10 of the diode cells DD1 and DD3 inside the respective contact holes D16. In the lead-out electrode DL1, the portions connected to the diode cells DD1 and DD3 inside the contact holes D16 constitute cell connection portions DC1 and DC3. Similarly, the lead-out electrode DL2 enters into the contact holes D16 of the diode cells DD2 and DD4 from the top surface of the insulating film D15 and is in ohmic contact with the respective $n^+$ type regions D10 of the diode cells DD2 and DD4 inside the respective contact holes D16. In the lead-out electrode DL2, the portions connected to the diode cells DD2 and DD4 inside the contact holes D16 constitute cell connection portions DC2 and DC4. The anode electrode film D4A extends to inner sides of the contact holes D17 from the top surface of the insulating film D15 and is in ohmic contact with the $p^+$ type semiconductor substrate D2 inside the contact holes D17. In the present preferred embodiment, the cathode electrode film D3A and the anode electrode film D4A are made of the same material.

In the present preferred embodiment, AlSi films are used as the electrode films. When an AlSi film is used, the anode electrode film D4A can be put in ohmic contact with the $p^+$ type semiconductor substrate D2 without having to provide a $p^+$ type region on the top surface of the semiconductor substrate D2. That is, an ohmic junction can be formed by putting the anode electrode film D4A in direct contact with the $p^+$ type semiconductor substrate D2. A process for forming the $p^+$ type region can thus be omitted.

The cathode electrode film D3A and the anode electrode film D4A are separated by a slit D18. The lead-out electrode DL1 is formed rectilinearly along a straight line passing from the diode cell DD1 to the cathode pad D5 through the diode cell DD3. Similarly, the lead-out electrode DL2 is formed rectilinearly along a straight line passing from the diode cell DD2 to the cathode pad D5 through the diode cell DD4. The lead-out electrodes DL1 and DL2 respectively have uniform widths W1 and W2 at all locations between the $n^+$ type regions D10 and the cathode pad D5, and the widths W1 and W2 are wider than the widths of the cell connection portions DC1, DC2, DC3, and DC4. The widths of the cell connection portions DC1 to DC4 are defined by the lengths in the direction orthogonal to the lead-out directions of the lead-out electrodes DL1 and DL2. Tip end portions of the lead-out electrodes DL1 and DL2 are shaped to match the planar shapes of the $n^+$ type regions D10. Base end portions of the lead-out electrodes DL1 and DL2 are connected to the cathode pad D5. The slit D18 is formed so as to border the lead-out electrodes DL1 and DL2. On the other hand, the anode electrode film D4A is formed on the top surface of the insulating film D15 so as to surround the cathode electrode film D3A across an interval corresponding to the slit D18 of substantially fixed width. The anode electrode film D4A integrally includes a comb-teeth-like portion extending in the longitudinal direction of the element forming surface D2*a* and the anode pad D6 that is constituted of a rectangular region.

The cathode electrode film D3A and the anode electrode film D4A are covered by a passivation film D20 (omitted from illustration in FIG. 66), constituted, for example, of a nitride film, and a resin film D21, made of polyimide, etc., is further formed on the passivation film D20. A pad opening D22 exposing the cathode pad D5 and a pad opening D23 exposing the anode pad D6 are formed so as to penetrate through the passivation film D20 and the resin film D21. The external connection electrodes D3B and D4B are respectively embedded in the pad openings D22 and D23. The passivation film D20 and the resin film D21 constitute a protective film to suppress or prevent the entry of moisture to the lead-out electrodes DL1 and DL2 and the p-n junction regions D11 and also absorb impacts, etc., from the exterior, thereby contributing to improvement of the durability of the chip diode D1.

The external connection electrodes D3B and D4B may have top surfaces at positions lower than the top surface of the resin film D21 (positions close to the semiconductor substrate D2) or may project from the top surface of the resin film D21 and have top surfaces at positions higher than the resin film D21 (positions far from the semiconductor substrate D2). An example where the external connection electrodes D3B and D4B project from the top surface of the resin film D21 is shown in FIG. 67. Each of the external connection electrodes D3B and D4B may be constituted, for example, of an Ni/Pd/Au laminated film having an Ni film in contact with the electrode film D3A or D4A, a Pd film formed on the Ni film, and an Au film formed on the Pd film. Such a laminated film may be formed by a plating method.

In each of the diode cells DD1 to DD4, the p-n junction region D11 is formed between the p-type semiconductor substrate D2 and the $n^+$ type region D10, and a p-n junction diode is thus formed respectively. The $n^+$ type regions D10 of the plurality of diode cells DD1 to DD4 are connected in common to the cathode electrode D3, and the $p^+$ type semiconductor substrate D2, which is the p-type region in common to the diode cells DD1 to DD4, is connected in common to the anode electrode D4. The plurality of diode cells DD1 to DD4, formed on the semiconductor substrate D2, are thereby connected in parallel all together.

Figure 70:
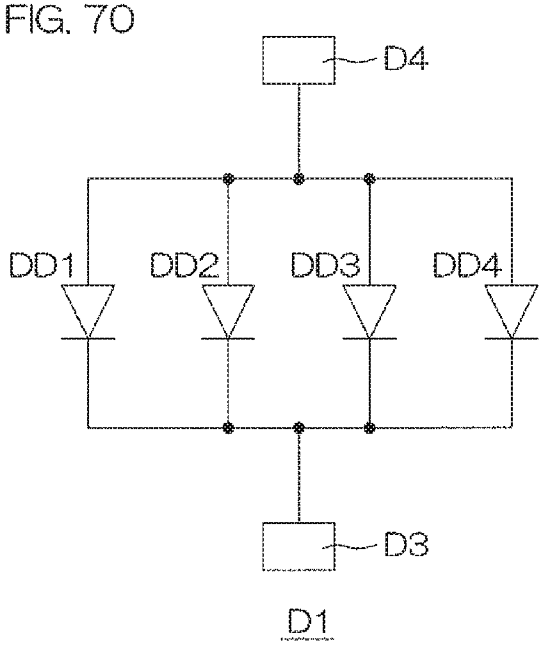
FIG. 70 is an electric circuit diagram showing the electrical structure of the interior of the chip diode.

FIG. 70 is an electric circuit diagram showing the electrical structure of the interior of the chip diode D1. With the p-n junction diodes respectively constituted by the diode cells DD1 to DD4, the cathode sides are connected in common by the cathode electrode D3, the anode sides are connected in common by the anode electrode D4, and all of the diodes are thereby connected in parallel and made to function as a single diode as a whole.

With the arrangement of the present preferred embodiment, the chip diode D1 has the plurality of diode cells DD1 to DD4 and each of the diode cells DD1 to DD4 has the p-n junction region D11. The p-n junction regions D11 are separated according to each of the diode cells DD1 to DD4. The chip diode D1 is thus made long in the peripheral length of the p-n junction regions D11, that is, the total peripheral length (total extension) of the $n^+$ type regions D10 in the semiconductor substrate D2. The electric field can thereby be dispersed and prevented from concentrating at vicinities of the p-n junction regions D11, and the ESD tolerance can thus be improved. That is, even when the chip diode D1 is to be formed compactly, the total peripheral length of the p-n junction regions D11 can be made large, thereby enabling both downsizing of the chip diode D1 and securing of the ESD tolerance to be achieved at the same time.

Figure 71:
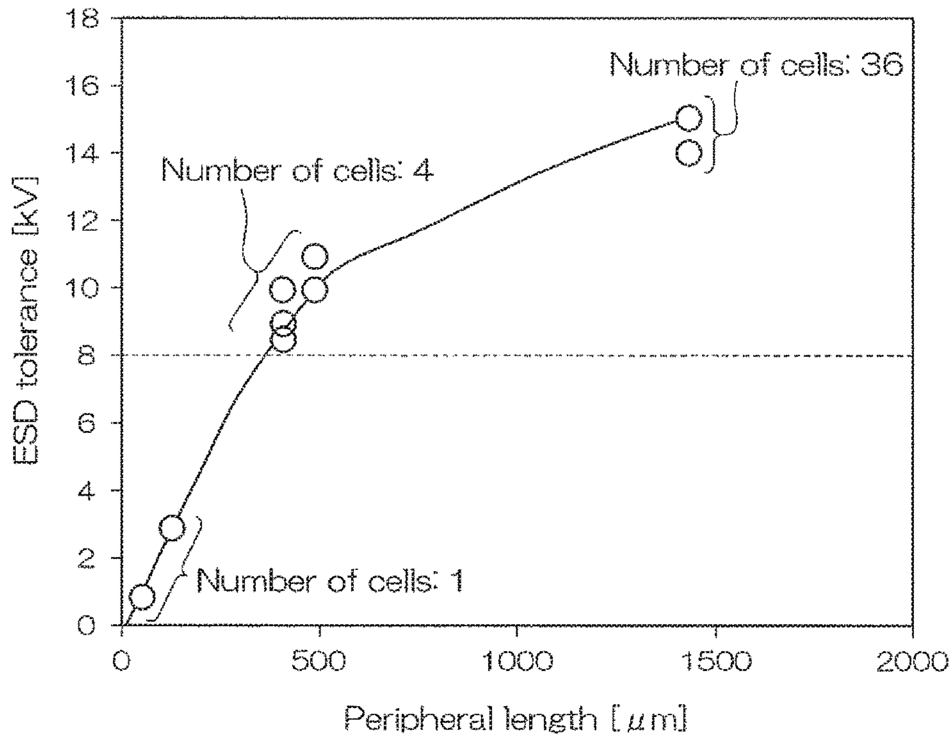
FIG. 71 shows experimental results of measuring the ESD tolerances of a plurality of samples that are differed in total peripheral length (total extension) of p-n junction regions by variously setting the sizes of diode cells and/or the number of the diode cells formed on a semiconductor substrate of the same area.

FIG. 71 shows experimental results of measuring the ESD tolerances of a plurality of samples that are differed in the total peripheral length (total extension) of the p-n junction regions by variously setting the sizes of diode cells and/or the number of the diode cells formed on a semiconductor substrate of the same area. From these experimental results, it can be understood that the longer the peripheral length of the p-n junction regions, the greater the ESD tolerance. In cases where not less than four diode cells are formed on the semiconductor substrate, ESD tolerances in the excess of 8 kilovolts could be realized.

Further with the present preferred embodiment, the widths W1 and W2 of the lead-out electrodes DL1 and DL2 are wider than the widths of the cell connection portions DC1 to DC4 at all locations between the cell connection portions DC1 to DC4 and the cathode pad D5. A large allowable current amount can thus be set and electromigration can be reduced to improve reliability with respect to a large current. That is, a chip diode that is compact, high in ESD tolerance, and secured in reliability with respect to large currents can be provided.

Also with the present preferred embodiment, the plurality of diode cells DD1 and DD3 and the plurality of diode cells DD2 and DD4, which are respectively aligned along straight lines directed toward the cathode pad D5, are connected to the cathode pad D5 by the rectilinear lead-out electrodes DL1 and DL2 in common. The lengths of the lead-out electrodes from the diode cells DD1 to DD4 to the cathode pad D5 can thereby be minimized and electromigration can thus be reduced more effectively. Also, a single lead-out electrode DL1 or DL2 can be shared by the plurality of diode cells DD1 and DD3 or the plurality of diode cells DD2 and DD4, and therefore lead-out electrodes of wide line widths can be laid out on the semiconductor substrate D2 while forming a large number of diode cells DD1 to DD4 to increase the peripheral length of the diode junction regions (p-n junction regions D11). Both further improvement of ESD tolerance and reduction of electromigration can thereby be achieved at the same time to further improve the reliability.

Figure 72:
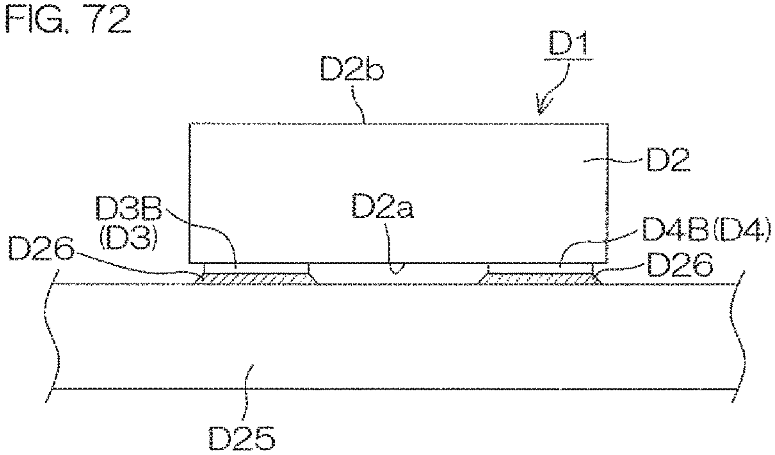
FIG. 72 is a sectional view of the arrangement of a circuit assembly with which the chip diode is flip-chip connected onto a mounting substrate.

Also, the end portions of the lead-out electrodes DL1 and DL2 have partially polygonal shapes matching the shapes (polygons) of the $n^+$ type regions D10 and can thus be connected to the $n^+$ type regions D10 while making small the areas occupied by the lead-out electrodes DL1 and DL2. Further, both the cathode side and anode side external connection electrodes D3B and D4B are formed on the element forming surface D2*a*, which is one of the surfaces of the semiconductor substrate D2. Therefore as shown in FIG. 72, a circuit assembly having the chip diode D1 surface-mounted on a mounting substrate D25 can be arranged by making the element forming surface D2*a* face the mounting substrate D25 and bonding the external connection electrodes D3B and D4B onto the mounting substrate D25 by solders D26. That is, the chip diode D1 of the flip-chip connection type can be provided, and by performing face-down bonding with the element forming surface D2*a* being made to face the mounting surface of the mounting substrate D25, the chip diode D1 can be connected to the mounting substrate D25 by wireless bonding. The area occupied by the chip diode D1 on the mounting substrate D25 can thereby be made small. In particular, reduction of height of the chip diode D1 on the mounting substrate D25 can be realized. Effective use can thereby be made of the space inside a casing of a compact electronic equipment, etc., to contribute to high-density packaging and downsizing.

Also with the present preferred embodiment, the insulating film D15 is formed on the semiconductor substrate D2 and the cell connection portions DC1 to DC4 of the lead-out electrodes DL1 and DL2 are connected to the diode cells DD1 to DD4 via the contact holes D16 formed in the insulating film D15. The cathode pad D5 is disposed on the insulating film D15 in the region outside the contact holes D16. That is, the cathode pad D5 is provided at a position separated from positions directly above the p-n junction regions D11. Also, the anode electrode film D4A is connected to the semiconductor substrate D2 via the contact holes D17 formed in the insulating film D15, and the anode pad D6 is disposed on the insulating film D15 in the region outside the contact holes D17. The anode pad D6 is also disposed at a position separated from positions directly above the p-n junction regions D11. Application of a large impact to the p-n junction regions D11 can thus be avoided during mounting of the chip diode D1 on the mounting substrate D25. Destruction of the p-n junction regions D11 can thereby be avoided and a chip diode that is excellent in durability against external forces can thereby be realized. An arrangement is also possible where the external connection electrodes D3B and D4B are not provided, the cathode pad D5 and the anode pad D6 are respectively used as the cathode external connection portion and the anode external portion, and bonding wires are connected to the cathode pad D5 and the anode pad D6. Destruction of the p-n junction regions D11 due to impacts during wire bonding can be avoided in this case as well.

Also with the present preferred embodiment, the anode electrode film D4A is constituted of an AlSi film. An AlSi film is close in work function to a p-type semiconductor (especially a p-type silicon semiconductor) and can thus form a satisfactory ohmic junction with the $p^+$ type semiconductor substrate D2. There is thus no need to form a high impurity concentration diffusion layer for ohmic junction on the $p^+$ type semiconductor substrate D2. The manufacturing process can thereby be simplified further and the productivity and the production cost can be reduced accordingly.

Further with the present preferred embodiment, the semiconductor substrate D2 has the rectangular shape with the corner portions D9 being rounded. Fragmenting (chipping) of the corner portions of the chip diode D1 can thereby be suppressed or prevented and the chip diode D1 with few appearance defects can be provided. Further with the present preferred embodiment, the recess D8 expressing the cathode direction is formed on the short side of the semiconductor substrate D2 close to the cathode side external connection electrode D3B and there is thus no need to mark a cathode mark on a rear surface (the principal surface at the side opposite to the element forming surface D2*a*) of the semiconductor substrate D2. The recess D8 may be formed at the same time as performing the processing for cutting out the chip diode D1 from a wafer (base substrate). Also, the recess D8 can be formed to indicate the direction of the cathode even when the size of the chip diode D1 is minute and marking is difficult. A step for marking can thus be omitted and a sign expressing the cathode direction can be provided even in the chip diode D1 of minute size.

Figure 73:
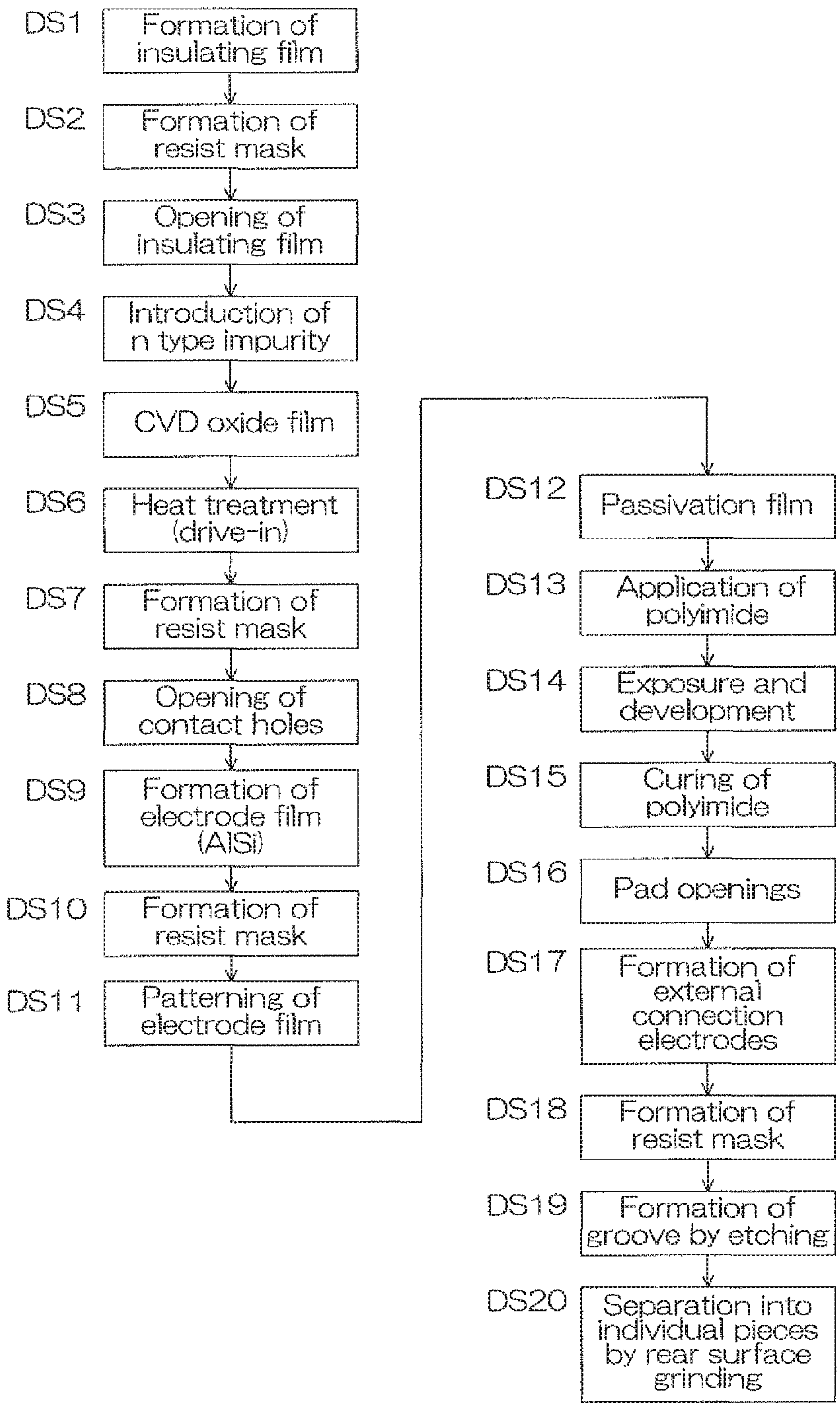
FIG. 73 is a process diagram for describing an example of a manufacturing process of the chip diode.
Figure 74A:
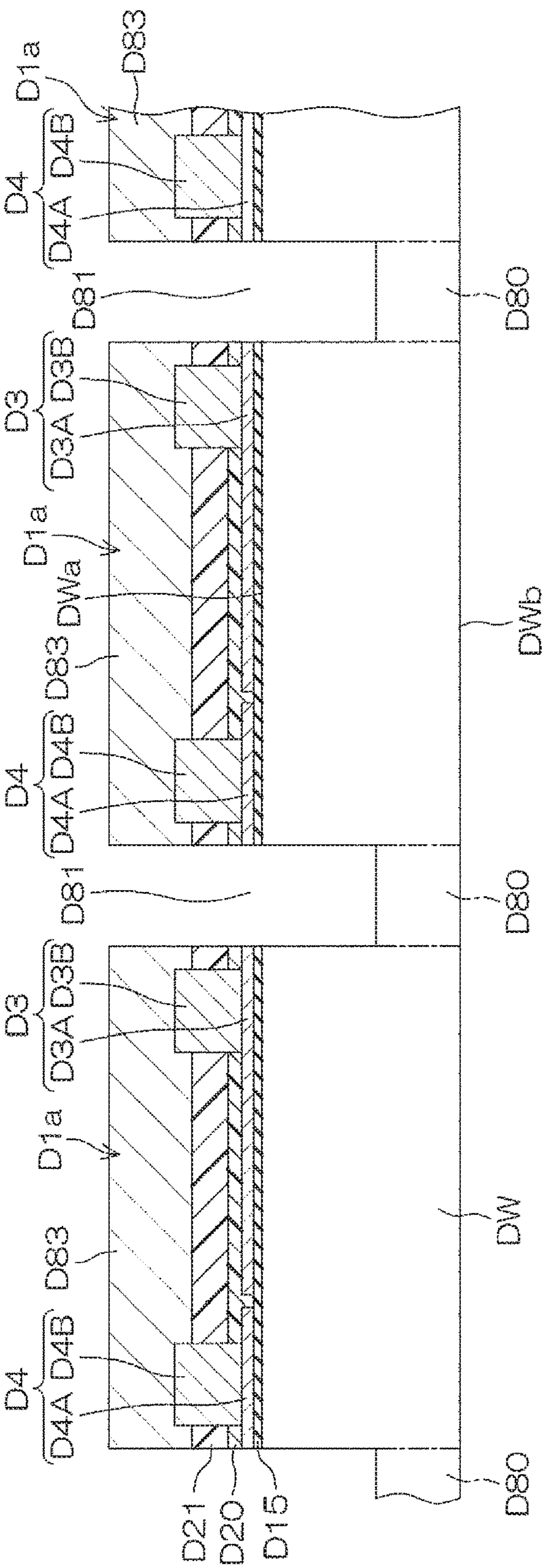
FIG. 74A is a sectional view of the arrangement of the chip diode in the middle of the manufacturing process.
Figure 74B:
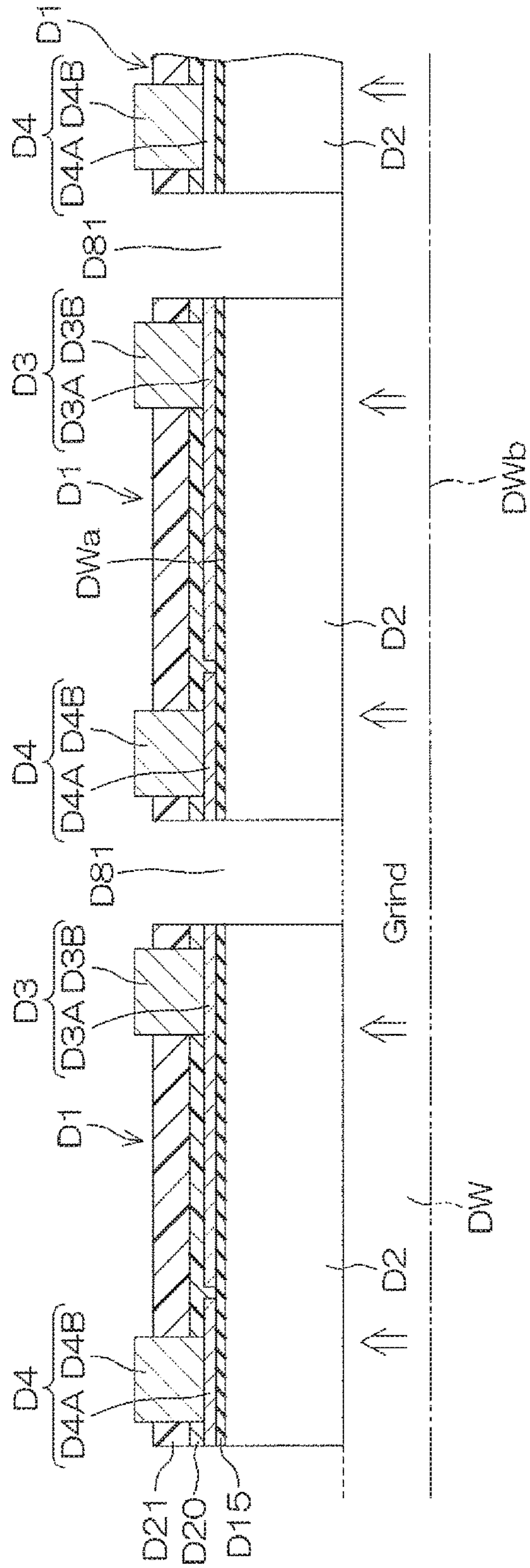
FIG. 74B is a sectional view of the arrangement in a step following that shown in FIG. 74A.
Figure 75:
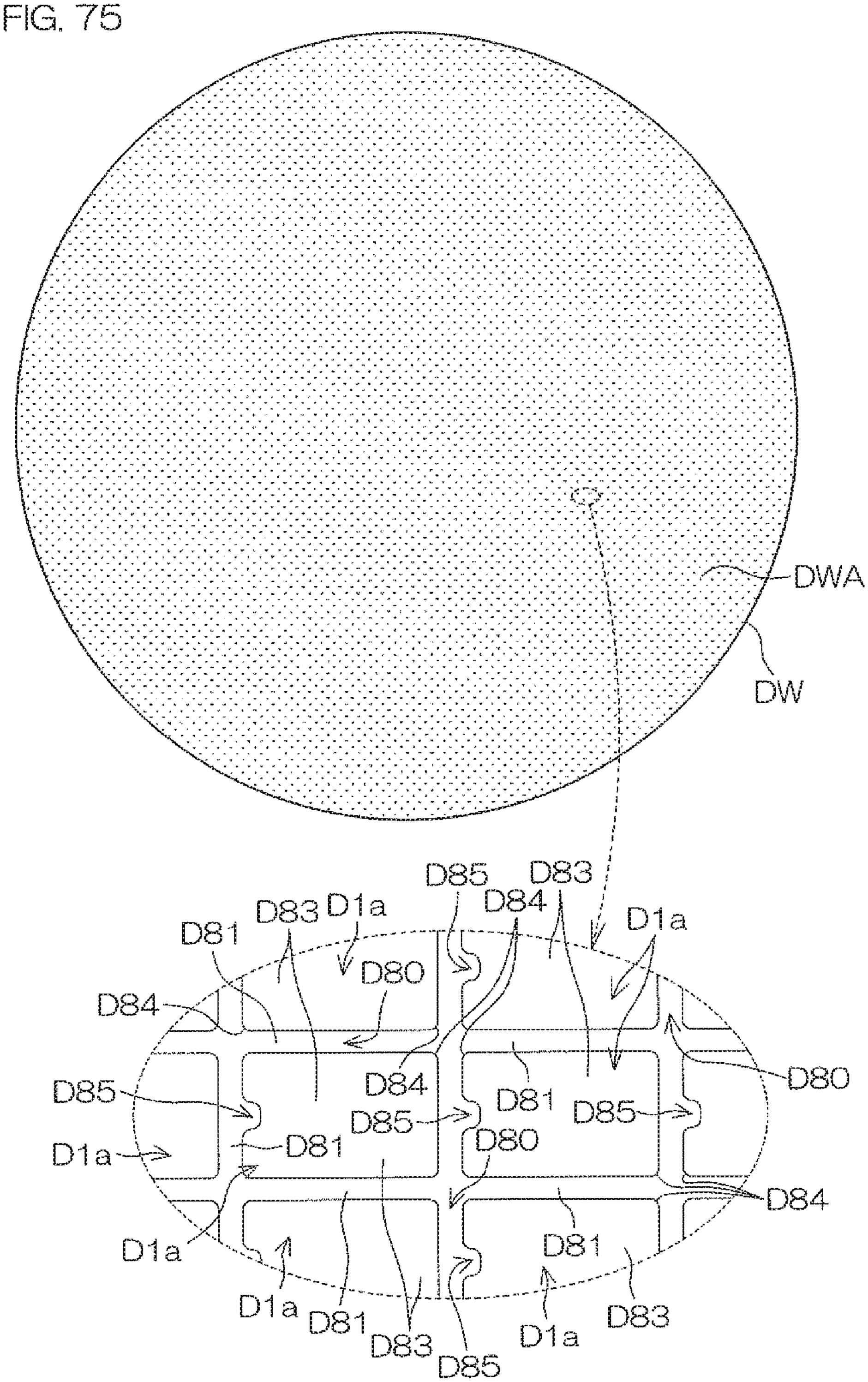
FIG. 75 is a plan view of a semiconductor wafer as a base substrate of the semiconductor substrate of the chip diode and shows a partial region in a magnified manner.

FIG. 73 is a process diagram for describing an example of a manufacturing process of the chip diode D1. Also, FIG. 74A and FIG. 74B are sectional views of the arrangement in the middle of the manufacturing process of FIG. 73 and show a section corresponding to FIG. 67. FIG. 75 is a plan view of a $p^+$ type semiconductor wafer DW as a base substrate of the semiconductor substrate D2 and shows a partial region in a magnified manner.

First, the $p^+$ type semiconductor wafer DW is prepared as the base substrate of the semiconductor substrate D2. A top surface of the semiconductor wafer DW is an element forming surface DWa and corresponds to the element forming surface D2*a* of the semiconductor substrate D2. A plurality of chip diode regions D1*a*, corresponding to a plurality of the chip diodes D1, are arrayed and set in a matrix on the element forming surface DWa. A boundary region D80 is provided between adjacent chip diode regions D1*a*. The boundary region D80 is a band-like region having a substantially fixed width and extends in two orthogonal directions to form a lattice. After performing necessary steps on the semiconductor wafer DW, the semiconductor wafer DW is cut apart along the boundary region D80 to obtain the plurality of chip diodes D1.

The steps executed on the semiconductor wafer DW are, for example, as follows. First, the insulating film D15 (with a thickness, for example, of 8000 Å to 8600 Å), which is a thermal oxide film or CVD oxide film, etc., is formed on the element forming surface DWa of the $p^+$ type semiconductor wafer DW (DS1) and a resist mask is formed on the insulating film D15 (DS2). Openings corresponding to the $n^+$ type regions D10 are then formed in the insulating film D15 by etching using the resist mask (DS3). Further, after peeling off the resist mask, an n-type impurity is introduced to top layer portions of the semiconductor wafer DW that are exposed from the openings formed in the insulating film D15 (DS4). The introduction of the n-type impurity may be performed by a step of depositing phosphorus as the n-type impurity on the top surface (so-called phosphorus deposition) or by implantation of n-type impurity ions (for example, phosphorus ions). Phosphorus deposition is a process of depositing phosphorus on the top surface of the semiconductor wafer DW exposed inside the openings in the insulating film D15 by conveying the semiconductor wafer DW into a diffusion furnace and performing heat treatment while making $POCl_3$ gas flow inside a diffusion passage. After thickening the insulating film D15 (thickening, for example, by approximately 1200 Å by CVD oxide film formation) as necessary (DS5), heat treatment (drive-in) for activation of the impurity ions introduced into the semiconductor wafer DW is performed (DS6). The $n^+$ type regions D10 are thereby formed on the top layer portion of the semiconductor wafer DW.

Thereafter, another resist mask having openings matching the contact holes D16 and D17 is formed on the insulating film D15 (DS7). The contact holes D16 and D17 are formed in the insulating film D15 by etching via the resist mask (DS8), and the resist mask is peeled off thereafter. An electrode film that constitutes the cathode electrode D3 and the anode electrode D4 is then formed on the insulating film D15, for example, by sputtering (DS9). In the present preferred embodiment, an electrode film (for example, of 10000 Å thickness), made of AlSi, is formed. Another resist mask having an opening pattern corresponding to the slit D18 is then formed on the electrode film (DS10) and the slit D18 is formed in the electrode film by etching (for example, reactive ion etching) via the resist mask (DS11). The width of the slit D18 may be approximately 3 μm. The electrode film is thereby separated into the cathode electrode film D3A and the anode electrode film D4A.

Then after peeling off the resist film, the passivation film D20, which is a nitride film, etc., is formed, for example, by the CVD method (DS12), and further, polyimide, etc., is applied to form the resin film D21 (DS13). For example, a polyimide imparted with photosensitivity is applied, and after exposing in a pattern corresponding to the pad openings D22 and D23, the polyimide film is developed (step DS14). The resin film D21 having openings corresponding to the pad openings D22 and D23 is thereby formed. Thereafter, heat treatment for curing the resin film is performed as necessary (DS15). The pad openings D22 and D23 are then formed in the passivation film D20 by performing dry etching (for example, reactive ion etching) using the resin film D21 as a mask (DS16). Thereafter, the external connection electrodes D3B and D4B are formed inside the pad openings D22 and D23 (DS17). The external connection electrodes D3B and D4B may be formed by plating (preferably, electroless plating).

Thereafter, a resist mask D83 (see FIG. 74A), having a lattice-shaped opening matching the boundary region D80 (see FIG. 75), is formed (DS18). Plasma etching is performed via the resist mask D83 and the semiconductor wafer DW is thereby etched to a predetermined depth from the element forming surface DWa as shown in FIG. 74A. A groove D81 for cutting is thereby formed along the boundary region D80 (DS19). After peeling off the resist mask D83, the semiconductor wafer DW is ground from the rear surface DWb until a bottom portion of the groove D81 is reached as shown in FIG. 74B (DS20). The plurality of chip diode regions D1*a* are thereby separated into individual pieces and the chip diodes D1 with the structure described above can thereby be obtained.

As shown in FIG. 75, the resist mask D83 arranged to form the groove D81 at the boundary region D80 has, at positions adjacent to the four corners of each chip diode regions D1*a*, round shaped portions D84 of curved shapes that are convex toward outer sides of the chip diode regions D1*a*. Each round shaped portion D84 is formed to connect two adjacent sides of a chip diode region D1*a* by a smooth curve. Further, the resist mask D83 arranged to form the groove D81 in the boundary region D80 has, at a position adjacent to one short side of each chip diode regions D1*a*, a recess D85 that is recessed toward an inner side of the chip diode regions D1*a*. Therefore, when the groove D81 is formed by plasma etching using the resist mask D83 as a mask, the groove D81 is to made to have, at positions adjacent to the four corners of each chip diode regions D1*a*, round shaped portions of curved shapes that are convex toward the outer sides of the chip diode regions D1*a* and to have, at a position adjacent to one side of each chip diode regions D1*a*, a recess that is recessed toward the inner side of the chip diode regions D1*a*. Therefore in the step of forming the groove D81 for cutting out the chip diode regions D1*a* from the semiconductor wafer DW, the corner portions D9 of the four corners can be shaped to round shapes and the recess D8 can be formed as the cathode mark in one short side (the short side at the cathode side) in each chip diode D1 at the same time. That is, the corner portions D9 can be processed to round shapes and the recess D8 can be formed as the cathode mark without adding a dedicated step.

With the present preferred embodiment, the semiconductor substrate D2 is constituted of the p-type semiconductor and therefore stable characteristics can be realized even if an epitaxial layer is not formed on the semiconductor substrate D2. That is, an n-type semiconductor wafer is large in in-plane variation of resistivity, and therefore when an n-type semiconductor wafer is used, an epitaxial layer with low in-plane variation of resistivity must be formed on the top surface and an impurity diffusion layer must be formed on the epitaxial layer to form the p-n junction. This is because an n-type impurity is low in segregation coefficient and therefore when an ingot (for example, a silicon ingot) that is to be the source of a semiconductor wafer is formed, a large difference in resistivity arises between a central portion and a peripheral edge portion of the wafer. On the other hand, a p-type impurity is comparatively high in segregation coefficient and therefore a p-type semiconductor wafer is low in in-plane variation of resistivity. Therefore by using a p-type semiconductor wafer, a diode with stable characteristics can be cut out from any location of the wafer without having to form an epitaxial layer. Therefore by using the $p^+$ type semiconductor substrate D2, the manufacturing process can be simplified and the manufacturing cost can be reduced.

Figure 76A:
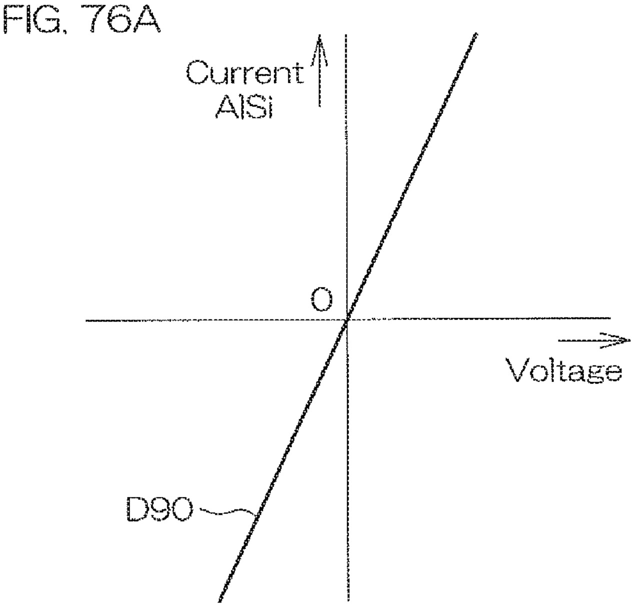
FIG. 76A and FIG. 76B are diagrams for describing the ohmic contact of an AlSi electrode and a $p^+$ type semiconductor substrate.
Figure 76B:
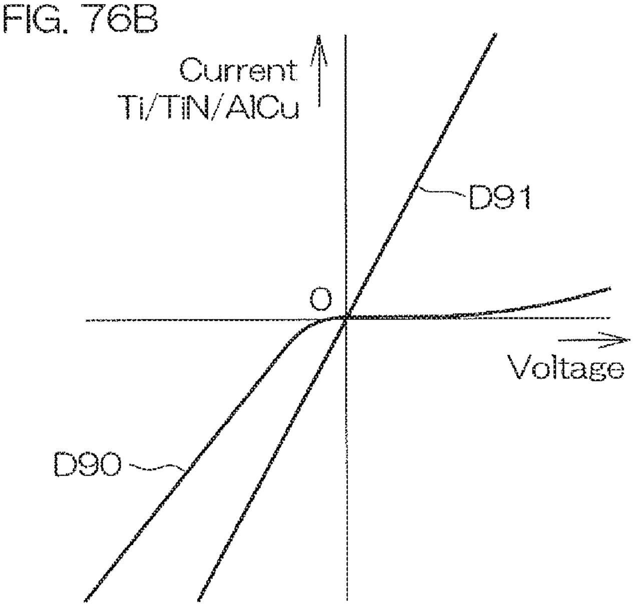

FIG. 76A and FIG. 76B are diagrams for describing the ohmic contact of an AlSi electrode film and a $p^+$ type semiconductor substrate. FIG. 76A shows current vs. voltage characteristics between a $p^+$ type silicon substrate and an AlSi film when the AlSi film is formed on the $p^+$ type silicon substrate. The current is proportional to the applied voltage and it can thus be understood that a satisfactory ohmic contact is formed. For comparison, a curve D90 in FIG. 76B shows the same characteristics in a case where the electrode film formed on the $p^+$ type silicon substrate is arranged as a laminated film in which a Ti film, a TiN film, and an AlCu film are laminated successively from the substrate top surface. The current vs. voltage characteristics are not linear characteristics and it can thus be understood that an ohmic contact is not obtained. On the other hand, a curve D91 shows the current vs. voltage characteristics in a case where a high concentration region is formed by introducing a p-type impurity to a higher concentration in the top surface of a $p^+$ type silicon substrate and an electrode film, constituted of a laminated film formed by laminating a Ti film, a TiN film, and an AlCu film successively on the substrate top surface, is put in contact with the high concentration region. In this case, the current vs. voltage characteristics are linear characteristics and it can thus be understood that a satisfactory ohmic contact is obtained. From the above, it can be understood that by using an AlSi film as the electrode film, a cathode electrode film and an anode electrode film that are in ohmic contact with the $p^+$ type semiconductor substrate can be formed without having to form a high concentration region in the $p^+$ type semiconductor substrate and the manufacturing process can thereby be simplified.

Figure 77:
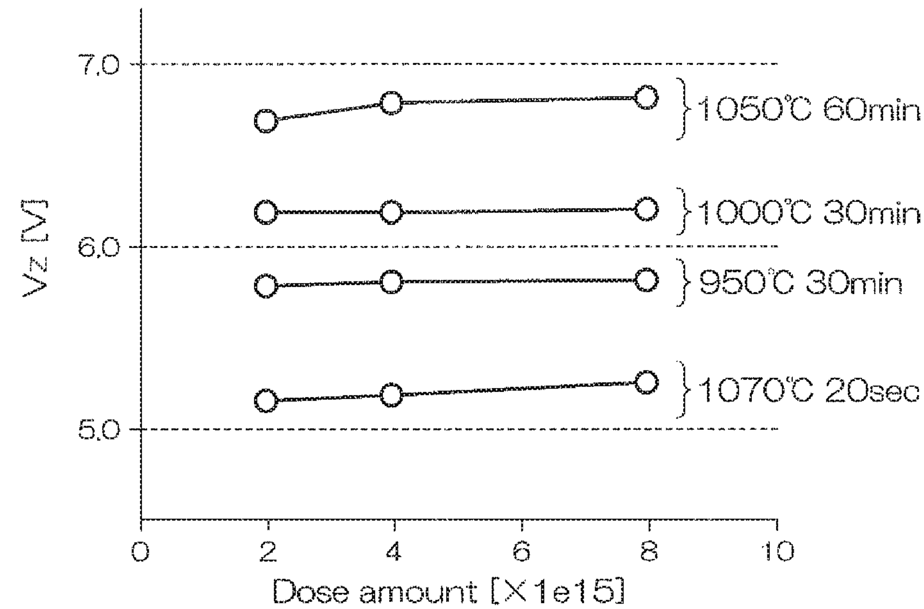
FIG. 77 is a diagram for describing a feature related to adjustment of a Zener voltage (Vz) of the chip diode.

FIG. 77 is a diagram for describing a feature related to adjustment of a Zener voltage (Vz) of the chip diode D1. That is, the features concerning Zener voltage adjustment in a case where the chip diode D1 is arranged as a Zener diode are shown. To describe more specifically, after introducing an n-type impurity (for example, phosphorus) in the top layer portion of the semiconductor substrate D2 to form the $n^+$ type regions D10, the heat treatment (drive-in) for activating the introduced impurity is performed. The Zener voltage changes in accordance with the temperature and duration of the heat treatment. Specifically, the Zener voltage tends to increase with increase in the amount of heat applied to the semiconductor substrate D2 during the heat treatment. The Zener voltage can be adjusted using this tendency. As can be understood from FIG. 77, the Zener voltage is more strongly dependent on the heat amount during the heat treatment than the impurity dose amount.

Figure 78:
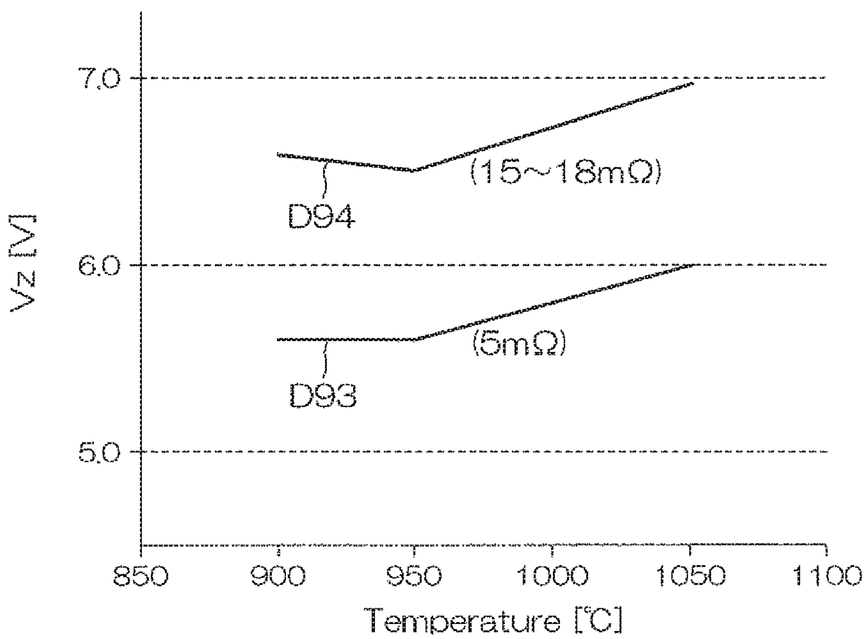
FIG. 78 is a diagram for describing another feature related to the adjustment of the Zener voltage (Vz).

FIG. 78 is a diagram for describing another feature related to the adjustment of the Zener voltage (Vz). Specifically, changes of the Zener voltage with respect to the temperature during the heat treatment for activating the n-type impurity introduced into the semiconductor substrate D2 are shown, with a curve D93 showing the Zener voltage in a case of using a semiconductor substrate with a comparatively low resistivity (for example, 5 mΩ) and a curve D94 showing the Zener voltage in a case of using a semiconductor substrate with a comparatively high resistivity (for example, 15 to 18 mΩ). From a comparison of the curves D93 and D94, it can be understood that the Zener voltage is dependent on the resistivity of the semiconductor substrate. The Zener voltage can thus be adjusted to a design value by applying a semiconductor substrate with a resistivity that is appropriate in accordance with the targeted Zener voltage.

Figure 79:
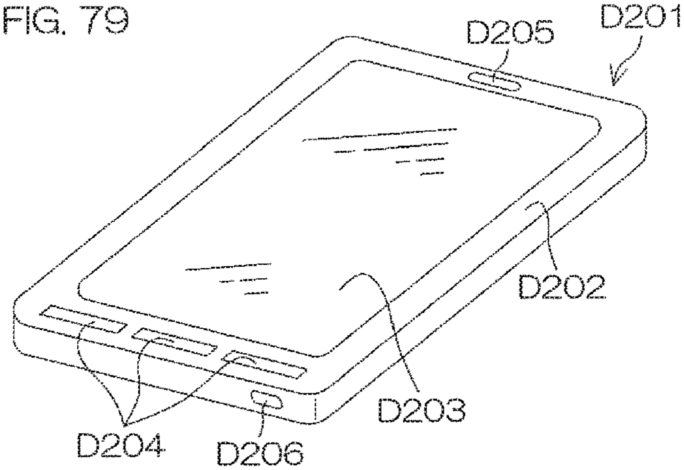
FIG. 79 is a perspective view of an outer appearance of a smartphone that is an example of an electronic equipment in which the chip diode is used.

FIG. 79 is a perspective view of an outer appearance of a smartphone that is an example of an electronic equipment in which the chip diode is used. The smartphone D201 is arranged by housing electronic parts in the interior of a casing D202 with a flat rectangular parallelepiped shape. The casing D202 has a pair of principal surfaces at its front side and rear side, and the pair of principal surfaces are joined by four side surfaces. A display surface of a display panel D203, constituted of a liquid crystal panel or an organic EL panel, etc., is exposed at one of the principal surfaces of the casing D202. The display surface of the display panel D203 constitutes a touch panel and provides an input interface for a user.

The display panel D203 is formed to an oblong shape that occupies most of one of the principal surfaces of the casing D202. Operation buttons D204 are disposed along one short side of the display panel D203. In the present preferred embodiment, a plurality (three) of the operation buttons D204 are aligned along the short side of the display panel D203. The user can call and execute necessary functions by performing operations of the smartphone D201 by operating the operation buttons D204 and the touch panel.

A speaker D205 is disposed in a vicinity of the other short side of the display panel D203. The speaker D205 provides an earpiece for a telephone function and is also used as an acoustic conversion unit for reproducing music data, etc. On the other hand, close to the operation buttons D204, a microphone D206 is disposed at one of the side surfaces of the casing D202. The microphone D206 provides a mouthpiece for the telephone function and may also be used as a microphone for sound recording.

Figure 80:
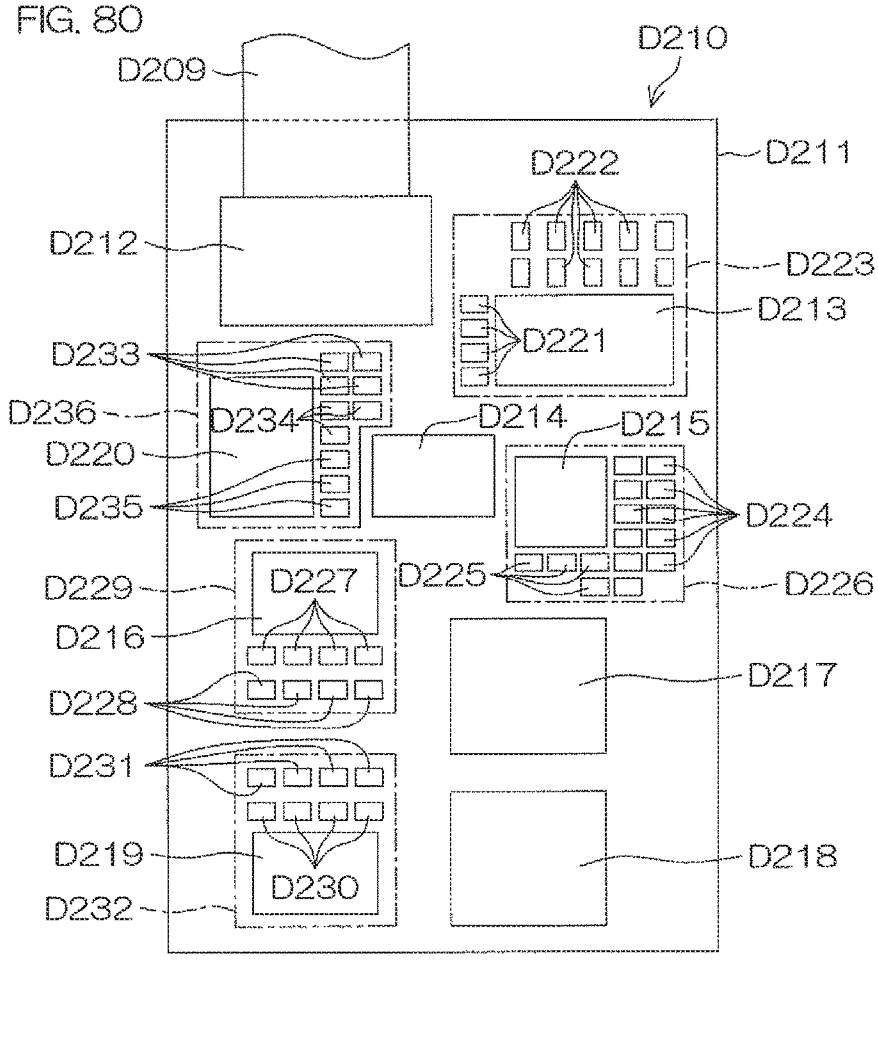
FIG. 80 is an illustrative plan view of the arrangement of an electronic circuit assembly housed in a housing of the smartphone.

FIG. 80 is an illustrative plan view of the arrangement of an electronic circuit assembly D210 housed in the interior of the housing D202. The electronic circuit assembly D210 includes a wiring substrate D211 and circuit parts mounted on a mounting surface of the wiring substrate D211. The plurality of circuit parts include a plurality of integrated circuit elements (ICs) D212 to D220 and a plurality of chip parts. The plurality of ICs include a transmission processing IC D212, a one-segment TV receiving IC D213, a GPS receiving IC D214, an FM tuner IC D215, a power supply IC D216, a flash memory D217, a microcomputer D218, a power supply IC D219, and a baseband IC D220. The plurality of chip parts include chip inductors D221, D225, and D235, chip resistors D222, D224, and D233, chip capacitors D227, D230, and D234, and chip diodes D228 and D231. The chip parts are mounted on the mounting surface of the wiring substrate D211, for example, by flip-chip bonding. The chip diodes according to the preferred embodiments described above may be applied as the chip diodes D228 and D231.

The transmission processing IC D212 has incorporated therein an electronic circuit arranged to generate display control signals for the display panel D203 and receive input signals from the touch panel on the top surface of the display panel D203. For connection with the display panel D203, the transmission processing IC D212 is connected to a flexible wiring D209. The one-segment TV receiving IC D213 incorporates an electronic circuit that constitutes a receiver for receiving one-segment broadcast (terrestrial digital television broadcast targeted for reception by portable equipment) radio waves. A plurality of the chip inductors D221 and a plurality of the chip resistors D222 are disposed in a vicinity of the one-segment TV receiving IC D213. The one-segment TV receiving IC D213, the chip inductors D221, and the chip resistors D222 constitute a one-segment broadcast receiving circuit D223. The chip inductors D221 and the chip resistors D222 respectively have accurately adjusted inductances and resistances and provide circuit constants of high precision to the one-segment broadcast receiving circuit D223.

The GPS receiving IC D214 incorporates an electronic circuit that receives radio waves from GPS satellites and outputs positional information of the smartphone D201. The FM tuner IC D215 constitutes, together with a plurality of the chip resistors D224 and a plurality of the chip inductors D225 mounted on the wiring substrate D211 in a vicinity thereof, an FM broadcast receiving circuit D226. The chip resistors D224 and the chip inductors D225 respectively have accurately adjusted resistances and inductances and provide circuit constants of high precision to the FM broadcast receiving circuit D226.

A plurality of the chip capacitors D227 and a plurality of the chip diodes D228 are mounted on the mounting surface of the wiring substrate D211 in a vicinity of the power supply IC D216. Together with the chip capacitors D227 and the chip diodes D228, the power supply IC D216 constitutes a power supply circuit D229. The flash memory D217 is a storage device for recording operating system programs, data generated in the interior of the smartphone D201, and data and programs acquired from the exterior by communication functions, etc.

The microcomputer D218 is a computing processing circuit that incorporates a CPU, a ROM, and a RAM and realizes a plurality of functions of the smartphone D201 by executing various computational processes. More specifically, computational processes for image processing and various application programs are realized by actions of the microcomputer D218. A plurality of the chip capacitors D230 and a plurality of the chip diodes D231 are mounted on the mounting surface of the wiring substrate D211 in a vicinity of the power supply IC D219. Together with the chip capacitors D230 and the chip diodes D231, the power supply IC D219 constitutes a power supply circuit D232.

A plurality of the chip resistors D233, a plurality of the chip capacitors D234, and a plurality of the chip inductors D235 are mounted on the mounting surface of the wiring substrate D211 in a vicinity of the baseband IC D220. Together with the chip resistors D233, the chip capacitors D234, and the chip inductors D235, the baseband IC D220 constitutes a baseband communication circuit D236. The baseband communication circuit D236 provides communication functions for telephone communication and data communication.

With the above arrangement, electric power that is appropriately adjusted by the power supply circuits D229 and D232 is supplied to the transmission processing IC D212, the GPS receiving IC D214, the one-segment broadcast receiving circuit D223, the FM broadcast receiving circuit D226, the baseband communication circuit D236, the flash memory D217, and the microcomputer D218. The microcomputer D218 performs computational processes in response to input signals input via the transmission processing IC D212 and makes the display control signals be output from the transmission processing IC D212 to the display panel D203 to make the display panel D203 perform various displays.

When receiving of a one-segment broadcast is commanded by operation of the touch panel or the operation buttons D204, the one-segment broadcast is received by actions of the one-segment broadcast receiving circuit D223. Computational processes for outputting the received images to the display panel D203 and making the received audio signals be acoustically converted by the speaker D205 are executed by the microcomputer D218. Also, when positional information of the smartphone D201 is required, the microcomputer D218 acquires the positional information output by the GPS receiving IC D214 and executes computational processes using the positional information.

Further, when an FM broadcast receiving command is input by operation of the touch panel or the operation buttons D204, the microcomputer D218 starts up the FM broadcast receiving circuit D226 and executes computational processes for outputting the received audio signals from the speaker D205. The flash memory D217 is used for storing data acquired by communication and storing data prepared by computations by the microcomputer D218 and inputs from the touch panel. The microcomputer D218 writes data into the flash memory D217 or reads data from the flash memory D217 as necessary.

The telephone communication or data communication functions are realized by the baseband communication circuit D236. The microcomputer D218 controls the baseband communication circuit D236 to perform processes for sending and receiving audio signals or data.

Although preferred embodiments of the fifth invention have been described above, the fifth invention may be implemented in yet other modes as well. For example, although with the preferred embodiments described above, examples where four diode cells are formed on the semiconductor substrate were described, two or three diode cells may be formed or not less than four diode cells may be formed on the semiconductor substrate.

Also, although with the preferred embodiments, examples where the p-n junction regions are respectively formed to a regular octagon in a plan view were described, the p-n junction regions may be formed to any polygonal shape with the number of sides being not less than three, and the planar shapes of the regions may be circular or elliptical. If the shape of the p-n junction regions is to be made a polygonal shape, the shape does not have to be a regular polygonal shape and the respective regions may be formed to a polygon with two or more types of side length. Yet further, there is no need to form the p-n junction regions to the same size and a plurality of diode cells respectively having junction regions of different sizes may be mixed on the semiconductor substrate. Yet further, the shape of the p-n junction regions formed on the semiconductor substrate does not have to be of one type, and p-n junction regions with two or more types of shape may be mixed on the semiconductor substrate.

[6] Sixth Invention

Patent Document 2 (Japanese Unexamined Patent Publication No. H8-316001) discloses an art of forming a marking by forming an overcoat layer from a photosensitive material on a chip part and irradiating the overcoat layer with ultraviolet rays. The marking is used, for example, to express the resistance value or precision, etc., of a chip resistor, which is an example of a chip part, or to express a type name or cathode direction (polarity direction) of a chip diode, which is another example of a chip part.

Such a marking is recognized by an image recognition function provided in an automatic mounting machine and used for mounting a chip part. However, the art described in Patent Document 2 requires a special step for forming the marking. Productivity of the chip part may thus be restricted. Also, marking on an extremely small chip part such that it is installed in compact electronic equipment is not easy and if even smaller chip parts come to be desired in the future, it may become impossible to apply conventional marking arts.

A main object of the sixth invention is to provide a micro type chip part that is marked without compromising the productivity of the chip part and a method for manufacturing the chip part. Another object of the sixth invention is to provide a micro type chip part provided with an outer appearance feature that expresses information and a method for manufacturing the chip part. Yet another object of the sixth invention is to provide a circuit assembly and an electronic equipment that include a micro type chip part that is marked.

The sixth invention has the following features.

E1. A chip part including a substrate, an element formed on the substrate, and an electrode formed on the substrate, and where a recess and/or projection expressing information related to the element is formed at a peripheral edge portion of the substrate.

E2. The chip part according to "E1.," where the substrate is substantially rectangular in a plan view and the peripheral edge portion includes one side in a plan view.

E3. The chip part according to "E1." or "E2.," where the recess and/or projection includes a recessed mark formed at one or more mark forming positions selected from among a plurality of mark forming positions determined in advance at the peripheral edge portion of the substrate.

E4. The chip part according to "E3.," where information is indicated by a pattern of positions of the one or more recessed marks.

E5. The chip part according to "E4.," where the pattern of positions of the recessed marks includes at least three position patterns of recessed marks and contains an information indication amount that is the cube of the binary information amount expressed by the presence/non-presence of the recessed mark in a single position pattern.

E6. The chip part according to "E1." or "E2.," where the recess and/or projection includes a recessed mark extending along the peripheral edge portion of the substrate across a single mark length selected from a plurality of mark lengths.

E7. The chip part according to "E6.," where information is indicated by the mark length of the recessed mark.

E8. The chip part according to "E1." or "E2.," where the recess and/or projection includes a projecting mark formed at one or more mark forming positions selected from among a plurality of mark forming positions determined in advance at the peripheral edge portion of the substrate.

E9. The chip part according to "E8.," where information is indicated by a pattern of positions of the one or more projecting marks.

E10. The chip part according to "E9.," where the pattern of positions of the projecting marks includes at least three position patterns of projecting marks and contains an information indication amount that is the cube of the binary information amount expressed by the presence/non-presence of the projecting mark in a single position pattern.

E11. The chip part according to "E1." or "E2.," where the recess and/or projection includes a projecting mark extending along the peripheral edge portion of the substrate across a single mark length selected from a plurality of mark lengths.

E12. The chip part according to "E11.," where information is indicated by the mark length of the projecting mark.

E13. The chip part according to "E1." or "E2.," where the recess and/or projection includes a combination of the recessed mark according to any one of "E3." to "E7." and the projecting mark according to any one of "E8." to "E12."

E14. The chip part according to any one of "E1." to "E13.," where the recess and/or projection is formed to a pattern that is asymmetrical with respect to a center of gravity of the chip part in a plan view of the chip part and expresses a polarity of the electrode.

E15. The chip part according to any one of "E2." to "E13.," where the recess and/or projection is formed only on one side of the substrate and expresses a polarity of the electrode.

E16. The chip part according to "E14." or "E15.," where the element includes a diode and the recess and/or projection expresses a direction of an electrode connected to a cathode of the diode.

E17. The chip part according to any one of "E1." to "E13.," where the element is any one of a resistive film, a capacitive film or an inductive film and the chip part is any one of a chip resistor, a chip capacitor, or a chip inductor.

E18. A circuit assembly including a mounting substrate and the chip part according to any one of "E1." to "E17." mounted on the mounting substrate.

E19. An electronic equipment including a casing and the circuit assembly according to "E18." housed in the casing.

E20. A method for manufacturing chip part, including a step of forming elements respectively on a plurality of chip part forming regions on a substrate, a step of respectively forming electrodes electrically connected to the elements in the plurality of chip part forming regions on the substrate, a step of forming a groove extending along a boundary region between the plurality of chip part forming regions and having recesses and/or projections, expressing information related to the elements, at peripheral edge portions of the chip part forming regions, and a step of grinding the substrate until the groove is reached from a surface at a side opposite to the surface on which the groove is formed to separate the plurality of chip part forming regions along the groove and subdividing the regions to a plurality of chip parts.

E21. The method for manufacturing chip part according to "E20.," where the step of forming the groove includes plasma etching.

With the sixth invention, the recesses and/or projections are formed at the peripheral edge portions at the same time as cutting a base substrate, having the plurality of chip part regions, along the boundary region of the chip parts. A dedicated step for forming information related to the element thus does not have to be provided, and the productivity of the chip part can thus be improved. Also, the recess and/or projection formed at the peripheral edge portion functions as a marking so that information is indicated by the recess and/or projection, and a large space is thus not required to form a marking on a top surface or a rear surface of the chip part. Application to a micro type chip part is thus also possible.

More specifically, with the invention according to "E1.," the recess and/or projection expressing the information related to the element is formed at the peripheral edge portion of the element and the polarity direction, type name, date of manufacture, and other information on the element can thus be obtained based on the recess and/or projection. Also, an automatic mounting machine can readily recognize the recess and/or projection and the chip part can thus made suitable for automatic mounting.

With the invention according to "E2.," the recess and/or projection expressing the information is formed on one side in a plan view, and the polarity direction, etc., of the chip part can thus be expressed appropriately based on the position of the one side at which the recess and/or projection is formed.

With the invention according to "E3.," the peripheral edge portion of the chip part is not projected and information can be indicated by the recessed mark that is not liable to get caught.

With the invention according to "E4.," information can be indicated by the pattern of the positions at which the recessed marks are formed and therefore an abundant amount of information can be indicated. As mentioned in "E5.," when binary information is expressed by the presence/non-presence of the recessed mark and at least three position patterns of forming the recessed marks are provided, an information amount of $2^3$ can be indicated. The information amount can thus be increased to $2^4$ with four patterns, to $2^5$ with five patterns, etc.

With the invention according to "E6.," the information amount can be indicated more appropriately by changing the length of the recessed mark. Similarly, with the invention according to "E7.," the information can be expressed appropriately and simply by way of the mark length of the recessed mark.

With the invention according to "E8.," information can be indicated by the projecting mark that projects from the peripheral edge portion of the chip part and therefore an electrode pattern is not narrowed and solder strength (mounting strength) is not weakened.

With the invention according to "E9.," information can be indicated by the pattern of the positions at which the projecting marks are formed and therefore an abundant amount of information can be indicated. As mentioned in "E10.," when binary information is expressed by the presence/non-presence of the projecting mark and at least three position patterns of forming the projecting marks are provided, an information amount of $2^3$ can be indicated. The information amount can thus be increased to $2^4$ with four patterns, to $2^5$ with five patterns, etc.

With the invention according to "E11.," the information amount can be indicated more appropriately by changing the length of the projecting mark. Similarly, with the invention according to "E12.," the information can be expressed appropriately and simply by way of the mark length of the projecting mark. With the invention according to "E13.," an abundant amount of information can be indicated by combining the recessed mark and the projecting mark.

With the invention according to "E14.," the polarity of the electrode of the chip part can be marked appropriately. With the invention according to "E15.," the polarity of the electrode of the chip part can be indicated appropriately. With the invention according to "E16.," in a case where the chip part is a chip diode, the direction of the cathode electrode can be expressed appropriately.

With the invention according to "E17.," the information indication using the recess and/or projection according to the present information can be applied to a chip resistor, a chip capacitor, or a chip inductor.

With the invention according to "E18.," a circuit assembly of high precision, with which mounting has been performed accurately and appropriately can be provided.

With the invention according to "E19.," an electronic equipment of high precision and compact size can be provided.

With the inventions according to "E20." and "E21.," by forming the recess and/or projection mark by making use of a single process in the manufacturing process and without using a special step for forming the marking, predetermined information can be marked on the chip part without restricting the productivity of the chip part.

Preferred embodiments of the sixth invention shall now be described in detail with reference to the attached drawings.

Figure 81:
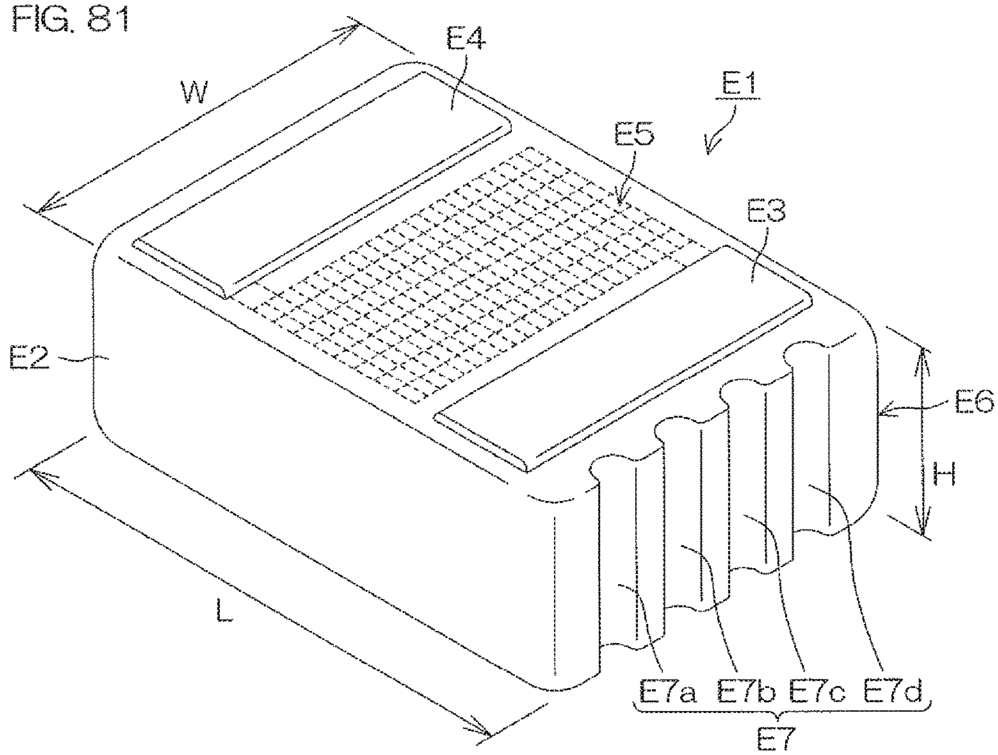
FIG. 81 is a perspective view of the external arrangement of a chip part according to a preferred embodiment of a sixth invention.

FIG. 81 is a perspective view of the external arrangement of a chip part according to a preferred embodiment of the sixth invention. The chip part E1 has a substrate E2 having a substantially rectangular parallelepiped shape and more specifically having a substantially rectangular shape in a plan view with chamfered corners and having a fixed thickness. The substrate E2 is small, with a size (dimensions) of length L=0.6 mm, width W=0.3 mm, and thickness T=0.3 mm, approximately, and depending on the product, the substrate is even smaller.

On a top surface of the substrate E2, a pair of electrodes E3 and E4 are formed near respective ends opposing each other in the length direction. Also, a central region E5 of the top surface of the substrate E2 sandwiched by the electrodes E3 and E4 is an element forming region and a functional element is embeddedly formed in the element forming region E5. The function element is, for example, a resistor, capacitor, inductor, or diode, etc., and the chip part E1 may be a chip resistor, a chip capacitor, a chip inductor, or a chip diode in accordance with the type of the functional element.

A feature of the chip part E1 according to the present preferred embodiment is that a plurality, four in the present preferred embodiment, of recessed marks E7 (E7*a*, E7*b*, E7*c*, and E7*d*), extending in an up/down direction (thickness direction of the substrate E2), are formed at a peripheral edge portion of the substrate E2 or, more specifically, at one side surface (one short side surface E6 extending in a length direction of the electrode E3 in the substrate E2) of the substrate E2. With each long groove that constitutes a recessed mark E7 and extends in the up/down direction (thickness direction of the substrate E2), the form of recess as viewed in a direction orthogonal to the length direction may be a semiarcuate shape, or may be a rectangular shape, or may be a triangular shape without a planar base. The recess may be of any form.

Figure 82A:
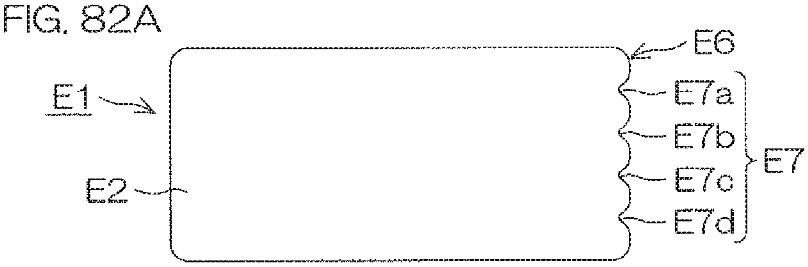
FIG. 82A to FIG. 82C are plan views of the chip part as viewed from a rear surface side (that is, bottom views of the chip part) and are diagrams for explaining the arrangement of recessed marks.
Figure 82B:
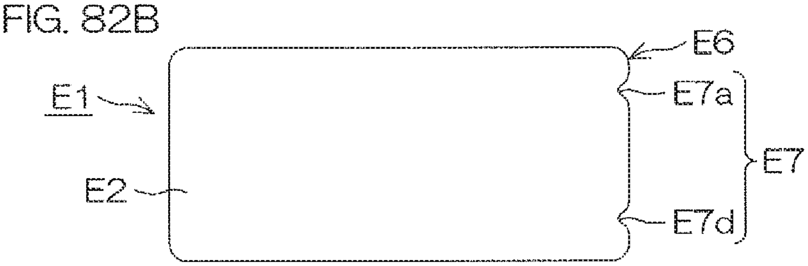
Figure 82C:
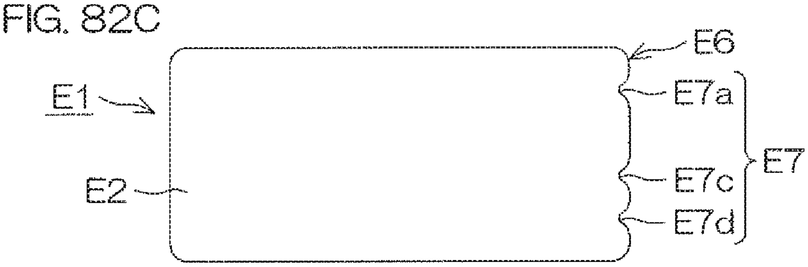

The recessed marks E7 indicate information, such as a polarity direction, type name, date of manufacture, etc., of the chip part by way of the positions and number of the recessed marks E7. FIG. 82A to FIG. 82C are plan views of the chip part E1 as viewed from a rear surface side (that is, bottom views of the chip part E1) and are diagrams for describing the arrangement of the recessed marks E7. As shown in FIG. 82A, the recessed marks E7 may be of an arrangement having four recessed marks E7a, E7b, E7c, and E7d formed at equal intervals at the one short side surface E6 of the substrate E2 (one short side in a plan view of the substrate E2).

Also, as shown in FIG. 82B, the recessed marks E7 may be the two recessed marks E7a and E7d positioned at the respective outer sides. Or, as shown in FIG. 82C, the recessed marks E7 may be the three recessed marks E7a, E7c, and E7d. Arrangements are thus made so that, for example, four recessed marks E7 can be formed at equal intervals along the one short side E6, and by arranging to form certain recessed marks E7 or not to form certain recessed marks E7, binary information can be indicated by the presence/non-presence of a single recessed mark E7.

With the present preferred embodiment, a maximum of four of the recessed marks E7, each of which indicates binary information, can be formed and therefore in regard to information amount, the chip part E1 can be made to have an information amount of $2\times2\times2\times2=2^4$. The compact chip part E1 is thus provided with an outer appearance feature (the recessed marks E7) that expresses information along the short side E6, and information required of the chip part E1 can be expressed by a method that takes the place of marking. An automatic mounting machine, etc., can easily recognize the type, polarity direction, date of manufacture, and other information of the chip part E1. The chip part E1 can thus be made suitable for automatic mounting.

Figure 83A:
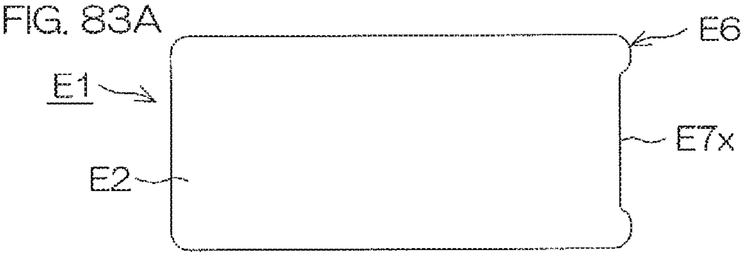
FIG. 83A to FIG. 83C are plan views of the chip part as viewed from the rear surface side and are diagrams showing modification examples of a recessed mark.
Figure 83B:
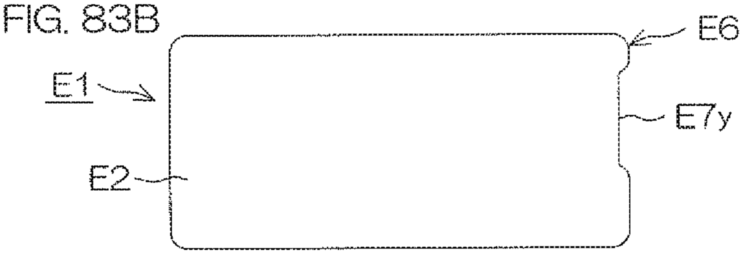
Figure 83C:
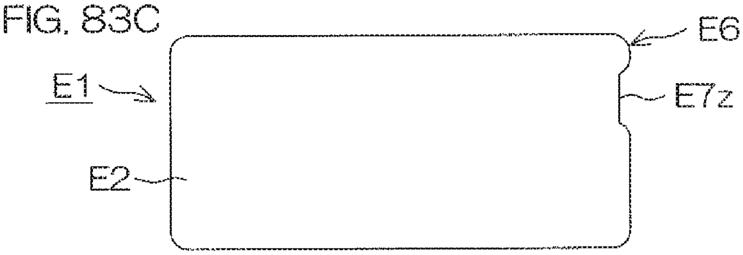

FIG. 83A to FIG. 83C are plan views of the chip part E1 as viewed from the rear surface side and are diagrams showing modification examples of the recessed marks E7. The chip part E1 of FIG. 83A is an arrangement example where a long recessed mark E7x extending in the length direction of the one short side surface E6 of the substrate E2 is formed at the short side surface E6. As shown in FIG. 83B or FIG. 83C, the long recessed mark E7x may be changed to a recessed mark E1y or E7z that is differed in length. That is, the preferred embodiment shown in FIG. 83A to FIG. 83C is an embodiment in which the recessed mark E7 formed at the one short side surface E6 of the substrate E2 is arranged to differ in width and information is indicated by the three types E7x, E7y, and E7z of wide width, medium width, and narrow width.

Figure 84A:
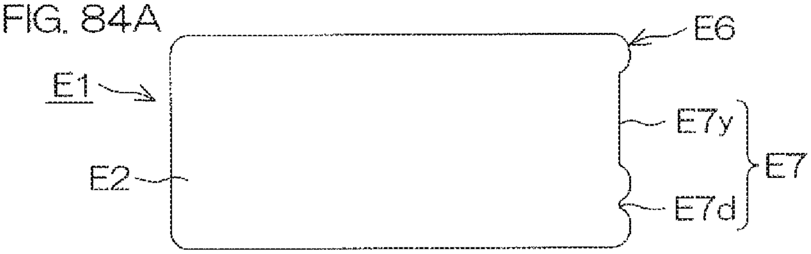
FIG. 84A and FIG. 84B are diagrams of examples with which the types of information that can be indicated by the recessed mark are made abundant by varying the types and positions of recessed mark grooves.
Figure 84B:
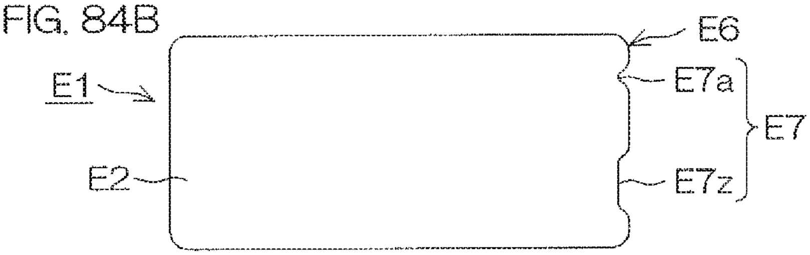

Further, in regard to the recessed marks E7 formed at the short side surface E6 of the substrate E2, the plurality of recessed marks E7a, E7b, E7c, and E7d of fixed width described with reference to FIG. 82A to FIG. 82C and the recessed marks E7x, E7y, and E7z of variable width described with reference to FIG. 83A to FIG. 83C may be combined to vary the types and positions of the recessed marks E7 as in a combination of the recessed mark E7y of wide width and the recessed mark E7d of fixed width shown in FIG. 84A or a combination of the recessed mark E7z of narrow width and the recessed mark E7a of fixed width shown in FIG. 84B to make abundant the types of information that can be indicated by the recessed marks E7.

Figure 85:
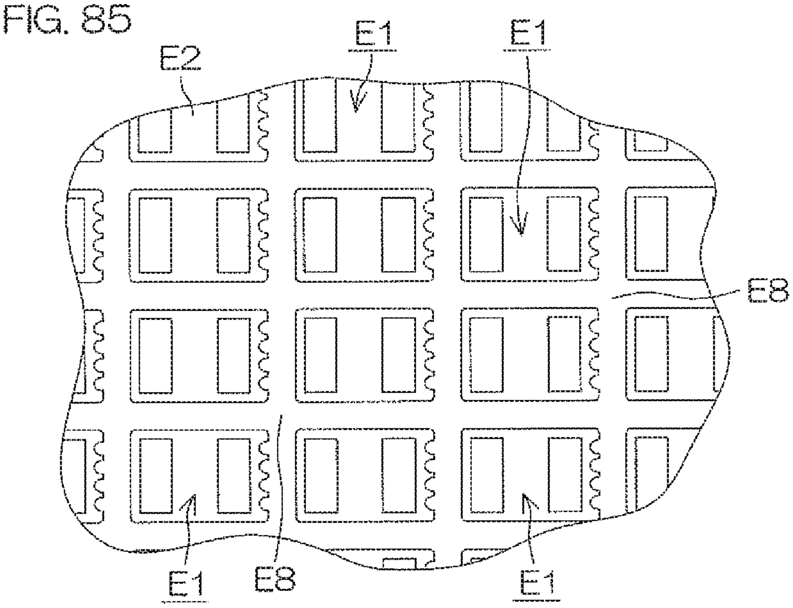
FIG. 85 is an illustrative plan view for describing a portion of a manufacturing process of the chip part.

FIG. 85 is an illustrative plan view for describing a portion of a manufacturing process of the chip part E1. With the chip part E1, numerous chip parts are formed in a batch on a substrate (base substrate) E2 so as to be arrayed in a matrix on the base substrate E2. The numerous chip parts E1 that have been formed are separated into individual chip parts E1 by cutting along a boundary region E8. The boundary region E8 extends in a lattice form so as to surround the peripheries of the chip parts E1. The boundary region E8 is dug in from a top surface side of the substrate (base substrate) E2, for example, by etching. As the etching, for example, plasma etching is employed.

Figure 86:
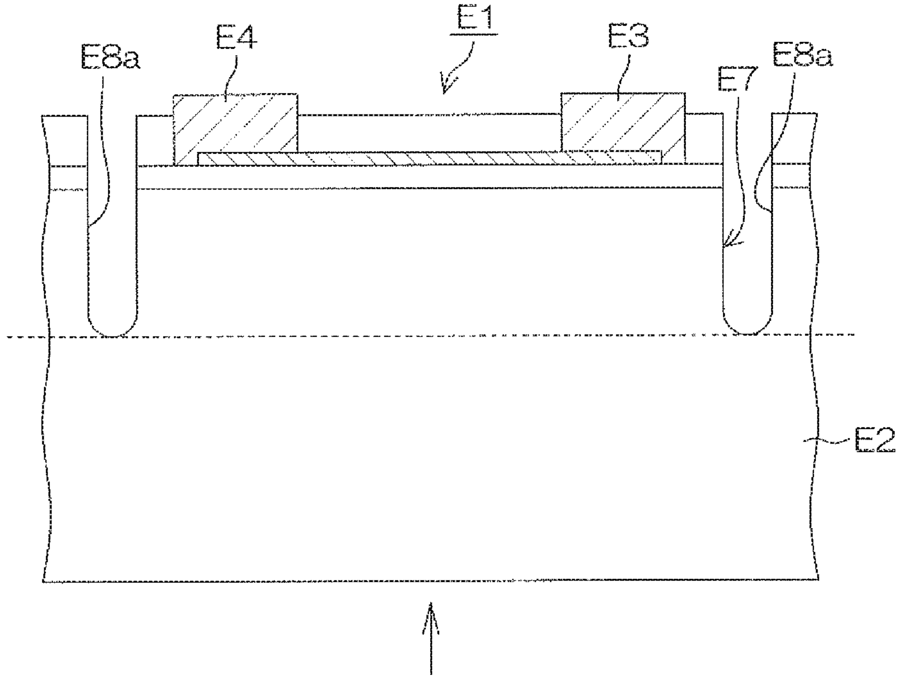
FIG. 86 is an illustrative sectional view of an example of a manufacturing process of the chip part.

By the etching of the boundary region E8, a separation groove E8a is formed in the substrate (base substrate) E2 at the boundary region E8 portion as shown in the illustrative sectional view of FIG. 86. While forming the separation groove E8a, the recessed marks E7 described above can be formed along the one short side surface E6 of each chip part E1 at the same time. That is, by designing the mask for etching used in the process of plasma etching the boundary region E8, the recessed marks E7 can be formed at the same time by plasma etching.

Thereafter, the base substrate E2 is ground from the rear surface side and by the grinding reaching the bottom of the boundary groove E8a, the respective chip parts E1 are separated into the individual chip parts E1, and the chip parts E1 are thereby completed. With the manufacturing method of the present preferred embodiment, the recessed marks E7 are thus formed at the peripheral edge portions at the same time as cutting the base substrate, having the plurality of chip part regions, along the boundary region of the chip parts. There is thus no need to provide a dedicated step for recording the information related to the chip part E1 and the productivity of the chip part E1 can thus be improved. Also, the information of the chip part E1 is indicated by the recessed marks E7 formed at the one short side surface E6 and therefore a large space for forming a marking is not required at the top surface or the rear surface of the chip part E1. Application to a micro type chip part is thus also possible.

With the preferred embodiment described above, arrangements of forming the recessed marks E7 (E7a, E7b, E7c, E7d, E7x, E1y, E7z) at the one short side surface E6 of the substrate E2 of the chip part E1 was described. However, the position of formation of the recessed marks E7 is not restricted to the one short side surface E6 and it suffices that the marks be formed at a peripheral edge portion of the substrate E2.

Although with the chip part E1 according to the preferred embodiment, the preferred embodiment, with which the plurality of recessed marks E7 extending in the up/down direction are formed at the peripheral edge portion of the substrate E2, were described, the recessed marks E7 may be replaced by projecting marks.

Figure 87:
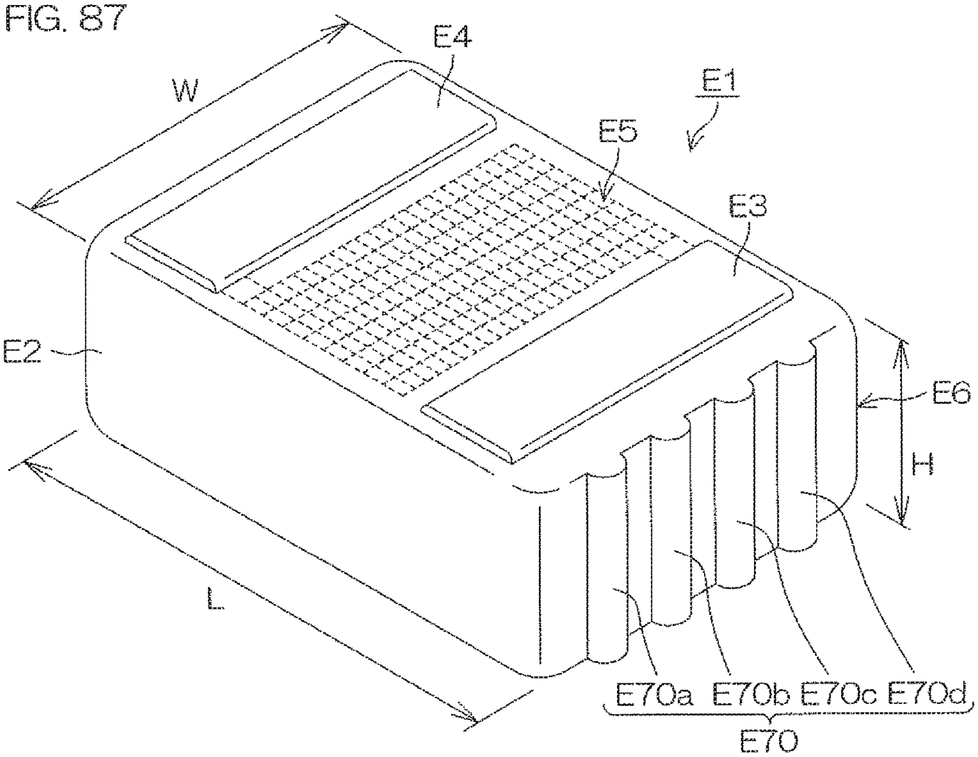
FIG. 87 is a perspective view of the external arrangement of a chip part according to a preferred embodiment of the sixth invention and is a diagram showing an example of a preferred embodiment provided with projecting marks.

A preferred embodiment provided with projecting marks shall now be described specifically with reference to the drawings. FIG. 87 is a perspective view of the external arrangement of a chip part according to another preferred embodiment of the sixth invention. The chip part E1 has the substrate E2 having a substantially rectangular parallelepiped shape and more specifically having a substantially rectangular shape in a plan view with chamfered corners and having a fixed thickness. The substrate E2 is small, with a size (dimensions) of length L=0.6 mm, width W=0.3 mm, and thickness T=0.3 mm, approximately, and depending on the product, the substrate is even smaller.

On the top surface of the substrate E2, the pair of electrodes E3 and E4 are formed near respective ends opposing each other in the length direction. Also, the central region E5 of the top surface of the substrate E2 sandwiched by the electrodes E3 and E4 is an element forming region and a functional element is embeddedly formed in the element forming region E5. The function element is, for example, a resistor, capacitor, inductor, or diode, etc., and the chip part E1 may be a chip resistor, a chip capacitor, a chip inductor, or a chip diode in accordance with the type of the functional element.

A feature of the chip part E1 according to the present preferred embodiment is that a plurality, four in the present preferred embodiment, of projecting marks E70 (E70*a*, E70*b*, E70*c*, and E70*d*), extending in the up/down direction, are formed at a peripheral edge portion of the substrate E2 or, more specifically, at one side surface (the side surface E6 at one short side extending in a length direction of the electrode E3 in the substrate E2) of the substrate E2. With each ridge or projecting band that constitutes a projecting mark E70 and extends in the up/down direction (thickness direction of the substrate E2), the form of projection as viewed in a direction orthogonal to the length direction may be a semiarcuate shape, or may be a rectangular shape, or may be a triangular shape. The form may also be a rectangular shape with rounded corners or a rounded triangular shape. In other words, the projection may be formed as a ridge or projecting band of any form.

Figure 88A:
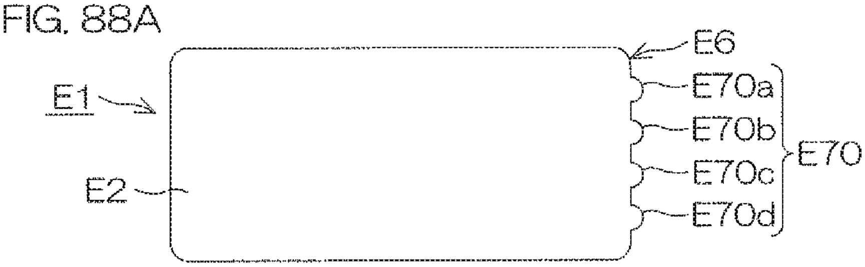
FIG. 88A to FIG. 88C are plan views of the chip part as viewed from a rear surface side (that is, bottom views of the chip part) and are diagrams for explaining the arrangement of the projecting marks.
Figure 88B:
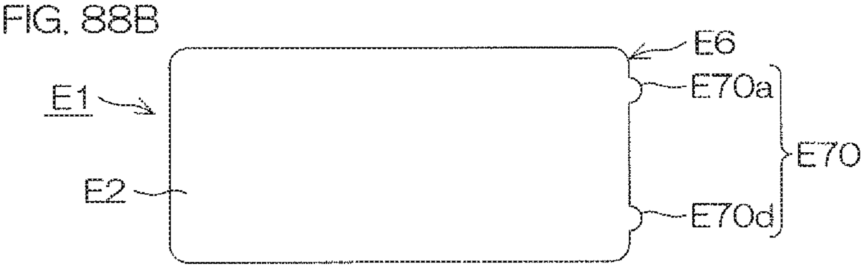
Figure 88C:
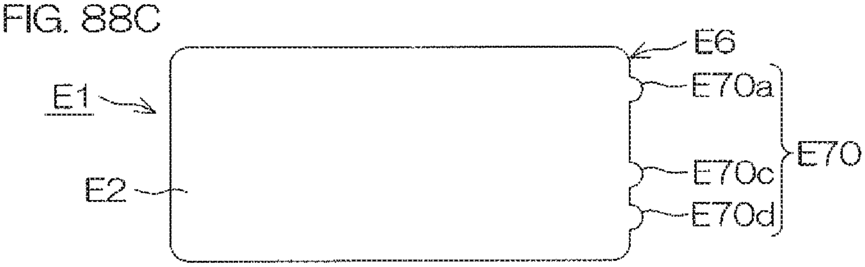

The projecting marks E70 indicate information, such as a polarity direction, type name, date of manufacture, etc., of the chip part by way of the positions and number of the projecting marks E70. FIG. 88A to FIG. 88C are plan views of the chip part E1 as viewed from a rear surface side (that is, bottom views of the chip part E1) and are diagrams for describing the arrangement of the projecting marks E70.

As shown in FIG. 88A, the projecting marks E70 may be of an arrangement having four projecting marks E70*a*, E70*b*, E70*c*, and E70*d* formed at equal intervals at the one short side surface E6 of the substrate E2 (one short side in a plan view of the substrate E2).

Also, as shown in FIG. 88B, the projecting marks E70 may be the two projecting marks E70*a* and E70*d* positioned at the respective outer sides. Or, as shown in FIG. 88C, the projecting marks E70 may be the three projecting marks E70*a*, E70*c*, and E70*d*. Arrangements are thus made so that, for example, four projecting marks E70 can be formed at equal intervals along the one short side E6, and by arranging to form certain projecting marks E70 or not to form certain projecting marks E70, binary information can be indicated by the presence/non-presence of a single projecting mark E70.

With the present preferred embodiment, a maximum of four of the projecting marks E70, each of which indicates binary information, can be formed and therefore in regard to information amount, the chip part E1 can be made to have an information amount of $2\times2\times2\times2=2^4$. The compact chip part E1 is thus provided with an outer appearance feature (the projecting marks E70) that expresses information along the short side E6, and information required of the chip part E1 can be expressed by a method that takes the place of marking. An automatic mounting machine, etc., can easily recognize the type, polarity direction, date of manufacture, and other information of the chip part E1. The chip part E1 can thus be made suitable for automatic mounting.

Figure 89A:
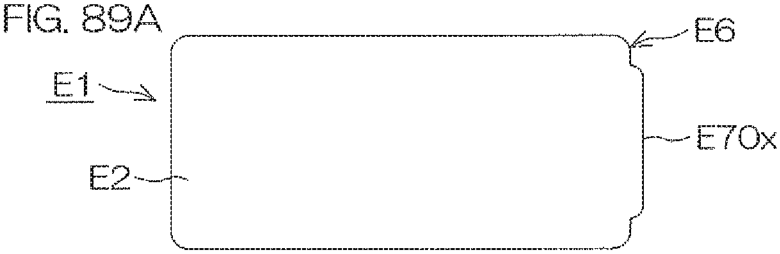
FIG. 89A to FIG. 89C are plan views of the chip part as viewed from the rear surface side and are diagrams showing modification examples of a projecting mark.
Figure 89B:
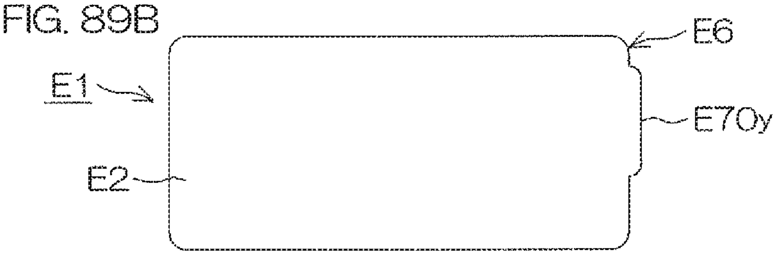
Figure 89C:
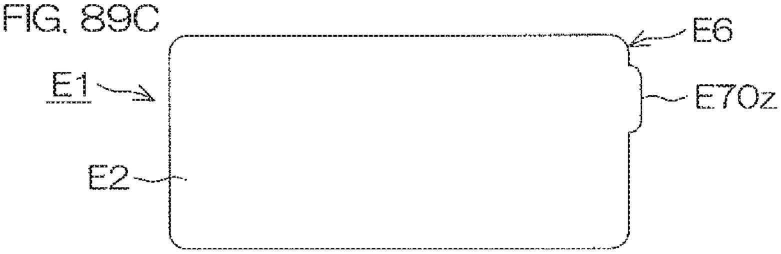

FIG. 89A to FIG. 89C are plan views of the chip part E1 as viewed from the rear surface side and are diagrams showing modification examples of the projecting marks E70. The chip part E1 of FIG. 89A is an arrangement example where a long projecting mark E70*x* extending in the length direction of the one short side surface E6 of the substrate E2 is formed at the short side surface E6. As shown in FIG. 89B or FIG. 89C, the long projecting mark E70*x* may be changed to a projecting mark E70*y* or E70*z* that is differed in length. That is, the preferred embodiment shown in FIG. 89A to FIG. 89C is an embodiment in which the projecting mark E70 formed at the one short side surface E6 of the substrate E2 is arranged to differ in width and information is indicated by the three types E70*x*, E70*y*, and E70*z* of wide width, medium width, and narrow width.

Figure 90A:
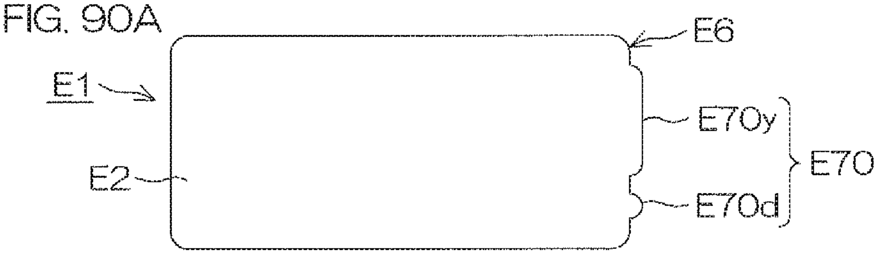
FIG. 90A and FIG. 90B are diagrams of examples with which the types of information that can be indicated by the projecting mark are made abundant by varying the types and positions of the projecting marks.
Figure 90B:
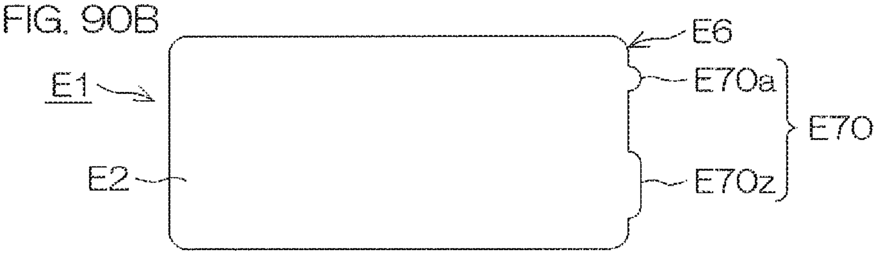

Further, in regard to the projecting marks E70 formed at the short side surface E6 of the substrate E2, the plurality of projecting marks E70*a*, E70*b*, E70*c*, and E70*d* of fixed width described with reference to FIG. 88A to FIG. 88C and the projecting marks E70*x*, E70*y*, and E70*z* of variable width described with reference to FIG. 89A to FIG. 89C may be combined to vary the types and positions of the projecting marks E70 as in a combination of the projecting mark E70*y* of wide width and the projecting mark E70*d* of fixed width shown in FIG. 90A or a combination of the projecting mark E70*z* of narrow width and the projecting mark E70*a* of fixed width shown in FIG. 90B to make abundant the types of information that can be indicated by the projecting marks E70.

Figure 91:
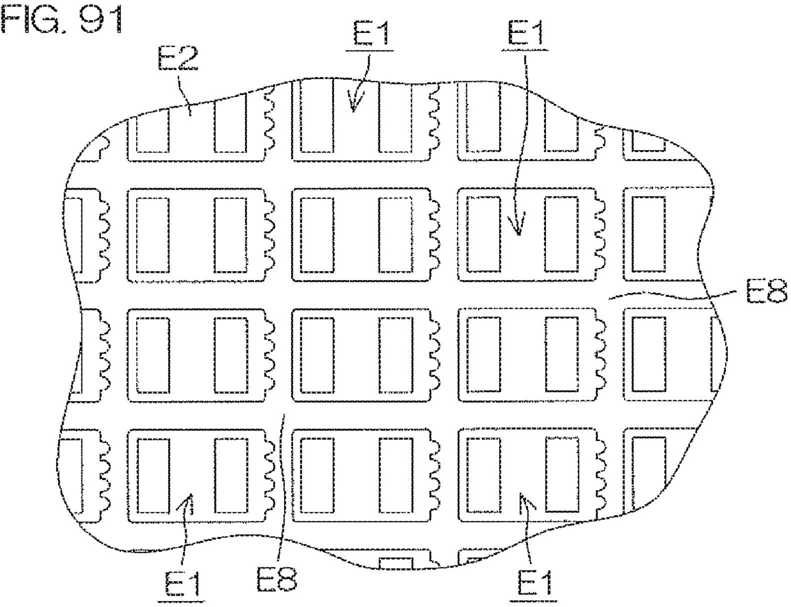
FIG. 91 is an illustrative plan view for describing a portion of a manufacturing process of a chip part.

FIG. 91 is an illustrative plan view for describing a portion of a manufacturing process of the chip part E1. With the chip part E1, multiple chip parts are formed in a batch on the substrate (base substrate) E2 so as to be arrayed in a matrix on the base substrate E2. The multiple chip parts E1 that have been formed are separated into individual chip parts E1 by cutting along the boundary region E8. The boundary region E8 extends in a lattice form so as to surround the peripheries of the chip parts E1. The boundary region E8 is dug in from a top surface side of the substrate (base substrate) E2, for example, by etching. As the etching, for example, plasma etching is employed.

Figure 92:
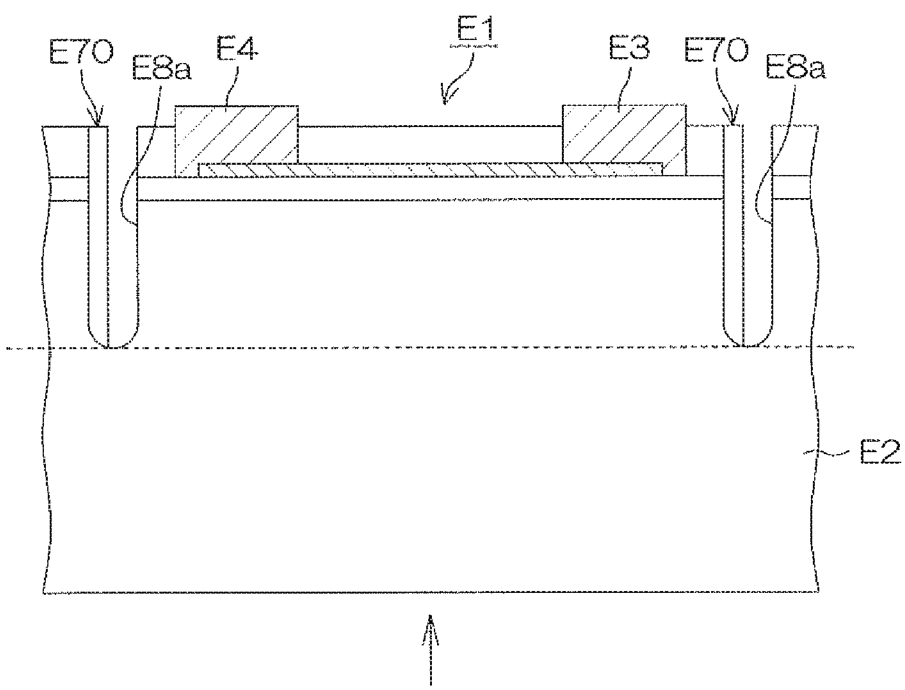
FIG. 92 is an illustrative sectional view of an example of a manufacturing process of the chip part.

By the etching of the boundary region E8, the separation groove E8*a* is formed in the substrate (base substrate) E2 at the boundary region E8 portion as shown in the illustrative sectional view of FIG. 92. While forming the separation groove E8*a*, the projecting marks E70 described above can be formed along the one short side surface E6 of each chip part E1 at the same time. That is, by designing the mask for etching used in the process of plasma etching the boundary region E8, the projecting marks E70 can be formed at the same time by plasma etching.

Thereafter, the base substrate E2 is ground from the rear surface side and by the grinding reaching the bottom of the boundary groove E8*a*, the respective chip parts E1 are separated into the individual chip parts E1, and the chip parts E1 are thereby completed. With the manufacturing method of the present preferred embodiment, the projecting marks E70 are thus formed at the peripheral edge portions at the same time as cutting the base substrate, having the plurality of chip part regions, along the boundary region of the chip parts. There is thus no need to provide a dedicated step for recording the information related to the chip part E1 and the productivity of the chip part E1 can thus be improved. Also, the information of the chip part E1 is indicated by the projecting marks E70 formed at the one short side surface E6 and therefore a large space for forming a marking is not required at the top surface or the rear surface of the chip part E1. Application to a micro type chip part is thus also possible.

With the preferred embodiment described above, arrangements of forming the projecting marks E70 (E70*a*, E70*b*, E70*c*, E70*d*, E70*x*, E70*y*, E70 *z*) at the one short side surface E6 of the substrate E2 of the chip part E1 was described. However, the position of formation of the projecting marks E70 is not restricted to the one short side surface E6 and it suffices that the marks be formed at a peripheral edge portion of the substrate E2.

Also although with the preferred embodiments, the recessed marks E7 were described as the first preferred embodiment and the projecting marks E70 were described as the next preferred embodiment, arrangements in which the recessed marks E7 and the projecting marks E70 are combined are also possible. That is, a shape, which, when viewed as a whole, expresses information by way of recesses and/or projections is also possible.

Further, in separating the chip parts E1 by cutting, plasma etching is applied along the boundary region E8, and by changing the etching conditions of the plasma etching, the shape of the cut end surface of each chip part E1 may be formed to an end surface that is vertical from the top surface to the rear surface, an end surface with an inclination in a direction of spreading from the top surface to the rear surface (inclination in an increasing direction), an end surface with an inclination in a direction of narrowing from the top surface to the rear surface (inclination in an gouging direction), etc., and the end surface may thus be formed to an inclined surface besides a vertical surface, and the recessed marks E7 and the projecting marks E70 may be made marks extending vertically or extending in the inclination direction accordingly. Inclinations of the recessed marks E7 and projecting marks E70 can thus be added by control of the etching conditions to make the marks richer in information amount.

As more specific preferred embodiments, a chip resistor, a chip capacitor, a chip diode, and a chip inductor shall now be described specifically.

Description of a Preferred Embodiment of a Chip Resistor

Figure 93A:
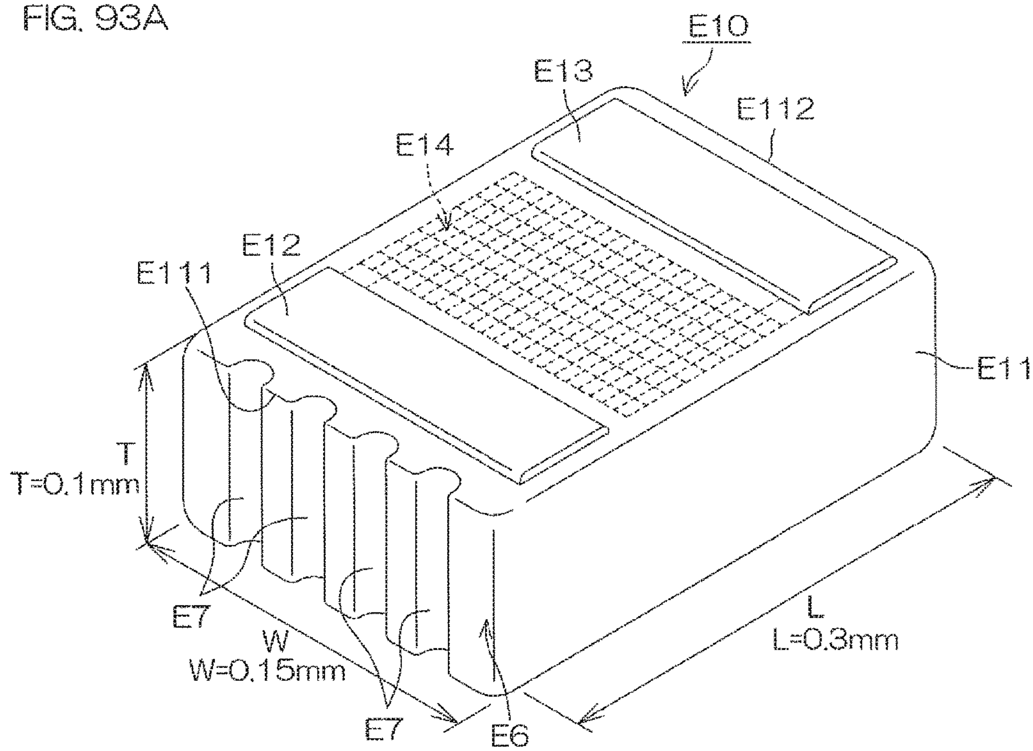
FIG. 93A is an illustrative perspective view of the external arrangement of a chip resistor according to a preferred embodiment of the sixth invention.
Figure 93B:
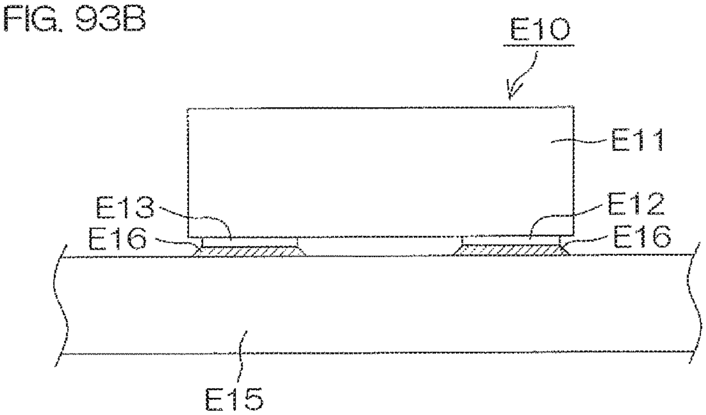
FIG. 93B is a side view of a state where the chip resistor is mounted on a substrate.

FIG. 93A is an illustrative perspective view of the external arrangement of a chip resistor E10 according to a preferred embodiment of the sixth invention, and FIG. 93B is a side view of a state where the chip resistor E10 is mounted on a substrate.

Referring to FIG. 93A, the chip resistor E10 according to the preferred embodiment of the sixth invention includes a first connection electrode E12, a second connection electrode E13, and a resistor network E14 that are formed on a substrate E11. The substrate E11 has a rectangular parallelepiped shape with a substantially rectangular shape in a plan view and is a minute chip with, for example, the length in the long side direction being L=0.3 mm, the width in the short side direction being W=0.15 mm, and the thickness being T=0.1 mm, approximately. In a plan view, the substrate E11 has a corner-rounded shape with the corners being chamfered. For example, a maximum of four recessed marks E7 extending in an up/down direction are formed at one side surface (one short side surface E6 extending in a length direction of the first connection electrode E12 in the substrate E11) of the substrate E11. As in the preferred embodiment described above, the recessed marks function as a marking expressing information of the chip resistor E10. The substrate E11 may be formed, for example, of silicon, glass, ceramic, etc. With the preferred embodiments described below, cases where the substrate E11 is a silicon substrate shall be described as examples.

On the substrate E11, the first connection electrode E12 is a rectangular electrode that is disposed along one short side E111 of the substrate E11 and is long in the short side E111 direction. The second connection electrode E13 is a rectangular electrode that is disposed on the substrate E11 along the other short side E112 and is long in the short side E112 direction. The resistor network E14 is provided in a central region (circuit forming surface or element forming surface) on the substrate E11 sandwiched by the first connection electrode E12 and the second connection electrode E13. One end side of the resistor network E14 is electrically connected to the first connection electrode E12 and another end side of the resistor network E14 is electrically connected to the second connection electrode E13. The first connection electrode E12, the second connection electrode E13, and the resistor network E14 may be provided on the substrate E11 by using, for example, a microfabrication process. In particular, by using a photolithography process to be described below, the resistor network E14 with a fine and accurate pattern can be formed.

The first connection electrode E12 and the second connection electrode E13 respectively function as external connection electrodes. In a state where the chip resistor E10 is mounted on a circuit substrate E15, the first connection electrode E12 and the second connection electrode E13 are respectively connected electrically and mechanically by solder to circuits (not shown) of the circuit substrate E15 as shown in FIG. 93B. The first connection electrode E12 and the second connection electrode E13 that function as external connection electrodes are preferably formed of gold (Au) at least at the surface regions or has gold plating applied on the surfaces thereof to improve solder wettability and improve reliability.

Figure 94:
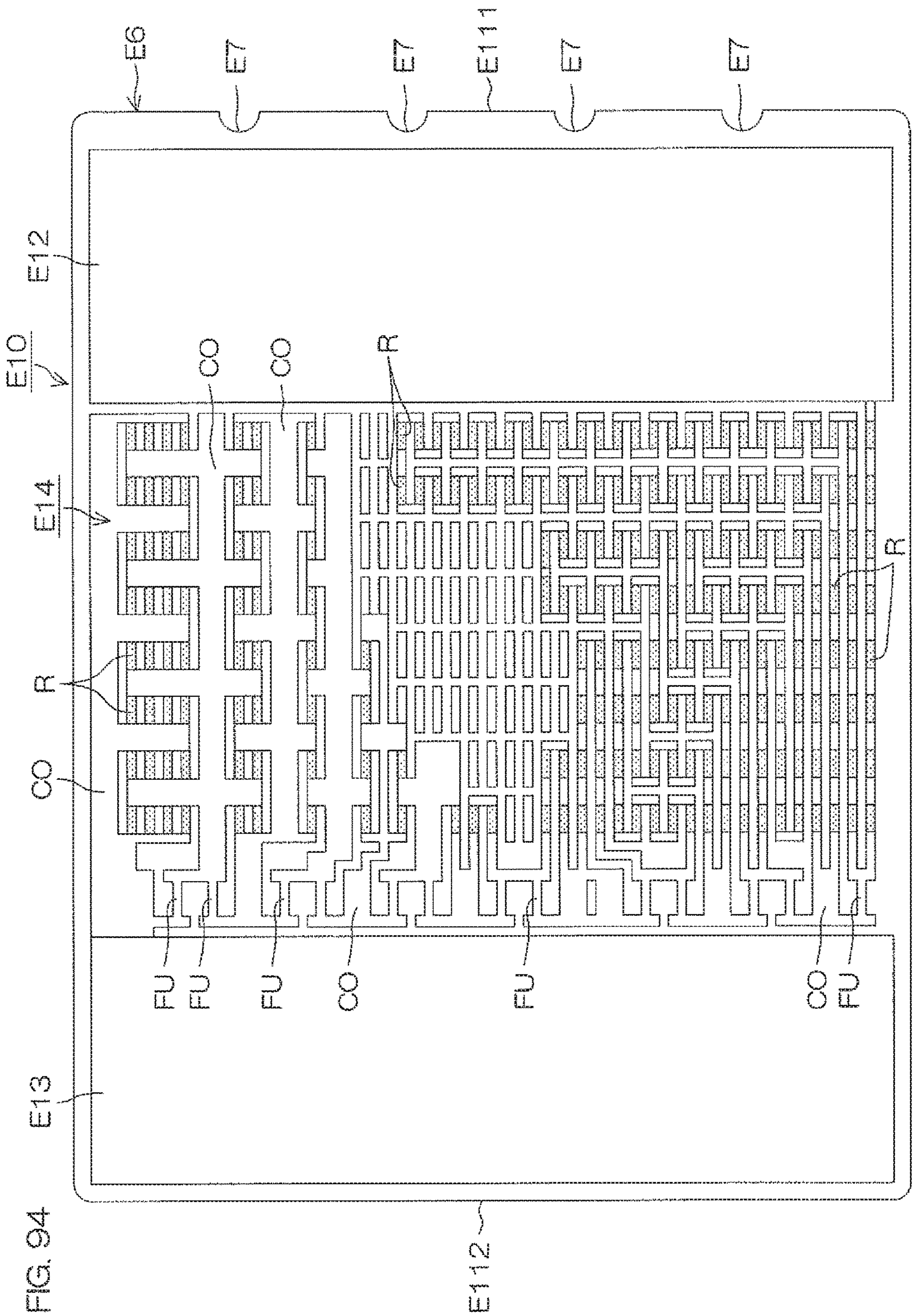
FIG. 94 is a plan view of the chip resistor and is a diagram of the positional relationship of a first connection electrode, a second connection electrode, and a resistor network and the arrangement in a plan view of the resistor network.

FIG. 94 is a plan view of the chip resistor E10 showing the positional relationships of the first connection electrode E12, the second connection electrode E13, and the resistor network E14 and showing the arrangement (layout pattern) in a plan view of the resistor network E14. With reference to FIG. 94, the chip resistor E10 includes the first connection electrode E12, disposed so that its long side extends along the one short side E111 of the substrate E11 upper surface and having the long, substantially rectangular shape in a plan view, the second connection electrode E13, disposed so that its long side extends along the other short side E112 of the substrate E11 upper surface and having the long, substantially rectangular shape in a plan view, and the resistor network E14 provided in the region of rectangular shape in a plan view between the first connection electrode E12 and the second connection electrode E13.

The resistor network E14 has a plurality of unit resistor bodies R having an equal resistance value and being arrayed in a matrix on the substrate E11 (the example of FIG. 94 has an arrangement with a total of 352 unit resistor bodies R with 8 unit resistor bodies R being arrayed along the row direction (length direction of the substrate E11) and 44 unit resistor bodies R being arrayed along the column direction (width direction of the substrate E11)). Predetermined numbers of one to 64 of these numerous resistor bodies R are electrically connected by conductor films CO (the conductor films CO are wiring films, preferably formed of an aluminum-based metal, such as Al, AlSi, AlSiCu, or AlCu, etc.) to form a plurality of types of resistor circuits in accordance with the number of unit resistor bodies R connected.

Further, a plurality of fuses FU (which are wiring films that may also be referred to hereinafter as "fuses" and are preferably formed of an aluminum-based metal film of Al, AlSi, AlSiCu, or AlCu, etc., that is the same material as that of the conductor films CO) are provided that are capable of being fused to electrically incorporate resistor circuits into the resistor network E14 or electrically separate resistor circuits from the resistor network E14. The plurality of fuses FU are arrayed along the inner side of the second connection electrode E13 so that the arrangement region thereof is rectilinear. More specifically, the plurality of fuses FU and the connection conductor films, that is, the wiring films CO are disposed so as to be arrayed adjacently and so that the arraying direction is rectilinear.

Figure 95A:
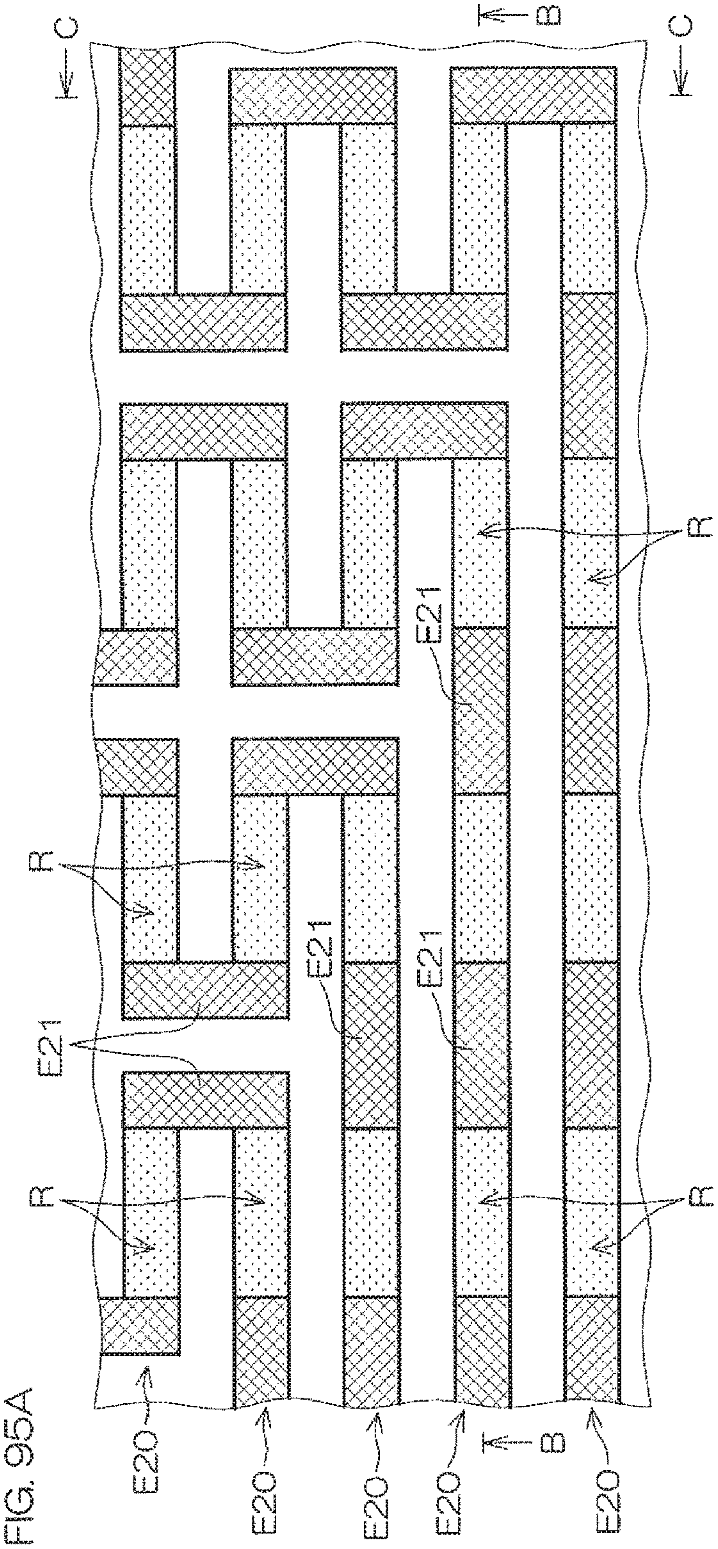
FIG. 95A is an enlarged plan view of a portion of the resistor network shown in FIG. 94.
Figure 95B:
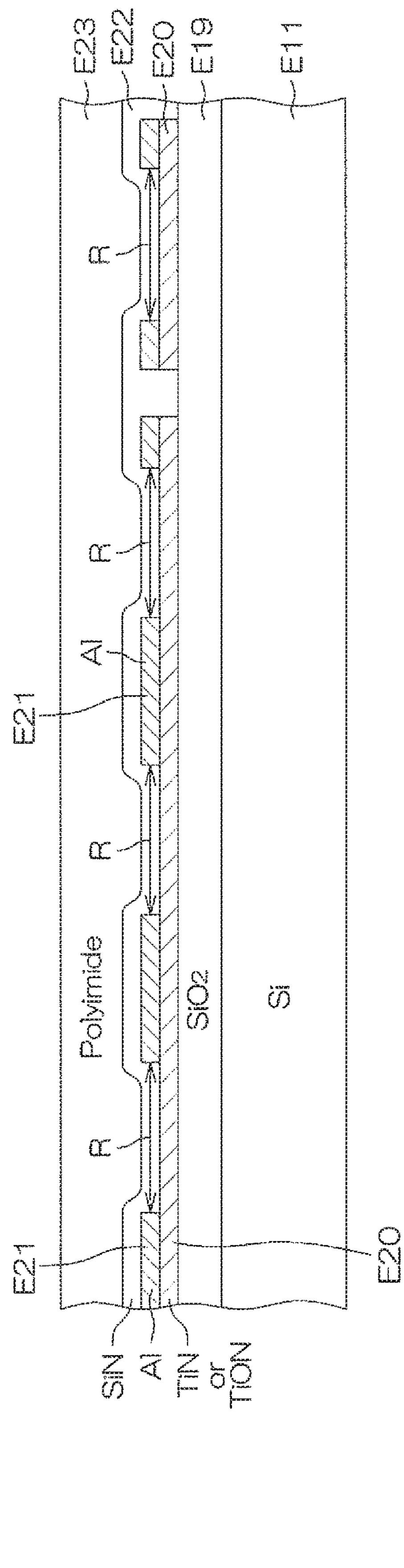
FIG. 95B is a structural sectional view taken along B-B in FIG. 95A.
Figure 95C:
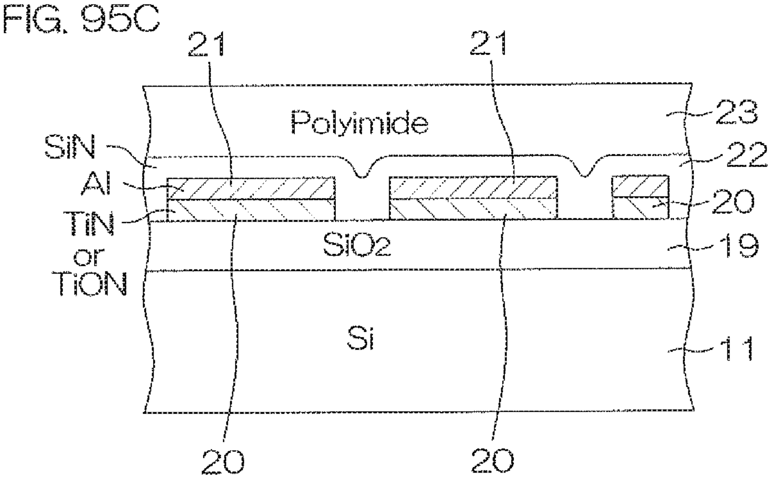
FIG. 95C is a structural sectional view taken along C-C in FIG. 95A.

FIG. 95A is an enlarged plan view of a portion of the resistor network E14 shown in FIG. 94. FIG. 95B is a structural sectional view taken along B-B in FIG. 95A, and FIG. 95C is a structural sectional view taken along C-C in FIG. 95A. The arrangement of the unit resistor bodies R shall now be described with reference to FIG. 95A, FIG. 95B, and FIG. 95C.

On an upper surface of the substrate E11, an insulating layer ($SiO_2$) E19 is formed, and resistor body films E20 are disposed on the insulating film E19. The resistor body films E20 are made of a material containing one or more types of material selected from the group consisting of NiCr, NiCrAl, NiCrSi, NiCrSiAl, TaN, $TaSiO_2$, TiN, TiNO, and TiSiON. By forming the resistor body films E20 from such a material, microfabrication by photolithography is made possible. Also, a chip resistor of accurate resistor value that does not change readily in resistance value due to effects of temperature characteristics can be prepared. The resistor body films E20 are arranged as a plurality of resistor body films (hereinafter referred to as "resistor body film lines") extending in parallel and rectilinearly between the first connection electrode E12 and the second connection electrode E13, and there are cases where a resistor body film line E20 is cut at predetermined positions in the line direction. For example, aluminum films are laminated as conductor film pieces E21 on the resistor body film lines E20. The respective conductor film pieces E21 are laminated on the resistor body film lines 20 while being spaced apart by fixed intervals R in the line direction.

Figure 96:
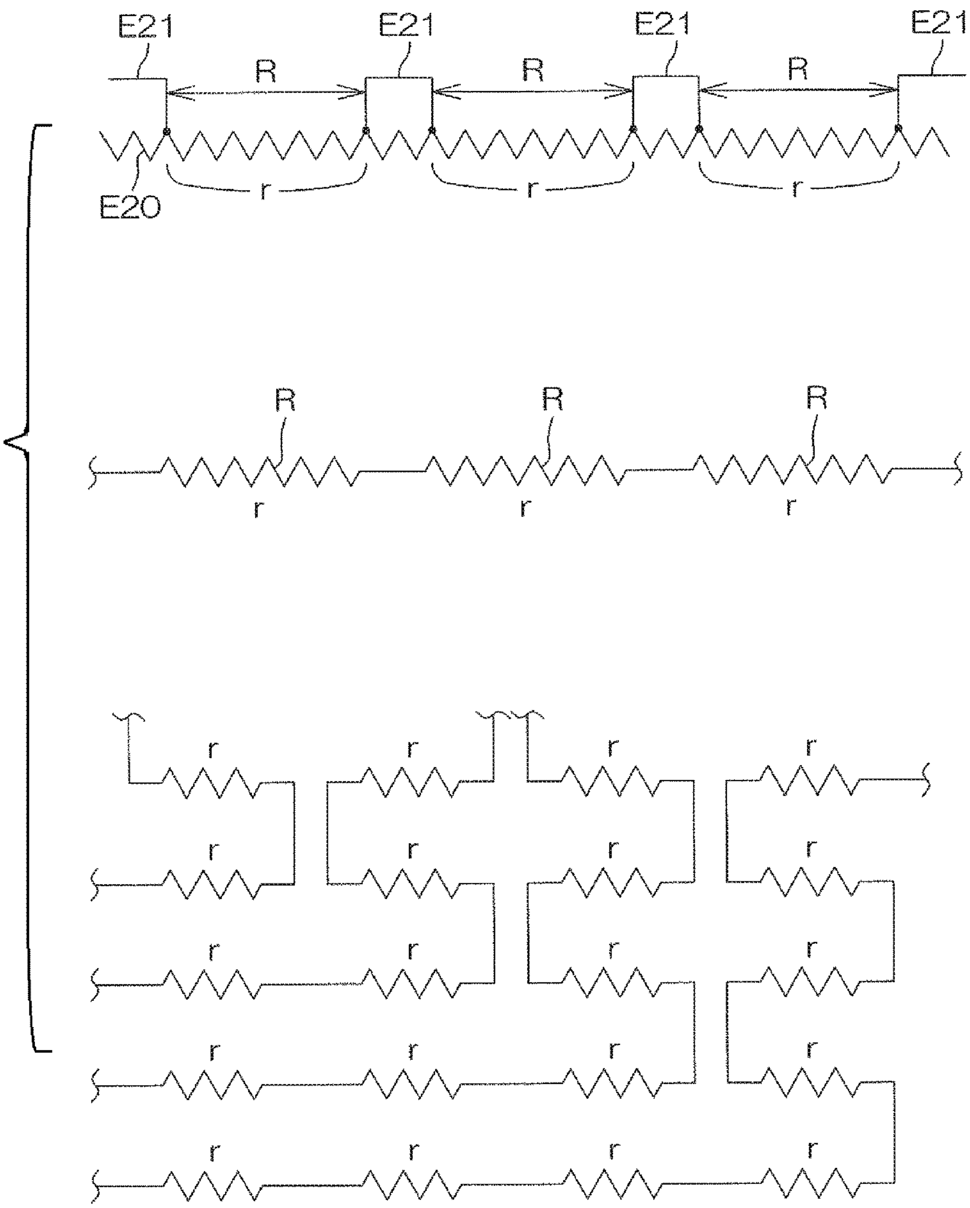
FIG. 96 shows diagrams showing the electrical features of resistor body film lines and conductor films in the form of circuit symbols and an electric circuit diagram.

The electrical features of the resistor body film lines E20 and the conductor film pieces E21 of the present arrangement are indicated by circuit symbols in FIG. 96A to FIG. 96C. That is, as shown in FIG. 96A, each of the resistor body film line E20 portions in regions of the predetermined interval R forms a unit resistor body R with a fixed resistance value r. In each region at which a conductor film piece E21 is laminated, the resistor body film line 20 is short-circuited by the conductor film piece E21. A resistor circuit, constituted of serial connections of resistor bodies R of resistance r, is thus formed as shown in FIG. 96B.

Also, adjacent resistor body film lines E20 are connected to each other by the resistor body film lines E20 and conductor film pieces E21 and therefore the resistor network shown in FIG. 95A forms the resistor circuit shown in FIG. 96C. Also in the illustrative sectional views of FIG. 95B and FIG. 95C, the reference symbol E11 indicates the substrate, E19 indicates the silicon dioxide $SiO_2$ layer as the insulating layer, E20 indicates the resistor body film formed on the insulating layer E19, E21 indicates the wiring film made of aluminum (Al), E22 indicates an SiN film as a protective film, and E23 indicates a polyimide layer as a protective layer.

As mentioned above, the material of the resistor body films E20 is constituted of the material containing one or more types of material selected from the group consisting of NiCr, NiCrAl, NiCrSi, NiCrSiAl, TaN, $TaSiO_2$, TiN, TiNO, and TiSiON. Also, the film thickness of the resistor body films E20 is preferably 300 Å to 1 μm. This is because by setting the film thickness of the resistor body film E20 in this range, a temperature coefficient of 50 ppm/° C. to 200 ppm/° C. can be realized for the resistor body films E20 and the chip resistor becomes one that is not readily influenced by temperature characteristics.

A chip resistor that is satisfactory for practical use can be obtained if the temperature coefficient of the resistor body films E20 is less than 1000 ppm/° C. Further, the resistor body films E20 are preferably structures that include line-like elements having a line width of 1 μm to 1.5 μm. This is because miniaturization of the resistor circuit and satisfactory temperature characteristics can then be realized at the same time. In place of Al, the wiring films E21 may be constituted of an aluminum-based metal film, such as AlSi, AlSiCu, or AlCu. By thus forming the wiring films E21 (including the fuses FU) from an aluminum-based metal film, the processing precision can be improved.

The manufacturing process of the resistor network E14 of the present arrangement shall be described in detail later. In the present preferred embodiment, the unit resistor bodies R, included in the resistor network E14 formed on the substrate E11, include the resistor body film lines E20 and the plurality of conductor film pieces E21 that are laminated on the resistor body film lines E20 while being spaced apart by the fixed intervals in the line direction, and a single unit resistor body R is arranged from the resistor body film line E20 at the fixed interval R portion on which the conductor film pieces E21 is not laminated. The resistor body film lines E20 making up the unit resistor bodies R are all equal in shape and size. Therefore based on the characteristic that resistor body films of the same shape and same size that are formed on a substrate are substantially the same in value, the numerous unit resistor bodies R arrayed in a matrix on the substrate E11 have an equal resistance value.

The conductor film pieces E21 laminated on the resistor body film lines E20 form the unit resistor bodies R and also serve the role of connection wiring films that connect a plurality of unit resistor bodies R to arrange a resistor circuit.

Figure 97A:
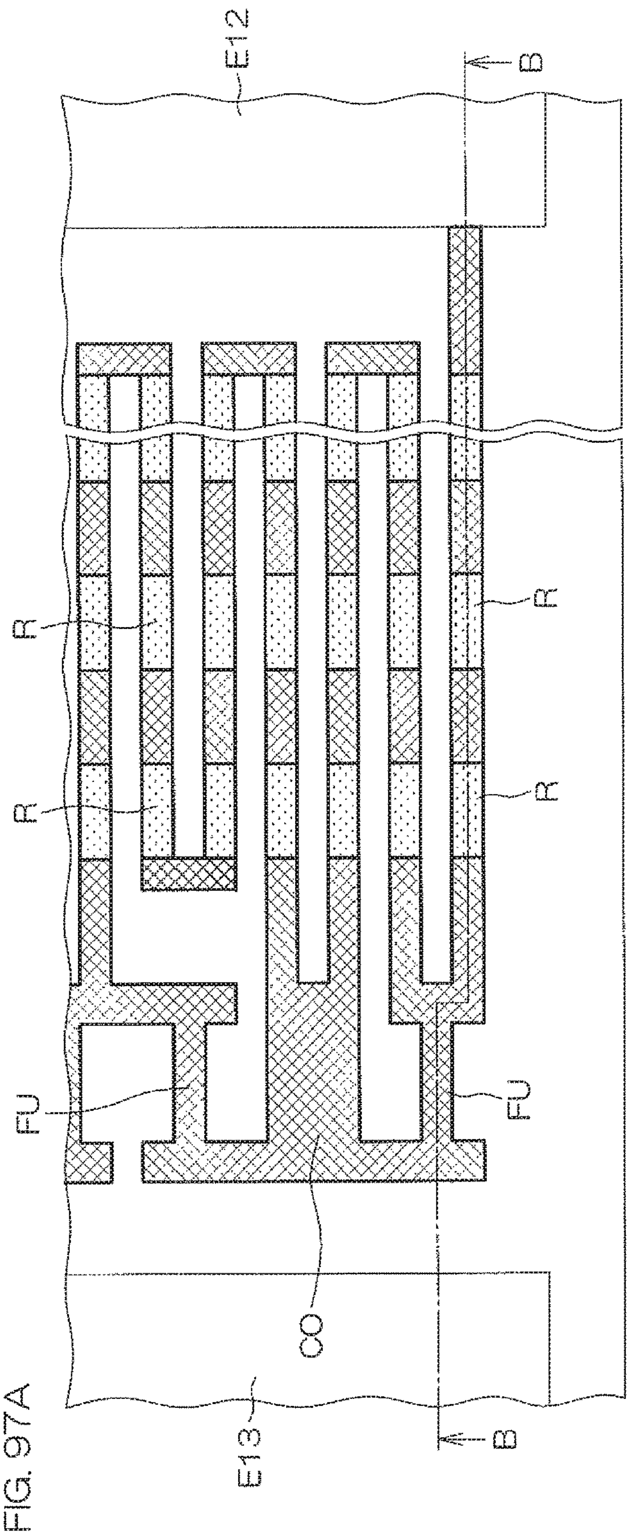
FIG. 97A is partially enlarged plan view of a region including fuses F drawn by enlarging a portion of the plan view of the chip resistor shown in FIG. 94
Figure 97B:
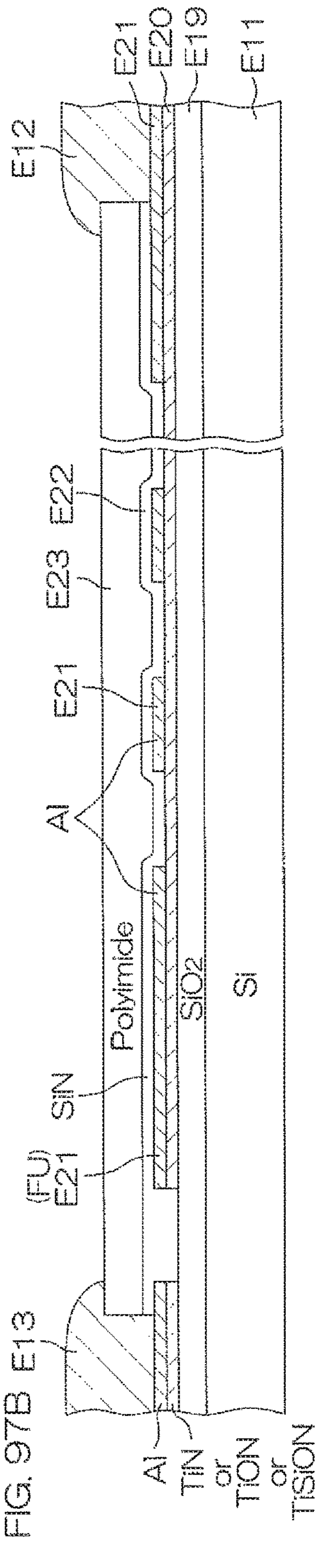
FIG. 97B is a structural sectional view taken along B-B in FIG. 97A.

FIG. 97A is partially enlarged plan view of a region including the fuses FU drawn by enlarging a portion of the plan view of the chip resistor E10 shown in FIG. 94, and FIG. 97B is a structural sectional view taken along B-B in FIG. 97A.

As shown in FIG. 97A and FIG. 97B, the fuses FU are also formed by the wiring films E21, which are laminated on the resistor body film lines E20. That is, the fuses FU are formed of aluminum (Al), which is the same metal material as that of the conductor film pieces E21, on the same layer as the conductor film pieces E21, which are laminated on the resistor body film lines E20 that form the unit resistor bodies R. As mentioned above, the conductor film pieces E21 are also used as the connection conductor films CO that electrically connect a plurality of unit resistor bodies R to form a resistor circuit.

That is, on the same layer laminated on the resistor body film E20, the wiring films for forming the unit resistor bodies R, the connection wiring films for forming the resistor circuits, the connection wiring films for arranging the resistor network E14, the fuses FU, and the wiring films for connecting the resistor network E14 to the first connection electrode E12 and the second connection electrode E13 are formed by the same manufacturing process (for example, a sputtering and photolithography process) using the same aluminum-based metal material (for example, aluminum). The manufacturing process of the chip resistor E10 is thereby simplified and also, various types of wiring films can be formed at the same time using a mask in common. Further, the property of alignment with respect to the resistor body film E20 is also improved.

Figure 98:
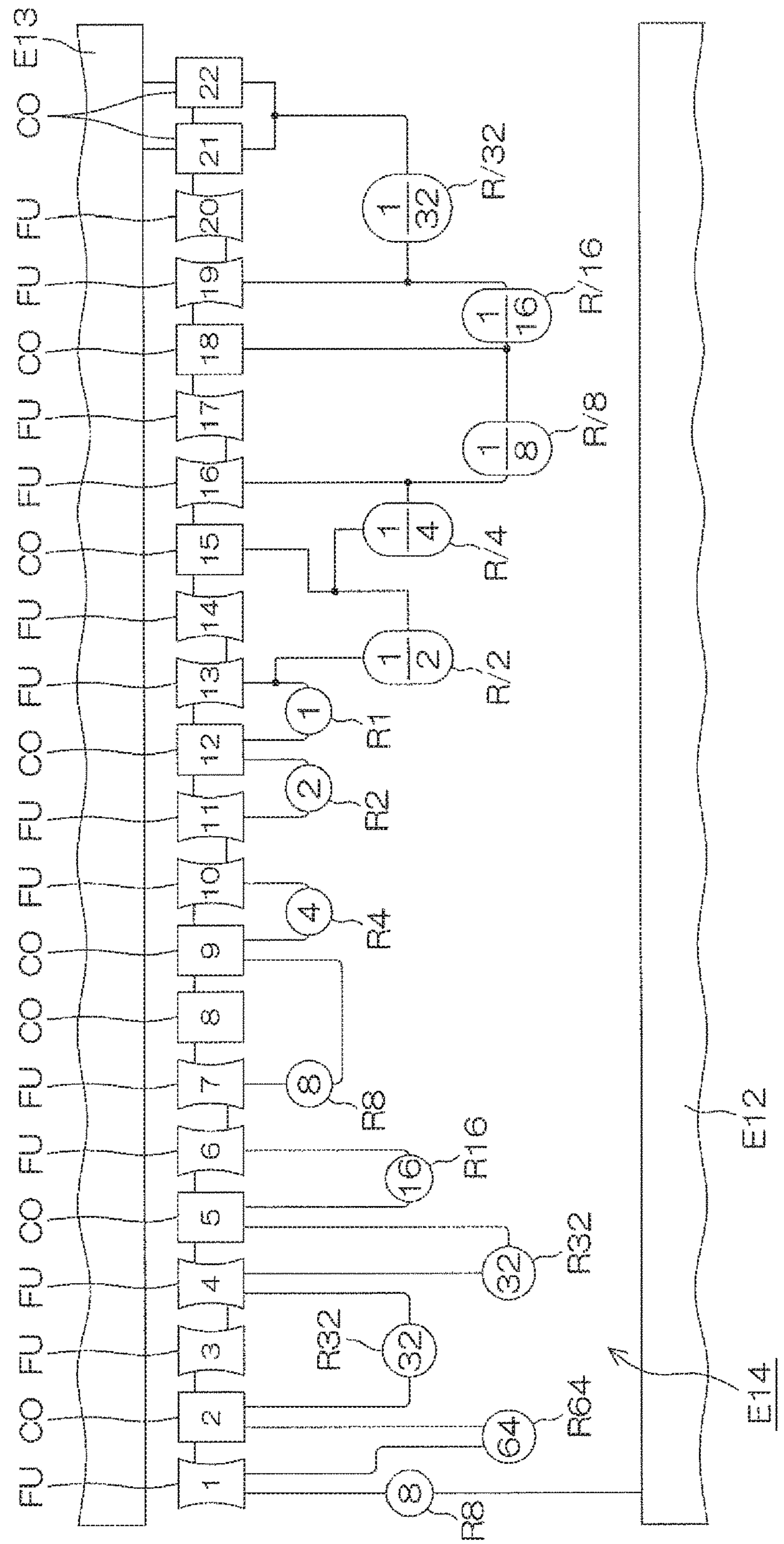
FIG. 98 is an illustrative diagram of the array relationships of connection conductor films and fuses connecting a plurality of types of resistance units in the resistor network shown in FIG. 94 and the connection relationships of the plurality of types of resistance units connected to the connection conductor films and fuse films.

FIG. 98 is an illustrative diagram of the array relationships of the connection conductor films CO and the fuses FU connecting a plurality of types of resistor circuits in the resistor network E14 shown in FIG. 94 and the connection relationships of the plurality of types of resistor circuits connected to the connection conductor films CO and fuses FU. With reference to FIG. 98, one end of a reference resistor circuit R8, included in the resistor network E14, is connected to the first connection electrode E12. The reference resistor circuit R8 is formed by a serial connection of 8 unit resistor bodies R and the other end thereof is connected to a fuse FU1.

One end and the other end of a resistor circuit R64, formed by a serial connection of 64 unit resistor bodies R, are connected to the fuse FU1 and a connection conductor film CO2. One end and the other end of a resistor circuit R32, formed by a serial connection of 32 unit resistor bodies R, are connected to the connection conductor film CO2 and a fuse FU4. One end and the other end of a resistor circuit R32, formed by a serial connection of 32 unit resistor bodies R, are connected to the fuse FU4 and a connection conductor film CO5.

One end and the other end of a resistor circuit R16, formed by a serial connection of 16 unit resistor bodies R, are connected to the connection conductor film CO5 and a fuse FU6. One end and the other end of a resistor circuit R8, formed by a serial connection of 8 unit resistor bodies R, are connected to a fuse FU7 and a connection conductor film CO9. One end and the other end of a resistor circuit R4, formed by a serial connection of 4 unit resistor bodies R, are connected to the connection conductor film CO9 and a fuse FU10.

One end and the other end of a resistor circuit R2, formed by a serial connection of 2 unit resistor bodies R, are connected to a fuse FU11 and a connection conductor film CO12. One end and the other end of a resistor circuit R1, formed of a single unit resistor body R, are connected to the connection conductor film CO12 and a fuse FU13. One end and the other end of a resistor circuit R/2, formed by a parallel connection of 2 unit resistor bodies R, are connected to the fuse FU13 and a connection conductor film CO15.

One end and the other end of a resistor circuit R/4, formed by a parallel connection of 4 unit resistor bodies R, are connected to the connection conductor film CO15 and a fuse FU16. One end and the other end of a resistor circuit R/8, formed by a parallel connection of 8 unit resistor bodies R, are connected to the fuse FU16 and a connection conductor film CO18. One end and the other end of a resistor circuit R/16, formed by a parallel connection of 16 unit resistor bodies R, are connected to the connection conductor film CO18 and a fuse FU19.

A resistor circuit R/32, formed by a parallel connection of 32 unit resistor bodies R, is connected to the fuse FU19 and a connection conductor film CO22.

With the plurality of fuses FU and connection conductor films CO, the fuse FU1, the connection conductor film CO2, the fuse FU3, the fuse FU4, the connection conductor film CO5, the fuse FU6, the fuse FU7, the connection conductor film CO8, the connection conductor film CO9, the fuse FU10, the fuse FU11, the connection conductor film CO12, the fuse FU13, a fuse FU14, the connection conductor film CO15, the fuse FU16, the fuse FU17, the connection conductor film CO18, the fuse FU19, the fuse FU20, the connection conductor film CO21, and the connection conductor film CO22 are disposed rectilinearly and connected in series. With this arrangement, when a fuse FU is fused, the electrical connection with the connection conductor film CO connected adjacently to the fuse FU is interrupted.

Figure 99:
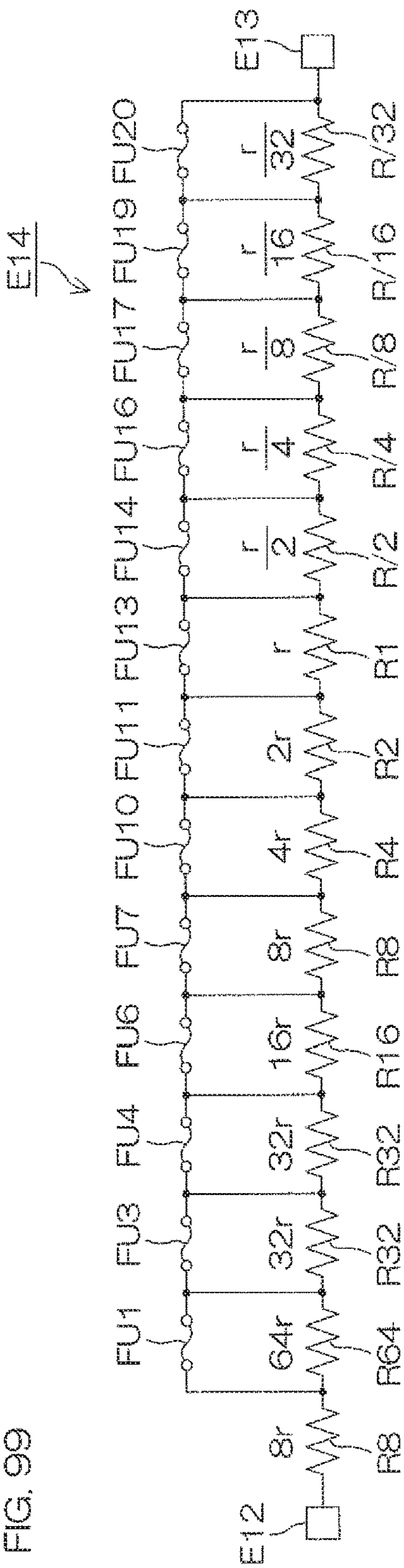
FIG. 99 is an electric circuit diagram of the resistor network.

This arrangement is illustrated in the form of an electric circuit diagram in FIG. 99. That is, in a state where none of the fuses FU is fused, the resistor network E14 forms a resistor circuit of the reference resistor circuit R8 (resistance value: 8r), formed by the serial connection of the 8 unit resistor bodies R provided between the first connection electrode E12 and the second connection electrode E13. For example, if the resistance value r of a single unit resistor body R is r=80Ω, the chip resistor 10 is arranged with the first connection electrode E12 and the second connection electrode E13 being connected by a resistor circuit of 8r=640Ω.

With each of the plurality of types of resistor circuits besides the reference resistor circuit R8, a fuse FU is connected in parallel, and these plurality of types of resistor circuits are put in short-circuited states by the respective fuses FU. That is, although 13 resistor circuits R64 to R/32 of 12 types are connected in series to the reference resistor circuit R8, each resistor circuit is short-circuited by the fuse FU that is connected in parallel and thus electrically, the respective resistor circuits are not incorporated in the resistance network E14.

With the chip resistor E10 according to the present preferred embodiment, a fuse FU is selectively fused, for example, by laser light in accordance with the required resistance value. The resistor circuit with which the fuse FU connected in parallel is fused is thereby incorporated into the resistor network E14. The resistor network E14 can thus be made a resistor network with the overall resistance value being the resistance value resulting from serially connecting and incorporating the resistor circuits corresponding to the fused fuses FU.

In other words, with the chip resistor E10 according to the present preferred embodiment, by selectively fusing the fuses FU provided in correspondence to the plurality of types of resistor circuits, the plurality of types of resistor circuits (for example, the serial connection of the resistor circuits R64, R32, and R1 in the case of fusing FU1, FU4, and FU13) can be incorporated into the resistor network. The respective resistance values of the plurality of types of resistor circuits are predetermined, and the chip resistor E10 can thus be made to have the required resistance value by adjusting the resistance value of the resistance network E14 in a so to speak digital manner.

Also, the plurality of types of resistor circuits include the plurality of types of serial resistor circuits, with which the unit resistor bodies R having an equal resistance value are connected in series with the number of unit resistor bodies R being increased in geometric progression as 1, 2, 4, 8, 16, 32, and 64, and the plurality of types of parallel resistor circuits, with which the unit resistor bodies R having an equal resistance value are connected in parallel with the number of unit resistor bodies R being increased in geometric progression as 2, 4, 8, 16, and 32. These are connected in series in states of being short-circuited by the fuses FU. Therefore by selectively fusing the fuses FU, the resistance value of the resistor network E14 as a whole can be set to an arbitrary resistance value within a wide range from a small resistance value to a large resistance value.

Figure 100:
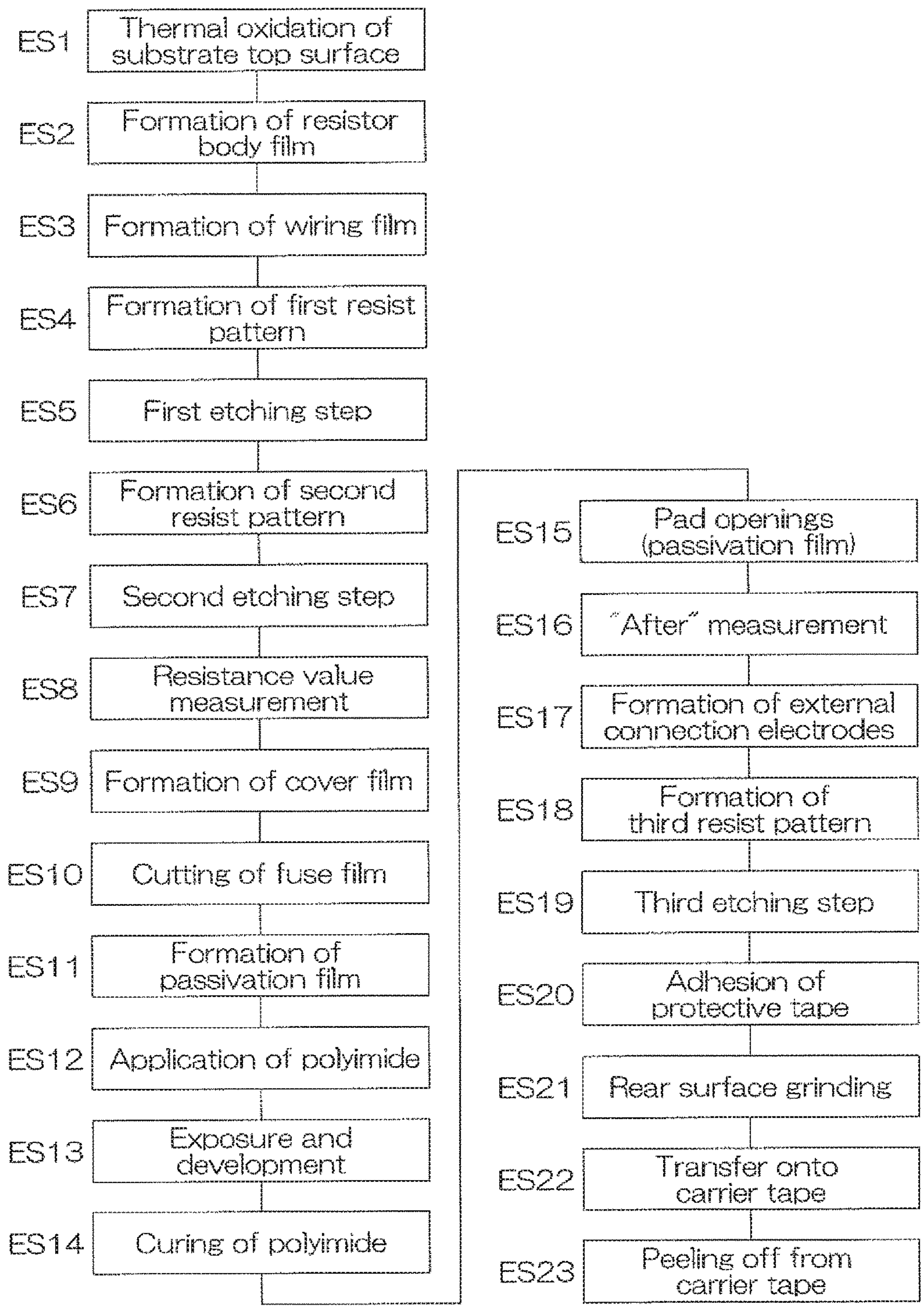
FIG. 100 is a flow diagram of an example of a manufacturing process of the chip resistor.

FIG. 100 is a flow diagram of an example of a manufacturing process of the chip resistor E10 that was described with reference to FIG. 93 to FIG. 98. A method for manufacturing the chip resistor E10 shall now be described in accordance with the manufacturing process of the flow diagram and with reference to FIG. 93 to FIG. 98 as necessary.

Step ES1: First, the substrate E11 is disposed in a predetermined processing chamber and a silicon dioxide ($SiO_2$) layer is formed as the insulating layer E19 on the top surface, for example, by a thermal oxidation method.

Step ES2: Thereafter, the resistor body film E20, made of a material containing one or more types of material selected from the group consisting of NiCr, NiCrAl, NiCrSi, NiCr- SiAl, TaN, $TaSiO_2$, TiN, TiNO, and TiSiON, for example, TiN, TiON, or TiSiON, is formed, for example, by a sputtering method on the entire top surface of the insulating layer E19.

Step ES3: Thereafter, the wiring film E21, made, for example, of aluminum (Al), is formed by lamination, for example, by the sputtering method on the entire top surface of the resistor body film E20. The total film thickness of the two laminated film layers of the resistor body film E20 and wiring film E21 may be approximately 8000 Å. In place of Al, the wiring film E21 may be formed of an aluminum-based metal film of AlSi, AlSiCu, or AlCu, etc. By forming the wiring film E21 from an aluminum-based metal film of Al, AlSi, AlSiCu, or AlCu, etc., the processing precision can be improved.

Step ES4: Thereafter, a resist pattern corresponding to the arrangement in a plan view of the resistor network E14 (the layout pattern including the conductor films CO and the fuse films FU) is formed on the top surface of the wiring film E21 using a photolithography process (formation of the first resist pattern).

Step ES5: Thereafter a first etching step is performed. That is, the two laminated film layers of the resistor body film E20 and wiring film E21 are etched, for example, by reactive ion etching (ME) using the first resist pattern, formed in step ES4, as a mask. Then after the etching, the first resist pattern is peeled off.

Step ES6: A second resist pattern is formed using the photolithography process again. The second resist pattern formed in step ES6 is a pattern for forming the unit resistor bodies R (regions indicated by being provided with fine dots in FIG. 94) by selectively removing the wiring film E21 laminated on the resistor body film E20.

Step ES7: Only the wiring film E21 is etched selectively, for example, by wet etching using the second resist pattern, formed in step ES6 as a mask (second etching step). After the etching, the second resist pattern is peeled off. The layout pattern of the resistor network E14 shown in FIG. 94 is thereby obtained.

Step ES8: The resistance value of the resistor network E14 formed on the substrate top surface (the resistance value of the network E14 as a whole) is measured at this stage. This measurement is made, for example, by putting multiprobe pins in contact with an end portion of the resistor network E14 at the side connected to the first connection electrode E12 shown in FIG. 94 and end portions of the fuse film and the resistor network E14 at the side connected to the second connection electrode E13. The quality of the manufactured resistor network E14 in the initial state is judged by this measurement.

Step ES9: Thereafter, a cover film E22*a*, made, for example, of a nitride film, is formed so as to cover the entire surface of the resistor network E14 formed on the substrate E11. In place of a nitride film (SiN film), the cover film E22*a* may be an oxide film ($SiO_2$ film). The cover film E22*a* may be formed by a plasma CVD method, and a silicon nitride film (SiN film) with a film thickness, for example, of approximately 3000 Å may be formed. The cover film E22*a* covers the patterned wiring films E21, resistor body films E20, and fuses FU.

Figure 101A:
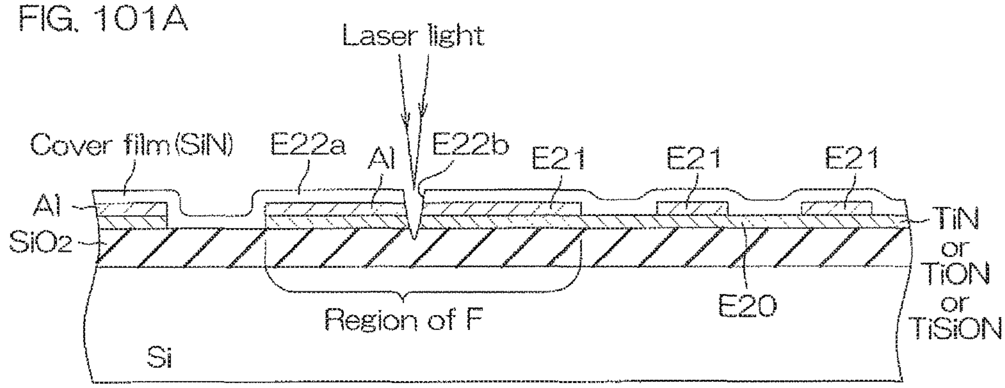
FIG. 101A to FIG. 101C are illustrative sectional views of a fuse film fusing step and a passivation film and a resin film that are formed subsequently.

Step ES10: From this state, laser trimming is performed to selectively fuse the fuses FU to adjust the chip resistor E10 to a desired resistance value. That is, as shown in FIG. 101A, a fuse FU, selected in accordance with the measurement result of the total resistance measurement performed in step ES8, is irradiated with laser light to fuse the fuse FU and the resistor body film E20 positioned below it. The corresponding resistor circuit that was short-circuited by the fuse FU is thereby incorporated into the resistor network E14 to enable the resistance value of the resistor network E14 to be adjusted to the desired resistance value. When a fuse FU is irradiated with the laser light, the energy of the laser light is accumulated at a vicinity of the fuse FU by an action of the cover film E22*a* and the fuse FU and the resistor body film E20 below it are thereby fused.

Figure 101B:
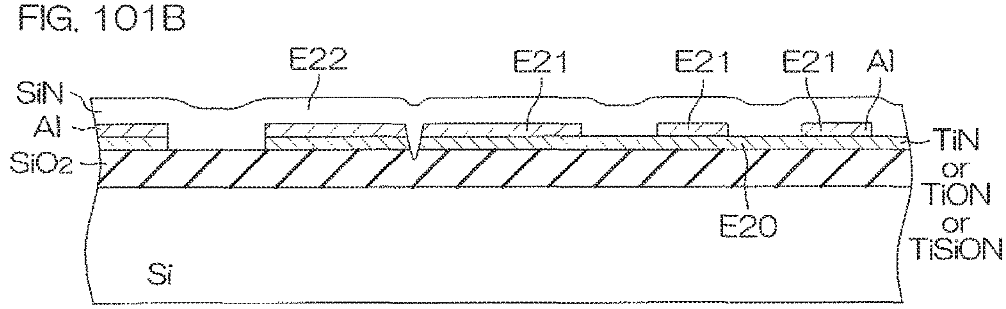

Step ES11: Thereafter as shown in FIG. 101B, a passivation film E22 is formed by depositing a silicon nitride film on the cover film E22*a*, for example, by the plasma CVD method. In the final form, the cover film E22*a* is made integral with the passivation film E22 to constitute a portion of the passivation film E22. The passivation film E22 that is formed after the cutting of the fuses FU and the resistor body films E20 therebelow enters into openings E22*b* in the cover film E22*a* that is destroyed at the same time as the fusing of the fuses FU and the resistor body films E20 therebelow to protect cut surfaces of the fuses FU and the resistor body films E20 therebelow. The passivation film E22 thus prevents entry of foreign matter and entry of moisture into cut locations of the fuses FU. The passivation film E22 suffices to have a thickness, for example, of approximately 1000 to 20000 Å as a whole and may be formed to have a film thickness, for example, of approximately 8000 Å.

Also as mentioned above, the passivation film E22 may be a silicon oxide film.

Figure 101C:
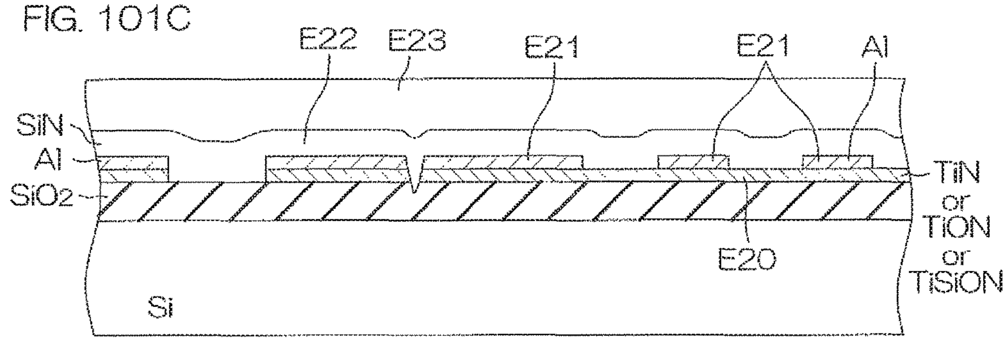

Step ES12: Thereafter, a resin film E23 is coated on the entire surface as shown in FIG. 101C. As the resin film E23, for example, a coating film E23 of a photosensitive polyimide is used.

Step ES13: Patterning of the resin film E23 by photolithography may be performed by performing an exposure step and a subsequent developing step on regions of the resin film corresponding to openings of the first connection electrode E12 and the second connection electrode E13. Pad openings for the first connection electrode E12 and the second connection electrode E13 are thereby formed in the resin film E23.

Step ES14: Thereafter, heat treatment (polyimide curing) for curing the resin film E23 is performed and the polyimide film E23 is stabilized by the heat treatment. The heat treatment may, for example, be performed at a temperature of approximately 170° C. to 700° C. A merit that the characteristics of the resistor bodies (the resistor body films E20 and the patterned wiring films E21) are stabilized is also provided as a result.

Step ES15: Thereafter, etching of the passivation film E22 using the polyimide film E23, having penetrating holes at positions at which the first connection electrode E12 and the second connection electrode E13 are to be formed, as a mask is performed. The pad openings that expose the wiring films E21 at a region of the first connection electrode E12 and a region of the second connection electrode E13 are thereby formed. The etching of the passivation film E22 may be performed by reactive ion etching (RIE).

Step ES16: Multiprobe pins are put in contact with the wiring films E21 exposed from the two pad openings to perform resistance value measurement ("after" measurement) for confirming that the resistance value of the chip resistor is the desired resistance value. By performing the "after" measurement, in other words, performing the series of processes of the first measurement (initial measurement) →fusing of the fuses FU (laser repair)→"after" measurement, the trimming processing ability with respect to the chip resistor E10 is improved significantly.

Step ES17: The first connection electrode E12 and the second connection electrode E13 are grown as external connection electrodes inside the two pad openings, for example, by an electroless plating method.

Step ES18: Thereafter, a third resist pattern is formed by photolithography for separation of the numerous (for example, 500 thousand) respective chip resistors, formed in an array on the substrate top surface, into the individual chip resistors E10. The resist film is provided on the substrate top surface to protect the respective chip resistors E10 and is formed so that intervals between the respective chip resistors E10 will be etched. Also, the third resist pattern is patterned so that, for example, a maximum of four recessed marks will be formed at predetermined positions at the one short side surface E6 (see FIG. 93A) of each chip resistor E10.

Step ES19: Plasma dicing is then executed. The plasma dicing is the etching using the third resist pattern as a mask and a groove of a predetermined depth from the substrate top surface is formed between the respective chip resistors E10. The recessed marks are also formed at the same time at the peripheral edge portions of the respective chip resistors E10. Thereafter, the resist film is peeled off.

Figure 102A:
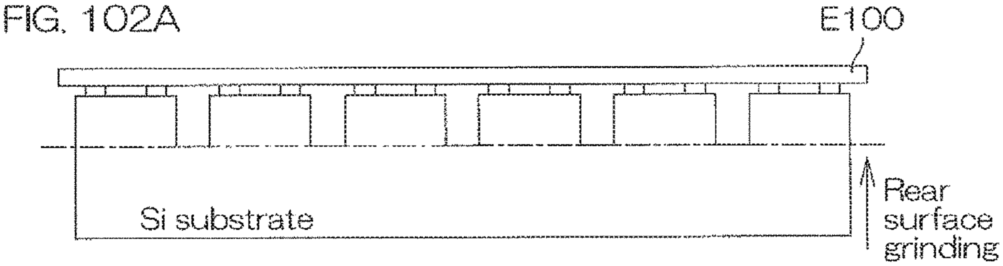
FIG. 102A to FIG. 102F are illustrative views of processing steps of separating individual chip resistors from a substrate.

Step ES20: Then as shown in FIG. 102A, a protective tape E100 is adhered onto the top surface.

Figure 102B:
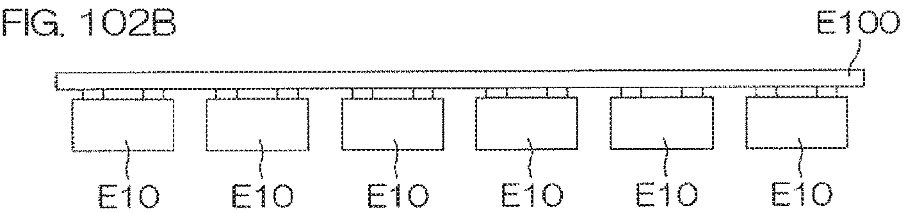

Step ES21: Thereafter, rear surface grinding of the substrate is performed to separate the chip resistors into the individual chip resistors E10 (see FIG. 102A and FIG. 102B).

Figure 102C:
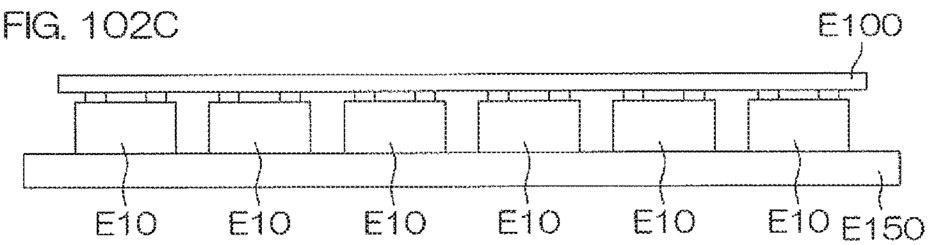
Figure 102D:
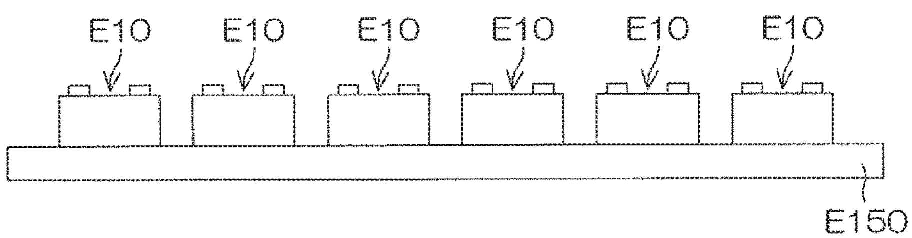

Step ES22: Then as shown in FIG. 102C, a carrier tape (thermally foaming sheet) E150 is adhered onto the rear surface side, and the numerous chip resistors E10 that have been separated into the individual chip resistors are held in a state of being arrayed on the carrier tape E151. On the other hand, the protective tape adhered to the top surface is removed (see FIG. 102D).

Figure 102E:
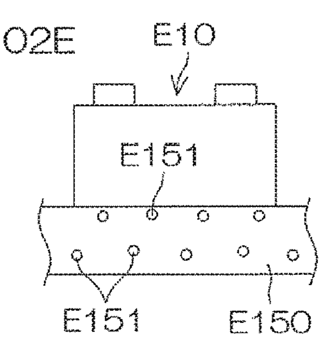
Figure 102F:
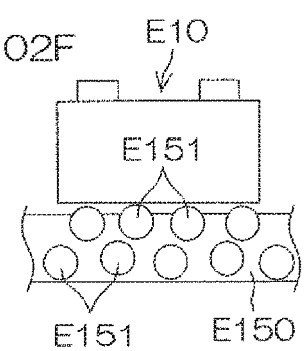

Step ES23: When the thermally foaming sheet E150 is heated, thermally foaming particles E151 contained in the interior swell and the respective chip resistors E10 adhered to the carrier tape E150 surface are thereby peeled off from the carrier tape E150 and separated into individual chips (see FIG. 102E and FIG. 102F).

Figure 103:
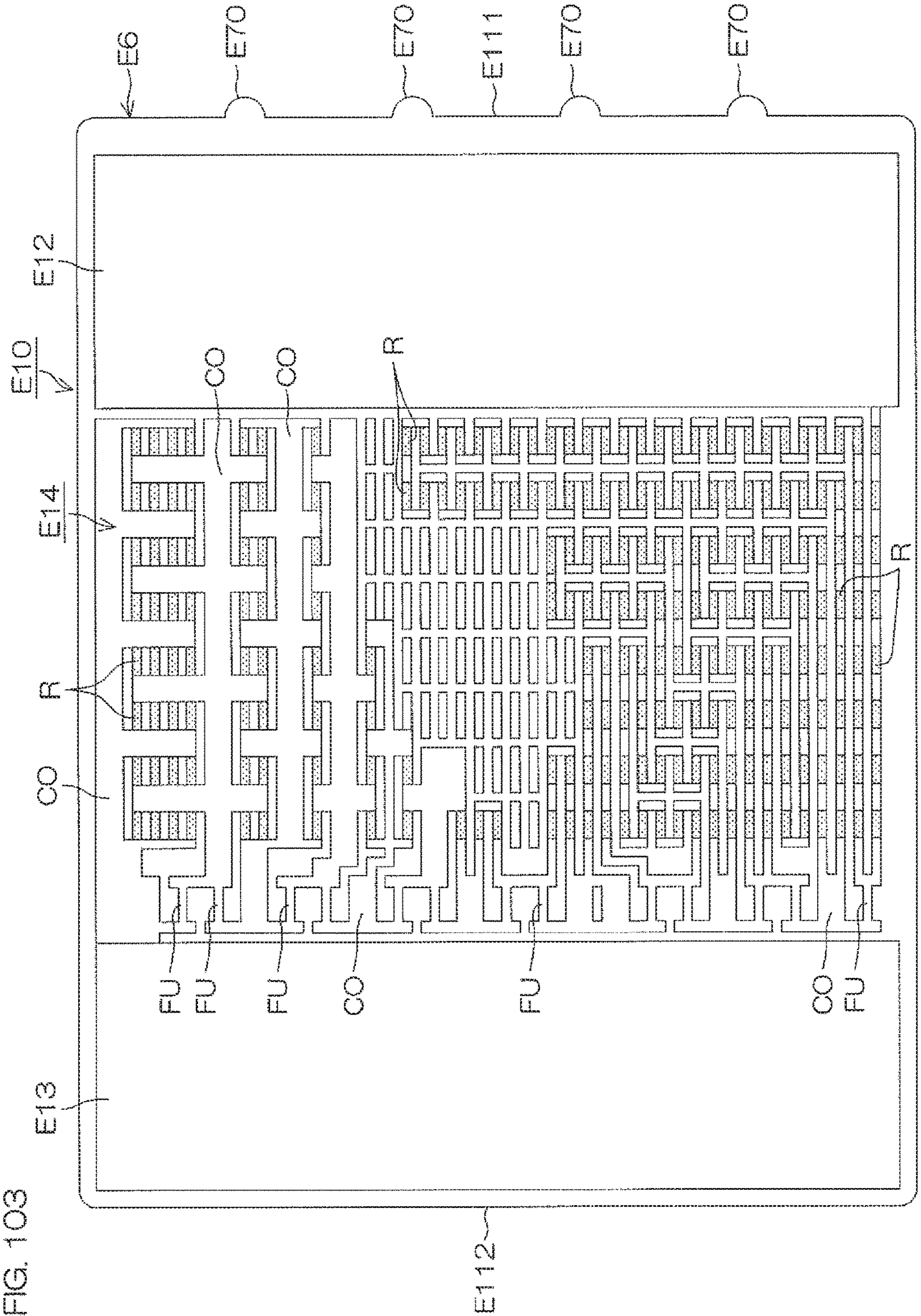
FIG. 103 is a plan view of a chip resistor and is a plan view of a preferred embodiment provided with projecting marks in place of a recessed mark.

FIG. 103 is a plan view of the chip resistor E10 and is a plan view of a preferred embodiment provided with projecting marks in place of recessed marks. Although with the chip resistor E10 of the preferred embodiment described above, an example where the recessed marks E7, extending in the up/down direction and functioning as a marking expressing information of the chip resistor E10, are formed at one side surface (the one short side surface E6 extending in the length direction of the first connection electrode E12 in the substrate E11) of the substrate E11 was described, the recessed marks E7 may be replaced by the projecting marks E70 as shown in FIG. 103.

Description of a Preferred Embodiment of a Chip Capacitor

Figure 104:
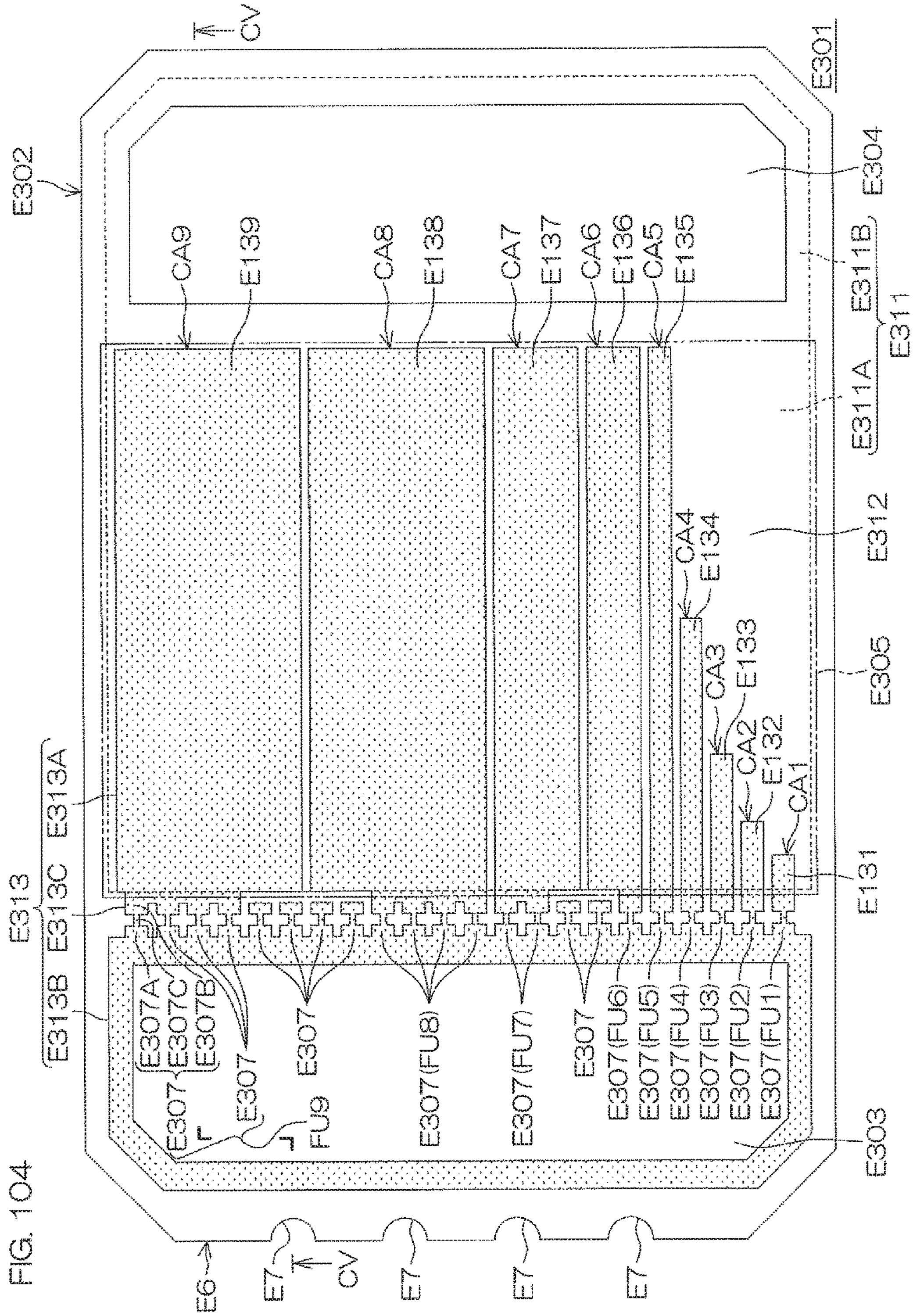
FIG. 104 is a plan view of a chip capacitor according to another preferred embodiment of the sixth invention.
Figure 105:
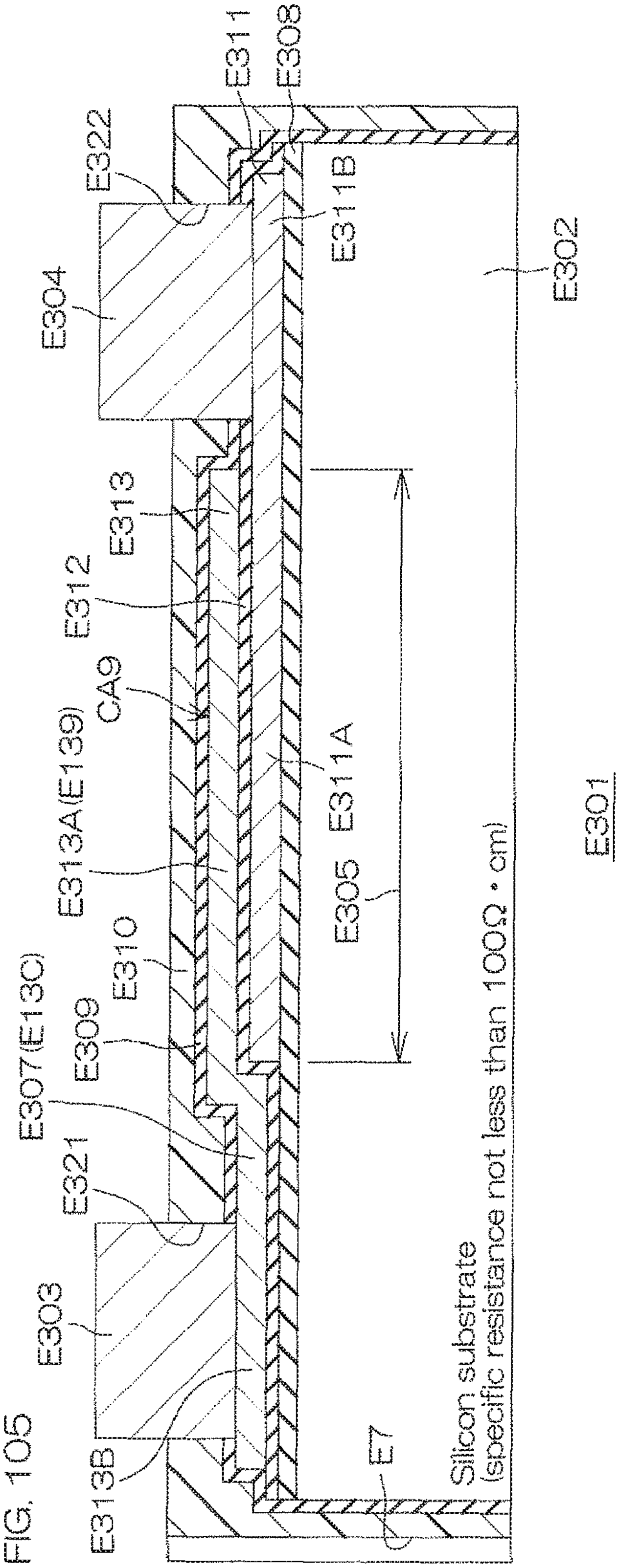
FIG. 105 is a sectional view taken along section plane line CV-CV in FIG. 104.
Figure 106:
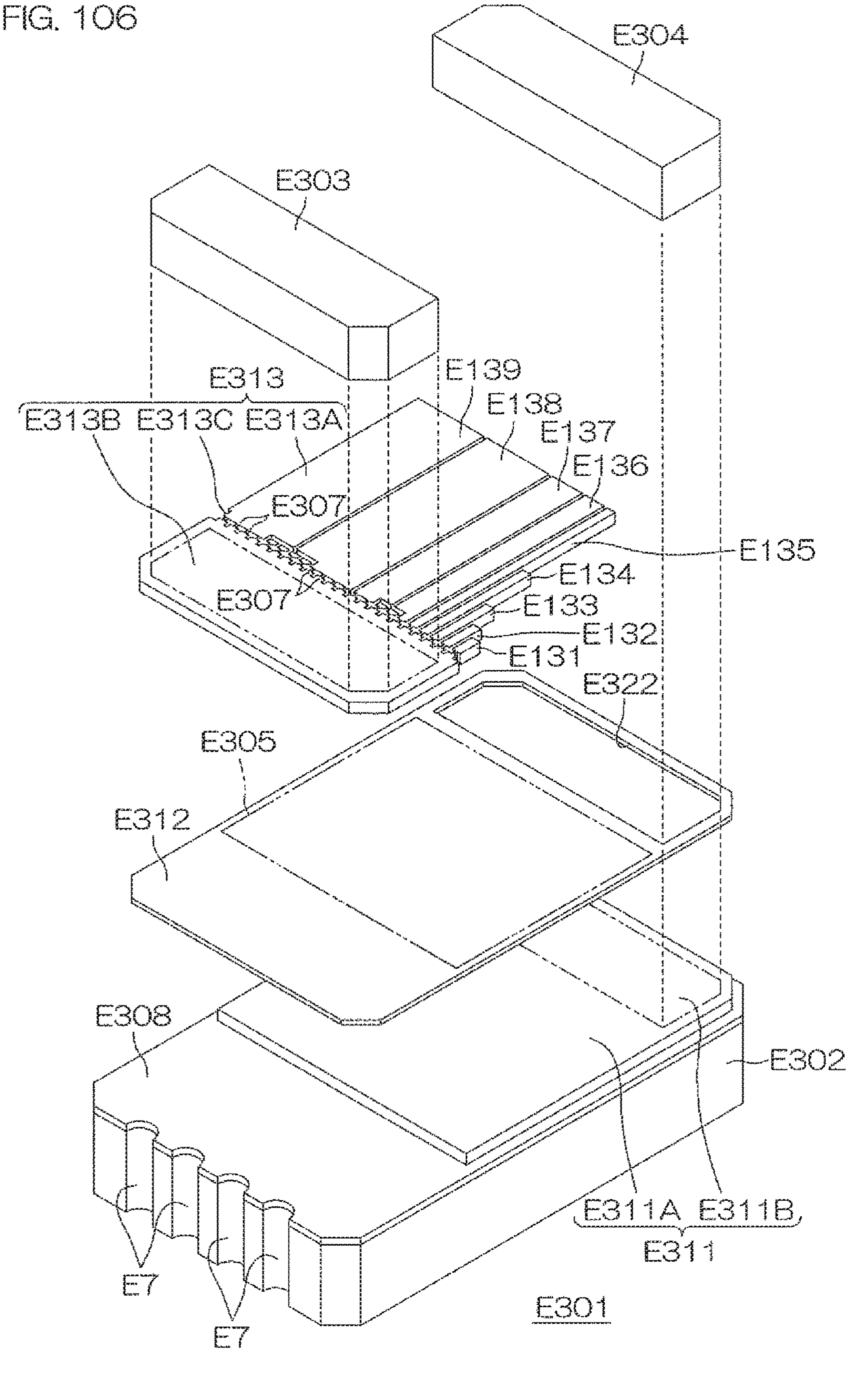
FIG. 106 is an exploded perspective view showing the arrangement of a portion of the chip capacitor in a separated state.

FIG. 104 is a plan view of a chip capacitor E301 according to another preferred embodiment of the sixth invention and FIG. 105 is a sectional view thereof taken along section plane line CV-CV in FIG. 104. Further, FIG. 106 is an exploded perspective view showing the arrangement of a portion of the chip capacitor E301 in a separated state.

The chip capacitor E301 includes a substrate E302, a first external electrode E303 disposed on the substrate E302, and a second external electrode E304 similarly disposed on the substrate E302. In the present preferred embodiment, the substrate E302 has, in a plan view, a rectangular shape with the four corners being chamfered. The rectangular shape has dimensions, for example, of approximately 0.3 mm×0.15 mm. The first external electrode E303 and the second external electrode E304 are respectively disposed at respective end portions in the long direction of the substrate E302. In the present preferred embodiment, each of the first external electrode E303 and the second external electrode E304 has a substantially rectangular planar shape extending in the short direction of the substrate E302 and has chamfered portions at two locations respectively corresponding to corners of the substrate E302. On the substrate E302, a plurality of capacitor elements CA1 to CA9 are disposed inside a capacitor arrangement region E305 between the first external electrode E303 and the second external electrode E304. The plurality of capacitor elements CA1 to CA9 are electrically connected respectively via a plurality of fuse units E307 to the first external electrode E303.

Also, for example, a maximum of four recessed mark grooves E7 extending in an up/down direction are formed at one side surface (one short side surface E6 extending in a length direction of the first external electrode E303 in the substrate E302) of the substrate E302. The recessed marks E7 also function as a marking expressing information of the chip capacitor E301. As shown in FIG. 105 and FIG. 106, an insulating film E308 is formed on a top surface of the substrate E302 and a lower electrode film E311 is formed on the top surface of the insulating film E308. The lower electrode film 311 is formed to extend across substantially the entirety of the capacitor arrangement region E305 and extend to a region directly below the second external electrode E304. More specifically, the lower electrode film E311 has a capacitor electrode region E311A functioning as a lower electrode in common to the capacitor elements CA1 to CA9 and a pad region E311B for external electrode lead-out. The capacitor electrode region E311A is positioned in the capacitor arrangement region E305 and the pad region E311B is positioned directly below the second external electrode E304.

In the capacitor arrangement region E305, a capacitance film (dielectric film) E312 is formed to cover the lower electrode film E311 (capacitor electrode region E311A). The capacitance film E312 is continuous across the entirety of the capacitor electrode region E311A and, in the present preferred embodiment, continues to a region directly below the first external electrode E303 to cover the insulating film E308 outside the capacitor arrangement region E305.

An upper electrode film E313 is formed above the capacitance film E312. In FIG. 104, the upper electrode film E313 is provided with fine dots for the sake of clarification. The upper electrode film E313 has a capacitor electrode region E313A positioned in the capacitor arrangement region E305, a pad region E313B positioned directly below the first external electrode E303, and a fuse region E313C disposed between the pad region E313B and the capacitor electrode region E313A.

In the capacitor electrode region E313A, the upper electrode film E313 is divided into a plurality of electrode film portions E131 to E139. In the present preferred embodiment, all of the electrode film portions E131 to E139 have rectangular shapes and extend in a band-like manner from the fuse region E313C toward the second external electrode E304. The plurality of electrode film portions E131 to E139 face the lower electrode film E311 with a plurality of types facing areas across the capacitance film E312. More specifically, the facing areas of the plurality of electrode film portions E131 to E139 with respect to the lower electrode film E311 are set to be 1:2:4:8:16:32:64:128:128. That is, the plurality of electrode film portions E131 to E139 include a plurality of electrode film portion that differ in facing area and, more specifically, include a plurality of electrode film portions E131 to E138 (or E131 to E137 and E139) having facing areas that are set to form a geometric progression of a common ratio of 2. The plurality of capacitor elements CA1 to CA9 arranged by the respective electrode film portions E131 to E139 and the facing lower electrode film E311 across the capacitance film E312 are thereby made to include a plurality of capacitor elements with mutually different capacitance values. In the case where the ratios of the facing areas of the electrode film portions E131 to E139 are as mentioned above, the ratios of the capacitance values of the capacitor elements CA1 to CA9 are equal to the ratios of the facing areas and are 1:2:4:8:16:32:64:128:128. That is, the plurality of capacitor elements CA1 to CA9 include a plurality of capacitor elements CA1 to CA8 (or CA1 to CA7 and CA9) with which the capacitance values are set to form a geometric progression of a common ratio of 2.

In the present preferred embodiment, the electrode film portions E131 to E135 are formed to bands, which are equal in width and with which the ratios of length are set to 1:2:4:8:16. Also, the electrode film portions E135, E136, E137, E138, E139 are formed to bands, which are equal in length and with which the ratios of width are set to 1:2:4:8:8. The electrode film portions E135 to E139 are formed to extend across a range from a first external electrode E303 side edge to a second external electrode E304 side edge of the capacitor arrangement region E305 while the electrode film portions E131 to E134 are formed to be shorter than that range.

The pad region E313B is formed to be substantially similar in shape to the first external electrode E303 and has a substantially rectangular planar shape having two chamfered portions corresponding to the corner portions of the substrate E302. The fuse region E313C is disposed along one long side (the long side at the inner side with respect to a peripheral edge of the substrate E302) of the pad region E313B. The fuse region E313C includes a plurality of fuse units E307 arrayed along the one long side of the pad region E313B. The fuse units E307 are formed of the same material as an integral to the pad region E313B of the upper electrode film E313. Each of the plurality of electrode film portions E131 to E139 is formed integral to one or a plurality of fuse units E307, is connected to the pad region E313 via the fuse unit or units E307, and is electrically connected to the first external electrode E303 via the pad region E313B. The electrode film portions E131 to E136 of comparatively small areas are respectively connected to the pad region E313B by a single fuse unit E307, and the electrode film portions E137 to E139 of comparatively large areas are respectively connected to the pad region E313B via a plurality of fuse units E307. Not all of the fuse units E307 have to be used, and in the present preferred embodiment, a portion of the fuse units E307 is unused.

The fuse units E307 include first wide portions E307A for connection with the pad region E313B, second wide portions E307B for connection with the electrode film portions E131 to E139, and narrow portions E307C connecting the first and second wide portions E307A and E307B. The narrow portions E307C are arranged to be cut (fused) by laser light. Unnecessary electrode film portions among the electrode film portions E131 to E139 can thus be electrically cut off from the first and second external electrodes E303 and E304 by cutting the fuse units E307.

Although omitted from illustration in FIG. 104 and FIG. 106, the top surface of the chip capacitor E301 that includes the top surface of the upper electrode film E313 is covered by a passivation film E309 as shown in FIG. 105. The passivation film E309 is constituted, for example, of a nitride film and is formed not only to cover the upper surface of the chip capacitor E301 but also to extend to side surfaces of the substrate E302 and cover the side surfaces. Further, a resin film E310, made of a polyimide resin, etc., is formed above the passivation film E309. The resin film E310 is formed to cover the upper surface of the chip capacitor E301 and extend to the side surfaces of the substrate E302 to cover the passivation film E309 on the side surfaces.

The passivation film E309 and the resin film E310 are protective films that protect the top surface of the chip capacitor E301. In these films are formed pad openings E321 and E322 that respectively correspond to the first external electrode E303 and the second external electrode E304. The pad openings E321 and E322 penetrate through the passivation film E309 and the resin film E310 to respectively expose a region of a portion of the pad region E313B of the upper electrode film E313 and a region of a portion of the pad region E311B of the lower electrode film E311. Further in the present preferred embodiment, the pad opening E322 corresponding to the second external electrode E304 also penetrates through the capacitance film E312.

The first external electrode E303 and the second external electrode E304 are respectively embedded in the pad openings E321 and E322. The first external electrode E303 is thereby bonded to the pad region E313B of the upper electrode film E313 and the second external electrode E304 is bonded to the pad region E311B of the lower electrode film E311. The first and second external electrodes E303 and E304 are formed to project from the top surface of the resin film E310. The chip capacitor E301 can thereby be flip-chip bonded to a mounting substrate.

Figure 107:
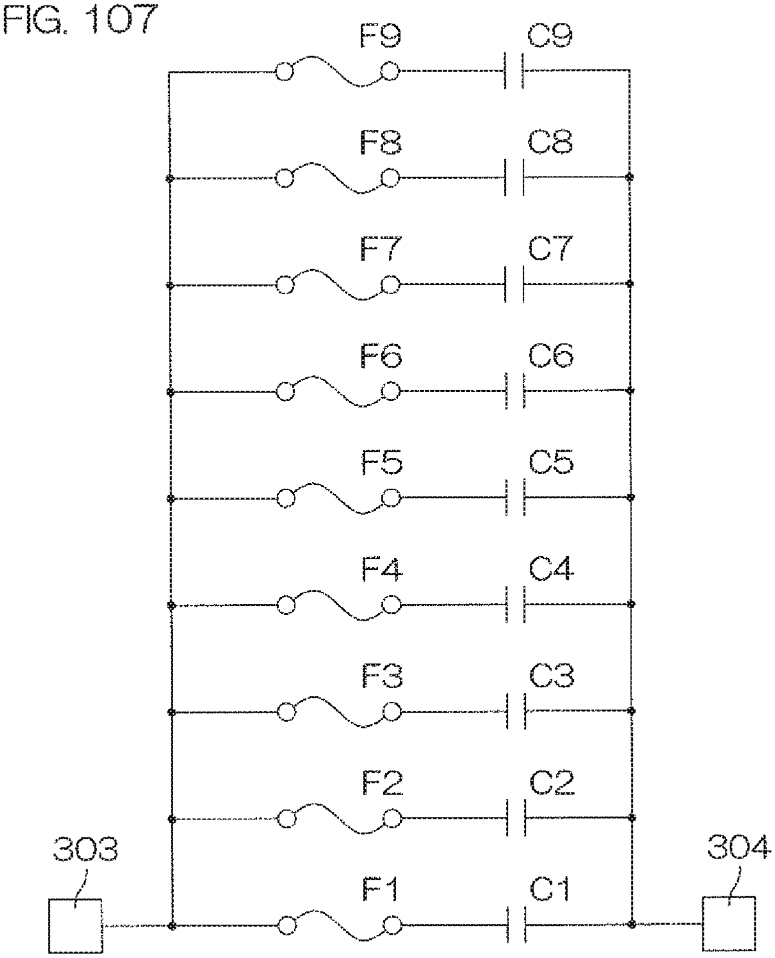
FIG. 107 is a circuit diagram of the electrical arrangement of the interior of the chip capacitor.

FIG. 107 is a circuit diagram of the electrical arrangement of the interior of the chip capacitor E301. The plurality of capacitor elements CA1 to CA9 are connected in parallel between the first external electrode E303 and the second external electrode E304. Fuses FU1 to FU9, respectively arranged from one or a plurality of fuse units E307, are interposed in series between the respective capacitor elements CA1 to CA9 and the first external electrode E303.

When all of the fuses FU1 to FU9 are connected, the capacitance value of the chip capacitor E301 is equal to the total of the capacitance values of the capacitor elements CA1 to CA9. When one or two or more fuses selected from among the plurality of fuses FU1 to FU9 is or are cut, each capacitor element corresponding to a cut fuse is cut off and the capacitance value of the chip capacitor E301 decreases by just the capacitance value or values of the cut-off capacitor element or elements.

Therefore by measuring the capacitance value across the pad regions E311B and E313B (the total capacitance value of the capacitor elements CA1 to CA9) and thereafter using laser light to fuse one or a plurality of fuses selected appropriately from among the fuses FU1 to FU9 in accordance with a desired capacitance value, adjustment (laser trimming) to the desired capacitance value can be performed. In particular, if the capacitance values of the capacitor elements CA1 to CA8 are set to form a geometric progression of a common ratio of 2, fine adjustment to the targeted capacitance value at a precision corresponding to the capacitance value of the capacitor element CA1, which is the smallest capacitance value (value of the first term in the geometric progression), is made possible.

For example, the capacitance values of the capacitor elements CA1 to CA9 may be set as follows. CA1=0.03125 pF CA2=0.0625 pF CA3=0.125 pF CA4=0.25 pF CA5=0.5 pF CA6=1 pF CA7=2 pF CA8=4 pF CA9=4 pF. In this case, the capacitance of the chip capacitor E301 can be finely adjusted at a minimum adjustment precision of 0.03125 pF. Also, the fuses to be cut from among the fuses FU1 to FU9 can be selected appropriately to provide the chip capacitor E301 with an arbitrary capacitance value between 0.1 pF and 10 pF.

As described above, with the present preferred embodiment, the plurality of capacitor elements CA1 to CA9 that can be cut off by the fuses FU1 to FU9 are provided between the first external electrode E303 and the second external electrode E304. The capacitor elements CA1 to CA9 include a plurality of capacitor elements that differ in capacitance value, that is, more specifically, a plurality of capacitor elements with capacitance values set to form a geometric progression. The chip capacitor E301 can thus be provided, which, by selection and fusion of one or a plurality of fuses from among the fuses FU1 to FU9 by laser light, can accommodate a plurality of types of capacitance values without change of design and can be accurately adjusted to the desired capacitance value.

Details of respective portions of the chip capacitor E301 shall now be described additionally. The substrate E302 may have, for example, a rectangular shape in a plan view with a size of 0.3 mm×0.15 mm, 0.4 mm×0.2 mm, or 0.2 mm×0.1 mm, etc. (preferably with a size of not more than 0.4 mm×0.2 mm). The capacitor arrangement region E305 generally has a square shape with one side corresponding to the length of the short side of the substrate E302. The thickness of the substrate E302 may be approximately 150 μm. The substrate E302 may, for example, be a substrate that has been thinned by grinding or polishing from a rear surface side (surface on which the capacitor elements CA1 to CA9 are not formed). As the material of the substrate E302, a semiconductor substrate as represented by a silicon substrate may be used or a glass substrate may be used or a resin film may be used.

The insulating film E308 may be a silicon oxide film or other oxide film. The film thickness thereof may be approximately 500 Å to 2000 Å. The lower electrode film E311 is preferably a conductive film, a metal film in particular, and may, for example, be an aluminum film. The lower electrode film E311 that is constituted of an aluminum film may be formed by a sputtering method. Similarly, the upper electrode film E313 is preferably a conductive film, a metal film in particular, and may, for example, be an aluminum film. The upper electrode film E313 that is constituted of an aluminum film may be formed by the sputtering method. The patterning for dividing the capacitor electrode region E313A of the upper electrode film E313 into the electrode film portions E131 to E139 and shaping the fuse region E313C into the plurality of fuse units E307 may be performed by photolithography and etching processes.

The capacitance film E312 may be constituted, for example, of a silicon nitride film. The film thickness thereof may be 500 Å to 2000 Å (for example, 1000 Å). The capacitance film E312 may be a silicon nitride film formed by plasma CVD (chemical vapor deposition). The passivation film E309 may be constituted, for example, of a silicon nitride film and may be formed, for example, by the plasma CVD method. The film thickness thereof may be approximately 8000 Å. As mentioned above, the resin film E310 may be constituted of a polyimide film or other resin film.

Each of the first and second external electrodes E303 and E304 may, for example, be constituted of a laminated structure film in which a nickel layer in contact with the lower electrode film E311 or the upper electrode film E313, a palladium layer laminated on the nickel layer, and a gold layer laminated on the palladium layer are laminated, and may be formed, for example, by a plating method (or more specifically, an electroless plating method). The nickel layer contributes to improvement of adhesion with the lower electrode film E311 or the upper electrode film E313, and the palladium layer functions as a diffusion preventing layer that suppresses mutual diffusion of the material of the upper electrode film or the lower electrode film and the gold of the uppermost layer of each of the first and second external electrodes E303 and E304.

Figure 108:
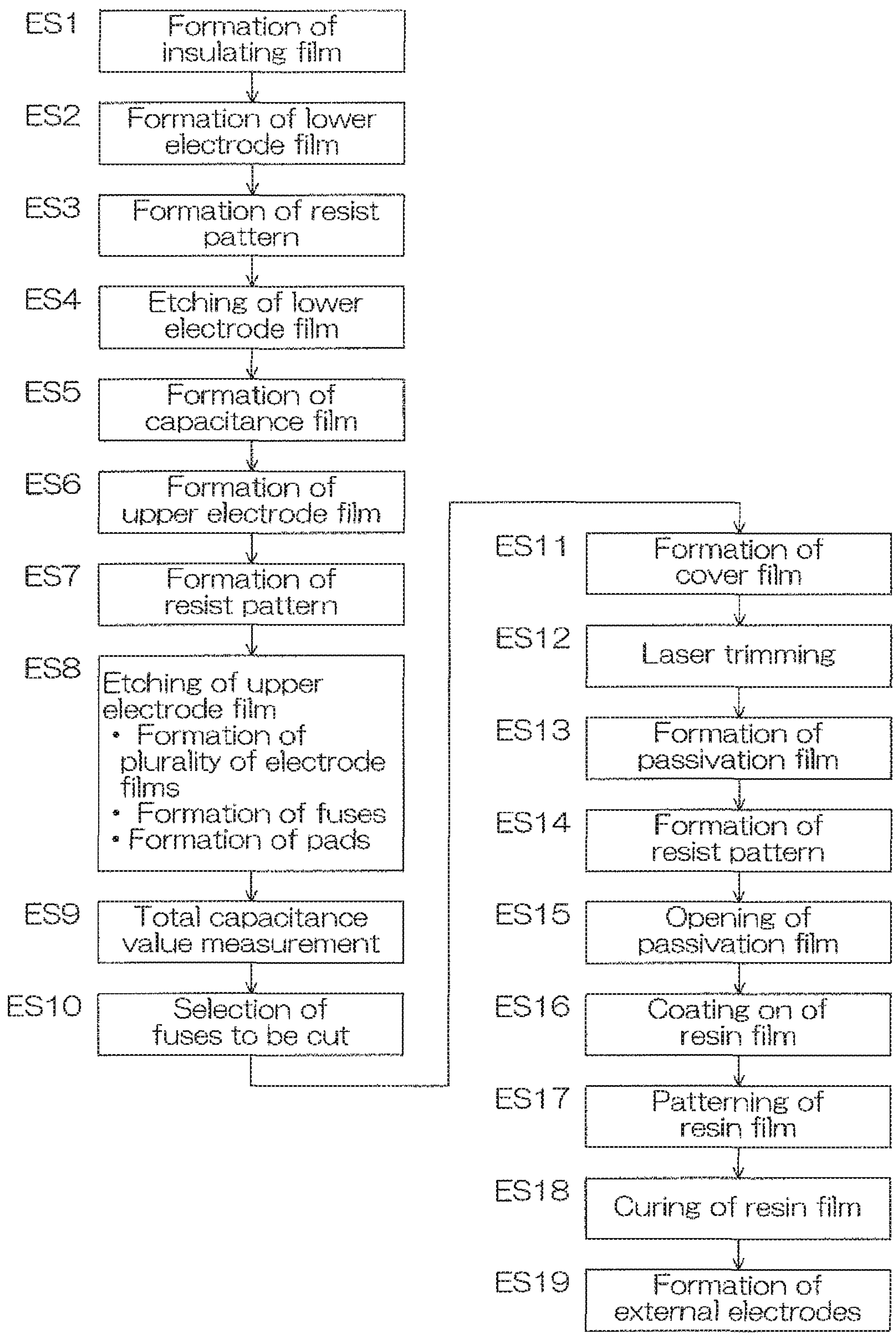
FIG. 108 is a flow diagram for describing an example of a manufacturing process of the chip capacitor.

FIG. 108 is a flow diagram for describing an example of a manufacturing process of the chip capacitor E301. As the substrate E302, a semiconductor substrate with a specific resistance of not less than 100 Ω·cm is prepared. Thereafter, the insulating film E308, constituted of an oxide film (for example, a silicon oxide film) is formed on the top surface of the substrate E302 by a thermal oxidation method and/or CVD method (step ES1). Thereafter, the lower electrode film E311, constituted of an aluminum film, is formed over the entire top surface of the insulating film E308, for example, by the sputtering method (step ES2). The film thickness of the lower electrode film E311 may be approximately 8000 Å. Thereafter, a resist pattern corresponding to the final shape of the lower electrode film E311 is formed on the top surface of the lower electrode film by photolithography (step ES3). By the lower electrode film being etched using this resist pattern as a mask, the lower electrode film E311 of the pattern shown in FIG. 104, etc., is obtained (step ES4). The etching of the lower electrode film E311 may, for example, be performed by reactive ion etching.

Thereafter, the capacitance film E312, constituted of a silicon nitride film, etc., is formed on the lower electrode film 311, for example, by the plasma CVD method (step ES5). In the region in which the lower electrode film E311 is not formed, the capacitance film E312 is formed on the top surface of the insulating film E308. Thereafter, the upper electrode film E313 is formed on the capacitance film E312 (step ES6). The upper electrode film E313 is constituted, for example, of an aluminum film and may be formed by the sputtering method. The film thickness thereof may be approximately 8000 Å. Thereafter, a resist pattern corresponding to the final shape of the upper electrode film E313 is formed on the top surface of the upper electrode film E313 by photolithography (step ES7). By the etching using this resist pattern as a mask, the upper electrode film E313 is patterned to its final shape (see FIG. 104, etc.) (step ES8). The upper electrode film E313 is thereby shaped to the pattern having the plurality of electrode film portions E131 to E139 in the capacitor electrode region E313A, having the plurality of fuse units E307 in the fuse region E313C, and having the pad region E313B connected to the fuse units E307. The etching for patterning the upper electrode film E313 may be performed by wet etching using an etching liquid, such as phosphoric acid, etc., or may be performed by reactive ion etching.

Thereafter, inspection probes are contacted against the pad region E313B of the upper electrode film E313 and the pad region E311B of the lower electrode film E311 to measure the total capacitance value of the plurality of capacitor elements CA1 to CA9 (step ES9). Based on the measured total capacitance value, the capacitor elements to be cut off, that is, the fuses to be cut are selected in accordance with the targeted capacitance value of the chip capacitor E301 (step ES10).

Thereafter as shown in FIG. 109A, a cover film E326, constituted, for example, of a nitride film, is formed on the entire surface of the substrate E302 (step ES11). The forming of the cover film E326 may be performed by the plasma CVD method and, for example, a silicon nitride film with a film thickness of approximately 3000 Å may be formed. The cover film E326 covers the patterned upper electrode film E313 and covers the capacitance film E312 in the region in which the upper electrode film E313 is not formed. The cover film E326 covers the fuse units E307 in the fuse region E313C.

From this state, the laser trimming for fusing the fuse units E307 is performed (step ES12). That is, as shown in FIG. 109B, each fuse unit E307 corresponding to a fuse selected in accordance with the measurement result of the total capacitance value is irradiated with laser light E327 and the narrow portion E307C of the fuse unit E307 is fused. The corresponding capacitor element is thereby cut off from the pad region E313B. When the laser light E327 is irradiated on the fuse unit E307, the energy of the laser light E327 is accumulated at a vicinity of the fuse unit E307 by the action of the cover film E326 and the fuse unit E307 is thereby fused.

Thereafter as shown in FIG. 109C, a silicon nitride film is deposited on the cover film E326, for example, by the plasma CVD method to form the passivation film E309 (step ES13). In the final form, the cover film E326 is made integral with the passivation film E309 to constitute a portion of the passivation film E309. The passivation film E309 that is formed after the cutting of the fuses enters into openings in the cover film E326 that is destroyed at the same time as the fusing of the fuses to protect cut surfaces of the fuse units E307. The passivation film E309 thus prevents entry of foreign matter and entry of moisture into cut locations of the fuse units E307. The passivation film E309 may be formed to have a film thickness, for example, of approximately 8000 Å as a whole.

Thereafter, a resist pattern, having penetrating holes at positions at which the first and second external electrodes E303 and E304 are to be formed, is formed on the passivation film E309 (step ES14). Using this resist pattern as a mask, etching of the passivation film E309 is performed. The pad opening exposing the lower electrode film E311 in the pad region E311B and the pad opening exposing the upper electrode film E313 in the pad region E313B are thereby formed (step ES15). The etching of the passivation film E309 may be performed by reactive ion etching. During the process of etching of the passivation film E309, the capacitance film E312, which is similarly formed of a nitride film, is also opened and the pad region E311B of the lower electrode film E311 is thereby exposed.

Thereafter a resin film is coated on the entire surface (step ES16). As the resin film, for example, a coating film of a photosensitive polyimide is used. Patterning of the resin film by photolithography may be performed by performing an exposure step and a subsequent developing step on regions of the resin film corresponding to the pad openings (step ES17). The pad openings E321 and E322 penetrating through the resin film E310 and the passivation film E309 are thereby formed. Thereafter, heat treatment (curing) for curing the resin film is performed (step ES18) and further, the first external electrode E303 and the second external electrode E304 are grown inside the pad openings E321 and E322, for example, by the electroless plating method (step ES19). The chip capacitor E301 of the structure shown in FIG. 104, etc., is thereby obtained.

With the patterning of the upper electrode film E313 using the photolithography process, the electrode film portions E131 to E139 of minute areas can be formed with high precision and the fuse units E307 of even finer pattern can be formed. After the patterning of the upper electrode film E313, the total capacitance value is measured and then the fuses to be cut are determined. By cutting the determined fuses, the chip capacitor E301 that is accurately adjusted to the desired capacitance value can be obtained.

Thereafter, the respective chip capacitors E301 are separated from the base substrate to obtain the individual chip capacitors E301.

FIG. 110 is a plan view of a preferred embodiment where projecting marks E70 are provided in place of the recessed marks E7 in the chip capacitor E301. Even with the chip capacitor E301, the projecting marks E70 may be formed in place of forming the recessed marks E7 extending in the up/down direction at one side surface (the one short side surface E6 extending in the length direction of the first external electrode E303 in the substrate E302) of the substrate E302. The projecting marks E70 also function as a marking expressing information of the chip capacitor E301.

Description of a Preferred Embodiment of a Chip Diode

FIG. 111 is a perspective view of a chip diode E401 according to another preferred embodiment of the sixth invention, FIG. 112 is a plan view thereof, and FIG. 113 is a sectional view taken along line CXIII-CXIII in FIG. 112. Further, FIG. 114 is a sectional view taken along line CXIV-CXIV in FIG. 112.

The chip diode E401 includes a $p^+$ type semiconductor substrate E402 (for example, a silicon substrate), a plurality of diode cells ED1 to ED4 formed on the semiconductor substrate E402, and a cathode electrode E403 and an anode electrode E404 connecting the plurality of diode cells ED1 to ED4 in parallel. The semiconductor substrate E402 includes a pair of principal surfaces E402*a* and E402*b* and a plurality of side surfaces E402*c* orthogonal to the pair of principal surfaces E402*a* and E402*b*, and one (principal surface E402*a*) of the pair of principal surfaces E402*a* and E402*b* is arranged as an element forming surface. Hereinafter, the principal surface E402*a* shall be referred to as the "element forming surface E402*a*." The element forming surface E402*a* is formed to a rectangular shape in a plan view and, for example, the length L in the long direction may be approximately 0.4 mm and the length W in the short direction may be approximately 0.2 mm. Also, the thickness T of the chip diode E401 as a whole may be approximately 0.1 mm. An external connection electrode E403B of the cathode electrode E403 and an external connection electrode E404B of the anode electrode E404 are disposed at respective end portions of the element forming surface E402*a*. A diode cell region E407 is provided on the element forming surface E402*a* between the external connection electrodes E403B and E404B.

A plurality of recesses E7 (for example, a maximum of four recesses) that are cut out so as to extend in the thickness direction of the semiconductor substrate E402 are formed on one side surface E402*c* that is continuous with one short side (in the present preferred embodiment, the short side close to the cathode side external connection electrode E403B) of the element forming surface E402*a*. In the present preferred embodiment, each recess E7 extends across the entirety in the thickness direction of the semiconductor substrate E402. In a plan view, each recess E7 is recessed inward from the one short side of the element forming surface E402*a* and, in the present preferred embodiment, has a trapezoidal shape that becomes narrow toward the inner side of the element forming surface E402*a*. Obviously, this planar shape is an example and the planar shape may instead be a rectangular shape, a triangular shape, or a recessingly curved shape, such as a partially circular shape (for example, an arcuate shape), etc.

The recesses E7 indicate the orientation (chip direction) of the chip diode E401. More specifically, the recesses E7 provide a cathode mark that indicates the position of the cathode side external connection electrode E403B. A structure is thereby provided with which the polarity of the chip diode E401 can be ascertained from its outer appearance during mounting. Also as with the recessed marks E7 described above, the recesses E7 indicate other information, such as the type name, date of manufacture, etc., in addition to the polarity direction of the chip diode 401 and also function as a marking.

The semiconductor substrate E402 has four corner portions E409 at four corners, each corresponding to an intersection portion of a pair of mutually adjacent side surfaces among the four side surfaces E402*c*. In the present preferred embodiment, the four corner portions E409 are shaped to round shapes. Each corner portion E409 has a smooth curved surface that is outwardly convex in a plan view as viewed in a direction of a normal to the element forming surface E402*a*. A structure capable of suppressing chipping during the manufacturing process or mounting of the chip diode E401 is thereby arranged.

In the present preferred embodiment, the diode cell region E407 is formed to a rectangular shape. The plurality of diode cells ED1 to ED4 are disposed inside the diode cell region E407. In regard to the plurality of diode cells ED1 to ED4, four are provided in the present preferred embodiment and these are arrayed two-dimensionally at equal intervals in a matrix along the long direction and short direction of the semiconductor substrate E402.

FIG. 115 is a plan view showing the structure of the top surface (element forming surface E402*a*) of the semiconductor substrate E402 with the cathode electrode E403, the anode electrode E404, and the arrangement formed thereon being removed. In each of the regions of the diode cells ED1 to ED4, an $n^+$ type region E410 is formed in a top layer region of the $p^+$ type semiconductor substrate E402. The $n^+$ type regions E410 are separated according to each individual diode cell. The diode cells ED1 to ED4 are thereby made to respectively have p-n junction regions E411 that are separated according to each individual diode cell.

In the present preferred embodiment, the plurality of diode cells ED1 to ED4 are formed to be equal in size and equal in shape and are specifically formed to rectangular shapes, and the $n^+$ type region E410 with a polygonal shape is formed in the rectangular region of each diode cell. In the present preferred embodiment, each $n^+$ type region E410 is formed to a regular octagon having four sides extending along the four sides forming the rectangular region of the corresponding diode cell among the diode cells ED1 to ED4 and another four sides respectively facing the four corner portions of the rectangular region of the corresponding diode cell among the diode cells ED1 to ED4.

As shown in FIG. 113 and FIG. 114, an insulating film E415 (omitted from illustration in FIG. 112), constituted of an oxide film, etc., is formed on the element forming surface E402*a* of the semiconductor substrate E402. Contact holes E416 (cathode contact holes) exposing top surfaces of the respective $n^+$ type regions E410 of the diode cells ED1 to ED4 and contact holes E417 (anode contact holes) exposing the element forming surface E402*a* are formed in the insulating film E415.

The cathode electrode E403 and the anode electrode E404 are formed on the top surface of the insulating film E415. The cathode electrode E403 includes a cathode electrode film E403A formed on the top surface of the insulating film E415 and the external connection electrode E403B bonded to the cathode electrode film E403A. The cathode electrode film E403A includes a lead-out electrode EL1 connected to the plurality of diode cells ED1 and ED3, a lead-out electrode EL2 connected to the plurality of diodes ED2 and ED4, and a cathode pad E405 formed integral to the lead-out electrodes EL1 and EL2 (cathode lead-out electrodes). The cathode pad E405 is formed to a rectangle at one end portion of the element forming surface E402*a*. The external connection electrode E403B is connected to the cathode pad E405. The external connection electrode E403B is thereby connected in common to the lead-out electrodes EL1 and EL2. The cathode pad E405 and the external connection electrode E403B constitute an external connection portion (cathode external connection portion) of the cathode electrode E403.

The anode electrode E404 includes an anode electrode film E404A formed on the top surface of the insulating film E415 and the external connection electrode E404B bonded to the anode electrode film E404A. The anode electrode film E404A is connected to the $p^+$ type semiconductor substrate E402 and has an anode pad E406 near one end portion of the element forming surface E402*a*. The anode pad E406 is constituted of a region of the anode electrode film E404A that is disposed at the one end portion of the element forming surface E402*a*. The external connection electrode E404B is connected to the anode pad E406. The anode pad E406 and the external connection electrode E404B constitute an external connection portion (anode external connection portion) of the anode electrode E404. The region of the anode electrode film E404A besides the anode pad E406 is an anode lead-out electrode that is led out from the anode contact holes E417.

The lead-out electrode EL1 enters into the contact holes E416 of the diode cells ED1 and ED3 from the top surface of the insulating film E415 and is in ohmic contact with the respective $n^+$ type regions E410 of the diode cells ED1 and ED3 inside the respective contact holes E16. In the lead-out electrode ELL the portions connected to the diode cells ED1 and ED3 inside the contact holes E416 constitute cell connection portions EC1 and EC3. Similarly, the lead-out electrode EL2 enters into the contact holes E416 of the diode cells ED2 and ED4 from the top surface of the insulating film E415 and is in ohmic contact with the respective $n^+$ type regions E410 of the diode cells ED2 and ED4 inside the respective contact holes E416. In the lead-out electrode EL2, the portions connected to the diode cells ED2 and ED4 inside the contact holes E416 constitute cell connection portions EC2 and EC4. The anode electrode film E404A extends to inner sides of the contact holes E417 from the top surface of the insulating film E415 and is in ohmic contact with the $p^+$ type semiconductor substrate E402 inside the contact holes E417. In the present preferred embodiment, the cathode electrode film E403A and the anode electrode film E404A are made of the same material.

In the present preferred embodiment, AlSi films are used as the electrode films. When an AlSi film is used, the anode electrode film E404A can be put in ohmic contact with the p$^+$ type semiconductor substrate E402 without having to provide a p$^+$ type region on the top surface of the semiconductor substrate E402. That is, an ohmic junction can be formed by putting the anode electrode film E404A in direct contact with the p$^+$ type semiconductor substrate E402. A process for forming the p$^+$ type region can thus be omitted.

The cathode electrode film E403A and the anode electrode film E404A are separated by a slit E418. The lead-out electrode EL1 is formed rectilinearly along a straight line passing from the diode cell ED1 to the cathode pad E405 through the diode cell ED1. Similarly, the lead-out electrode EL2 is formed rectilinearly along a straight line passing from the diode cell ED2 to the cathode pad E405 through the diode cell ED4. The lead-out electrodes EL1 and EL2 respectively have uniform widths W1 and W2 at all locations between the n$^+$ type regions E410 and the cathode pad E405, and the widths W1 and W2 are wider than the widths of the cell connection portions EC1, EC2, EC3, and EC4. The widths of the cell connection portions EC1 to EC4 are defined by the lengths in the direction orthogonal to the lead-out directions of the lead-out electrodes EL1 and EL2. Tip end portions of the lead-out electrodes EL1 and EL2 are shaped to match the planar shapes of the n$^+$ type regions E410. Base end portions of the lead-out electrodes EL1 and EL2 are connected to the cathode pad E405. The slit E418 is formed so as to border the lead-out electrodes EL1 and EL2. On the other hand, the anode electrode film E404A is formed on the top surface of the insulating film E415 so as to surround the cathode electrode film E403A across an interval corresponding to the slit E418 of substantially fixed width. The anode electrode film E404A integrally includes a comb-teeth-like portion extending in the long direction of the element forming surface E402*a* and the anode pad E406 that is constituted of a rectangular region.

The cathode electrode film E403A and the anode electrode film E404A are covered by a passivation film E420 (omitted from illustration in FIG. 112), constituted, for example, of a nitride film, and a resin film E421, made of polyimide, etc., is further formed on the passivation film E420. A pad opening E422 exposing the cathode pad E405 and a pad opening E423 exposing the anode pad E406 are formed so as to penetrate through the passivation film E420 and the resin film E421. The external connection electrodes E403B and E404B are respectively embedded in the pad openings E422 and E423. The passivation film E420 and the resin film E421 constitute a protective film to suppress or prevent the entry of moisture to the lead-out electrodes EL1 and EL2 and the p-n junction regions E411 and also absorb impacts, etc., from the exterior, thereby contributing to improvement of the durability of the chip diode E401.

The external connection electrodes E403B and E404B may have top surfaces at positions lower than the top surface of the resin film E421 (positions close to the semiconductor substrate E402) or may project from the top surface of the resin film E421 and have top surfaces at positions higher than the resin film E421 (positions far from the semiconductor substrate E402). An example where the external connection electrodes E403B and E404B project from the top surface of the resin film E421 is shown in FIG. 113. Each of the external connection electrodes E403B and E404B may be constituted, for example, of an Ni/Pd/Au laminated film having an Ni film in contact with the electrode film E403A or E404A, a Pd film formed on the Ni film, and an Au film formed on the Pd film. Such a laminated film may be formed by a plating method.

In each of the diode cells ED1 to ED4, the p-n junction region E411 is formed between the p-type semiconductor substrate E402 and the n$^+$ type region E410, and a p-n junction diode is thus formed respectively. The n$^+$ type regions E410 of the plurality of diode cells ED1 to ED4 are connected in common to the cathode electrode E403, and the p$^+$ type semiconductor substrate E402, which is the p-type region in common to the diode cells ED1 to ED4, is connected in common to the anode electrode E404. The plurality of diode cells ED1 to ED4, formed on the semiconductor substrate E402, are thereby connected in parallel all together.

FIG. 116 is an electric circuit diagram showing the electrical structure of the interior of the chip diode E401. With the p-n junction diodes respectively constituted by the diode cells ED1 to ED4, the cathode sides are connected in common by the cathode electrode E403, the anode sides are connected in common by the anode electrode E404, and all of the diodes are thereby connected in parallel and made to function as a single diode as a whole.

With the arrangement of the present preferred embodiment, the chip diode E401 has the plurality of diode cells ED1 to ED4 and each of the diode cells ED1 to ED4 has the p-n junction region E411. The p-n junction regions E411 are separated according to each of the diode cells ED1 to ED4. The chip diode E401 is thus made long in the peripheral length of the p-n junction regions E411, that is, the total peripheral length (total extension) of the n$^+$ type regions E410 in the semiconductor substrate E402. The electric field can thereby be dispersed and prevented from concentrating at vicinities of the p-n junction regions E411, and the ESD tolerance can thus be improved. That is, even when the chip diode E401 is to be formed compactly, the total peripheral length of the p-n junction regions E411 can be made large, thereby enabling both downsizing of the chip diode E401 and securing of the ESD tolerance to be achieved at the same time.

With the present preferred embodiment, the recesses E7 expressing the cathode direction are formed on the short side of the semiconductor substrate E402 close to the cathode side external connection electrode E403B and there is thus no need to mark a cathode mark on a rear surface (the principal surface at the side opposite to the element forming surface E402*a*) of the semiconductor substrate E402. The recesses E7 may be formed at the same time as performing the processing for cutting out the chip diode E401 from a wafer (base substrate). Also, the recesses E7 can be formed to indicate the direction of the cathode even when the size of the chip diode E401 is minute and marking is difficult. A step for marking can thus be omitted and a sign expressing the cathode direction can be provided even in the chip diode E401 of minute size.

FIG. 117 is a process diagram for describing an example of a manufacturing process of the chip diode E401. Also, FIG. 118A and FIG. 118B are sectional views of the arrangement in the middle of the manufacturing process of FIG. 117 and show a section corresponding to FIG. 113. FIG. 119 is a plan view of a p$^+$ type semiconductor wafer EW as a base substrate of the semiconductor substrate E402 and shows a partial region in a magnified manner.

First, the p$^+$ type semiconductor wafer EW is prepared as the base substrate of the semiconductor substrate E402. A top surface of the semiconductor wafer EW is an element forming surface EWa and corresponds to the element forming surface E402*a* of the semiconductor substrate E402. A plurality of chip diode regions E401*a*, corresponding to a plurality of the chip diodes E401, are arrayed and set in a matrix on the element forming surface EWa. A boundary region E8 is provided between adjacent chip diode regions E401*a*. The boundary region E8 is a band-like region having a substantially fixed width and extends in two orthogonal directions to form a lattice. After performing necessary steps on the semiconductor wafer EW, the semiconductor wafer EW is cut apart along the boundary region E8 to obtain the plurality of chip diodes E401.

The steps executed on the semiconductor wafer EW are, for example, as follows. First, the insulating film E415 (with a thickness, for example, of 8000 Å to 8600 Å), which is a thermal oxide film or CVD oxide film, etc., is formed on the element forming surface EWa of the $p^+$ type semiconductor wafer EW (ES1) and a resist mask is formed on the insulating film E415 (ES2). Openings corresponding to the $n^+$ type regions E410 are then formed in the insulating film E415 by etching using the resist mask (ES3). Further, after peeling off the resist mask, an n-type impurity is introduced to top layer portions of the semiconductor wafer EW that are exposed from the openings formed in the insulating film E415 (ES4). The introduction of the n-type impurity may be performed by a step of depositing phosphorus as the n-type impurity on the top surface (so-called phosphorus deposition) or by implantation of n-type impurity ions (for example, phosphorus ions). Phosphorus deposition is a process of depositing phosphorus on the top surface of the semiconductor wafer EW exposed inside the openings in the insulating film E415 by conveying the semiconductor wafer EW into a diffusion furnace and performing heat treatment while making $POCl_3$ gas flow inside a diffusion passage. After thickening the insulating film E415 (thickening, for example, by approximately 1200 Å by CVD oxide film formation) as necessary (ES5), heat treatment (drive-in) for activation of the impurity ions introduced into the semiconductor wafer EW is performed (ES6). The $n^+$ type regions E410 are thereby formed on the top layer portion of the semiconductor wafer EW.

Thereafter, another resist mask having openings matching the contact holes E416 and E417 is formed on the insulating film E415 (ES7). The contact holes E416 and E417 are formed in the insulating film E415 by etching via the resist mask (ES8), and the resist mask is peeled off thereafter. An electrode film that constitutes the cathode electrode E403 and the anode electrode E404 is then formed on the insulating film E415, for example, by sputtering (ES9). In the present preferred embodiment, an electrode film (for example, of 10000 Å thickness), made of AlSi, is formed. Another resist mask having an opening pattern corresponding to the slit E418 is then formed on the electrode film (ES10) and the slit E418 is formed in the electrode film by etching (for example, reactive ion etching) via the resist mask (ES11). The width of the slit E418 may be approximately 3 μm. The electrode film is thereby separated into the cathode electrode film E403A and the anode electrode film E404A.

Then after peeling off the resist film, the passivation film E420, which is a nitride film, etc., is formed, for example, by the CVD method (ES12), and further, polyimide, etc., is applied to form the resin film E421 (ES13). For example, a polyimide imparted with photosensitivity is applied, and after exposing in a pattern corresponding to the pad openings E422 and E423, the polyimide film is developed (step ES14). The resin film E421 having openings corresponding to the pad openings E422 and E423 is thereby formed. Thereafter, heat treatment for curing the resin film is performed as necessary (ES15). The pad openings E422 and E423 are then formed in the passivation film E420 by performing dry etching (for example, reactive ion etching) using the resin film E421 as a mask (ES16). Thereafter, the external connection electrodes E403B and E404B are formed inside the pad openings E422 and E423 (ES17). The external connection electrodes E403B and E404B may be formed by plating (preferably, electroless plating).

Thereafter, a resist mask E83 (see FIG. 118A), having a lattice-shaped opening matching the boundary region E8 (see FIG. 119), is formed (ES18). Plasma etching is performed via the resist mask E83 and the semiconductor wafer EW is thereby etched to a predetermined depth from the element forming surface EWa as shown in FIG. 118A. A groove E81 for cutting is thereby formed along the boundary region E8 (ES19). After peeling off the resist mask E83, the semiconductor wafer EW is ground from the rear surface EWb until a bottom portion of the groove E81 is reached as shown in FIG. 118B (ES20). The plurality of chip diode regions E401*a* are thereby separated into individual pieces and the chip diodes E401 with the structure described above can thereby be obtained.

As shown in FIG. 119, the resist mask E83 arranged to form the groove E81 at the boundary region E8 has, at positions adjacent to the four corners of each chip diode region E401*a*, round shaped portions E84 of curved shapes that are convex toward outer sides of the chip diode region E401*a*. Each round shaped portion E84 is formed to connect two adjacent sides of a chip diode region E401*a* by a smooth curve. Further, the resist mask E83 arranged to form the groove E81 in the boundary region E8 has, at positions adjacent to one short side of each chip diode region E401*a*, a plurality of recesses E85 that are recessed toward an inner side of the chip diode region E401*a*. Therefore, when the groove E81 is formed by plasma etching using the resist mask E83 as a mask, the groove E81 is to made to have, at positions adjacent to the four corners of each chip diode region E401*a*, round shaped portions of curved shapes that are convex toward the outer sides of the chip diode region E401*a* and to have, at positions adjacent to one side of each chip diode region E401*a*, a plurality of recesses that are recessed toward the inner side of the chip diode region E401*a*. Therefore in the step of forming the groove E81 for cutting out the chip diode regions E401*a* from the semiconductor wafer EW, the corner portions E409 of the four corners can be shaped to round shapes and the recesses E7 can be formed as the cathode mark and marking in one short side (the short side at the cathode side) in each chip diode E401 at the same time. That is, the corner portions E409 can be processed to round shapes and the recesses E7 can be formed as the cathode mark and marking without adding a dedicated step.

FIG. 120 is a plan view of a preferred embodiment where, in the chip diode E401, projecting marks E70 are provided in place of the recesses E7 as the marking. It was described above that the recesses E7 indicate the orientation (chip direction) of the chip diode E401 and, more specifically, provide the cathode mark that indicates the position of the cathode side external connection electrode E403B and that a structure is thereby provided with which the polarity of the chip diode E401 can be ascertained from its outer appearance during mounting. Also as with the recessed marks E7 described above, the recesses E7 indicate other information, such as the type name, date of manufacture, etc., in addition to the polarity direction of the chip diode 401 and also function as a marking. The recesses E7 may be replaced by the projecting marks E70 as shown in FIG. 120.

The process for manufacturing the chip diode E401 shown in FIG. 120 is substantially the same as the manufacturing process of the chip diode E401, shown in FIG. 111 to FIG. 115, that was described using FIG. 117. However, the shape of the resist mask E83 formed in step ES18 of FIG. 117 differs. The resist mask E83 used in the manufacturing process of the chip diode E401 shall now be described with reference to FIG. 121. As shown in FIG. 121, the resist mask E83 arranged to form the groove E81 at the boundary region E8 has, at positions adjacent to the four corners of each chip diode region E401*a*, round shaped portions E84 of curved shapes that are convex toward outer sides of the chip diode region E401*a*. Each round shaped portion E84 is formed to connect two adjacent sides of a chip diode region E401*a* by a smooth curve. Further, the resist mask E83 arranged to form the groove E81 in the boundary region E8 has, at positions adjacent to one short side of each chip diode region E401*a*, a plurality of projections E86 that project toward an outer side of the chip diode region E401*a*. Therefore, when the groove E81 is formed by plasma etching using the resist mask E83 as a mask, the groove E81 is to made to have, at positions adjacent to the four corners of the respective chip diode regions E401*a*, round shaped portions of curved shapes that are convex toward the outer sides of the respective chip diode regions E401*a* and to have, at positions adjacent to one side of each chip diode region E401*a*, a plurality of projections that project toward the outer side of the chip diode region E401*a*. Therefore in the step of forming the groove E81 for cutting out the chip diode regions E401*a* from the semiconductor wafer EW, the corner portions E409 of the four corners can be shaped to round shapes and the projections E70 can be formed as the cathode mark and marking in one short side (the short side at the cathode side) in each chip diode E401 at the same time. That is, the corner portions E409 can be processed to round shapes and the projections E70 can be formed as the cathode mark and marking without adding a dedicated step.

Although a chip resistor, a chip capacitor, and a chip diode were described above as preferred embodiments of the sixth invention, the sixth invention may also be applied to chip parts besides a chip resistor, a chip capacitor, and a chip diode. For example, a chip inductor may be cited as another example of a chip part. A chip inductor is a part having, for example, a multilayer wiring structure on a substrate and having an inductor (coil) and wiring related thereto inside the multilayer wiring structure and is arranged so that an arbitrary inductor in the multilayer wiring structure can be incorporated into a circuit or cut off from the circuit by a fuse. The chip inductor can be made a chip inductor (chip part) that is easy to mount and easy to handle by adopting the structure of indicating information by recesses and/or projections, that is, the structure of the recessed mark grooves, etc., according to the sixth invention.

FIG. 122 is a perspective view of an outer appearance of a smartphone that is an example of an electronic equipment in which the chip diode, the chip resistor, the chip capacitor, etc., described above are used. The smartphone E201 is arranged by housing electronic parts in the interior of a casing E202 with a flat rectangular parallelepiped shape. The casing E202 has a pair of principal surfaces with an oblong shape at its front side and rear side, and the pair of principal surfaces are joined by four side surfaces. A display surface of a display panel E203, constituted of a liquid crystal panel or an organic EL panel, etc., is exposed at one of the principal surfaces of the casing E202. The display surface of the display panel E203 constitutes a touch panel and provides an input interface for a user. The display panel E203 is formed to an oblong shape that occupies most of one of the principal surfaces of the casing E202. Operation buttons E204 are disposed along one short side of the display panel E203. In the present preferred embodiment, a plurality (three) of the operation buttons E204 are aligned along the short side of the display panel E203. The user can call and execute necessary functions by performing operations of the smartphone E201 by operating the operation buttons E204 and the touch panel.

A speaker E205 is disposed in a vicinity of the other short side of the display panel E203. The speaker E205 provides an earpiece for a telephone function and is also used as an acoustic conversion unit for reproducing music data, etc. On the other hand, close to the operation buttons E204, a microphone E206 is disposed at one of the side surfaces of the casing E202. The microphone E206 provides a mouthpiece for the telephone function and may also be used as a microphone for sound recording.

FIG. 123 is an illustrative plan view of the arrangement of an electronic circuit assembly E210 housed in the interior of the housing E202. The electronic circuit assembly E210 includes a wiring substrate E211 and circuit parts mounted on a mounting surface of the wiring substrate E211. The plurality of circuit parts include a plurality of integrated circuit elements (ICs) E212 to E220 and a plurality of chip parts. The plurality of ICs include a transmission processing IC E212, a one-segment TV receiving IC E213, a GPS receiving IC E214, an FM tuner IC E215, a power supply IC E216, a flash memory E217, a microcomputer E218, a power supply IC E219, and a baseband IC E220. The plurality of chip parts include chip inductors E221, E225, and E235, chip resistors E222, E224, and E233, chip capacitors E227, E230, and E234, and chip diodes E228 and E231. The chip parts are mounted on the mounting surface of the wiring substrate E211, for example, by flip-chip bonding. The chip diodes according to any one of the preferred embodiments described above may be applied as the chip diodes E228 and E231.

The transmission processing IC E212 has incorporated therein an electronic circuit arranged to generate display control signals for the display panel E203 and receive input signals from the touch panel on the top surface of the display panel E203. For connection with the display panel E203, the transmission processing IC E212 is connected to a flexible wiring E209. The one-segment TV receiving IC E213 incorporates an electronic circuit that constitutes a receiver for receiving one-segment broadcast (terrestrial digital television broadcast targeted for reception by portable equipment) radio waves. A plurality of the chip inductors E221 and a plurality of the chip resistors E222 are disposed in a vicinity of the one-segment TV receiving IC E213. The one-segment TV receiving IC E213, the chip inductors E221, and the chip resistors E222 constitute a one-segment broadcast receiving circuit E223. The chip inductors E221 and the chip resistors E222 respectively have accurately adjusted inductances and resistances and provide circuit constants of high precision to the one-segment broadcast receiving circuit E223.

The GPS receiving IC E214 incorporates an electronic circuit that receives radio waves from GPS satellites and outputs positional information of the smartphone E201. The FM tuner IC E215 constitutes, together with a plurality of the chip resistors E224 and a plurality of the chip inductors E225 mounted on the wiring substrate E211 in a vicinity thereof, an FM broadcast receiving circuit E226. The chip resistors E224 and the chip inductors E225 respectively have accurately adjusted resistances and inductances and provide circuit constants of high precision to the FM broadcast receiving circuit E226.

A plurality of the chip capacitors E227 and a plurality of the chip diodes E228 are mounted on the mounting surface of the wiring substrate E211 in a vicinity of the power supply IC E216. Together with the chip capacitors E227 and the chip diodes E228, the power supply IC E216 constitutes a power supply circuit E229. The flash memory E217 is a storage device for recording operating system programs, data generated in the interior of the smartphone E201, and data and programs acquired from the exterior by communication functions, etc.

The microcomputer E218 is a computing processing circuit that incorporates a CPU, a ROM, and a RAM and realizes a plurality of functions of the smartphone E201 by executing various computational processes. More specifically, computational processes for image processing and various application programs are realized by actions of the microcomputer E218. A plurality of the chip capacitors E230 and a plurality of the chip diodes E231 are mounted on the mounting surface of the wiring substrate E211 in a vicinity of the power supply IC E219. Together with the chip capacitors E230 and the chip diodes E231, the power supply IC E219 constitutes a power supply circuit E232.

A plurality of the chip resistors E233, a plurality of the chip capacitors E234, and a plurality of the chip inductors E235 are mounted on the mounting surface of the wiring substrate E211 in a vicinity of the baseband IC E220. Together with the chip resistors E233, the chip capacitors E234, and the chip inductors E235, the baseband IC E220 constitutes a baseband communication circuit E236. The baseband communication circuit E236 provides communication functions for telephone communication and data communication.

With the above arrangement, electric power that is appropriately adjusted by the power supply circuits E229 and E232 is supplied to the transmission processing IC E212, the GPS receiving IC E214, the one-segment broadcast receiving circuit E223, the FM broadcast receiving circuit E226, the baseband communication circuit E236, the flash memory E217, and the microcomputer E218. The microcomputer E218 performs computational processes in response to input signals input via the transmission processing IC E212 and makes the display control signals be output from the transmission processing IC E212 to the display panel E203 to make the display panel E203 perform various displays.

When receiving of a one-segment broadcast is commanded by operation of the touch panel or the operation buttons E204, the one-segment broadcast is received by actions of the one-segment broadcast receiving circuit E223. Computational processes for outputting the received images to the display panel E203 and making the received audio signals be acoustically converted by the speaker E205 are executed by the microcomputer E218. Also, when positional information of the smartphone E201 is required, the microcomputer E218 acquires the positional information output by the GPS receiving IC E214 and executes computational processes using the positional information.

Further, when an FM broadcast receiving command is input by operation of the touch panel or the operation buttons E204, the microcomputer E218 starts up the FM broadcast receiving circuit E226 and executes computational processes for outputting the received audio signals from the speaker E205. The flash memory E217 is used for storing data acquired by communication and storing data prepared by computations by the microcomputer E218 and inputs from the touch panel. The microcomputer E218 writes data into the flash memory E217 or reads data from the flash memory E217 as necessary.

The telephone communication or data communication functions are realized by the baseband communication circuit E236. The microcomputer E218 controls the baseband communication circuit E236 to perform processes for sending and receiving audio signals or data.

[7] Seventh Invention

In portable electronic equipment as represented by cellphones, the downsizing of the circuit parts constituting the internal circuits is being demanded. Downsizing is thus being demanded for chip diodes as well and accordingly, it is becoming difficult to secure current capability and also secure ESD (electrostatic discharge) tolerance.

An object of the seventh invention is to provide a chip diode that is improved in ESD tolerance. A more specific object of the seventh invention is to provide a chip diode with which both downsizing and securing of ESD tolerance can be achieved at the same time. The seventh invention has the following features.

F1. A chip diode including a plurality of diode cells, formed on a semiconductor substrate of a first conductivity type and each having an individual second conductivity type region forming a p-n junction with the semiconductor substrate, an insulating film covering a principal surface of the semiconductor substrate and having formed therein a plurality of contact holes respectively exposing the second conductivity type regions of the plurality of diode cells, a first electrode connected to a region of the first conductivity type of the semiconductor substrate, and a second electrode formed on the insulating film and bonded to the respective second conductivity type regions of the plurality of diode cells via the plurality of contact holes, and where a distance from a peripheral edge of each bonding region of the second electrode and a second conductivity type region inside a contact hole to a peripheral edge of the second conductivity type region is not less than 1 μm and not more than 10% of a diameter of the second conductivity type region.

With this arrangement, the plurality of diode cells, each having the second conductivity type region are formed on the semiconductor substrate of the first conductivity type. The insulating film is formed on the semiconductor substrate and the second electrode is connected to the second conductivity type region via the contact holes formed in the insulating film. The first electrode is connected to the region of the first conductivity type of the semiconductor substrate. The plurality of diode cells are thus connected in parallel between the first electrode and the second electrode. The ESD tolerance can thereby be improved, and in particular, both reduction of the chip size and securing of ESD tolerance can be achieved at the same time. More specifically, the p-n junctions (p-n junction regions) that are separated according to each diode cell are formed and these are connected in parallel. By a p-n junction region being formed in each of the plurality of diode cells, a peripheral length of the p-n junction regions on the semiconductor substrate can be made long. Concentration of electric field is thereby relaxed and the ESD tolerance can be improved. The peripheral length of the p-n junction regions is the total extension of the boundary lines between p-type regions and n-type regions at the top surface of the semiconductor substrate.

Also with the present invention, the distance from the peripheral edge of each bonding region of the second electrode and a second conductivity type region inside a contact hole to the peripheral edge of the second conductivity type region is not less than 1 μm and not more than 10% of the diameter of the second conductivity type region. By defining the distance as being not less than 1 μm, the flowing of a leak current between the peripheral edge of a bonding region of the second electrode and a second conductivity type region and the semiconductor substrate by bypassing the second conductivity type region can be suppressed or prevented. Meanwhile, the distance is defined as being not more than 10% of the diameter of the second conductivity type region and the ESD tolerance can thus be improved further.

Normally, it may be considered that the greater the distance, the greater the ESD tolerance. The inventor thus predicted that the greater the distance, the greater the ESD tolerance and performed the following experiment to specify an appropriate range of the distance. That is, the ESD tolerance was measured for samples with which the distance was varied by setting the size of the contact hole variously with respect to the second conductivity type region. As a result, the inventor found that contrary to the prediction, the ESD tolerance is increased by decreasing the distance. Also, it was found that when the distance is made too small, a leak current flows between the peripheral edge of the bonding region of the second electrode and the second conductivity type region and the semiconductor substrate by bypassing the second conductivity type region. The present invention has been made based on such a finding.

F2. The chip diode according to "F1.," where each second conductivity type region has a polygonal shape, the bonding region has a polygonal shape similar to the second conductivity type region, corresponding sides of the second conductivity type region and the bonding region are disposed in parallel to each other, and the distance from the peripheral edge of the bonding region to the peripheral edge of the second conductivity type region is defined as the distance between the sides disposed in parallel to each other.

F3. The chip diode according to "F1." or "F2.," where each second conductivity type region has a polygonal shape and the diameter of the second conductivity type region is defined as twice an average value of the lengths of a plurality of perpendiculars respectively drawn from a center of gravity of the second conductivity type region to the plurality of sides of the second conductivity type region.

F4. The chip diode according to any one of "F1." to "F3.," where the second electrode includes a plurality of lead-out electrodes, led out from the bonding regions onto a region on the semiconductor substrate in which the second conductivity type region is not formed, and an external electrode portion connected to the lead-out electrodes and disposed on the insulating region and connected to the plurality of lead-out electrodes on the region in which the second conductivity type region is not formed.

With this arrangement, the external electrode portion of the second electrode can be disposed so as to avoid a position directly above the second conductivity type region, and application of a large impact to the p-n junction region can thus be avoided during mounting of the chip diode on a mounting substrate or during connection of a bonding wire to the external electrode portion of the second electrode. Destruction of the p-n junction region can thereby be avoided, and a chip diode that is excellent in durability against external forces and therefore improved in reliability can be realized.

F5. The chip diode according to any one of "F1." to "F4.," where the semiconductor substrate is constituted of a p-type semiconductor substrate and a plurality of n-type diffusion layers, forming the plurality of second conductivity type regions, respectively, are formed on the p-type semiconductor substrate while being separated from each other. With this arrangement, the semiconductor substrate is constituted of the p-type semiconductor substrate and therefore stable characteristics can be realized even if an epitaxial layer is not formed on the semiconductor substrate. That is, an n-type semiconductor wafer is large in in-plane variation of resistivity, and therefore an epitaxial layer with low in-plane variation of resistivity must be formed on the top surface and an impurity diffusion layer must be formed on the epitaxial layer to form the p-n junction. On the other hand, a p-type semiconductor wafer is low in in-plane variation of resistivity and a diode with stable characteristics can be cut out from any location of the wafer without having to form an epitaxial layer. Therefore by using the p-type semiconductor substrate, the manufacturing process can be simplified and the manufacturing cost can be reduced.

F6. The chip diode according to "F5.," where the second electrode includes an electrode film contacting the p-type semiconductor substrate and made of AlSi. With this arrangement, the second electrode includes the AlSi electrode film that contacts the p-type semiconductor substrate. AlSi is close in work function to a p-type semiconductor (especially a p-type silicon semiconductor). An AlSi electrode film can thus form a satisfactory ohmic junction with the p-type semiconductor substrate. There is thus no need to form a high impurity concentration diffusion layer for ohmic junction on the p-type semiconductor substrate. The manufacturing process can thereby be simplified and the productivity and the production cost can be reduced accordingly.

F7. The chip diode according to "F4.," where the plurality of second conductivity type regions include a plurality of second conductivity type regions that are aligned on a straight line toward the external electrode portion and the plurality of second conductivity type regions that are aligned on the straight line are connected to the external electrode portions by a lead-out electrode in common that is formed rectilinearly along the straight line.

With this arrangement, the plurality of second conductivity type regions that are aligned on the straight line toward the external electrode portion of the second electrode are connected to the external electrode portion by the rectilinear lead-out electrode in common. The length of the lead-out electrode from the second conductivity type region to the external electrode portion of the second electrode can thereby be minimized and electromigration can thus be reduced. Also, a single lead-out electrode can be shared by the plurality of second conductivity type regions to enable a lead-out electrode of wide line width to be laid out on the semiconductor substrate while forming a large number of second conductivity type regions to increase the peripheral length of the p-n junction regions. Both further improvement of ESD tolerance and reduction of electromigration can thereby be achieved at the same time to provide a chip diode of even higher reliability.

F8. The chip diode according to any one of "F1." to "F7.," where the plurality of second conductivity type regions are arrayed two-dimensionally on the semiconductor substrate. With this arrangement, the ESD tolerance can be improved further by the plurality of diode cells being arrayed two-dimensionally (preferably arrayed two-dimensionally at equal intervals). The plurality of diode cells may be formed to be equal in size (more specifically, the p-n junction regions of the plurality of diode cells may be formed to be equal in size). With this arrangement, the plurality of diode cells have substantially equal characteristics and the chip diode thus has satisfactory characteristics as a whole and can be made to have a sufficient ESD tolerance even when downsized.

Preferably, not less than four of the diode cells are provided. With this arrangement, by not less than four of the diode cells being provided, the peripheral length of the diode junction regions can be made long and the ESD tolerance can thus be improved efficiently.

F9. The chip diode according to any one of “F1.” to “F8.,” where the first electrode and the second electrode are disposed at the principal surface side of the semiconductor substrate. With this arrangement, both the first electrode and the second electrode are formed on one of the surfaces of the semiconductor substrate, and the chip diode can thus be surface-mounted on a mounting substrate. That is, a flip-chip connection type chip diode can be provided. The space occupied by the chip diode can thereby be made small. In particular, reduction of height of the chip diode on the mounting substrate can be realized. Effective use can thereby be made of the space inside a casing of a compact electronic equipment, etc., to contribute to high-density packaging and downsizing.

F10. The chip diode according to “F4.,” further including a protective film formed on the principal surface of the semiconductor substrate so as to cover the lead-out electrodes while partially exposing the first electrode and the second electrode. With this arrangement, the protective film that covers the lead-out electrodes while exposing the first electrode and the second electrode is formed so that entry of moisture to the lead-out electrodes and the p-n junction regions can be suppressed or prevented. In addition, the durability against external forces can be improved by the protective film and the reliability can be improved further.

F11. The chip diode according to any one of “F1.” to “F10.,” where the principal surface of the semiconductor substrate has a rectangular shape with rounded corner portions. With this arrangement, the principal surface of the semiconductor substrate has the rectangular shape with rounded corner portions. Fragmenting (chipping) of the corner portions of the chip diode can thereby be suppressed or prevented and a chip diode with few appearance defects can be provided.

F12. The chip diode according to “F11.,”, where a recess expressing a cathode direction is formed in a middle portion of one side of the rectangular shape. With this arrangement, the recess expressing the cathode direction is formed on one side of the semiconductor substrate of rectangular shape and there is thus no need to form a mark (cathode mark) that expresses the cathode direction by marking, etc., on a surface of the semiconductor substrate (for example, on the top surface of the protective film). A recess such as the above may be formed at the same time as performing the processing for cutting out the chip diode from a wafer (base substrate). Also, the recess can be formed even when the size of the chip diode is minute and marking is difficult. A step for marking can thus be omitted and a sign expressing the cathode direction can be provided even in a chip diode of minute size.

F13. A circuit assembly including a mounting substrate and the chip diode according to any one of “F1.” to “F12.” that is mounted on the mounting substrate. With this arrangement, a circuit assembly can be provided that uses the chip diode that is high in ESD tolerance and is thus improved in reliability. A circuit assembly of high reliability can thus be provided.

F14. The circuit assembly according to “F13.,” where the chip diode is connected to the mounting substrate by wireless bonding (face-down bonding or flip-chip bonding). With this arrangement, the space occupied by the chip diode on the mounting substrate can be made small to enable a contribution to be made to high-density packaging of electronic parts.

F15. An electronic equipment including the circuit assembly according to “F13.” or “F14.” and a casing housing the circuit assembly. With this arrangement, an electronic equipment can be provided with which the circuit assembly, using the chip diode that is high in ESD tolerance and is thus improved in reliability, is housed in the casing. An electronic equipment of high reliability can thus be provided.

Preferred embodiments of the seventh invention shall now be described in detail with reference to the attached drawings.

FIG. 124 is a perspective view of a chip diode according to a preferred embodiment of the seventh invention, FIG. 125 is a plan view thereof, and FIG. 126 is a sectional view taken along line CXXVI-CXXVI in FIG. 125. Further, FIG. 127 is a sectional view taken along line CXXVII-CXXVII in FIG. 125.

The chip diode F1 includes a $p^+$ type semiconductor substrate F2 (for example, a silicon substrate), a plurality of diode cells FD1 to FD4 formed on the semiconductor substrate F2, and a cathode electrode F3 and an anode electrode F4 connecting the plurality of diode cells FD1 to FD4 in parallel. The semiconductor substrate F2 includes a pair of principal surfaces F2*a* and F2*b* and a plurality of side surfaces F2*c* orthogonal to the pair of principal surfaces F2*a* and F2*b*, and one (principal surface F2*a*) of the pair of principal surfaces F2*a* and F2*b* is arranged as an element forming surface. Hereinafter, the principal surface F2*a* shall be referred to as the “element forming surface F2*a*.” The element forming surface F2*a* is formed to a rectangular shape in a plan view and, for example, the length L in the long direction may be approximately 0.4 mm and the length W in the short direction may be approximately 0.2 mm. Also, the thickness T of the chip diode F1 as a whole may be approximately 0.1 mm. An external connection electrode F3B of the cathode electrode F3 and an external connection electrode F4B of the anode electrode F4 are disposed at respective end portions of the element forming surface F2*a*. A diode cell region F7 is provided on the element forming surface F2*a* between the external connection electrodes F3B and F4B.

A recess F8 that is cut out so as to extend in the thickness direction of the semiconductor substrate F2 is formed on one side surface F2*c* that is continuous with one short side (in the present preferred embodiment, the short side close to the cathode side external connection electrode F3B) of the element forming surface F2*a*. In the present preferred embodiment, the recess F8 extends across the entirety in the thickness direction of the semiconductor substrate F2. In a plan view, the recess F8 is recessed inward from the one short side of the element forming surface F2*a* and, in the present preferred embodiment, has a trapezoidal shape that becomes narrow toward the inner side of the element forming surface F2*a*. Obviously, this planar shape is an example and the planar shape may instead be a rectangular shape, a triangular shape, or a recessingly curved shape, such as a partially circular shape (for example, an arcuate shape), etc. The recess F8 indicates the orientation (chip direction) of the chip diode F1. More specifically, the recess F8 provides a cathode mark that indicates the position of the cathode side external connection electrode F3B. A structure is thereby provided with which the polarity of the chip diode F1 can be ascertained from its outer appearance during mounting.

The semiconductor substrate F2 has four corner portions F9 at four corners, each corresponding to an intersection portion of a pair of mutually adjacent side surfaces among the four side surfaces F2*c*. In the present preferred embodiment, the four corner portions F9 are shaped to round shapes. Each corner portion F9 has a smooth curved surface that is outwardly convex in a plan view as viewed in a direction of a normal to the element forming surface F2*a*. A structure capable of suppressing chipping during the manufacturing process or mounting of the chip diode F1 is thereby arranged.

In the present preferred embodiment, the diode cell region F7 is formed to a rectangular shape. The plurality of diode cells FD1 to FD4 are disposed inside the diode cell region F7. In regard to the plurality of diode cells FD1 to FD4, four are provided in the present preferred embodiment and these are arrayed two-dimensionally at equal intervals in a matrix along the long direction and short direction of the semiconductor substrate F2. FIG. 128 is a plan view showing the structure of the top surface (element forming surface F2*a*) of the semiconductor substrate F2 with the cathode electrode F3, the anode electrode F4, and the arrangement formed thereon being removed. In each of the regions of the diode cells FD1 to FD4, an $n^+$ type region (second conductivity type region) F10 is formed in a top layer region of the $p^+$ type semiconductor substrate F2. The $n^+$ type regions F10 are separated according to each individual diode cell. The diode cells FD1 to FD4 are thereby made to respectively have p-n junction regions F11 that are separated according to each individual diode cell.

In the present preferred embodiment, the plurality of diode cells FD1 to FD4 are formed to be equal in size and equal in shape and are specifically formed to rectangular shapes, and the $n^+$ type region F10 with a polygonal shape is formed in the rectangular region of each diode cell. In the present preferred embodiment, each $n^+$ type region F10 is formed to a regular octagon having four sides extending along the four sides forming the rectangular region of the corresponding diode cell among the diode cells FD1 to FD4 and another four sides respectively facing the four corner portions of the rectangular region of the corresponding diode cell among the diode cells FD1 to FD4.

As shown in FIG. 126 and FIG. 127, an insulating film F15 (omitted from illustration in FIG. 125), constituted of an oxide film, etc., is formed on the element forming surface F2*a* of the semiconductor substrate F2. Contact holes F16 (cathode contact holes) exposing top surfaces of the respective $n^+$ type regions F10 of the diode cells FD1 to FD4 and contact holes F17 (anode contact holes) exposing the element forming surface F2*a* are formed in the insulating film F15. The cathode electrode F3 and the anode electrode F4 are formed on the top surface of the insulating film F15. The cathode electrode F3 includes a cathode electrode film F3A formed on the top surface of the insulating film F15 and the external connection electrode F3B bonded to the cathode electrode film F3A. The cathode electrode film F3A includes a lead-out electrode FL1 connected to the plurality of diode cells FD1 and FD3, a lead-out electrode FL2 connected to the plurality of diode cells FD2 and FD4, and a cathode pad F5 formed integral to the lead-out electrodes FL1 and FL2 (cathode lead-out electrodes). The cathode pad F5 is formed to a rectangle at one end portion of the element forming surface F2*a*. The external connection electrode F3B is connected to the cathode pad F5. The external connection electrode F3B is thereby connected in common to the lead-out electrodes FL1 and FL2. The cathode pad F5 and the external connection electrode F3B constitute an external connection portion (cathode external connection portion) of the cathode electrode F3.

The anode electrode F4 includes an anode electrode film F4A formed on the top surface of the insulating film F15 and the external connection electrode F4B bonded to the anode electrode film F4A. The anode electrode film F4A is connected to the $p^+$ type semiconductor substrate F2 and has an anode pad F6 near one end portion of the element forming surface F2*a*. The anode pad F6 is constituted of a region of the anode electrode film F4A that is disposed at the one end portion of the element forming surface F2*a*. The external connection electrode F4B is connected to the anode pad F6. The anode pad F6 and the external connection electrode F4B constitute an external connection portion (anode external connection portion) of the anode electrode F4. The region of the anode electrode film F4A besides the anode pad F6 is an anode lead-out electrode that is led out from the anode contact holes F17.

The lead-out electrode FL1 enters into the contact holes F16 of the diode cells FD1 and FD3 from the top surface of the insulating film F15 and is in ohmic contact with the respective $n^+$ type regions F10 of the diode cells FD1 and FD3 inside the respective contact holes F16. In the lead-out electrode FL1, the portions connected to the diode cells FD1 and FD3 inside the contact holes F16 constitute cell connection portions FC1 and FC3. Similarly, the lead-out electrode FL2 enters into the contact holes F16 of the diode cells FD2 and FD4 from the top surface of the insulating film F15 and is in ohmic contact with the respective $n^+$ type regions F10 of the diode cells FD2 and FD4 inside the respective contact holes F16. In the lead-out electrode FL2, the portions connected to the diode cells FD2 and FD4 inside the contact holes F16 constitute cell connection portions FC2 and FC4. The anode electrode film F4A extends to inner sides of the contact holes F17 from the top surface of the insulating film F15 and is in ohmic contact with the $p^+$ type semiconductor substrate F2 inside the contact holes F17. In the present preferred embodiment, the cathode electrode film F3A and the anode electrode film F4A are made of the same material.

In the present preferred embodiment, AlSi films are used as the electrode films. When an AlSi film is used, the anode electrode film F4A can be put in ohmic contact with the $p^+$ type semiconductor substrate F2 without having to provide a $p^+$ type region on the top surface of the semiconductor substrate F2. That is, an ohmic junction can be formed by putting the anode electrode film F4A in direct contact with the $p^+$ type semiconductor substrate F2. A process for forming the $p^+$ type region can thus be omitted.

The cathode electrode film F3A and the anode electrode film F4A are separated by a slit F18. The lead-out electrode FL1 is formed rectilinearly along a straight line passing from the diode cell FD1 to the cathode pad F5 through the diode cell FD3. Similarly, the lead-out electrode FL2 is formed rectilinearly along a straight line passing from the diode cell FD2 to the cathode pad F5 through the diode cell FD4. The lead-out electrodes FL1 and FL2 respectively have uniform widths W1 and W2 at all locations between the $n^+$ type regions F10 and the cathode pad F5, and the widths W1 and W2 are wider than the widths of the cell connection portions FC1, FC2, FC3, and FC4. The widths of the cell connection portions FC1 to FC4 are defined by the lengths in the direction orthogonal to the lead-out directions of the lead-out electrodes FL1 and FL2. Tip end portions of the lead-out electrodes FL1 and FL2 are shaped to match the planar shapes of the $n^+$ type regions F10. Base end portions of the lead-out electrodes FL1 and FL2 are connected to the cathode pad F5. The slit F18 is formed so as to border the lead-out electrodes FL1 and FL2. On the other hand, the anode electrode film F4A is formed on the top surface of the insulating film F15 so as to surround the cathode electrode film F3A across an interval corresponding to the slit F18 of substantially fixed width. The anode electrode film F4A integrally includes a comb-teeth-like portion extending in the long direction of the element forming surface F2*a* and the anode pad F6 that is constituted of a rectangular region.

The cathode electrode film F3A and the anode electrode film F4A are covered by a passivation film F20 (omitted from illustration in FIG. 125), constituted, for example, of a nitride film, and a resin film F21, made of polyimide, etc., is further formed on the passivation film F20. A pad opening F22 exposing the cathode pad F5 and a pad opening F23 exposing the anode pad F6 are formed so as to penetrate through the passivation film F20 and the resin film F21. The external connection electrodes F3B and F4B are respectively embedded in the pad openings F22 and F23. The passivation film F20 and the resin film F21 constitute a protective film to suppress or prevent the entry of moisture to the lead-out electrodes FL1 and FL2 and the p-n junction regions F11 and also absorb impacts, etc., from the exterior, thereby contributing to improvement of the durability of the chip diode F1.

The external connection electrodes F3B and F4B may have top surfaces at positions lower than the top surface of the resin film F21 (positions close to the semiconductor substrate F2) or may project from the top surface of the resin film F21 and have top surfaces at positions higher than the resin film F21 (positions far from the semiconductor substrate F2). An example where the external connection electrodes F3B and F4B project from the top surface of the resin film F21 is shown in FIG. 126. Each of the external connection electrodes F3B and F4B may be constituted, for example, of an Ni/Pd/Au laminated film having an Ni film in contact with the electrode film F3A or F4A, a Pd film formed on the Ni film, and an Au film formed on the Pd film. Such a laminated film may be formed by a plating method.

In each of the diode cells FD1 to FD4, the p-n junction region F11 is formed between the $p^+$ type semiconductor substrate F2 and the $n^+$ type region F10, and a p-n junction diode is thus formed respectively. The $n^+$ type regions F10 of the plurality of diode cells FD1 to FD4 are connected in common to the cathode electrode F3, and the $p^+$ type semiconductor substrate F2, which is the p-type region in common to the diode cells FD1 to FD4, is connected in common to the anode electrode F4. The plurality of diode cells FD1 to FD4, formed on the semiconductor substrate F2, are thereby connected in parallel all together.

FIG. 129 is an electric circuit diagram showing the electrical structure of the interior of the chip diode F1. With the p-n junction diodes respectively constituted by the diode cells FD1 to FD4, the cathode sides are connected in common by the cathode electrode F3, the anode sides are connected in common by the anode electrode F4, and all of the diodes are thereby connected in parallel and made to function as a single diode as a whole.

With the arrangement of the present preferred embodiment, the chip diode F1 has the plurality of diode cells FD1 to FD4 and each of the diode cells FD1 to FD4 has the p-n junction region F11. The p-n junction regions F11 are separated according to each of the diode cells FD1 to FD4. The chip diode F1 is thus made long in the peripheral length of the p-n junction regions F11, that is, the total peripheral length (total extension) of the $n^-$ type regions F10 in the semiconductor substrate F2. The electric field can thereby be dispersed and prevented from concentrating at vicinities of the p-n junction regions F11, and the ESD tolerance can thus be improved. That is, even when the chip diode F1 is to be formed compactly, the total peripheral length of the p-n junction regions F11 can be made large, thereby enabling both downsizing of the chip diode F1 and securing of the ESD tolerance to be achieved at the same time.

With reference to FIG. 126 to FIG. 128, in the present preferred embodiment, in each of the diode cells FD1 to FD4, a distance D from a peripheral edge of a bonding region (cell connection portion FC1 to FC4) of the cathode electrode F3 and the $n^+$ type region F10 in the contact hole F16 to a peripheral edge of $n^+$ type region F10 is defined to be not less than 1 μm and not more than 10% of a diameter φ of the $n^+$ type region F10. The distance D is preferably defined to be not less than 1 μm and not more than 3% of a diameter φ of the $n^+$ type region F10.

When, as in the present preferred embodiment, the respective $n^+$ type region F10 have polygonal shapes (regular octagons in the present example), the cell connection portions FC1 to FC4 have polygonal shapes similar to the $n^+$ type regions F10, and corresponding sides of the $n^+$ type regions F10 and the cell connection portions FC1 to FC4 are disposed in parallel to each other, the distance D is defined as the distance between the sides disposed in parallel to each other. Also, the diameter φ of the $n^+$ type region F10 is defined as twice an average value of the lengths of a plurality of perpendiculars respectively drawn from a center of gravity of the $n^+$ type region F10 to the plurality of sides of the $n^+$ type region F10. For example, the diameter φ of the $n^+$ type region F10 may be 120 μm and the distance D may be 2 μm.

In the present preferred embodiment, the distance D is defined as being not less than 1 μm and therefore the flowing of a leak current between the peripheral edge of any of the cell connection portions FC1 to FC4 and the semiconductor substrate F2 by bypassing the $n^+$ type region F10 can be suppressed or prevented. Meanwhile, the distance D is defined as being not more than 10% of the diameter φ of the $n^+$ type region F10 and the ESD tolerance can thus be improved further as shall be described specifically below.

Although improvement of the ESD tolerance by forming of an $n^-$ type diffusion layer that is low in concentration and is deep at a periphery of the $n^+$ type region F10 in the top layer portion of the semiconductor substrate F2 may be considered, the number of manufacturing steps will be increased with this method. In contrast, with the present preferred embodiment, the ESD tolerance is improved by appropriately determining a relative layout of the $n^+$ type regions F10 and the contact holes F15 and the ESD tolerance can thus be improved without increasing the number of manufacturing steps.

FIG. 130 shows experimental results of measuring the ESD tolerances of a plurality of samples that are differed in the total peripheral length (total extension) of the p-n junction regions by variously setting the sizes of diode cells and/or the number of the diode cells formed on a semiconductor substrate of the same area. From these experimental results, it can be understood that the longer the peripheral length of the p-n junction regions, the greater the ESD tolerance. In cases where not less than four diode cells are formed on the semiconductor substrate, ESD tolerances in the excess of 8 kilovolts could be realized.

Further with the present preferred embodiment, the widths W1 and W2 of the lead-out electrodes FL1 and FL2 are wider than the widths of the cell connection portions FC1 to FC4 at all locations between the cell connection portions FC1 to FC4 and the cathode pad F5. A large allowable current amount can thus be set and electromigration can be reduced to improve reliability with respect to a large current.

That is, a chip diode that is compact, high in ESD tolerance, and secured in reliability with respect to large currents can be provided.

Also with the present preferred embodiment, the plurality of diode cells FD1 and FD3 and the plurality of diode cells FD2 and FD4, which are respectively aligned along straight lines directed toward the cathode pad F5, are connected to the cathode pad F5 by the rectilinear lead-out electrodes FL1 and FL2 in common. The lengths of the lead-out electrodes from the diode cells FD1 to FD4 to the cathode pad F5 can thereby be minimized and electromigration can thus be reduced more effectively. Also, a single lead-out electrode FL1 or FL2 can be shared by the plurality of diode cells FD1 and FD3 or the plurality of diode cells FD2 and FD4, and therefore lead-out electrodes of wide line widths can be laid out on the semiconductor substrate F2 while forming a large number of diode cells FD1 to FD4 to increase the peripheral length of the diode junction regions (p-n junction regions F11). Both further improvement of ESD tolerance and reduction of electromigration can thereby be achieved at the same time to further improve the reliability.

Also, the end portions of the lead-out electrodes FL1 and FL2 have partially polygonal shapes matching the shapes (polygons) of the $n^+$ type regions F10 and can thus be connected to the $n^+$ type regions F10 while making small the areas occupied by the lead-out electrodes FL1 and FL2. Further, both the cathode side and anode side external connection electrodes F3B and F4B are formed on the element forming surface F2*a*, which is one of the surfaces of the semiconductor substrate F2. Therefore as shown in FIG. 131, a circuit assembly having the chip diode F1 surface-mounted on a mounting substrate F25 can be arranged by making the element forming surface F2*a* face the mounting substrate F25 and bonding the external connection electrodes F3B and F4B onto the mounting substrate F25 by solders F26. That is, the chip diode F1 of the flip-chip connection type can be provided, and by performing face-down bonding with the element forming surface F2*a* being made to face the mounting surface of the mounting substrate F25, the chip diode F1 can be connected to the mounting substrate F25 by wireless bonding. The area occupied by the chip diode F1 on the mounting substrate F25 can thereby be made small. In particular, reduction of height of the chip diode F1 on the mounting substrate F25 can be realized. Effective use can thereby be made of the space inside a casing of a compact electronic equipment, etc., to contribute to high-density packaging and downsizing.

Also with the present preferred embodiment, the insulating film F15 is formed on the semiconductor substrate F2 and the cell connection portions FC1 to FC4 of the lead-out electrodes FL1 and FL2 are connected to the diode cells FD1 to FD4 via the contact holes F16 formed in the insulating film F15. The cathode pad F5 is disposed on the insulating film F15 in the region outside the contact holes F16. That is, the cathode pad F5 is provided at a position separated from positions directly above the p-n junction regions F11. Also, the anode electrode film F4A is connected to the semiconductor substrate F2 via the contact holes F17 formed in the insulating film F15, and the anode pad F6 is disposed on the insulating film F15 in the region outside the contact holes F17. The anode pad F6 is also disposed at a position separated from positions directly above the p-n junction regions F11. Application of a large impact to the p-n junction regions F11 can thus be avoided during mounting of the chip diode F1 on the mounting substrate F25. Destruction of the p-n junction regions F11 can thereby be avoided and a chip diode that is excellent in durability against external forces can thereby be realized. An arrangement is also possible where the external connection electrodes F3B and F4B are not provided, the cathode pad F5 and the anode pad F6 are respectively used as the cathode external connection portion and the anode connection portion, and bonding wires are connected to the cathode pad F5 and the anode pad F6. Destruction of the p-n junction regions F11 due to impacts during wire bonding can be avoided in this case as well.

Also with the present preferred embodiment, the anode electrode film F4A is constituted of an AlSi film. An AlSi film is close in work function to a p-type semiconductor (especially a p-type silicon semiconductor) and can thus form a satisfactory ohmic junction with the $p^+$ type semiconductor substrate F2. There is thus no need to form a high impurity concentration diffusion layer for ohmic junction on the $p^+$ type semiconductor substrate F2. The manufacturing process can thereby be simplified and the productivity and the production cost can be reduced accordingly.

Further with the present preferred embodiment, the semiconductor substrate F2 has the rectangular shape with the corner portions F9 being rounded. Fragmenting (chipping) of the corner portions of the chip diode F1 can thereby be suppressed or prevented and the chip diode F1 with few appearance defects can be provided. Further with the present preferred embodiment, the recess F8 expressing the cathode direction is formed on the short side of the semiconductor substrate F2 close to the cathode side external connection electrode F3B and there is thus no need to mark a cathode mark on a rear surface (the principal surface at the side opposite to the element forming surface F2*a*) of the semiconductor substrate F2. The recess F8 may be formed at the same time as performing the processing for cutting out the chip diode F1 from a wafer (base substrate). Also, the recess F8 can be formed to indicate the direction of the cathode even when the size of the chip diode F1 is minute and marking is difficult. A step for marking can thus be omitted and a sign expressing the cathode direction can be provided even in the chip diode F1 of minute size.

FIG. 132 shows results of measuring the ESD tolerances of a plurality of samples that are differed in the distance D by variously setting the size of the contact hole with respect to the $n^+$ type region with the diameter φ of the same size. Four samples with the distance D being 6 μm, 3 μm, 2 μm, and 1 μm were prepared. The diameter φ of the $n^+$ type region F10 of each sample is 120 μm. With the sample with the distance D being 1 μm, the ESD tolerance could not be evaluated because a leak occurred between the peripheral edge of the cell connection portion and the semiconductor substrate F2.

Normally, it may be considered that the greater the distance D, the greater the ESD tolerance. However, it was found by the present experiment that contrary to prediction, the ESD tolerance is increased by decreasing the distance D. It was also found that when the distance D is made too small, a leak occurs and impairs the ESD tolerance. From these experimental results, it may be presumed that when the distance D is not more than 12 μm (not more than 10% of the diameter φ of the $n^+$ type region F10), an ESD tolerance exceeding 8 kilovolts can be realized. It may also be presumed that when the distance D is not more than 3.6 μm (not more than 3% of the diameter φ of the $n^+$ type region F10), an ESD tolerance exceeding 20 kilovolts can be realized.

FIG. 133 shows results of measuring the leak currents of the plurality of samples that are differed in the distance D by variously setting the size of the contact hole with respect to the $n^+$ type region with the diameter φ of the same size. Four samples with the distance D being 6 μm, 3 μm, 2 μm, and 1 μm were prepared. The diameter φ of the $n^+$ type region F10 of each sample is 120 μm. With the sample with the distance D being 1 μm, a leak occurred between the peripheral edge of the cell connection portion and the semiconductor substrate F2. From these experimental results, it can be understood that although the leak current does not differ significantly with the magnitude of the distance D, a path bypassing the $n^+$ type region F10 is formed and the leak current becomes large below a certain lower limit.

FIG. 134 shows results of measuring the Zener voltage of the plurality of samples that are differed in the distance D by variously setting the size of the contact hole with respect to the $n^+$ type region with the diameter φ of the same size. Four samples with the distance D being 6 μm, 3 μm, 2 μm, and 1 μm were prepared. The diameter φ of the $n^+$ type region F10 of each sample is 120 μm. With the sample with the distance D being 1 μm, the Zener voltage could not be evaluated because a leak occurred between the peripheral edge of the cell connection portion and the semiconductor substrate F2. From these experimental results, it can be understood that there are no adverse effects due to the distance D on the Zener voltage.

FIG. 135 shows results of measuring the inter-terminal capacitances of the plurality of samples that are differed in the distance D by variously setting the size of the contact hole with respect to the n+ type region with the radius φ of the same size. The inter-terminal capacitance is the capacitance between the anode electrode F4 and the cathode electrode F3. Four samples with the distance D being 6 μm, 3 μm, 2 μm, and 1 μm were prepared. The diameter φ of the $n^+$ type region F10 of each sample is 120 μm. With the sample with the distance D being 1 μm, the inter-terminal capacitance could not be evaluated because a leak occurred between the peripheral edge of the cell connection portion and the semiconductor substrate F2. From these experimental results, it can be understood that there are no adverse effects due to the distance D on the inter-terminal capacitance.

FIG. 136 is a process diagram for describing an example of a manufacturing process of the chip diode F1. Also, FIG. 137A and FIG. 137B are sectional views of the arrangement in the middle of the manufacturing process of FIG. 136 and show a section corresponding to FIG. 126. FIG. 138 is a plan view of a $p^+$ type semiconductor wafer FW as a base substrate of the semiconductor substrate F2 and shows a partial region in a magnified manner.

First, the $p^+$ type semiconductor wafer FW is prepared as the base substrate of the semiconductor substrate F2. A top surface of the semiconductor wafer FW is an element forming surface FWa and corresponds to the element forming surface F2*a* of the semiconductor substrate F2. A plurality of chip diode regions F1*a*, corresponding to a plurality of the chip diodes F1, are arrayed and set in a matrix on the element forming surface FWa. A boundary region F80 is provided between adjacent chip diode regions F1*a*. The boundary region F80 is a band-like region having a substantially fixed width and extends in two orthogonal directions to form a lattice. After performing necessary steps on the semiconductor wafer FW, the semiconductor wafer FW is cut apart along the boundary region F80 to obtain the plurality of chip diodes F1.

The steps executed on the semiconductor wafer FW are, for example, as follows. First, the insulating film F15 (with a thickness, for example, of 8000 Å to 8600 Å), which is a thermal oxide film or CVD oxide film, etc., is formed on the element forming surface FWa of the $p^+$ type semiconductor wafer FW (FS1) and a resist mask is formed on the insulating film F15 (FS2). Openings corresponding to the $n^+$ type regions F10 are then formed in the insulating film F15 by etching using the resist mask (FS3). Further, after peeling off the resist mask, an n-type impurity is introduced to top layer portions of the semiconductor wafer FW that are exposed from the openings formed in the insulating film F15 (FS4). The introduction of the n-type impurity is performed by implantation of n-type impurity ions (for example, phosphorus ions). The implantation energy of the n-type impurity ions is, for example, 40 keV, and the density of the n-type impurity ions is, for example, $2\times10^{15}$ ions/$cm^3$. The introduction of the n-type impurity may instead be performed by a step of depositing phosphorus as the n-type impurity on the top surface (so-called phosphorus deposition). Phosphorus deposition is a process of depositing phosphorus on the top surface of the semiconductor wafer FW exposed inside the openings in the insulating film F15 by conveying the semiconductor wafer FW into a diffusion furnace and performing heat treatment while making $POCl_3$ gas flow inside a diffusion passage. After thickening the insulating film F15 (thickening, for example, by approximately 1200 Å by CVD oxide film formation) as necessary (FS5), heat treatment (drive-in) for activation of the impurity ions introduced into the semiconductor wafer FW is performed (FS6). This heat treatment is performed, for example, for 40 minutes in an atmosphere of a temperature of, for example, 900° C. The $n^+$ type regions F10 are thereby formed on the top layer portion of the semiconductor wafer FW. The size of the $n^+$ type regions F10 can be controlled by setting of the conditions in the steps of FS4 and FS6.

Thereafter, another resist mask having openings matching the contact holes F16 and F17 is formed on the insulating film F15 (FS7). The contact holes F16 and F17 are formed in the insulating film F15 by etching via the resist mask (FS8), and the resist mask is peeled off thereafter. The size of the contact holes F16 is determined by the step of FS8. The magnitude of the distance D can thus be controlled by the steps of FS4, FS6, and FS8.

An electrode film that constitutes the cathode electrode F3 and the anode electrode F4 is then formed on the insulating film F15, for example, by sputtering (FS9). In the present preferred embodiment, an electrode film (for example, of 10000 Å thickness), made of AlSi, is formed. Another resist mask having an opening pattern corresponding to the slit F18 is then formed on the electrode film (FS10) and the slit F18 is formed in the electrode film by etching (for example, reactive ion etching) via the resist mask (FS11). The width of the slit F18 may be approximately 3 μm. The electrode film is thereby separated into the cathode electrode film F3A and the anode electrode film F4A.

Then after peeling off the resist film, the passivation film F20, which is a nitride film, etc., is formed, for example, by the CVD method (FS12), and further, polyimide, etc., is applied to form the resin film F21 (FS13). For example, a polyimide imparted with photosensitivity is applied, and after exposing in a pattern corresponding to the pad openings F22 and F23, the polyimide film is developed (step FS14). The resin film F21 having openings corresponding to the pad openings F22 and F23 is thereby formed. Thereafter, heat treatment for curing the resin film is performed as necessary (FS15). The pad openings F22 and F23 are then formed in the passivation film F20 by performing dry etching (for example, reactive ion etching) using the resin film F21 as a mask (FS16). Thereafter, the external connection electrodes F3B and F4B are formed inside the pad openings F22 and F23 (FS17). The external connection electrodes F3B and F4B may be formed by plating (preferably, electroless plating).

Thereafter, a resist mask F83 (see FIG. 137A), having a lattice-shaped opening matching the boundary region F80 (see FIG. 138), is formed (FS18). Plasma etching is performed via the resist mask F83 and the semiconductor wafer FW is thereby etched to a predetermined depth from the element forming surface FWa as shown in FIG. 137A. A groove F81 for cutting is thereby formed along the boundary region F80 (FS19). After peeling off the resist mask F83, the semiconductor wafer FW is ground from the rear surface FWb until a bottom portion of the groove F81 is reached as shown in FIG. 137B (FS20). The plurality of chip diode regions F1*a* are thereby separated into individual pieces and the chip diodes F1 with the structure described above can thereby be obtained.

As shown in FIG. 138, the resist mask F83 arranged to form the groove F81 at the boundary region F80 has, at positions adjacent to the four corners of the chip diode region F1*a*, round shaped portions F84 of curved shapes that are convex toward outer sides of the chip diode region F1*a*. Each round shaped portion F84 is formed to connect two adjacent sides of a chip diode region F1*a* by a smooth curve. Further, the resist mask F83 arranged to form the groove F81 in the boundary region F80 has, at a position adjacent to one short side of each chip diode region F1*a*, a recess F85 that is recessed toward an inner side of the chip diode region F1*a*. Therefore, when the groove F81 is formed by plasma etching using the resist mask F83 as a mask, the groove F81 is to made to have, at positions adjacent to the four corners of each chip diode region F1*a*, round shaped portions of curved shapes that are convex toward the outer sides of the chip diode region F1*a* and to have, at a position adjacent to one side of each chip diode region F1*a*, a recess that is recessed toward the inner side of the chip diode region F1*a*. Therefore in the step of forming the groove F81 for cutting out the chip diode regions F1*a* from the semiconductor wafer FW, the corner portions F9 of the four corners can be shaped to round shapes and the recess F8 can be formed as the cathode mark in one short side (the short side at the cathode side) in each chip diode F1 at the same time. That is, the corner portions F9 can be processed to round shapes and the recess F8 can be formed as the cathode mark without adding a dedicated step.

With the present preferred embodiment, the semiconductor substrate F2 is constituted of the p-type semiconductor and therefore stable characteristics can be realized even if an epitaxial layer is not formed on the semiconductor substrate F2. That is, an n-type semiconductor wafer is large in in-plane variation of resistivity, and therefore when an n-type semiconductor wafer is used, an epitaxial layer with low in-plane variation of resistivity must be formed on the top surface and an impurity diffusion layer must be formed on the epitaxial layer to form the p-n junction. This is because an n-type impurity is low in segregation coefficient and therefore when an ingot (for example, a silicon ingot) that is to be the source of a semiconductor wafer is formed, a large difference in resistivity arises between a central portion and a peripheral edge portion of the wafer. On the other hand, a p-type impurity is comparatively high in segregation coefficient and therefore a p-type semiconductor wafer is low in in-plane variation of resistivity. Therefore by using a p-type semiconductor wafer, a diode with stable characteristics can be cut out from any location of the wafer without having to form an epitaxial layer. Therefore by using the $p^+$ type semiconductor substrate F2, the manufacturing process can be simplified and the manufacturing cost can be reduced.

FIG. 139 is a perspective view of an outer appearance of a smartphone that is an example of an electronic equipment in which the chip diode is used. The smartphone F201 is arranged by housing electronic parts in the interior of a casing F202 with a flat rectangular parallelepiped shape. The casing F202 has a pair of principal surfaces with an oblong shape at its front side and rear side, and the pair of principal surfaces are joined by four side surfaces. A display surface of a display panel F203, constituted of a liquid crystal panel or an organic EL panel, etc., is exposed at one of the principal surfaces of the casing F202. The display surface of the display panel F203 constitutes a touch panel and provides an input interface for a user.

The display panel F203 is formed to an oblong shape that occupies most of one of the principal surfaces of the casing F202. Operation buttons F204 are disposed along one short side of the display panel F203. In the present preferred embodiment, a plurality (three) of the operation buttons F204 are aligned along the short side of the display panel F203. The user can call and execute necessary functions by performing operations of the smartphone F201 by operating the operation buttons F204 and the touch panel.

A speaker F205 is disposed in a vicinity of the other short side of the display panel F203. The speaker F205 provides an earpiece for a telephone function and is also used as an acoustic conversion unit for reproducing music data, etc. On the other hand, close to the operation buttons F204, a microphone F206 is disposed at one of the side surfaces of the casing F202. The microphone F206 provides a mouthpiece for the telephone function and may also be used as a microphone for sound recording.

FIG. 140 is an illustrative plan view of the arrangement of an electronic circuit assembly F210 housed in the interior of the housing F202. The electronic circuit assembly F210 includes a wiring substrate F211 and circuit parts mounted on a mounting surface of the wiring substrate F211. The plurality of circuit parts include a plurality of integrated circuit elements (ICs) F212 to F220 and a plurality of chip parts. The plurality of ICs include a transmission processing IC F212, a one-segment TV receiving IC F213, a GPS receiving IC F214, an FM tuner IC F215, a power supply IC F216, a flash memory F217, a microcomputer F218, a power supply IC F219, and a baseband IC F220. The plurality of chip parts include chip inductors F221, F225, and F235, chip resistors F222, F224, and F233, chip capacitors F227, F230, and F234, and chip diodes F228 and F231. The chip parts are mounted on the mounting surface of the wiring substrate F211, for example, by flip-chip bonding. The chip diodes according to the preferred embodiment described above may be applied as the chip diodes F228 and F231.

The transmission processing IC F212 has incorporated therein an electronic circuit arranged to generate display control signals for the display panel F203 and receive input signals from the touch panel on the top surface of the display panel F203. For connection with the display panel F203, the transmission processing IC F212 is connected to a flexible wiring F209. The one-segment TV receiving IC F213 incorporates an electronic circuit that constitutes a receiver for receiving one-segment broadcast (terrestrial digital television broadcast targeted for reception by portable equipment) radio waves. A plurality of the chip inductors F221 and a plurality of the chip resistors F222 are disposed in a vicinity of the one-segment TV receiving IC F213. The one-segment TV receiving IC F213, the chip inductors F221, and the chip resistors F222 constitute a one-segment broadcast receiving circuit F223. The chip inductors F221 and the chip resistors F222 respectively have accurately adjusted inductances and resistances and provide circuit constants of high precision to the one-segment broadcast receiving circuit F223.

The GPS receiving IC F214 incorporates an electronic circuit that receives radio waves from GPS satellites and outputs positional information of the smartphone F201. The FM tuner IC F215 constitutes, together with a plurality of the chip resistors F224 and a plurality of the chip inductors F225 mounted on the wiring substrate F211 in a vicinity thereof, an FM broadcast receiving circuit F226. The chip resistors F224 and the chip inductors F225 respectively have accurately adjusted resistance values and inductances and provide circuit constants of high precision to the FM broadcast receiving circuit F226.

A plurality of the chip capacitors F227 and a plurality of the chip diodes F228 are mounted on the mounting surface of the wiring substrate F211 in a vicinity of the power supply IC F216. Together with the chip capacitors F227 and the chip diodes F228, the power supply IC F216 constitutes a power supply circuit F229. The flash memory F217 is a storage device for recording operating system programs, data generated in the interior of the smartphone F201, and data and programs acquired from the exterior by communication functions, etc.

The microcomputer F218 is a computing processing circuit that incorporates a CPU, a ROM, and a RAM and realizes a plurality of functions of the smartphone F201 by executing various computational processes. More specifically, computational processes for image processing and various application programs are realized by actions of the microcomputer F218. A plurality of the chip capacitors F230 and a plurality of the chip diodes F231 are mounted on the mounting surface of the wiring substrate F211 in a vicinity of the power supply IC F219. Together with the chip capacitors F230 and the chip diodes F231, the power supply IC F219 constitutes a power supply circuit F232.

A plurality of the chip resistors F233, a plurality of the chip capacitors F234, and a plurality of the chip inductors F235 are mounted on the mounting surface of the wiring substrate F211 in a vicinity of the baseband IC F220. Together with the chip resistors F233, the chip capacitors F234, and the chip inductors F235, the baseband IC F220 constitutes a baseband communication circuit F236. The baseband communication circuit F236 provides communication functions for telephone communication and data communication.

With the above arrangement, electric power that is appropriately adjusted by the power supply circuits F229 and F232 is supplied to the transmission processing IC F212, the GPS receiving IC F214, the one-segment broadcast receiving circuit F223, the FM broadcast receiving circuit F226, the baseband communication circuit F236, the flash memory F217, and the microcomputer F218. The microcomputer F218 performs computational processes in response to input signals input via the transmission processing IC F212 and makes the display control signals be output from the transmission processing IC F212 to the display panel F203 to make the display panel F203 perform various displays.

When receiving of a one-segment broadcast is commanded by operation of the touch panel or the operation buttons F204, the one-segment broadcast is received by actions of the one-segment broadcast receiving circuit F223. Computational processes for outputting the received images to the display panel F203 and making the received audio signals be acoustically converted by the speaker F205 are executed by the microcomputer F218. Also, when positional information of the smartphone F201 is required, the microcomputer F218 acquires the positional information output by the GPS receiving IC F214 and executes computational processes using the positional information.

Further, when an FM broadcast receiving command is input by operation of the touch panel or the operation buttons F204, the microcomputer F218 starts up the FM broadcast receiving circuit F226 and executes computational processes for outputting the received audio signals from the speaker F205. The flash memory F217 is used for storing data acquired by communication and storing data prepared by computations by the microcomputer F218 and inputs from the touch panel. The microcomputer F218 writes data into the flash memory F217 or reads data from the flash memory F217 as necessary.

The telephone communication or data communication functions are realized by the baseband communication circuit F236. The microcomputer F218 controls the baseband communication circuit F236 to perform processes for sending and receiving audio signals or data.

Although preferred embodiments of the seventh invention have been described above, the seventh invention may be implemented in yet other modes as well. For example, although with the preferred embodiment described above, an example where four diode cells are formed on the semiconductor substrate was described, two or three diode cells may be formed or not less than four diode cells may be formed on the semiconductor substrate.

Also, although with the preferred embodiment, an example where the p-n junction regions are respectively formed to a regular octagon in a plan view was described, the p-n junction regions may be formed to any polygonal shape with the number of sides being not less than three, and the planar shapes of the regions may be circular or elliptical. If the shape of the p-n junction regions is to be made a polygonal shape, the shape does not have to be a regular polygonal shape and the respective regions may be formed to a polygon with two or more types of side length. Yet further, there is no need to form the p-n junction regions to the same size and a plurality of diode cells respectively having junction regions of different sizes may be mixed on the semiconductor substrate. Yet further, the shape of the p-n junction regions formed on the semiconductor substrate does not have to be of one type, and p-n junction regions with two or more types of shape may be mixed on the semiconductor substrate.

Also although with the preferred embodiment, the anode electrode film F4A is bonded directly to the top surface of the $p^+$ type semiconductor substrate F2, a $p^+$ type region may be formed in a state of being separated from the $n^+$ type regions F10 in a top layer portion of the $p^-$ type semiconductor substrate F2 and the anode electrode film F4A may be bonded to the $p^+$ type region. With such an arrangement, even when an electrode film other than an AlSi film is used as the anode electrode film F4A, an ohmic contact can be formed between the anode electrode film F4A and the $p^+$ type region to electrically connect the anode electrode film F4A and the semiconductor substrate F2. Therefore in this case, an electrode film other than an AlSi film, for example, a Ti/Al laminated film having a Ti film as a lower layer and an Al film as an upper layer or a Ti/TiN/Al laminated film having a Ti film (with a thickness, for example, of 300 to 400 Å), a TiN film (with a thickness, for example, of approximately 1000 Å), and an AlCu film (with a thickness, for example, of approximately 30000 Å) laminated successively from the substrate F2 side, etc., may be used as each of the cathode electrode film F3A and the anode electrode film F4A.

Also, an n-type semiconductor substrate may be used in place of the $p^+$ type semiconductor substrate F2. In this case, preferably, an epitaxial layer is formed on the n-type semiconductor substrate and a p-type impurity diffusion layer is formed in the epitaxial layer to form a p-n junction.

[8] Eighth Invention

Patent Document 3 (Japanese Unexamined Patent Publication No. 2001-326354) discloses a vertical MOSFET, in which a protective diode, constituted of a bidirectional Zener diode, is connected between a gate and a source. The bidirectional Zener diode is used, for example, as a protective element that releases positive and negative surge currents to protect other devices. To provide a protective element that is effective for surge currents of either direction, characteristics for respective current directions are preferably made equal. An object of the eighth invention is to provide a bidirectional Zener diode chip with which characteristics for respective current directions can be made practically equal. Another object of the eighth invention is to provide a circuit assembly using the bidirectional Zener diode chip, with which the characteristics for the respective current directions are practically equal and which is thus high in quality, and an electronic equipment housing the circuit assembly in a casing.

The eighth invention has the following features.

G1. A bidirectional Zener diode chip including a first diffusion region of a second conductivity type formed on a semiconductor substrate of a first conductivity type, forming a p-n junction with the semiconductor substrate, and exposed on a principal surface of the semiconductor substrate, a second diffusion region of the second conductivity type formed on the semiconductor substrate while being spaced apart from the first diffusion region, forming a p-n junction with the semiconductor substrate, and exposed on a principal surface of the semiconductor substrate, a first electrode connected to the first diffusion region and formed on the principal surface of the semiconductor substrate, and a second electrode connected to the second diffusion region and formed on the principal surface of the semiconductor substrate, and where the first electrode plus the first diffusion region and the second electrode plus the second diffusion region are arranged to be mutually symmetrical.

With this arrangement, a p-n junction (p-n junction region) is formed between the first diffusion region and the semiconductor substrate and a first Zener diode is thereby arranged. The first electrode is connected to the first diffusion region of the first Zener diode. Meanwhile, a p-n junction (p-n junction region) is formed between the second diffusion region and the semiconductor substrate and a second Zener diode is thereby arranged. The second electrode is connected to the second diffusion region of the second Zener diode. The first Zener diode and the second Zener diode are anti-serially connected via the semiconductor substrate so as to arrange a bidirectional Zener diode between the first electrode and the second electrode.

With the present invention, the first electrode plus the first diffusion region and the second electrode plus the second diffusion region are arranged to be mutually symmetrical and therefore characteristics of the first Zener diode and the second Zener diode can be made substantially equal. Characteristics for respective current directions can thereby be made practically equal. The symmetry includes point symmetry and line symmetry. The symmetry is not restricted to strictly symmetrical forms and includes forms that can be regarded as being practically symmetrical as long as the electrical characteristics are symmetrical.

Also with the present invention, both the first electrode and the second electrode are formed on one of the surfaces of the semiconductor substrate, and the bidirectional Zener diode can thus be surface-mounted on a mounting substrate. That is, a flip-chip connection type bidirectional Zener diode can be provided. The space occupied by the bidirectional Zener diode can thereby be made small. In particular, reduction of height of the bidirectional Zener diode on the mounting substrate can be realized. Effective use can thereby be made of the space inside a casing of a compact electronic equipment, etc., to contribute to high-density packaging and downsizing.

G2. The bidirectional Zener diode chip according to "G1.," where first current vs. voltage characteristics obtained with the first electrode being a positive electrode and the second electrode being a negative electrode and second current vs. voltage characteristics obtained with the second electrode being a positive electrode and the first electrode being a negative electrode are practically equal. With this arrangement, a bidirectional Zener diode chip with which the current vs. voltage characteristics for the respective current directions are practically equal can be realized.

G3. The bidirectional Zener diode chip according to "G1." or "G2.," where a plurality of the first diffusion regions and a plurality of the second diffusion regions are arrayed alternately along a predetermined arraying direction parallel to the principal surface of the semiconductor substrate. With this arrangement, the p-n junctions regions that are separated according to each of the plurality of first diffusion regions are formed and a peripheral length of the p-n junction regions of the first Zener diode can thus be made long. Concentration of electric field is thereby relaxed and the ESD (electrostatic discharge) tolerance of the first Zener diode can be improved. The peripheral length of the p-n junction regions of the first Zener diode is the total extension of the boundary lines between the semiconductor substrate and the first diffusion regions at the top surface of the semiconductor substrate. Similarly, the p-n junctions regions that are separated according to each of the plurality of second diffusion regions are formed and a peripheral length of the p-n junction regions of the second Zener diode can thus be made long. Concentration of electric field is thereby relaxed and the ESD tolerance of the second Zener diode can be improved. The peripheral length of the p-n junction regions of the second Zener diode is the total extension of the boundary lines between the semiconductor substrate and the second diffusion regions at the top surface of the semiconductor substrate.

Also, with this arrangement, the plurality of first diffusion regions and the plurality of second diffusion regions are arrayed alternately and a symmetrical form can therefore be prepared readily within a region of limited area and yet the peripheral length of the p-n junction regions can be made long readily to improve the ESD tolerance.

G4. The bidirectional Zener diode chip according to "G3.," where the plurality of first diffusion regions and the plurality of second diffusion regions are formed to extend longitudinally in a direction intersecting the arraying direction. With this arrangement, the peripheral length of the p-n junction regions of the first Zener diode can be made long and the ESD tolerance of the first Zener diode can thus be improved further. Similarly, the peripheral length of the p-n junction regions of the second Zener diode can be made long and the ESD tolerance of the second Zener diode can thus be improved further.

G5. The bidirectional Zener diode chip according to "G4.," where the first electrode includes a plurality of first lead-out electrode portions bonded respectively to the plurality of first diffusion regions and a first external connection portion connected in common to the plurality of first lead-out electrode portions, the second electrode includes a plurality of second lead-out electrode portions bonded respectively to the plurality of second diffusion regions and a second external connection portion connected in common to the plurality of second lead-out electrode portions, and the first electrode and the second electrode are formed to comb-teeth-like shapes in which the plurality of first lead-out electrode portions and the plurality of second lead-out electrode portions are mutually engaged.

With this arrangement, the plurality of first lead-out electrode portions and the plurality of second lead-out electrode portions are formed to mutually engaging comb-teeth-like shapes and these can thus be made symmetrical readily. Also, the peripheral length of the p-n junction regions of the first Zener diode and the peripheral length of the p-n junction regions of the second Zener diode can be made long to improve the ESD tolerances of the first Zener diode and the second Zener diode.

Also with this arrangement, the plurality of first lead-out electrode portions are bonded respectively to the plurality of first diffusion regions and the first external connection portion is connected in common to the plurality of first lead-out electrodes. Similarly, the plurality of second lead-out electrode portions are bonded respectively to the plurality of second diffusion regions and the second external connection portion is connected in common to the plurality of second lead-out electrodes. The first external connection portion can thereby be disposed so as to avoid positions directly above the p-n junction regions between the first diffusion regions and the semiconductor substrate, and the second external connection portion can be disposed so as to avoid positions directly above the p-n junction regions between the second diffusion regions and the semiconductor substrate. Application of large impacts to the p-n junction regions can thus be avoided during mounting of the bidirectional Zener diode chip on a mounting substrate or during connection of bonding wires to the external connection portions. Destruction of the p-n junction regions can thereby be avoided, and a bidirectional Zener diode chip that is excellent in durability against external forces and therefore improved in reliability can be realized.

G6. The bidirectional Zener diode chip according to any one of "G1." to "G5.," where respective peripheral lengths of the first diffusion regions and the second diffusion regions are not less than 400 μm. With this arrangement, a bidirectional Zener diode chip of high ESD tolerance can be realized.

G7. The bidirectional Zener diode chip according to any one of "G1." to "G6.," where the respective peripheral lengths of the first diffusion regions and the second diffusion regions are not more than 1500 μm. With this arrangement, a bidirectional Zener diode chip of low capacitance between the first electrode and the second electrode (inter-terminal capacitance) can be realized.

G8. The bidirectional Zener diode chip according to any one of "G1." to "G7.," where a capacitance between the first electrode and the second electrode is not more than 30 pF. With this arrangement, a bidirectional Zener diode chip of low capacitance between the first electrode and the second electrode (inter-terminal capacitance) can be realized.

G9. The bidirectional Zener diode chip according to any one of "G1." to "G8.," where the semiconductor substrate is constituted of a p-type semiconductor substrate and each of the first diffusion regions and the second diffusion regions is an n-type diffusion region forming the p-n junction with the p-type semiconductor substrate.

With this arrangement, the semiconductor substrate is constituted of the p-type semiconductor substrate and therefore stable characteristics can be realized even if an epitaxial layer is not formed on the semiconductor substrate. That is, an n-type semiconductor wafer is large in in-plane variation of resistivity, and therefore an epitaxial layer with low in-plane variation of resistivity must be formed on the top surface and an impurity diffusion layer must be formed on the epitaxial layer to form the p-n junction. On the other hand, a p-type semiconductor wafer is low in in-plane variation of resistivity and a bidirectional Zener diode with stable characteristics can be cut out from any location of the wafer without having to form an epitaxial layer. Therefore by using the p-type semiconductor substrate, the manufacturing process can be simplified and the manufacturing cost can be reduced.

G10. The bidirectional Zener diode chip according to "G1." or "G9.," further including an insulating film formed in contact with the principal surface of the semiconductor substrate, having a first contact hole at each bonding portion of the first electrode and the first diffusion region, and having a second contact hole at each bonding portion of the second electrode and the second diffusion region, and portions of the first electrode and the second electrode besides the respective bonding portions with the first diffusion regions and the second diffusion regions are formed on the insulating film.

With this arrangement, it suffices to form the first electrode and the second electrode on the insulating film and the first electrode and the second electrode can thus be laid out symmetrically easily. For example, after forming an electrode film on the insulating film, the electrode film may be separated into the first electrode and the second electrode by etching using a resist mask to form the first electrode and the second electrode that are mutually symmetrical. Also with this arrangement, the connection of the first electrode with the exterior and the connection of the second electrode with the exterior can be performed on the insulating film formed on the top surface of the semiconductor substrate. Application of large impacts to the p-n junction regions can thus be avoided during mounting of the bidirectional Zener diode chip on a mounting substrate or during connection of a bonding wire to the first electrode or the second electrode. Destruction of the p-n junction regions can thereby be avoided, and a bidirectional Zener diode chip that is excellent in durability against external forces and therefore improved in reliability can be realized.

G11. The bidirectional Zener diode chip according to any one of "G1." to "G10.," further including a protective film formed on the principal surface of the semiconductor substrate so as to cover the first electrode and the second electrode while exposing the respective external connection portions of the first electrode and the second electrode. With this arrangement, the protective film that covers the first electrode and the second electrode while exposing the respective external connection portions of the first electrode and the second electrode is formed so that entry of moisture to the first electrode, the second electrode, and the p-n junction regions can be suppressed or prevented, and in addition, the durability against external forces can be improved by the protective film.

G12. The bidirectional Zener diode chip according to any one of "G1." to "G11.," where the principal surface of the semiconductor substrate has a rectangular shape with rounded corner portions. With this arrangement, the principal surface of the semiconductor substrate has the rectangular shape with rounded corner portions. Fragmenting (chipping) of the corner portions of the bidirectional Zener diode chip can thereby be suppressed or prevented and a bidirectional Zener diode chip with few appearance defects can be provided.

G13. A circuit assembly including a mounting substrate and the bidirectional Zener diode chip according to any one of "G1." to "G12." that is mounted on the mounting substrate. With this arrangement, a circuit assembly can be provided that uses the bidirectional Zener diode chip, with which the characteristics for the respective current directions are practically equal and which is thus high in quality.

G14. The circuit assembly according to "G13.," where the bidirectional Zener diode chip is connected to the mounting substrate by wireless bonding (face-down bonding or flip-chip bonding). With this arrangement, the space occupied by the bidirectional Zener diode chip on the mounting substrate can be made small to enable a contribution to be made to high-density packaging of electronic parts.

G15. An electronic equipment including the circuit assembly according to "G13." or "G14." and a casing housing the circuit assembly. With this arrangement, an electronic equipment can be provided with the circuit assembly, using the bidirectional Zener diode chip, with which the characteristics for the respective current directions are practically equal and which is thus high in quality, housed in the casing.

Preferred embodiments of the eighth invention shall now be described in detail with reference to the attached drawings.

FIG. 141 is a perspective view of a bidirectional Zener diode chip according to a preferred embodiment of the eighth invention, FIG. 142 is a plan view thereof, and FIG. 143 is a sectional view taken along line CXLIII-CXLIII in FIG. 142. Further, FIG. 144 is a sectional view taken along line CXLIV-CXLIV in FIG. 142. The bidirectional Zener diode chip G1 includes a $p^+$ type semiconductor substrate G2 (for example, a silicon substrate), a first Zener diode GD1 formed on the semiconductor substrate G2, a second Zener diode GD2 formed on the semiconductor substrate G2 and connected anti-serially to the first Zener diode GD1, a first electrode G3 connected to the first Zener diode GD1, and a second electrode 4 connected to the second Zener diode GD2. The first Zener diode GD1 is arranged from a plurality of Zener diodes GD11 and GD12. The second Zener diode GD2 is arranged from a plurality of Zener diodes GD21 and GD22.

The semiconductor substrate G2 includes a pair of principal surfaces G2*a* and G2*b* and a plurality of side surfaces G2*c* orthogonal to the pair of principal surfaces G2*a* and G2*b*, and one (principal surface G2*a*) of the pair of principal surfaces G2*a* and G2*b* is arranged as an element forming surface. Hereinafter, the principal surface G2*a* shall be referred to as the "element forming surface G2*a*." The element forming surface G2*a* is formed to a rectangular shape in a plan view and, for example, the length L in the long direction may be approximately 0.4 mm and the length W in the short direction may be approximately 0.2 mm. Also, the thickness T of the bidirectional Zener diode chip G1 as a whole may be approximately 0.1 mm. An external connection electrode G3B of the first electrode G3 and an external connection electrode G4B of the second electrode G4 are disposed at respective end portions of the element forming surface G2*a*. A diode forming region G7 is provided into the element forming surface G2*a* between the external connection electrodes G3B and G4B. The diode forming region G7 is formed to a rectangle in the present preferred embodiment.

The semiconductor substrate G2 has four corner portions G9 at four corners, each corresponding to an intersection portion of a pair of mutually adjacent side surfaces among the four side surfaces G2*c*. In the present preferred embodiment, the four corner portions G9 are shaped to round shapes. Each corner portion G9 has a smooth curved surface that is outwardly convex in a plan view as viewed in a direction of a normal to the element forming surface G2*a*. A structure capable of suppressing chipping during the manufacturing process or mounting of the bidirectional Zener diode chip G1 is thereby arranged.

FIG. 145 is a plan view showing the structure of the top surface (element forming surface G2*a*) of the semiconductor substrate G2 with the first electrode G3, the second electrode G4, and the arrangement formed thereon being removed. Referring to FIG. 142 and FIG. 145, a plurality of first $n^+$ type diffusion regions (hereinafter referred to as "first diffusion regions G10"), respectively forming p-n junction regions G11 with the semiconductor substrate G2, are formed in a top layer region of the $p^+$ type semiconductor substrate G2. Also, a plurality of second $n^+$ type diffusion regions (hereinafter referred to as "second diffusion regions G12"), respectively forming p-n junction regions G13 with the semiconductor substrate G2, are formed in the top layer region of the $p^+$ type semiconductor substrate G2.

In the present preferred embodiment, two each of the first diffusion regions G10 and the second diffusion regions G12 are formed. With the four diffusion regions G10 and G12, the first diffusion regions G10 and the second diffusion regions G12 are arrayed alternately and at equal intervals along a short direction of the semiconductor substrate G2. Also, the four diffusion regions G10 and G12 are formed to extend longitudinally in a direction intersecting (in the present preferred embodiment, a direction orthogonal to) the short direction of the semiconductor substrate G2. In the present preferred embodiment, the first diffusion regions G10 and the second diffusion regions G12 are formed to be equal in size and equal in shape. Specifically, the first diffusion regions G10 and the second diffusion regions G12 are formed to substantially rectangular shapes in a plan view, each of which is long in the long direction of the semiconductor substrate G2 and is cut at the four corners.

The two Zener diodes GD11 and GD12 are constituted by the respective first diffusion regions G10 and portions of the $p^+$ type semiconductor substrate G2 in the vicinities of the first diffusion regions G10, and the first Zener diode GD1 is constituted by the two Zener diodes GD11 and GD12. The first diffusion regions G10 are separated according to each of the two Zener diodes GD11 and GD12. The Zener diodes GD11 and GD12 are thereby made to respectively have the p-n junction regions G11 that are separated according to each Zener diode.

Similarly, the two Zener diodes GD21 and GD22 are constituted by the respective second diffusion regions G12 and portions of the $p^+$ type semiconductor substrate G2 in the vicinities of the second diffusion regions G12, and the second Zener diode GD2 is constituted by the two Zener diodes GD21 and GD22. The second diffusion regions G12 are separated according to each of the two Zener diodes GD21 and GD22. The Zener diodes GD21 and GD22 are thereby made to respectively have the p-n junction regions G13 that are separated according to each Zener diode.

As shown in FIG. 143 and FIG. 144, an insulating film G15 (omitted from illustration in FIG. 142), constituted of an oxide film, etc., is formed on the element forming surface G2*a* of the semiconductor substrate G2. First contact holes G16 respectively exposing top surfaces of the first diffusion regions G10 and second contact holes G17 exposing the top surfaces of the second diffusion regions G12 are formed in the insulating film G15. The first electrode G3 and the second electrode G4 are formed on the top surface of the insulating film G15.

The first electrode G3 includes a first electrode film G3A formed on the top surface of the insulating film G15 and the first external connection electrode G3B bonded to the first electrode film G3A. The first electrode film G3A includes a lead-out electrode GL11 connected to the first diffusion region G10 corresponding to the Zener diode GD11, a lead-out electrode GL12 connected to the first diffusion region G10 corresponding to the Zener diode GD12, and a first pad G5 formed integral to the lead-out electrodes GL11 and GL12 (first lead-out electrodes). The first pad G5 is formed to a rectangle at one end portion of the element forming surface G2*a*. The first external connection electrode G3B is connected to the first pad G5. The first external connection electrode G3B is thereby connected in common to the lead-out electrodes GL11 and GL12. The first pad G5 and the first external connection electrode G3B constitute an external connection portion of the first electrode G3.

The second electrode G4 includes a second electrode film G4A formed on the top surface of the insulating film G15 and the second external connection electrode G4B bonded to the second electrode film G4A. The second electrode film G4A includes a lead-out electrode GL21 connected to the second diffusion region G12 corresponding to the Zener diode GD21, a lead-out electrode GL22 connected to the second diffusion region G12 corresponding to the Zener diode GD22, and a second pad G6 formed integral to the lead-out electrodes GL21 and GL22 (second lead-out electrodes). The second pad G6 is formed to a rectangle at one end portion of the element forming surface G2*a*. The second external connection electrode G4B is connected to the second pad G6. The second external connection electrode G4B is thereby connected in common to the lead-out electrodes GL21 and GL22. The second pad G6 and the second external connection electrode G4B constitute an external connection portion of the second electrode G4.

The lead-out electrode GL11 enters into the first contact hole G16 of the Zener diode GD11 from the top surface of the insulating film G15 and is in ohmic contact with the first diffusion region G10 of the Zener diode GD11 inside the first contact hole G16. In the lead-out electrode GL11, the portion bonded to the Zener diode GD11 inside the first contact hole G16 constitutes a bonding portion GC11. Similarly, the lead-out electrode GL12 enters into the first contact hole G16 of the Zener diode GD12 from the top surface of the insulating film G15 and is in ohmic contact with the first diffusion region G10 of the Zener diode GD12 inside the first contact hole G16. In the lead-out electrode GL12, the portion bonded to the Zener diode GD12 inside the first contact hole G16 constitutes a bonding portion GC12.

The lead-out electrode GL21 enters into the second contact hole G17 of the Zener diode GD21 from the top surface of the insulating film G15 and is in ohmic contact with the second diffusion region G12 of the Zener diode GD21 inside the second contact hole G17. In the lead-out electrode GL21, the portion bonded to the Zener diode GD21 inside the second contact hole G17 constitutes a bonding portion GC21. Similarly, the lead-out electrode GL22 enters into the second contact hole G17 of the Zener diode GD22 from the top surface of the insulating film G15 and is in ohmic contact with the second diffusion region G12 of the Zener diode GD22 inside the second contact hole G17. In the lead-out electrode GL22, the portion bonded to the Zener diode GD22 inside the second contact hole G17 constitutes a bonding portion GC22. In the present preferred embodiment, the first electrode film G3A and the second electrode film G4A are made of the same material. In the present preferred embodiment, Al films are used as the electrode films.

The first electrode film G3A and the second electrode film G4A are separated by a slit G18. The lead-out electrode GL11 is formed rectilinearly along a straight line passing above the first diffusion region G10 corresponding to the Zener diode GD11 and leading to the first pad G5. Similarly, the lead-out electrode GL12 is formed rectilinearly along a straight line passing above the first diffusion region G10 corresponding to the Zener diode GD12 and leading to the first pad G5. Each of the lead-out electrodes GL11 and GL12 has a uniform width at all locations between the corresponding first diffusion region G10 and the first pad G5, and the respective widths are wider than the widths of the bonding portions GC11 and GC12. The widths of the bonding portions GC11 and GC12 are defined by the lengths in the direction orthogonal to the lead-out directions of the lead-out electrodes GL11 and GL12. Tip end portions of the lead-out electrodes GL11 and GL12 are shaped to match the planar shapes of the corresponding first diffusion regions G10. Base end portions of the lead-out electrodes GL11 and GL12 are connected to the first pad G5.

The lead-out electrode GL21 is formed rectilinearly along a straight line passing above the second diffusion region G12 corresponding to the Zener diode GD21 and leading to the second pad G6. Similarly, the lead-out electrode GL22 is formed rectilinearly along a straight line passing above the second diffusion region G12 corresponding to the Zener diode GD22 and leading to the second pad G6. Each of the lead-out electrodes GL21 and GL22 has a uniform width at all locations between the corresponding second diffusion region G12 to the second pad G6, and the respective widths are wider than the widths of the bonding portions GC21 and GC22. The widths of the bonding portions GC21 and GC22 are defined by the lengths in the direction orthogonal to the lead-out directions of the lead-out electrodes GL21 and GL22. Tip end portions of the lead-out electrodes GL21 and GL22 are shaped to match the planar shapes of the corresponding second diffusion regions G12. Base end portions of the lead-out electrodes GL21 and GL22 are connected to the second pad G6.

That is, the first electrode G3 and the second electrode G4 are formed to comb-teeth-like shapes in which the plurality of first lead-out electrodes GL11 and GL12 and the plurality of second lead-out electrodes GL21 and GL22 are mutually engaged. Also, the first electrode G3 plus the first diffusion regions G10 and the second electrode G4 plus the second diffusion regions G12 are arranged to be mutually symmetrical in a plan view. More specifically, the first electrode G3 plus the first diffusion regions G10 and the second electrode G4 plus the second diffusion regions G12 are arranged to be point symmetrical with respect to a center of gravity of the element forming surface G2*a* in a plan view.

The first electrode G3 plus the first diffusion regions G10 and the second electrode G4 plus the second diffusion regions G12 may also be regarded as being arranged to be practically line symmetrical. Specifically, the second lead-out electrode GL22 at one of the long sides of the semiconductor substrate G2 and the first lead-out electrode GL11 adjacent thereto may be regarded as being at substantially the same position, and the first lead-out electrode GL12 at the other long side of the semiconductor substrate G2 and the second lead-out electrode GL21 adjacent thereto may be regarded as being at substantially the same position. In this case, the first electrode G3 plus the first diffusion regions G10 and the second electrode G4 plus the second diffusion regions G12 may be regarded as being arranged to be line symmetrical with respect to a straight line parallel to the short direction of the element forming surface G2*a* and passing through the long direction center in a plan view. The slit G18 is formed so as to border the lead-out electrodes GL11, GL12, GL21, and GL22. The first electrode film G3A and the second electrode film G4A are covered by a passivation film G20 (omitted from illustration in FIG. 142), constituted, for example, of a nitride film, and a resin film G21, made of polyimide, etc., is further formed on the passivation film G20. A pad opening G22 exposing the first pad G5 and a pad opening G23 exposing the second pad G6 are formed so as to penetrate through the passivation film G20 and the resin film G21. The external connection electrodes G3B and G4B are respectively embedded in the pad openings G22 and G23. The passivation film G20 and the resin film G21 constitute a protective film to suppress or prevent the entry of moisture to the first lead-out electrodes GL11 and GL12, the second lead-out electrodes GL21 and GL22, and the p-n junction regions G11 and G13 and also absorb impacts, etc., from the exterior, thereby contributing to improvement of the durability of the bidirectional Zener diode chip G1.

The external connection electrodes G3B and G4B may have top surfaces at positions lower than the top surface of the resin film G21 (positions close to the semiconductor substrate G2) or may project from the top surface of the resin film G21 and have top surfaces at positions higher than the resin film G21 (positions far from the semiconductor substrate G2). An example where the external connection electrodes G3B and G4B project from the top surface of the resin film G21 is shown in FIG. 143. Each of the external connection electrodes G3B and G4B may be constituted, for example, of an Ni/Pd/Au laminated film having an Ni film in contact with the electrode film G3A or G4A, a Pd film formed on the Ni film, and an Au film formed on the Pd film. Such a laminated film may be formed by a plating method.

The first diffusion regions G10 of the plurality of Zener diodes GD11 and GD12 that constitute the first Zener diode GD1 are connected in common to the first electrode G3 and are connected to the $p^+$ type semiconductor substrate G2, which is the p-type region in common to the Zener diodes GD11 and GD12. The plurality of Zener diodes GD11 and GD12 that constitute the first Zener diode GD1 are thereby connected in parallel. Meanwhile, the second diffusion regions G12 of the plurality of Zener diodes GD21 and GD22 that constitute the second Zener diode GD2 are connected in common to the second electrode G4 and are connected to the $p^+$ type semiconductor substrate G2, which is the p-type region in common to the Zener diodes GD21 and GD22. The plurality of Zener diodes GD21 and GD22 that constitute the second Zener diode GD2 are thereby connected in parallel. The parallel circuit of the Zener diodes GD21 and GD22 and the parallel circuit of the Zener diodes GD11 and GD12 are connected anti-serially, and the bidirectional Zener diode is constituted by the anti-serial circuit.

FIG. 146 is an electric circuit diagram showing the electrical structure of the interior of the bidirectional Zener diode chip G1. The cathodes of the plurality of Zener diodes GD11 and GD12 constituting the first Zener diode GD1 are connected in common to the first electrode G3 and the anodes thereof are connected in common to the anodes of the plurality of Zener diodes GD21 and GD22 constituting the second Zener diode GD2. The cathodes of the plurality of Zener diodes GD21 and GD22 are connected in common to the second electrode G4. These thus function as a single bidirectional Zener diode as a whole.

With the present preferred embodiment, the first electrode G3 plus the first diffusion regions G10 and the second electrode G4 plus the second diffusion region G12 are arranged to be mutually symmetrical, and characteristics for respective current directions can thus be made practically equal. FIG. 147B shows experimental results of measuring, for respective current directions, current vs. voltage characteristics of a bidirectional Zener diode (comparative example), with which a first electrode plus first diffusion region and a second electrode plus second diffusion region are arranged to be mutually asymmetrical. In FIG. 147B, the solid line indicates the current vs. voltage characteristics in a case of applying voltage to the bidirectional Zener diode with one electrode being a positive electrode and the other electrode being a negative electrode and the broken line indicates the current vs. voltage characteristics in a case of applying voltage to the bidirectional Zener diode with the one electrode being the negative electrode and the other electrode being the positive electrode. From the experimental results, it can be understood with the bidirectional Zener diode, with which the first electrode plus first diffusion region and the second electrode plus second diffusion region are arranged to be mutually asymmetrical, the current vs. voltage characteristics are not equal for the respective current directions.

FIG. 147A shows experimental results of measuring, for respective current directions, current vs. voltage characteristics of the bidirectional Zener diode according to the present preferred embodiment. With the bidirectional Zener diode according to the present preferred embodiment, both the current vs. voltage characteristics in the case of applying voltage with the first electrode G3 being the positive electrode and the second electrode G4 being the negative electrode and the current vs. voltage characteristics in the case of applying voltage with the second electrode G4 being the positive electrode and the first electrode G3 being the negative electrode were characteristics indicated by the solid line in FIG. 147A. That is, with the bidirectional Zener diode according to the present preferred embodiment, the current vs. voltage characteristics were practically equal for the respective current directions. With the arrangement of the present preferred embodiment, the bidirectional Zener diode chip G1 has the first Zener diode GD1 and the second Zener diode GD2. The first Zener diode GD1 has the plurality of Zener diodes GD11 and GD12 (first diffusion regions G10) and each of the Zener diodes GD11 and GD12 has the p-n junction region G11. The p-n junction regions G11 are separated according to each of the Zener diodes GD11 and GD12. Therefore "a peripheral length of the p-n junction regions G11 of the first Zener diode GD1," that is, the total (total extension) of the peripheral lengths of the first diffusion regions G10 in the semiconductor substrate G2 is long. The electric field can thereby be dispersed and prevented from concentrating at vicinities of the p-n junction regions G11, and the ESD tolerance of the first Zener diode GD1 can thus be improved. That is, even when the bidirectional Zener diode chip G1 is to be formed compactly, the total peripheral length of the p-n junction regions G11 can be made large, thereby enabling both downsizing of the bidirectional Zener diode chip G1 and securing of the ESD tolerance to be achieved at the same time.

Similarly, the second Zener diode GD2 has the plurality of Zener diodes GD21 and GD22 (second diffusion regions G12) and each of the Zener diodes GD21 and GD22 has the p-n junction region G13. The p-n junction regions G13 are separated according to each of the Zener diodes GD21 and GD22. Therefore "a peripheral length of the p-n junction regions G13 of the second Zener diode GD2," that is, the total (total extension) of the peripheral lengths of the second diffusion regions G12 in the semiconductor substrate G2 is long. The electric field can thereby be dispersed and prevented from concentrating at vicinities of the p-n junction regions G13, and the ESD tolerance of the second Zener diode GD2 can thus be improved. That is, even when the bidirectional Zener diode chip G1 is to be formed compactly, the total peripheral length of the p-n junction regions G13 can be made large, thereby enabling both downsizing of the bidirectional Zener diode chip G1 and securing of the ESD tolerance to be achieved at the same time.

With the present preferred embodiment, the respective peripheral lengths of the p-n junction regions G11 of the first Zener diode GD1 and the p-n junction regions G13 of the second Zener diode GD2 are defined to be not less than 400 μm and not more than 1500 μm. More preferably, the respective peripheral lengths are defined to be not less than 500 μm and not more than 1000 μm. As shall be described later using FIG. 148, a bidirectional Zener diode chip of high ESD tolerance can be realized because the respective peripheral lengths are defined to be not less than 400 μm. Also, as shall be described later using FIG. 149, a bidirectional Zener diode chip with which the capacitance between the first electrode G3 and the second electrode G4 (inter-terminal capacitance) is small can be realized because the respective peripheral lengths are defined to be not more than 1500 μm. Specifically, a bidirectional Zener diode chip with an inter-terminal capacitance of not more than 30 [pF] can be realized. More preferably, the respective peripheral lengths are defined to be not less than 500 μm and not more than 1000 μm.

FIG. 148 shows experimental results of measuring the ESD tolerances of a plurality of samples that are differed in the respective peripheral lengths of the p-n junction regions of the first Zener diode and the p-n junction regions of the second Zener diode by variously setting the number of lead-out electrodes (diffusion regions) and/or the sizes of the diffusion regions formed on a semiconductor substrate of the same area. In each sample, the first electrode plus the first diffusion regions and the second electrode plus the second diffusion regions are formed to be mutually symmetrical in the same manner as in the preferred embodiment. Therefore in each sample, the peripheral length of the junction regions G11 of the first Zener diode GD1 and the peripheral length of the junction regions G13 of the second Zener diode GD2 are substantially equal.

The abscissa axis of FIG. 148 indicates one of either of the peripheral length of the junction regions G11 of the first Zener diode GD1 or the peripheral length of the junction regions G13 of the second Zener diode GD2. From these experimental results, it can be understood that the longer the respective peripheral lengths of the p-n junction regions G11 and p-n junction regions G13, the greater the ESD tolerance. In cases where the respective peripheral lengths of the p-n junction regions G11 and p-n junction regions G13 are defined to be not less than 400 μm, ESD tolerances of not less than 8 kilovolts, which is the target value, could be realized.

FIG. 149 shows experimental results of measuring the inter-terminal capacitances of a plurality of samples that are differed in the respective peripheral lengths of the p-n junction regions of the first Zener diode and the p-n junction regions of the second Zener diode by variously setting the number of lead-out electrodes (diffusion regions) and/or the sizes of the diffusion regions formed on a semiconductor substrate of the same area. In each sample, the first electrode plus the first diffusion regions and the second electrode plus the second diffusion regions are formed to be mutually symmetrical in the same manner as in the preferred embodiment.

The abscissa axis of FIG. 149 indicates one of either of the peripheral length of the junction regions G11 of the first Zener diode GD1 or the peripheral length of the junction regions G13 of the second Zener diode GD2. From these experimental results, it can be understood that the longer the respective peripheral lengths of the p-n junction regions G11 and p-n junction regions G13, the greater the inter-terminal capacitance. In cases where the respective peripheral lengths of the p-n junction regions G11 and p-n junction regions G13 are defined to be not more than 1500 μm, inter-terminal capacitances of not more than 30 [pF], which is the target value, could be realized.

Further with the present preferred embodiment, the widths of the lead-out electrodes GL11, GL12, GL21, and GL22 are wider than the widths of the bonding portions GC11, GC12, GC21, and GC22 at all locations between the bonding portions GC11, GC12, GC21, and GC22 and the first pad G5. A large allowable current amount can thus be set and electromigration can be reduced to improve reliability with respect to a large current. That is, a bidirectional Zener diode chip that is compact, high in ESD tolerance, and secured in reliability with respect to large currents can be provided.

Further, the external connection electrodes G3B and G4B of the first electrode G3 and the second electrode G4 are both formed on the element forming surface G2*a*, which is one of the surfaces of the semiconductor substrate G2. Therefore as shown in FIG. 150, a circuit assembly having the bidirectional Zener diode chip G1 surface-mounted on a mounting substrate G25 can be arranged by making the element forming surface G2*a* face the mounting substrate G25 and bonding the external connection electrodes G3B and G4B onto the mounting substrate G25 by solders G26. That is, the bidirectional Zener diode chip G1 of the flip-chip connection type can be provided, and by performing face-down bonding with the element forming surface G2*a* being made to face the mounting surface of the mounting substrate G25, the bidirectional Zener diode chip G1 can be connected to the mounting substrate G25 by wireless bonding. The area occupied by the bidirectional Zener diode chip G1 on the mounting substrate G25 can thereby be made small. In particular, reduction of height of the bidirectional Zener diode chip G1 on the mounting substrate G25 can be realized. Effective use can thereby be made of the space inside a casing of a compact electronic equipment, etc., to contribute to high-density packaging and downsizing.

Also with the present preferred embodiment, the insulating film G15 is formed on the semiconductor substrate G2 and the bonding portions GC11 and GC12 of the lead-out electrodes GL11 and GL12 are connected to the first diffusion regions G10 of the Zener diodes GD11 and GD12 via the first contact holes G16 formed in the insulating film G15.

The first pad G5 is disposed on the insulating film G15 in the region outside the first contact holes G16. That is, the first pad G5 is provided at a position separated from positions directly above the p-n junction regions G11.

Similarly, the bonding portions GC21 and GC22 of the lead-out electrodes GL21 and GL22 are connected to the second diffusion regions G12 of the Zener diodes GD21 and GD22 via the second contact holes G17 formed in the insulating film G15. The second pad G6 is disposed on the insulating film G15 in the region outside the second contact holes G17. The second pad G6 is also disposed at a position separated from positions directly above the p-n junction regions G13. Application of a large impact to the p-n junction regions G11 and G13 can thus be avoided during mounting of the bidirectional Zener diode chip G1 on the mounting substrate G25. Destruction of the p-n junction regions G11 and G13 can thereby be avoided and a bidirectional Zener diode chip that is excellent in durability against external forces can thereby be realized. An arrangement is also possible where the external connection electrodes G3B and G4B are not provided, the first pad G5 and the second pad G6 are respectively used as the external connection portion of the first electrode G3 and the external connection portion of the second electrode G4, and bonding wires are connected to the first pad G5 and the second pad G6. Destruction of the p-n junction regions G11 and G13 due to impacts during wire bonding can be avoided in this case as well.

Further with the present preferred embodiment, the semiconductor substrate G2 has the rectangular shape with the corner portions G9 being rounded. Fragmenting (chipping) of the corner portions of the bidirectional Zener diode chip G1 can thereby be suppressed or prevented and the bidirectional Zener diode chip G1 with few appearance defects can be provided.

FIG. 151 is a process diagram for describing an example of a manufacturing process of the bidirectional Zener diode chip G1. Also, FIG. 152A and FIG. 152B are schematic sectional views of the arrangement in the middle of the manufacturing process of FIG. 151 and show a section corresponding to FIG. 143. FIG. 153 is a plan view of a $p^+$ type semiconductor wafer GW as a base substrate of the semiconductor substrate G2 and shows a partial region in a magnified manner.

First, the $p^+$ type semiconductor wafer GW is prepared as the base substrate of the semiconductor substrate G2. A top surface of the semiconductor wafer GW is an element forming surface GWa and corresponds to the element forming surface G2*a* of the semiconductor substrate G2. A plurality of bidirectional Zener diode chip regions G1*a*, corresponding to a plurality of the bidirectional Zener diode chips G1, are arrayed and set in a matrix on the element forming surface GWa. A boundary region G80 is provided between adjacent bidirectional Zener diode chip regions G1*a*. The boundary region G80 is a band-like region having a substantially fixed width and extends in two orthogonal directions to form a lattice. After performing necessary steps on the semiconductor wafer GW, the semiconductor wafer GW is cut apart along the boundary region G80 to obtain the plurality of bidirectional Zener diode chips G1.

The steps executed on the semiconductor wafer GW are, for example, as follows. First, the insulating film G15 (with a thickness, for example, of 8000 Å to 8600 Å), which is a thermal oxide film or CVD oxide film, etc., is formed on the element forming surface GWa of the $p^+$ type semiconductor wafer GW (GS1) and a resist mask is formed on the insulating film G15 (GS2). Openings corresponding to the first diffusion regions G10 and the second diffusion regions G12 are then formed in the insulating film G15 by etching using the resist mask (GS3). Further, after peeling off the resist mask, an n-type impurity is introduced to top layer portions of the semiconductor wafer GW that are exposed from the openings formed in the insulating film G15 (GS4). The introduction of the n-type impurity may be performed by a step of depositing phosphorus as the n-type impurity on the top surface (so-called phosphorus deposition) or by implantation of n-type impurity ions (for example, phosphorus ions). Phosphorus deposition is a process of depositing phosphorus on the top surface of the semiconductor wafer GW exposed inside the openings in the insulating film G15 by conveying the semiconductor wafer GW into a diffusion furnace and performing heat treatment while making $POCl_3$ gas flow inside a diffusion passage. After thickening the insulating film G15 (thickening, for example, by approximately 1200 Å by CVD oxide film formation) as necessary (GS5), heat treatment (drive-in) for activation of the impurity ions introduced into the semiconductor wafer GW is performed (GS6). The first diffusion regions G10 and the second diffusion regions G12 are thereby formed on the top layer portion of the semiconductor wafer GW.

Thereafter, another resist mask having openings matching the contact holes G16 and G17 is formed on the insulating film G15 (GS7). The contact holes G16 and G17 are formed in the insulating film G15 by etching via the resist mask (GS8), and the resist mask is peeled off thereafter. An electrode film that constitutes the first electrode G3 and the second electrode G4 is then formed on the insulating film G15, for example, by sputtering (GS9). In the present preferred embodiment, an electrode film (for example, of 10000 Å thickness), made of Al, is formed. Another resist mask having an opening pattern corresponding to the slit G18 is then formed on the electrode film (GS10) and the slit G18 is formed in the electrode film by etching (for example, reactive ion etching) via the resist mask (GS11). The electrode film is thereby separated into the first electrode film G3A and the second electrode film G4A.

Then after peeling off the resist film, the passivation film G20, which is a nitride film, etc., is formed, for example, by the CVD method (GS12), and further, polyimide, etc., is applied to form the resin film G21 (GS13). For example, a polyimide imparted with photosensitivity is applied, and after exposing in a pattern corresponding to the pad openings G22 and G23, the polyimide film is developed (step GS14). The resin film G21 having openings corresponding to the pad openings G22 and G23 is thereby formed. Thereafter, heat treatment for curing the resin film is performed as necessary (GS15). The pad openings G22 and G23 are then formed in the passivation film G20 by performing dry etching (for example, reactive ion etching) using the resin film G21 as a mask (GS16). Thereafter, the external connection electrodes G3B and G4B are formed inside the pad openings G22 and G23 (GS17). The external connection electrodes G3B and G4B may be formed by plating (preferably, electroless plating).

Thereafter, a resist mask G83 (see FIG. 152A), having a lattice-shaped opening matching the boundary region G80 (see FIG. 153), is formed (GS18). Plasma etching is performed via the resist mask G83 and the semiconductor wafer GW is thereby etched to a predetermined depth from the element forming surface GWa as shown in FIG. 152A. A groove G81 for cutting is thereby formed along the boundary region G80 (GS19). After peeling off the resist mask G83, the semiconductor wafer GW is ground from the rear surface GWb until a bottom portion of the groove G81 is reached as shown in FIG. 152B (GS20). The plurality of bidirectional Zener diode chip regions G1*a* are thereby separated into individual pieces and the bidirectional Zener diode chips G1 with the structure described above can thereby be obtained.

As shown in FIG. 153, the resist mask G83 arranged to form the groove G81 at the boundary region G80 has, at positions adjacent to the four corners of the bidirectional Zener diode chip region G1*a*, round shaped portions G84 of curved shapes that are convex toward outer sides of the bidirectional Zener diode chip region G1*a*. Each round shaped portion G84 is formed to connect two adjacent sides of a bidirectional Zener diode chip region G1*a* by a smooth curve. Therefore, when the groove G81 is formed by plasma etching using the resist mask G83 as a mask, the groove G81 is to made to have, at positions adjacent to the four corners of each bidirectional Zener diode chip region G1*a*, round shaped portions of curved shapes that are convex toward the outer sides of the bidirectional Zener diode chip region G1*a*. Therefore in the step of forming the groove G81 for cutting out the bidirectional Zener diode chip regions G1*a* from the semiconductor wafer GW, the corner portions G9 of the four corners of each bidirectional Zener diode chip G1 can be shaped to round shapes at the same time. That is, the corner portions G9 can be processed to round shapes without adding a dedicated step.

With the present preferred embodiment, the semiconductor substrate G2 is constituted of the p-type semiconductor and therefore stable characteristics can be realized even if an epitaxial layer is not formed on the semiconductor substrate G2. That is, an n-type semiconductor wafer is large in in-plane variation of resistivity, and therefore when an n-type semiconductor wafer is used, an epitaxial layer with low in-plane variation of resistivity must be formed on the top surface and an impurity diffusion layer must be formed on the epitaxial layer to form the p-n junction. This is because an n-type impurity is low in segregation coefficient and therefore when an ingot (for example, a silicon ingot) that is to be the source of a semiconductor wafer is formed, a large difference in resistivity arises between a central portion and a peripheral edge portion of the wafer. On the other hand, a p-type impurity is comparatively high in segregation coefficient and therefore a p-type semiconductor wafer is low in in-plane variation of resistivity. Therefore by using a p-type semiconductor wafer, a bidirectional Zener diode with stable characteristics can be cut out from any location of the wafer without having to form an epitaxial layer. Therefore by using the $p^-$ type semiconductor substrate G2, the manufacturing process can be simplified and the manufacturing cost can be reduced.

FIG. 154 is a perspective view of an outer appearance of a smartphone that is an example of an electronic equipment in which the bidirectional Zener diode chip is used. The smartphone G201 is arranged by housing electronic parts in the interior of a casing G202 with a flat rectangular parallelepiped shape. The casing G202 has a pair of principal surfaces with an oblong shape at its front side and rear side, and the pair of principal surfaces are joined by four side surfaces. A display surface of a display panel G203, constituted of a liquid crystal panel or an organic EL panel, etc., is exposed at one of the principal surfaces of the casing G202. The display surface of the display panel G203 constitutes a touch panel and provides an input interface for a user.

The display panel G203 is formed to an oblong shape that occupies most of one of the principal surfaces of the casing G202. Operation buttons G204 are disposed along one short side of the display panel G203. In the present preferred embodiment, a plurality (three) of the operation buttons G204 are aligned along the short side of the display panel G203. The user can call and execute necessary functions by performing operations of the smartphone G201 by operating the operation buttons G204 and the touch panel.

A speaker G205 is disposed in a vicinity of the other short side of the display panel G203. The speaker G205 provides an earpiece for a telephone function and is also used as an acoustic conversion unit for reproducing music data, etc. On the other hand, close to the operation buttons G204, a microphone G206 is disposed at one of the side surfaces of the casing G202. The microphone G206 provides a mouthpiece for the telephone function and may also be used as a microphone for sound recording.

FIG. 155 is an illustrative plan view of the arrangement of an electronic circuit assembly G210 housed in the interior of the housing G202. The electronic circuit assembly G210 includes a wiring substrate G211 and circuit parts mounted on a mounting surface of the wiring substrate G211. The plurality of circuit parts include a plurality of integrated circuit elements (ICs) G212 to G220 and a plurality of chip parts. The plurality of ICs include a transmission processing IC G212, a one-segment TV receiving IC G213, a GPS receiving IC G214, an FM tuner IC G215, a power supply IC G216, a flash memory G217, a microcomputer G218, a power supply IC G219, and a baseband IC G220. The plurality of chip parts include chip inductors G221, G225, and G235, chip resistors G222, G224, and G233, chip capacitors G227, G230, and G234, chip diodes G228 and G231, and bidirectional Zener diode chips G241 to G248. The chip parts are mounted on the mounting surface of the wiring substrate G211, for example, by flip-chip bonding.

The bidirectional Zener diode chips G241 to G248 are provided for absorbing positive and negative surges, etc., in signal input lines to the one-segment TV receiving IC G213, the GPS receiving IC G214, the FM tuner IC G215, the power supply IC G216, the flash memory G217, the microcomputer G218, the power supply IC G219, and the baseband IC G220. The bidirectional Zener diode chips according to the preferred embodiment described above may be applied as the bidirectional Zener diode chips G241 and G248.

The transmission processing IC G212 has incorporated therein an electronic circuit arranged to generate display control signals for the display panel G203 and receive input signals from the touch panel on the top surface of the display panel G203. For connection with the display panel G203, the transmission processing IC G212 is connected to a flexible wiring G209. The one-segment TV receiving IC G213 incorporates an electronic circuit that constitutes a receiver for receiving one-segment broadcast (terrestrial digital television broadcast targeted for reception by portable equipment) radio waves. A plurality of the chip inductors G221, a plurality of the chip resistors G222, and a plurality of the bidirectional Zener diode chips G241 are disposed in a vicinity of the one-segment TV receiving IC G213. The one-segment TV receiving IC G213, the chip inductors G221, the chip resistors G222, and the bidirectional Zener diode chips G241 constitute a one-segment broadcast receiving circuit G223. The chip inductors G221 and the chip resistors G222 respectively have accurately adjusted inductances and resistances and provide circuit constants of high precision to the one-segment broadcast receiving circuit G223.

The GPS receiving IC G214 incorporates an electronic circuit that receives radio waves from GPS satellites and outputs positional information of the smartphone G201. A plurality of the bidirectional Zener diode chips G242 are disposed in a vicinity of the GPS receiving IC G214. The FM tuner IC G215 constitutes, together with a plurality of the chip resistors G224, a plurality of the chip inductors G225, and a plurality of the bidirectional Zener diode chips G243 mounted on the wiring substrate G211 in a vicinity thereof, an FM broadcast receiving circuit G226. The chip resistors G224 and the chip inductors G225 respectively have accurately adjusted resistance values and inductances and provide circuit constants of high precision to the FM broadcast receiving circuit G226.

A plurality of the chip capacitors G227, a plurality of the chip diodes G228, and a plurality of the bidirectional Zener diode chips G244 are mounted on the mounting surface of the wiring substrate G211 in a vicinity of the power supply IC G216. Together with the chip capacitors G227, the chip diodes G228, and the bidirectional Zener diode chips G244, the power supply IC G216 constitutes a power supply circuit G229.

The flash memory G217 is a storage device for recording operating system programs, data generated in the interior of the smartphone G201, and data and programs acquired from the exterior by communication functions, etc. A plurality of the bidirectional Zener diode chips G245 are disposed in a vicinity of the flash memory G217. The microcomputer G218 is a computing processing circuit that incorporates a CPU, a ROM, and a RAM and realizes a plurality of functions of the smartphone G201 by executing various computational processes. More specifically, computational processes for image processing and various application programs are realized by actions of the microcomputer G218. A plurality of the bidirectional Zener diode chips G246 are disposed in a vicinity of the microcomputer G218. A plurality of the chip capacitors G230, a plurality of the chip diodes G231, and a plurality of the bidirectional Zener diode chips G247 are mounted on the mounting surface of the wiring substrate G211 in a vicinity of the power supply IC G219. Together with the chip capacitors G230, the chip diodes G231, and the plurality of bidirectional Zener diode chips G247, the power supply IC G219 constitutes a power supply circuit G232.

A plurality of the chip resistors G233, a plurality of the chip capacitors G234, a plurality of the chip inductors G235, and a plurality of the bidirectional Zener diode chips G248 are mounted on the mounting surface of the wiring substrate G211 in a vicinity of the baseband IC G220. Together with the chip resistors G233, the chip capacitors G234, the chip inductors G235, and the plurality of bidirectional Zener diode chips G248, the baseband IC G220 constitutes a baseband communication circuit G236. The baseband communication circuit G236 provides communication functions for telephone communication and data communication.

With the above arrangement, electric power that is appropriately adjusted by the power supply circuits G229 and G232 is supplied to the transmission processing IC G212, the GPS receiving IC G214, the one-segment broadcast receiving circuit G223, the FM broadcast receiving circuit G226, the baseband communication circuit G236, the flash memory G217, and the microcomputer G218. The microcomputer G218 performs computational processes in response to input signals input via the transmission processing IC G212 and makes the display control signals be output from the transmission processing IC G212 to the display panel G203 to make the display panel G203 perform various displays.

When receiving of a one-segment broadcast is commanded by operation of the touch panel or the operation buttons G204, the one-segment broadcast is received by actions of the one-segment broadcast receiving circuit G223. Computational processes for outputting the received images to the display panel G203 and making the received audio signals be acoustically converted by the speaker G205 are executed by the microcomputer G218. Also, when positional information of the smartphone G201 is required, the microcomputer G218 acquires the positional information output by the GPS receiving IC G214 and executes computational processes using the positional information.

Further, when an FM broadcast receiving command is input by operation of the touch panel or the operation buttons G204, the microcomputer G218 starts up the FM broadcast receiving circuit G226 and executes computational processes for outputting the received audio signals from the speaker G205. The flash memory G217 is used for storing data acquired by communication and storing data prepared by computations by the microcomputer G218 and inputs from the touch panel. The microcomputer G218 writes data into the flash memory G217 or reads data from the flash memory G217 as necessary.

The telephone communication or data communication functions are realized by the baseband communication circuit G236. The microcomputer G218 controls the baseband communication circuit G236 to perform processes for sending and receiving audio signals or data.

FIG. 156A to FIG. 156E are respectively, plan views of modification examples of the bidirectional Zener diode chip. FIG. 156A to FIG. 156E are plan views corresponding to FIG. 142. In FIG. 156A to FIG. 156E, portions corresponding to respective portions shown in FIG. 142 are provided with the same reference symbol as in FIG. 142.

With the bidirectional Zener diode chip G1A of FIG. 156A, one each of the first diffusion region G10 and the second diffusion region G12 are formed. The first Zener diode GD1 is constituted of a single Zener diode corresponding to the first diffusion region G10. The second Zener diode GD2 is constituted of a single Zener diode corresponding to the second diffusion region G12. The first diffusion region G10 and the second diffusion region G12 have substantially rectangular shapes that are long in the long direction of the semiconductor substrate G2 and are disposed across an interval in the short direction of the semiconductor substrate G2. The lengths of the first diffusion region G10 and the second diffusion region G12 in the long direction are defined to be comparatively short (shorter than ½ the interval between the first pad G5 and the second pad G6). The interval between the first diffusion region G10 and the second diffusion region G12 is set to be shorter than the widths of the diffusion regions G10 and G12.

The single lead-out electrode GL11 corresponding to the first diffusion region G10 is formed in the first electrode G3. Similarly, the single lead-out electrode GL12 corresponding to the second diffusion region G12 is formed in the second electrode G4. The first electrode G3 and the second electrode G4 are formed to comb-teeth-like shapes in which the lead-out electrode GL11 and the lead-out electrode GL21 are mutually engaged. Also, the first electrode G3 plus the first diffusion region G10 and the second electrode G4 plus the second diffusion region G12 are arranged to be point symmetrical with respect to the center of gravity of the element forming surface G2*a* in a plan view. The first electrode G3 plus the first diffusion region G10 and the second electrode G4 plus the second diffusion region G12 may also be regarded as being arranged to be practically line symmetrical. That is, if it is regarded that the first lead-out electrode GL11 and the second lead-out electrode GL21 are at substantially the same position, the first electrode G3 plus the first diffusion region G10 and the second electrode G4 plus the second diffusion region G12 may be regarded as being arranged to be line symmetrical with respect to the straight line parallel to the short direction of the element forming surface G2*a* and passing through the long direction center in a plan view.

As with the bidirectional Zener diode chip G1B of FIG. 156B, with the bidirectional Zener diode chip G1A of FIG. 156A, each of the first Zener diode GD1 and the second Zener diode GD2 is constituted of a single Zener diode. With the bidirectional Zener diode chip G1B of FIG. 156B, the lengths of the first diffusion region G10 and the second diffusion region G12 in the long direction and the lengths of the lead-out electrodes GL11 and GL21 are defined to be comparatively long (longer than ½ the interval between the first pad G5 and the second pad G6) in comparison to the bidirectional Zener diode chip G1A of FIG. 156A.

With the bidirectional Zener diode chip G1C of FIG. 156C, four each of the first diffusion regions G10 and the second diffusion regions G12 are formed. The eight first diffusion regions G10 and the second diffusion regions G12 have rectangular shapes that are long in the long direction of the semiconductor substrate G2, and the first diffusion regions G10 and the second diffusion regions G12 are disposed alternately at equal intervals along the short direction of the semiconductor substrate G2. The first diode GD1 is constituted of four Zener diodes GD11 to GD14 respectively corresponding to the respective first diffusion regions G10. The second diode GD2 is constituted of four Zener diodes GD21 to GD24 respectively corresponding to the respective second diffusion regions G12.

Four lead-out electrodes GL11 to GL14 respectively corresponding to the respective first diffusion regions G10 are formed in the first electrode G3. Similarly, four lead-out electrodes GL21 to GL24 respectively corresponding to the respective second diffusion regions G12 are formed in the second electrode G4. The first electrode G3 and the second electrode G4 are formed to comb-teeth-like shapes in which the lead-out electrodes GL11 to GL14 and the lead-out electrodes GL21 to GL24 are mutually engaged.

The first electrode G3 plus the first diffusion regions G10 and the second electrode G4 plus the second diffusion regions G12 are arranged to be point symmetrical with respect to the center of gravity of the element forming surface G2*a* in a plan view. The first electrode G3 plus the first diffusion regions G10 and the second electrode G4 plus the second diffusion regions G12 may also be regarded as being arranged to be practically line symmetrical. That is, if it is regarded that the mutually adjacent electrodes among the first lead-out electrodes GL11 to GL14 and the second lead-out electrodes GL21 to GL24 (GL24 plus GL11, GL23 plus GL12, GL22 plus GL13, and GL21 plus GL14) are at substantially the same positions, the first electrode G3 plus the first diffusion regions G10 and the second electrode G4 plus the second diffusion regions G12 may be regarded as being arranged to be line symmetrical with respect to the straight line parallel to the short direction of the element forming surface G2*a* and passing through the long direction center in a plan view.

As with the preferred embodiment of FIG. 142, with the bidirectional Zener diode chip G1D of FIG. 156D, two each of the first diffusion regions G10 and the second diffusion regions G12 are formed. The four first diffusion regions G10 and the second diffusion regions G12 have rectangular shapes that are long in the long direction of the semiconductor substrate G2, and the first diffusion regions G10 and the second diffusion regions G12 are disposed alternately along the short direction of the semiconductor substrate G2. The first diode GD1 is constituted of two Zener diodes GD11 and GD12 respectively corresponding to the respective first diffusion regions G10. The second diode GD2 is constituted of two Zener diodes GD21 and GD22 respectively corresponding to the respective second diffusion regions G12. On the element forming surface G2*a*, the four diodes are aligned in the short side direction of the surface in the order of GD22, GD11, GD21, and GD12.

The second diffusion region G12 corresponding to the Zener diode GD22 and the first diffusion region G10 corresponding to the Zener diode GD11 are disposed adjacent to each other at a portion of the element forming surface G2*a* that is close to one of the long sides of the surface. The second diffusion region G12 corresponding to the Zener diode GD21 and the first diffusion region G10 corresponding to the Zener diode GD12 are disposed adjacent to each other at a portion of the element forming surface G2*a* that is close to the other long side of the surface. The first diffusion region G10 corresponding to the Zener diode GD11 and the second diffusion region G12 corresponding to the Zener diode GD21 are thus disposed across a large interval (an interval greater than the widths of the diffusion regions G10 and G12).

Two lead-out electrodes GL11 and GL12 respectively corresponding to the respective first diffusion regions G10 are formed in the first electrode G3. Similarly, two lead-out electrodes GL12 and GL22 respectively corresponding to the respective second diffusion regions G12 are formed in the second electrode G4. The first electrode G3 and the second electrode G4 are formed to comb-teeth-like shapes in which the lead-out electrodes GL11 and GL12 and the lead-out electrodes GL21 and GL22 are mutually engaged.

The first electrode G3 plus the first diffusion regions G10 and the second electrode G4 plus the second diffusion regions G12 are arranged to be point symmetrical with respect to the center of gravity of the element forming surface G2*a* in a plan view. The first electrode G3 plus the first diffusion regions G10 and the second electrode G4 plus the second diffusion regions G12 may also be regarded as being arranged to be practically line symmetrical. That is, the second lead-out electrode GL22 at one of the long sides of the semiconductor substrate G2 and the first lead-out electrode GL11 adjacent thereto may be regarded as being at substantially the same position, and the first lead-out electrode GL12 at the other long side of the semiconductor substrate G2 and the second lead-out electrode GL21 adjacent thereto may be regarded as being at substantially the same position. In this case, the first electrode G3 plus the first diffusion regions G10 and the second electrode G4 plus the second diffusion regions G12 may be regarded as being arranged to be line symmetrical with respect to the straight line parallel to the short direction of the element forming surface G2*a* and passing through the long direction center in a plan view.

With the bidirectional Zener diode chip G1E of FIG. 156E, two each of the first diffusion regions G10 and the second diffusion regions G12 are formed. The respective first diffusion regions G10 and the respective second diffusion regions G12 have substantially rectangular shapes that are long in the long direction of the first diffusion region G10. One of the second diffusion regions G12 is formed at a portion of the element forming surface G2*a* close to one of the long sides of the surface and the other second diffusion region G12 is formed at a portion of the element forming surface G2*a* close to the other long side of the surface. The two first diffusion regions G10 are formed respectively adjacent to the respective second diffusion regions G12 in a region between the two second diffusion regions G12. That is, the two first diffusion regions G10 are disposed across a large interval (an interval greater than the widths of the diffusion regions G10 and G12) and one each of the second diffusion regions G12 are disposed at the outer sides thereof.

The first diode GD1 is constituted of two Zener diodes GD11 and GD12 respectively corresponding to the respective first diffusion regions G10. The second diode GD2 is constituted of two Zener diodes GD21 and GD22 respectively corresponding to the respective second diffusion regions G12. Two lead-out electrodes GL11 and GL12 respectively corresponding to the respective first diffusion regions G10 are formed in the first electrode G3. Similarly, two lead-out electrodes GL21 and GL22 respectively corresponding to the respective second diffusion regions G12 are formed in the second electrode G4.

The first electrode G3 plus the first diffusion regions G10 and the second electrode G4 plus the second diffusion regions G12 may be regarded as being arranged to be practically line symmetrical. That is, the second lead-out electrode GL22 at one of the long sides of the semiconductor substrate G2 and the first lead-out electrode GL11 adjacent thereto may be regarded as being at substantially the same position, and the second lead-out electrode GL21 at the other long side of the semiconductor substrate G2 and the first lead-out electrode GL12 adjacent thereto may be regarded as being at substantially the same position. In this case, the first electrode G3 plus the first diffusion regions G10 and the second electrode G4 plus the second diffusion regions G12 may be regarded as being arranged to be line symmetrical with respect to the straight line passing through the long direction center of the element forming surface G2*a* in a plan view.

With the bidirectional Zener diode chip G1E of FIG. 156E, the second lead-out electrode GL22 at one of the long sides of the semiconductor substrate G2 and the first lead-out electrode GL11 adjacent thereto are arranged to be mutually point symmetrical around a predetermined point in between. Also, the second lead-out electrode GL21 at the other long side of the semiconductor substrate G2 and the first lead-out electrode GL12 adjacent thereto are arranged to be mutually point symmetrical around a predetermined point in between. Even in such a case where the first electrode G3 plus the first diffusion regions G10 and the second electrode G4 plus the second diffusion regions G12 are arranged from a combination of partially symmetrical structures, it may be regarded that the first electrode G3 plus the first diffusion regions G10 and the second electrode G4 plus the second diffusion regions G12 are arranged to be practically symmetrical.

FIG. 157 is a plan view of a modification example of the bidirectional Zener diode chip. FIG. 157 is a plan view corresponding to FIG. 142. In FIG. 157, portions corresponding to respective portions shown in FIG. 142 are provided with the same reference symbol as in FIG. 142. With the bidirectional Zener diode chip G1F, a plurality of the first diffusion regions G10 are disposed discretely and a plurality of the second diffusion regions G12 are disposed discretely in a top layer region of the semiconductor substrate G2. The first diffusion regions G10 and the second diffusion regions G12 are formed to circles of the same size in a plan view. The plurality of first diffusion regions G10 are disposed in a region between the width center and one of the long sides of the element forming surface G2*a*, and the plurality of second diffusion regions G12 are disposed in a region between the width center and the other long side of the element forming surface G2*a*. The first electrode G3 has a single lead-out electrode GL11 connected in common to the plurality of first diffusion regions G10. Similarly, the second electrode G4 has a single lead-out electrode GL21 connected in common to the plurality of second diffusion regions G12. The first electrode G3 plus the first diffusion regions G10 and the second electrode G4 plus the second diffusion regions G12 are arranged to be point symmetrical with respect to the center of gravity of the element forming surface G2*a* in a plan view in this modification example as well.

The shape in a plan view of each of the first diffusion regions G10 and the second diffusion regions G12 may be any shape, such as a triangle, rectangle, or other polygon, etc. Also, a plurality of the first diffusion regions G10, extending in a long direction of the element forming surface G2*a* may be formed across intervals in the short direction of the element forming surface G2*a* in a region between the width center and one of the long sides of the element forming surface G2*a* and the lead-out electrode GL11 may be connected in common to the plurality of first diffusion regions G10. In this case, a plurality of the second diffusion regions G12, extending in a long direction of the element forming surface G2*a* are formed across intervals in the short direction of the element forming surface G2*a* in a region between the width center and the other long side of the element forming surface G2*a* and the lead-out electrode GL21 is connected in common to the plurality of second diffusion regions G12.

Although preferred embodiments of the eighth invention have been described above, the eighth invention may be implemented in yet other modes as well. For example, although with the preferred embodiments described above, the p-type semiconductor substrate G2 is used, an n-type semiconductor substrate may be used instead. In a case of using an n-type semiconductor substrate, an n-type epitaxial layer is formed on its principal surface and a $p^+$ type first diffusion region and a $p^+$ type second diffusion region are formed on a top layer portion of the n-type epitaxial layer.

Although in the preferred embodiments, the first diffusion regions G10 and the second diffusion regions G12 are formed to extend longitudinally in a direction orthogonal to the arraying direction thereof, these may instead be formed to extend longitudinally in an oblique direction with respect to the arraying direction thereof.

[9] Ninth Invention

Patent Document 3 (Japanese Unexamined Patent Publication No. 2001-326354) discloses a vertical MOSFET, in which a protective diode, constituted of a bidirectional Zener diode, is connected between a gate and a source. The bidirectional Zener diode is used as a protective diode and its ESD (electrostatic discharge) tolerance is thus important.

An object of the ninth invention is to provide a bidirectional Zener diode chip that is improved in ESD tolerance. A more specific object of the ninth invention is to provide a bidirectional Zener diode chip with which both downsizing and securing of ESD tolerance can be achieved at the same time. The ninth invention has the following features.

H1. A bidirectional Zener diode chip including a plurality of first diffusion regions of a second conductivity type formed on a semiconductor substrate of a first conductivity type while being separated from each other and respectively forming p-n junctions with the semiconductor substrate, a second diffusion region of the second conductivity type formed on the semiconductor substrate while being separated from the first diffusion region and forming a p-n junction with the semiconductor substrate, a first electrode connected in common to the plurality of first diffusion regions, and a second electrode connected to the second diffusion region.

With this arrangement, p-n junctions (p-n junction regions), separated according to each first diffusion region, are formed between the plurality of first diffusion regions and the semiconductor substrate and these are connected in parallel. A first Zener diode is thereby arranged. Meanwhile a p-n junction (p-n junction region) is formed between the second diffusion region and the semiconductor substrate and a second Zener diode is thereby arranged. The first Zener diode and the second Zener diode are anti-serially connected via the semiconductor substrate. A bidirectional Zener diode is thereby arranged.

With this arrangement, the p-n junctions regions that are separated according to each of the plurality of first diffusion regions are formed and a peripheral length of the p-n junction regions of the first Zener diode can thus be made long. Concentration of electric field is thereby relaxed and the ESD tolerance of the first Zener diode can be improved. The peripheral length of the p-n junction regions of the first Zener diode is the total extension of the boundary lines between the semiconductor substrate and the first diffusion regions at the top surface of the semiconductor substrate.

H2. The bidirectional Zener diode chip according to "H1.," where each of the first diffusion regions is a polygonal region. With this arrangement, the p-n junction region between each first diffusion region and the semiconductor substrate is made long, the peripheral length of the p-n junction regions in the first Zener diode can thus be made long, and the ESD tolerance of the first Zener diode can thus be improved. The second diffusion region may be formed to surround the plurality of first diffusion regions (to be more specific, so as to have an edge portion of a shape matching the outer peripheral edges of the first diffusion regions). In this case, the peripheral length of the p-n junction region of the second Zener diode can also be made long and the ESD tolerance of the second Zener diode can be improved further. The peripheral length of the p-n junction region of the second Zener diode is the total extension of the boundary lines between the semiconductor substrate and the second diffusion region at the top surface of the semiconductor substrate.

H3. The bidirectional Zener diode chip according to "H1." or "H2.," where the plurality of first diffusion regions are arrayed two-dimensionally at equal intervals. With this arrangement, the ESD tolerance can be improved further by the plurality of first diffusion regions being arrayed two-dimensionally (preferably arrayed two-dimensionally at equal intervals).

H4. The bidirectional Zener diode chip according to any one of "H1." to "H3.," where not less than four of the first diffusion regions are provided. With this arrangement, by not less than four of the first diffusion regions being provided, the peripheral length of the p-n junction regions in the first Zener diode can be made long and the ESD tolerance can thus be improved efficiently.

H5. The bidirectional Zener diode chip according to any one of "H1." to "H4.," where the first electrode includes a plurality of lead-out electrodes bonded respectively to the plurality of first diffusion regions and an external connection portion connected in common to the plurality of lead-out electrodes, and each lead-out electrode has a bonding portion bonded to the first diffusion region and has a wider width than the bonding portion at all locations between the bonding portion and the external connection portion.

With this arrangement, each lead-out electrode has a wider width than the bonding portion at all locations between the bonding portion bonded to the first diffusion region and the external connection portion. A large allowable current amount can thus be set and electromigration can be reduced to improve reliability with respect to a large current. That is, a bidirectional Zener diode chip that is compact, high in ESD tolerance, and secured in reliability with respect to large currents can be provided.

H6. The bidirectional Zener diode chip according to "H5.," where the plurality of first diffusion regions include a plurality of first diffusion regions that are aligned on a straight line toward the external connection portion and the plurality of first diffusion regions that are aligned on the straight line are connected to the external connection portion by the lead-out electrode in common that is formed rectilinearly along the straight line. With this arrangement, the length of the lead-out electrode from the plurality of first diffusion regions that are aligned on the straight line to the external connection portion can be minimized and electromigration can thus be reduced more effectively. Also, a single lead-out electrode can be shared by the plurality of first diffusion regions aligned along the straight line toward the external connection portion to enable a lead-out electrode of wide line width to be laid out on the semiconductor substrate while forming a large number of first diffusion regions to increase the peripheral length of the p-n junction regions. Both further improvement of ESD tolerance and reduction of electromigration can thereby be achieved at the same time to further improve the reliability.

H7. The bidirectional Zener diode chip according to any one of "H1." to "H6.," where the first diffusion regions and the second diffusion region are exposed on one of the principal surfaces of the semiconductor substrate and the first electrode and the second electrode are respectively bonded to the first diffusion regions and the second diffusion regions on the principal surface.

With this arrangement, both the first electrode and the second electrode are formed on one of the surfaces of the semiconductor substrate, and the bidirectional Zener diode chip can thus be surface-mounted on a mounting substrate. That is, a flip-chip connection type bidirectional Zener diode chip can be provided. The space occupied by the bidirectional Zener diode chip can thereby be made small. In particular, reduction of height of the bidirectional Zener diode chip on the mounting substrate can be realized. Effective use can thereby be made of the space inside a casing of a compact electronic equipment, etc., to contribute to high-density packaging and downsizing.

H8. The bidirectional Zener diode chip according to any one of "H1." to "H7.," where the plurality of first diffusion regions are formed to be equal in size. With this arrangement, the plurality of Zener diodes constituting the first Zener diode have substantially equal characteristics and the first Zener diode can thus be made to have satisfactory characteristics as a whole.

H9. The bidirectional Zener diode chip according to "H7." or "H8.," further including an insulating film covering the principal surface of the semiconductor substrate and where the bonding portions of the lead-out electrodes are bonded to the first diffusion regions via contact holes formed in the insulating film and the external connection portion is disposed on the insulating film in a region outside the contact holes.

With this arrangement, the insulating film is formed on the semiconductor substrate and the bonding portions of the lead-out electrodes are connected to the first diffusion regions via the contact holes formed in the insulating film. The external connection portion is disposed on the insulating film in the region outside the contact holes. The external connection portion can thereby be disposed so as to avoid positions directly above the p-n junction regions between the first diffusion regions and the semiconductor substrate, and application of large impacts to the p-n junction regions can thus be avoided during mounting of the bidirectional Zener diode chip on a mounting substrate or during connection of bonding wires to the external connection portion. Destruction of the p-n junction regions can thereby be avoided, and a bidirectional Zener diode chip that is excellent in durability against external forces and therefore improved in reliability can be realized.

H10. The bidirectional Zener diode chip according to any one of "H1." to "H9.," further including a protective film formed on the principal surface of the semiconductor substrate so as to cover the first electrode and the second electrode while exposing portions of the first and second electrodes. With this arrangement, the protective film that covers the first electrode and the second electrode while exposing portions of the first electrode and the second electrode is formed so that entry of moisture to the first electrode, the second electrode, and the p-n junction regions can be suppressed or prevented, and in addition, the durability against external forces can be improved by the protective film.

H11. The bidirectional Zener diode chip according to any one of "H1." to "H10.," where the semiconductor substrate is a p-type semiconductor substrate and the first diffusion region and the second diffusion region are n-type diffusion layers. With this arrangement, the semiconductor substrate is constituted of the p-type semiconductor substrate and therefore stable characteristics can be realized even if an epitaxial layer is not formed on the semiconductor substrate. That is, an n-type semiconductor wafer is large in in-plane variation of resistivity, and therefore an epitaxial layer with low in-plane variation of resistivity must be formed on the top surface and an impurity diffusion layer must be formed on the epitaxial layer to form the p-n junction. On the other hand, a p-type semiconductor wafer is low in in-plane variation of resistivity and a bidirectional Zener diode with stable characteristics can be cut out from any location of the wafer without having to form an epitaxial layer. Therefore by using the p-type semiconductor substrate, the manufacturing process can be simplified and the manufacturing cost can be reduced.

H12. The bidirectional Zener diode chip according to any one of "H1." to "H11.," where the principal surface of the semiconductor substrate has a rectangular shape with rounded corner portions. With this arrangement, the principal surface of the semiconductor substrate has the rectangular shape with rounded corner portions. Fragmenting (chipping) of the corner portions of the bidirectional Zener diode chip can thereby be suppressed or prevented and a bidirectional Zener diode chip with few appearance defects can be provided.

H13. A circuit assembly including a mounting substrate and the bidirectional Zener diode chip according to any one of "H1." to "H12." that is mounted on the mounting substrate. With this arrangement, a circuit assembly can be provided that uses the bidirectional Zener diode chip that is high in ESD tolerance and is thus improved in reliability. A circuit assembly of high reliability can thus be provided.

H14. The circuit assembly according to "H13.," where the bidirectional Zener diode chip is connected to the mounting substrate by wireless bonding (face-down bonding or flip-chip bonding). With this arrangement, the space occupied by the bidirectional Zener diode chip on the mounting substrate can be made small to enable a contribution to be made to high-density packaging of electronic parts.

H15. An electronic equipment including the circuit assembly according to "H13." or "H14." and a casing housing the circuit assembly. With this arrangement, an electronic equipment can be provided with the circuit assembly, using the bidirectional Zener diode chip that is high in ESD tolerance and is thus improved in reliability, housed in the casing. An electric equipment of high reliability can thus be provided.

Preferred embodiments of the ninth invention shall now be described in detail with reference to the attached drawings.

FIG. 158 is a perspective view of a bidirectional Zener diode chip according to a preferred embodiment of the ninth invention, FIG. 159 is a plan view thereof, and FIG. 160 is a sectional view taken along line CLX-CLX in FIG. 159. Further, FIG. 161 is a sectional view taken along line CLXI-CLXI in FIG. 159.

The bidirectional Zener diode chip H1 includes a $p^+$ type semiconductor substrate H2 (for example, a silicon substrate), a first Zener diode HD1 formed on the semiconductor substrate H2, a second Zener diode HD2 formed on the semiconductor substrate H2 and connected anti-serially to the first Zener diode HD1, a first electrode H3 connected to the first Zener diode HD1, and a second electrode H4 connected to the second Zener diode HD2. The first Zener diode HD1 is arranged from a plurality of Zener diodes HD11 to HD14.

The semiconductor substrate H2 includes a pair of principal surfaces H2*a* and H2*b* and a plurality of side surfaces H2*c* orthogonal to the pair of principal surfaces H2*a* and H2*b*, and one (principal surface H2*a*) of the pair of principal surfaces H2*a* and H2*b* is arranged as an element forming surface. Hereinafter, the principal surface H2*a* shall be referred to as the "element forming surface H2*a*." The element forming surface H2*a* is formed to a rectangular shape in a plan view and, for example, the length L in the long direction may be approximately 0.4 mm and the length W in the short direction may be approximately 0.2 mm. Also, the thickness T of the bidirectional Zener diode chip H1 as a whole may be approximately 0.1 mm. An external connection electrode H3B of the first electrode H3 and an external connection electrode H4B of the second electrode H4 are disposed at respective end portions of the element forming surface H2*a*. A diode forming region H7 is provided on the element forming surface H2*a* between the external connection electrodes H3B and H4B. The diode forming region H7 is formed to a rectangle in the present preferred embodiment.

The semiconductor substrate H2 has four corner portions H9 at four corners, each corresponding to an intersection portion of a pair of mutually adjacent side surfaces among the four side surfaces H2*c*. In the present preferred embodiment, the four corner portions H9 are shaped to round shapes. Each corner portion H9 has a smooth curved surface that is outwardly convex in a plan view as viewed in a direction of a normal to the element forming surface H2*a*. A structure capable of suppressing chipping during the manufacturing process or mounting of the bidirectional Zener diode chip H1 is thereby arranged.

FIG. 162 is a plan view showing the structure of the top surface (element forming surface H2*a*) of the semiconductor substrate H2 with the first electrode H3, the second electrode H4, and the arrangement formed thereon being removed. A plurality of first $n^+$ type diffusion regions (hereinafter referred to as "first diffusion regions H10"), respectively forming p-n junction regions H11 with the semiconductor substrate H2, are formed in a top layer region of the $p^+$ type semiconductor substrate H2. In the present preferred embodiment, four of the first diffusion regions H10 are formed and arrayed two-dimensionally at equal intervals in a matrix along a long direction and a short direction of the semiconductor substrate H2.

The four Zener diodes HD11 to HD14 are constituted by the respective first diffusion regions H10 and portions of the $p^+$ type semiconductor substrate H2 in the vicinities of the first diffusion regions H10, and the first Zener diode HD1 is constituted by the four Zener diodes HD11 to HD14. The first diffusion regions H10 are separated according to each of the Zener diodes HD11 to HD14. The Zener diodes HD11 to HD14 are thereby made to respectively have the p-n junction regions H11 that are separated according to each Zener diode.

In the present preferred embodiment, the first diffusion regions H10 are formed to be equal in size and equal in shape. Specifically, each first diffusion region H10 is formed to a polygonal shape. In the present preferred embodiment, each first diffusion region H10 is formed to a regular octagon having four sides extending along the four sides of the element forming surface H2*a* and another four sides, each of which connects adjacent two sides of the aforementioned four sides.

In a top layer region of the semiconductor substrate H2, a second $n^+$ type diffusion region (hereinafter referred to as the "second diffusion region H12"), which forms a p-n junction region H13 with the semiconductor substrate H2, is formed in a state of being separated from the first diffusion regions H10 across a predetermined interval. In the diode forming region H7, the second diffusion region H12 is formed to a pattern that avoids the first diffusion regions H10. Specifically, the second diffusion region H12 is formed so as to surround the plurality of first diffusion regions H10 across an interval from the peripheral edges of the first diffusion regions H10. More specifically, the second diffusion region H12 has an edge portion matching the shapes of the outer peripheral edges of the first diffusion regions H10. The second Zener diode HD2 is constituted by the second diffusion region H12 and a portion of the $p^+$ type semiconductor substrate H12 in the vicinity of the second diffusion region H12.

As shown in FIG. 160 and FIG. 161, an insulating film H15 (omitted from illustration in FIG. 159), constituted of an oxide film, etc., is formed on the element forming surface H2*a* of the semiconductor substrate H2. A plurality of first contact holes H16 respectively exposing top surfaces of the plurality of first diffusion regions H10 and a second contact hole H17 exposing the top surface of the second diffusion region H12 are formed in the insulating film H15. The first electrode H3 and the second electrode H4 are formed on the top surface of the insulating film H15. The first electrode H3 includes a first electrode film H3A formed on the top surface of the insulating film H15 and the first external connection electrode H3B bonded to the first electrode film H3A. The first electrode film H3A includes a lead-out electrode HL1 connected to the plurality of first diffusion regions H10 corresponding to the plurality of Zener diodes HD11 and HD13, a lead-out electrode HL2 connected to the plurality of first diffusion regions H10 corresponding to the plurality of Zener diode HD12 and HD14, and a first pad H5 formed integral to the lead-out electrodes HL1 and HL2 (first lead-out electrodes). The first pad H5 is formed to a rectangle at one end portion of the element forming surface H2*a*. The first external connection electrode H3B is connected to the first pad H5. The first external connection electrode H3B is thereby connected in common to the lead-out electrodes HL1 and HL2. The first pad H5 and the first external connection electrode H3B constitute an external connection portion of the first electrode H3.

The second electrode H4 includes a second electrode film H4A formed on the top surface of the insulating film H15 and the second external connection electrode H4B bonded to the second electrode film H4A. The second electrode film H4A is connected to the second diffusion region H12 and has a second pad H6 near one end portion of the element forming surface H2*a*. The second pad H6 is constituted of a region disposed at the one end portion of the element forming surface H2*a* in the second electrode film H4. The second external connection electrode H4B is connected to the second pad H6. The second pad H6 and the second external connection electrode H4B constitute an external connection portion of the second electrode H4. In the second electrode film H4A, the region besides the second pad H6 is a second lead-out electrode that is led out from the second contact hole H17.

The lead-out electrode HL1 enters into the first contact holes H16 of the Zener diodes HD11 and HD13 from the top surface of the insulating film H15 and is in ohmic contact with the respective first diffusion regions H10 of the Zener diodes HD11 and HD13 inside the first contact holes H16. In the lead-out electrode HL1, the portions bonded to the respective first diffusion regions H10 of the Zener diodes HD11 and HD13 inside the first contact holes H16 constitute bonding portions HC1 and HC3. Similarly, the lead-out electrode HL2 enters into the first contact holes H16 of the Zener diodes HD12 and HD14 from the top surface of the insulating film H15 and is in ohmic contact with the respective first diffusion regions H10 of the Zener diodes HD12 and HD14 inside the first contact holes H16. In the lead-out electrode HL2, the portions connected to the respective first diffusion regions H10 of the Zener diodes HD12 and HD14 inside the first contact holes H16 constitute bonding portions HC2 and HC4. The second electrode film H4A extends to an inner side of the second contact hole H17 from the top surface of the insulating film H15 and is in ohmic contact with the second diffusion region H12 inside the second contact hole H17. In the present preferred embodiment, the first electrode film H3A and the second electrode film H4A are made of the same material. In the present preferred embodiment, Al films are used as the electrode films.

The first electrode film H3A and the second electrode film H4A are separated by a slit H18. The lead-out electrode HL1 is formed rectilinearly along a straight line passing from the first diffusion region H10 of the Zener diode HD11 to the first pad H5 through the first diffusion region H10 of the Zener diode HD13. Similarly, the lead-out electrode HL2 is formed rectilinearly along a straight line passing from the first diffusion region H10 corresponding to the Zener diode HD12 to the first pad H5 through the first diffusion region H10 of the Zener diode HD14. The lead-out electrodes HL1 and HL2 respectively have uniform widths W1 and W2 at all locations between the first diffusion regions H10 and the first pad H5, and the widths W1 and W2 are wider than the widths of the bonding portions HC1, HC2, HC3, and HC4. The widths of the bonding portions HC1 to HC4 are defined by the lengths in the direction orthogonal to the lead-out directions of the lead-out electrodes HL1 and HL2. Tip end portions of the lead-out electrodes HL1 and HL2 are shaped to match the planar shapes of the first diffusion regions H10. Base end portions of the lead-out electrodes HL1 and HL2 are connected to the first pad H5. The slit H18 is formed so as to border the lead-out electrodes HL1 and HL2. On the other hand, the second electrode film H4A is formed on the top surface of the insulating film H15 so as to surround the first electrode film H3A across an interval corresponding to the slit H18 of substantially fixed width. The second electrode film H4A integrally includes a comb-teeth-like portion extending in the long direction of the element forming surface H2*a* and the second pad H6 that is constituted of a rectangular region.

The first electrode film H3A and the second electrode film H4A are covered by a passivation film H20 (omitted from illustration in FIG. 159), constituted, for example, of a nitride film, and a resin film H21, made of polyimide, etc., is further formed on the passivation film H20. A pad opening H22 exposing the first pad H5 and a pad opening H23 exposing the second pad H6 are formed so as to penetrate through the passivation film H20 and the resin film H21. The external connection electrodes H3B and H4B are respectively embedded in the pad openings H22 and H23. The passivation film H20 and the resin film H21 constitute a protective film to suppress or prevent the entry of moisture to the first lead-out electrodes HL1 and HL2, the second lead-out electrode, and the p-n junction regions H11 and H13 and also absorb impacts, etc., from the exterior, thereby contributing to improvement of the durability of the bidirectional Zener diode chip H1.

The external connection electrodes H3B and H4B may have top surfaces at positions lower than the top surface of the resin film H21 (positions close to the semiconductor substrate H2) or may project from the top surface of the resin film H21 and have top surfaces at positions higher than the resin film H21 (positions far from the semiconductor substrate H2). An example where the external connection electrodes H3B and H4B project from the top surface of the resin film H21 is shown in FIG. 160. Each of the external connection electrodes H3B and H4B may be constituted, for example, of an Ni/Pd/Au laminated film having an Ni film in contact with the electrode film H3A or H4A, a Pd film formed on the Ni film, and an Au film formed on the Pd film. Such a laminated film may be formed by a plating method.

The first diffusion regions H10 of the plurality of Zener diodes HD11 to HD14 that constitute the first Zener diode HD1 are connected in common to the first electrode H3 and are connected to the $p^+$ type semiconductor substrate H2, which is the p-type region in common to the Zener diodes HD11 to HD14. Meanwhile, the second diffusion region H12 of the second Zener diode HD2 is connected to the second electrode H4 and is connected to the $p^+$ type semiconductor substrate H2, which is the p-type region of the second Zener diode HD2. The plurality of Zener diodes HD11 to HD14 that constitute the first Zener diode HD1 are thus connected in parallel and these parallel circuits are connected anti-serially to the second Zener diode HD2. The bidirectional Zener diode is constituted by the anti-serial circuit of the first Zener diode HD1 and the second Zener diode HD2.

FIG. 163 is an electric circuit diagram showing the electrical structure of the interior of the bidirectional Zener diode chip H1. The cathodes of the plurality of Zener diodes HD11 to HD14 constituting the first Zener diode HD1 are connected in common to the first electrode H3 and the anodes thereof are connected in common to the anode of the second Zener diode HD2. That is, the Zener diodes HD11 to HD14 are connected in parallel all together. The cathode of the second Zener diode HD2 is connected to the second electrode H4. These thus function as a single bidirectional Zener diode as a whole.

With the arrangement of the present preferred embodiment, the bidirectional Zener diode chip H1 has the first Zener diode HD1 and the second Zener diode HD2. The first Zener diode HD1 has the plurality of Zener diodes HD11 to HD14 (first diffusion regions H10) and each of the Zener diodes HD11 to HD14 has the p-n junction region H11. The p-n junction regions H11 are separated according to each of the Zener diodes HD11 to HD14. Therefore, with the bidirectional diode chip H1, the peripheral length of the p-n junction regions H11 of the first Zener diode HD1, that is, the total (total extension) of the peripheral lengths of the first diffusion regions H10 in the semiconductor substrate H2 is long. The electric field can thereby be dispersed and prevented from concentrating at vicinities of the p-n junction regions H11, and the ESD tolerance of the first Zener diode HD1 can thus be improved. That is, even when the bidirectional Zener diode chip H1 is to be formed compactly, the total peripheral length of the p-n junction regions H11 of the first Zener diode HD1 can be made large, thereby enabling both downsizing of the bidirectional Zener diode chip H1 and securing of the ESD tolerance to be achieved at the same time.

On the other hand, the second Zener diode HD2 has the second diffusion region H12 formed in the top layer region of the semiconductor substrate H2 in a state of being separated from the first diffusion regions H10 across the predetermined interval and has the p-n junction region H13. The second diffusion region H12 is formed so as to surround the plurality of first diffusion regions H10 and is matched in shape with the outer peripheral edges of the first diffusion regions H10, and the peripheral length of the p-n junction region H13 of the second Zener diode HD2 is thus also long. The electric field can thereby be dispersed and prevented from concentrating at vicinities of the p-n junction region H13, and the ESD tolerance of the second Zener diode HD2 can thus be improved. That is, even when the bidirectional Zener diode chip H1 is to be formed compactly, the total peripheral length of the p-n junction region H13 of the second Zener diode HD2 can be made large, thereby enabling both downsizing of the bidirectional Zener diode chip H1 and securing of the ESD tolerance to be achieved at the same time.

In order to make the peripheral length of the p-n junction region H13 of the second Zener diode HD2 even longer, the portions of the peripheral edge of the second diffusion region H12 (see FIG. 162) along the four sides of the element forming surface H2*a*, besides the portions facing the first diffusion regions H10, may be formed unevenly in a plan view.

FIG. 164 shows experimental results of measuring the ESD tolerances of a plurality of samples that are differed in total peripheral length (total extension) of p-n junction regions of the first Zener diode by variously setting the sizes and/or the number of first diffusion regions formed on the semiconductor substrate of the same area. From these experimental results, it can be understood that the longer the peripheral length of the p-n junction regions H11 of the first Zener diode HD1, the greater the ESD tolerance of the first Zener diode HD1. In cases where not less than four first diffusion regions H10 are formed on the semiconductor substrate, ESD tolerances in the excess of 8 kilovolts could be realized.

Further with the present preferred embodiment, the widths W1 and W2 of the lead-out electrodes HL1 and HL2 are wider than the widths of the bonding portions HC1 to HC4 at all locations between the bonding portions HC1 to HC4 and the first pad H5. A large allowable current amount can thus be set and electromigration can be reduced to improve reliability with respect to a large current. That is, a bidirectional Zener diode chip that is compact, high in ESD tolerance, and secured in reliability with respect to large currents can be provided.

Also with the present preferred embodiment, the plurality of Zener diodes HD11 and HD13 and the plurality of Zener diodes HD12 and HD14, which are respectively aligned along straight lines directed toward the first pad H5, are connected to the first pad H5 by the rectilinear lead-out electrodes HL1 and HL2 in common. The lengths of the lead-out electrodes from the Zener diodes HD11 to HD14 to the first pad H5 can thereby be minimized and electromigration can thus be reduced more effectively. Also, a single lead-out electrode HL1 or HL2 can be shared by the plurality of Zener diodes HD11 and HD13 or the plurality of Zener diodes HD12 and HD14, and therefore lead-out electrodes of wide line widths can be laid out on the semiconductor substrate H2 while forming a large number of Zener diodes HD11 to HD14 to increase the peripheral length of the p-n junction regions H11 of the first Zener diode HD1. Both further improvement of ESD tolerance and reduction of electromigration can thereby be achieved at the same time to further improve the reliability.

Also, the end portions of the lead-out electrodes HL1 and HL2 have partially polygonal shapes matching the shapes (polygons) of the first diffusion regions H10 and can thus be connected to the first diffusion regions H10 while making small the areas occupied by the lead-out electrodes HL1 and HL2. Further, the external connection electrodes H3B and H4B of the first electrode H3 side and the second electrode H4 side are both formed on the element forming surface H2*a*, which is one of the surfaces of the semiconductor substrate H2. Therefore as shown in FIG. 165, a circuit assembly having the bidirectional Zener diode chip H1 surface-mounted on a mounting substrate H25 can be arranged by making the element forming surface H2*a* face the mounting substrate H25 and bonding the external connection electrodes H3B and H4B onto the mounting substrate H25 by solders H26. That is, the bidirectional Zener diode chip H1 of the flip-chip connection type can be provided, and by performing face-down bonding with the element forming surface H2*a* being made to face the mounting surface of the mounting substrate H25, the bidirectional Zener diode chip H1 can be connected to the mounting substrate H25 by wireless bonding. The area occupied by the bidirectional Zener diode chip H1 on the mounting substrate H25 can thereby be made small. In particular, reduction of height of the bidirectional Zener diode chip H1 on the mounting substrate H25 can be realized. Effective use can thereby be made of the space inside a casing of a compact electronic equipment, etc., to contribute to high-density packaging and downsizing.

Also with the present preferred embodiment, the insulating film H15 is formed on the semiconductor substrate H2 and the bonding portions HC1 to HC4 of the lead-out electrodes HL1 and HL2 are connected to the first diffusion regions H10 of the Zener diodes HD11 to HD14 via the first contact holes H16 formed in the insulating film H15. The first pad H5 is disposed on the insulating film H15 in the region outside the first contact holes H16. That is, the first pad H5 is provided at a position separated from positions directly above the p-n junction regions H11 of the first Zener diode HD1. Also, the second electrode film H4A is connected to the second diffusion region H12 of the second Zener diode HD2 via the second contact hole H17 formed in the insulating film H15. The second pad H6 is disposed on the insulating film H15 in the region outside the second contact hole H17. The second pad H6 is also disposed at a position separated from a position directly above the p-n junction region H13 of the second Zener diode HD2. Application of a large impact to the p-n junction regions H11 and H13 can thus be avoided during mounting of the bidirectional Zener diode chip H1 on the mounting substrate H25. Destruction of the p-n junction regions H11 and H13 can thereby be avoided and a bidirectional Zener diode chip that is excellent in durability against external forces can thereby be realized. An arrangement is also possible where the external connection electrodes H3B and H4B are not provided, the first pad H5 and the second pad H6 are respectively used as the external connection portion of the first electrode H3 and the external connection portion of the second electrode H4, and bonding wires are connected to the first pad H5 and the second pad H6. Destruction of the p-n junction regions H11 and H13 due to impacts during wire bonding can be avoided in this case as well.

Further with the present preferred embodiment, the semiconductor substrate H2 has the rectangular shape with the corner portions H9 being rounded. Fragmenting (chipping) of the corner portions of the bidirectional Zener diode chip H1 can thereby be suppressed or prevented and the bidirectional Zener diode chip H1 with few appearance defects can be provided.

FIG. 166 is a process diagram for describing an example of a manufacturing process of the bidirectional Zener diode chip H1. Also, FIG. 167A and FIG. 167B are sectional views of the arrangement in the middle of the manufacturing process of FIG. 166 and show a section corresponding to FIG. 160. FIG. 168 is a plan view of a $p^+$ type semiconductor wafer HW as a base substrate of the semiconductor substrate H2 and shows a partial region in a magnified manner.

First, the $p^+$ type semiconductor wafer HW is prepared as the base substrate of the semiconductor substrate H2. A top surface of the semiconductor wafer HW is an element forming surface HWa and corresponds to the element forming surface H2*a* of the semiconductor substrate H2. A plurality of bidirectional Zener diode chip regions H1*a*, corresponding to a plurality of the bidirectional Zener diode chips H1, are arrayed and set in a matrix on the element forming surface HWa. A boundary region H80 is provided between adjacent bidirectional Zener diode chip regions H1*a*. The boundary region H80 is a band-like region having a substantially fixed width and extends in two orthogonal directions to form a lattice. After performing necessary steps on the semiconductor wafer HW, the semiconductor wafer HW is cut apart along the boundary region H80 to obtain the plurality of bidirectional Zener diode chips H1.

The steps executed on the semiconductor wafer HW are, for example, as follows. First, the insulating film H15 (with a thickness, for example, of 8000 Å to 8600 Å), which is a thermal oxide film or CVD oxide film, etc., is formed on the element forming surface HWa of the $p^+$ type semiconductor wafer HW (HS1) and a resist mask is formed on the insulating film H15 (HS2). Openings corresponding to the first diffusion regions H10 and the second diffusion region H12 are then formed in the insulating film H15 by etching using the resist mask (HS3). Further, after peeling off the resist mask, an n-type impurity is introduced to top layer portions of the semiconductor wafer HW that are exposed from the openings formed in the insulating film H15 (HS4). The introduction of the n-type impurity may be performed by a step of depositing phosphorus as the n-type impurity on the top surface (so-called phosphorus deposition) or by implantation of n-type impurity ions (for example, phosphorus ions). Phosphorus deposition is a process of depositing phosphorus on the top surface of the semiconductor wafer HW exposed inside the openings in the insulating film H15 by conveying the semiconductor wafer HW into a diffusion furnace and performing heat treatment while making POCl3 gas flow inside a diffusion passage. After thickening the insulating film H15 (thickening, for example, by approximately 1200 Å by CVD oxide film formation) as necessary (HS5), heat treatment (drive-in) for activation of the impurity ions introduced into the semiconductor wafer HW is performed (HS6). The first diffusion regions H10 and the second diffusion region H12 are thereby formed on the top layer portion of the semiconductor wafer HW.

Thereafter, another resist mask having openings matching the contact holes H16 and H17 is formed on the insulating film H15 (HS7). The contact holes H16 and H17 are formed in the insulating film H15 by etching via the resist mask (HS8), and the resist mask is peeled off thereafter. An electrode film that constitutes the first electrode H3 and the second electrode H4 is then formed on the insulating film H15, for example, by sputtering (HS9). In the present preferred embodiment, an electrode film (for example, of 10000 Å thickness), made of Al is formed. Another resist mask having an opening pattern corresponding to the slit H18 is then formed on the electrode film (HS10) and the slit H18 is formed in the electrode film by etching (for example, reactive ion etching) via the resist mask (HS11). The width of the slit H18 may be approximately 3 μm. The electrode film is thereby separated into the first electrode film H3A and the second electrode film H4A.

Then after peeling off the resist film, the passivation film H20, which is a nitride film, etc., is formed, for example, by the CVD method (HS12), and further, polyimide, etc., is applied to form the resin film H21 (HS13). For example, a polyimide imparted with photosensitivity is applied, and after exposing in a pattern corresponding to the pad openings H22 and H23, the polyimide film is developed (step HS14). The resin film H21 having openings corresponding to the pad openings H22 and H23 is thereby formed. Thereafter, heat treatment for curing the resin film is performed as necessary (HS15). The pad openings H22 and H23 are then formed in the passivation film H20 by performing dry etching (for example, reactive ion etching) using the resin film H21 as a mask (HS16). Thereafter, the external connection electrodes H3B and H4B are formed inside the pad openings H22 and H23 (HS17). The external connection electrodes H3B and H4B may be formed by plating (preferably, electroless plating).

Thereafter, a resist mask H83 (see FIG. 167A), having a lattice-shaped opening matching the boundary region H80 (see FIG. 168), is formed (HS18). Plasma etching is performed via the resist mask H83 and the semiconductor wafer HW is thereby etched to a predetermined depth from the element forming surface HWa as shown in FIG. 167A. A groove H81 for cutting is thereby formed along the boundary region H80 (HS19). After peeling off the resist mask H83, the semiconductor wafer HW is ground from the rear surface HWb until a bottom portion of the groove H81 is reached as shown in FIG. 167B (HS20). The plurality of bidirectional Zener diode chip regions H1*a* are thereby separated into individual pieces and the bidirectional Zener diode chips H1 with the structure described above can thereby be obtained.

As shown in FIG. 168, the resist mask H83 arranged to form the groove H81 at the boundary region H80 has, at positions contacting the four corners of the bidirectional Zener diode chip region H1*a*, round shaped portions H84 of curved shapes that are convex toward outer sides of the bidirectional Zener diode chip region H1*a*. Each round shaped portion H84 is formed to connect two adjacent sides of a bidirectional Zener diode chip region H1*a* by a smooth curve. Therefore, when the groove H81 is formed by plasma etching using the resist mask H83 as a mask, the groove H81 is to made to have, at positions adjacent to the four corners of each bidirectional Zener diode chip region H1*a*, round shaped portions of curved shapes that are convex toward the outer sides of the bidirectional Zener diode chip region H1*a*. Therefore in the step of forming the groove H81 for cutting out the bidirectional Zener diode chip regions H1*a* from the semiconductor wafer HW, the corner portions H9 of the four corners of each bidirectional Zener diode chip H1 can be shaped to round shapes at the same time. That is, the corner portions H9 can be processed to round shapes without adding a dedicated step.

With the present preferred embodiment, the semiconductor substrate H2 is constituted of the p-type semiconductor and therefore stable characteristics can be realized even if an epitaxial layer is not formed on the semiconductor substrate H2. That is, an n-type semiconductor wafer is large in in-plane variation of resistivity, and therefore when an n-type semiconductor wafer is used, an epitaxial layer with low in-plane variation of resistivity must be formed on the top surface and an impurity diffusion layer must be formed on the epitaxial layer to form the p-n junction. This is because an n-type impurity is low in segregation coefficient and therefore when an ingot (for example, a silicon ingot) that is to be the source of a semiconductor wafer is formed, a large difference in resistivity arises between a central portion and a peripheral edge portion of the wafer. On the other hand, a p-type impurity is comparatively high in segregation coefficient and therefore a p-type semiconductor wafer is low in in-plane variation of resistivity. Therefore by using a p-type semiconductor wafer, a bidirectional Zener diode with stable characteristics can be cut out from any location of the wafer without having to form an epitaxial layer. Therefore by using the $p^+$ type semiconductor substrate H2, the manufacturing process can be simplified and the manufacturing cost can be reduced.

FIG. 169 is a perspective view of an outer appearance of a smartphone that is an example of an electronic equipment in which the bidirectional Zener diode chip is used. The smartphone H201 is arranged by housing electronic parts in the interior of a casing H202 with a flat rectangular parallelepiped shape. The casing H202 has a pair of principal surfaces at its front side and rear side, and the pair of principal surfaces are joined by four side surfaces. A display surface of a display panel H203, constituted of a liquid crystal panel or an organic EL panel, etc., is exposed at one of the principal surfaces of the casing H202. The display surface of the display panel H203 constitutes a touch panel and provides an input interface for a user.

The display panel H203 is formed to an oblong shape that occupies most of one of the principal surfaces of the casing H202. Operation buttons H204 are disposed along one short side of the display panel H203. In the present preferred embodiment, a plurality (three) of the operation buttons H204 are aligned along the short side of the display panel H203. The user can call and execute necessary functions by performing operations of the smartphone H201 by operating the operation buttons H204 and the touch panel.

A speaker H205 is disposed in a vicinity of the other short side of the display panel H203. The speaker H205 provides an earpiece for a telephone function and is also used as an acoustic conversion unit for reproducing music data, etc. On the other hand, close to the operation buttons H204, a microphone H206 is disposed at one of the side surfaces of the casing H202. The microphone H206 provides a mouthpiece for the telephone function and may also be used as a microphone for sound recording.

FIG. 170 is an illustrative plan view of the arrangement of an electronic circuit assembly H210 housed in the interior of the housing H202. The electronic circuit assembly H210 includes a wiring substrate H211 and circuit parts mounted on a mounting surface of the wiring substrate H211. The plurality of circuit parts include a plurality of integrated circuit elements (ICs) H212 to H220 and a plurality of chip parts. The plurality of ICs include a transmission processing IC H212, a one-segment TV receiving IC H213, a GPS receiving IC H214, an FM tuner IC H215, a power supply IC H216, a flash memory H217, a microcomputer H218, a power supply IC H219, and a baseband IC H220. The plurality of chip parts include chip inductors H221, H225, and H235, chip resistors H222, H224, and H233, chip capacitors H227, H230, and H234, chip diodes H228 and H231, and bidirectional Zener diode chips H241 to H248. The chip parts are mounted on the mounting surface of the wiring substrate H211, for example, by flip-chip bonding.

The bidirectional Zener diode chips H241 to H248 are provided for absorbing positive and negative surges, etc., in signal input lines to the one-segment TV receiving IC H213, the GPS receiving IC H214, the FM tuner IC H215, the power supply IC H216, the flash memory H217, the microcomputer H218, the power supply IC H219, and the baseband IC H220. The bidirectional Zener diode chips according to the preferred embodiment described above may be applied as the bidirectional Zener diode chips H241 to H248.

The transmission processing IC H212 has incorporated therein an electronic circuit arranged to generate display control signals for the display panel H203 and receive input signals from the touch panel on the top surface of the display panel H203. For connection with the display panel H203, the transmission processing IC H212 is connected to a flexible wiring H209. The one-segment TV receiving IC H213 incorporates an electronic circuit that constitutes a receiver for receiving one-segment broadcast (terrestrial digital television broadcast targeted for reception by portable equipment) radio waves. A plurality of the chip inductors H221, a plurality of the chip resistors H222, and a plurality of the bidirectional Zener diode chips H241 are disposed in a vicinity of the one-segment TV receiving IC H213. The one-segment TV receiving IC H213, the chip inductors H221, the chip resistors H222, and the bidirectional Zener diode chips H241 constitute a one-segment broadcast receiving circuit H223. The chip inductors H221 and the chip resistors H222 respectively have accurately adjusted inductances and resistances and provide circuit constants of high precision to the one-segment broadcast receiving circuit H223.

The GPS receiving IC H214 incorporates an electronic circuit that receives radio waves from GPS satellites and outputs positional information of the smartphone H201. A plurality of the bidirectional Zener diode chips H242 are disposed in a vicinity of the GPS receiving IC H214. The FM tuner IC H215 constitutes, together with a plurality of the chip resistors H224, a plurality of the chip inductors H225, and a plurality of the bidirectional Zener diode chips H243 mounted on the wiring substrate H211 in a vicinity thereof, an FM broadcast receiving circuit H226. The chip resistors H224 and the chip inductors H225 respectively have accurately adjusted resistance values and inductances and provide circuit constants of high precision to the FM broadcast receiving circuit H226.

A plurality of the chip capacitors H227, a plurality of the chip diodes H228, and a plurality of the bidirectional Zener diode chips H244 are mounted on the mounting surface of the wiring substrate H211 in a vicinity of the power supply IC H216. Together with the chip capacitors H227, the chip diodes H228, and the bidirectional Zener diode chips H244, the power supply IC H216 constitutes a power supply circuit H229.

The flash memory H217 is a storage device for recording operating system programs, data generated in the interior of the smartphone H201, and data and programs acquired from the exterior by communication functions, etc. A plurality of the bidirectional Zener diode chips H245 are disposed in a vicinity of the flash memory H217. The microcomputer H218 is a computing processing circuit that incorporates a CPU, a ROM, and a RAM and realizes a plurality of functions of the smartphone H201 by executing various computational processes. More specifically, computational processes for image processing and various application programs are realized by actions of the microcomputer H218. A plurality of the bidirectional Zener diode chips H246 are disposed in a vicinity of the microcomputer H218. A plurality of the chip capacitors H230, a plurality of the chip diodes H231, and a plurality of the bidirectional Zener diode chips H247 are mounted on the mounting surface of the wiring substrate H211 in a vicinity of the power supply IC H219. Together with the chip capacitors H230, the chip diodes H231, and the bidirectional Zener diode chips H247, the power supply IC H219 constitutes a power supply circuit H232.

A plurality of the chip resistors H233, a plurality of the chip capacitors H234, a plurality of the chip inductors H235, and a plurality of the bidirectional Zener diode chips H248 are mounted on the mounting surface of the wiring substrate H211 in a vicinity of the baseband IC H220. Together with the chip resistors H233, the chip capacitors H234, the chip inductors H235, and the plurality of bidirectional Zener diode chips H248, the baseband IC H220 constitutes a baseband communication circuit H236. The baseband communication circuit H236 provides communication functions for telephone communication and data communication.

With the above arrangement, electric power that is appropriately adjusted by the power supply circuits H229 and H232 is supplied to the transmission processing IC H212, the GPS receiving IC H214, the one-segment broadcast receiving circuit H223, the FM broadcast receiving circuit H226, the baseband communication circuit H236, the flash memory H217, and the microcomputer H218. The microcomputer H218 performs computational processes in response to input signals input via the transmission processing IC H212 and makes the display control signals be output from the transmission processing IC H212 to the display panel H203 to make the display panel H203 perform various displays.

When receiving of a one-segment broadcast is commanded by operation of the touch panel or the operation buttons H204, the one-segment broadcast is received by actions of the one-segment broadcast receiving circuit H223.

Computational processes for outputting the received images to the display panel H203 and making the received audio signals be acoustically converted by the speaker H205 are executed by the microcomputer H218. Also, when positional information of the smartphone H201 is required, the microcomputer H218 acquires the positional information output by the GPS receiving IC H214 and executes computational processes using the positional information.

Further, when an FM broadcast receiving command is input by operation of the touch panel or the operation buttons H204, the microcomputer H218 starts up the FM broadcast receiving circuit H226 and executes computational processes for outputting the received audio signals from the speaker H205. The flash memory H217 is used for storing data acquired by communication and storing data prepared by computations by the microcomputer H218 and inputs from the touch panel. The microcomputer H218 writes data into the flash memory H217 or reads data from the flash memory H217 as necessary.

The telephone communication or data communication functions are realized by the baseband communication circuit H236. The microcomputer H218 controls the baseband communication circuit H236 to perform processes for sending and receiving audio signals or data.

Although preferred embodiments of the ninth invention have been described above, the ninth invention may be implemented in yet other modes as well. For example, although with the preferred embodiment described above, an example where four first diffusion regions are formed on the semiconductor substrate was described, two or three first diffusion regions may be formed or not less than four first diffusion regions may be formed on the semiconductor substrate.

Also, although with the preferred embodiment, an example where the first diffusion regions are respectively formed to a regular octagon in a plan view was described, the first diffusion regions may be formed to any polygonal shape with the number of sides being not less than three, and the planar shapes of the regions may be circular or elliptical. If the shape of the first diffusion regions is to be made a polygonal shape, the shape does not have to be a regular polygonal shape and the respective regions may be formed to a polygon with two or more types of side length. Yet further, there is no need to form the first diffusion regions to the same size and a plurality of first diffusion regions of different sizes may be mixed on the semiconductor substrate. Yet further, the shape of the first diffusion regions formed on the semiconductor substrate does not have to be of one type, and first diffusion regions with two or more types of shape may be mixed on the semiconductor substrate.

While preferred embodiments of the present invention have been described in detail, these are merely specific examples used to clarify the technical contents of the present invention, and the present invention should not be interpreted as being limited only to these specific examples, and the spirit and scope of the present invention shall be limited only by the appended claims.

DESCRIPTION OF THE SYMBOLS

1 diode package 2 resin package 5 anode terminal 6 cathode terminal 15 chip diode 19 bonding wire 20 semiconductor substrate 21 epitaxial layer 22 top surface (of the epitaxial layer) 23 diode impurity region 24 guard ring layer 28 p-n junction 29 diode element 30 insulating film 31 $SiO_2$ film 32 PSG film 33 contact hole 34 anode electrode 35 top surface protective film 36 pad opening 37 pad 39 floating region 40 rear surface (of the semiconductor substrate) 41 cathode electrode 42 p-n junction 51 diode package 52 resin package 55 anode terminal 56 cathode terminal 65 chip diode 69 bump 70 semiconductor substrate 71 epitaxial layer 72 top surface (of the epitaxial layer) 73 diode impurity region 77 p-n junction 78 diode element 79 insulating film 80 SiO2 film 81 PSG film 82 contact hole 83 anode electrode 84 top surface protective film 85 pad opening 86 pad 87 rear surface (of the semiconductor substrate) 88 cathode electrode

What is claimed is:

1. A semiconductor device, comprising:

a silicon substrate;

an insulating film formed on the silicon substrate;

a first electrode layer formed on the insulating film, and being connected to the silicon substrate;

a second electrode layer formed on the insulating film, and being connected to the silicon substrate, the second electrode layer being electrically disconnected from the first electrode layer by a slit;

a first electrode connected to the first electrode layer;

a second electrode connected to the second electrode layer; and a passivation film covering the first electrode layer and the second electrode layer, and not covering the first electrode and the second electrode, wherein the first electrode layer has a first extending electrode portion and a second extending electrode portion, both of which extend toward the second electrode in a plan view, the first extending electrode portion and the second extending electrode portion being rimmed with the slit.

2. The semiconductor device according to claim 1, wherein the second electrode layer extends toward the first electrode in a comb shape along the slit in the plan view.

3. The semiconductor device according to claim 2, wherein the first extending electrode portion and the second extending electrode portion each has an extending portion which linearly extends toward the second electrode in a first direction, and having a constant width in a second direction perpendicular to the first direction, and a tip portion having a trapezoidal shape, in the plan view.

4. The semiconductor device according to claim 3, wherein the constant width of the extending portion of the first extending electrode portion is a same width as the constant width of the extending portion of the second extending electrode portion.

5. The semiconductor device according to claim 4, wherein a width of the slit between the first electrode layer and the second electrode layer facing each other in the plan view is equal to about 3 μm.

6. The semiconductor device according to claim 4, further comprising:

a first opening formed on the insulation film to connect the first extending electrode portion to the silicon substrate; and a second opening formed on the insulation film to connect the second extending electrode portion to the silicon substrate.

7. The semiconductor device according to claim 6, wherein the constant width of the first extending electrode portion is greater than a width of the first opening in a direction parallel to the second direction, and the constant width of the second extending electrode portion is greater than a width of the second opening in a direction parallel to the second direction.

8. The semiconductor device according to claim 7, further comprising first and second semiconductor regions in a surface layer of the silicon substrate, wherein the silicon substrate has a first conductivity type, and each of the first and second semiconductor regions has a second conductivity type, and the first and second openings are respectively disposed on the first and second semiconductor region.

9. The semiconductor device according to claim 8, wherein a sum of widths of the first and second semiconductor regions is greater than a sum of widths of the first and second openings in a direction parallel to the second direction in the plan view.

10. The semiconductor device according to claim 9, wherein the widths of the first and second semiconductor regions are set so that an Electro Static Discharge resistance of the semiconductor device is from about 8 kV to 16 kV.

11. The semiconductor device according to claim 8, wherein the first conductivity type is a p type and the second conductivity type is an n type.

12. The semiconductor device according to claim 7, wherein the first opening and the second opening each has a tapered side surface such that a size of the portion at an upper surface of the insulating film is greater than a size of the portion at a lower surface of the insulating film facing the silicon substrate in the plan view.

13. The semiconductor device according to claim 12, wherein the first opening and the second opening each has an elliptical shape in the plan view.

14. The semiconductor device according to claim 5, wherein the insulating film is made of oxide, and the passivation film is made of nitride.

* * * * *